US009285679B2

(12) United States Patent
Tsuchimura et al.

(10) Patent No.: US 9,285,679 B2
(45) Date of Patent: Mar. 15, 2016

(54) ACTINIC RAY-SENSITIVE OR RADIATION-SENSITIVE COMPOSITION, AND RESIST FILM, RESIST-COATED MASK BLANKS, RESIST PATTERN FORMING METHOD AND PHOTOMASK EACH USING THE COMPOSITION

(71) Applicant: FUJIFILM CORPORATION, Tokyo (JP)

(72) Inventors: Tomotaka Tsuchimura, Shizuoka (JP); Takuya Tsuruta, Shizuoka (JP); Takeshi Inasaki, Shizuoka (JP); Koutarou Takahashi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/497,560

(22) Filed: Sep. 26, 2014

(65) Prior Publication Data

US 2015/0010855 A1 Jan. 8, 2015

Related U.S. Application Data

(63) Continuation of application No. PCT/JP2013/058852, filed on Mar. 26, 2013.

(30) Foreign Application Priority Data

Mar. 27, 2012 (JP) ................................ 2012-072540
Mar. 29, 2012 (JP) ................................ 2012-078094

(51) Int. Cl.

| | |
|---|---|
| ***G03F 7/039*** | (2006.01) |
| ***G03F 7/028*** | (2006.01) |
| ***G03F 7/027*** | (2006.01) |
| ***C08F 12/24*** | (2006.01) |
| ***G03F 7/004*** | (2006.01) |
| ***G03F 7/038*** | (2006.01) |
| ***G03F 1/00*** | (2012.01) |
| ***G03F 1/20*** | (2012.01) |
| ***G03F 1/22*** | (2012.01) |
| ***G03F 7/20*** | (2006.01) |
| ***C08F 12/22*** | (2006.01) |
| ***C08F 12/26*** | (2006.01) |
| ***C08F 12/30*** | (2006.01) |
| ***C08F 12/32*** | (2006.01) |
| ***C08F 212/14*** | (2006.01) |
| ***C09D 125/18*** | (2006.01) |

(52) U.S. Cl.

CPC ................ *G03F 7/027* (2013.01); *C08F 12/22* (2013.01); *C08F 12/24* (2013.01); *C08F 12/26* (2013.01); *C08F 12/30* (2013.01); *C08F 12/32* (2013.01); *C08F 212/14* (2013.01); *C09D 125/18* (2013.01); *G03F 1/00* (2013.01); *G03F 1/20* (2013.01); *G03F 1/22* (2013.01); *G03F 7/004* (2013.01); *G03F 7/0045* (2013.01); *G03F 7/0382* (2013.01); *G03F 7/0388* (2013.01); *G03F 7/0392* (2013.01); *G03F 7/0397* (2013.01); *G03F 7/2037* (2013.01); *G03F 7/2039* (2013.01)

(58) Field of Classification Search

CPC .......... G03F 7/004; G03F 7/027; G03F 7/039
See application file for complete search history.

(56) References Cited

U.S. PATENT DOCUMENTS

| | | | | |
|---|---|---|---|---|
| 5,082,755 | A * | 1/1992 | Liu .................................. | 430/5 |
| 2001/0044054 | A1 * | 11/2001 | Kaneko et al. .................... | 430/5 |
| 2003/0027061 | A1 | 2/2003 | Cameron et al. | |

(Continued)

FOREIGN PATENT DOCUMENTS

| | | | |
|---|---|---|---|
| JP | 8-248561 | A | 9/1996 |
| JP | 11-158118 | A | 6/1999 |

(Continued)

OTHER PUBLICATIONS

Kruger, S.A., Higgings, C., Cardineau, B., Younkin, T. R., Brainard, R.L. -Catalytic and Autocatalytic Mechanisms of Acid Amplifiers for Use in EUV Photoresists, Chem. Mater, 2010, 22, pp. 5609-5616.*
Communication issued on Mar. 10, 2015 by the Japanese Patent Office in related application No. 2012072540.
Communication issued on Mar. 1, 2015 by the Korean Intellectual Property Office in related KR application No. 10-2014-7026957.
International Search Report dated Jun. 25, 2013 issued in International Application No. PCT/JP2013/058852 (PCT/ISA/210).
Written Opinion dated Jun. 25, 2013 issued in International Application No. PCT/JP2013/058852 (PCT/ISA/237).
Seth Kruger et al., "Can Acid Amplifiers Help Beat the Resolution, Line Edge Roughness, and Sensitivity Trade-Off?", Japanese Journal of Applied Physics, 49, Apr. 20, 2010, pp. 041602-1-041602-5.
Kazuaki Kudo et al., "3-Phenyl-3,3-ethylenedioxy-1-propyl Sulfonates as Acid Amplifiers to Enhance the Photosensitivity of Positive-Working Photoresists", Chemistry of Materials, 11, Jul. 7, 1999, pp. 2119-2125.
Office Action dated Sep. 9, 2014 issued by the Japanese Patent Office in counterpart Japanese Application No. 2012-078094.

(Continued)

*Primary Examiner* — Anca Eoff
(74) *Attorney, Agent, or Firm* — Sughrue Mion, PLLC

(57) ABSTRACT

There is provided an actinic ray-sensitive or radiation-sensitive composition containing (α) a compound represented by the formula (αI) capable of generating an acid having a size of 200 $Å^3$ or more in volume and (β) a compound capable of generating an acid upon irradiation with an actinic ray or radiation, and the formula (αI) is defined as herein, (αI)

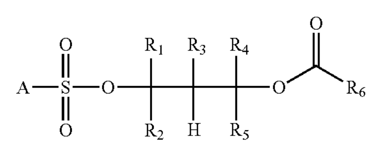

and a resist film formed using the actinic ray-sensitive or radiation-sensitive composition, a resist-coated mask blanks coated with the resist film, a resist pattern forming method comprising exposing the resist film and developing the exposed film, a photomask obtained by exposing and developing the resist-coated mask blanks, a method for manufacturing an electronic device, comprising the resist pattern forming method and an electronic device manufactured by the manufacturing method of an electronic device.

36 Claims, No Drawings

(56) References Cited

U.S. PATENT DOCUMENTS

| | | | | |
|---|---|---|---|---|
| 2005/0048767 | A1* | 3/2005 | Matsumoto | 438/629 |
| 2011/0183258 | A1 | 7/2011 | Takahashi et al. | |
| 2011/0189607 | A1 | 8/2011 | Ohashi et al. | |
| 2011/0189609 | A1 | 8/2011 | Kawabata et al. | |
| 2011/0294070 | A1 | 12/2011 | Hatakeyama et al. | |
| 2011/0318542 | A1 | 12/2011 | Mori et al. | |
| 2013/0171562 | A1* | 7/2013 | Tsuchimura et al. | 430/283.1 |

FOREIGN PATENT DOCUMENTS

| | | | |
|---|---|---|---|
| JP | 2008-162101 | A | 7/2008 |
| JP | 2009-63986 | A | 3/2009 |
| JP | 2010-150367 | A | 7/2010 |
| JP | 2011-33729 | A | 2/2011 |
| JP | 2011-53624 | A | 3/2011 |
| JP | 2011-157313 | A | 8/2011 |
| JP | 2011-158647 | A | 8/2011 |
| JP | 2012-012577 | A | 1/2012 |
| JP | 2012-048075 | A | 3/2012 |
| WO | 2012018121 | A1 | 2/2012 |

OTHER PUBLICATIONS

Marumori, T. et al., "Self-Consistent Collective-Coordinate Method for the Large-Amplitude Nuclear Collective Motion", Progress of Theoretical Physics, Oct. 1980, pp. 1294-1314, vol. 64, No. 4.

Communication from the Japanese Patent Office dated Sep. 16, 2014, in a counterpart Japanese application No. 2012-072540.

Written Opinion dated Jun. 25, 2013 issued by the International Searching Authority in corresponding International Application No. PCT/JP2013/058852 (PCT/ISA/237).

Office Action dated Jul. 3, 2015 issued by the Korean Intellectual Property Office in counterpart Korean Patent Application No. 10-2014-7026957.

Office Action dated Oct. 6, 2015, issued by the Japanese Patent Office in counterpart Japanese Patent Application No. 2012-072540.

* cited by examiner

ACTINIC RAY-SENSITIVE OR RADIATION-SENSITIVE COMPOSITION, AND RESIST FILM, RESIST-COATED MASK BLANKS, RESIST PATTERN FORMING METHOD AND PHOTOMASK EACH USING THE COMPOSITION

CROSS REFERENCE TO RELATED APPLICATION

This is a continuation of International Application No. PCT/JP2013/058852 filed on Mar. 26, 2013, and claims priority from Japanese Patent Application No. 2012-072540 filed on Mar. 27, 2012, and Japanese Patent Application No. 2012-078094 filed on Mar. 29, 2012 the entire disclosures of which are incorporated therein by reference.

TECHNICAL FIELD

The present invention relates to an actinic ray-sensitive or radiation-sensitive composition capable of forming a highly defined pattern by using an electron beam or an extreme-ultraviolet ray, which is suitably used in the ultramicrolithography process such as production of VLSI or a high-capacity microchip and in other fabrication processes; and a resist film, a resist-coated mask blanks, a resist pattern forming method, and a photomask, each using the composition. More specifically, the present invention relates to an actinic ray-sensitive or radiation-sensitive composition for use in the process using a substrate having a specific underlying film; and a resist film, a resist-coated mask blanks, a resist pattern forming method, and a photomask, each using the composition.

Also, the present invention relates to a pattern forming method employing a developer containing an organic solvent, an actinic ray-sensitive or radiation-sensitive composition, and a resist film, which are suitably used in the ultramicrolithography process such as production of VLSI or a high-capacity microchip and in other photofabrication processes; and a manufacturing method of an electronic device, and an electronic device, each using the method, composition or film. More specifically, the present invention relates to a pattern forming method employing a developer containing an organic solvent, an actinic ray-sensitive or radiation-sensitive composition, and a resist film, which are suitably usable for the semiconductor device microfabrication using an actinic ray or radiation; and a manufacturing method of an electronic device, and an electronic device, each using the method, composition or film.

BACKGROUND ART

In the process of producing a semiconductor device such as IC and LSI, microfabrication by lithography using a photoresist composition has been conventionally performed. In recent years, with the increase in the integration degree of an integrated circuit, formation of an ultrafine pattern in the sub-micron or quarter-micron region is required, and in turn, the exposure wavelength tends to become shorter, for example, from g line to i line or further to KrF excimer laser light. In addition to the excimer laser light, development of lithography using an electron beam, an X-ray or EUV light is also being pursued at present.

Such electron beam, X-ray or EUV lithography is positioned as a next-generation or next-next-generation pattern formation technology, and a resist composition having high sensitivity and high resolution is demanded.

In particular, the elevation of sensitivity is a very important issue for shortening the wafer processing time, but when higher sensitivity is pursued, the pattern profile or resolution indicated by a limiting resolution line width is deteriorated, and it is strongly desired to develop a resist composition satisfying all of these properties at the same time.

High sensitivity is in a trade-off relationship with high resolution and good pattern profile, and the matter of importance is how to satisfy these properties at the same time.

The actinic ray-sensitive or radiation-sensitive composition generally includes "a positive resist composition" used in a pattern forming method of forming a pattern by using a resin sparingly soluble or insoluble in an alkali developer and making the exposed area soluble for an alkali developer by the exposure to radiation, and "a negative resist composition" used in a pattern forming method of forming a pattern by using a resin soluble in an alkali developer and making the exposed area sparingly soluble or insoluble for an alkali developer by the exposure to radiation.

As the actinic ray-sensitive or radiation-sensitive composition suitable for such a lithography process using an electron beam, X-ray or EUV light, a chemical amplification positive resist composition utilizing mainly an acid catalyst reaction is studied from the standpoint of elevating the sensitivity, and a chemical amplification positive resist composition composed of a phenolic resin as the main component, which is insoluble or sparingly soluble in an alkali developer and has a property of becoming soluble in an alkali developer under an action of acid (hereinafter, simply referred to as a phenolic acid-decomposable resin), and an acid generator, is being effectively used.

Also, for providing an actinic ray-sensitive or radiation-sensitive composition significantly enhanced in the photosensitization speed by amplifying a photochemical reaction, it is known to use, together with the above-described acid generator, an acid-increasing agent capable of newly generating an acid (e.g., sulfonic acid) by an action of the acid generated from the acid generator (see, for example, Patent Document 2).

However, the acid-increasing agent known at present is bad in the aging stability, and this problem greatly affects the performance of a resist composition and is required to be solved.

As for the acid generator that is the main constituent component of the chemical amplification resist, a triphenylsulfonium salt is generally known.

In addition, for providing a chemical amplification resist composition significantly enhanced in the photosensitization speed by amplifying a photochemical reaction, it is known to use, together with the above-described acid generator, an acid-increasing agent capable of newly generating an acid by an action of the acid generated from the acid generator (see, for example, Patent Document 1).

As the acid-increasing agent, an acid-increasing agent having a structure where a sulfonyloxy group and a hydroxy group are coupled through three carbon atoms, is known. For example, in Patent Document 2 and Non-Patent Document 1, an acid-increasing agent having such a specific structure is used in a positive chemical amplification resist composition, and in Patent Document 3, a positive chemical amplification resist composition containing a resin having such a specific structure is disclosed.

Furthermore, the microfabrication by a resist composition is not only used directly for the production of an integrated circuit but also, in recent years, applied to the production or the like of a so-called imprint mold structure (for example, Patent Document 4 and Non-Patent Document 2). Therefore, it becomes an important issue to satisfy all of high sensitivity, high resolution (for example, high resolving power, excellent pattern profile and small line edge roughness (LER)), good dry etching resistance, excellent scum properties, and excellent aging stability at the same time.

RELATED ART

Patent Document

Patent Document 1: JP-A-8-248561 (the term "JP-A" as used herein means an "unexamined published Japanese patent application")
Patent Document 2: JP-A-2011-33729
Patent Document 3: JP-A-2011-53624
Patent Document 4: JP-A-2008-162101

Non-Patent Document

Non-Patent Document 1: *J. Am. Chem. Soc.* 2009, 131(29), 9862-9863
Non-Patent Document 2: Yoshihiko Hirai (compiler), *Nanoimprint no Kiso to Gijutsu Kaihatsu•Oyo Tenkai-Nanoimprint no Kiban Gijutsu to Saishin no Gijutsu Tenkai* (*Basic and Technology Expansion•Application Development of Nanoimprint-Substrate Technology of Nanoimprint and Latest Technology Expansion*), Frontier Shuppan (issued on June 2006)

SUMMARY OF THE INVENTION

Problems that the Invention is to Solve

An object of the present invention is to provide a chemical amplification resist composition capable of forming a pattern satisfying all of high sensitivity, high resolution (for example, high resolving power, excellent pattern profile and small line edge roughness (LER)), high aging stability, little scumming and good dry etching resistance at the same time. More specifically, an object of the present invention is to provide an actinic ray-sensitive or radiation-sensitive composition where an acid-increasing agent represented by formula (αI) has an ester group, making it possible to achieve a good balance between sensitivity and aging stability, and the acid-increasing agent, when acid-decomposed, generates a carboxylic acid, leading in particular to excellent enhancement of the sensitivity.

Another object of the present invention is to provide a resist film, a resist-coated mask blanks, a resist pattern forming method, and a photomask, each using the actinic ray-sensitive or radiation-sensitive composition above.

In another aspect, an object of the present invention is to provide an actinic ray-sensitive or radiation-sensitive composition capable of forming a pattern satisfying all of high sensitivity, high resolution (for example, high resolving power, excellent pattern profile and small line edge roughness (LER)), high aging stability and good dry etching resistance at the same time and being reduced in scum.

Another object of the present invention is to provide a resist film, a resist-coated mask blanks, a pattern forming method, and a photomask, each using the actinic ray-sensitive or radiation-sensitive composition above.

Means for Solving the Problems

As a result of intensive studies, the present inventors have found that the above-described objects can be attained by an actinic ray-sensitive or radiation-sensitive composition containing an acid-increasing agent having a specific structure. The present invention has been accomplished based on this finding.

That is, the present invention is as follows.

[1] An actinic ray-sensitive or radiation-sensitive composition containing (α) a compound represented by the following formula (αI) and (β) a compound capable of generating an acid upon irradiation with an actinic ray or radiation:

[Chem. 1]

(αI)

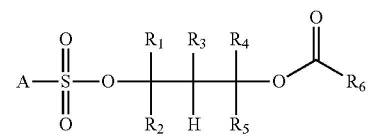

wherein in formula (αI), each of $R_1$ to $R_5$ represents a hydrogen atom or a substituent, two or more members of $R_1$ to $R_5$ may combine with each other to form a ring, $R_6$ represents a substituent, and A represents a monovalent organic group.

[2] The actinic ray-sensitive or radiation-sensitive composition as described in [1], which further contains (γ) a resin having a group capable of decomposing by an action of acid to produce an alkali-soluble group and is used for positive pattern formation.

[3] The actinic ray-sensitive or radiation-sensitive composition as described in [2], wherein the resin (γ) having a group capable of decomposing by an action of acid to produce an alkali-soluble group is a resin containing a repeating unit represented by the following formula (2):

[Chem. 2]

(2)

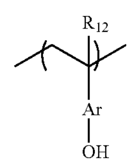

wherein in formula (2), $R_{12}$ represents a hydrogen atom or a methyl group, and Ar represents an aromatic ring.

[4] The actinic ray-sensitive or radiation-sensitive composition as described in [1], which further contains (8) a crosslinking agent and is used for negative pattern formation.

[5] The actinic ray-sensitive or radiation-sensitive composition as described in [4], wherein the crosslinking agent (8) is a compound having two or more hydroxymethyl groups or alkoxymethyl groups in the molecule.

[6] The actinic ray-sensitive or radiation-sensitive composition as described in [1], [4] or [5], which further contains (ε) a compound having a phenolic hydroxyl group and is used for negative pattern formation.

[7] The actinic ray-sensitive or radiation-sensitive composition as described in [6], wherein the phenolic hydroxyl group-containing compound (ε) is a polymer compound containing a repeating unit represented by the following formula (2):

[Chem. 3]

(2)

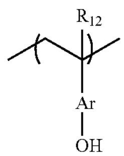

wherein in formula (2), $R_{12}$ represents a hydrogen atom or a methyl group, and Ar represents an aromatic ring.

[8] The actinic ray-sensitive or radiation-sensitive composition as described in any one of [1] to [7], wherein the compound (α) is a compound capable of generating an acid having a size of 200 $Å^3$ or more in volume.

[9] The actinic ray-sensitive or radiation-sensitive composition as described in any one of [1] to [8], which is used for electron beam or extreme-ultraviolet exposure.

[10] The actinic ray-sensitive or radiation-sensitive composition as described in any one of [1] to [9], wherein the compound (β) is a compound capable of generating an acid having a size of 200 $Å^3$ or more in volume upon irradiation with an actinic ray or radiation.

[11] A resist film formed using the actinic ray-sensitive or radiation-sensitive composition described in any one of [1] to [10].

[12] A resist-coated mask blanks coated with the resist film described in [11].

[13] A resist pattern forming method comprising exposing the resist film described in [11] and developing the exposed film.

[14] A resist pattern forming method comprising exposing the resist-coated mask blanks described in [12] and developing the exposed mask blanks.

[15] A photomask obtained by exposing and developing the resist-coated mask blanks described in [12].

[16] A compound represented by the following formula (IV):

[Chem. 4]

(IV)

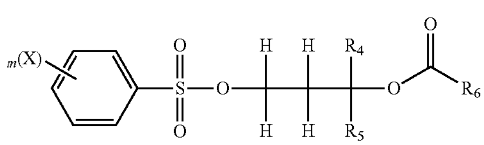

wherein each of $R_4$ to $R_6$ represents a hydrogen atom, an alkyl group or an aryl group, X represents an alkyl group, a cycloalkyl group, a halogen atom, an aryl group or an acyl group, and m represents an integer of 0 to 5.

[17] A method for manufacturing an electronic device, comprising the resist pattern forming method described in [13].

[18] An electronic device manufactured by the manufacturing method of an electronic device described in [17].

The present invention preferably further has the following configurations.

[19] The actinic ray-sensitive or radiation-sensitive composition as described in any one of [1] to [10], wherein $R_1$ and $R_2$ in formula (I) are a hydrogen atom.

[20] The actinic ray-sensitive or radiation-sensitive composition as described in any one of [1] to [10] and [19], wherein each of $R_4$ to $R_6$ in formula (I) is an alkyl group, a cycloalkyl group or an aryl group.

[21] The actinic ray-sensitive or radiation-sensitive composition as described in any one of [1] to [10], [19] and [20], wherein the monovalent organic group A in formula (I) is a residue of a sulfonic acid represented by the formula $A\text{-}SO_3H$ and the sulfonic acid is a compound represented by the following formula (II):

[Chem. 5]

(II)

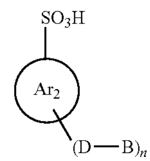

wherein in formula (II), $Ar_2$ represents an aromatic ring and may further has a substituent other than the sulfonic acid and the -(D-B) group, n represents an integer of 0 or more, D represents a single bond or a divalent linking group, B represents a hydrocarbon group, and when n is 2 or more, the plurality of -(D-B) groups may be the same or different.

[22] The actinic ray-sensitive or radiation-sensitive composition as described in [2] or [3], wherein the resin (γ) having a group capable of decomposing by an action of acid to produce an alkali-soluble group is a resin containing a repeating unit represented by the following formula (A):

[Chem. 6]

(A)

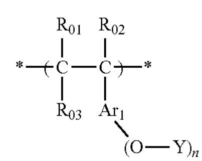

wherein each of $R_{01}$, $R_{02}$ and $R_{03}$ independently represents, for example, a hydrogen atom, an alkyl group, a cycloalkyl group, a halogen atom, a cyano group or an alkoxycarbonyl group, $Ar_1$ represents an alkylene group or an aromatic ring group, provided that $R_{03}$ may be an alkylene group and combine with $Ar_1$ as an aromatic ring group to form a ring together with the —C—C— chain or that $R_{03}$ and $Ar_1$ may be an alkylene group and both may combine with each other to form, for example, a 5- or 6-membered ring together with the —C—C— chain, each of n Y's independently represents a hydrogen atom or a group capable of leaving by an action of acid, provided that at least one Y represents a group capable of leaving by an action of acid, and n represents an integer of 1 to 4.

[23] The resist pattern forming method as described in [13] or [14], wherein the exposure is performed using an electron beam or an extreme-ultraviolet ray.

[24] An actinic ray-sensitive or radiation-sensitive composition containing (A) a compound represented by the following formula (I) and (B) a compound capable of generating an acid upon irradiation with an actinic ray or radiation:

[Chem. 7]

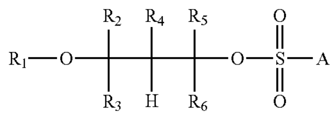

(I)

wherein in formula (I), $R_1$ represents an alkyl group, a cycloalkyl group, an alkenyl group, an alkynyl group, an aryl group or a silicon atom-containing group, each of $R_2$ and $R_3$ independently represents a hydrogen atom, an alkyl group, a cycloalkyl group, an alkenyl group, an alkynyl group, an aryl group, an alkylsulfonyl group, an arylsulfonyl group or a heterocyclic group, each of $R_4$ to $R_6$ independently represents a hydrogen atom or a monovalent substituent, at least two members of $R_1$ to $R_6$ may combine with each other to form a ring, and A represents a monovalent organic group.

[25] The actinic ray-sensitive or radiation-sensitive composition as described in [1], wherein the compound (A) is a compound capable of generating an acid having a size of 200 $Å^3$ or more in volume.

[26] The actinic ray-sensitive or radiation-sensitive composition as described in [24] or [25], which further contains (D) a crosslinking agent.

[27] The actinic ray-sensitive or radiation-sensitive composition as described in any one of [24] to [26], which further contains (C) a compound having one or more phenolic hydroxyl groups or a compound where the hydrogen atom in at least one phenolic hydroxyl group out of the one or more phenolic hydroxyl groups is replaced by a group capable of leaving by an action of acid.

[28] The actinic ray-sensitive or radiation-sensitive composition as described in [27], wherein the compound (C) is a polymer compound containing a repeating unit represented by the following formula (1):

[Chem. 8]

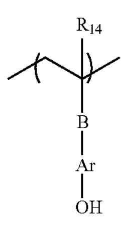

(1)

wherein in formula (1), $R_{14}$ represents a hydrogen atom or a methyl group,

B represents a single bond or a divalent linking group, and

Ar represents an aromatic ring.

[29] The actinic ray-sensitive or radiation-sensitive composition as described in [27], wherein the compound (C) is a compound in which the hydrogen atom in at least one phenolic hydroxyl group out of the phenolic hydroxyl groups of the compound having one or more phenolic hydroxyl groups is replaced by an acid-labile group represented by the following formula (III):

[Chem. 9]

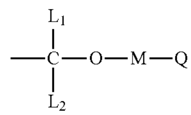

(III)

wherein in formula (III), each of $L_1$ and $L_2$ independently represents a hydrogen atom, an alkyl group, a cycloalkyl group, an aryl group or an aralkyl group, M represents a single bond or a divalent linking group, and Q represents an alkyl group, a cycloalkyl group that may contain a heteroatom, an aromatic ring group that may contain a heteroatom, an amino group, an ammonium group, a mercapto group, a cyano group or an acyl group, provided that at least two members of Q, M and $L_1$ may combine with each other to form a 5- or 6-membered ring.

[30] The actinic ray-sensitive or radiation-sensitive composition as described in any one of [27] to [29], wherein the compound (C) is a polymer compound further containing a repeating unit represented by the following formula (3):

[Chem. 10]

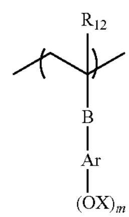

(3)

wherein in formula (3), $R_{12}$ represents a hydrogen atom or a methyl group,

X represents a hydrogen atom or a group having a non-acid-decomposable polycyclic alicyclic hydrocarbon structure, and when a plurality of X are present, at least one of the plurality of X represents a group having a non-acid-decomposable polycyclic alicyclic hydrocarbon structure, Ar represents an aromatic ring group, B represents a single bond or a divalent linking group, and m is an integer of 1 or more.

[31] The actinic ray-sensitive or radiation-sensitive composition as described in any one of [24] to [30], wherein the compound (B) is a compound capable of generating an acid having a size of 200 $Å^3$ or more in volume upon irradiation with an actinic ray or radiation.

[32] A resist film formed using the actinic ray-sensitive or radiation-sensitive composition described in any one of [24] to [31].

[33] A resist-coated mask blanks coated with the resist film described in [32].

[34] A pattern forming method comprising exposing the resist film described in [32] and developing the exposed film.

[35] A pattern forming method comprising exposing the resist-coated mask blanks described in [33] and developing the exposed mask blanks.

[36] The pattern forming method as described in [34] or [35], wherein the exposure is performed using an electron beam, an X-ray or EUV light.

[37] A photomask obtained by exposing and developing the resist-coated mask blanks described in [33].

Advantage of the Invention

According to the present invention, an actinic ray-sensitive or radiation-sensitive composition capable of forming a pattern satisfying all of high sensitivity, high resolution (for example, high resolving power, excellent pattern profile and small line edge roughness (LER)), high aging stability, little scumming and good dry etching resistance at the same time can be provided. More specifically, an actinic ray-sensitive or radiation-sensitive composition where an acid-increasing agent represented by formula (αI) has an ester group, making it possible to achieve a good balance between sensitivity and aging stability, and the acid-increasing agent, when acid-decomposed, generates a carboxylic acid, leading in particular to excellent enhancement of the sensitivity, can be provided.

Also, according to the present invention, a resist film, a resist-coated mask blanks, a resist pattern forming method, and a photomask, each using the actinic ray-sensitive or radiation-sensitive composition above, can be provided.

Furthermore, according to the present invention, an actinic ray-sensitive or radiation-sensitive composition capable of forming a pattern satisfying all of high sensitivity, high resolution (for example, high resolving power, excellent pattern profile and small line edge roughness (LER)), high aging stability and good dry etching resistance at the same time and being reduced in scumming can be provided.

Also, according to the present invention, a resist film, a resist-coated mask blanks, a resist pattern forming method, and a photomask, each using the actinic ray-sensitive or radiation-sensitive composition above, can be provided.

MODE FOR CARRYING OUT THE INVENTION

In the description of the present invention, when a group (atomic group) is denoted without specifying whether substituted or unsubstituted, the group encompasses both a group having no substituent and a group having a substituent. For example, "an alkyl group" encompasses not only an alkyl group having no substituent (unsubstituted alkyl group) but also an alkyl group having a substituent (substituted alkyl group).

In the present invention, the "volume of an acid" means the volume of a region occupied by a van der Waals sphere based on the van der Waals radius of an atom constituting the acid. Specifically, the "volume of an acid" is a volume calculated as follows. That is, first, the most stable conformation of the acid is determined by a molecular force field calculation using an MM3 method. Next, with respect to this most stable conformation, a van der Waals volume is computed by a molecular orbital calculation using a PM3 method. The obtained van der Waals volume is referred to as the "volume of an acid".

In the present invention, the "actinic ray" or "radiation" means, for example, a bright line spectrum of mercury lamp, a far ultraviolet ray typified by excimer laser, an extreme-ultraviolet ray (EUV light), an X-ray or an electron beam. Also, in the present invention, the "light" means an actinic ray or radiation. Unless otherwise indicated, the "exposure" as used in the description of the present invention encompasses not only exposure to a mercury lamp, a far ultraviolet ray typified by excimer laser, an X-ray, EUV light or the like but also lithography with a particle beam such as electron beam and ion beam.

The actinic ray-sensitive or radiation-sensitive composition in a first embodiment of the present invention (hereinafter, sometimes simply referred to as the chemical amplification resist composition of the present invention) contains (α) a compound represented by the following formula (αI) and (β) a compound capable of generating an acid upon irradiation with an actinic ray or radiation:

[Chem. 11]

(αI)

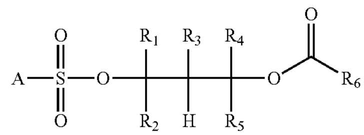

In formula (αI), each of $R_1$ to $R_5$ represents a hydrogen atom or a substituent, and two or more members of $R_1$ to $R_5$ may combine with each other to form a ring. $R_6$ represents a substituent.

A represents a monovalent organic group.

The structure of a 1,3-diol derivative (that is, a compound having a structure where a sulfonyloxy group and an acyloxy group are connected through three carbon atoms) represented by formula (αI) can generate a sulfonic acid by an action of acid (hereinafter, the compound is sometimes referred to as "acid-increasing agent"). The mechanism thereof is not necessarily clarified, but the present inventors believe that a reaction proceeds according to the following scheme 1 or 2:

Presumed Scheme 1:

[Chem. 12]

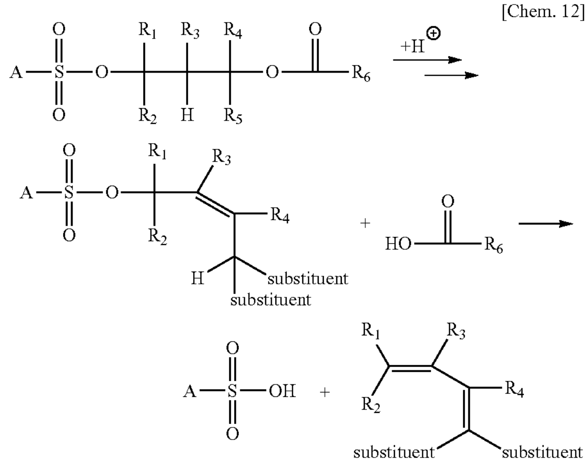

Presumed Scheme 2:

[Chem. 13]

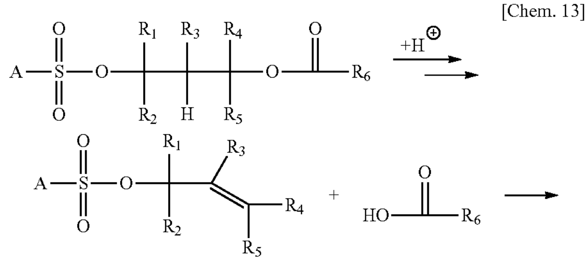

-continued

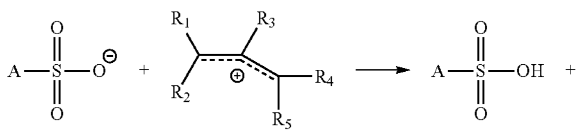

alkene

In the schemes above, each of $R_1$ to $R_5$ represents a hydrogen atom or a substituent, and two or more members of $R_1$ to $R_5$ may combine with each other to form a ring. $R_6$ represents a substituent.

A represents a monovalent organic group.

As shown in the schemes above, the structure represented by formula (αI) produces a carbon-carbon double bond through a dehydration reaction using an acid as the catalyst and subsequently produces a sulfonic acid while producing an alkene or a dialkene.

On the other hand, an acid-increasing agent of a 1,2-diol derivative (that is, an acid-increasing agent having a structure where a sulfonyloxy group and an acyloxy group are connected through two carbon atoms) is known to decompose by the following presumed mechanism, but the reactivity is slightly insufficient and even when used in a chemical amplification resist composition, the sensitivity increasing effect is small. Incidentally, in the scheme below, Ra represents a hydrogen atom or a substituent, Rb represents a substituent, and A represents a monovalent organic group.

[Chem. 14]

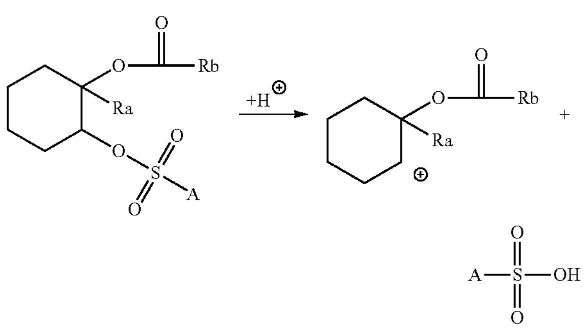

In addition, as shown in the following scheme, a 1,4-diol derivative (that is, a compound having a structure where a sulfonyloxy group and an acyloxy group are connected through four carbon atoms) does not function as an acid-increasing agent. In the scheme below, each of $R_1$ to $R_7$ represents a hydrogen atom or a substituent, two or more members of $R_1$ to $R_7$ may combine with each other to form a ring, $R_8$ represents a substituent, and A represents a monovalent organic group.

[Chem. 15]

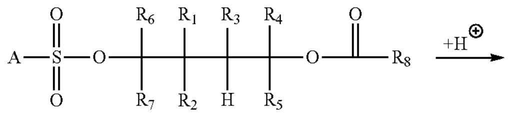

-continued

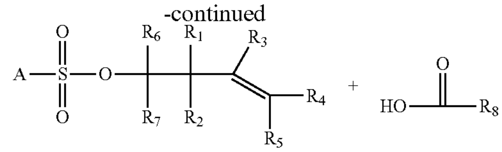

The present inventors have found that the acid-increasing agent having a structure represented by formula (αI) is higher in the acid-increasing ability and aging stability than a conventional acid-increasing agent. The reason therefore is not necessarily clarified, but the present inventors presume as follows. That is, the excellent acid-increasing ability is thought to be attributable to smooth progress of the above-described elimination reaction. Also, the excellent aging stability is thought to be attributable to high thermal stability of the structure containing an acyloxy group.

Accordingly, when this acid-increasing agent is used in a chemical amplification resist composition, a composition excellent in both sensitivity and aging stability can be obtained. Also, use of this acid-increasing agent brings about a rise in the acid generation contrast and therefore, the resolution such as LER is improved. Furthermore, because of a rise in the acid generation contrast, the curability of the resist film in the exposed area is enhanced and in turn, the dry etching resistance is enhanced. In addition, due to a high acid generation contrast between the unexposed portion and the exposed portion, the difference in the dissolution rate contrast for a developer between the unexposed portion and the exposed portion also becomes large, as a result, good reduction in scumming is achieved.

The chemical amplification resist composition according to the present invention is preferably used for electron beam or extreme-ultraviolet exposure.

The chemical amplification resist composition according to the present invention may be a chemical amplification resist composition for negative pattern formation or a chemical amplification resist composition for positive pattern formation.

In the following, respective components of the actinic ray-sensitive or radiation-sensitive composition in a first embodiment of the present invention (the chemical amplification resist composition of the present invention) are described in detail.

<1> (α) Compound Represented by Formula (αI)

The actinic ray-sensitive or radiation-sensitive composition in a first embodiment of the present invention (the chemical amplification resist composition according to the present invention) contains (α) a compound represented by the following formula (αI):

[Chem. 16]

(αI)

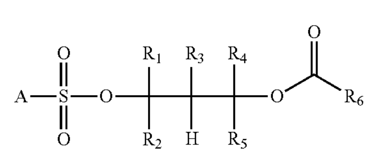

In formula (αI), each of $R_1$ to $R_5$ represents a hydrogen atom or a substituent, and two or more members of $R_1$ to $R_5$ may combine with each other to form a ring. $R_6$ represents a substituent.

A represents a monovalent organic group.

As described above, the composition according to the present invention contains (α) a compound represented by formula (αI) and (β) a photoacid generator. Therefore, when the composition according to the present invention is irradiated with an actinic ray or radiation, the photoacid generator (β) generates an acid. Then, at least a part of the compound (α) represented by formula (αI) contained in the composition decomposes by an action of the acid generated from the photoacid generator (β) and generates a sulfonic acid. Furthermore, the other compound (α) represented by formula (αI) contained in the composition decomposes by an action of the sulfonic acid generated. As a result, the other compound (α) represented by formula (αI) further generates a sulfonic acid.

In this way, the compound (α) represented by formula (αI) according to the present invention has a function as an acid-increasing agent capable of generating an acid in a chain reaction.

The structure represented by formula (αI) is described in detail below.

Each of $R_1$ to $R_5$ represents a hydrogen atom or a substituent, and $R_6$ represents a substituent.

The substituent as $R_1$ to $R_6$ includes, for example, an alkyl group, a cycloalkyl group, an alkenyl group, an alkynyl group, an aryl group, a halogen atom, a hydroxy group, an alkoxy group, an aryloxy group, an alkanoyl group, an alkoxycarbonyl group, an aryloxycarbonyl group, an alkylcarbonyloxy group, an arylcarbonyloxy group, an alkylsulfonyloxy group, an arylsulfonyloxy group, an alkylsulfonyl group, an arylsulfonyl group, a cyano group, an alkylthio group, an arylthio group, and a heterocyclic group.

Each of $R_1$ and $R_2$ is preferably a hydrogen atom, an alkyl group or an alkoxy group, and most preferably a hydrogen atom.

$R_3$ is preferably a hydrogen atom, an alkyl group or an alkoxy group, more preferably a hydrogen atom or an alkyl group, and most preferably a hydrogen atom.

Each of $R_4$ and $R_5$ is preferably a hydrogen atom, an alkyl group, a cycloalkyl group, an aryl group or a cyano group, more preferably a hydrogen atom, an alkyl group, a cycloalkyl group or an aryl group, still more preferably a hydrogen atom, an alkyl group or an aryl group, and most preferably an alkyl group or an aryl group. $R_4$ and $R_5$ are preferably combined with each other to form a ring, more preferably to form an aliphatic hydrocarbon ring having a carbon number of 5 to 7.

$R_6$ is preferably an alkyl group, an aryl group, an alkenyl group, an alkoxy group, an aryloxy group, an alkylamino group, an arylamino group, an alkylthio group or an arylthio group.

The alkyl group is preferably an alkyl group having a carbon number of 1 to 30, and examples thereof include a methyl group, an ethyl group, a propyl group, a butyl group, a hexyl group, an octyl group, a decyl group, a dodecyl group, an octadecyl group, an isopropyl group, an isobutyl group, a sec-butyl group, a tert-butyl group, a 1-ethylpentyl group, a trifluoromethyl group, a 2-ethylhexyl group, a phenacyl group, a 1-naphthoylmethyl group, a 2-naphthoylmethyl group, a 4-methylsulfanylphenacyl group, a 4-phenylsulfanylphenacyl group, a 4-dimethylaminophenacyl group, a 4-cyanophenacyl group, a 4-methylphenacyl group, a 2-methylphenacyl group, a 3-fluorophenacyl group, a 3-trifluoromethylphenacyl group, and a 3-nitrophenacyl group.

The cycloalkyl group may have a monocyclic ring or a polycyclic ring. The cycloalkyl group having a monocyclic ring is preferably a cyclopentyl group, a cyclohexyl group, a cyclooctyl group, etc. The cycloalkyl group having a polycyclic ring is preferably a norbornyl group, a tricyclodecanyl group, a tetracyclodecanyl group, a tetracyclododecanyl group, an adamantyl group, etc. A cycloalkyl group having a carbon number of 3 to 8 is preferred and, for example, a cyclopentyl group and a cyclohexyl group are more preferred.

The alkenyl group is preferably an alkenyl group having a carbon number of 2 to 10, and examples thereof include a vinyl group, an allyl group, and a styryl group.

The alkynyl group is preferably an alkynyl group having a carbon number of 2 to 10, and examples thereof include an ethynyl group, a propynyl group, and a propargyl group.

The aryl group is preferably an aryl group having a carbon number of 6 to 30, and examples thereof include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quaterphenyl group, an o-, m- or p-tolyl group, a xylyl group, an o-, m- or p-cumenyl group, a mesityl group, a pentalenyl group, a binaphthalenyl group, a ternaphthalenyl group, a quaternaphthalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quateranthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group.

The halogen atom includes a fluorine atom, a chlorine atom, a bromine atom, and an iodine atom.

The alkoxy group includes, for example, a methoxy group, an ethoxy group, a propioxy group, an n-butoxy group, a trifluoromethoxy group, a hexyloxy group, a tert-butoxy group, a 2-ethylhexyloxy group, a cyclohexyloxy group, a decyloxy group, and a dodecyloxy group.

The aryloxy group includes, for example, a phenyloxy group, a 1-naphthyloxy group, a 2-naphthyloxy group, a tolyloxy group, a methoxyphenyloxy group, a naphthyloxy group, a chlorophenyloxy group, a trifluoromethylphenyloxy group, a cyanophenyloxy group, and a nitrophenyloxy group.

The alkanoyl group is preferably an alkanoyl group having a carbon number of 2 to 20, and examples thereof include an acetyl group, a propanoyl group, a butanoyl group, a trifluoromethylcarbonyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, and a 4-methoxybenzoyl group.

The alkoxycarbonyl group is preferably an alkoxycarbonyl group having a carbon number of 2 to 20, and examples thereof include a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, and a trifluoromethyloxycarbonyl group.

The aryloxycarbonyl group includes, for example, a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, and a 4-methoxyphenyloxycarbonyl group.

The alkylcarbonyloxy group includes, for example, a methylcarbonyloxy group, an ethylcarbonyloxy group, a propylcarbonyloxy group, a butylcarbonyloxy group, a hexylcarbonyloxy group, an octylcarbonyloxy group, a decylcarbonyloxy group, an octadecylcarbonyloxy group, and a trifluoromethylcarbonyloxy group.

The arylcarbonyloxy group includes, for example, a phenylcarbonyloxy group, a 1-naphthylcarbonyloxy group, a 2-naphthylcarbonyloxy group, a 4-methylsulfanylphenylcarbonyloxy group, a 4-phenylsulfanylphenylcarbonyloxy group, a 4-dimethylaminophenylcarbonyloxy group, a 4-diethylaminophenylcarbonyloxy group, a 2-chlorophenylcarbonyloxy group, a 2-methylphenylcarbonyloxy group, a 2-methoxyphenylcarbonyloxy group, a 2-butoxyphenylcarbonyloxy group, a 3-chlorophenylcarbonyloxy group, a 3-trifluoromethylphenylcarbonyloxy group, a 3-cyanophenylcarbonyloxy group, a 3-nitrophenylcarbonyloxy group, a 4-fluorophenylcarbonyloxy group, a 4-cyanophenylcarbonyloxy group, and a 4-methoxyphenylcarbonyloxy group.

The alkylsulfonyloxy group is preferably an alkylsulfonyloxy group having a carbon number of 1 to 20, and examples thereof include a methylsulfonyloxy group, an ethylsulfonyloxy group, a propylsulfonyloxy group, an isopropylsulfonyloxy group, a butylsulfonyloxy group, a hexylsulfonyloxy group, a cyclohexylsulfonyloxy group, an octylsulfonyloxy group, a 2-ethylhexylsulfonyloxy group, a decanoylsulfonyloxy group, a dodecanoylsulfonyloxy group, an octadecanoylsulfonyloxy group, a cyanomethylsulfonyloxy group, a methoxymethylsulfonyloxy group, and a perfluoroalkylsulfonyloxy group.

The arylsulfonyloxy group is preferably an arylsulfonyloxy group having a carbon number of 6 to 30, and examples thereof include a phenylsulfonyloxy group, a 1-naphthylsulfonyloxy group, a 2-naphthylsulfonyloxy group, a 2-chlorophenylsulfonyloxy group, a 2-methylphenylsulfonyloxy group, a 2-methoxyphenylsulfonyloxy group, a 2-butoxyphenylsulfonyloxy group, a 3-chlorophenylsulfonyloxy group, a 3-trifluoromethylphenylsulfonyloxy group, a 3-cyanophenylsulfonyloxy group, a 3-nitrophenylsulfonyloxy group, a 4-fluorophenylsulfonyloxy group, a 4-cyanophenylsulfonyloxy group, a 4-methoxyphenylsulfonyloxy group, a 4-methylsulfanylphenylsulfonyloxy group, a 4-phenylsulfanylphenylsulfonyloxy group, and a 4-dimethylaminophenylsulfonyloxy group.

The alkylsulfonyl group is preferably an alkylsulfonyl group having a carbon number of 1 to 20, and examples thereof include a methylsulfonyl group, an ethylsulfonyl group, a propylsulfonyl group, an isopropylsulfonyl group, a butylsulfonyl group, a hexylsulfonyl group, a cyclohexylsulfonyl group, an octylsulfonyl group, a 2-ethylhexylsulfonyl group, a decanoylsulfonyl group, a dodecanoylsulfonyl group, an octadecanoylsulfonyl group, a cyanomethylsulfonyl group, a methoxymethylsulfonyl group, and a perfluoroalkylsulfonyl group.

The arylsulfonyl group is preferably an arylsulfonyl group having a carbon number of 6 to 30, and examples thereof include a phenylsulfonyl group, a 1-naphthylsulfonyl group, a 2-naphthylsulfonyl group, a 2-chlorophenylsulfonyl group, a 2-methylphenylsulfonyl group, a 2-methoxyphenylsulfonyl group, a 2-butoxyphenylsulfonyl group, a 3-chlorophenylsulfonyl group, a 3-trifluoromethylphenylsulfonyl group, a 3-cyanophenylsulfonyl group, a 3-nitrophenylsulfonyl group, a 4-fluorophenylsulfonyl group, a 4-cyanophenylsulfonyl group, a 4-methoxyphenylsulfonyl group, a 4-methylsulfanylphenylsulfonyl group, a 4-phenylsulfanylphenylsulfonyl group, and a 4-dimethylaminophenylsulfonyl group.

The alkylthio group includes, for example, a methylthio group, an ethylthio group, a propylthio group, an n-butylthio group, a trifluoromethylthio group, a hexylthio group, a tert-butylthio group, a 2-ethylhexylthio group, a cyclohexylthio group, a decylthio group, and a dodecylthio group.

The arylthio group includes, for example, a phenylthio group, a 1-naphthylthio group, a 2-naphthylthio group, a tolylthio group, a methoxyphenylthio group, a naphthylthio group, a chlorophenylthio group, a trifluoromethylphenylthio group, a cyanophenylthio group, and a nitrophenylthio group.

The heterocyclic group is preferably an aromatic or aliphatic heterocyclic group containing a nitrogen atom, an oxygen atom, a sulfur atom or a phosphorus atom. This heterocyclic group includes, for example, a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxathiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purinyl group, a 4H-quinolizinyl group, an isoquinolyl group, a quinolyl group, a phthalazinyl group, a naphthyridinyl group, a quinoxalinyl group, a quinazolinyl group, a cinnolinyl group, a pteridinyl group, a 4aH-carbazolyl group, a carbazolyl group, a β-carbolinyl group, a phenanthridinyl group, an acridinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a morpholinyl group, and a thioxanthryl group.

Each of these groups as $R_1$ to $R_5$ may further have a substituent, and the substituent which can be substituted on those groups includes, for example, a halogen atom such as fluorine atom, chlorine atom, bromine atom and iodine atom; an alkoxy group such as methoxy group, ethoxy group and tert-butoxy group; an aryloxy group such as phenoxy group and p-tolyloxy group; an alkoxycarbonyl group such as methoxycarbonyl group, butoxycarbonyl group and phenoxycarbonyl group; an acyloxy group such as acetoxy group, propionyloxy group and benzoyloxy group; an acyl group such as acetyl group, benzoyl group, isobutyryl group, acryloyl group, methacryloyl group and methoxalyl group; an alkylsulfanyl group such as methylsulfanyl group and tert-butylsulfanyl group; an arylsulfanyl group such as phenylsulfanyl group and p-tolylsulfanyl group; an alkylamino group such as methylamino group and cyclohexylamino group; a dialkylamino group such as dimethylamino group, diethylamino group, morpholino group and piperidino group; an arylamino group such as phenylamino group and p-tolylamino group; an alkyl group such as methyl group, ethyl group, tert-butyl group and dodecyl group; a cycloalkyl group such as cyclopentyl group, cyclohexyl group and cycloheptyl group; an aryl group such as phenyl group, p-tolyl group, xylyl group, cumenyl group, naphthyl group, anthryl group and phenanthryl group; a hydroxy group; a carboxy group; a formyl group; a mercapto group; a sulfo group; a mesyl group; a p-toluenesulfonyl group; an amino group; a nitro group; a cyano group; a trifluoromethyl group; a trichloromethyl group; a trimethylsilyl group; a phosphinico group; a phosphono group; a trimethylammoniumyl group; a dimethylsulfoniumyl group; and a triphenylphenancylphosphoniumyl group.

As described above, two or more members of $R_1$ to $R_5$ may combine with each other to form a ring. This ring may be an aliphatic or aromatic hydrocarbon ring or may be a heterocyclic ring containing a heteroatom. These $R_1$ to $R_5$ may also form a condensed ring.

The aliphatic or aromatic hydrocarbon ring includes, for example, those having a 6-, 5- or 7-membered ring. The hydrocarbon ring is preferably a 6- or 5-membered ring, more preferably a 5-membered ring.

The heterocyclic ring includes, for example, those containing a sulfur atom, an oxygen atom or a nitrogen atom as the heteroatom. A heterocyclic ring containing a sulfur atom as the heteroatom is preferred.

The condensed ring includes, for example, a condensed ring composed of only a hydrocarbon ring. This polycondensed ring includes, for example, a condensed ring formed by fusing 2 to 4 benzene rings, and a condensed ring formed by fusing a benzene ring and a 5-membered unsaturated ring.

The condensed ring may be a condensed ring containing at least one heterocyclic ring. This condensed ring includes, for example, a condensed ring formed by fusing a benzene ring and a 5-membered heterocyclic ring, and a condensed ring formed by fusing a benzene ring and a 6-membered heterocyclic ring.

The ring structure that can be formed by $R_1$ to $R_5$ includes, for example, a cycloheptane ring, a cyclohexane ring, a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, a dithiolane ring, an oxirane ring, a dioxirane ring, a thiirane ring, a pyrrolidine ring, a piperidine ring, an imidazole ring, an isoxazole ring, a benzodithiol ring, an oxazole ring, a thiazole ring, a benzothiazole ring, a benzimidazole ring, a benzoxazole ring, a pyridine ring, a pyrazine ring, a pyrimidine ring, a pyridazine ring, an indolizine ring, an indole ring, a benzofuran ring, a benzothiophene ring, a benzodithiol ring, an isobenzofuran ring, a quinolizine ring, a quinoline ring, a phthalazine ring, a naphthyridine ring, a quinoxaline ring, a quinazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, and a phenazine ring. Among others, a cycloheptane ring, a cyclohexane ring, a dithiolane ring, a benzodithiol ring, a benzothiazole ring, a benzimidazole ring and a benzoxazole ring are preferred.

$R_1$ to $R_6$ in formula (αI) include, for example, those illustrated in the following chemical formulae. In the following chemical formulae, A has the same meaning as A in formula (αI).

[Chem. 17]

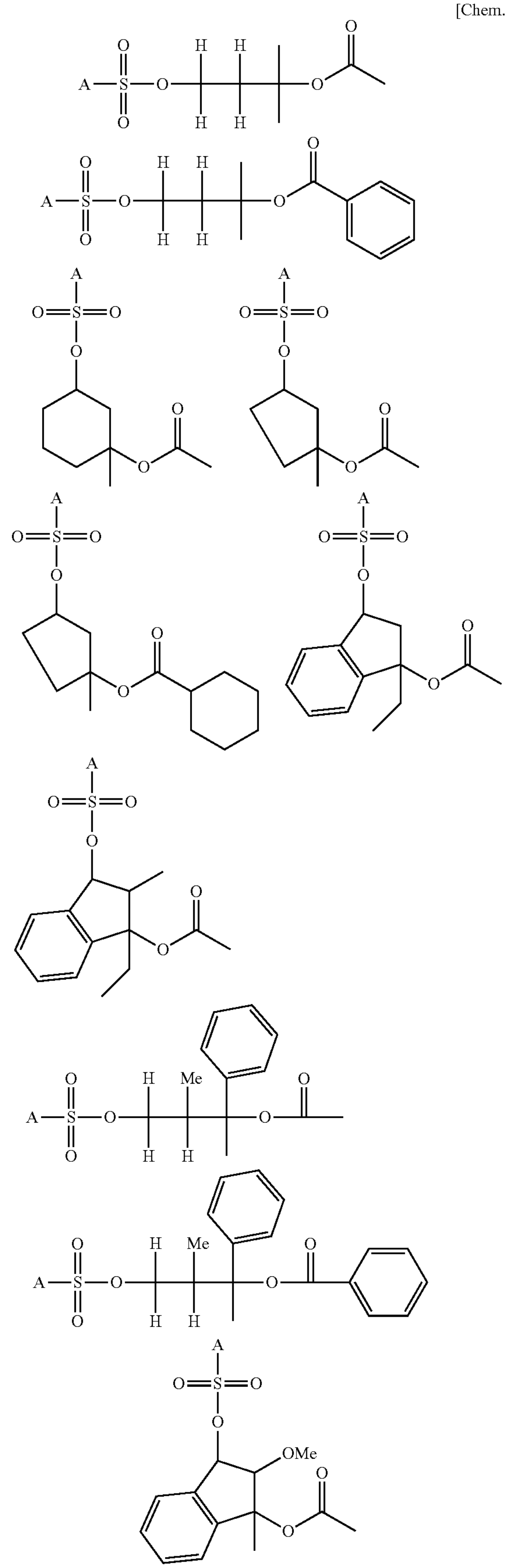

-continued
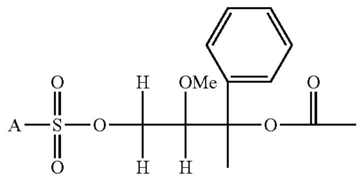
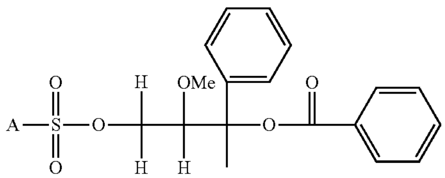
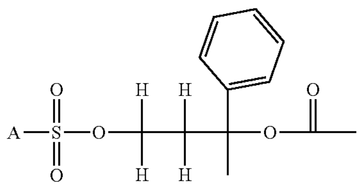
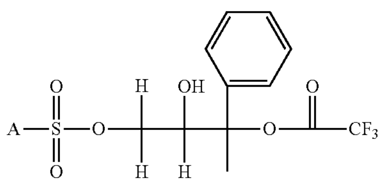
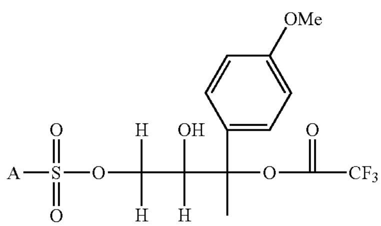
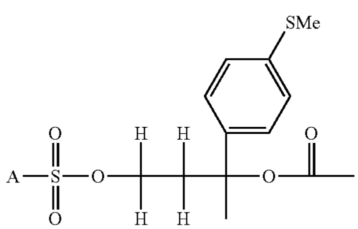
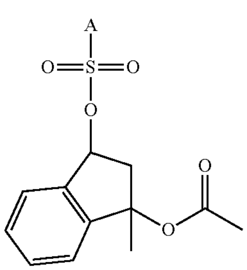
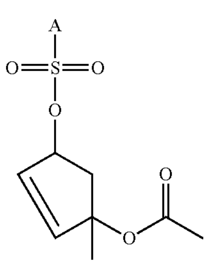
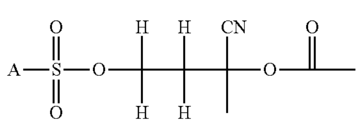
-continued
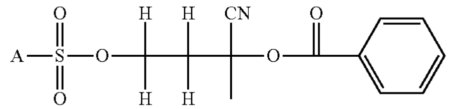
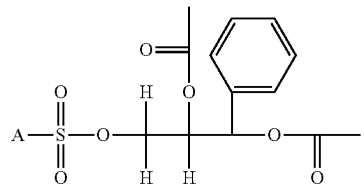
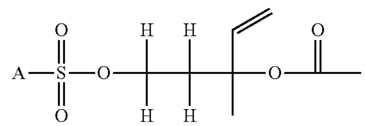
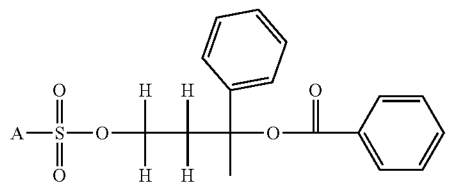
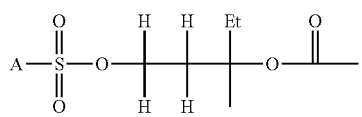
[Chem. 18]
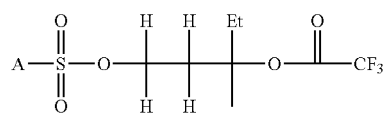
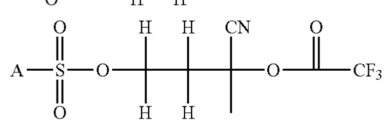
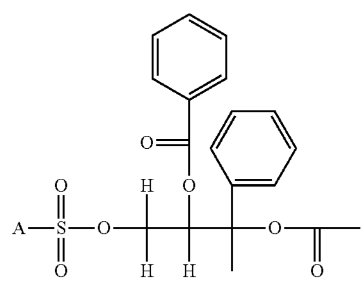
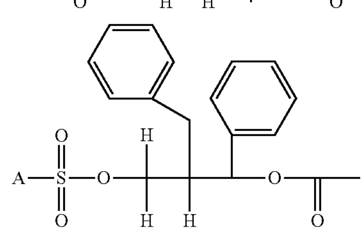
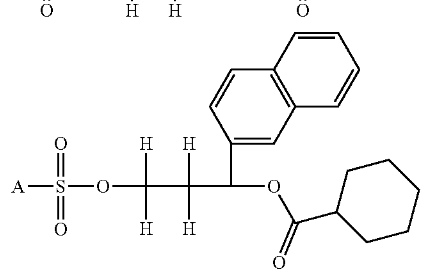

-continued
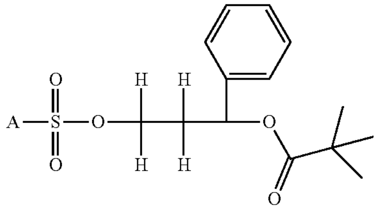
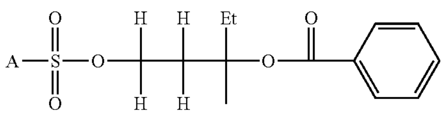
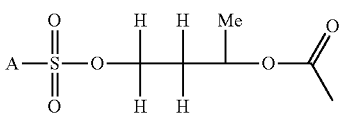
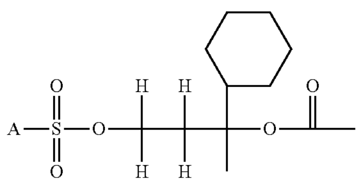
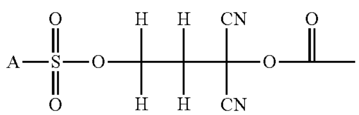
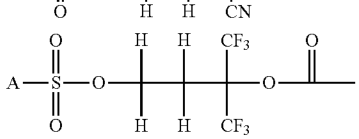
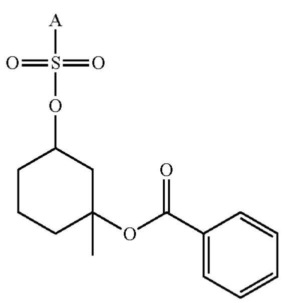
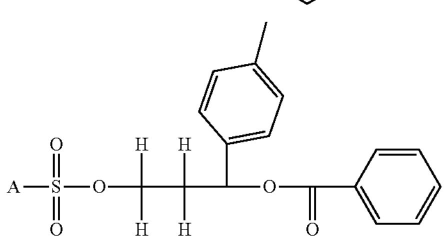
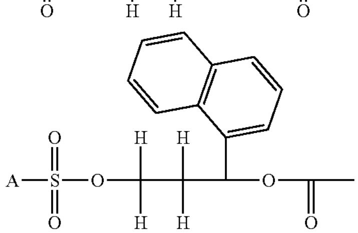
-continued
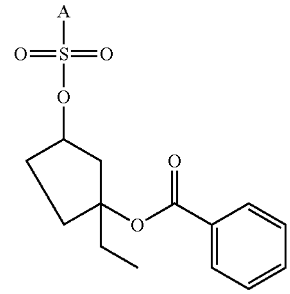
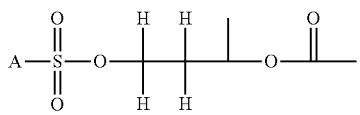
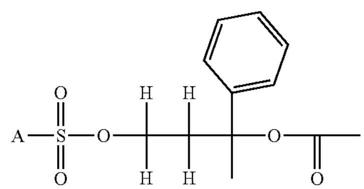
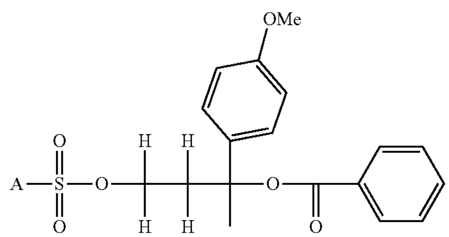
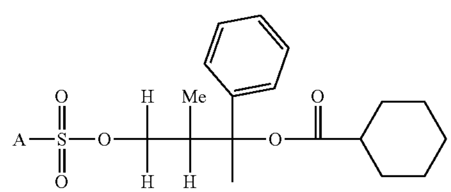
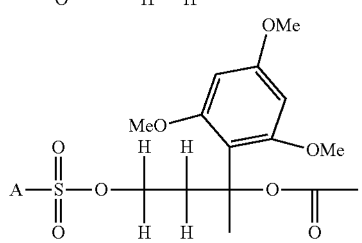
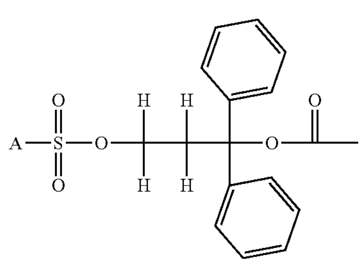
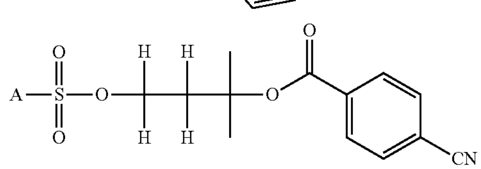

-continued
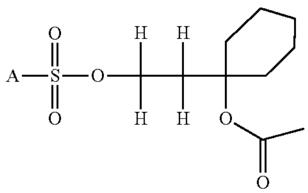
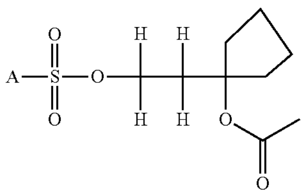
[Chem. 19]
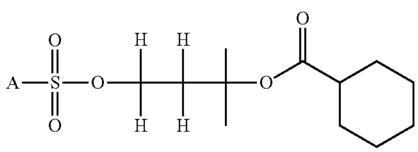
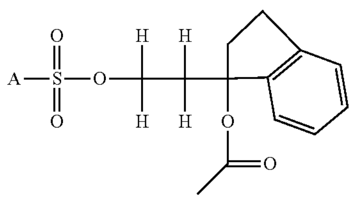
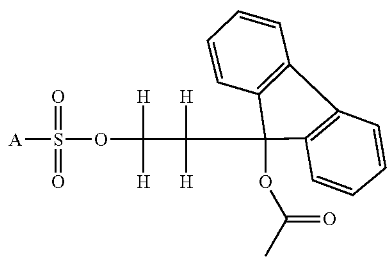
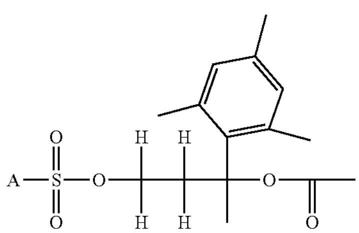
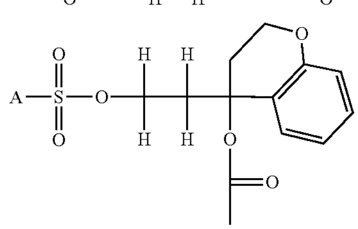
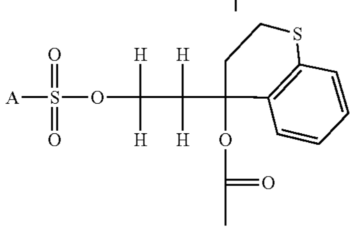
-continued
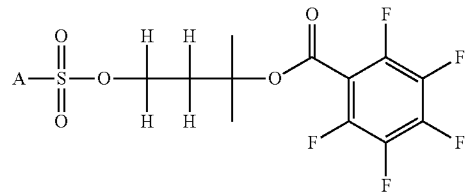
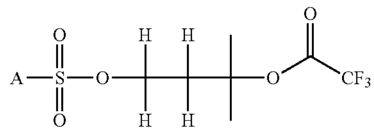
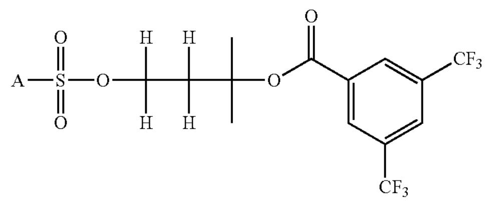
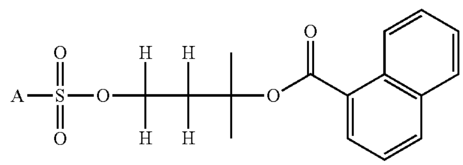
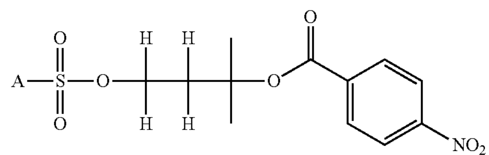
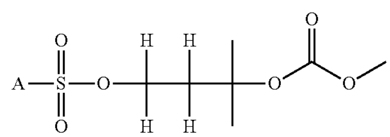
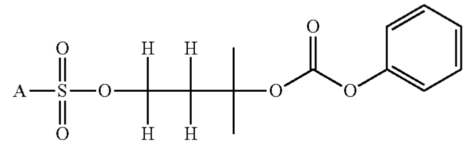
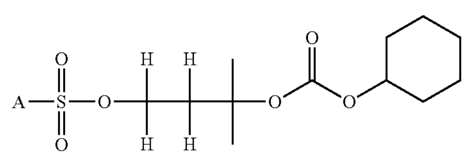
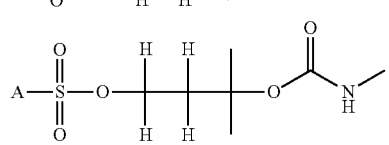
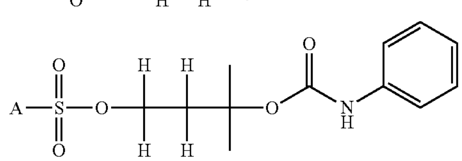
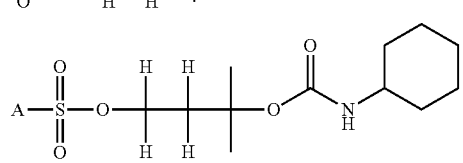

-continued

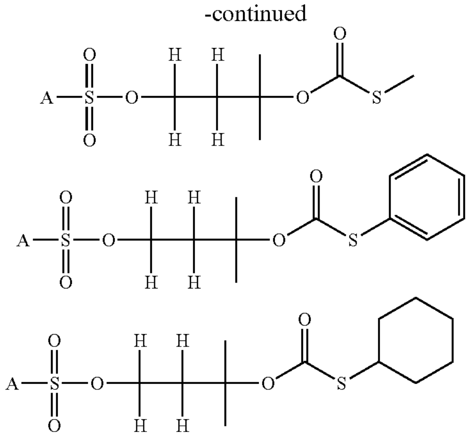

A represents a monovalent organic group. The monovalent organic group is not particularly limited, but A is preferably an alkyl group, a cycloalkyl group or an aromatic group. Each of these alkyl group, cycloalkyl group and aromatic group may have a substituent.

The alkyl group is preferably an alkyl group having a carbon umber of 1 to 30, and examples thereof include a methyl group, an ethyl group, a propyl group, a butyl group, a pentyl group, a hexyl group, a heptyl group, an octyl group, a nonyl group, a decyl group, a dodecyl group, a tetradecyl group, an octadecyl group, an isopropyl group, an isobutyl group, a sec-butyl group, a tert-butyl group, a 1-ethylpentyl group, and a 2-ethylhexyl group.

The cycloalkyl group may be a monocyclic cycloalkyl group or a polycyclic cycloalkyl group. The monocyclic cycloalkyl group includes, for example, a cyclopropyl group, a cyclobutyl group, a cyclopentyl group, a cyclohexyl group, a cycloheptyl group, and a cyclooctyl group. The polycyclic cycloalkyl group includes, for example, an adamantyl group, a norbornyl group, a bornyl group, a camphenyl group, a decahydronaphthyl group, a tricyclodecanyl group, a tetracyclodecanyl group, a camphoroyl group, a dicyclohexyl group, and a pinenyl group. Among these, in view of both the improvement of roughness and the elevation of sensitivity, a polycyclic cycloalkyl group is preferred, and an adamantyl group is most preferred.

The aromatic group includes, for example, a benzene ring, a naphthalene ring, a pentalene ring, an indene ring, an azulene ring, a heptalene ring, an indecene ring, a perylene ring, a pentacene ring, an acenaphthalene ring, a phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolidine ring, a quinoline ring, a phthalazine ring, a naphthylidine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiine ring, a phenothiazine ring, and a phenazine ring. Among these, in view of both the improvement of roughness and the elevation of sensitivity, a benzene ring, a naphthalene ring and an anthracene ring are preferred, and a benzene ring is more preferred.

Examples of the substituent that may be substituted on the alkyl group, cycloalkyl group and aromatic group include a halogen atom such as fluorine atom, chlorine atom, bromine atom and iodine atom; an alkoxy group such as methoxy group, ethoxy group and tert-butoxy group; an aryloxy group such as phenoxy group and p-tolyloxy group; an alkoxycarbonyl group such as methoxycarbonyl group, butoxycarbonyl group and phenoxycarbonyl group; an acyloxy group such as acetoxy group, propionyloxy group and benzoyloxy group; an acyl group such as acetyl group, benzoyl group, isobutyryl group, acryloyl group, methacryloyl group and methoxalyl group; an alkylsulfanyl group such as methylsulfanyl group and tert-butylsulfanyl group; an arylsulfanyl group such as phenylsulfanyl group and p-tolylsulfanyl group; an alkyl group such as methyl group, ethyl group, tert-butyl group and dodecyl group; a cycloalkyl group such as cyclopentyl group, cyclohexyl group, cycloheptyl group and adamantyl group; an aryl group such as phenyl group, p-tolyl group, xylyl group, cumenyl group, naphthyl group, anthryl group and phenanthryl group; a hydroxy group; a carboxy group; a formyl group; a sulfonyl group; a cyano group; an alkylaminocarbonyl group; an arylaminocarbonyl group; a sulfonamide group; a silyl group; an amino group; a thioxy group; and a combination thereof.

A preferably has a ring structure. A is more preferably a residue of a sulfonic acid represented by the formula $A\text{-}SO_3H$, and the sulfonic acid represented by the formula $A\text{-}SO_3H$ is a compound represented by the following formula (II) or (III). The sulfonic acid $A\text{-}SO_3H$ is preferably a compound represented by the following formula (II).

[Chem. 20]

(II)

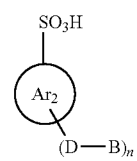

In formula (II), $Ar_2$ represents an aromatic ring and may further have a substituent other than the sulfonic acid group and the -(D-B) group.

n represents an integer of 0 or more. n is preferably an integer of 1 or more, more preferably an integer of 1 to 4, still more preferably 2 or 3, and most preferably 3.

D represents a single bond or a divalent linking group. This divalent linking group is an ether group, a thioether group, a carbonyl group, a sulfoxide group, a sulfone group, a sulfonic acid ester group or an ester group.

B represents a hydrocarbon group.

When n is 2 or more, the plurality of -(D-B) groups may be the same or different.

[Chem. 21]

(III)

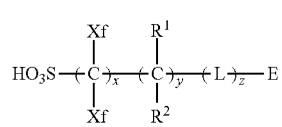

In formula (III), each Xf independently represents a fluorine atom or an alkyl group substituted with at least one fluorine atom.

Each of $R^1$ and $R^2$ independently represents a group selected from a hydrogen atom, a fluorine atom, an alkyl group and an alkyl group substituted with at least one fluorine atom, and when a plurality of $R^1$ or $R^2$ are present, each may be the same as or different from every other member.

L represents a single bond or a divalent linking group, and when a plurality of L are present, each may be the same as or different from every other member.

E represents a group having a ring structure.

x represents an integer of 1 to 20. y represents an integer of 0 to 10. z represents an integer of 0 to 10.

First, the sulfonic acid represented by formula (II) is described in detail below.

In formula (II), $Ar_2$ is preferably an aromatic ring having a carbon number of 6 to 30.

Specifically, the aromatic ring represented by $Ar_2$ is, for example, a benzene ring, a naphthalene ring, a pentalene ring, an indene ring, an azulene ring, a heptalene ring, an indecene ring, a perylene ring, a pentacene ring, an acenaphthalene ring, phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolidine ring, a quinoline ring, a phthalazine ring, a naphthylidine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiine ring, a phenothiazine ring or a phenazine ring. Among others, in view of both the improvement of roughness and the elevation of sensitivity, a benzene ring, a naphthalene ring or an anthracene ring is preferred, and a benzene ring is more preferred.

In the case where $Ar_2$ further has a substituent other than the sulfonic acid group and the -(D-B) group, this substituent includes, for example, the followings. That is, the substituent includes a halogen atom such as fluorine atom, chlorine atom, bromine atom and iodine atom; an alkoxy group such as methoxy group, ethoxy group and tert-butoxy group; an aryloxy group such as phenoxy group and p-tolyloxy group; an alkylthioxy group such as methylthioxy group, ethylthioxy group and tert-butylthioxy group; an arylthioxy group such as phenylthioxy group and p-tolylthioxy group; an alkoxycarbonyl group such as methoxycarbonyl group, butoxycarbonyl group and phenoxycarbonyl group; an acetoxy group; a linear alkyl group and a branched alkyl group, such as methyl group, ethyl group, propyl group, butyl group, heptyl group, hexyl group, dodecyl group and 2-ethylhexyl group; an alkenyl group such as vinyl group, propenyl group and hexenyl group; an acetylene group; an alkynyl group such as propynyl group and hexynyl group; an aryl group such as phenyl group and tolyl group; a hydroxy group; a carboxy group; a mercapto group; and a sulfonic acid group. Among these, from the standpoint of improving the roughness, a linear alkyl group and a branched alkyl group are preferred.

In formula (II), D is preferably a single bond, an ether group or an ester group. D is more preferably a single bond.

In formula (II), B is, for example, an alkyl group, an alkenyl group, an alkynyl group, an aryl group or a cycloalkyl group. B is preferably an alkyl group or a cycloalkyl group. The alkyl group, alkenyl group, alkynyl group, aryl group and cycloalkyl group as B may have a substituent.

The alkyl group as B is preferably a branched alkyl group. This branched alkyl group includes, for example, an isopropyl group, a tert-butyl group, a tert-pentyl group, a neopentyl group, a sec-butyl group, an isobutyl group, an isohexyl group, a 3,3-dimethylpentyl group, and a 2-ethylhexyl group.

The cycloalkyl group as B may be a monocyclic cycloalkyl group or a polycyclic cycloalkyl group. The monocyclic cycloalkyl group includes, for example, a cyclopropyl group, a cyclobutyl group, a cyclopentyl group, a cyclohexyl group, a cycloheptyl group, and a cyclooctyl group. The polycyclic cycloalkyl group includes, for example, an adamantyl group, a norbornyl group, a bornyl group, a camphenyl group, a decahydronaphthyl group, a tricyclodecanyl group, a tetracyclodecanyl group, a camphoroyl group, a dicyclohexyl group, and a pinenyl group.

The alkenyl group as B is preferably an alkenyl group having a carbon number of 2 to 10, and examples thereof include a vinyl group, an allyl group, and a styryl group.

The alkynyl group as B is preferably an alkynyl group having a carbon number of 2 to 10, and examples thereof include an ethynyl group, a propynyl group, and a propargyl group.

The aryl group as B is preferably an aryl group having a carbon number of 6 to 30, and examples thereof include a phenyl group, a biphenyl group, a 1-naphthyl group, and a 2-naphthyl group.

In the case where the alkyl group, alkenyl group, alkynyl group, aryl group and cycloalkyl group as B have a substituent, this substituent includes, for example, the followings. That is, examples of the substituent include a halogen atom such as fluorine atom, chlorine atom, bromine atom and iodine atom; an alkoxy group such as methoxy group, ethoxy group and tert-butoxy group; an aryloxy group such as phenoxy group and p-tolyloxy group; an alkylthioxy group such as methylthioxy group, ethylthioxy group and tert-butylthioxy group; an arylthioxy group such as phenylthioxy group and p-tolylthioxy group; an alkoxycarbonyl group such as methoxycarbonyl group, butoxycarbonyl group and phenoxycarbonyl group; an acetoxy group; a linear alkyl group and a branched alkyl group, such as methyl group, ethyl group, propyl group, butyl group, heptyl group, hexyl group, dodecyl group and 2-ethylhexyl group; a cycloalkyl group such as cyclohexyl group; an alkenyl group such as vinyl group, propenyl group and hexenyl group; an acetylene group; an alkynyl group such as propynyl group and hexynyl group; an aryl group such as phenyl group and tolyl group; a hydroxy group; a carboxy group; a sulfonic acid group; and a carbonyl group. Among these, in view of both the improvement of roughness and the elevation of sensitivity, a linear alkyl group and a branched alkyl group are preferred.

Next, the sulfonic acid represented by formula (III) is described in detail below.

In formula (III), Xf is a fluorine atom or an alkyl group substituted with at least one fluorine atom. This alkyl group is preferably an alkyl group having a carbon number of 1 to 10, more preferably an alkyl group having a carbon number of 1 to 4. The alkyl group substituted with a fluorine atom is preferably a perfluoroalkyl group.

Xf is preferably a fluorine atom or a perfluoroalkyl group having a carbon number of 1 to 4. Specifically, Xf is preferably a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ or $CH_2CH_2C_4F_9$, more preferably a fluorine atom or $CF_3$, and most preferably a fluorine atom.

In formula (III), each of $R^1$ and $R^2$ is a group selected from a hydrogen atom, a fluorine atom, an alkyl group and an alkyl group substituted with at least one fluorine atom. The alkyl group that may be substituted with a fluorine atom is preferably an alkyl group having a carbon number of 1 to 4. Also, among others, the alkyl group substituted with a fluorine atom is preferably a perfluoroalkyl group having a carbon number of 1 to 4. Specifically, this perfluoroalkyl group is $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ or $CH_2CH_2C_4F_9$, preferably $CF_3$.

In formula (III), x is preferably an integer of 1 to 8, more preferably an integer of 1 to 4. y is preferably an integer of 0 to 4, more preferably an integer of 0 to 3, still more preferably 0. z is preferably an integer of 0 to 8, more preferably an integer of 0 to 4, still more preferably an integer of 0 to 3.

In formula (III), L represents a single bond or a divalent linking group. The divalent linking group includes, for example, —COO—, —OCO—, —CONR— (R is a hydrogen atom, an alkyl group or a cycloalkyl group), —NR— (R is a hydrogen atom, an alkyl group or a cycloalkyl group), —CO—, —O—, —S—, —SO—, —$SO_2$—, an alkylene group, a cycloalkylene group, an alkenylene group, a linking group formed by combining a plurality of these members. Among others, the divalent linking group is preferably —COO—, —OCO—, —CONR—, —CO—, —O—, —S—, —SO— or —$SO_2$—, more preferably —COO—, —OCO— or —$SO_2$—.

In formula (III), E represents a group having a ring structure. E includes, for example, a cyclic aliphatic group, an aryl group, and a group having a heterocyclic structure.

The cyclic aliphatic group as E may have a monocyclic structure or a polycyclic structure. The cyclic aliphatic group having a monocyclic structure is preferably a monocyclic cycloalkyl group such as cyclopentyl group, cyclohexyl group and cyclooctyl group. The cyclic aliphatic group having a polycyclic structure is preferably a polycyclic cycloalkyl group such as norbornyl group, tricyclodecanyl group, tetracyclodecanyl group, tetracyclododecanyl group and adamantyl group. Above all, when a cyclic aliphatic group having a bulky structure of 6-membered or higher membered ring is employed as E, in-film diffusion in the PEB (post-exposure baking) step can be suppressed, and resolution and EL (exposure latitude) can be more enhanced.

The aryl group as E is, for example, a benzene ring, a naphthalene ring, a phenanthrene ring or an anthracene ring.

The group having a heterocyclic structure as E may or may not have aromaticity. The heteroatom contained in this group is preferably a nitrogen atom or an oxygen atom. Specific examples of the heterocyclic structure include a furan ring, a thiophene ring, a benzofuran ring, a benzothiophene ring, a dibenzofuran ring, a dibenzothiophene ring, a decahydroquinoline ring, a pyridine ring, a piperidine ring, and a morpholine ring. Among these, a furan ring, a thiophene ring, a decahydroquinoline ring, a pyridine ring, a piperidine ring and a morpholine ring are preferred.

E may have a substituent, and this substituent includes, for example, an alkyl group (may be either linear or branched; preferably having a carbon number of 1 to 12), a cycloalkyl group (preferably having a carbon number of 3 to 12), an aryl group (preferably having a carbon number of 6 to 14), a hydroxy group, an alkoxy group, an ester group, an amido group, a urethane group, a ureido group, a thioether group, a sulfonamido group, and a sulfonic acid ester group.

From the standpoint of not only improving the resolution and pattern profile by preventing the acid generated upon exposure from diffusing into the unexposed area but also achieving good aging stability, the sulfonic acid $ASO_3H$ generated from the compound (α) represented by formula (αI) preferably has a large volume. Specifically, the compound (α) represented by formula (αI) is preferably a compound capable of generating an acid (preferably a sulfonic acid) having a size of 200 Å$^3$ or more in volume, more preferably a compound capable of generating an acid (preferably a sulfonic acid) having a size of 240 Å$^3$ or more in volume, still more preferably a compound capable of generating an acid (preferably a sulfonic acid) having a size of 270 Å$^3$ or more in volume, yet still more preferably a compound capable of generating an acid (preferably a sulfonic acid) having a size of 300 Å$^3$ or more in volume, even yet still more preferably a compound capable of generating an acid (preferably a sulfonic acid) having a size of 400 Å$^3$ or more in volume. However, in view of sensitivity and solubility in the coating solvent, the volume above is preferably 2,000 Å$^3$ or less, more preferably 1,500 Å$^3$ or less. Examples of the volume of sulfonic acid $ASO_3H$ are set forth below together with the structure of the sulfonic acid generated from the acid-increasing agent represented by formula (αI).

Incidentally, a computed volume value is affixed to each of these examples.

This volume value was determined as follows by using "WinMOPAC" produced by Fujitsu Limited. That is, first, the chemical structure of the acid according to each example was input, and next, using this structure as the initial structure, the most stable conformation of each acid was obtained by molecular force field calculation using an MM3 method. Thereafter, with respect to the most stable conformation, molecular orbital calculation using a PM3 method was performed, whereby the "accessible volume" of each acid was computed.

The acid-increasing agent represented by formula (I) according to the present invention is not limited to the below-illustrated compounds capable of generating a sulfonic acid.

[Chem. 22]

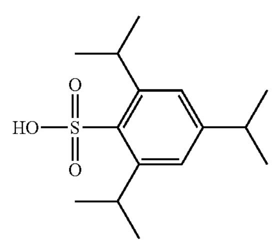

303 Å$^3$

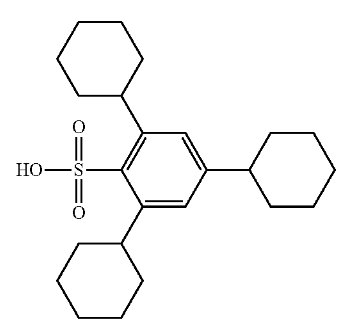

437 Å$^3$

-continued
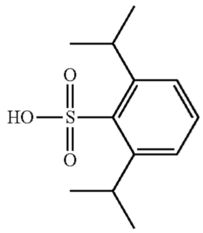
244 Å$^3$
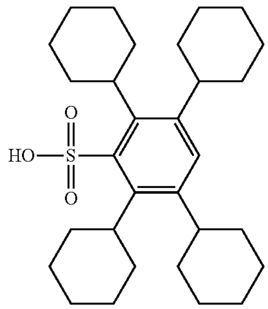
529 Å$^3$
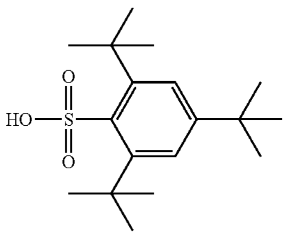
357 Å$^3$
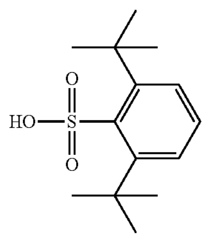
280 Å$^3$
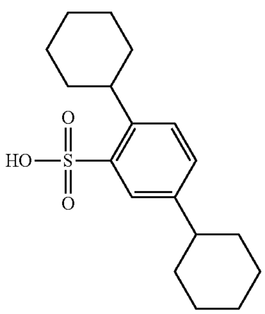
336 Å$^3$
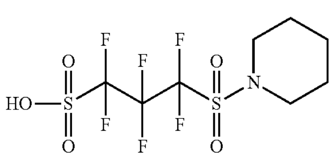
244 Å$^3$
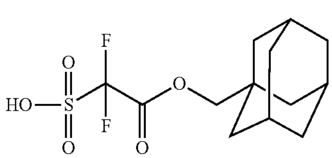
271 Å$^3$
-continued
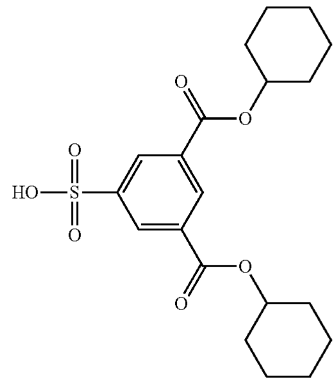
380 Å$^3$
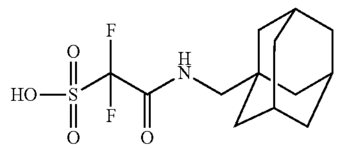
277 Å$^3$
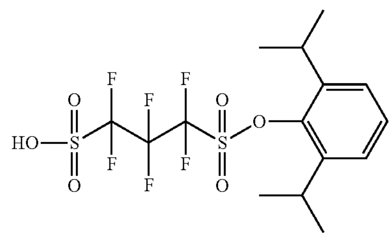
347 Å$^3$
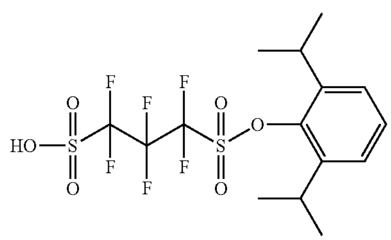
347 Å$^3$
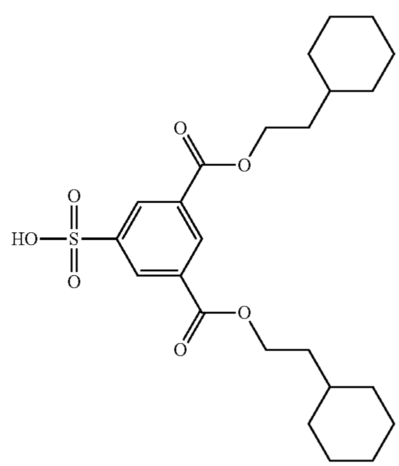
457 Å$^3$ -continued
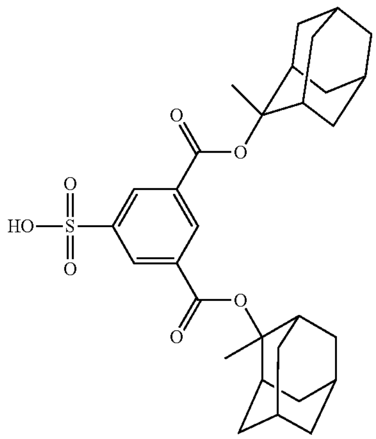
511 Å$^3$
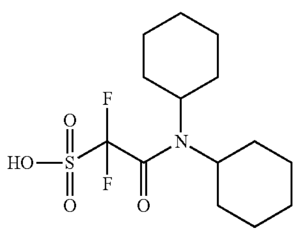
311 Å$^3$
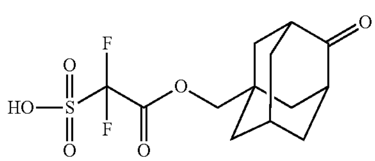
266 Å$^3$
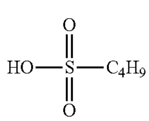
129 Å$^3$
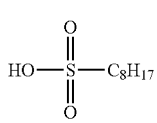
211 Å$^3$
[Chem. 23]
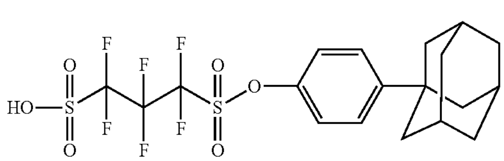
380 Å$^3$
-continued
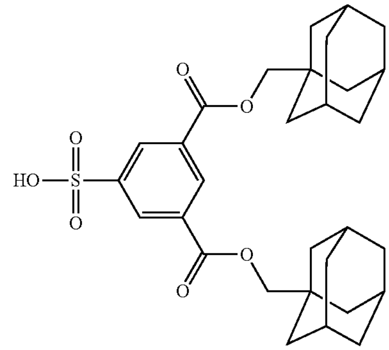
519 Å$^3$
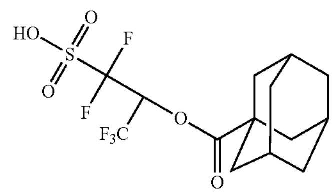
291 Å$^3$
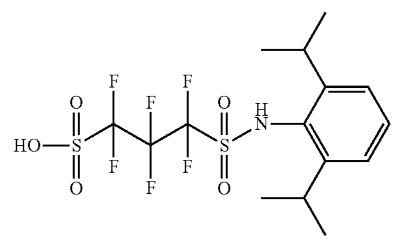
339 Å$^3$
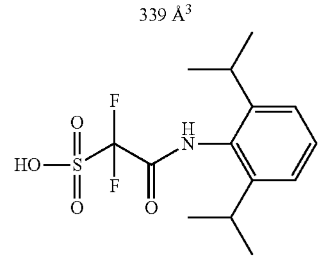
297 Å$^3$
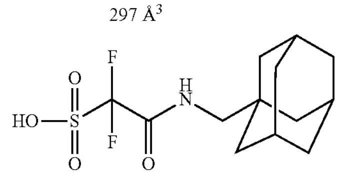
277 Å$^3$
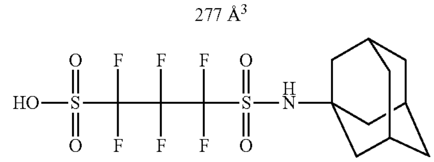
315 Å$^3$ -continued
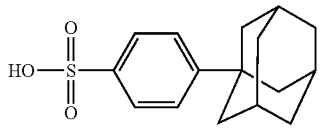
281 Å$^3$
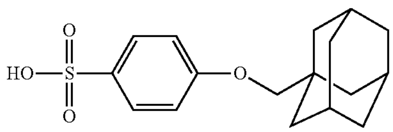
310 Å$^3$
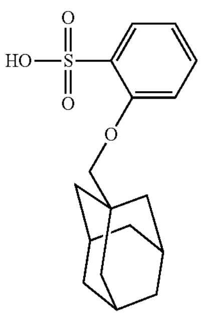
309 Å$^3$
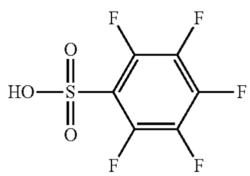
127 Å$^3$
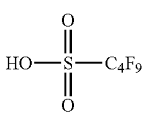
113 Å$^3$
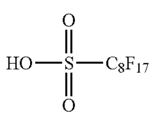
220 Å$^3$
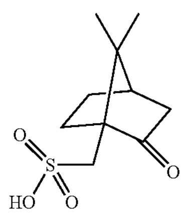
216 Å$^3$
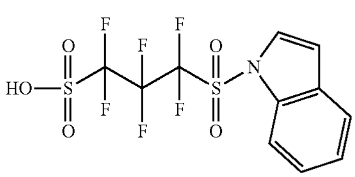
250 Å$^3$
[Chem. 24]
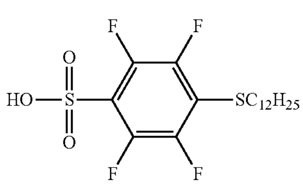
393 Å$^3$
-continued
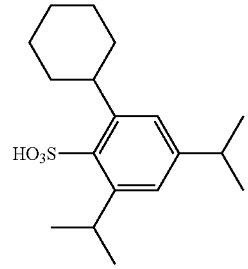
350 Å$^3$
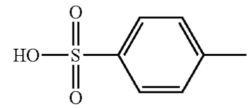
186 Å$^3$
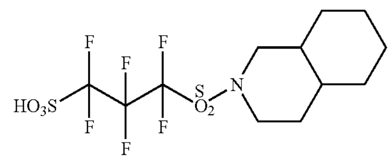
311 Å$^3$
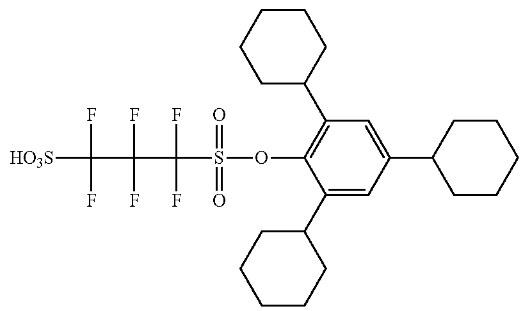
535 Å$^3$
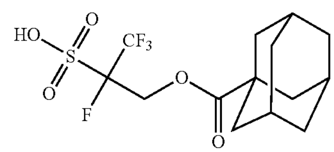
290 Å$^3$
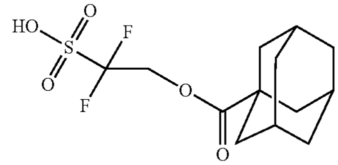
270 Å$^3$
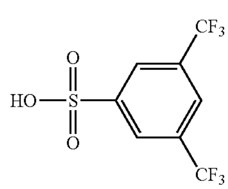
168 Å$^3$
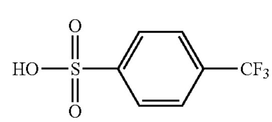
148 Å$^3$
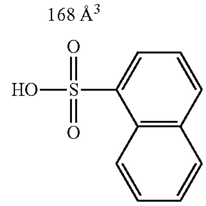
172 Å$^3$
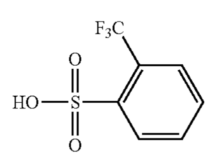
147 Å$^3$ -continued

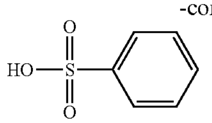

125 Å$^3$

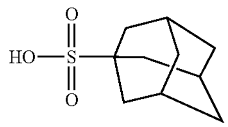

207 Å$^3$

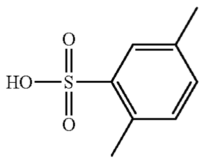

166 Å$^3$

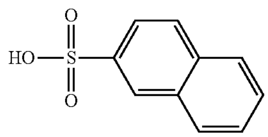

172 Å$^3$

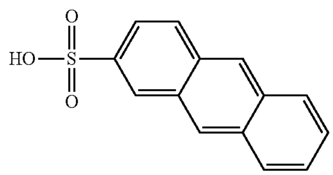

218 Å$^3$

The compound (α) represented by formula (αI) is preferably a compound represented by the following formula (IV).

The present invention also relates to a compound represented by the following formula (IV).

[Chem. 25]

(IV)

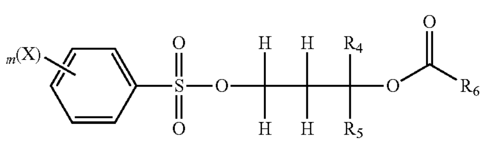

In the formula, each of $R_4$ to $R_6$ represents a hydrogen atom, an alkyl group or an aryl group.

X represents an alkyl group, a cycloalkyl group, a halogen atom, an aryl group or an acyl group. m represents an integer of 0 to 5.

The alkyl group and aryl group of $R_4$ to $R_6$ may have a substituent, and specific examples and preferred examples of the alkyl group and aryl group are the same as those described above for the alkyl group and aryl group of $R_1$ to $R_6$ in formula (αI).

The alkyl group, cycloalkyl group, aryl group and acyl group of X may have a substituent.

Specific examples and preferred examples of the alkyl group, cycloalkyl group, halogen atom, aryl group and acyl group of X are the same as those described above for the alkyl group, cycloalkyl group, halogen atom, aryl group and acyl group of $R_1$ to $R_6$ in formula (αI).

m is preferably an integer of 1 to 3.

As for the compound represented by formula (αI) or (IV), one compound may be used alone, or two or more compounds may be used in combination.

Incidentally, the content of the compound represented by formula (αI) or (IV) is preferably from 0.1 to 40 mass %, more preferably from 0.5 to 30 mass %, still more preferably from 1.0 to 20 mass %, based on the total solid content of the composition.

As for the production method of the compound (α) represented by formula (αI) of the present invention, for example, a corresponding diol compound and a sulfonyl halide or sulfonic anhydride are used and reacted in an inert solvent such as THF, DMF and acetonitrile or a basic solvent such as pyridine in the presence of a base (for example, triethylamine or pyridine), whereby a compound in which one hydroxyl group of the diol is sulfonylated can be synthesized. The reaction temperature is preferably from −10 to 60° C. Subsequently, the compound above and an acid halide or acid anhydride are used and reacted in an inert solvent such as THF, DMF and acetonitrile in the presence of an acid catalyst (for example, cerium trifluoromethanesulfonate or cobalt chloride) or a base (for example, triethylamine, pyridine, dimethylaminopyridine, diisopropylethylamine, butyllithium or an inorganic base), whereby the target compound (α) represented by formula (αI) can be synthesized. The reaction temperature is preferably from −10 to 60° C.

In addition, by using an alkylsulfonyl halide, an arylsulfonyl halide, etc. as the sulfonyl halide and using an acyl halide, an arylcarbonyl halide, etc. as the acid halide, corresponding various sulfonic acid-generating compounds can be synthesized.

<2> (β) Compound Capable of Generating an Acid Upon Irradiation with an Actinic Ray or Radiation The chemical amplification resist composition of the present invention contains (β) a compound capable of generating an acid upon irradiation with an actinic ray or radiation (hereinafter, this compound is sometimes simply referred to as an "acid generator").

A preferred embodiment of the acid generator is an onium compound. The onium compound includes, for example, a sulfonium salt, an iodonium salt, and a phosphonium salt.

Another preferred embodiment of the acid generator is a compound capable of generating a sulfonic acid, an imide acid or a methide acid upon irradiation with an actinic ray or radiation. The acid generator in this embodiment includes, for example, a sulfonium salt, an iodonium salt, a phosphonium salt, an oxime sulfonate, and an imidosulfonate.

The acid generator is preferably a compound capable of generating an acid upon irradiation with an electron beam or an extreme-ultraviolet ray.

In the present invention, preferred onium compounds include a sulfonium compound represented by the following formula (5) and an iodonium compound represented by formula (6):

[Chem. 26]

(5)

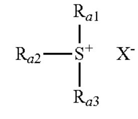

(6)

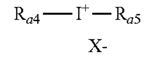

In formulae (5) and (6), each of $R_{a1}$, $R_{a2}$, $R_{a3}$, $R_{a4}$ and $R_{a5}$ independently represents an organic group.

$X^-$ represents an organic anion.

The sulfonium compound represented by formula (5) and the iodonium compound represented by formula (6) are described in more detail below.

Each of $R_{a1}$ to $R_{a3}$ in formula (5) and $R_{a4}$ and $R_{a5}$ in formula (6) independently represents an organic group, but each of at least one of $R_{a1}$ to $R_{a3}$ and at least one of $R_{a4}$ and $R_{a5}$ is preferably an aryl group. The aryl group is preferably a phenyl group or a naphthyl group, more preferably a phenyl group.

The organic anion of $X^-$ in formulae (5) and (6) includes, for example, a sulfonate anion, a carboxylate anion, a bis(alkylsulfonyl)amide anion, and a tris(alkylsulfonyl)methide anion. The organic anion is preferably an organic anion represented by the following formula (7), (8) or (9), more preferably an organic anion represented by the following formula (7):

[Chem. 27]

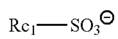

(7)

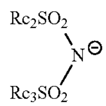

(8)

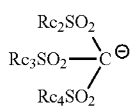

(9)

In formulae (7), (8) and (9), each of $Rc_1$, $Rc_2$, $Rc_3$ and $Rc_4$ represents an organic group.

The organic anion of $X^-$ corresponds to a sulfonic acid, an imide acid, a methide acid, etc., which is an acid generated upon irradiation with an actinic ray or radiation such as electron beam and extreme-ultraviolet ray.

The organic group of $Rc_1$ to $Rc_4$ includes, for example, an alkyl group, a cycloalkyl group, an aryl group, and a group formed by combining a plurality of these groups. Among these organic groups, an alkyl group substituted with a fluorine atom or a fluoroalkyl group at the 1-position, a cycloalkyl group substituted with a fluorine atom or a fluoroalkyl group, and a phenyl group substituted with a fluorine atom or a fluoroalkyl group are preferred. A plurality of organic groups of $R_{c2}$ to $R_{c4}$ may combine with each other to form a ring, and the group formed by combining a plurality of these organic groups is preferably an alkylene group substituted with a fluorine atom or a fluoroalkyl group. By virtue of containing a fluorine atom or a fluoroalkyl group, the acidity of the acid generated upon irradiation with light rises and in turn, the sensitivity is enhanced. However, a fluorine atom is preferably not contained as a substituent in the terminal group.

From the standpoint of improving the resolution and pattern profile by preventing the acid generated upon exposure from diffusing into the unexposed area, the compound (3) capable of generating an acid is preferably a compound capable of generating an acid (preferably a sulfonic acid) having a size of 130 $Å^3$ or more in volume, more preferably a compound capable of generating an acid (preferably a sulfonic acid) having a size of 200 $Å^3$ or more in volume, still more preferably a compound capable of generating an acid (preferably a sulfonic acid) having a size of 240 $Å^3$ or more in volume, yet still more preferably a compound capable of generating an acid (preferably a sulfonic acid) having a size of 400 $Å^3$ or more in volume. However, in view of sensitivity and solubility in the coating solvent, the volume above is preferably 2,000 $Å^3$ or less, more preferably 1,500 $Å^3$ or less.

This volume value is determined using "WinMOPAC" produced by Fujitsu Limited. That is, first, the chemical structure of the acid according to each example is input, and next, using this structure as the initial structure, the most stable conformation of each acid is obtained by molecular force field calculation using an MM3 method. Thereafter, with respect to the most stable conformation, molecular orbital calculation using a PM3 method is performed, whereby the "accessible volume" of each acid can be computed.

Examples of the acid generator, which are particularly preferred in the present invention, are illustrated below. In some of these examples, a computed volume value (unit: $Å^3$) is shown together. The computed value determined here is a volume value of an acid in which a proton is bonded to the anion moiety.

[Chem. 28]

(z1)

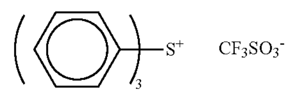

(z2)

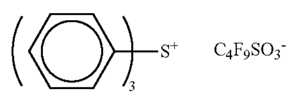

113 $Å^3$ (z3)

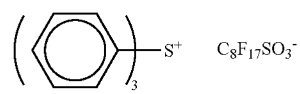

220 $Å^3$ (z4)

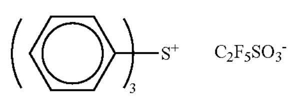

(z5)

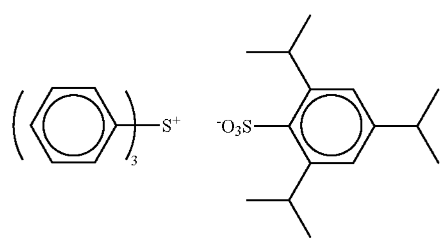

303 $Å^3$ (z6)

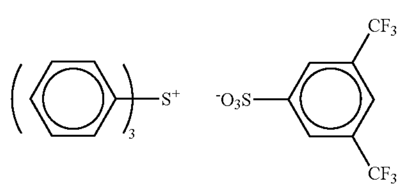

(z7)

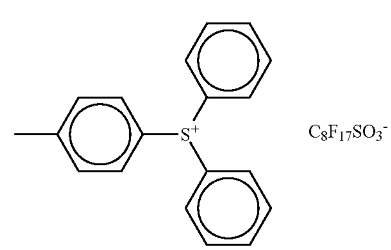

-continued
(z8)
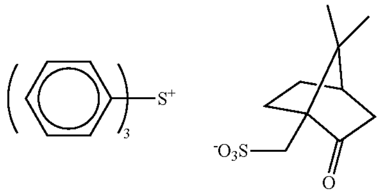
216 Å3
(z9)
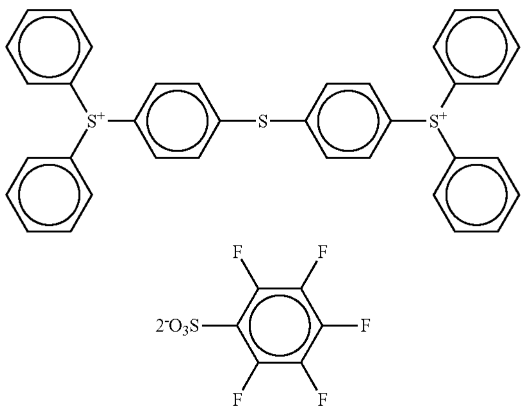
127 Å3
(z10)
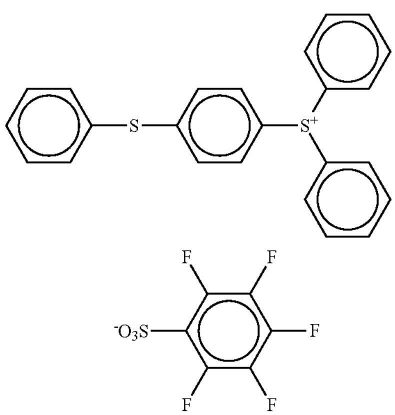
127 Å3
(z11)
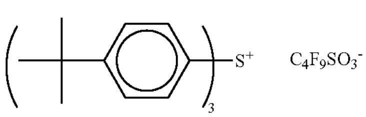
113 Å3
(z12)
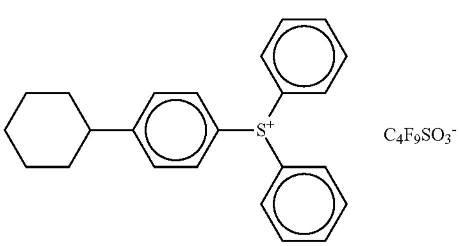
113 Å3
-continued
(z13)
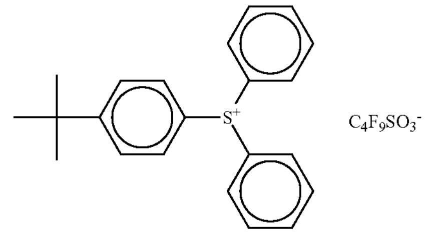
113 Å3
(z14)
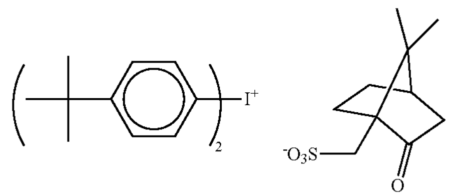
216 Å3
(z15)
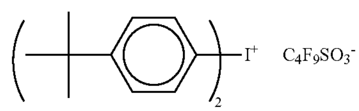
113 Å3
(z16)
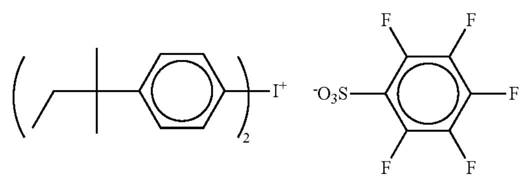
127 Å3
(z17)
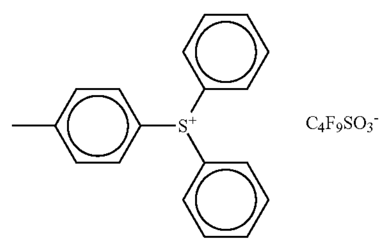
113 Å3
[Chem. 29]
(z18)
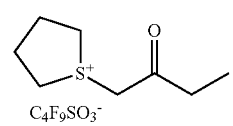
113 Å3
(z19)
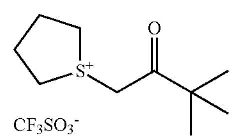
113 Å3

-continued
(z20)
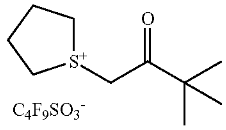
113 Å$^3$
(z21)
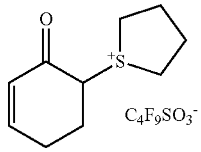
113 Å$^3$
(z22)
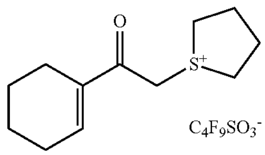
113 Å$^3$
(z23)
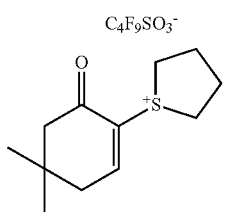
113 Å$^3$
(z24)
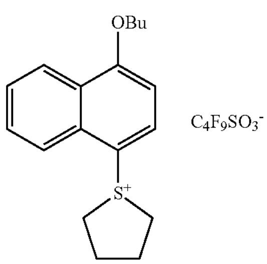
113 Å$^3$
(z25)
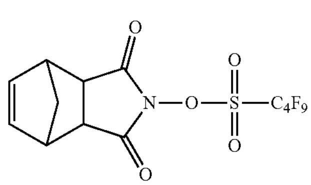
113 Å$^3$
-continued
(z26)
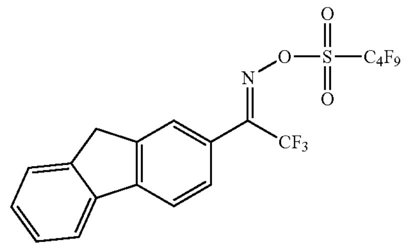
113 Å$^3$
(z27)
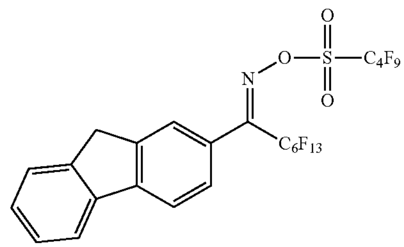
113 Å$^3$
(z28)
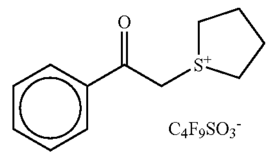
113 Å$^3$
(z29)
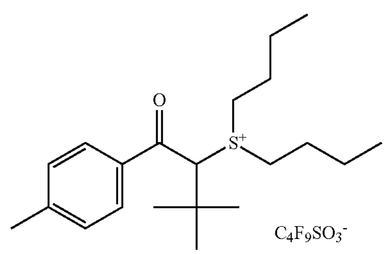
113 Å$^3$
(z30)
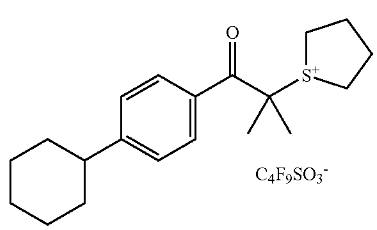
113 Å$^3$
(z31)
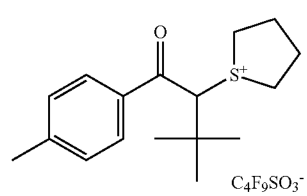
113 Å$^3$ -continued
(z32)
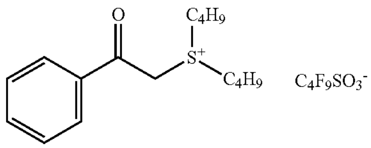
113 Å$^3$
(z33)
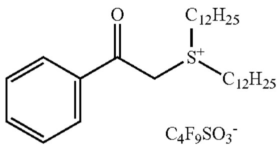
113 Å$^3$
(z34)
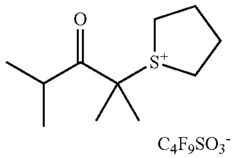
113 Å$^3$
(z35)
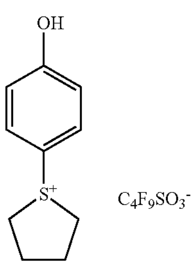
113 Å$^3$
(z36)
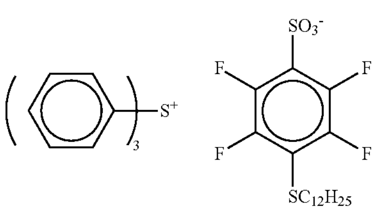
393 Å$^3$
(z37)
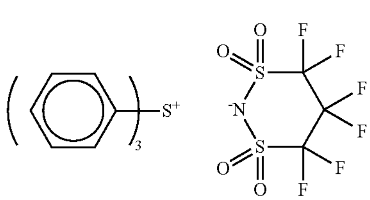
136 Å$^3$
-continued
(z38)
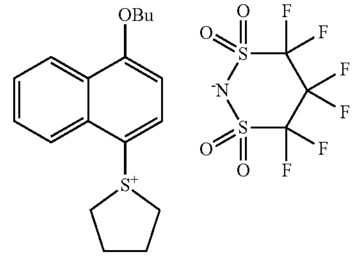
136 Å$^3$
(z39)
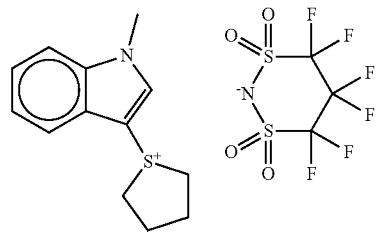
136 Å$^3$
(z40)
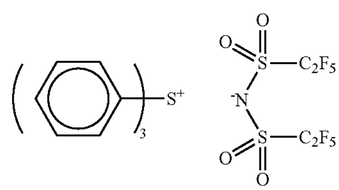
173 Å$^3$
(z41)
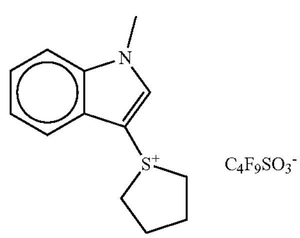
113 Å$^3$
[Chem. 30]
(z42)
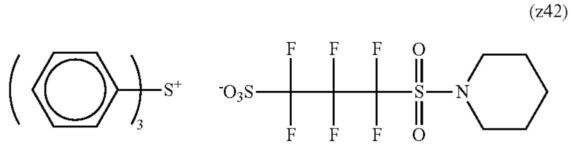
244 Å$^3$ -continued
(z43)
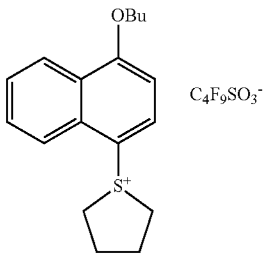
113 Å$^3$
(z44)
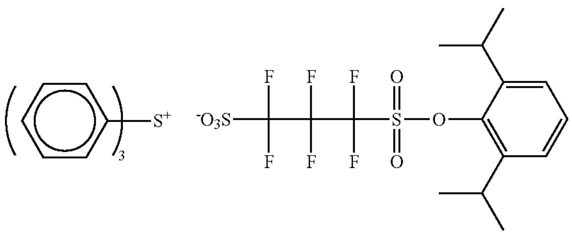
347 Å$^3$
(z45)
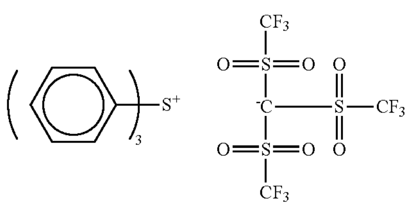
189 Å$^3$
(z46)
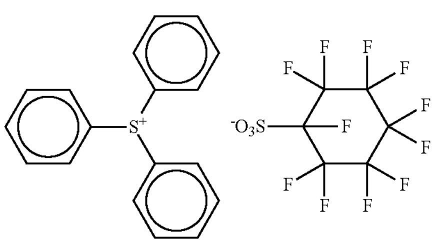
136 Å$^3$
(z47)
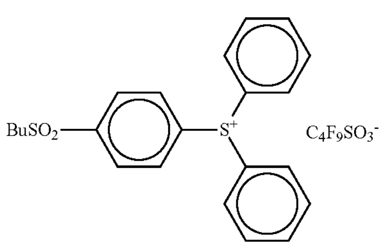
113 Å$^3$
-continued
(z48)
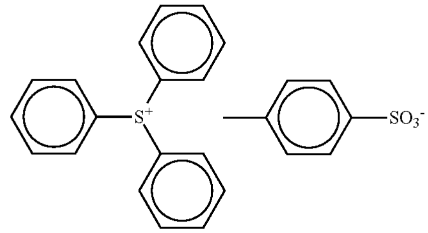
186 Å$^3$
(z49)
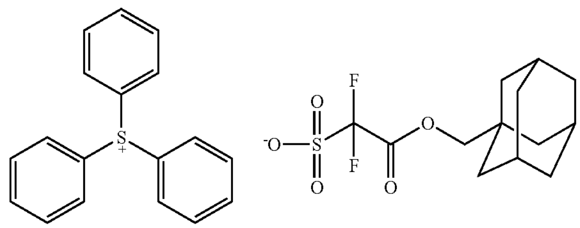
271 Å$^3$
(z50)
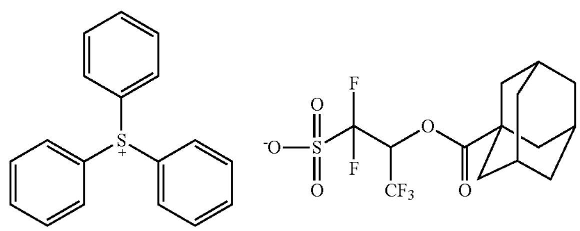
291 Å$^3$
(z51)
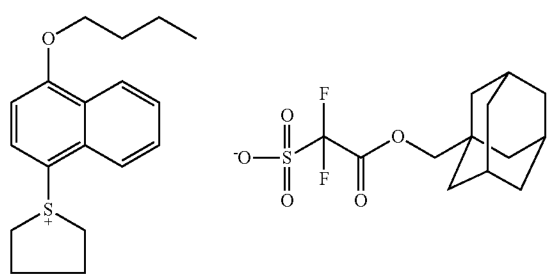
271 Å$^3$
(z52)
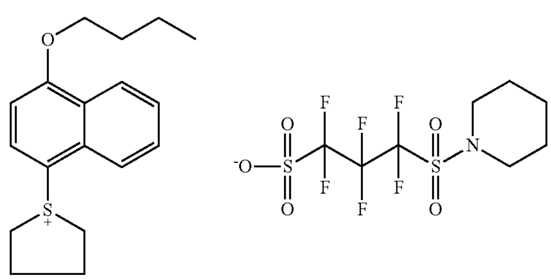
244 Å$^3$ -continued
(z53)
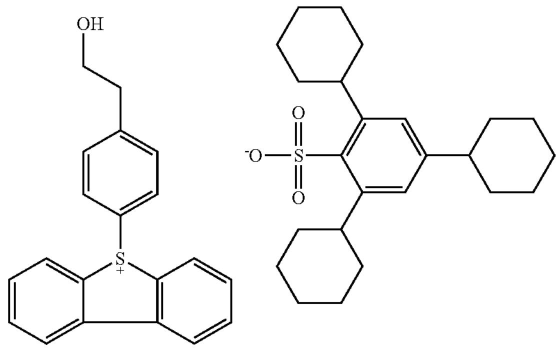
437 Å$^3$
(z54)
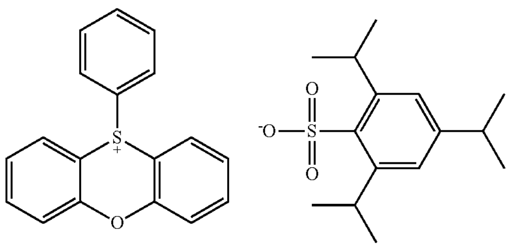
303 Å$^3$
(z55)
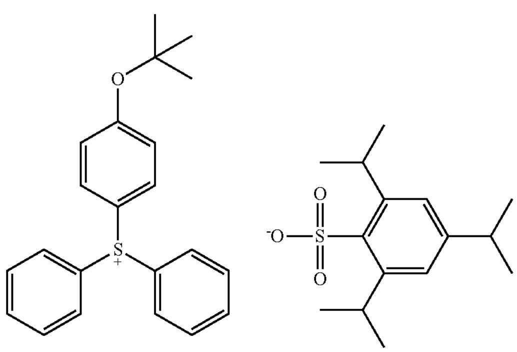
303 Å$^3$
[Chem. 31]
(z56)
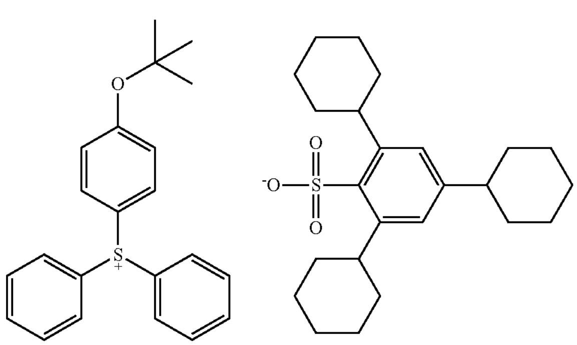
437 Å$^3$
-continued
(z57)
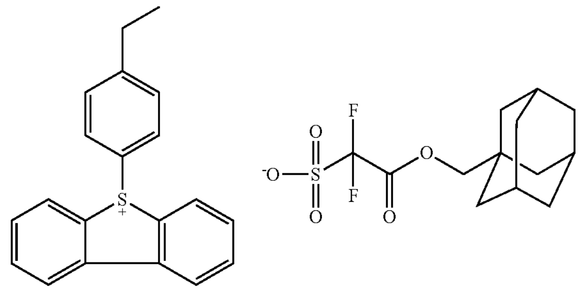
271 Å$^3$
(z58)
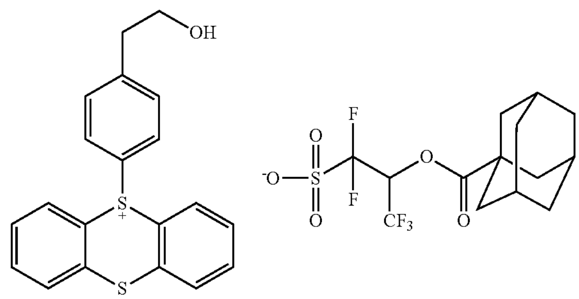
291 Å$^3$
(z59)
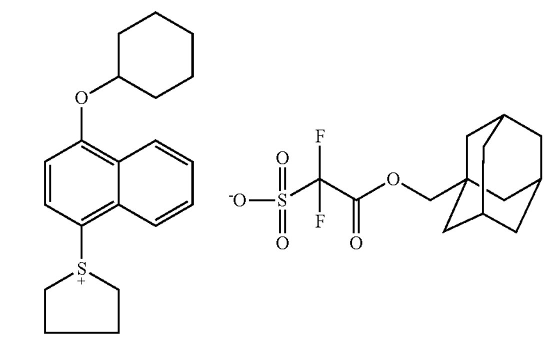
271 Å$^3$
(z60)
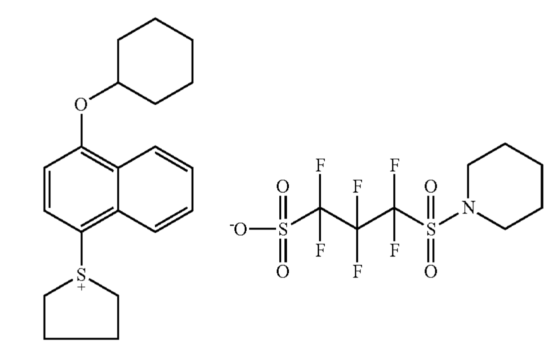
244 Å$^3$ -continued
(z61)
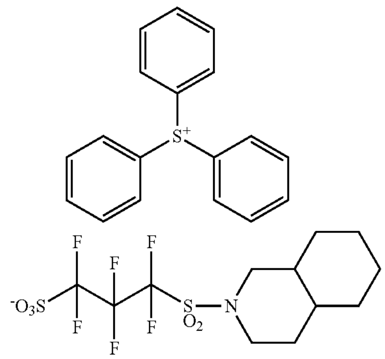
311 Å$^3$
(z62)
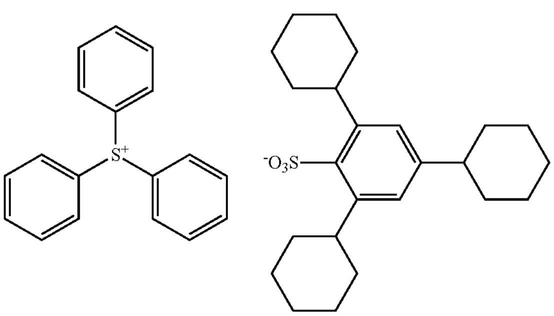
437 Å$^3$
(z63)
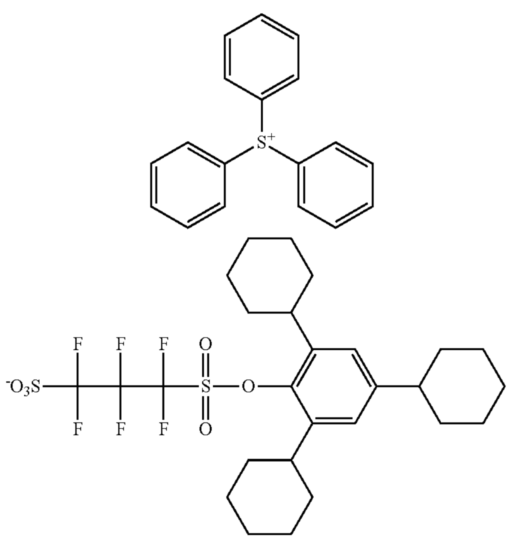
535 Å$^3$
(z64)
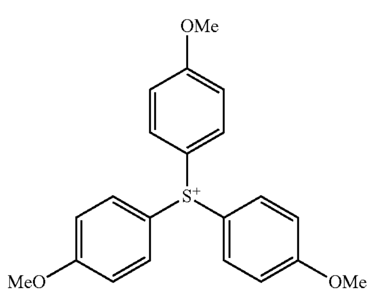
-continued
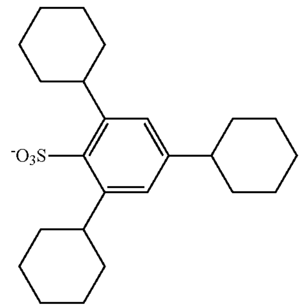
437 Å$^3$
(z65)
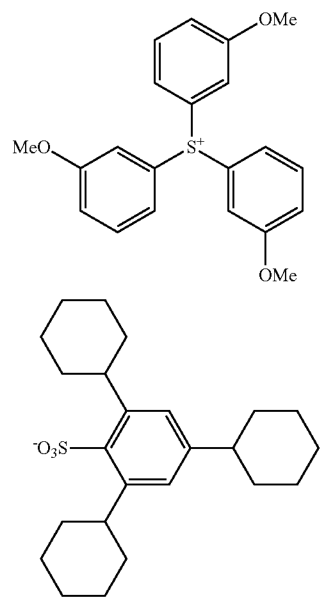
437 Å$^3$
(z66)
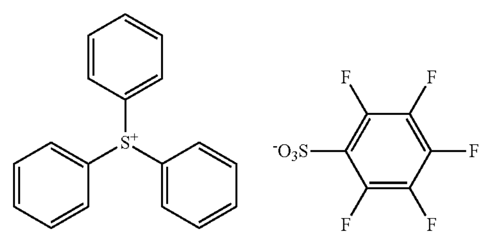
127 Å$^3$
[Chem. 32]
(z67)
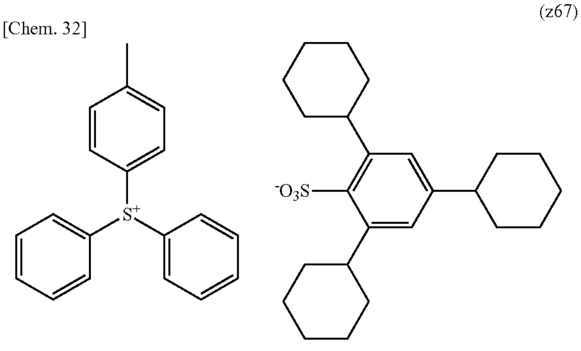
437 Å$^3$ -continued (z68)

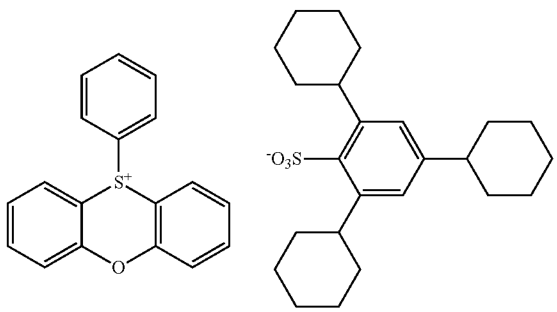

437 Å$^3$

The content of the acid generator (β) in the composition is preferably from 0.1 to 25 mass %, more preferably from 0.5 to 20 mass %, still more preferably from 1 to 18 mass %, based on the total solid content of the resist composition.

As for the acid generator, one compound may be used alone, or two or more compounds may be used in combination.

<3> (γ) Resin Having a Group Capable of Decomposing by an Action of Acid to Increase an Alkali-Soluble Group (Hereinafter, Sometimes Referred to as "Acid-Decomposable Group")

In the case of forming a positive pattern, the chemical amplification resist composition of the present invention preferably contains (γ) a resin having an acid-decomposable group.

This resin may have an acid-decomposable group in ether one or both of the main chain and the side chain of the resin. The resin preferably has an acid-decomposable group in the side chain. Also, the resin (γ) preferably contains a repeating unit having an acid-decomposable group.

The acid-decomposable group is preferably a group formed by replacing the hydrogen atom of an alkali-soluble group such as —COOH group and —OH group by a group capable of leaving by an action of acid. The group capable of leaving by an action of acid is preferably an acetal group or a tertiary ester group.

In the case where the acid-decomposable group is bonded as a side chain, the mother resin includes, for example, an alkali-soluble resin having an —OH or —COOH group in the side chain. Examples of such an alkali-soluble resin include those described later.

The alkali dissolution rate of the alkali-soluble resin is preferably 17 nm/sec or more, more preferably 33 nm/sec or more, as measured (at 23° C.) in an aqueous 2.38 mass % tetramethylammonium hydroxide (TMAH) solution.

From such a standpoint, particularly preferred alkali-soluble resins include a resin containing a hydroxystyrene structural unit, such as o-, m- or p-poly(hydroxystyrene) or a copolymer thereof, hydrogenated poly(hydroxystyrene), halogen- or alkyl-substituted poly(hydroxystyrene), partially O-alkylated or O-acylated poly(hydroxystyrene), styrene-hydroxystyrene copolymer, α-methylstyrene-hydroxystyrene copolymer and hydrogenated novolak resin; and a resin containing a repeating unit having a carboxyl group, such as (meth)acrylic acid and norbornene carboxylic acid.

The repeating unit having a preferable acid-decomposable group includes, for example, a tert-butoxycarbonyloxystyrene, a 1-alkoxyethoxystyrene, and a tertiary alkyl (meth) acrylate. This repeating unit is more preferably a 2-alkyl-2-adamantyl (meth)acrylate or a dialkyl(1-adamantyl)methyl (meth)acrylate.

The resin capable of decomposing by an action of acid to increase the solubility in an alkali developer can be obtained, for example, by reacting a resin with a precursor of a group capable of leaving by an action of acid or by copolymerizing various monomers with an alkali-soluble resin monomer having bonded thereto a group capable of leaving by an action of acid, as disclosed in European Patent 254853, JP-A-2-25850, JP-A-3-223860, JP-A-4-251259, etc.

In the case of irradiating the composition of the present invention with KrF excimer laser light, electron beam, X-ray or high-energy light with a wavelength of 50 nm or less (e.g., EUV), the resin above preferably contains a hydroxystyrene repeating unit. This resin is more preferably a copolymer of hydroxystyrene and hydroxystyrene protected by a group capable of leaving by an action of acid, or a copolymer of hydroxystyrene and tertiary alkyl (meth)acrylate.

Such a resin specifically includes a resin containing a repeating unit represented by the following formula (A):

[Chem. 33]

(A)

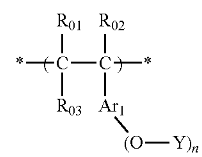

In the formula, each of $R_{01}$, $R_{02}$ and $R_{03}$ independently represents, for example, a hydrogen atom, an alkyl group, a cycloalkyl group, a halogen atom, a cyano group or an alkoxycarbonyl group. $Ar_1$ represents an alkylene group or an aromatic ring group. Incidentally, $R_{03}$ may be an alkylene group and combine with $Ar_1$ as an aromatic ring group to form a ring together with the —C—C— chain. Alternatively, $R_{03}$ and $Ar_1$ may be an alkylene group and both may combine with each other to form, for example, a 5- or 6-membered ring together with the —C—C— chain.

Each of n Y's independently represents a hydrogen atom or a group capable of leaving by an action of acid. However, at least one Y represents a group capable of leaving by an action of acid.

n represents an integer of 1 to 4 and is preferably 1 or 2, more preferably 1.

The alkyl group as $R_{01}$ to $R_{03}$ is, for example, an alkyl group having a carbon number of 20 or less and is preferably a methyl group, an ethyl group, a propyl group, an isopropyl group, an n-butyl group, a sec-butyl group, a hexyl group, a 2-ethylhexyl group, an octyl group or a dodecyl group. The alkyl group is more preferably an alkyl group having a carbon number of 8 or less. These alkyl groups may have a substituent.

As the alkyl group contained in the alkoxycarbonyl group, the same alkyl group as in $R_{01}$ to $R_{03}$ is preferred.

The cycloalkyl group may be either a monocyclic cycloalkyl group or a polycyclic cycloalkyl group. The cycloalkyl group is preferably a monocyclic cycloalkyl group having a carbon number of 3 to 8, such as cyclopropyl group, cyclopentyl group and cyclohexyl group. These cycloalkyl groups may have a substituent.

The halogen atom includes a fluorine atom, a chlorine atom, a bromine atom, and an iodine atom, with a fluorine atom being preferred.

In the case where $R_{03}$ represents an alkylene group, this alkylene group is preferably an alkylene group having a carbon number of 1 to 8, such as methylene group, ethylene group, propylene group, butylene group, hexylene group and octylene group.

The aromatic ring group as $Ar_1$ is preferably an aromatic ring group having a carbon number of 6 to 14, and examples thereof include a benzene ring, a toluene ring, and a naphthalene ring. These aromatic rings may have a substituent.

The group Y capable of leaving by an action of acid includes, for example, the groups represented by —C($R_{36}$)($R_{37}$)($R_{38}$), —C(═O)—O—C($R_{36}$)($R_{37}$)($R_{38}$), —C($R_{01}$)($R_{02}$)($R_{39}$), —C($R_{01}$)($R_{02}$)—C(═O)—O—C($R_{36}$)($R_{37}$)($R_{38}$), and —CH($R_{36}$)(Ar).

In the formulae, each of $R_{36}$ to $R_{39}$ independently represents an alkyl group, a cycloalkyl group, an aryl group, an aralkyl group or an alkenyl group. $R_{36}$ and $R_{37}$ may combine with each other to form a ring structure.

Each of $R_{01}$ and $R_{02}$ independently represents a hydrogen atom, an alkyl group, a cycloalkyl group, an aryl group, an aralkyl group or an alkenyl group.

Ar represents an aryl group.

The alkyl group as $R_{36}$ to $R_{39}$, $R_{01}$ or $R_{02}$ is preferably an alkyl group having a carbon number of 1 to 8, and examples thereof include a methyl group, an ethyl group, a propyl group, an n-butyl group, a sec-butyl group, a hexyl group, and an octyl group.

The cycloalkyl group as $R_{36}$ to $R_{39}$, $R_{01}$ or $R_{02}$ may be a monocyclic cycloalkyl group or a polycyclic cycloalkyl group. The monocyclic cycloalkyl group is preferably a cycloalkyl group having a carbon number of 3 to 8, and examples thereof include a cyclopropyl group, a cyclobutyl group, a cyclopentyl group, a cyclohexyl group, and a cyclooctyl group. The polycyclic cycloalkyl group is preferably a cycloalkyl group having a carbon number of 6 to 20, and examples thereof include an adamantyl group, a norbornyl group, an isoboronyl group, a camphanyl group, a dicyclopentyl group, an α-pinel group, a tricyclodecanyl group, a tetracyclododecyl group, and an androstanyl group. Incidentally, a part of carbon atoms in the cycloalkyl group may be substituted with a heteroatom such as oxygen atom.

The aryl group as $R_{36}$ to $R_{39}$, $R_{01}$, $R_{02}$ or Ar is preferably an aryl group having a carbon number of 6 to 10, and examples thereof include a phenyl group, a naphthyl group, and an anthryl group.

The aralkyl group as $R_{36}$ to $R_{39}$, $R_{01}$ or $R_{02}$ is preferably an aralkyl group having a carbon number of 7 to 12, and preferred examples thereof include a benzyl group, a phenethyl group, and a naphthylmethyl group.

The alkenyl group as $R_{36}$ to $R_{39}$, $R_{01}$ or $R_{02}$ is preferably an alkenyl group having a carbon number of 2 to 8, and examples thereof include a vinyl group, an allyl group, a butenyl group, and a cyclohexenyl group.

The aryl group as $R_{36}$ to $R_{39}$, $R_{01}$, $R_{02}$ or Ar is preferably an aryl group having a carbon number of 6 to 10, and examples thereof include a phenyl group, a naphthyl group, and an anthryl group.

The aralkyl group as $R_{36}$ to $R_{39}$, $R_{01}$ or $R_{02}$ is preferably an aralkyl group having a carbon number of 7 to 12, and preferred examples thereof include a benzyl group, a phenethyl group, and a naphthylmethyl group.

The alkenyl group as $R_{36}$ to $R_{39}$, $R_{01}$ or $R_{02}$ is preferably an alkenyl group having a carbon number of 2 to 8, and examples thereof include a vinyl group, an allyl group, a butenyl group, and a cyclohexenyl group.

The ring that may be formed by combining $R_{36}$ and $R_{37}$ with each other may be either a monocyclic type or a polycyclic type. The monocyclic type is preferably a cycloalkane structure having a carbon number of 3 to 8, and examples thereof include a cyclopropane structure, a cyclobutane structure, a cyclopentane structure, a cyclohexane structure, a cycloheptane structure, and a cyclooctane structure. The polycyclic type is preferably a cycloalkane structure having a carbon number of 6 to 20, and examples thereof include an adamantane structure, a norbornane structure, a dicyclopentane structure, a tricyclodecane structure, and a tetracyclododecane structure. Incidentally, a part of carbon atoms in the ring structure may be substituted with a heteroatom such as oxygen atom.

Each of the groups above may have a substituent. This substituent includes, for example, an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group. The carbon number of the substituent is preferably 8 or less.

The resin may have a structure where a plurality of repeating units represented by formula (A) are combined with each other at the portion of the group Y capable of leaving by an action of acid.

The group Y capable of leaving by an action of acid is more preferably a structure represented by the following formula (B):

[Chem. 34]

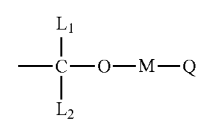

(B)

In the formula, each of $L_1$ and $L_2$ independently represents a hydrogen atom, an alkyl group, a cycloalkyl group, an aryl group or an aralkyl group.

M represents a single bond or a divalent linking group.

Q represents an alkyl group, a cycloalkyl group, a cyclic aliphatic group, an aromatic ring group, an amino group, an ammonium group, a mercapto group, a cyano group or an aldehyde group. The cyclic aliphatic group and the aromatic ring group may contain a heteroatom.

At least two members of Q, M and $L_1$ may combine with each other to form a 5- or 6-membered ring.

The alkyl group as $L_1$ and $L_2$ is, for example, an alkyl group having a carbon number of 1 to 8 and specifically includes a methyl group, an ethyl group, a propyl group, an n-butyl group, a sec-butyl group, a hexyl group, and an octyl group.

The cycloalkyl group as $L_1$ and $L_2$ is, for example, a cycloalkyl group having a carbon number of 3 to 15 and specifically includes a cyclopentyl group, a cyclohexyl group, a norbornyl group, and an adamantyl group.

The aryl group as $L_1$ and $L_2$ is, for example, an aryl group having a carbon number of 6 to 15 and specifically includes a phenyl group, a tolyl group, a naphthyl group, and an anthryl group.

The aralkyl group as $L_1$ and $L_2$ is, for example, an aralkyl group having a carbon number of 6 to 20 and specifically includes a benzyl group and a phenethyl group.

The divalent linking group as M is, for example, an alkylene group (e.g., methylene, ethylene, propylene, butylene, hexylene, octylene), a cycloalkylene group (e.g., cyclopentylene, cyclohexylene), an alkenylene group (e.g., ethenylene, propenylene, butenylene), an arylene group (e.g., phenylene, tolylene, naphthylene), —S—, —O—, —CO—, —$SO_2$—, —N($R_0$)—, or a combination of two or more thereof. Here, $R_0$ is a hydrogen atom or an alkyl group. The alkyl group as $R_0$ is, for example, an alkyl group having a carbon number of 1 to 8 and specifically includes a methyl group, an ethyl group, a propyl group, an n-butyl group, a sec-butyl group, a hexyl group, and an octyl group.

Examples of the alkyl group and cycloalkyl group as Q are the same as those of respective groups of $L_1$ and $L_2$.

The cyclic aliphatic group and aromatic ring group as Q include, for example, the above-described cycloalkyl group and aryl group as $L_1$ and $L_2$. These cycloalkyl group and aryl group are preferably a group having a carbon number of 3 to 15.

The heteroatom-containing cyclic aliphatic group or aromatic ring group as Q includes, for example, a group having a heterocyclic structure, such as thiirane, cyclothiolane, thiophene, furan, pyrrole, benzothiophene, benzofuran, benzopyrrole, triazine, imidazole, benzimidazole, triazole, thiadiazole, thiazole and pyrrolidone, but the ring is not limited thereto as long as it is a ring composed of carbon and a heteroatom or a ring composed of only a hetero atom.

The ring structure that may be formed by combining at least two members of Q, M and $L_1$ with each other includes, for example, a 5- or 6-membered ring structure where a propylene group or a butylene group is formed by the members above. Incidentally, this 5- or 6-membered ring structure contains an oxygen atom.

Each of the groups represented by $L_1$, $L_2$, M and Q in formula (2) may have a substituent. This substituent includes, for example, an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group. The carbon number of the substituent is preferably 8 or less.

The group represented by -(M-Q) is preferably a group having a carbon number of 1 to 30, more preferably a group having a carbon number of 5 to 20. Above all, in view of outgassing reduction, a group having a carbon number of 6 or more is preferred.

Specific examples of the repeating unit represented by formula (A) are illustrated below, but the present invention is not limited thereto.

[Chem. 35]

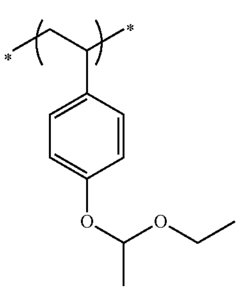

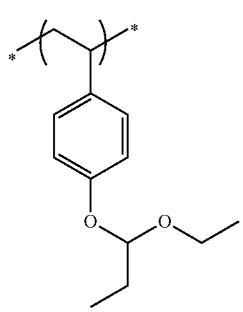

-continued

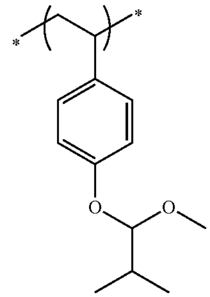

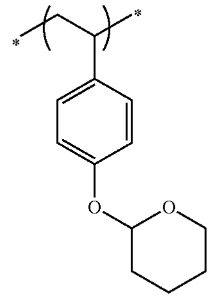

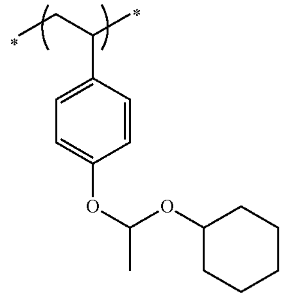

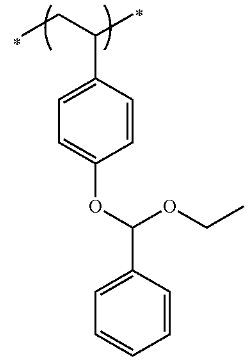

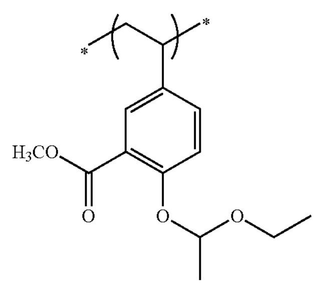

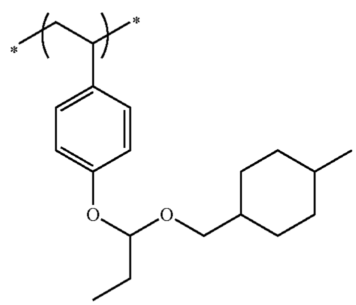

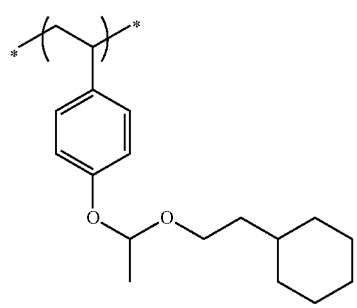

-continued
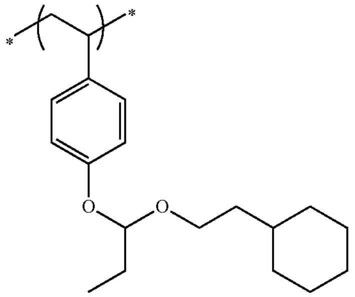
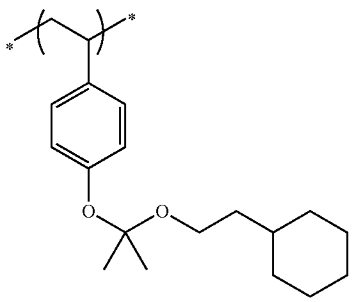
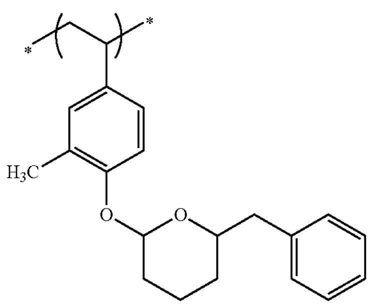
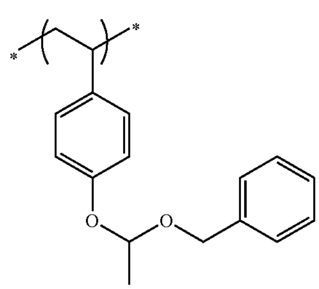
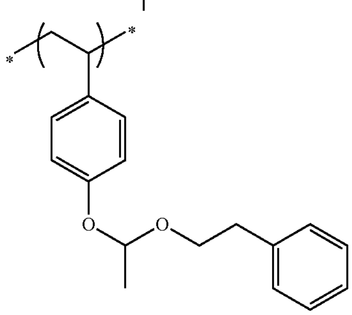
-continued
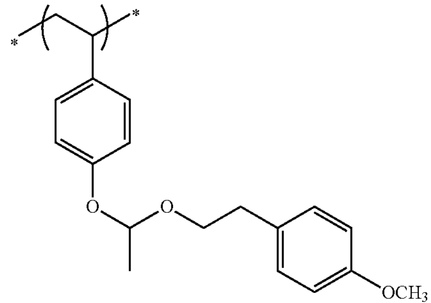
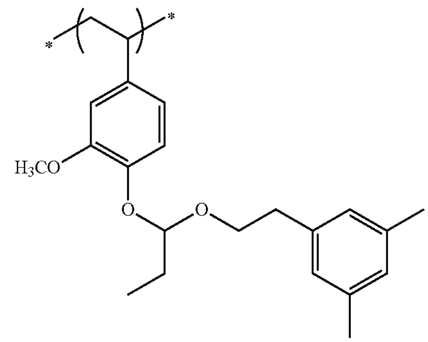
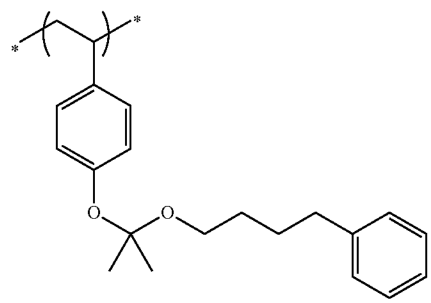
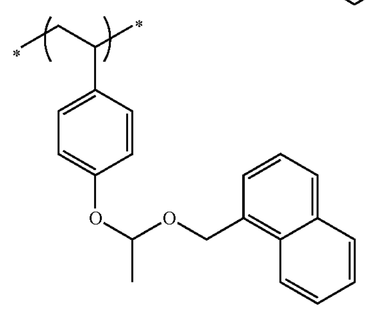
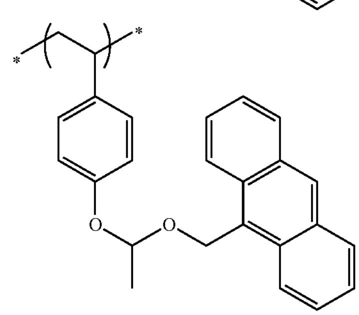

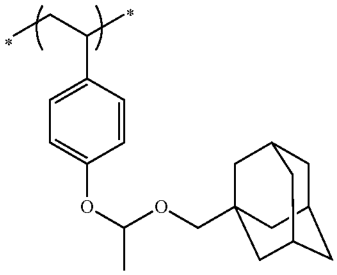
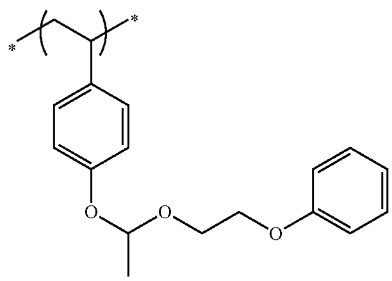
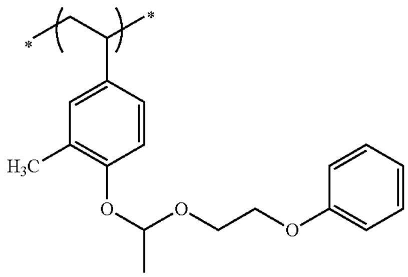
[Chem. 36]
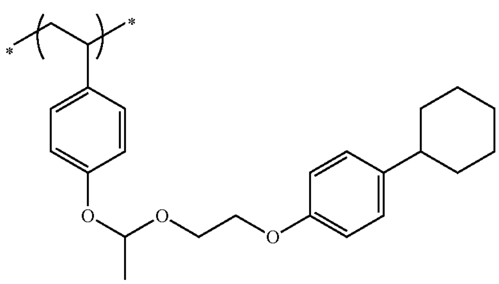
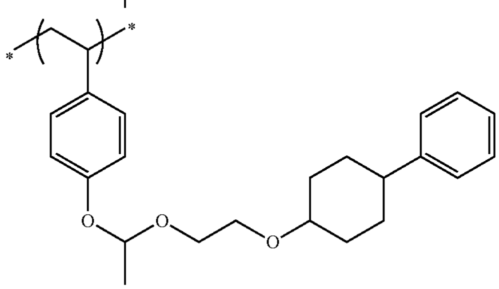
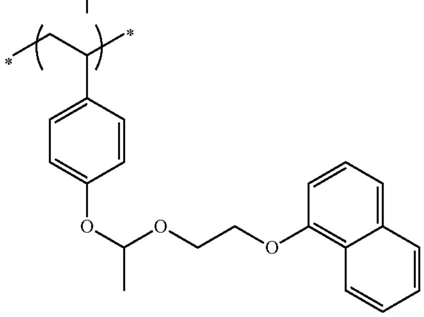
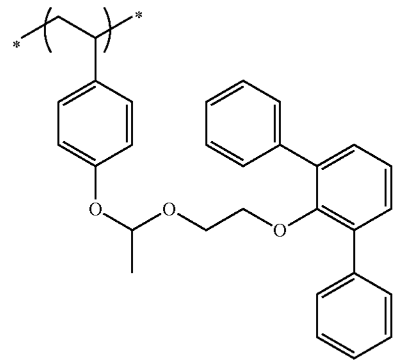
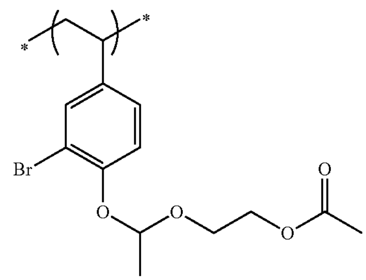
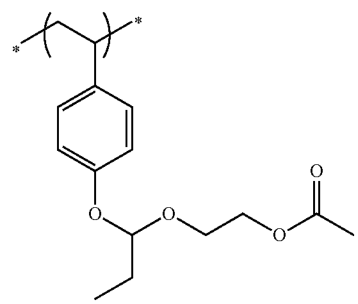
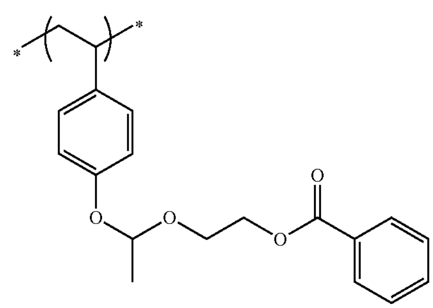
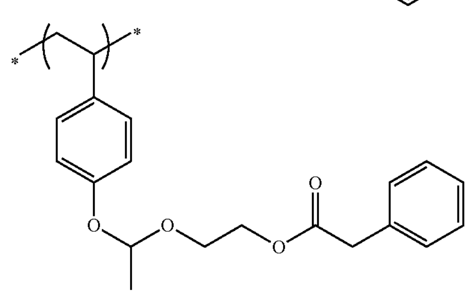

-continued
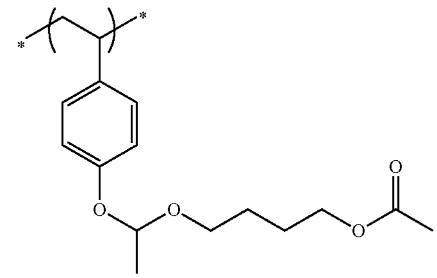
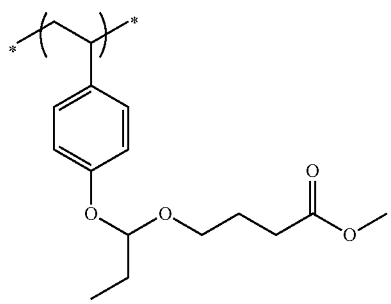
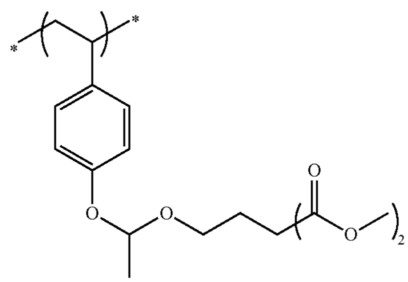
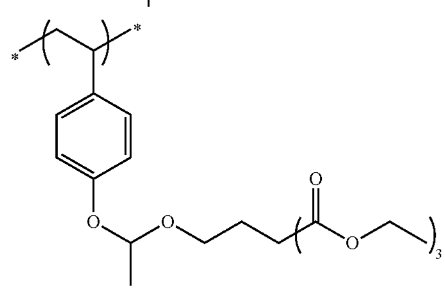
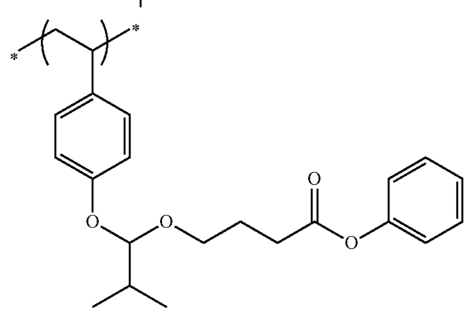
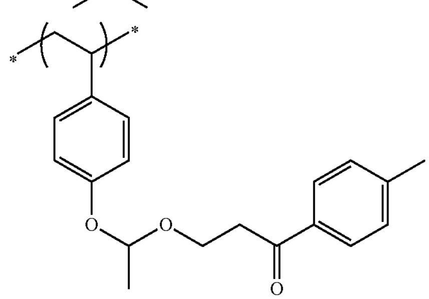
-continued
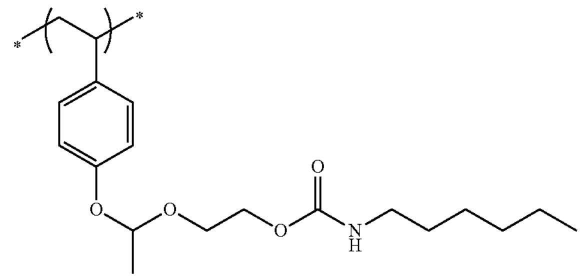
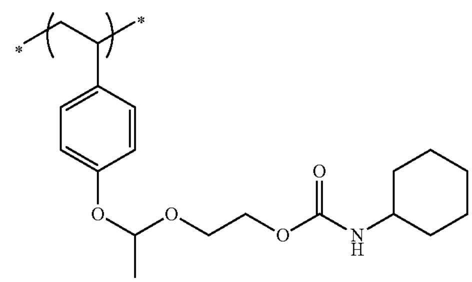
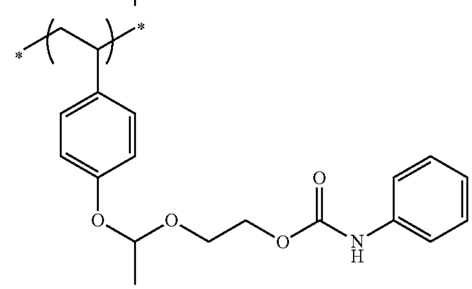
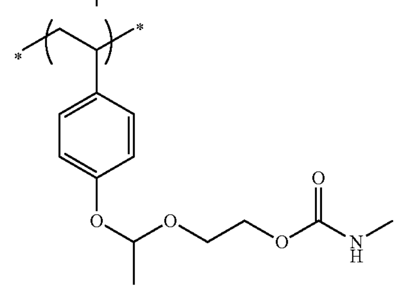
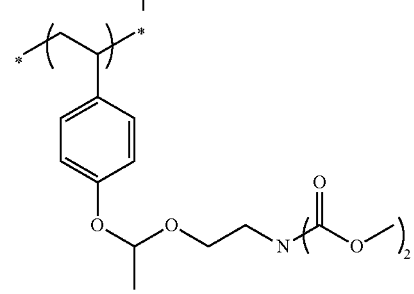
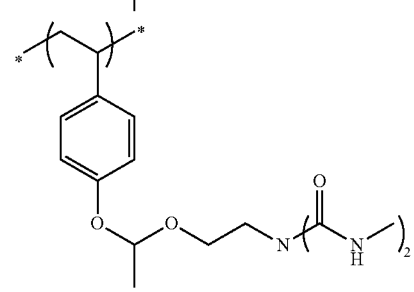

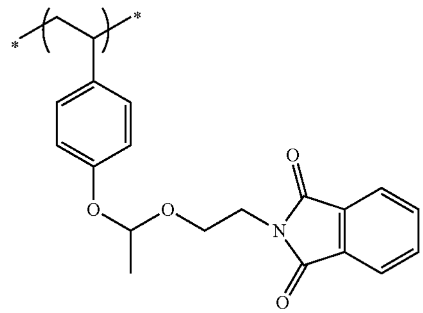
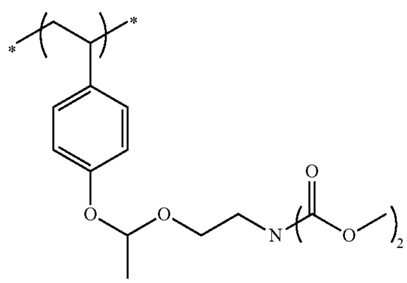
[Chem. 37]
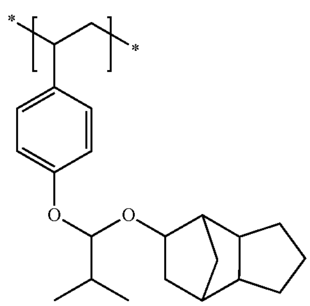
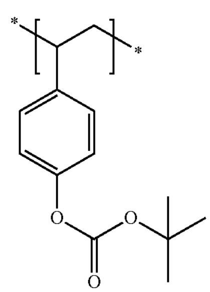
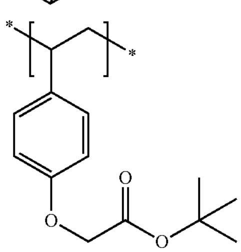
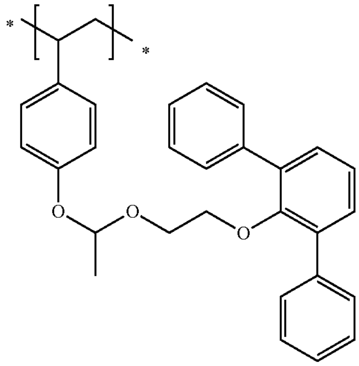
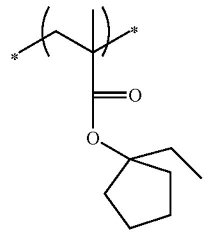
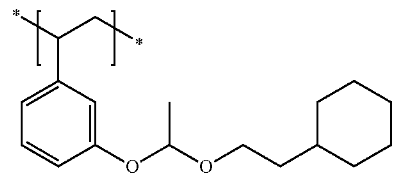
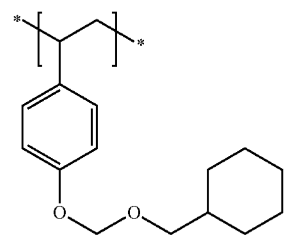
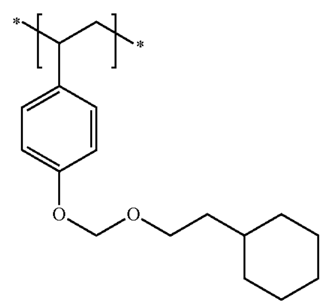
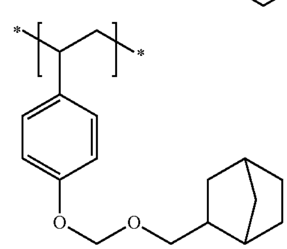
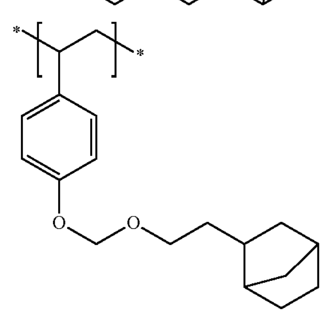

-continued

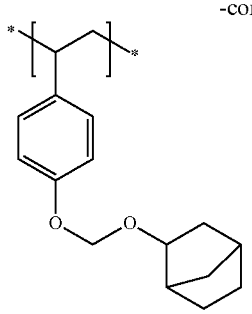

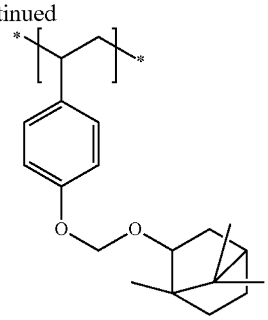

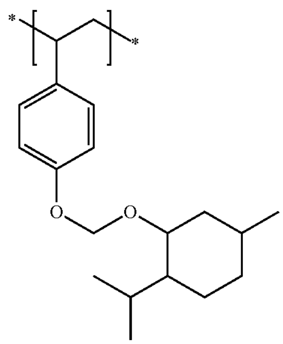

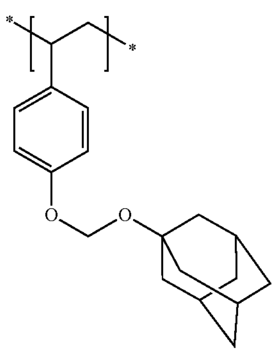

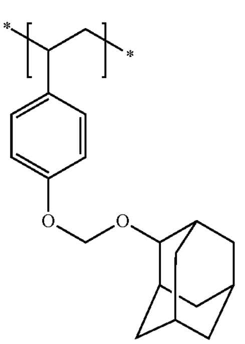

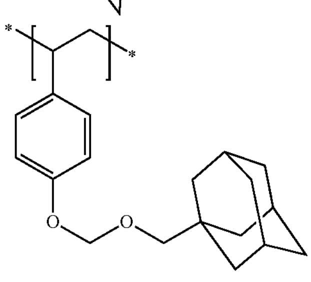

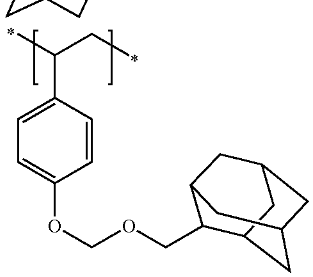

-continued

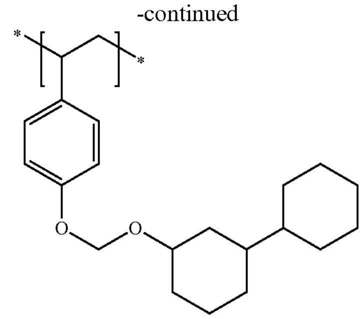

The content of the repeating unit represented by formula (A) in the resin (γ) is preferably from 10 to 90 mol %, more preferably from 10 to 70 mol %, still more preferably from 20 to 60 mol %, based on all repeating units.

The resin (γ) may also contain, as the repeating unit having an acid-decomposable group, a repeating unit represented by the following formula (X):

[Chem. 38]

(X)

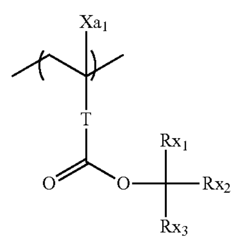

In formula (X), $Xa_1$ represents a hydrogen atom, a methyl group, a trifluoromethyl group or a hydroxymethyl group. T represents a single bond or a divalent linking group.

Each of $Rx_1$ to $Rx_3$ independently represents a linear or branched alkyl group or a monocyclic or polycyclic cycloalkyl group. At least two members of $Rx_1$ to $Rx_3$ may combine with each other to form a monocyclic or polycyclic cycloalkyl group.

The divalent linking group as T includes, for example, an alkylene group, a —(COO-Rt)- group, and a —(O-Rt)- group, wherein Rt represents an alkylene group or a cycloalkylene group.

T is preferably a single bond or a —(COO-Rt)- group. Rt is preferably an alkylene group having a carbon number of 1 to 5, more preferably a —$CH_2$— group, —$(CH_2)_2$— group or a —$(CH_2)_3$— group.

The alkyl group as $Rx_1$ to $Rx_3$ is preferably an alkyl group having a carbon number of 1 to 4, such as methyl group, ethyl group, n-propyl group, isopropyl group, n-butyl group, isobutyl group and tert-butyl group.

The cycloalkyl group as $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The cycloalkyl group that may be formed by combining two members of $Rx_1$ to $Rx_3$ with each other is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group, more preferably a monocyclic cycloalkyl group having a carbon number of 5 to 6.

Among others, an embodiment where $Rx_1$ is a methyl group or an ethyl group and $Rx_2$ and $Rx_3$ are combined with each other to form the above-described cycloalkyl group, is preferred.

Each of the groups above may have a substituent. The substituent includes, for example, an alkyl group (having a carbon number of 1 to 4), a halogen atom, a hydroxyl group, an alkoxy group (having a carbon number of 1 to 4), a carboxyl group, and an alkoxycarbonyl group (having a carbon number of 2 to 6), and the carbon number of the substituent is preferably 8 or less.

Specific examples of the repeating unit having an acid-decomposable group are illustrated below, but the present invention is not limited thereto.

[Chem. 39]

(In the formulae, Rx represents H, $CH_3$, $CF_3$ or $CH_2OH$, and each of Rxa and Rxb represents an alkyl group having a carbon number of 1 to 4.)

1

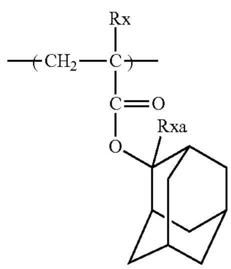

2

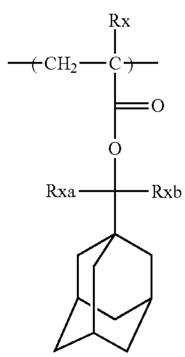

3

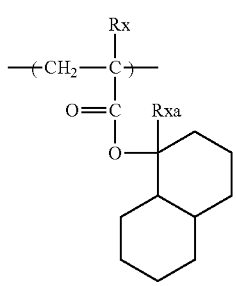

4

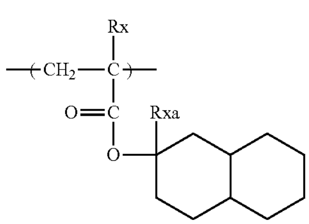

-continued

5

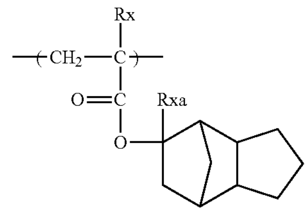

6

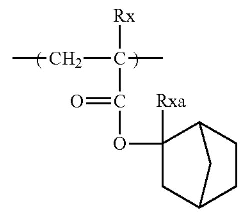

7

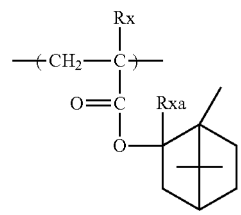

8

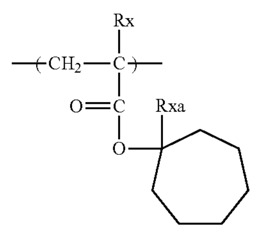

9

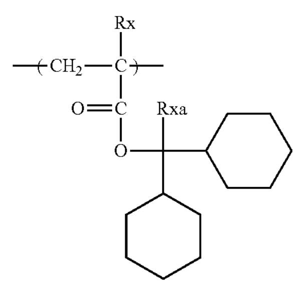

10

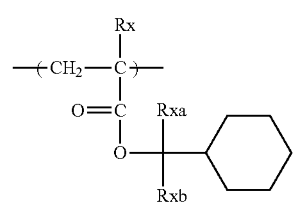

11

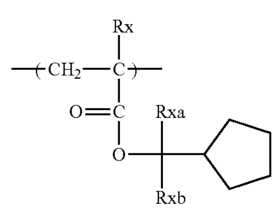

-continued
12
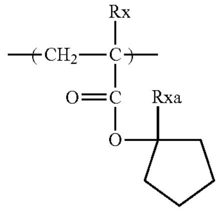
13
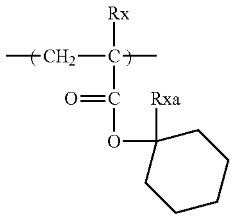
14
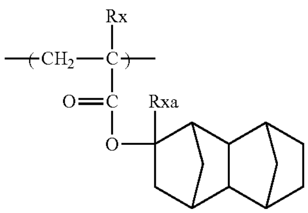
15
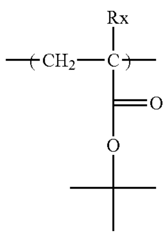
16
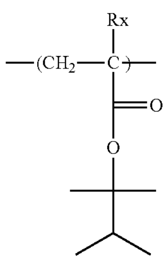
17
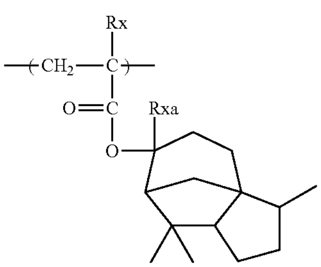
18
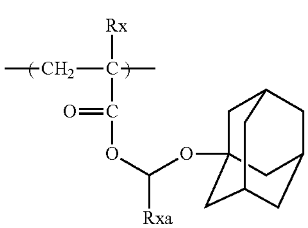
-continued
19
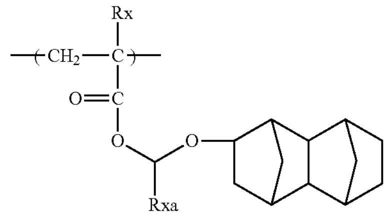
20
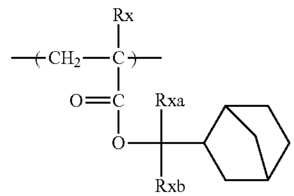
21
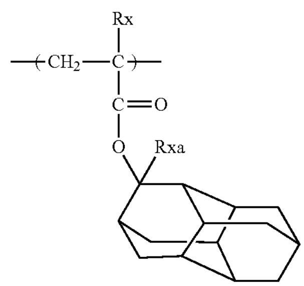
22
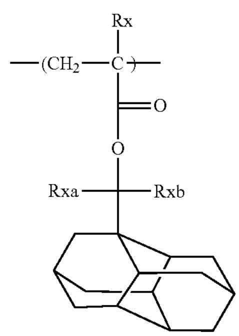
23
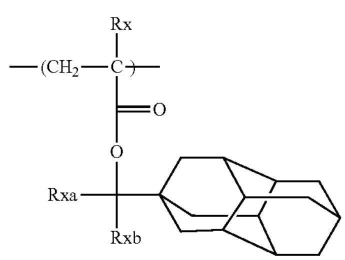
24
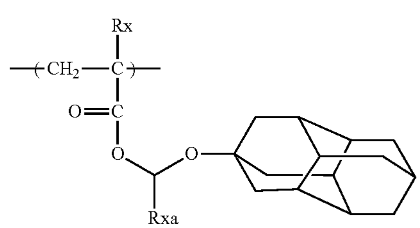

-continued

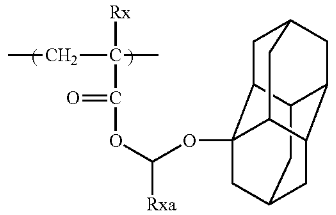

The content of the repeating unit represented by formula (X) in the resin is preferably from 30 to 90 mol %, more preferably from 5 to 80 mol %, still more preferably from 7 to 70 mol %, based on all repeating units.

The content ratio of the group capable of decomposing by an action of acid is calculated according to the formula B/(B+S) by using the number (B) of groups capable of decomposing by an action of acid and the number (S) of alkali-soluble groups not protected by a group capable of leaving by an action of acid, in the resin. The content ratio is preferably from 0.01 to 0.7, more preferably from 0.05 to 0.50, still more preferably from 0.05 to 0.40.

The resin (γ) preferably contains a repeating unit represented by the following formula (2):

[Chem. 40]

(2)

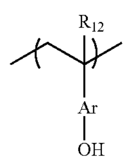

In formula (2), $R_{12}$ represents a hydrogen atom or a methyl group.

Ar represents an aromatic ring.

$R_{12}$ represents a hydrogen atom or a methyl group and in view of developability, is preferably a hydrogen atom.

The aromatic ring of Ar is a monocyclic or polycyclic aromatic ring and includes an aromatic hydrocarbon ring having a carbon number of 6 to 18, such as benzene ring, naphthalene ring, anthracene ring, fluorene ring and phenanthrene ring, and an aromatic heterocyclic ring containing a heterocyclic ring such as thiophene ring, furan ring, pyrrole ring, benzothiophene ring, benzofuran ring, benzopyrrole ring, triazine ring, imidazole ring, benzimidazole ring, triazole ring, thiadiazole ring and thiazole ring. Among these, a benzene ring and a naphthalene ring are preferred in view of resolution, and a benzene ring is most preferred in view of sensitivity.

The aromatic ring of Ar may have a substituent other than the group represented by —OH, and the substituent includes, for example, an alkyl group, a cycloalkyl group, a halogen atom, a hydroxyl group, an alkoxy group, a carboxyl group, an alkoxycarbonyl group, an alkylcarbonyl group, an alkylcarbonyloxy group, an alkylsulfonyloxy group, and an arylcarbonyl group.

In view of sensitivity, the repeating unit represented by formula (2) is preferably a repeating unit derived from hydroxystyrene (namely, a repeating unit where in formula (2), $R_{12}$ is a hydrogen atom and Ar is a benzene ring).

The content of the repeating unit represented by formula (2) is preferably from 10 to 90 mol %, more preferably from 20 to 85 mol %, still more preferably from 30 to 85 mol %, based on all repeating units in the resin (γ).

Examples of the repeating unit represented by formula (2) are illustrated below, but the present invention is not limited thereto.

[Chem. 41]

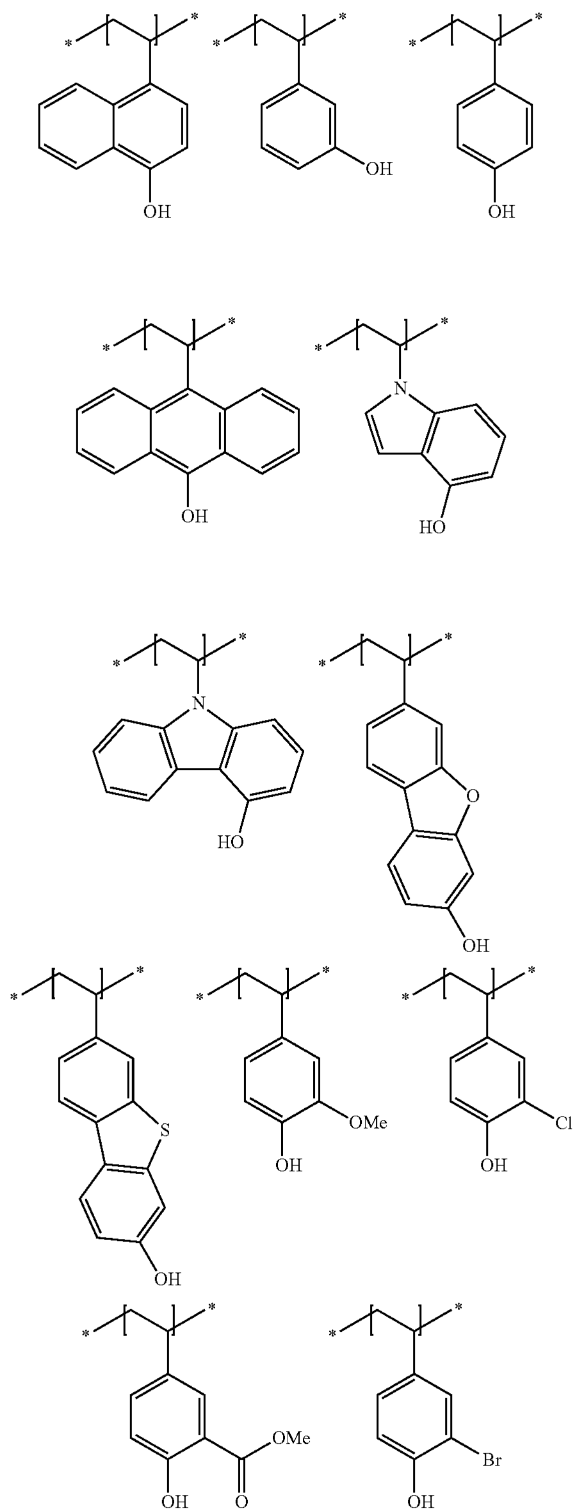

-continued

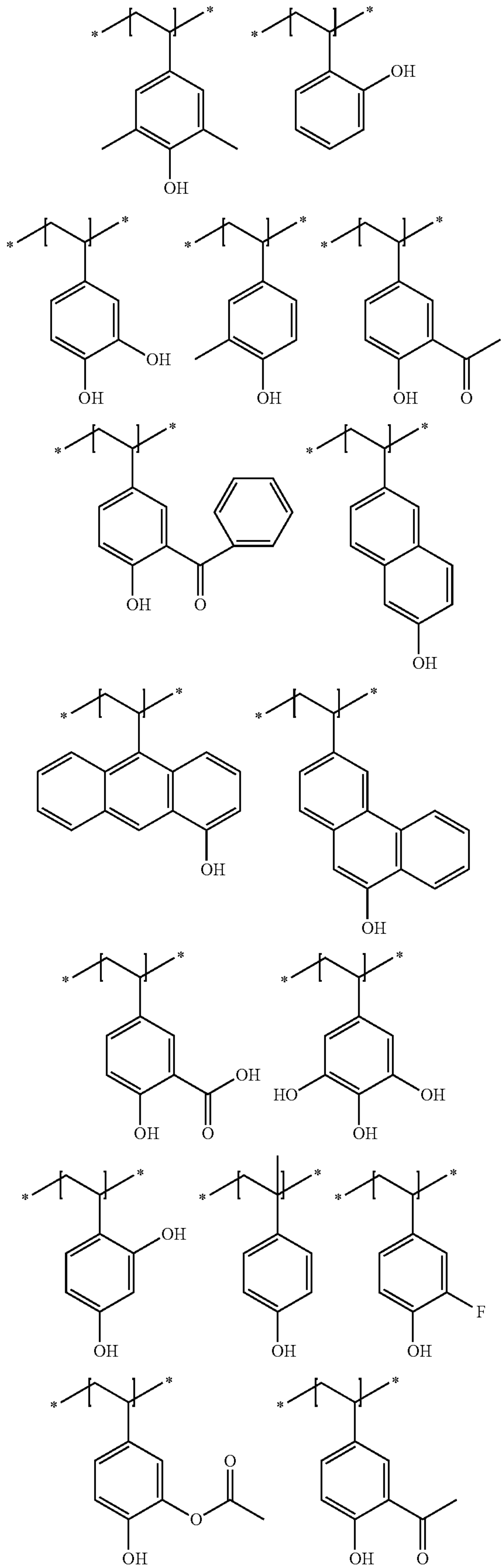

-continued

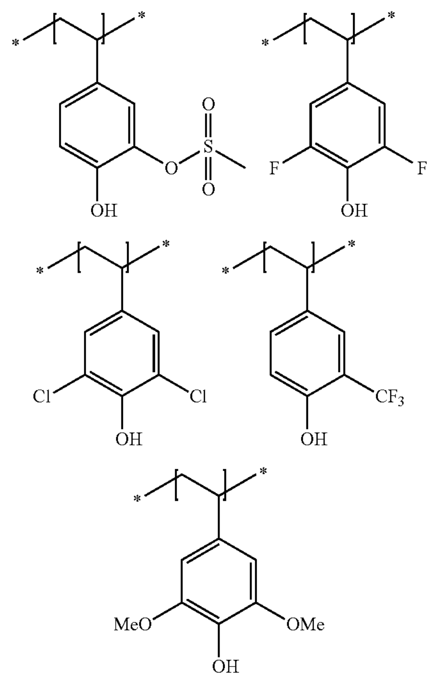

In the case of irradiating the composition of the present invention with ArF excimer laser light, the resin preferably has a monocyclic or polycyclic alicyclic hydrocarbon structure. Hereinafter, this resin is referred to as "alicyclic hydrocarbon-based acid-decomposable resin".

The alicyclic hydrocarbon-based acid-decomposable resin is preferably a resin containing at least one repeating unit selected from the group consisting of a repeating unit having an alicyclic hydrocarbon-containing partial structure represented by the following formulae (pI) to (pV), and a repeating unit represented by the following formula (II-AB):

[Chem. 42]

(pI)

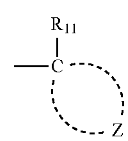

(pII)

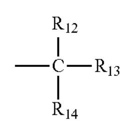

(pIII)

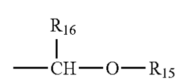

(pIV)

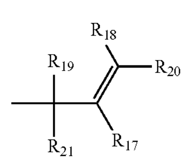

-continued (pV)

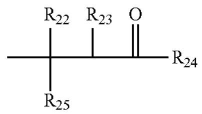

In formulae (pI) to (pV), $R_{11}$ represents a methyl group, an ethyl group, an n-propyl group, an isopropyl group, an n-butyl group, an isobutyl group or a sec-butyl group. Z represents an atomic group necessary for forming a cycloalkyl group together with the carbon atom.

Each of $R_{12}$ to $R_{16}$ independently represents a linear or branched alkyl group having a carbon number of 1 to 4 or a cycloalkyl group. However, at least one of $R_{12}$ to $R_{14}$ represents a cycloalkyl group, and either $R_{15}$ or $R_{16}$ represents a cycloalkyl group.

Each of $R_{17}$ to $R_{21}$ independently represents a hydrogen atom, a linear or branched alkyl group having a carbon number of 1 to 4, or a cycloalkyl group. However, at least one of $R_{17}$ to $R_{21}$ represents a cycloalkyl group, and either $R_{19}$ or $R_{21}$ represents a linear or branched alkyl group having a carbon number of 1 to 4 or a cycloalkyl group.

Each of $R_{22}$ to $R_{25}$ independently represents a hydrogen atom, a linear or branched alkyl group having a carbon number of 1 to 4, or a cycloalkyl group. However, at least one of $R_{22}$ to $R_{25}$ represents a cycloalkyl group. $R_{23}$ and $R_{24}$ may combine with each other to form a ring structure.

[Chem. 43]

(II-AB)

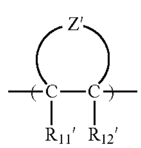

In formula (II-AB), each of $R_{11}'$ and $R_{12}'$ independently represents a hydrogen atom, a cyano group, a halogen atom or an alkyl group.

Z' represents an atomic group necessary for forming an alicyclic structure together with two carbon atoms (C—C) to which this member is bonded.

Formula (II-AB) is preferably the following formula (II-AB1) or (II-AB2):

[Chem. 44]

(II-AB1)

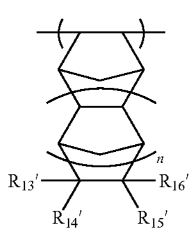

-continued (II-AB2)

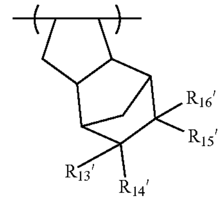

In formulae (II-AB1) and (II-AB2), each of $R_{13}'$ to $R_{16}'$ independently represents a hydrogen atom, a halogen atom, a cyano group, a hydroxyl group, —COOH, —$COOR_5$, a group capable of decomposing by an action of acid, —C(═O)—X-A'—$R_{17}'$, an alkyl group or a cycloalkyl group. Here, $R_5$ represents an alkyl group, a cycloalkyl group or a group having a lactone structure. X represents an oxygen atom, a sulfur atom, —NH—, —$NHSO_2$— or —$NHSO_2NH$—. A' represents a single bond or a divalent linking group. $R_{17}'$ represents —COOH, —$COOR_5$, —CN, a hydroxyl group, an alkoxy group, —CO—NH—$R_6$, —CO—NH—$SO_2$—$R_6$ or a group having a lactone structure, wherein $R_6$ represents an alkyl group or a cycloalkyl group. At least two members of $R_{13}'$ to $R_{16}'$ may combine with each other to form a ring structure.

n represents 0 or 1.

In formulae (pI) to (pV), the alkyl group of $R_{12}$ to $R_{25}$ is preferably a linear or branched alkyl group having a carbon number of 1 to 4, and examples thereof include a methyl group, an ethyl group, a propyl group, an n-butyl group, a sec-butyl group, and a tert-butyl group.

The cycloalkyl group of $R_{12}$ to $R_{25}$ or the cycloalkyl group formed by Z together with the carbon atom may be a monocyclic cycloalkyl group or a polycyclic cycloalkyl group and specifically includes a group having a monocyclo, bicyclo, tricyclo or tetracyclo structure and having a carbon number of 5 or more. The carbon number thereof is preferably from 6 to 30, more preferably from 7 to 25.

Preferred cycloalkyl groups include, for example, an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group, and a cyclododecanyl group. An adamantyl group, a norbornyl group, a cyclohexyl group, a cyclopentyl group, a tetracyclododecanyl group, and a tricyclodecanyl group are more preferred.

These alkyl group and cycloalkyl group may have a substituent. This substituent includes, for example, an alkyl group (having a carbon number of 1 to 4), a halogen atom, a hydroxyl group, an alkoxy group (having a carbon number of 1 to 4), a carboxyl group, and an alkoxycarbonyl group (having a carbon number of 2 to 6). These substituents may have a further substituent. The further substituent includes, for example, a hydroxyl group, a halogen atom, and an alkoxy group.

The structures represented by formulae (pI) to (pV) may be used for the protection of an alkali-soluble group. The alkali-soluble group includes various groups known in this technical field.

Specific examples thereof include structures where the hydrogen atom of a carboxylic acid group, a sulfonic acid group, a phenol group, a thiol group, etc. is replaced by a structure represented by formulae (pI) to (pV). A structure where the hydrogen atom of a carboxylic acid group or a sulfonic acid group is replaced by a structure represented by formulae (pI) to (pV) is preferred.

The repeating unit having an alkali-soluble group protected by a structure represented by formulae (pI) to (pV) is preferably a repeating unit represented by the following formula (pA):

[Chem. 45]

(pA)

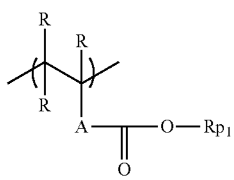

In formula (pA), R represents a hydrogen atom, a halogen atom or a linear or branched alkyl group having from a carbon number of 1 to 4, and each R may be the same as or different from every other R.

A is selected from the group consisting of a single bond, an alkylene group, an ether group, a thioether group, a carbonyl group, an ester group, an amido group, a sulfonamido group, a urethane group, a urea group, and a combination of two or more thereof, and is preferably a single bond.

$Rp_1$ is a group represented by any one of formulae (pI) to (pV).

The repeating unit represented by formula (pA) is most preferably a repeating unit composed of a 2-alkyl-2-adamantyl (meth)acrylate or a dialkyl(1-adamantyl)methyl (meth) acrylate.

Specific examples of the repeating unit represented by formula (pA) are the same as those described above as the repeating unit represented by formula (X), and other specific examples of the repeating unit represented by formula (pA) are illustrated below.

[Chem. 46]

1

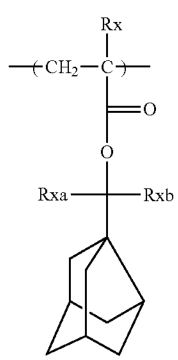

2

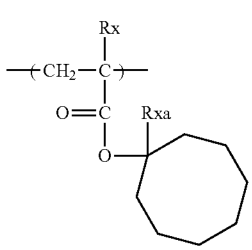

-continued

3

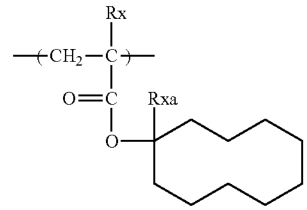

In the structural formulae above, Rx represents H, $CH_3$, $CF_3$ or $CH_2OH$, and each of Rxa and Rxb independently represents an alkyl group having a carbon number of 1 to 4.

The halogen atom as $R_{11}'$ or $R_{12}'$ in formula (II-AB) includes, for example, a chlorine atom, a bromine atom, a fluorine atom, and an iodine atom.

The alkyl group as $R_{11}'$ or $R_{12}'$ is preferably a linear or branched alkyl group having a carbon number of 1 to 10, and examples thereof include a methyl group, an ethyl group, an n-propyl group, an isopropyl group, and a linear or branched butyl, pentyl, hexyl or heptyl group.

The atomic group represented by Z' is an atomic group for forming, in the resin, an alicyclic hydrocarbon repeating unit that may have a substituent. The atomic group is preferably an atomic group for forming a crosslinked alicyclic hydrocarbon repeating unit.

Examples of the framework of the alicyclic hydrocarbon formed are the same as those of the cycloalkyl group of $R_{12}$ to $R_{25}$ in formulae (pI) to (pVI).

The framework of the alicyclic hydrocarbon may have a substituent, and the substituent includes, for example, $R_{13}'$ to $R_{16}'$ in formulae (II-AB1) and (II-AB2).

In the alicyclic hydrocarbon-based acid-decomposable resin, the group capable of decomposing by an action of acid may be incorporated into at least one repeating unit out of a repeating unit having an alicyclic hydrocarbon-containing partial structure represented by formulae (pI) to (pV), a repeating unit represented by formula (II-AB), and a repeating unit composed of the later-described copolymerization component.

Each of the substituents $R_{13}'$ to $R_{16}'$ in formulae (II-AB1) and (II-AB2) may work out to a substituent of the atomic group Z' for forming an alicyclic structure or a crosslinked alicyclic structure in formula (II-AB).

Specific examples of the repeating units represented by formulae (II-AB1) and (II-AB2) are illustrated below, but the present invention is not limited to these examples.

[Chem. 47]

[II-1]

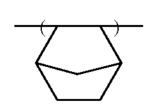

[II-2]

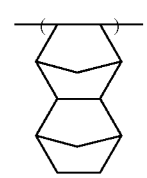

-continued
[II-3]
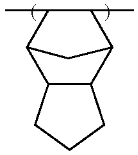
[II-4]
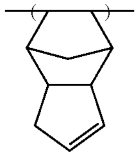
[II-5]
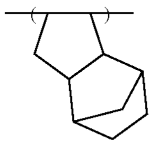
[II-6]
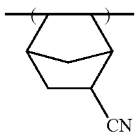
[II-7]
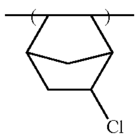
[II-8]
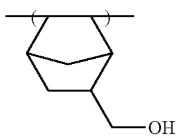
[II-9]
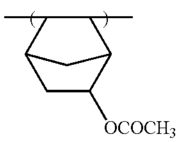
[II-10]
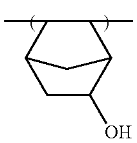
[II-11]
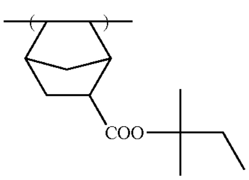
[II-12]
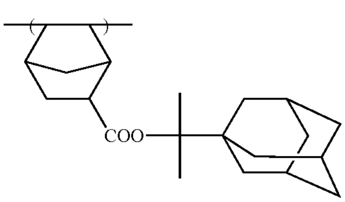
-continued
[II-13]
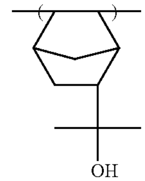
[II-14]
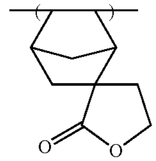
[II-15]
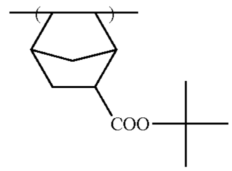
[II-16]
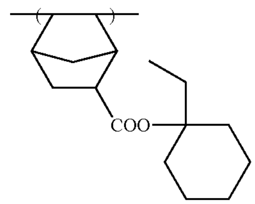
[II-17]
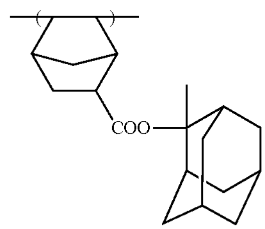
[II-18]
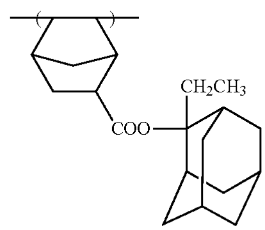
[II-19]
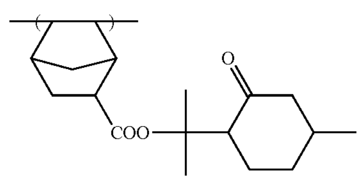
[II-20]
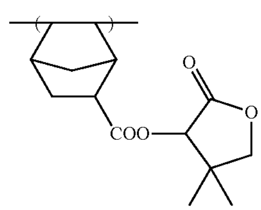

-continued

[II-21]

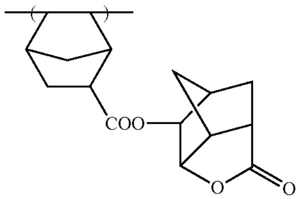

[II-22]

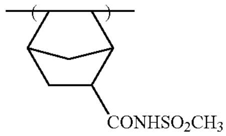

[II-23]

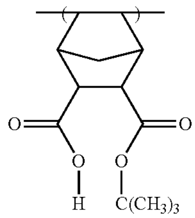

[II-24]

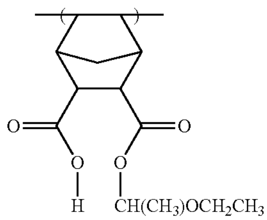

[II-25]

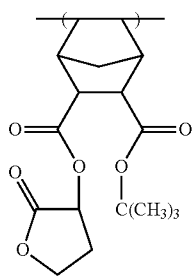

[II-26]

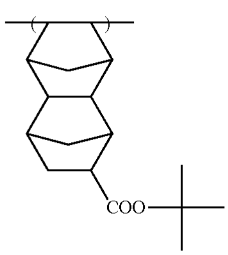

[II-27]

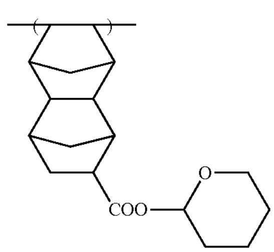

-continued

[II-28]

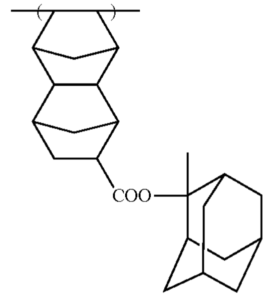

[II-29]

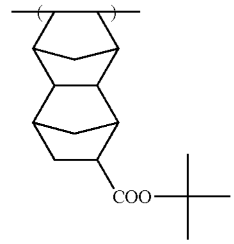

[II-30]

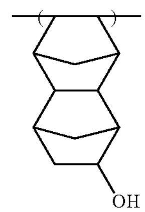

[II-31]

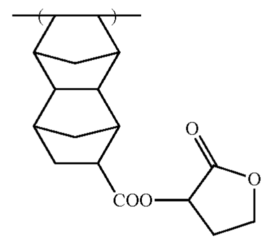

[II-32]

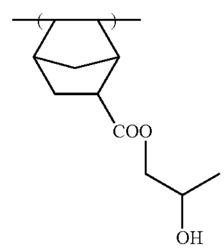

The resin (γ) preferably contains a repeating unit having a lactone group. The lactone group is preferably a group having a 5- to 7-membered ring lactone structure, more preferably a 5- to 7-membered ring lactone structure to which another ring structure is fused in the form of forming a bicyclo or Spiro structure.

The resin (γ) more preferably contains a repeating unit having a group containing a lactone structure represented by any one of the following formulae (LC1-1) to (LC1-17). The group having a lactone structure may be bonded directly to the main chain. Preferred lactone structures include (LC1-1), (LC1-4), (LC1-5), (LC1-6), (LC1-13), (LC1-14) and (LC1-17). By virtue of using a specific lactone structure, the line edge roughness and development defect can be more reduced.

[Chem. 48]
LC1-1
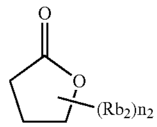
LC1-2
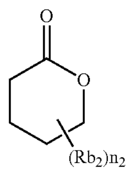
LC1-3
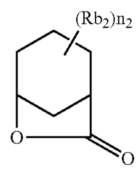
LC1-4
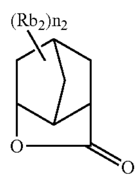
LC1-5
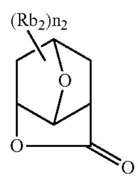
LC1-6
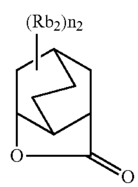
LC1-7
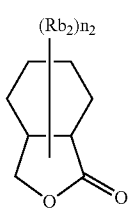
LC1-8
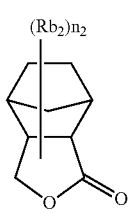
-continued
LC1-9
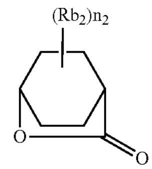
LC1-10
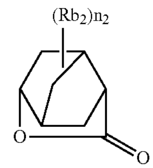
LC1-11
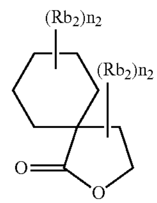
LC1-12
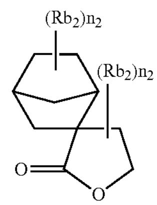
LC1-13
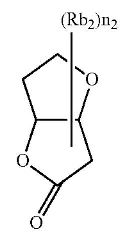
LC1-14
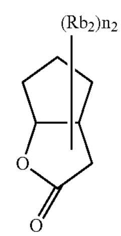
LC1-15
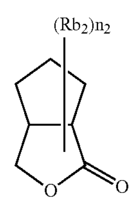
LC1-16
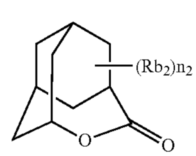

-continued

LC1-17

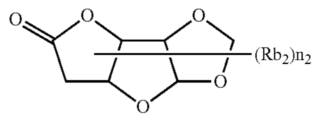

The lactone structure moiety may or may not have a substituent ($Rb_2$). Preferable substituents ($Rb_2$) include, for example, an alkyl group having a carbon number of 1 to 8, a cycloalkyl group having a carbon number of 3 to 7, an alkoxy group having a carbon number of 1 to 8, an alkoxycarbonyl group having a carbon number of 2 to 8, a carboxyl group, a halogen atom, a hydroxyl group, a cyano group, and an acid-decomposable group.

$n_2$ represents an integer of 0 to 4. When $n_2$ is an integer of 2 or more, each $Rb_2$ may be the same as or different from every other $Rb_2$. Also, in this case, the plurality of $Rb_2$ may combine with each other to form a ring structure.

The repeating unit having a group containing a lactone structure represented by any one of formulae (LC1-1) to (LC1-17) includes, for example, a repeating unit where at least one of $R_{13}'$ to $R_{16}'$ in formula (II-AB1) or (II-AB2) has a group represented by formulae (LC1-1) to (LC1-17), and a repeating unit represented by the following formula (AI). Examples of the former include a structure where $R_5$ of —$COOR_5$ is a group represented by formulae (LC1-1) to (LC1-17).

[Chem. 49]

(AI)

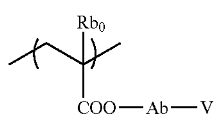

In formula (AI), $Rb_0$ represents a hydrogen atom, a halogen atom or an alkyl group having a carbon number of 1 to 4.

The alkyl group of $Rb_0$ is, for example, a methyl group, an ethyl group, a propyl group, an n-butyl group, a sec-butyl group, or a tert-butyl group. This alkyl group may have a substituent. The substituent includes, for example, a hydroxyl group and a halogen atom.

The halogen atom of $Rb_0$ includes a fluorine atom, a chlorine atom, a bromine atom, and an iodine atom.

$Rb_0$ is preferably a hydrogen atom or a methyl group.

Ab represents an alkylene group, a divalent linking group having a monocyclic or polycyclic alicyclic hydrocarbon structure, a single bond, an ether group, an ester group, a carbonyl group, or a combination thereof. Ab is preferably a single bond or a linking group represented by -$Ab_1$-$CO_2$—.

$Ab_1$ is a linear or branched alkylene group or a monocyclic or polycyclic cycloalkylene group, preferably a methylene group, an ethylene group, a cyclohexylene group, an adamantylene group or a norbornylene group.

V represents a group represented by any one of formulae (LC1-1) to (LC1-17).

The repeating unit having a lactone structure usually has an optical isomer, and any optical isomer may be used. One optical isomer may be used alone, or a plurality of optical isomers may be mixed and used. In the case of mainly using one optical isomer, the optical purity thereof is preferably 90% ee or more, more preferably 95% ee or more.

Particularly preferred repeating units having a lactone group include the following repeating units. By selecting an optimal lactone group, the pattern profile and the iso/dense bias are improved. In the formulae, each of Rx and R represents H, $CH_3$, $CH_2OH$ or $CF_3$.

[Chem. 50]

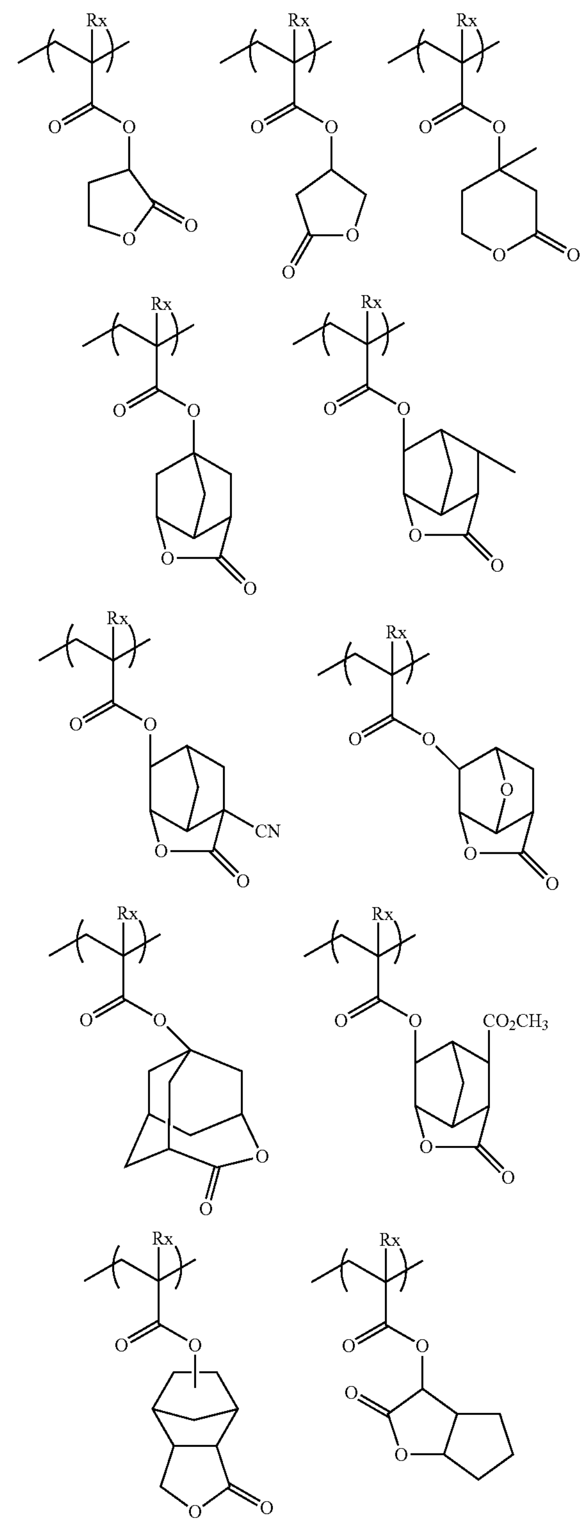

-continued
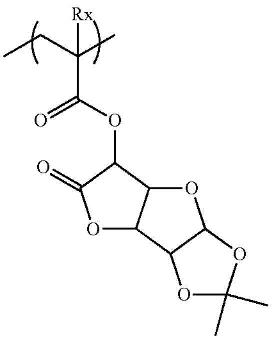
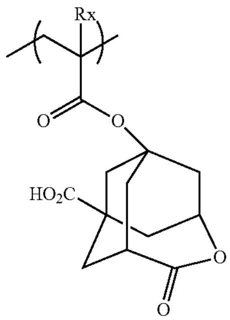
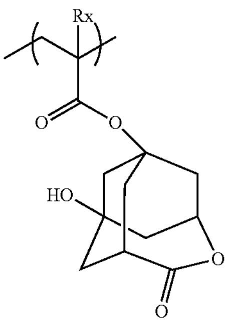
[Chem. 51]
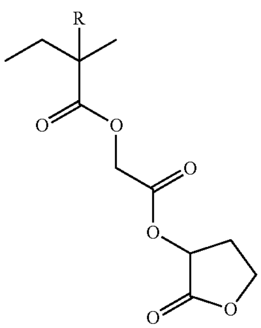
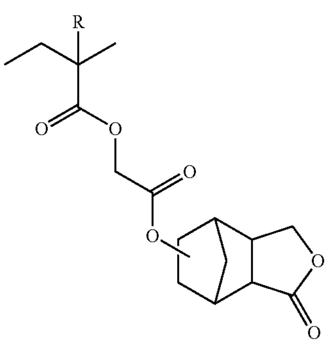
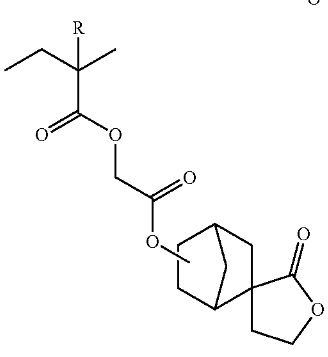
-continued
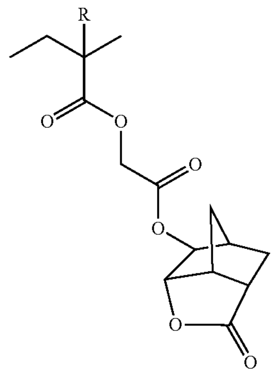
[Chem. 52]
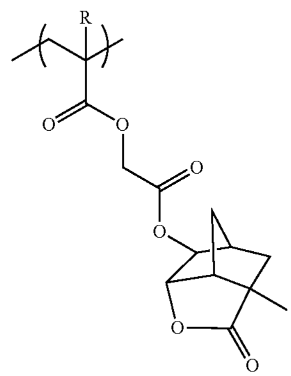
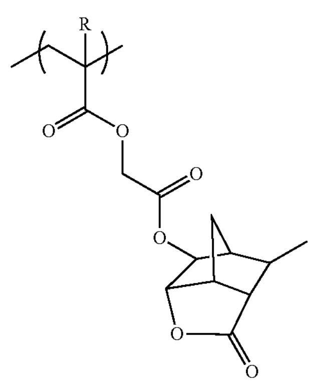
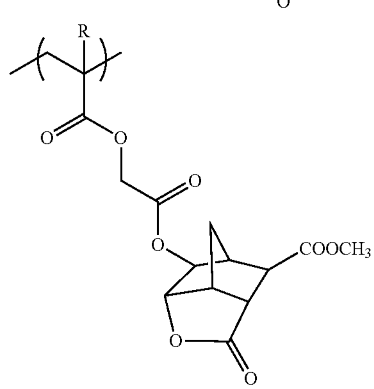

-continued
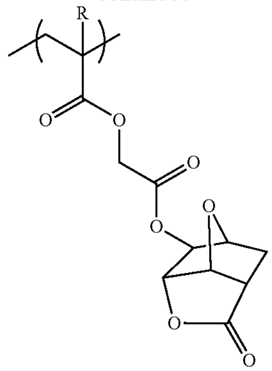
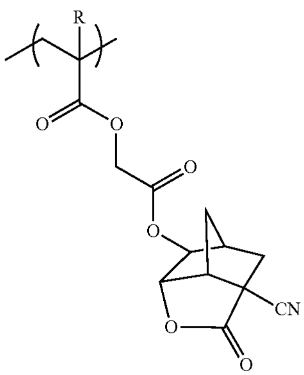
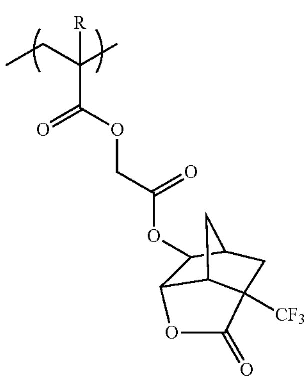
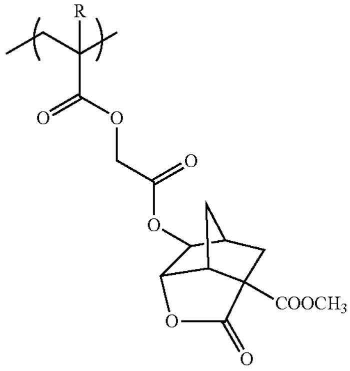
-continued
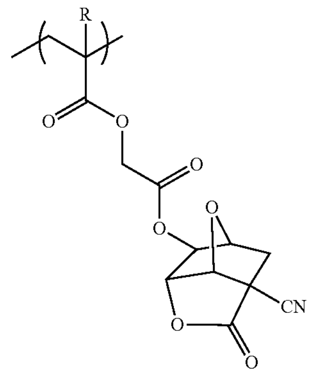
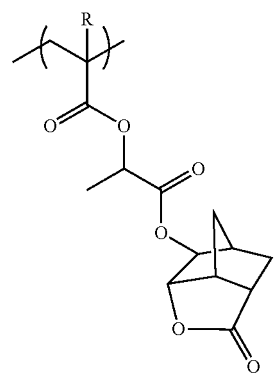
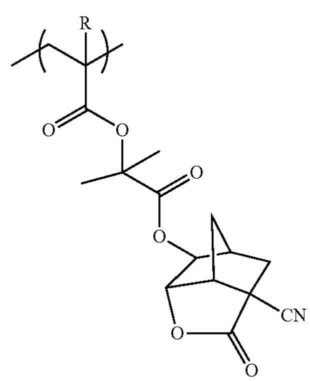
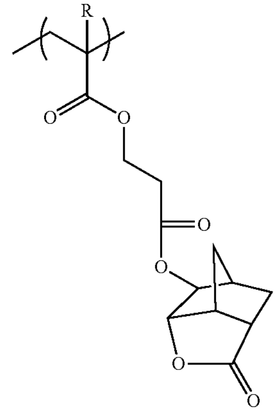

-continued
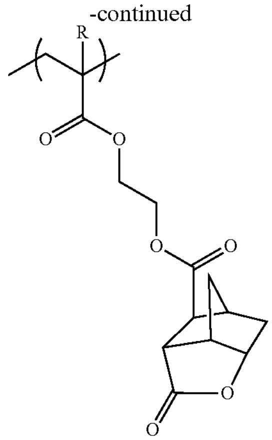
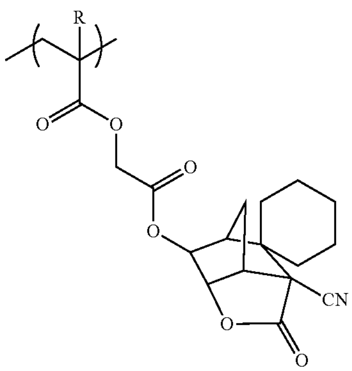
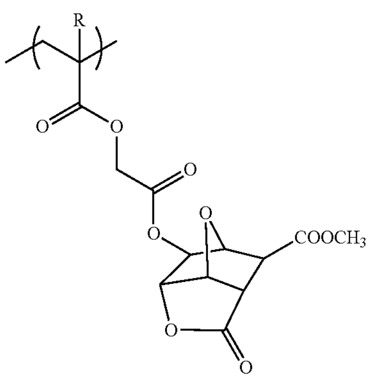
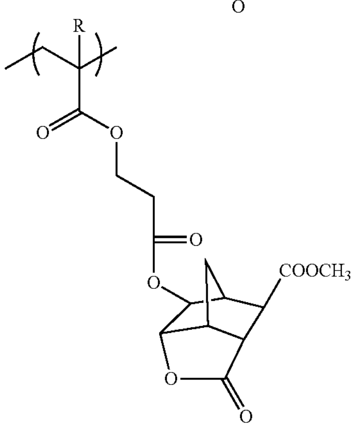
-continued
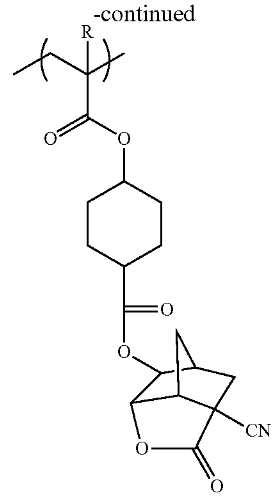
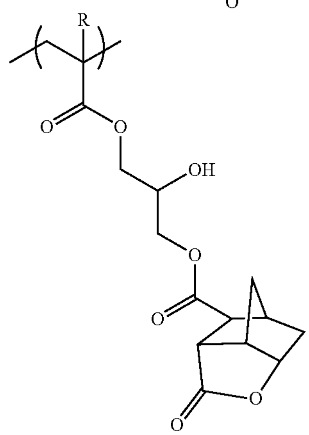
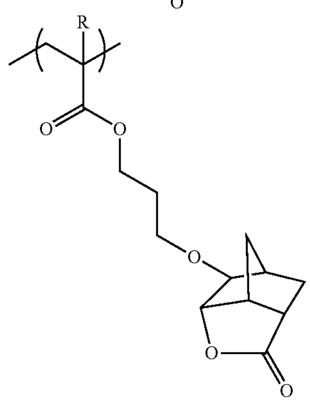
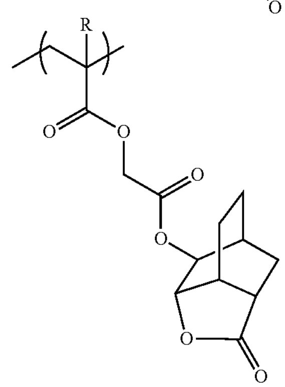
The resin (γ) may contain a plurality of lactone group-containing repeating units. In this case, either one of (1) using one repeating unit where Ab in formula (AI) is a single bond and one repeating unit where Ab is $-Ab_1-CO_2$—, or (2) using, in combination, two repeating units where Ab in formula (AI) is $-Ab_1-CO_2$—, is preferred.

The content of the lactone group-containing repeating unit (in the case of containing a plurality of lactone group-containing repeating units, the sum total thereof) is preferably from 3 to 70 mol %, more preferably from 5 to 60 mol %, based on all repeating units in the resin (γ).

The resin (γ) preferably contains a repeating unit having an alicyclic hydrocarbon structure substituted with a polar group. Thanks to this configuration, the adherence to substrate and the affinity for developer can be enhanced. The polar group is preferably a hydroxyl group or a cyano group. The hydroxyl group as the polar group forms an alcoholic hydroxyl group.

The alicyclic hydrocarbon structure substituted with a polar group includes, for example, a structure represented by the following formula (VIIa) or (VIIb):

[Chem. 53]

(VIIa)

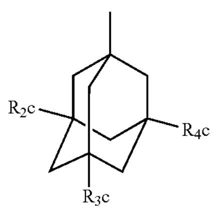

(VIIb)

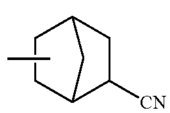

In formula (VIIa), each of $R_2c$ to $R_4c$ independently represents a hydrogen atom, a hydroxyl group or a cyano group, provided that at least one of $R_2c$ to $R_4c$ represents a hydroxyl group or a cyano group. A structure where one or two members out of $R_2c$ to $R_4c$ are a hydroxyl group with the remaining being a hydrogen atom is preferred, and it is more preferred that two members out of $R_2c$ to $R_4c$ are a hydroxyl group and the remaining one member is a hydrogen atom.

The group represented by formula (VIIa) is preferably a dihydroxy form or a monohydroxy form, more preferably a dihydroxy form.

The repeating unit having a group represented by formula (VIIa) or (VIIb) includes a repeating unit where at least one of $R_{13}'$ to $R_{16}'$ in formula (II-AB1) or (II-AB2) has a group represented by formula (VIIa) or (VIIb), and a repeating unit represented by the following formula (AIIa) or (AIIb). Examples of the former include a structure where $R_5$ of $—COOR_5$ is a group represented by formula (VIIa) or (VIIb).

[Chem. 54]

(AIIa)

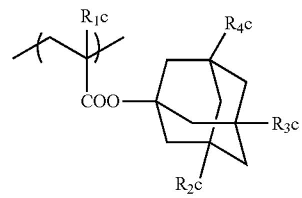

(AIIb)

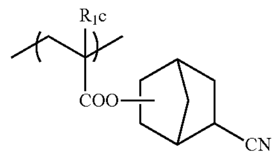

In formulae (AIIa) and (AIIb), $R_1c$ represents a hydrogen atom, a methyl group, a trifluoromethyl group or a hydroxymethyl group.

$R_2c$ to $R_4c$ have the same meanings as $R_2c$ to $R_4c$ in formula (VIIa).

Specific examples of the repeating unit represented by formula (AIIa) or (AIIb) are illustrated below, but the present invention is not limited thereto.

[Chem. 55]

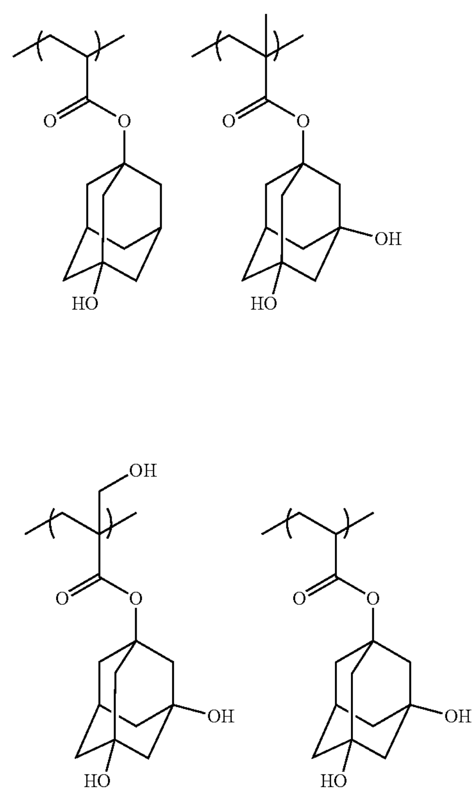

-continued

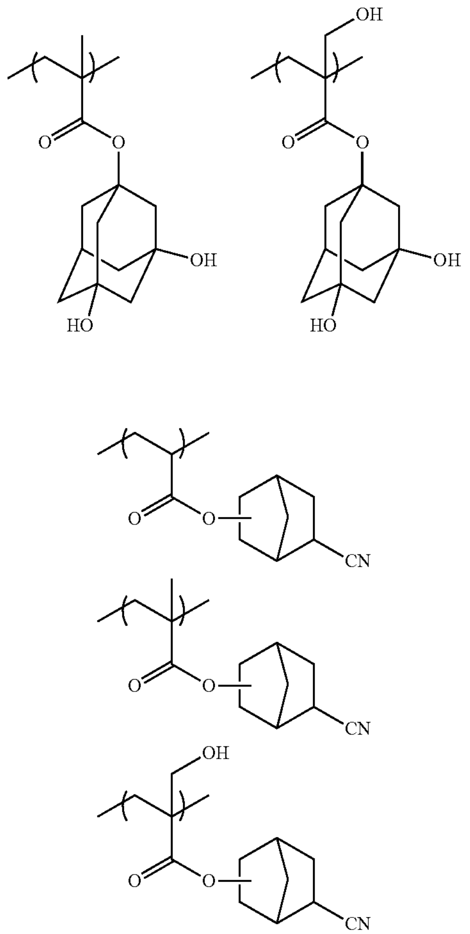

The resin (γ) may or may not contain the above-described repeating unit, but in the case of containing the repeating unit, the content thereof (in the case of containing a plurality of pertinent repeating units, the sum total thereof) is preferably from 3 to 30 mol %, more preferably from 5 to 25 mol %, based on all repeating units in the resin.

The resin (γ) may contain a repeating unit represented by the following formula (VIII):

[Chem. 56]

(VIII)

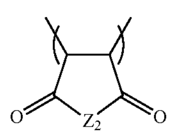

In formula (VIII), $Z_2$ represents —O— or —N($R_{41}$)—. $R_{41}$ represents a hydrogen atom, a hydroxyl group, an alkyl group or —$OSO_2$—$R_{42}$, wherein $R_{42}$ represents an alkyl group, a cycloalkyl group or a camphor residue. The alkyl group as $R_{41}$ or $R_{42}$ may be substituted with a halogen atom or the like. In this case, the halogen atom is preferably a fluorine atom.

Specific examples of the repeating unit represented by formula (VIII) are illustrated below, but the present invention is not limited thereto.

[Chem. 57]

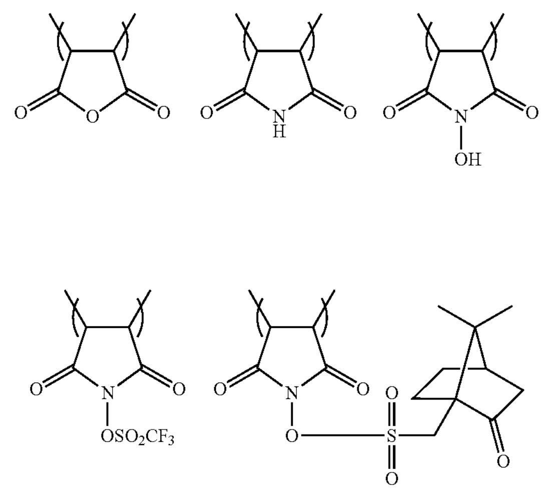

The resin (γ) preferably contains a repeating unit having an alkali-soluble group, more preferably a repeating unit having a carboxy group. Thanks to such a repeating unit, the resolution increases in usage of forming contact holes.

As for the repeating unit having a carboxy group, both a repeating unit where a carboxy group is directly bonded to the main chain of the resin, and a repeating unit where a carboxy group is bonded to the main chain of the resin through a linking group, are preferred.

Examples of the former include a repeating unit by an acrylic acid or a methacrylic acid. Also, the linking group in the latter may have a monocyclic or polycyclic cycloalkyl structure.

The repeating unit having a carboxy group is most preferably a repeating unit by an acrylic acid or a methacrylic acid.

The weight average molecular weight of the resin capable of decomposing by an action of acid to increase the solubility in an alkali developer is preferably from 2,000 to 200,000 in terms of polystyrene as determined by the GPC method. By setting the weight average molecular weight to 2,000 or more, among others, heat resistance and dry etching resistance can be improved. Also, by setting the weight average molecular weight to 200,000 or less, developability can be increased in particular and at the same time, thanks to reduction in the viscosity of the composition, the film-forming property of the composition can be enhanced.

The molecular weight is more preferably from 2,500 to 50,000, still more preferably from 3,000 to 20,000. In the fine pattern formation using an electron beam, an X-ray or a high-energy ray with a wavelength of 50 nm or less (e.g., EUV), the weight average molecular weight is most preferably from 3,000 to 10,000. By adjusting the molecular weight, for example, enhancement of the heat resistance and resolution of the composition and decrease in the development defect can be achieved at the same time.

The polydispersity (Mw/Mn) of the resin capable of decomposing by an action of acid to increase the solubility in an alkali developer is preferably from 1.0 to 3.0, more preferably from 1.2 to 2.5, still more preferably from 1.2 to 1.6. By adjusting the polydispersity to this range, for example, the line edge roughness performance can be improved.

Specific examples of the resin described above are illustrated below, but the present invention is not limited thereto.
[Chem. 58]
(R-1)
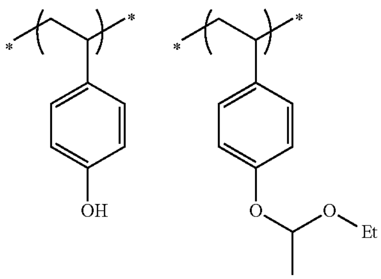
(R-2)
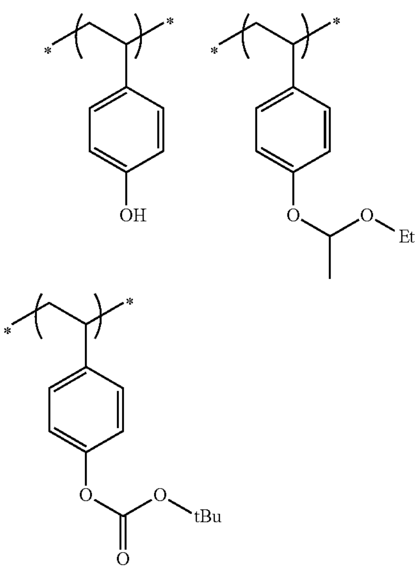
(R-3)
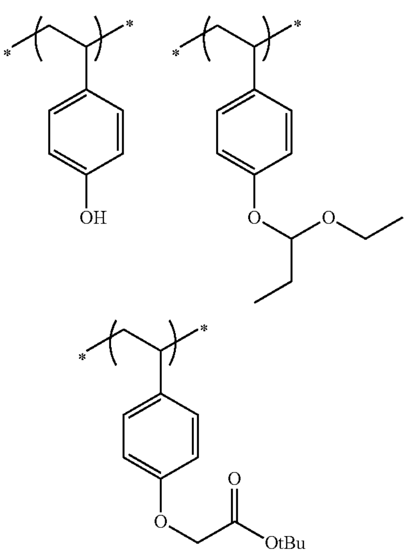
-continued
(R-4)
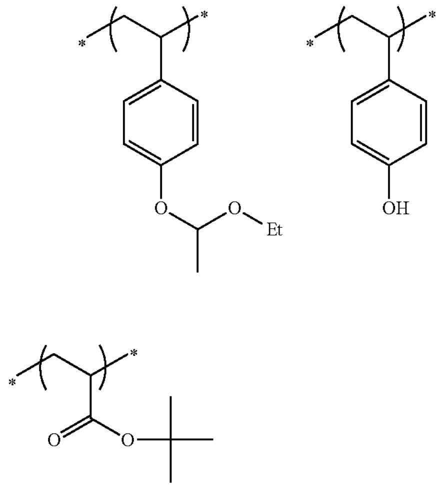
(R-5)
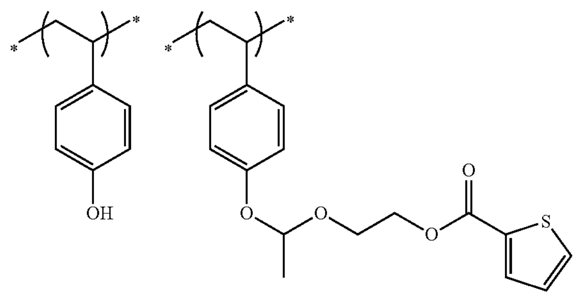
(R-6)
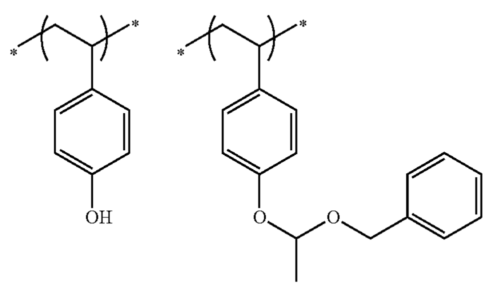
(R-7)
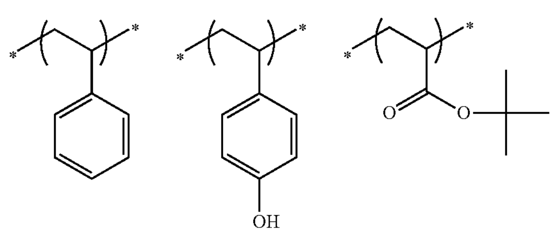
(R-8)
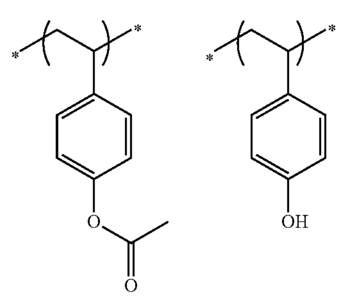

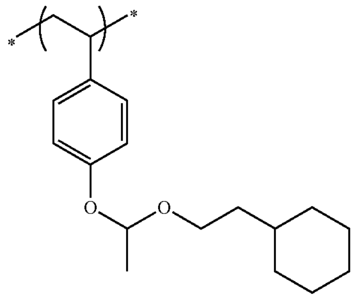
(R-9)
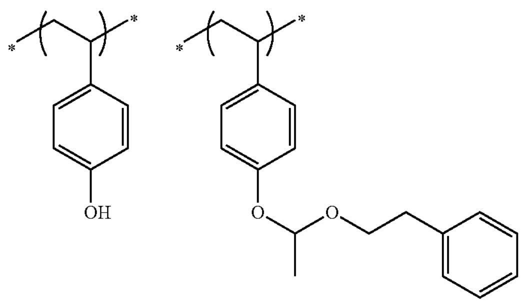
(R-10)
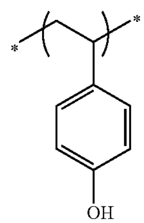
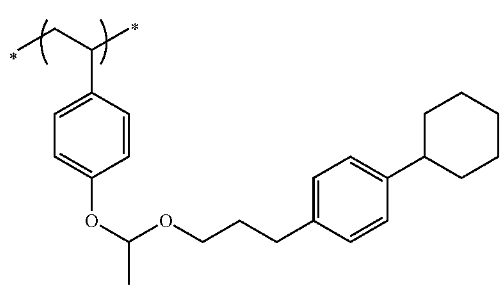
(R-11)
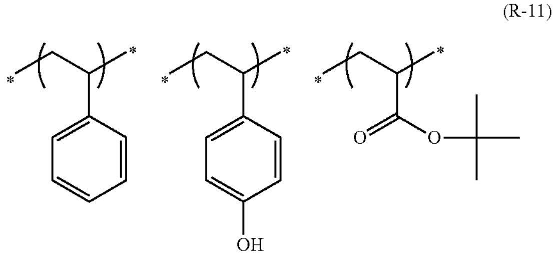
(R-12)
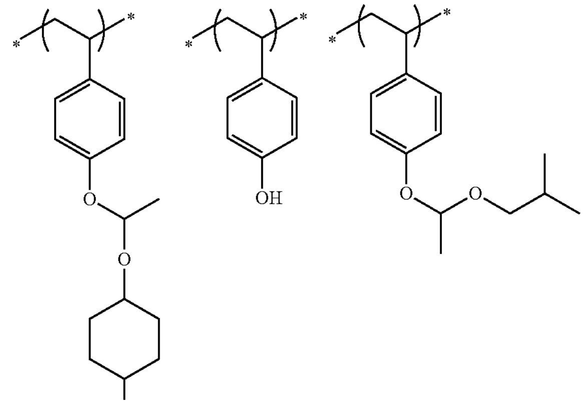
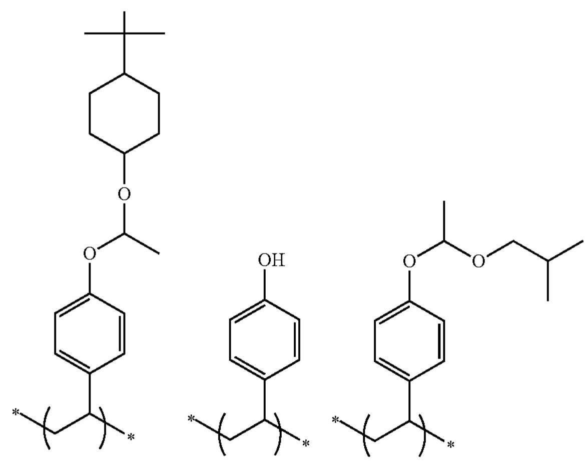
(R-13)
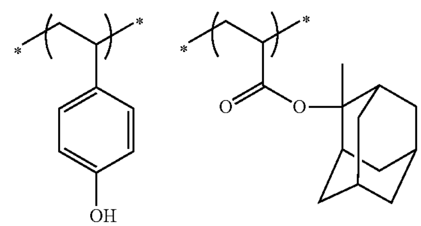
(R-14)
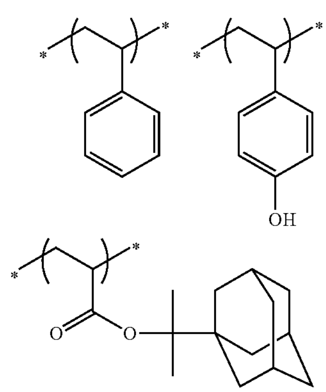

-continued
(R-15)
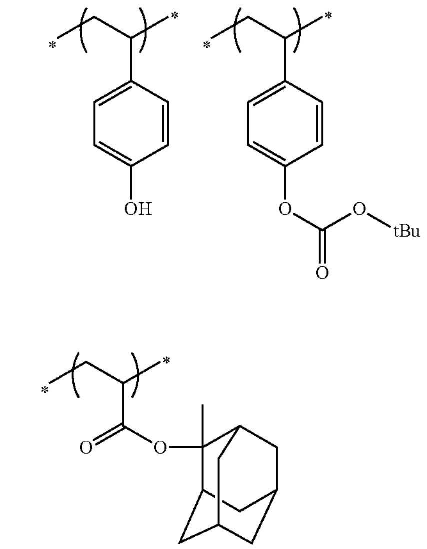
(R-16)
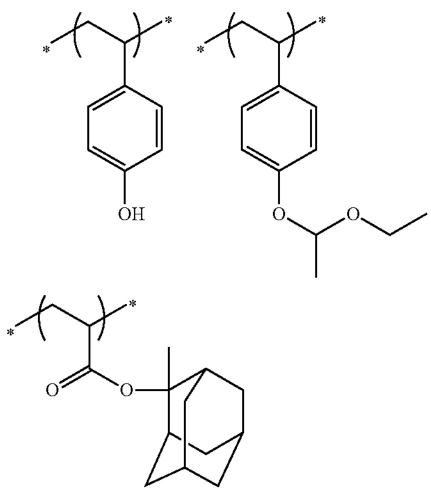
(R-17)
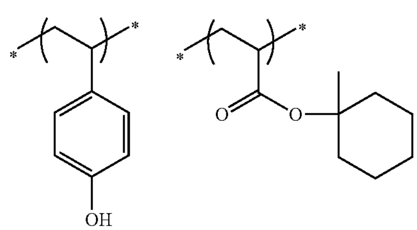
[Chem. 59]
(R-18)
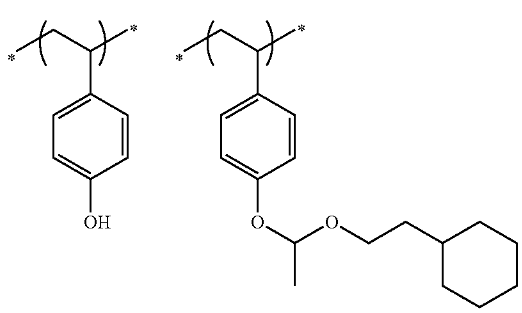
-continued
(R-19)
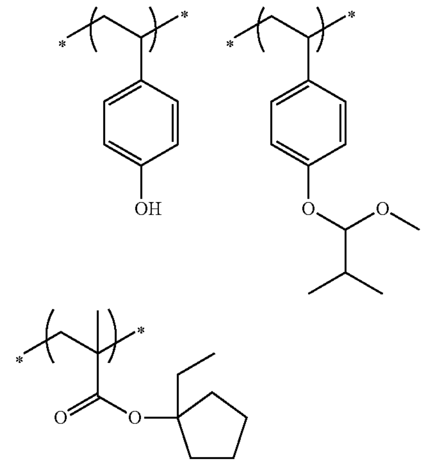
(R-20)
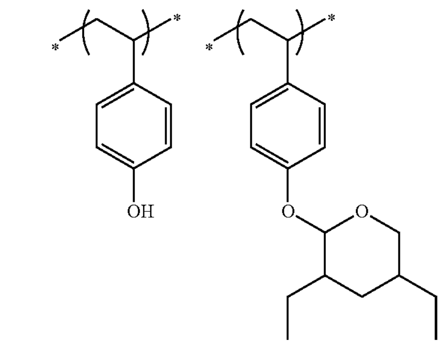
(R-21)
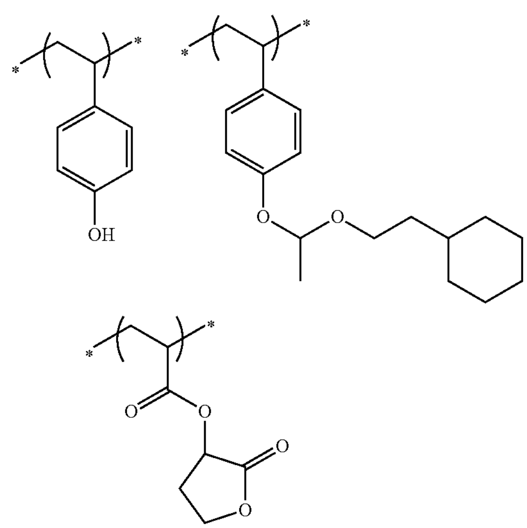
[Chem. 60]
R-22
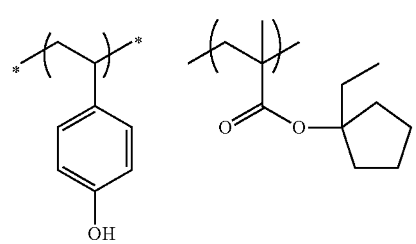

-continued

R-23

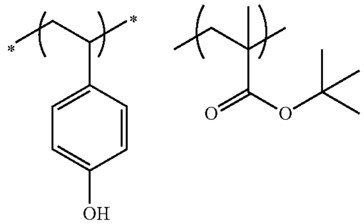

R-24

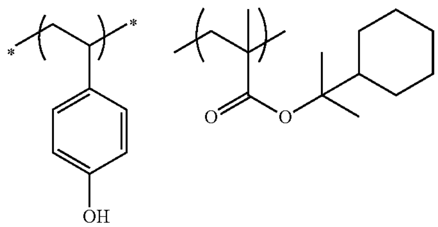

R-25

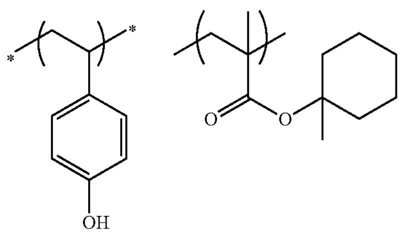

R-26

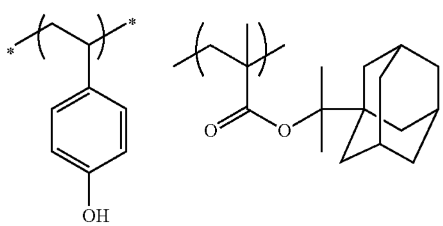

R-27

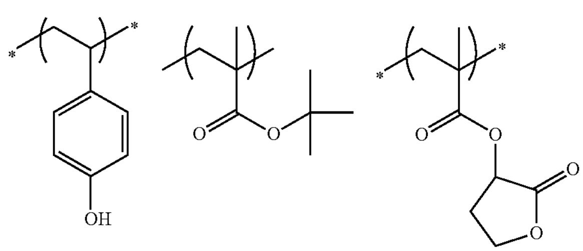

In specific examples above, tBu indicates a tert-butyl group.

As for the resin (γ), one resin may be used alone, or two or more resins may be used in combination.

The blending ratio of the resin (γ) in the composition according to the present invention is preferably from 5 to 99.9 mass %, more preferably from 50 to 95 mass %, still more preferably from 60 to 93 mass %, based on the total solid content.

<4> (ε) Compound Having a Phenolic Hydroxyl Group

In the case of forming a negative pattern, the chemical amplification resist composition of the present invention preferably contains (ε) a compound having a phenolic hydroxyl group (hereinafter, sometimes referred to as compound (ε)).

The phenolic hydroxyl group as used in the present application is a group formed by replacing a hydrogen atom of an aromatic ring group by a hydroxyl group. The aromatic ring of the aromatic ring group is a monocyclic or polycyclic aromatic ring and includes a benzene ring, a naphthalene ring, etc.

According to the chemical amplification resist composition of the present invention, a crosslinking reaction of the phenolic hydroxyl group-containing compound (ε) with the later-described crosslinking agent (δ) proceeds in the exposed area by actions of an acid generated from the compound (β) capable of generating an acid upon irradiation with an actinic ray or radiation and a sulfonic acid that is generated from the compound (α) represented by formula (αI) by an action of acid, whereby a negative pattern is formed.

The phenolic hydroxyl group-containing compound (ε) is not particularly limited as long as it has a phenolic hydroxyl group, and the compound may be a relatively low molecular compound such as molecular resist, or a polymer compound. Incidentally, as the molecular resist, a cyclic polyphenol compound having a low molecular weight described, for example, in JP-A-2009-173623 and JP-A-2009-173625 can be used.

In view of reactivity and sensitivity, the phenolic hydroxyl group-containing compound (ε) is preferably a polymer compound.

In the case where the phenolic hydroxyl group-containing compound (ε) of the present invention is a polymer compound, the polymer compound preferably contains at least one repeating unit having a phenolic hydroxyl group. The phenolic hydroxyl group-containing repeating unit is not particularly limited but is preferably a repeating unit represented by the following formula (1):

[Chem. 61]

(1)

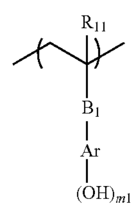

In formula (1), $R_{11}$ represents a hydrogen atom, a methyl group that may have a substituent, or a halogen atom.

$B_1$ represents a single bond or a divalent linking group.

Ar represents an aromatic ring.

m1 represents an integer of 1 or more.

The methyl group that may have a substituent in $R_{11}$ includes a trifluoromethyl group, a hydroxymethyl group, etc.

$R_{11}$ is preferably a hydrogen atom or a methyl group and is preferably a hydrogen atom on account of developability.

The divalent linking group of $B_1$ is preferably a carbonyl group, an alkylene group (preferably having a carbon number of 1 to 10, more preferably a carbon number of 1 to 5), a sulfonyl group (—S(=O)$_2$—), —O—, —NH—, or a divalent linking group formed by combining these.

$B_1$ preferably represents a single bond, a carbonyloxy group (—C(=O)—O—) or —C(=O)—NH—, more preferably a single bond or a carbonyloxy group (—C(=O)—O—), and, from the standpoint of enhancing the dry etching resistance, still more preferably a single bond.

The aromatic ring of Ar is a monocyclic or polycyclic aromatic ring and includes an aromatic hydrocarbon ring having a carbon number of 6 to 18 which may have a substituent, such as benzene ring, naphthalene ring, anthracene ring, fluorene ring and phenanthrene ring, and an aromatic heterocyclic ring containing a heterocyclic ring such as thiophene ring, furan ring, pyrrole ring, benzothiophene ring, benzofuran ring, benzopyrrole ring, triazine ring, imidazole ring, benzimidazole ring, triazole ring, thiadiazole ring and thiazole ring. Among these, a benzene ring and a naphthalene ring are preferred in view of resolution, and a benzene ring is most preferred in view of sensitivity.

m1 is preferably an integer of 1 to 5 and most preferably 1. When m1 is 1 and Ar is a benzene ring, the substitution position of —OH may be the para-, meta- or ortho-position relative to the bonding position of the benzene ring to $B_1$ (when $B_1$ is a single bond, the polymer main chain), but in view of crosslinking reactivity, the substitution position is preferably the meta- or para-position, more preferably the para-position.

The aromatic ring of Ar may have a substituent other than the group represented by —OH, and the substituent includes, for example, an alkyl group, a cycloalkyl group, a halogen atom, a hydroxyl group, an alkoxy group, a carboxyl group, an alkoxycarbonyl group, an alkylcarbonyl group, an alkylcarbonyloxy group, an alkylsulfonyloxy group, and an arylcarbonyl group.

On account of crosslinking reactivity, developability and dry etching resistance, the phenolic hydroxyl group-containing repeating unit is more preferably a repeating unit represented by the following formula (2):

[Chem. 62]

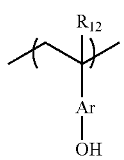

(2)

In formula (2), $R_{12}$ represents a hydrogen atom or a methyl group.

Ar represents an aromatic ring.

$R_{12}$ represents a hydrogen atom or a methyl group and is preferably a hydrogen atom on account of developability.

Ar in formula (2) has the same meaning as Ar in formula (1), and its preferred range is also the same. In view of sensitivity, the repeating unit represented by formula (2) is preferably a repeating unit derived from hydroxystyrene (that is, a repeating unit where in formula (2), $R_{12}$ is a hydrogen atom and Ar is a benzene ring).

The compound (ε) as a polymer compound may be composed of only the above-described phenolic hydroxyl group-containing repeating unit. The compound (ε) as a polymer compound may contain a repeating unit described later, other than the phenolic hydroxyl group-containing repeating unit. In this case, the content of the phenolic hydroxyl group-containing repeating unit is preferably from 10 to 98 mol %, more preferably from 30 to 97 mol %, still more preferably from 40 to 95 mol %, based on all repeating units in the compound (ε) as a polymer compound. Within this range, among others, when the resist film is a thin film (for example, when the thickness of the resist film is from 10 to 150 nm), the dissolution rate for an alkali developer of the exposed area in the resist film of the present invention formed using the compound (ε) can be more unfailingly reduced (that is, the dissolution rate of the resist film using the compound (ε) can be more unfailingly controlled to an optimal level). As a result, the sensitivity can be more reliably enhanced.

Examples of the phenolic hydroxyl group-containing repeating unit are illustrated below, but the present invention is not limited thereto.

[Chem. 63]

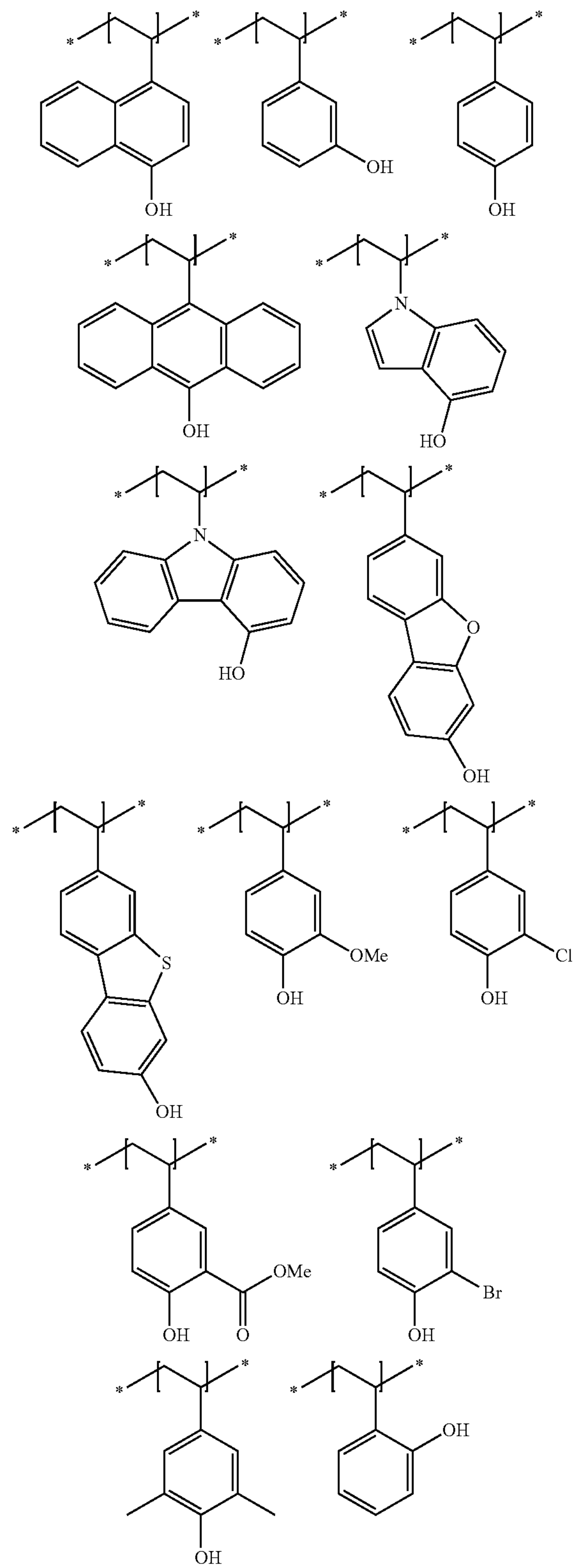

-continued
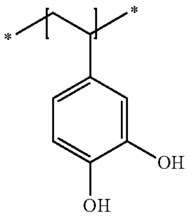
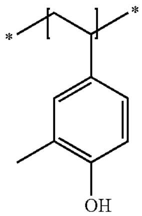
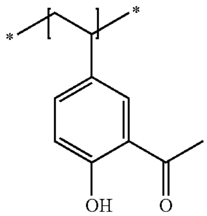
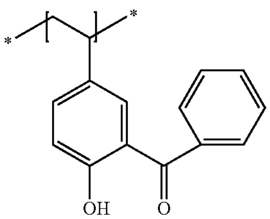
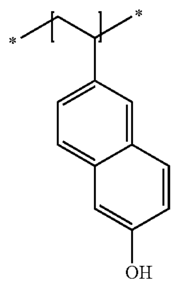
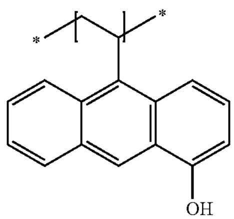
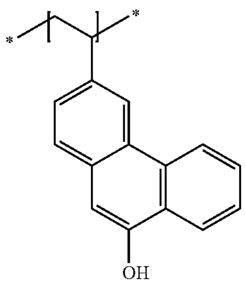
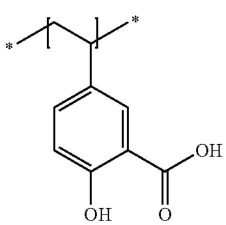
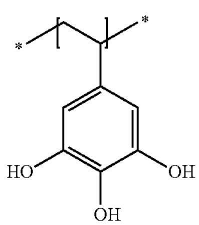
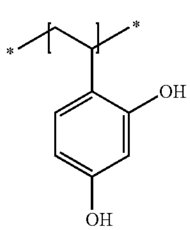
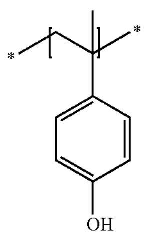
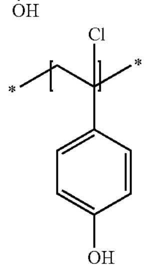
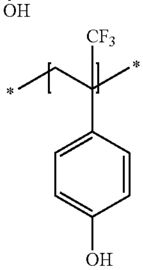
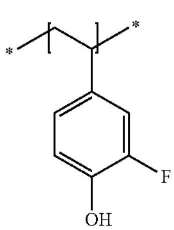
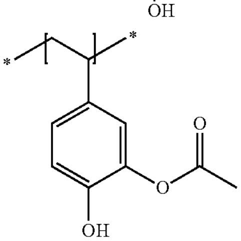
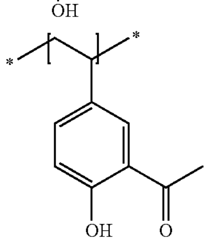
-continued
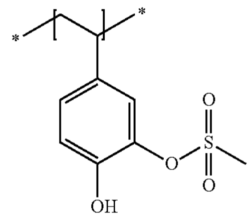
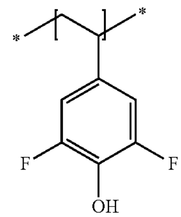
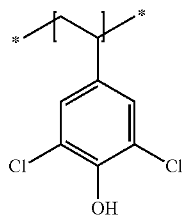
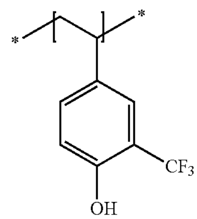
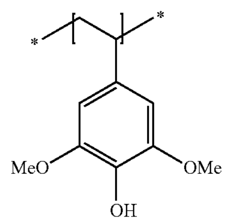
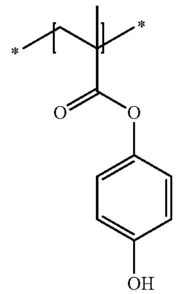
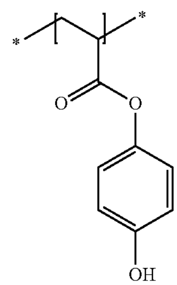
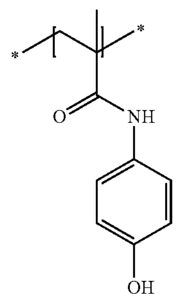
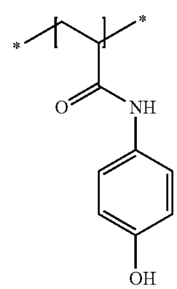
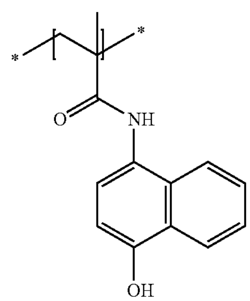
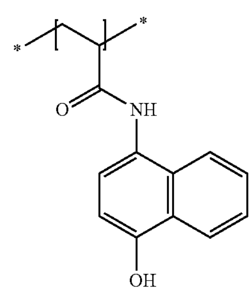
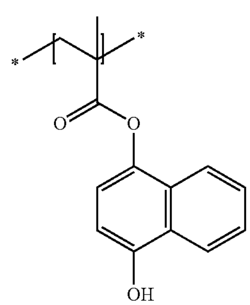
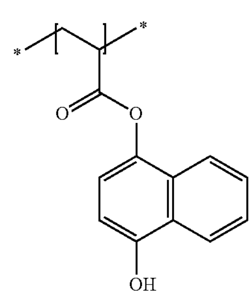

-continued

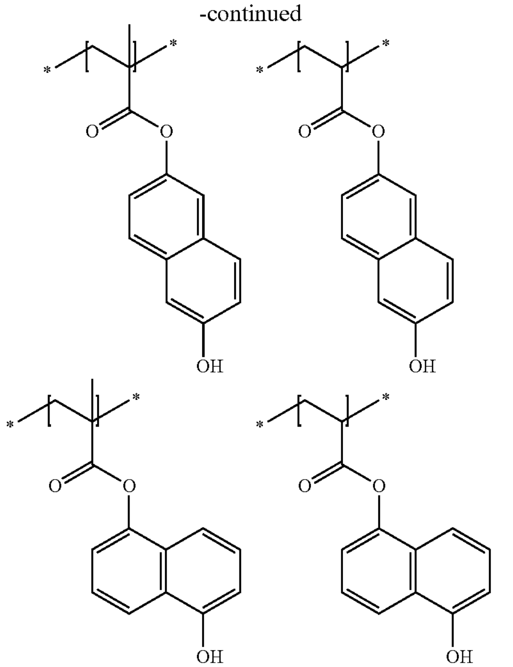

The compound (ϵ) preferably has a structure where the hydrogen atom of a phenolic hydroxyl group is replaced by a group having a non-acid-decomposable polycyclic alicyclic hydrocarbon structure, because a high glass transition temperature (Tg) is obtained and the dry etching resistance is improved.

By virtue of the compound (ϵ) having the above-described specific structure, the glass transition temperature (Tg) of the compound (ϵ) becomes high, so that a very hard resist film can be formed and the acid diffusion and dry etching resistance can be controlled. As a result, acid diffusion in the area exposed to an actinic ray or radiation such as electron beam and extreme-ultraviolet ray is highly suppressed and therefore, the resolution, pattern profile and LER in a fine pattern are more improved. Also, the configuration that the compound (ϵ) has a non-acid-decomposable polycyclic alicyclic hydrocarbon structure is considered to contribute to more enhancement of the dry etching resistance. Furthermore, although details are unknown, it is presumed that the polycyclic alicyclic hydrocarbon structure has a high hydrogen radical-donating property and the compound works out to a hydrogen source at the time of decomposition of the photoacid generator, that is, the compound (β) capable of generating an acid upon irradiation with an actinic ray or radiation, leading to a more improved decomposition efficiency of the photoacid generator and a higher acid generation efficiency, which is thought to contribute to more excellent sensitivity.

In the specific structure that the compound (ϵ) of the present invention may have, an aromatic ring such as benzene ring and a group having a non-acid-decomposable polycyclic alicyclic hydrocarbon structure are connected through an oxygen atom derived from a phenolic hydroxyl group. As described above, this structure is capable of not only contributing to high dry etching resistance but also raising the glass transition temperature (Tg) of the compound (ϵ), and the combination of these effects is presumed to provide for higher resolution.

In the present invention, the "non-acid-decomposable" means the property that a decomposition reaction is not caused by an acid generated from the compound (β) capable of generating an acid upon irradiation with an actinic ray or radiation.

More specifically, the group having a non-acid-decomposable polycyclic alicyclic hydrocarbon structure is preferably a group stable to an acid and an alkali. The "group stable to an acid and an alkali" means a group not exhibiting acid decomposability and alkali decomposability. The "acid decomposability" as used herein means the property of causing a decomposition reaction due to an action of the acid generated from the compound (β) capable of generating an acid upon irradiation with an actinic ray or radiation, and the group exhibiting acid decomposability includes the acid-decomposable group described later in "Repeating Unit Having Acid-Decomposable Group".

Also, the "alkali decomposability" means the property of causing a decomposition reaction due to an action of an alkali developer, and the group exhibiting alkali decomposability includes the conventionally known group capable of decomposing by an action of alkali developer to increase the dissolution rate in an alkali developer (for example, a group having a lactone structure), which is contained in the resin suitably used for the positive chemical amplification resist composition.

The group having a polycyclic alicyclic hydrocarbon structure is not particularly limited as long as it is a monovalent group having a polycyclic alicyclic hydrocarbon structure, but the total carbon number thereof is preferably from 5 to 40, more preferably from 7 to 30. The polycyclic alicyclic hydrocarbon structure may have an unsaturated bond in the ring.

The polycyclic alicyclic hydrocarbon structure in the group having a polycyclic alicyclic hydrocarbon structure means a structure having a plurality of alicyclic hydrocarbon groups of a monocyclic type, or an alicyclic hydrocarbon structure of a polycyclic type, and may be a bridged system. The alicyclic hydrocarbon group of a monocyclic type is preferably a cycloalkyl group having a carbon number of 3 to 8, and examples thereof include a cyclopropyl group, a cyclopentyl group, a cyclohexyl group, a cyclobutyl group, and a cyclooctyl group. The structure having a plurality of alicyclic hydrocarbon groups of a monocyclic type has a plurality of such groups. The structure having a plurality of alicyclic hydrocarbon groups of a monocyclic type preferably has from 2 to 4, more preferably 2, alicyclic hydrocarbon groups of a monocyclic type.

The alicyclic hydrocarbon group of a polycyclic type includes, for example, a bicyclo-, tricyclo- or tetracyclo-structure having a carbon number of 5 or more and is preferably a polycyclic cyclo-structure having a carbon number of 6 to 30, and examples thereof include an adamantane structure, a decalin structure, a norbornane structure, a norbornene structure, a cedrol structure, an isoboronane structure, a bornane structure, a dicyclopentane structure, an α-pinene structure, a tricyclodecane structure, a tetracyclododecane structure, and an androstane structure. Incidentally, a part of carbon atoms in the monocyclic or polycyclic cycloalkyl group may be substituted with a heteroatom such as oxygen atom.

Among these polycyclic alicyclic hydrocarbon structures, an adamantane structure, a decalin structure, a norbornane structure, a norbornene structure, a cedrol structure, a structure having a plurality of cyclohexyl groups, a structure having a plurality of cycloheptyl groups, a structure having a plurality of cyclooctyl groups, a structure having a plurality of cyclodecanyl groups, a structure having a plurality of cyclododecanyl groups, and a tricyclodecane structure are preferred, and an adamantane structure is most preferred in view of dry etching resistance (that is, it is most preferred that the group having a non-acid-decomposable polycyclic alicyclic hydrocarbon structure is a group having a non-acid-decomposable adamantane structure).

Chemical formulae of these polycyclic alicyclic hydrocarbon structures (with respect to the structure having a plurality of alicyclic hydrocarbon groups of a monocyclic type, the alicyclic hydrocarbon structure of a monocyclic type corresponding to the contained alicyclic hydrocarbon group of a monocyclic type (specifically, structures of the following formulae (47) to (50))) are illustrated below.

[Chem. 64]

(1)

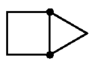

(2)

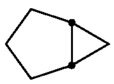

(3)

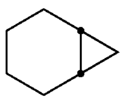

(4)

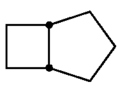

(5)

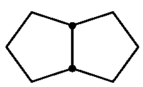

(6)

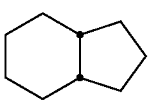

(7)

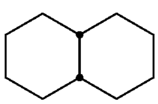

(8)

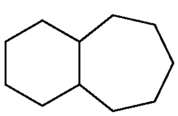

(9)

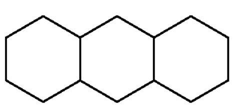

(10)

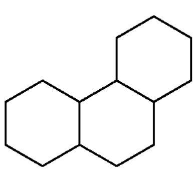

(11)

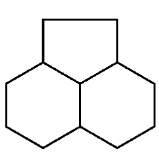

-continued (12)

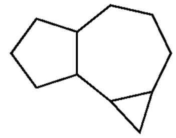

(13)

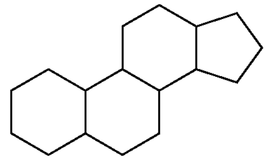

(14)

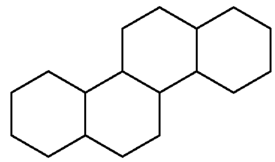

(15)

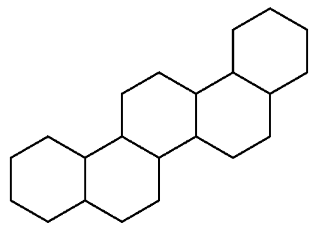

(16)

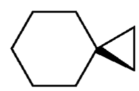

(17)

(18)

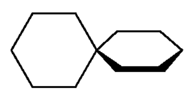

(19)

(20)

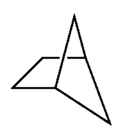

(21)

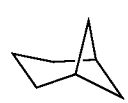

(22)

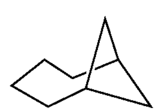

(23)

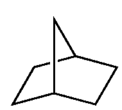

-continued
(24)
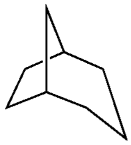
(25)
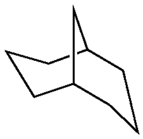
(26)
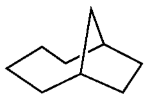
(27)
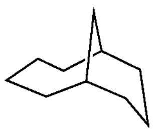
(28)
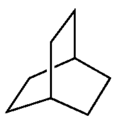
(29)
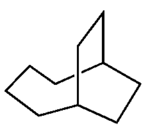
(30)
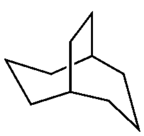
(31)
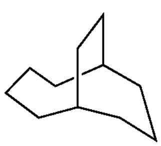
(32)
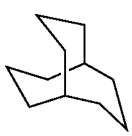
(33)
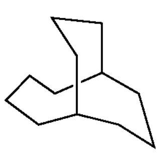
(34)
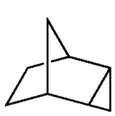
-continued
(35)
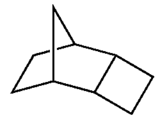
(36)
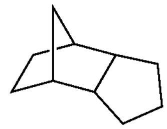
(37)
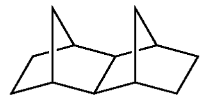
(38)
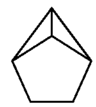
(39)
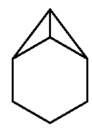
(40)
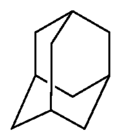
(41)
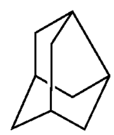
(42)
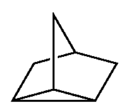
(43)
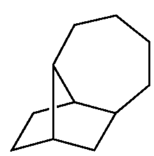
(44)
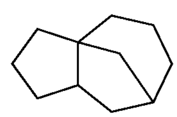
(45)
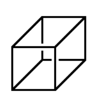
(46)
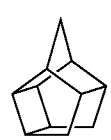
(47)

-continued (48)

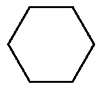

(49)

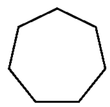

(50)

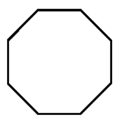

[Chem. 65]

(51)

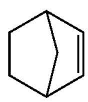

The polycyclic alicyclic hydrocarbon structure may further have a substituent, and the substituent includes, for example, an alkyl group (preferably having a carbon number of 1 to 6), a cycloalkyl group (preferably having a carbon number of 3 to 10), an aryl group (preferably having a carbon number of 6 to 15), a halogen atom, a hydroxyl group, an alkoxy group (preferably having a carbon number of 1 to 6), a carboxyl group, a carbonyl group, a thiocarbonyl group, an alkoxycarbonyl group (preferably having a carbon number of 2 to 7), and a group formed by combining these groups (preferably having a total carbon number of 1 to 30, more preferably a total carbon number of 1 to 15).

The polycyclic alicyclic hydrocarbon structure is preferably a structure represented by any one of formulae (7), (23), (40), (41) and (51), or a structure having two monovalent groups each formed by substituting a bond for one arbitrary hydrogen atom in the structure of formula (48), more preferably a structure represented by any one of formulae (23), (40) and (51), or a structure having two monovalent groups each formed by substituting a bond for one arbitrary hydrogen atom in the structure of formula (48), and most preferably a structure represented by formula (40).

The group having a polycyclic alicyclic hydrocarbon structure is preferably a monovalent group formed by substituting a bond for one arbitrary hydrogen atom in the above-described polycyclic alicyclic hydrocarbon structure.

The structure where the hydrogen atom of a phenolic hydroxyl group is replaced by the group having a non-acid-decomposable polycyclic alicyclic hydrocarbon structure is preferably contained, in the compound (ϵ) that is a polymer compound, as a repeating unit having a structure where the hydrogen atom of a phenolic hydroxyl group is replaced by the group having a non-acid-decomposable polycyclic alicyclic hydrocarbon structure, and more preferably contained, in the compound (ϵ), as a repeating unit represented by the following formula (3):

[Chem. 66]

(3)

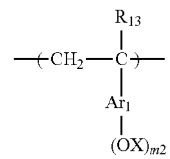

In formula (3), $R_{13}$ represents a hydrogen atom or a methyl group.

X represents a group having a non-acid-decomposable polycyclic alicyclic hydrocarbon structure.

$Ar_1$ represents an aromatic ring.

m2 is an integer of 1 or more.

In formula (3), $R_{13}$ represents a hydrogen atom or a methyl group and is preferably a hydrogen atom.

The aromatic ring of $Ar_1$ in formula (3) includes, for example, an aromatic hydrocarbon ring having a carbon number of 6 to 18 which may have a substituent, such as benzene ring, naphthalene ring, anthracene ring, fluorene ring and phenanthrene ring, and an aromatic heterocyclic ring containing a heterocyclic ring such as thiophene ring, furan ring, pyrrole ring, benzothiophene ring, benzofuran ring, benzopyrrole ring, triazine ring, imidazole ring, benzimidazole ring, triazole ring, thiadiazole ring and thiazole ring. Among these, a benzene ring and a naphthalene ring are preferred in view of resolution, and a benzene ring is most preferred.

The aromatic ring of $Ar_1$ may have a substituent other than the group represented by —OX, and the substituent includes, for example, an alkyl group (preferably having a carbon number of 1 to 6), a cycloalkyl group (preferably having a carbon number of 3 to 10), an aryl group (preferably having a carbon number of 6 to 15), a halogen atom, a hydroxyl group, an alkoxy group (preferably having a carbon number of 1 to 6), a carboxyl group, and an alkoxycarbonyl group (preferably having a carbon number of 2 to 7), and is preferably an alkyl group, an alkoxy group or an alkoxycarbonyl group, more preferably an alkoxy group.

X represents a group having a non-acid-decomposable polycyclic alicyclic hydrocarbon structure. Specific examples and preferred range of the group having a non-acid-decomposable polycyclic alicyclic hydrocarbon structure, represented by X, are the same as those described above. X is more preferably a group represented by —Y—$X_2$ in formula (4) later.

m2 is preferably an integer of 1 to 5 and most preferably 1. When m2 is 1 and $Ar_1$ is a benzene ring, the substitution position of —OX may be the para-, meta- or ortho-position relative to the bonding position of the benzene ring to the polymer main chain but is preferably the para- or meta-position, more preferably the para-position.

In the present invention, the repeating unit represented by formula (3) is preferably a repeating unit represented by the following formula (4).

When a polymer compound (ϵ) containing a repeating unit represented by formula (4) is used, Tg of the polymer compound (ϵ) becomes high, and a very hard resist film is formed, so that acid diffusion and dry etching resistance can be more reliably controlled.

[Chem. 67]

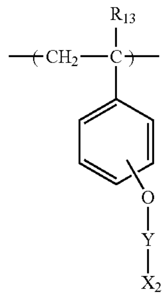

(4)

In formula (4), $R_{13}$ represents a hydrogen atom or a methyl group.

Y represents a single bond or a divalent linking group.

$X_2$ represents a non-acid-decomposable polycyclic alicyclic hydrocarbon group.

As to the repeating unit represented by formula (4), preferred embodiments used in the present invention are described below.

In formula (4), $R_{13}$ represents a hydrogen atom or a methyl group and in particular, is preferably a hydrogen atom.

In formula (4), Y is preferably a divalent linking group. The group preferred as the divalent linking group of Y is a carbonyl group, a thiocarbonyl group, an alkylene group (preferably having a carbon number of 1 to 10, more preferably a carbon number of 1 to 5), a sulfonyl group, —$COCH_2$—, —NH— or a divalent linking group formed by combining these (preferably having a total carbon number of 1 to 20, more preferably a total carbon umber of 1 to 10), more preferably a carbonyl group, —$COCH_2$—, a sulfonyl group, —CONH— or —CSNH—, still more preferably a carbonyl group or —$COCH_2$—, yet still more preferably a carbonyl group.

$X_2$ represents a polycyclic alicyclic hydrocarbon group and is non-acid-decomposable. The total carbon number of the polycyclic alicyclic hydrocarbon group is preferably from 5 to 40, more preferably from 7 to 30. The polycyclic alicyclic hydrocarbon group may have an unsaturated bond in the ring.

The polycyclic alicyclic hydrocarbon group is a group having a plurality of alicyclic hydrocarbon groups of a monocyclic type, or an alicyclic hydrocarbon group of a polycyclic type, and may be a bridged system. The alicyclic hydrocarbon group of a monocyclic type is preferably a cycloalkyl group having a carbon number of 3 to 8, and examples thereof include a cyclopropyl group, a cyclopentyl group, a cyclohexyl group, a cyclobutyl group, and a cyclooctyl group. The group has a plurality of such groups. The group having a plurality of alicyclic hydrocarbon groups of a monocyclic type preferably has from 2 to 4, more preferably 2, alicyclic hydrocarbon groups of a monocyclic type.

The alicyclic hydrocarbon group of a polycyclic type includes, for example, a bicyclo-, tricyclo- or tetracyclo-structure having a carbon number of 5 or more and is preferably a group having a polycyclic cyclo-structure with a carbon number of 6 to 30, and examples thereof include an adamantyl group, a norbornyl group, a norbornenyl group, an isoboronyl group, a camphanyl group, a dicyclopentyl group, an α-pinel group, a tricyclodecanyl group, a tetracyclododecyl group, and an androstanyl group. Incidentally, a part of carbon atoms in the monocyclic or polycyclic cycloalkyl group may be substituted with a heteroatom such as oxygen atom.

Among these polycyclic alicyclic hydrocarbon groups of $X_2$, an adamantyl group, a decalin group, a norbornyl group, a norbornenyl group, a cedrol group, a group having a plurality of cyclohexyl groups, a group having a plurality of cycloheptyl groups, a group having a plurality of cyclooctyl groups, a group having a plurality of cyclodecanyl groups, a group having a plurality of cyclododecanyl groups and a tricyclodecanyl group are preferred, and an adamantyl group is most preferred in view of dry etching resistance. Examples of the chemical formula of the polycyclic alicyclic hydrocarbon structure in the polycyclic alicyclic hydrocarbon group of $X_2$ are the same as those of the chemical formula of the polycyclic alicyclic hydrocarbon structure in the group having a polycyclic alicyclic hydrocarbon structure, and the preferred range is also the same. The polycyclic alicyclic hydrocarbon group of $X_2$ includes a monovalent group formed by substituting a bond for one arbitrary hydrogen atom in the above-described polycyclic alicyclic hydrocarbon structure.

Furthermore, the alicyclic hydrocarbon group above may have a substituent, and examples of the substituent are the same as those described above for the substituent that may be substituted on the polycyclic alicyclic hydrocarbon structure.

In formula (4), the substitution position of —O—Y—$X_2$ may be the para-, meta- or ortho-position relative to the bonding position of the benzene ring to the polymer main chain but is preferably the para-position.

In the present invention, the repeating unit represented by formula (3) is most preferably a repeating unit represented by the following formula (4'):

[Chem. 68]

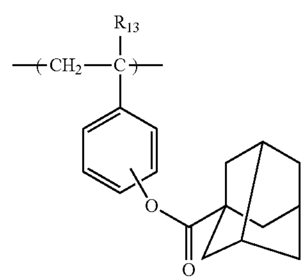

(4')

In formula (4'), $R_{13}$ represents a hydrogen atom or a methyl group.

In formula (4'), $R_{13}$ represents a hydrogen atom or a methyl group and in particular, is preferably a hydrogen atom.

In formula (4'), the substitution position of the adamantyl ester group may be the para-, meta- or ortho-position relative to the bonding position of the benzene ring to the polymer main chain but is preferably the para-position.

Specific examples of the repeating unit represented by formula (3) include the followings.

[Chem. 69]

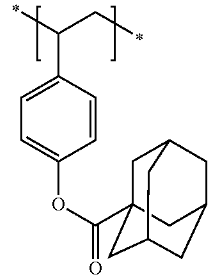

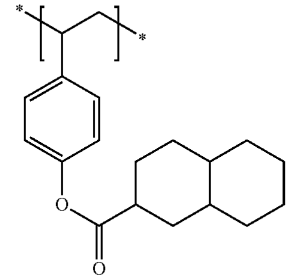

-continued
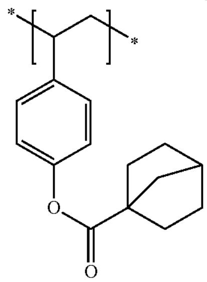
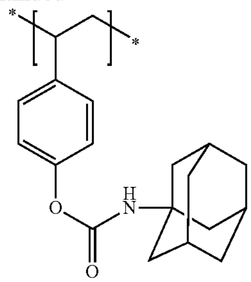
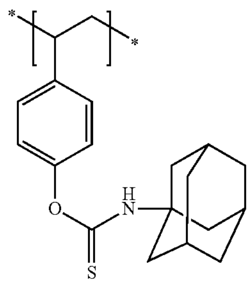
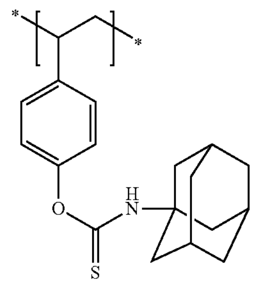
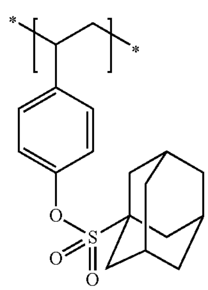
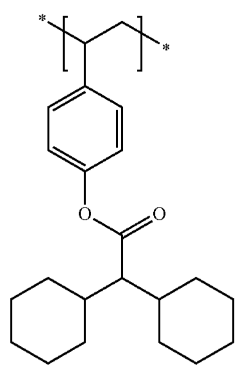
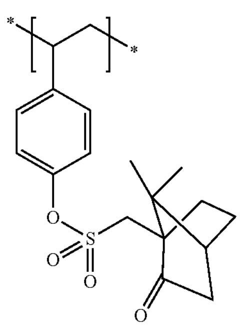
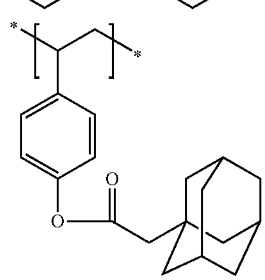
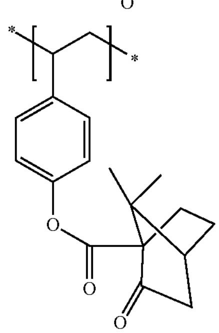
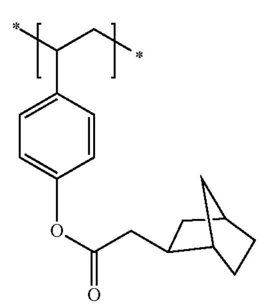
-continued
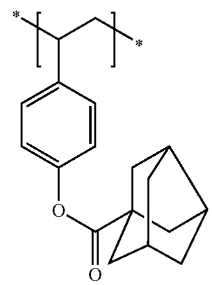
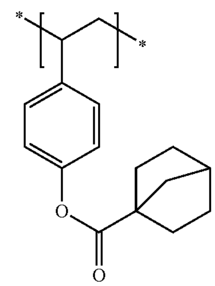
[Chem. 70]
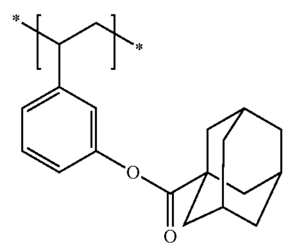
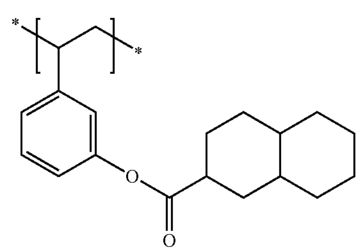
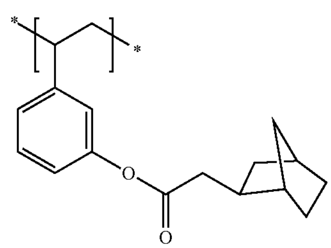
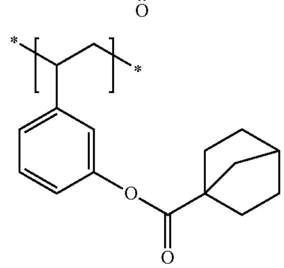
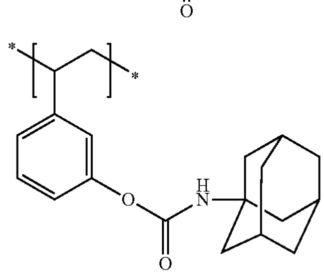

-continued
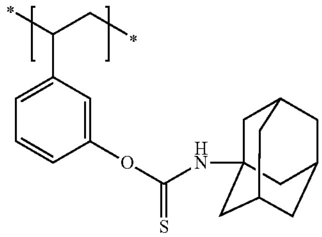
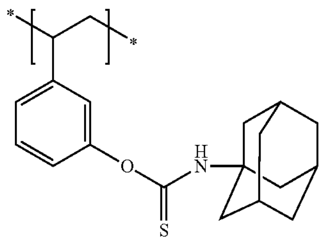
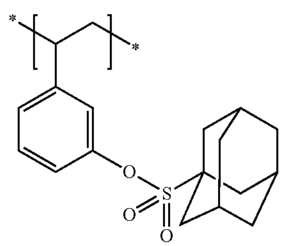
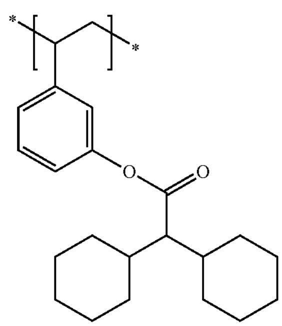
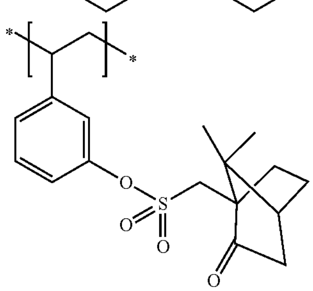
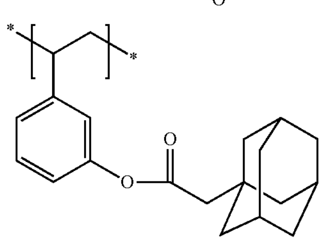
-continued
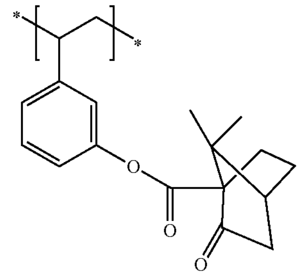
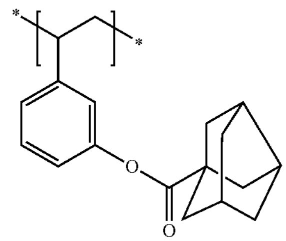
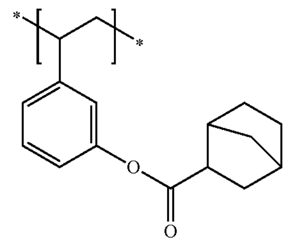
[Chem. 71]
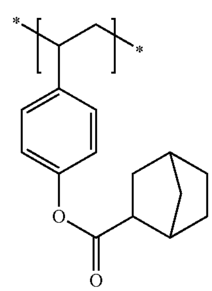
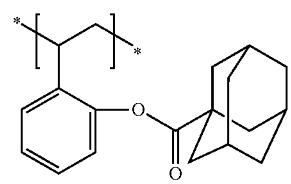
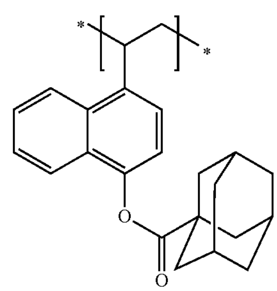
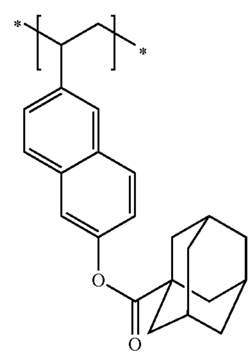
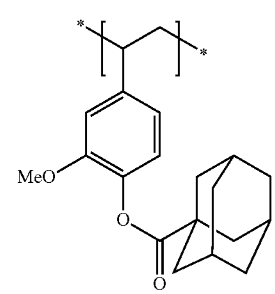

-continued

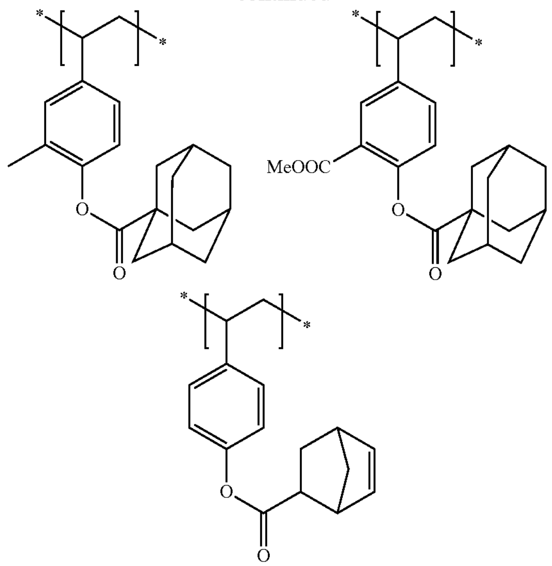

In the case where the compound (ϵ) is a polymer compound and contains a repeating unit having a structure in which the hydrogen atom of a phenolic hydroxyl group is replaced by the group having a non-acid-decomposable polycyclic alicyclic hydrocarbon structure, the content of the repeating unit is preferably from 1 to 40 mol %, more preferably from 2 to 30 mol %, based on all repeating units in the compound (ϵ) as a polymer compound.

It is also preferred that the compound (ϵ) as a polymer compound for use in the present invention further contains the following repeating unit (hereinafter, sometimes referred to as "another repeating unit") as a repeating unit other than the repeating units described above.

Examples of the polymerizable monomer for forming such another repeating unit include styrene, an alkyl-substituted styrene, an alkoxy-substituted styrene, a halogen-substituted styrene, an O-alkylated styrene, an O-acylated styrene, a hydrogenated hydroxystyrene, a maleic anhydride, an acrylic acid derivative (e.g., acrylic acid, acrylic acid ester), a methacrylic acid derivative (e.g., methacrylic acid, methacrylic acid ester), an N-substituted maleimide, acrylonitrile, methacrylonitrile, vinylnaphthalene, vinylanthracene, and an indene that may have a substituent.

The compound (ϵ) as a polymer compound may or may not contain such another repeating unit, but in the case of containing such another repeating unit, the content thereof in the compound (ϵ) as a polymer compound is generally from 1 to 30 mol %, preferably from 1 to 20 mol %, more preferably from 2 to 10 mol %, based on all repeating units constituting the compound (ϵ) as a polymer compound.

The compound (ϵ) as a polymer compound can be synthesized by a known radical polymerization method, anionic polymerization method or living radical polymerization method (e.g., iniferter method). For example, in the anionic polymerization method, vinyl monomers are dissolved in an appropriate organic solvent and reacted usually under cooling condition by using a metal compound (e.g., butyllithium) as the initiator, whereby the polymer can be obtained.

As the compound (ϵ) that is a polymer compound, a polyphenol compound produced by a condensation reaction of an aromatic ketone or aromatic aldehyde and a compound containing from 1 to 3 phenolic hydroxyl groups (see, for example, JP-A-2008-145539), a calixarene derivative (see, for example, JP-A-2004-18421), a Noria derivative (see, for example, JP-A-2009-222920), and a polyphenol derivative (see, for example, JPA-2008-94782) can be also applied, and these compounds may be modified by a polymer reaction to synthesize a polymer compound.

The compound (ϵ) as a polymer compound is preferably synthesized by subjecting a polymer obtained by radical polymerization or anionic polymerization to modification by a polymer reaction.

The weight average molecular weight of the compound (ϵ) as a polymer compound is preferably from 1,000 to 200,000, more preferably from 2,000 to 50,000, still more preferably from 2,000 to 15,000.

The polydispersity (molecular weight distribution) (Mw/Mn) of the compound (ϵ) as a polymer compound is preferably 2.5 or less and from the standpoint of enhancing the sensitivity and resolution, more preferably from 1.0 to 2.5, still more preferably from 1.0 to 1.6, most preferably from 1.0 to 1.25. By employing living polymerization such as living anionic polymerization, the polydispersity (molecular weight distribution) of the polymer compound obtained becomes uniform, and this is preferred. The weight average molecular weight and polydispersity of the compound (8) as a polymer compound are defined as a value in terms of polystyrene by GPC measurement.

As for the compound (ϵ), one compound may be used alone, or two or more compounds may be used in combination.

The amount of the compound (ϵ) amount to the chemical amplification resist composition of the present invention is preferably from 30 to 95 mass %, more preferably from 40 to 90 mass %, still more preferably from 50 to 85 mass %, based on the total solid content of the composition.

Specific examples of the compound (ϵ) are illustrated below, but the present invention is not limited thereto.

[Chem. 72]

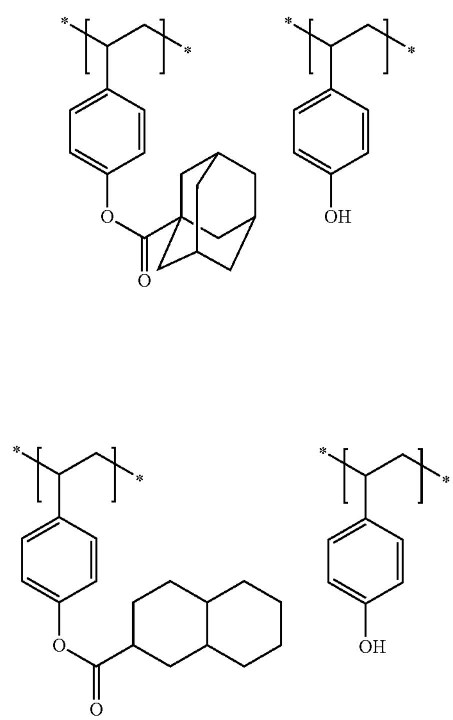

-continued
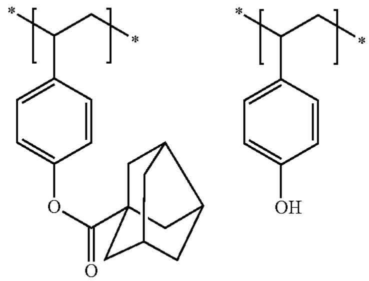
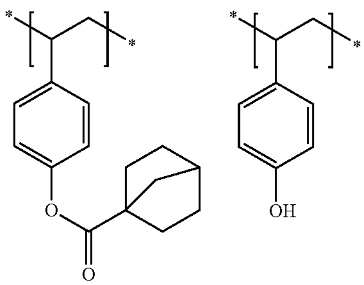
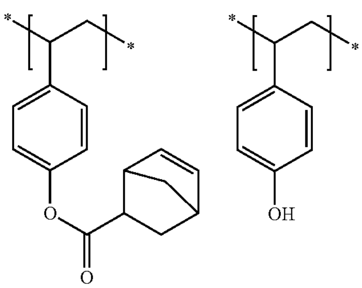
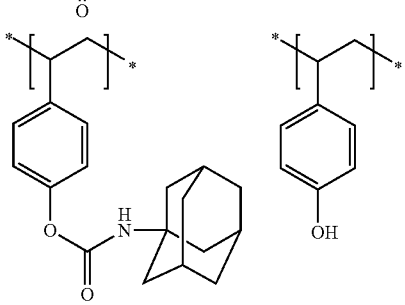
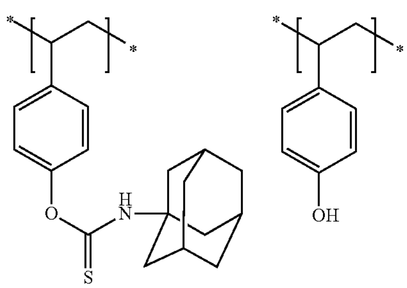
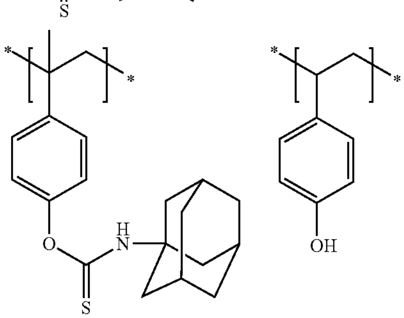
-continued
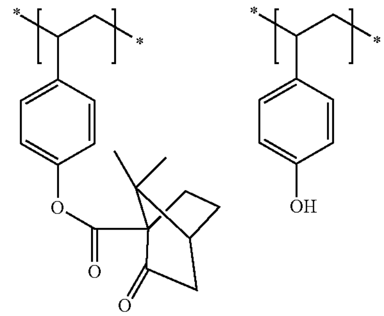
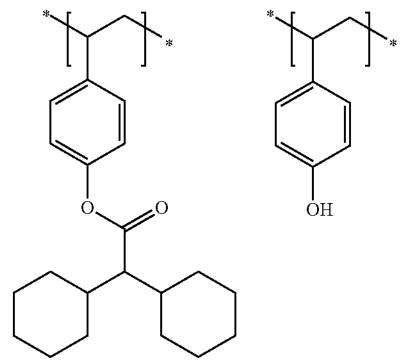
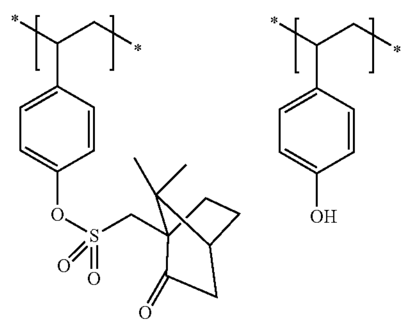
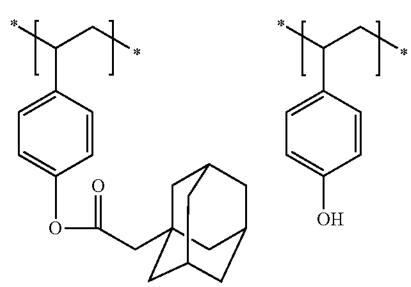
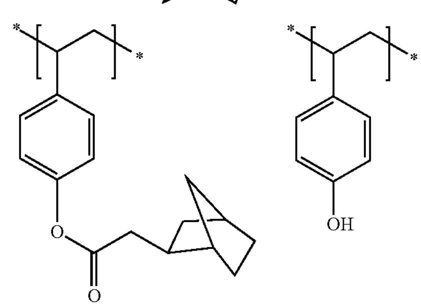

-continued
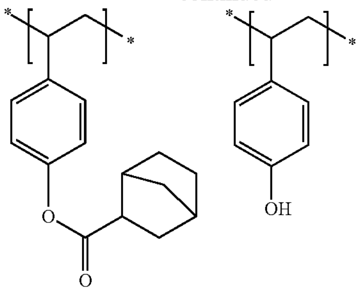
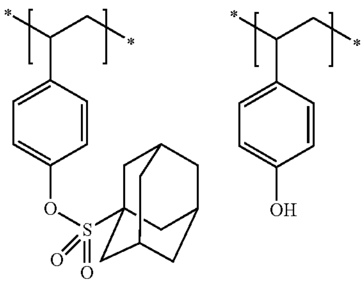
[Chem. 73]
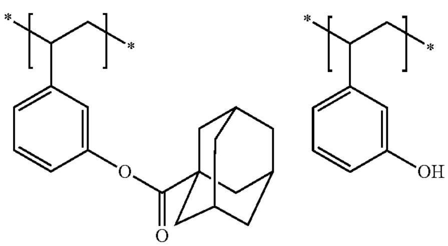
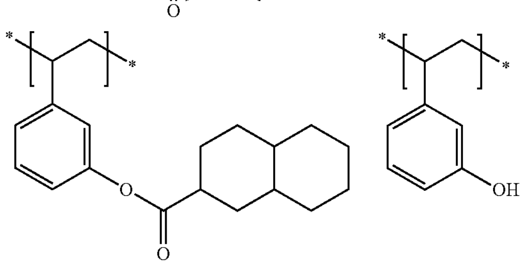
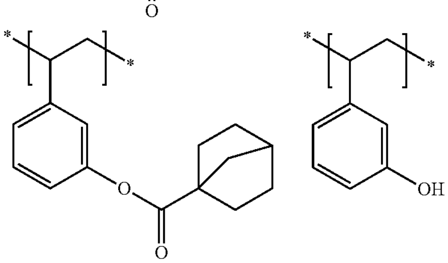
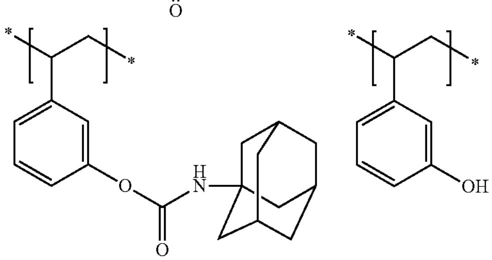
-continued
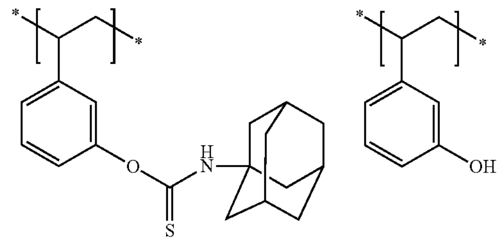
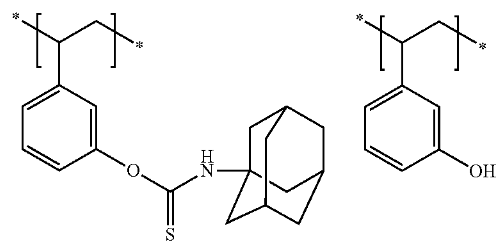
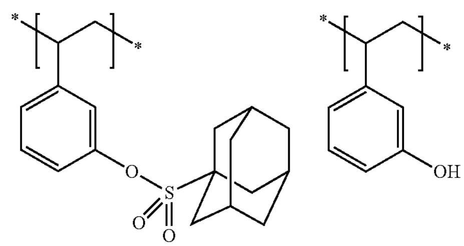
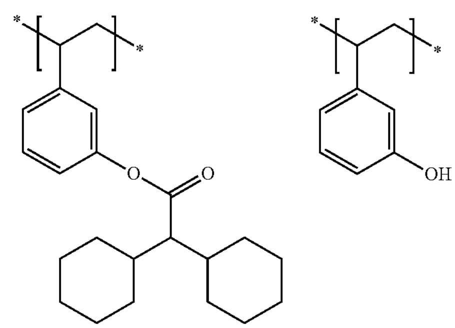
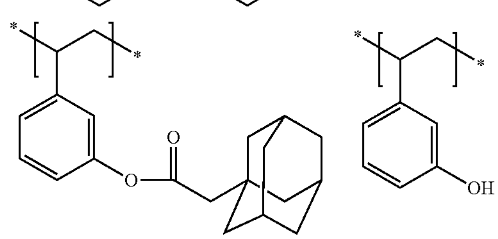
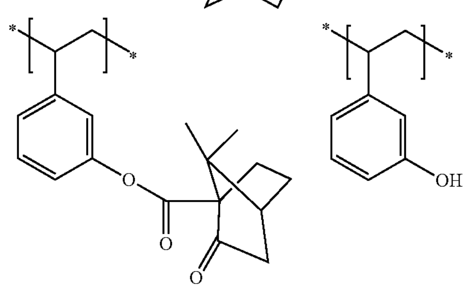

-continued
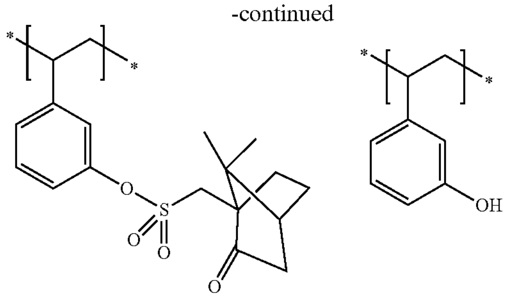
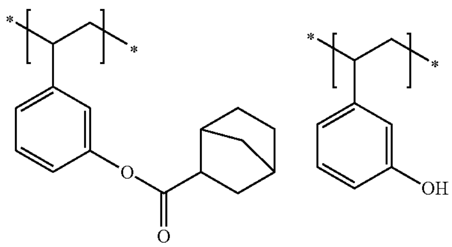
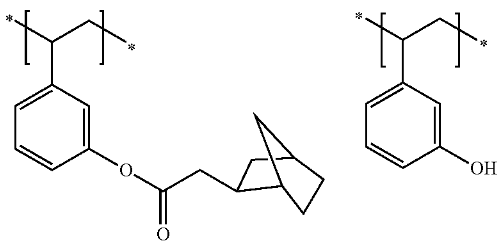
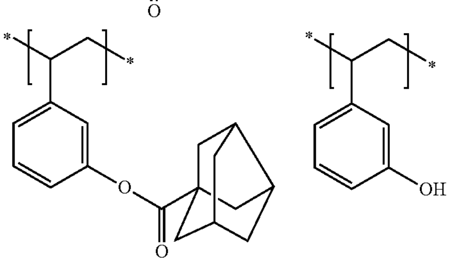
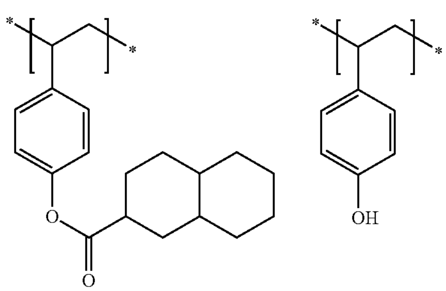
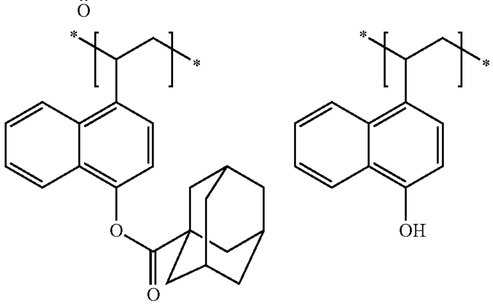
-continued
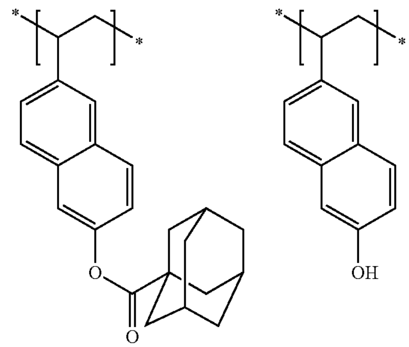
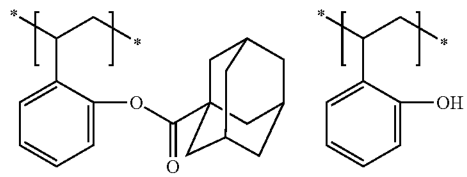
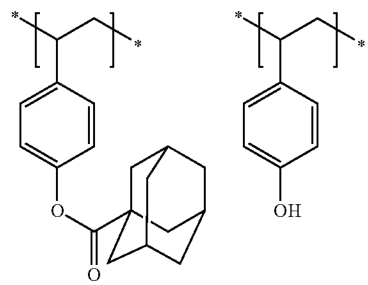
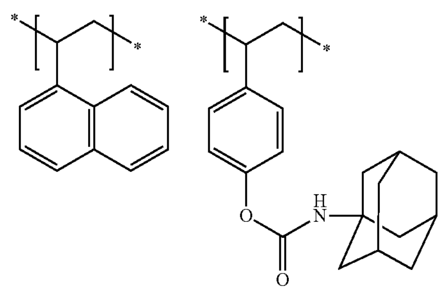
[Chem. 74]
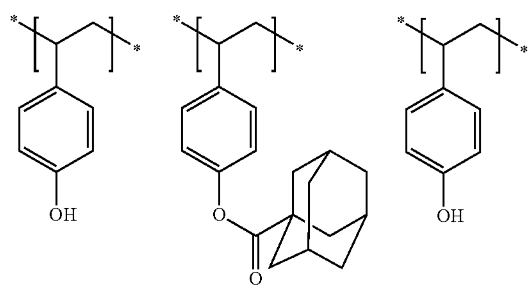
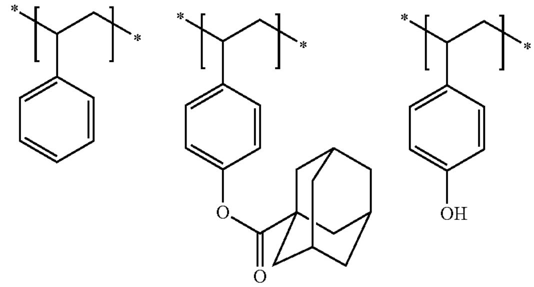

-continued

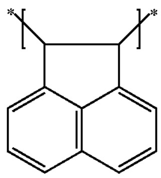
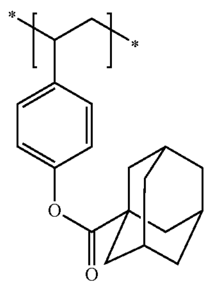
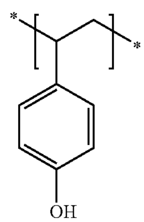
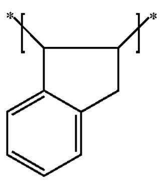
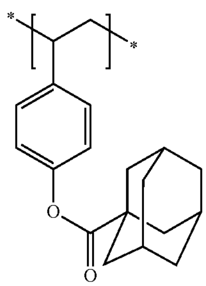
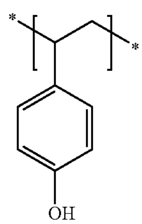
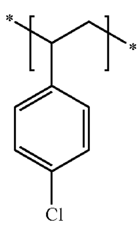
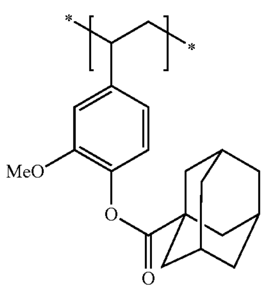
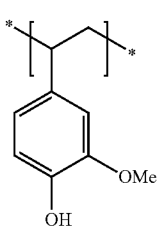
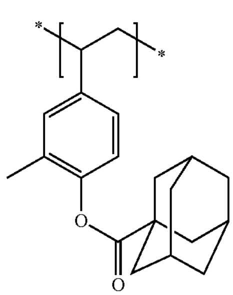
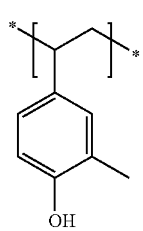
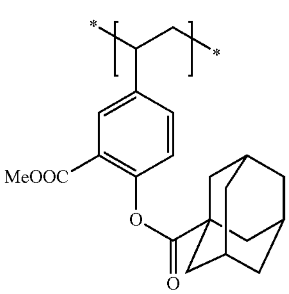
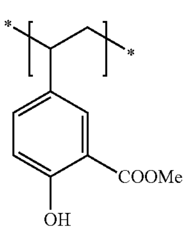

[Chem.75]

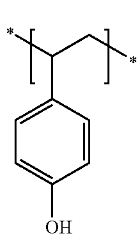
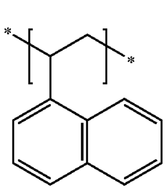
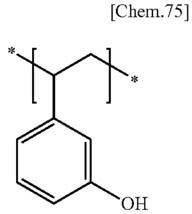

-continued

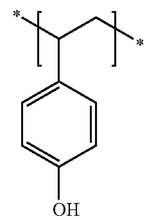
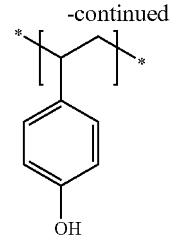
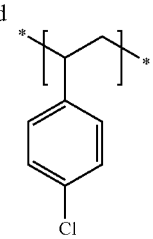
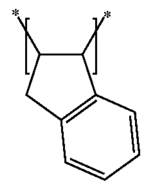
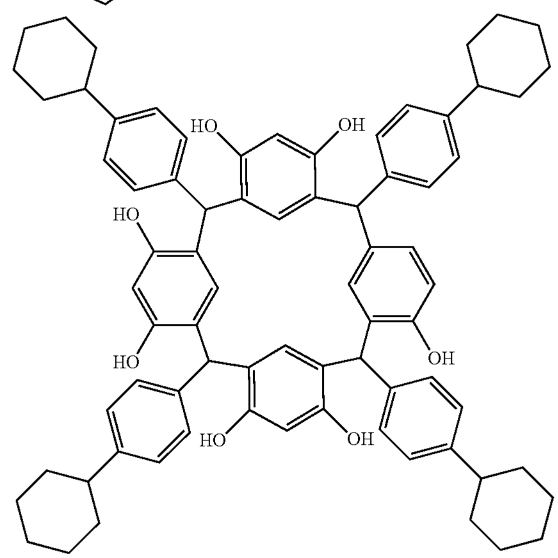

<5> (δ) Crosslinking Agent

In the case of forming a negative pattern, the chemical amplification resist composition of the present invention preferably contains (δ) a crosslinking agent (hereinafter, sometimes referred to as "acid crosslinking agent" or simply as "crosslinking agent").

The chemical amplification resist composition of the present invention more preferably contains, as the crosslinking agent (δ), a compound having two or more hydroxymethyl groups or alkoxymethyl groups in the molecule.

Preferred crosslinking agents include hydroxyethylated or alkoxymethylated phenol compounds, alkoxymethylated melamine-based compounds, alkoxymethyl glycoluril-based compounds, and acyloxymethylated urea-based compounds, and among these, hydroxymethylated or alkoxymethylated phenol compounds are more preferred, because a good pattern profile is obtained. The compound (δ) particularly preferred as the crosslinking agent includes a phenol derivative having a molecular weight of 1,200 or less and containing, in the molecule, from 3 to 5 benzene rings and a total of two or more hydroxymethyl groups or alkoxymethyl groups, a melamine-formaldehyde derivative having at least two free N-alkoxymethyl groups, and an alkoxymethyl glycoluril derivative.

In view of the pattern profile, the chemical amplification resist composition of the present invention preferably contains, as the crosslinking agent (δ), at least two compounds each having two or more alkoxymethyl groups in the molecule, more preferably contains at least two phenol compounds each having two or more alkoxymethyl groups in the molecule, and above all, out of the at least two phenol compounds above, at least one phenol compound is preferably a phenol derivative having a molecular weight of 1,200 or less and containing, in the molecule, from 3 to 5 benzene rings and a total of two or more alkoxymethyl groups.

The alkoxymethyl group is preferably a methoxymethyl group or an ethoxymethyl group.

Out of the crosslinking agents above, the phenol derivative having a hydroxymethyl group can be obtained by reacting a corresponding phenol compound having no hydroxymethyl group with formaldehyde in the presence of a base catalyst. Also, the phenol derivative having an alkoxymethyl group can be obtained by reacting a corresponding phenol derivative having a hydroxymethyl group with an alcohol in the presence of an acid catalyst.

Among the thus-synthesized phenol derivatives, a phenol derivative having an alkoxymethyl group is preferred in view of sensitivity and storage stability.

Other preferred examples of the crosslinking agent include a compound having an N-hydroxymethyl group or an N-alkoxymethyl group, such as alkoxymethylated melamine-based compound, alkoxymethyl glycoluril-based compound and alkoxymethylated urea-based compound.

Such a compound includes hexamethoxymethylmelamine, hexaethoxymethylmelamine, tetramethoxymethyl glycoluril, 1,3-bismethoxymethyl-4,5-bismethoxyethyleneurea, bismethoxymethylurea, etc., and these are disclosed in EP 0,133,216A, German Patents 3,634,671 and 3,711,264, and EP 0,212,482A.

Among these crosslinking agents, particularly preferred are those illustrated below.

[Chem. 76]

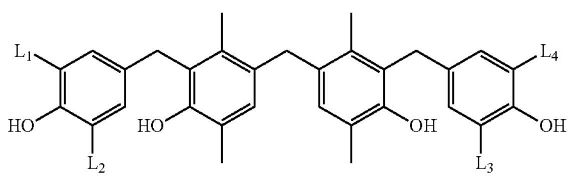

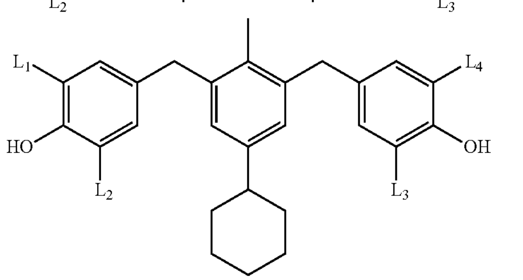

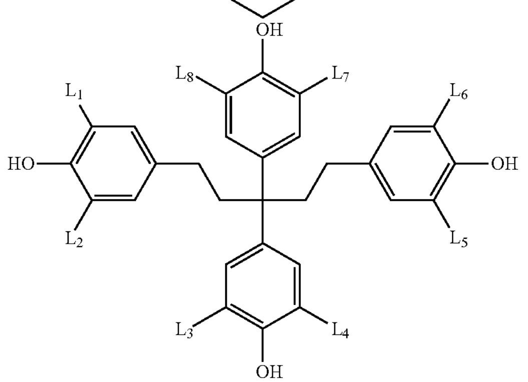

-continued

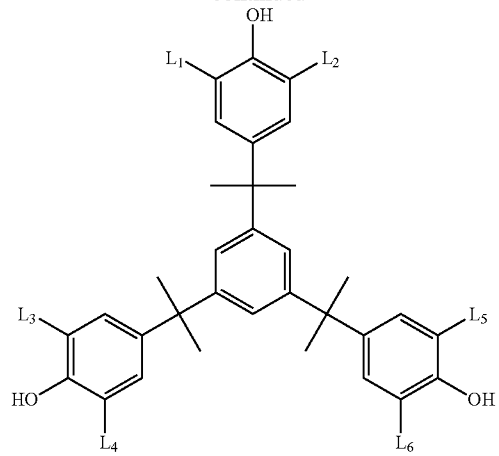

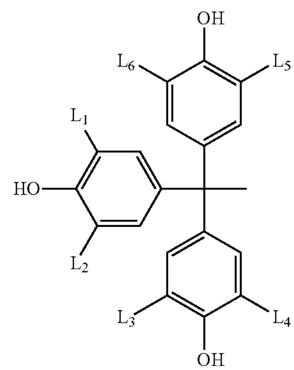

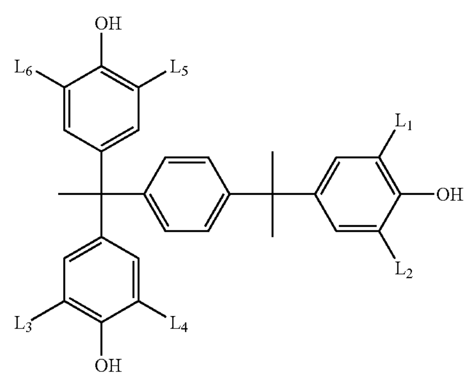

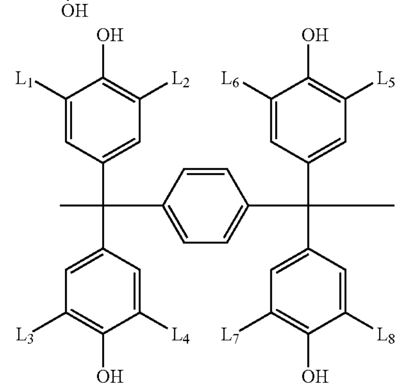

-continued

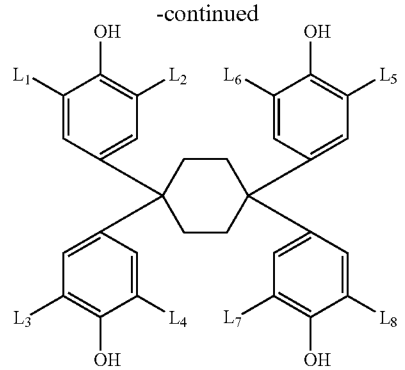

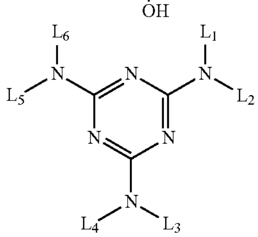

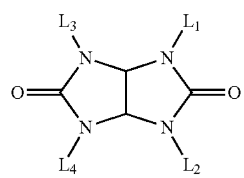

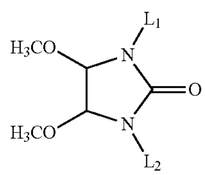

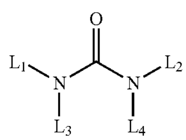

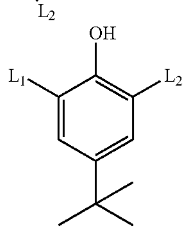

In these formulae, each of $L_1$ to $L_8$ independently represents a hydrogen atom, a hydroxymethyl group, a methoxymethyl group, an ethoxymethyl group, or an alkyl group having a carbon number of 1 to 6.

In the present invention, the crosslinking agent is used in an addition amount of preferably from 3 to 65 mass %, more preferably from 5 to 50 mass %, still more preferably from 5 to 30 mass %, based on the solid content of the resist composition. When the amount of the crosslinking agent added is from 3 to 65 mass %, the residual film ratio and the resolution can be prevented from decreasing and at the same time, the stability during storage of the resist solution can be kept good.

In the present invention, one crosslinking agent may be used alone, or two or more crosslinking agents may be used in combination and in view of the pattern profile, two or more crosslinking agents are preferably used in combination.

For example, in the case of using the phenol derivative and additionally using another crosslinking agent, for example, using the above-described compound having an N-alkoxymethyl group in combination, the ratio between the phenol derivative and another crosslinking agent is, in terms of molar ratio, from 100/0 to 20/80, preferably from 90/10 to 40/60, more preferably from 80/20 to 50/50.

<6> Basic Compound

The chemical amplification resist composition of the present invention preferably contains a basic compound as an acid scavenger, in addition to the components described above. By using a basic compound, the change in performance over time from exposure to post-baking can be reduced. The basic compound is preferably an organic basic compound and, more specifically, includes aliphatic amines, aromatic amines, heterocyclic amines, nitrogen-containing compounds having a carboxyl group, nitrogen-containing compounds having a sulfonyl group, nitrogen-containing compounds having a hydroxy group, nitrogen-containing compounds having a hydroxyphenyl group, alcoholic nitrogen-containing compounds, amide derivatives, imide derivatives, etc. An amine oxide compound (preferably a compound having a methyleneoxy unit and/or an ethyleneoxy unit; for example, the compounds described in JP-A-2008-102383) and an ammonium salt (preferably a hydroxide or a carboxylate; more specifically, a tetraalkylammonium hydroxide typified by tetrabutylammonium hydroxide is preferred in view of LER) are also appropriately used.

Furthermore, a compound capable of increasing the basicity by an action of acid can also be used as a kind of the basic compound.

Specific examples of the amines include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline, 2,4,6-tri(tert-butyl)aniline, triethanolamine, N,N-dihydroxyethylaniline, tris(methoxyethoxyethyl)amine, compounds recited in column 3, line 60 et seq. of U.S. Pat. No. 6,040,112, 2-[2-{2-(2,2-dimethoxy-phenoxyethoxy)ethyl}-bis-(2-methoxyethyl)]-amine, and Compounds (C1-1) to ($C_{3-3}$) illustrated in paragraph [0066] of U.S. Patent Application Publication No. 2007/0224539A1. The compound having a nitrogen-containing heterocyclic structure includes 2-phenylbenzimidazole, 2,4,5-triphenylimidazole, N-hydroxyethylpiperidine, bis(1,2,2,6,6-pentamethyl-4-piperidyl) sebacate, 4-dimethylaminopyridine, antipyrine, hydroxyantipyrine, 1,5-diazabicyclo[4.3.0]-non-5-ene, 1,8-diazabicyclo[5.4.0]-undec-7-ene, tetrabutylammonium hydroxide, etc.

In addition, a photodecomposable basic compound (a compound which initially exhibits basicity due to a basic nitrogen atom acting as a base but decomposes upon irradiation with an actinic ray or radiation to generate a zwitterionic compound having a basic nitrogen atom and an organic acid moiety and resulting from their neutralization in the molecule, is reduced in or deprived of the basicity; for example, onium salts described in Japanese Patent No. 3,577,743, JP-A-2001-215689, JP-A-2001-166476 and JP-A-2008-102383), and a photobase generator (for example, compounds described in JP-A-2010-243773) are also appropriately used.

Among these basic compounds, an ammonium salt and a photodecomposable basic compound are preferred, because a good performance in terms of LER is obtained.

In the present invention, one basic compound may be used alone, or two or more basic compounds may be used in combination.

The content of the basic compound for use in the present invention is preferably from 0.01 to 10 mass %, more preferably from 0.03 to 5 mass %, still more preferably from 0.05 to 3 mass %, based on the total solid content of the resist composition.

<7> Surfactant

The chemical amplification resist composition of the present invention may further contain a surfactant so as to enhance the coatability. Examples of the surfactant include, although not particularly limited, a nonionic surfactant such as polyoxyethylene alkyl ethers, polyoxyethylene alkylallyl ethers, polyoxyethylene-polyoxypropylene block copolymers, sorbitan fatty acid esters and polyoxyethylene sorbitan fatty acid esters, a fluorine-containing surfactant such as Megaface F171 and F176 (produced by Dainippon Ink and Chemicals, Inc.), Florad FC430 (produced by Sumitomo 3M, Inc.), Surfynol E1004 (produced by Asahi Glass Co., Ltd.), and PF656 and PF6320 produced by OMNOVA, and an organosiloxane polymer such as Polysiloxane Polymer KP-341 (produced by Shin-Etsu Chemical Co., Ltd.).

In the case where the resist composition contains a surfactant, the amount of the surfactant used is preferably from 0.0001 to 2 mass %, more preferably from 0.0005 to 1 mass %, based on the total amount of the resist composition (excluding the solvent).

<8> Organic Carboxylic Acid

In view of scumming properties, the chemical amplification resist composition of the present invention preferably contains an organic carboxylic acid, in addition to the components described above. The organic carboxylic acid compound includes an aliphatic carboxylic acid, an alicyclic carboxylic acid, an unsaturated aliphatic carboxylic acid, an oxycarboxylic acid, an alkoxycarboxylic acid, a ketocarboxylic acid, a benzoic acid, a benzoic acid derivative, a phthalic acid, a terephthalic acid, an isophthalic acid, a 2-naphthoic acid, a 1-hydroxy-2-naphthoic acid, a 2-hydroxy-3-naphthoic acid, etc., but when performing electron beam exposure in vacuum, the organic carboxylic acid may volatilize from the resist film surface to contaminate the lithography chamber. For this reason, the preferable compound is an aromatic organic carboxylic acid, and above all, for example, a benzoic acid, a 1-hydroxy-2-naphthoic acid and a 2-hydroxy-3-naphthoic acid are preferred.

The blending amount of the organic carboxylic acid is preferably from 0.01 to 10 parts by mass, more preferably from 0.01 to 5 parts by mass, still more preferably from 0.01 to 3 parts by mass, per 100 parts by mass of the compound (E) having a phenolic hydroxyl group.

The chemical amplification resist composition of the present invention may further contain, if desired, a dye, a plasticizer, an acid-increasing agent other than the compound (A) (described, for example, in International Publication Nos. 95/29968 and 98/24000, JP-A-8-305262, JP-A-9-34106, JP-A-8-248561, JP-T-8-503082 (the term "JP-T" as used herein means a published Japanese translation of a PCT patent application), U.S. Pat. No. 5,445,917, JP-T-8-503081, U.S. Pat. Nos. 5,534,393, 5,395,736, 5,741,630, 5,334,489, 5,582,956, 5,578,424, 5,453,345 and 5,445,917, European Patent Nos. 665,960, 757,628 and 665,961, U.S. Pat. No. 5,667,943, JP-A-10-1508, JP-A-10-282642, JP-A-9-512498, JP-A-2000-62337, JP-A-2005-17730 and JP-A-2008-209889), etc. As for all of these compounds, examples thereof include those described for respective compounds in JP-A-2008-268935.

[Onium Carboxylate]

The chemical amplification resist composition of the present invention may contain an onium carboxylate. The onium carboxylate includes sulfonium carboxylate, iodonium carboxylate, ammonium carboxylate, etc. Among others, iodonium carboxylate and sulfonium carboxylate are preferred as the onium carboxylate. Furthermore, in the present invention, it is preferred that the carboxylate residue of the onium carboxylate does not contain an aromatic group and a carbon-carbon double bond. As for the particularly preferable anion moiety, a linear or branched, monocyclic or polycyclic alkylcarboxylate anion having a carbon number of 1 to 30 is preferred, and an anion where the alkyl group in the anion above is partially or entirely fluorine-substituted, is more preferred. An oxygen atom may be contained in the alkyl chain. Thanks to such a configuration, the transparency to light of 220 nm or less is ensured, the sensitivity and resolution are enhanced, and the iso/dense bias and exposure margin are improved.

The solvent for use in the chemical amplification resist composition of the present invention is preferably, for example, ethylene glycol monoethyl ether acetate, cyclohexanone, 2-heptanone, propylene glycol monomethyl ether (PGME, another name: 1-methoxy-2-propanol), propylene glycol monomethyl ether acetate (PGMEA, another name: 1-methoxy-2-acetoxypropane), propylene glycol monomethyl ether propionate, propylene glycol monoethyl ether acetate, methyl 3-methoxypropionate, ethyl 3-ethoxypropionate, methyl β-methoxyisobutyrate, ethyl butyrate, propyl butyrate, methyl isobutyl ketone, ethyl acetate, isoamyl acetate, ethyl lactate, toluene, xylene, cyclohexyl acetate, diacetone alcohol, N-methylpyrrolidone, N,N-dimethylformamide, γ-butyrolactone, N,N-dimethylacetamide, propylene carbonate, and ethylene carbonate. These solvents are used individually or in combination.

Solid matters of the resist composition are dissolved in the solvent above and preferably dissolved in a ratio of in terms of solid content concentration, from 1 to 40 mass %, more preferably from 1 to 30 mass %, still more preferably from 3 to 20 mass %.

The present invention also relates to a resist film formed using the chemical amplification resist composition of the present invention, and the resist film is formed, for example, by coating the resist composition on a support such as substrate. The thickness of the resist film is preferably from 0.02 to 0.1 μm. As for the coating method on a substrate, the composition is coated on a substrate by an appropriate coating method such as spin coating, roll coating, flow coating, dip coating, spray coating and doctor coating, but spin coating is preferred, and the spinning speed is preferably from 1,000 to 3,000 rpm. The coated film is pre-baked at 60 to 150° C. for 1 to 20 minutes, preferably at 80 to 120° C. for 1 to 10 minutes, to form a thin film.

As for the materials constituting the substrate to be processed and the outermost surface layer thereof, for example, in the case of a wafer for semiconductor, a silicon wafer can be used, and examples of the material working out to the outermost surface include Si, $SiO_2$, SiN, SiON, TiN, WSi, BPSG, SOG, and an organic antireflection film.

The present invention also relates to a resist-coated mask blanks coated with the resist film obtained as above. In order to obtain such a resist-coated mask blanks, in the case of forming a resist pattern on a photomask blanks for the production of a photomask, the transparent substrate used includes a transparent substrate such as quartz and calcium fluoride. In general, a light-shielding film, an antireflection film, further a phase shift film, and additionally a required functional film such as etching stopper film and etching mask film, are stacked on the substrate. As for the material of the functional film, a film containing silicon or a transition metal such as chromium, molybdenum, zirconium tantalum, tungsten, titanium and niobium is stacked. Examples of the material used for the outermost layer include a material where the main constituent material is a material containing silicon or containing silicon and oxygen and/or nitrogen, a silicon compound material where the main constituent material is the material above which further contains a transition metal, and a transition metal compound material where the main constituent material is a material containing a transition metal, particularly, one or more transition metals selected from chromium, molybdenum, zirconium, tantalum, tungsten, titanium and niobium, or further containing one or more elements selected from oxygen, nitrogen and carbon.

The light-shielding film may have a single-layer structure but preferably has a multilayer structure where a plurality of materials are coated one on another. In the case of a multilayer structure, the film thickness per layer is not particularly limited but is preferably from 5 to 100 nm, more preferably from 10 to 80 nm. The thickness of the entire light-shielding film is not particularly limited but is preferably from 5 to 200 nm, more preferably from 10 to 150 nm.

Out of the materials above, in the case of performing the pattern formation by using a negative chemical amplification resist composition on a photomask black having in the outermost surface layer thereof a material containing chromium and oxygen or nitrogen, a so-called undercut profile waist-shaped near the substrate is liable to be formed in general, but when the present invention is used, the undercut problem can be improved as compared with conventional mask blanks.

Subsequently, this resist film is irradiated with an actinic ray or radiation (e.g., electron beam), preferably baked (usually at 80 to 150° C., preferably from 90 to 130° C., usually for 1 to 20 minutes, preferably from 1 to 10 minutes), and then developed, whereby a good pattern can be obtained. Furthermore, etching, ion implantation or the like is appropriately performed by using this pattern as the mask to produce, for example, a semiconductor fine circuit, an imprint mold structure or a photomask.

Incidentally, the process when preparing an imprint mold by using the composition of the present invention is described, for example, in Japanese Patent 4,109,085, JP-A-2008-162101, and "Yoshihiko Hirai (compiler), *Nanoimprint no Kiso to Gijutsu Kaihatsu•Oyo Tenkai-Nanoimprint no Kiban Gijutsu to Saishin no Gijutsu Tenkai* (*Basic and Technology Expansion•Application Development of Nanoimprint-Substrate Technology of Nanoimprint and Latest Technology Expansion*), Frontier Shuppan".

The use mode of the chemical amplification resist composition of the present invention and the pattern forming method are described below.

The present invention also relates to a resist pattern forming method including exposing the above-described resist film or resist-coated mask blanks and developing the exposed resist film or resist-coated mask blanks. In the present invention, the exposure is preferably performed using an electron beam or an extreme-ultraviolet ray.

In the production or the like of a precision integrated circuit device, the exposure of resist film (pattern forming step) is preferably performed by patternwise irradiating the resist film of the present invention with an electron beam or an extreme-ultraviolet ray (EUV). The exposure is performed with an exposure dose of, in the case of an electron beam, approximately from 0.1 to 20 $\mu C/cm^2$, preferably on the order of 3 to 15 $\mu C/cm^2$, and in the case of an extreme-ultraviolet ray, approximately from 0.1 to 20 $mJ/cm^2$, preferably on the order of 3 to 15 $mJ/cm^2$. Thereafter, heating after development (post-exposure baking) is performed on a hot plate at 60 to 150° C. for 1 to 20 minutes, preferably at 80 to 120° C. for 1 to 10 minutes, and subsequently, the resist film is developed, rinsed and dried, whereby a resist pattern is formed. The developer is an aqueous alkali solution in a concentration of preferably from 0.1 to 5 mass %, more preferably from 2 to 3 mass %, such as tetramethylammonium hydroxide (TMAH) and tetrabutylammonium hydroxide (TBAH), and the development is performed by a conventional method such as dip method, puddle method and spray method for preferably from 0.1 to 3 minutes, more preferably from 0.5 to 2 minutes. In the alkali developer, alcohols and/or a surfactant may be added each in an appropriate amount. The pH of the alkali developer is usually from 10.0 to 15.0, and among others, an aqueous 2.38 mass % tetramethylammonium hydroxide solution is preferred.

In the developer, alcohols and/or a surfactant may be added each in an appropriate amount.

The surfactant is not particularly limited but, for example, ionic or nonionic fluorine-containing and/or silicon-containing surfactants can be used. The fluorine-containing and/or silicon-containing surfactants include, for example, surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988 and U.S. Pat. Nos. 5,405,720, 5,360,692, 5,529,881, 5,296,330, 5,436,098, 5,576,143, 5,294,511 and 5,824,451. A nonionic surfactant is preferred. The nonionic surfactant is not particularly limited, but use of a fluorine-containing surfactant or a silicon-containing surfactant is more preferred.

The amount of the surfactant used is usually from 0.001 to 5 mass %, preferably from 0.005 to 2 mass %, more preferably from 0.01 to 0.5 mass %, based on the total amount of the developer.

As the developing method, for example, a method of dipping the substrate in a bath filled with the developer for a fixed time (dip method), a method of raising the developer on the substrate surface by the effect of a surface tension and keeping it still for a fixed time, thereby performing development (puddle method), a method of spraying the developer on the substrate surface (spray method), and a method of continuously ejecting the developer on the substrate spinning at a constant speed while scanning a developer ejecting nozzle at a constant rate (dynamic dispense method) can be applied.

In the case where the above-described various developing methods include a step of ejecting the developer toward the resist film from a development nozzle of a developing apparatus, the ejection pressure of the developer ejected (the flow velocity per unit area of the developer ejected) is preferably 2 $mL/sec/mm^2$ or less, more preferably 1.5 $mL/sec/mm^2$ or less, still more preferably 1 $mL/sec/mm^2$ or less. The flow velocity has no particular lower limit but in view of throughput, is preferably 0.2 $mL/sec/mm^2$ or more.

By setting the ejection pressure of the ejected developer to the range above, pattern defects attributable to the resist scum after development can be greatly reduced.

Details of this mechanism are not clearly known, but it may be thought that thanks to the ejection pressure set to the above-described range, the pressure imposed on the resist film by the developer becomes small and the resist film or resist pattern is kept from inadvertent chipping or collapse.

Here, the ejection pressure ($mL/sec/mm^2$) of the developer is a value at the outlet of a development nozzle in a developing apparatus.

The method for adjusting the ejection pressure of the developer includes, for example, a method of adjusting the ejection pressure by a pump or the like, and a method of supplying the developer from a pressurized tank and adjusting its pressure to change the ejection pressure.

After the step of developing the resist film by using a developer, a step of stopping the development by replacing the solvent with another solvent may be practiced.

As for the rinsing solution in the rinsing treatment performed after the alkali development, pure water is used, and the pure water may also be used after adding thereto a surfactant in an appropriate amount.

In the case where the chemical amplification resist composition of the present invention is a negative type, the resist film in the unexposed portion is dissolved by the developer and the exposed portion is hardly dissolved, because the polymer compound is crosslinked therein, or in the case where the chemical amplification of the present invention is a positive type, the exposed portion is dissolved by the developer and the unexposed portion is hardly dissolved by the developer, whereby a target pattern is formed on the substrate.

The present invention also relates to a photomask obtained by exposing and developing the resist-coated mask blanks. As for the exposure and development, the above-described steps are applied. The photomask is suitably used for the production of a semiconductor.

The photomask of the present invention may be a light transmitting mask used with an ArF excimer laser, etc. or may be a light reflective mask used for reflective lithography using EUV light as the light source.

The present invention also relates to a semiconductor device manufacturing method involving the pattern forming method of the present invention, and a semiconductor device manufactured by this manufacturing method.

The semiconductor device of the present invention is suitably mounted on electric electronic equipment (e.g., home electric appliances, OA•media-related devices, optical equipment, communication equipment).

The actinic ray-sensitive or radiation-sensitive composition in a second embodiment of the present invention (hereinafter, sometimes simply referred to as "actinic ray-sensitive or radiation-sensitive composition of the present invention") contains [1] (A) Compound represented by the following formula (I) and [2] (B) Compound capable of generating an acid upon irradiation with an actinic ray or radiation:

[Chem. 77]

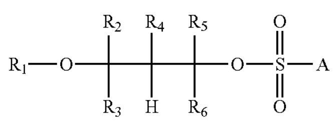

(I)

In formula (I), $R_1$ represents an alkyl group, a cycloalkyl group, an alkenyl group, an alkynyl group, an aryl group, or a group having a silicon atom.

Each of $R_2$ and $R_3$ independently represents a hydrogen atom, an alkyl group, a cycloalkyl group, an alkenyl group, an alkynyl group, an aryl group, an alkylsulfonyl group, an arylsulfonyl group or a heterocyclic group.

Each of $R_4$ to $R_6$ independently represents a hydrogen atom or a monovalent substituent.

At least two members of $R_1$ to $R_6$ may combine with each other to form a ring.

A represents a monovalent organic group.

The actinic ray-sensitive or radiation-sensitive composition in the second embodiment of the present invention may be used as a positive resist composition or may be used as a negative resist composition.

The actinic ray-sensitive or radiation-sensitive composition in the second embodiment of the present invention may contain (C) a compound having one or more phenolic hydroxyl groups or a compound in which the hydrogen atom in at least one phenolic hydroxyl group out of the one or more phenolic hydroxyl groups is replaced by a group capable of leaving by an action of acid (hereinafter, sometimes referred to as "compound (C)").

The phenolic hydroxyl group as used in the present application is a group formed by replacing a hydrogen atom of an aromatic ring group by a hydroxyl group. The aromatic ring of the aromatic ring group may be either a monocyclic or polycyclic aromatic ring and includes a benzene ring, a naphthalene ring, etc.

In the case where the actinic ray-sensitive or radiation-sensitive composition in the second embodiment of the present invention is a positive resist composition, the composition according to the present invention may contain, as the compound (C), (C1) a compound in which the hydrogen atom in at least one phenolic hydroxyl group out of the one or more phenolic hydroxyl groups is replaced by a group capable of leaving by an action of acid. Also, in this case, the composition according to the present invention may further contain a compound having a molecular weight of 3,000 or less and being capable of decomposing by an action of acid to increase the solubility for an alkali developer (hereinafter, sometimes referred to as "dissolution inhibiting compound").

In the case where the actinic ray-sensitive or radiation-sensitive composition in the second embodiment of the present invention is a negative resist composition, the composition according to the present invention may contain, as the compound (C), the later-described [4] (C2) Compound having one or more phenolic hydroxyl groups and at the same time, may further contain the later-described [6] Acid crosslinking agent capable of crosslinking with the alkali-soluble resin by an action of acid.

Also, the composition in the second embodiment of the present invention may further contain the later-described [7] Basic compound, [8] Fluorine- and/or silicon-containing surfactant, the later-described [9] Organic solvent, and/or the later-described [10] Other additives. The composition according to the present invention can be used for pattern formation, for example, by the method described later in [11] Pattern forming method.

These [1] to [11] as respective components of the actinic ray-sensitive or radiation-sensitive composition according to the present invention are described in sequence below.

[1] (A) Compound Represented by the Following Formula (I)

The actinic ray-sensitive or radiation-sensitive composition according to the present invention contains a compound represented by the following formula (I).

The compound represented by the following formula (I) decomposes by an action of acid as well as by heating to generate a sulfonic acid.

[Chem. 78]

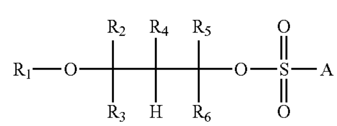

(I)

In formula (I), $R_1$ represents an alkyl group, a cycloalkyl group, an alkenyl group, an alkynyl group, an aryl group, or a group having a silicon atom.

Each of $R_2$ and $R_3$ independently represents a hydrogen atom, an alkyl group, a cycloalkyl group, an alkenyl group, an alkynyl group, an aryl group, an alkylsulfonyl group, an arylsulfonyl group or a heterocyclic group.

Each of $R_4$ to $R_6$ independently represents a hydrogen atom or a monovalent substituent.

At least two members of $R_1$ to $R_6$ may combine with each other to form a ring.

A represents a monovalent organic group.

The structure of a 1,3-diol derivative (that is, a compound having a structure where a sulfonyloxy group and an acyloxy group are connected through three carbon atoms) represented by formula (I) can generate a sulfonic acid by an action of acid. The mechanism thereof is not necessarily clarified, but the present inventors believe that a reaction proceeds according to the following scheme 1 or 2:

Presumed Scheme 1:

[Chem. 79]

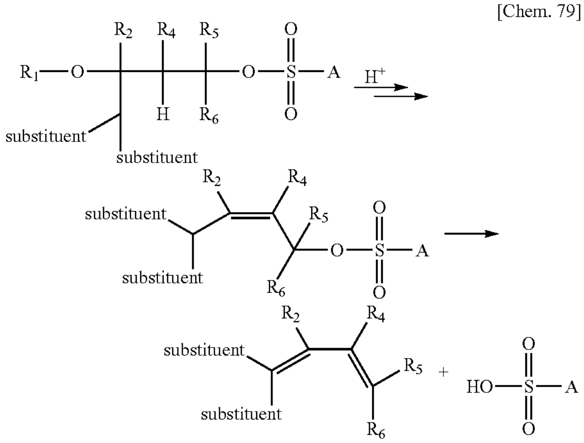

In formula (I), $R_1$ represents an alkyl group, a cycloalkyl group, an alkenyl group, an alkynyl group, an aryl group, or a group having a silicon atom.

Each of $R_2$ and substituents independently represents a hydrogen atom, an alkyl group, a cycloalkyl group, an alkenyl group, an alkynyl group, an aryl group, an alkylsulfonyl group, an arylsulfonyl group or a heterocyclic group.

Each of $R_4$ to $R_6$ independently represents a hydrogen atom or a monovalent substituent.

At least two members of $R_1$, substituents, $R_2$ and $R_4$ to $R_6$ may combine with each other to form a ring.

A represents a monovalent organic group.

Presumed Scheme 2:

[Chem. 80]

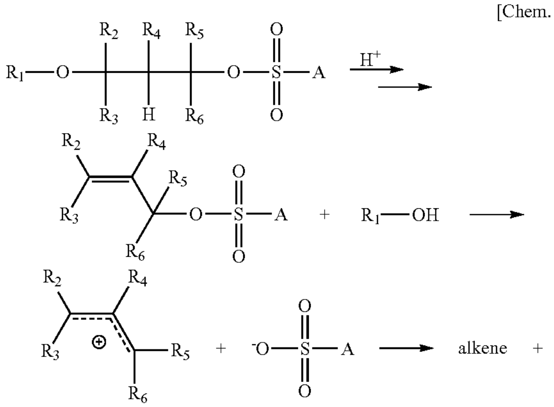

-continued

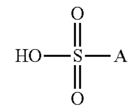

In formula (I), $R_1$ represents an alkyl group, a cycloalkyl group, an alkenyl group, an alkynyl group, an aryl group, or a group having a silicon atom.

Each of $R_2$ and $R_3$ independently represents a hydrogen atom, an alkyl group, a cycloalkyl group, an alkenyl group, an alkynyl group, an aryl group, an alkylsulfonyl group, an arylsulfonyl group or a heterocyclic group.

Each of $R_4$ to $R_6$ independently represents a hydrogen atom or a monovalent substituent.

At least two members of $R_1$ to $R_6$ may combine with each other to form a ring.

A represents a monovalent organic group.

As shown in the presumed schemes 1 and 2 above, the structure represented by formula (I) produces a carbon-carbon double bond through a dehydration reaction using an acid as the catalyst and subsequently produces a sulfonic acid while producing an alkene or a dialkene.

On the other hand, for example, in a conventional acetal-type acid-increasing agent represented by the following formula (VI), the carbon atom corresponding to the carbon atom to which $R_2$ and $R_3$ in formula (I) are bonded is bonded to two oxygen atoms, breakage of the acetal bond is likely to occur, accompanying deterioration of thermal stability. Meanwhile, in the compound represented by formula (I), at least either one of $R_2$ and $R_3$ in formula (I) does not have an oxygen atom as an atom directly bonding to the carbon atom to which $R_2$ and $R_3$ are bonded and therefore, breakage of ether bond is less likely occur than the breakage of acetal bond, which is considered to bring about excellent thermal stability. Also, although the reason is not clearly known, it is believed that the compound represented by formula (I) is excellent in the acid-increasing ability as compared with the acid-increasing agent represented by the following formula (VI):

[Chem. 81]

(VI)

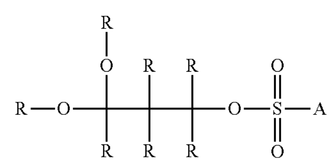

In formula (VI), R represents a hydrogen atom or a monovalent substituent, and A represents a monovalent organic group.

Accordingly, when the compound represented by formula (I) is used as an actinic ray-sensitive or radiation-sensitive composition, the sensitivity of the composition increases owing to excellent acid-increasing ability of the compound represented by formula (I) and also, the aging stability of the composition is enhanced, because the compound represented by formula (I) exhibits excellent thermal stability.

Furthermore, in the case of performing pattern formation by using the compound represented by formula (I) as the actinic ray-sensitive or radiation-sensitive composition, the contrast of the acid generation amount between exposed area and unexposed area is increased, and excellent pattern profile, high resolution and small line edge roughness can be realized.

Above all, in the case of using the compound represented by formula (I) as a negative resist composition, enough acid is generated in the exposed area and therefore, a curing reaction of the actinic ray-sensitive or radiation-sensitive composition in the exposed area proceeds adequately, as a result, the dry etching resistance is enhanced and the occurrence of scum is reduced.

The actinic ray-sensitive or radiation-sensitive composition according to the present invention is preferably used for electron beam, X-ray or extreme-ultraviolet exposure.

The compound represented by formula (I) is described in detail below.

[Chem. 82]

(I)

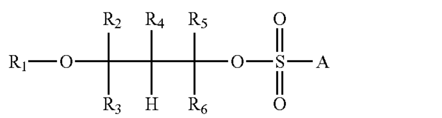

In formula (I), $R_1$ represents an alkyl group, a cycloalkyl group, an alkenyl group, an alkynyl group, an aryl group, a 1-alkoxyalkyl group or a group having a silicon atom.

Each of $R_2$ and $R_3$ independently represents a hydrogen atom, an alkyl group, a cycloalkyl group, an alkenyl group, an alkynyl group, an aryl group, an alkylsulfonyl group, an arylsulfonyl group or a heterocyclic group.

Each of $R_4$ to $R_6$ independently represents a hydrogen atom or a monovalent substituent.

At least two members of $R_1$ to $R_6$ may combine with each other to form a ring.

A represents a monovalent organic group.

$R_1$ represents an alkyl group, a cycloalkyl group, an alkenyl group, an alkynyl group, an aryl group, or a group having a silicon atom, which may have a substituent.

The alkyl group is preferably an alkyl group having a carbon number 1 to 30, and examples thereof include a methyl group, an ethyl group, a propyl group, a butyl group, a hexyl group, an octyl group, a decyl group, a dodecyl group, an octadecyl group, an isopropyl group, an isobutyl group, a sec-butyl group, a tert-butyl group, a 1-ethylpentyl group, a trifluoromethyl group, a 2-ethylhexyl group, a phenacyl group, a 1-naphthoylmethyl group, a 2-naphthoylmethyl group, a 4-methylsulfanylphenacyl group, a 4-phenylsulfanylphenacyl group, a 4-dimethylaminophenacyl group, a 4-cyanophenacyl group, a 4-methylphenacyl group, a 2-methylphenacyl group, a 3-fluorophenacyl group, a 3-trifluoromethylphenacyl group, and a 3-nitrophenacyl group.

The cycloalkyl group may have a monocyclic ring or a polycyclic ring. The cycloalkyl group having a monocyclic ring is preferably a cyclopentyl group, a cyclohexyl group, a cyclooctyl group, etc. The cycloalkyl group having a polycyclic ring is preferably a norbornyl group, a tricyclodecanyl group, a tetracyclodecanyl group, a tetracyclododecanyl group, an adamantyl group, etc. A cycloalkyl group having a carbon number of 3 to 8 is preferred and, for example, a cyclopentyl group and a cyclohexyl group are more preferred.

The alkenyl group is preferably an alkenyl group having a carbon number of 2 to 10, and examples thereof include a vinyl group, an allyl group, and a styryl group.

The alkynyl group is preferably an alkynyl group having a carbon number of 2 to 10, and examples thereof include an ethynyl group, a propynyl group, and a propargyl group.

The aryl group is preferably an aryl group having a carbon number of 6 to 30, and examples thereof include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quaterphenyl group, an o-, m- or p-tolyl group, a xylyl group, an o-, m- or p-cumenyl group, a mesityl group, a pentalenyl group, a binaphthalenyl group, a ternaphthalenyl group, a quaternaphthalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quateranthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group.

The 1-alkoxyalkyl group includes, for example, the following groups. * is a bond connected to O in the compound represented by formula (I).

[Chem. 83]

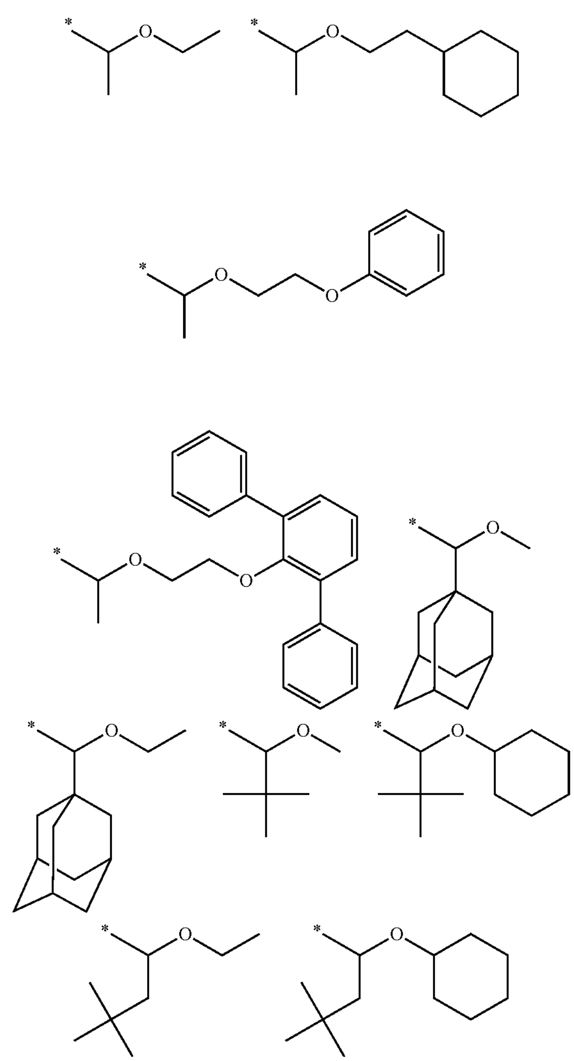

-continued

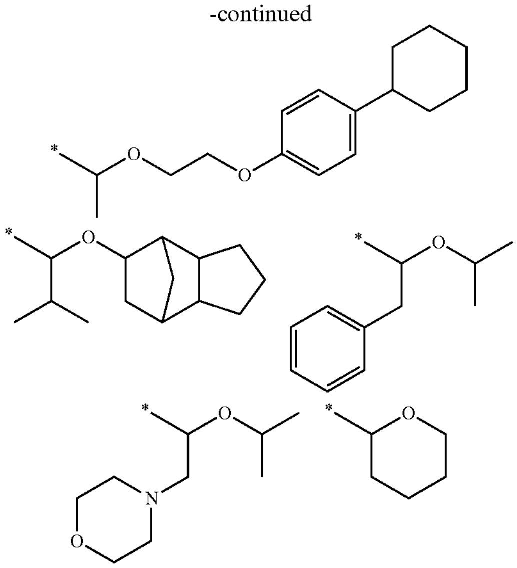

The group having a silicon atom includes a group represented by —Si($R_1$)($R_2$)($R_3$), and each of $R_1$, $R_2$ and $R_3$ independently represents a hydrogen atom or a substituent. Each of $R_1$, $R_2$ and $R_3$ preferably represents an alkyl group or an aryl group. The total number of alkyl groups or aryl groups as $R_1$, $R_2$ and $R_3$ is preferably 3. Other substituents represented by $R_1$, $R_2$ and $R_3$ include, for example, a trimethylsilyl group, a triethylsilyl group, a tert-butyldimethylsilyl group, a triisopropylsilyl group, a tert-butyldiphenylsilyl group, a triphenylsilyl group, a dimethylhydrosilyl group, and a diphenylhydrosilyl group.

$R_1$ is preferably an alkyl group, a cycloalkyl group, a 1-alkoxyalkyl group, an aryl group or a group having a silicon atom, more preferably an alkyl group, an aryl group or a group having a silicon atom.

Each of $R_2$ and $R_3$ independently represents a hydrogen atom, an alkyl group, a cycloalkyl group, an alkenyl group, an alkynyl group, an aryl group, an alkylsulfonyl group, an arylsulfonyl group or a heterocyclic group.

Examples of the alkyl group, cycloalkyl group, alkenyl group, alkynyl group and aryl group are the same as those described above for $R_1$, and preferred ranges are also the same.

The alkylsulfonyl group is preferably an alkylsulfonyl group having a carbon number of 1 to 20, and examples thereof include a methylsulfonyl group, an ethylsulfonyl group, a propylsulfonyl group, an isopropylsulfonyl group, a butylsulfonyl group, a hexylsulfonyl group, a cyclohexylsulfonyl group, an octylsulfonyl group, a 2-ethylhexylsulfonyl group, a decanoylsulfonyl group, a dodecanoylsulfonyl group, an octadecanoylsulfonyl group, a cyanomethylsulfonyl group, a methoxymethylsulfonyl group, and a perfluoroalkylsulfonyl group.

The arylsulfonyl group is preferably an arylsulfonyl group having a carbon number of 6 to 30, and examples thereof include a phenylsulfonyl group, a 1-naphthylsulfonyl group, a 2-naphthylsulfonyl group, a 2-chlorophenylsulfonyl group, a 2-methylphenylsulfonyl group, a 2-methoxyphenylsulfonyl group, a 2-butoxyphenylsulfonyl group, a 3-chlorophenylsulfonyl group, a 3-trifluoromethylphenylsulfonyl group, a 3-cyanophenylsulfonyl group, a 3-nitrophenylsulfonyl group, a 4-fluorophenylsulfonyl group, a 4-cyanophenylsulfonyl group, a 4-methoxyphenylsulfonyl group, a 4-methylsulfanylphenylsulfonyl group, a 4-phenylsulfanylphenylsulfonyl group, and a 4-dimethylaminophenylsulfonyl group.

The heterocyclic group is preferably an aromatic or aliphatic heterocyclic group containing a nitrogen atom, an oxygen atom, a sulfur atom or a phosphorus atom. The heterocyclic group includes, for example, a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxathiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purinyl group, a 4H-quinolizinyl group, an isoquinolyl group, a quinolyl group, a phthalazinyl group, a naphthyridinyl group, a quinoxalinyl group, a quinazolinyl group, a cinnolinyl group, a pteridinyl group, a 4aH-carbazolyl group, a carbazolyl group, a β-carbolinyl group, a phenanthridinyl group, an acridinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a morpholinyl, and a thioxanthryl group.

Each of $R_2$ and $R_3$ is independently, preferably a hydrogen atom, an alkyl group or an aryl group.

Each of $R_4$ to $R_6$ independently represents a hydrogen atom or a monovalent substituent. This substituent includes, for example, an alkyl group, a cycloalkyl group, an alkenyl group, an alkynyl group, an aryl group, a halogen atom, an alkoxy group, an aryloxy group, an alkanoyl group, an alkoxycarbonyl group, an aryloxycarbonyl group, an alkylsulfonyloxy group, an arylsulfonyloxy group, an alkylsulfonyl group, an arylsulfonyl group, a cyano group, an alkylthio group, an arylthio group, and a heterocyclic group.

Examples of the alkyl group, cycloalkyl group, alkenyl group, alkynyl group and aryl group are the same as those described above for $R_1$, and preferred ranges are also the same.

Examples of the alkylsulfonyl group, arylsulfonyl group and heterocyclic group are the same as those described above for $R_2$ and $R_3$, and preferred ranges are also the same.

The halogen atom includes a fluorine atom, a chlorine atom, a bromine atom, and an iodine atom.

The alkylthio group includes an alkylthio group having a carbon number of 1 to 30, and examples thereof include a methylthio group, an ethylthio group, a propylthio group, an n-butylthio group, a trifluoromethylthio group, a hexylthio group, a tert-butylthio group, a 2-ethylhexylthio group, a cyclohexylthio group, a decylthio group, and a dodecylthio group.

The arylthio group includes an arylthio group having a carbon number of 6 to 30, and examples thereof include a phenylthio group, a 1-naphthylthio group, a 2-naphthylthio group, a tolylthio group, a methoxyphenylthio group, a naphthylthio group, a chlorophenylthio group, a trifluoromethylphenylthio group, a cyanophenylthio group, and a nitrophenylthio group.

The alkoxy group includes an alkoxy group having a carbon number of 1 to 30, and examples thereof include a methoxy group, an ethoxy group, a propioxy group, an n-butoxy group, a trifluoromethoxy group, a hexyloxy group, a tert-butoxy group, a 2-ethylhexyloxy group, a cyclohexyloxy group, a decyloxy group, and a dodecyloxy group.

The aryloxy group includes an aryloxy group having a carbon number of 6 to 30, and examples thereof include a phenyloxy group, a 1-naphthyloxy group, a 2-naphthyloxy group, a tolyloxy group, a methoxyphenyloxy group, a naphthyloxy group, a chlorophenyloxy group, a trifluoromethylphenyloxy group, a cyanophenyloxy group, and a nitrophenyloxy group.

The alkanoyl group is preferably an alkanoyl group having a carbon number of 2 to 20, and examples thereof include an acetyl group, a propanoyl group, a butanoyl group, a trifluoromethylcarbonyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, and a 4-methoxybenzoyl group.

The alkoxycarbonyl group is preferably an alkoxycarbonyl group having a carbon number of 2 to 20, and examples thereof include a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, and a trifluoromethyloxycarbonyl group.

The aryloxycarbonyl group includes an aryloxycarbonyl group having a carbon number of 7 to 30, and examples thereof include a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, and a 4-methoxyphenyloxycarbonyl group.

The alkylsulfonyloxy group is preferably an alkylsulfonyloxy group having a carbon number of 1 to 20, and examples thereof include a methylsulfonyloxy group, an ethylsulfonyloxy group, a propylsulfonyloxy group, an isopropylsulfonyloxy group, a butylsulfonyloxy group, a hexylsulfonyloxy group, a cyclohexylsulfonyloxy group, an octylsulfonyloxy group, a 2-ethylhexylsulfonyloxy group, a decanoylsulfonyloxy group, a dodecanoylsulfonyloxy group, an octadecanoylsulfonyloxy group, a cyanomethylsulfonyloxy group, a methoxymethylsulfonyloxy group, and a perfluoroalkylsulfonyloxy group.

The arylsulfonyloxy group is preferably an arylsulfonyloxy group having a carbon number of 6 to 30, and examples thereof include a phenylsulfonyloxy group, a 1-naphthylsulfonyloxy group, a 2-naphthylsulfonyloxy group, a 2-chlorophenylsulfonyloxy group, a 2-methylphenylsulfonyloxy group, a 2-methoxyphenylsulfonyloxy group, a 2-butoxyphenylsulfonyloxy group, a 3-chlorophenylsulfonyloxy group, a 3-trifluoromethylphenylsulfonyloxy group, a 3-cyanophenylsulfonyloxy group, a 3-nitrophenylsulfonyloxy group, a 4-fluorophenylsulfonyloxy group, a 4-cyanophenylsulfonyloxy group, a 4-methoxyphenylsulfonyloxy group, a 4-methylsulfanylphenylsulfonyloxy group, a 4-phenylsulfanylphenylsulfonyloxy group, and a 4-dimethylaminophenylsulfonyloxy group.

Each of $R_4$ to $R_6$ is preferably a hydrogen atom, an alkyl group (preferably having a carbon number of 1 to 30), an aryl group (preferably having a carbon number of 6 to 30), or a cyano group.

Each of $R_4$ to $R_6$ is more preferably a hydrogen atom, an alkyl group (preferably having a carbon number of 1 to 30), or an aryl group (preferably having a carbon number of 6 to 30).

Each of the groups as $R_1$ to $R_5$ may further have a substituent, and this further substituent includes, for example, a halogen atom such as fluorine atom, chlorine atom, bromine atom and iodine atom; an alkoxy group such as methoxy group, ethoxy group and tert-butoxy group; an aryloxy group such as phenoxy group and p-tolyloxy group; an alkoxycarbonyl group such as methoxycarbonyl group, butoxycarbonyl group and phenoxycarbonyl group; an acyloxy group such as acetoxy group, propionyloxy group and benzoyloxy group; an acyl group such as acetyl group, benzoyl group, isobutyryl group, acryloyl group, methacryloyl group and methoxalyl group; an alkylsulfanyl group such as methylsulfanyl group and tert-butylsulfanyl group; an arylsulfanyl group such as phenylsulfanyl group and p-tolylsulfanyl group; an alkylamino group such as methylamino group and cyclohexylamino group; a dialkylamino group such as dimethylamino group, diethylamino group, morpholino group and piperidino group; an arylamino group such as phenylamino group and p-tolylamino group; an alkyl group such as methyl group, ethyl group, tert-butyl group and dodecyl group; an aryl group such as phenyl group, p-tolyl group, xylyl group, cumenyl group, naphthyl group, anthryl group and phenanthryl group; a hydroxy group; a carboxy group; a formyl group; a mercapto group; a sulfo group; a mesyl group; a p-toluenesulfonyl group; an amino group; a nitro group; a cyano group; a trifluoromethyl group; a trichloromethyl group; a trimethylsilyl group; a phosphinico group; a phosphono group; a trimethylammoniumyl group; a dimethylsulfoniumyl group; and a triphenylphenancylphosphoniumyl group.

As described above, at least two members of $R_1$ to $R_6$ may combine with each other to form a ring. This ring may be an aliphatic or aromatic hydrocarbon ring or may be a heterocyclic ring containing a heteroatom. Also, the ring may be a condensed ring.

The aliphatic or aromatic hydrocarbon ring includes, for example, those having a 5-, 6- or 7-membered ring. The hydrocarbon ring is preferably a hydrocarbon ring having a 5- or 6-membered ring, more preferably having a 5-membered ring.

The heterocyclic ring containing a heteroatom includes, for example, those containing a sulfur atom, an oxygen atom or a nitrogen atom as the heteroatom. This heterocyclic ring is preferably a heterocyclic ring containing a sulfur atom as the heteroatom.

The heterocyclic ring containing a heteroatom includes, for examples, those having a 5-, 6- or 7-membered ring. The heterocyclic ring containing a heteroatom is preferably, for example, a heterocyclic ring having a 5- or 6-membered ring.

The condensed ring includes, for example, a condensed ring composed of only a hydrocarbon ring. This polycondensed ring includes, for example, a condensed ring formed by fusing 2 to 4 benzene rings, and a condensed ring formed by fusing a benzene ring and a 5-membered unsaturated ring.

The condensed ring may be a condensed ring containing at least one heterocyclic ring. This condensed ring includes, for example, a condensed ring formed by fusing a benzene ring and a 5-membered heterocyclic ring, and a condensed ring formed by fusing a benzene ring and a 6-membered heterocyclic ring.

The ring structure that may be formed by at least two members of $R_1$ to $R_6$ includes, for example, a cycloheptane ring, a cyclohexane ring, a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, a dithiolane ring, an oxirane ring, a thiirane ring, a pyrrolidine ring, a piperidine ring, an imidazole ring, an isoxazole ring, a benzodithiol ring, an oxazole ring, a thiazole ring, a benzothiazole ring, a benzimidazole ring, a benzoxazole ring, a pyridine ring, a pyrazine ring, a pyrimidine ring, a pyridazine ring, an indolizine ring, an indole ring, a benzofuran ring, a benzothiophene ring, a benzodithiol ring, a benzothiopyran ring, an isobenzofuran ring, a quinolizine ring, a quinoline ring, a phthalazine ring, a naphthyridine ring, a quinoxaline ring, a quinazoline ring, an isoquinoline ring, a carbazole ring, a phenanthridine ring, an acridine ring, a phenanthroline ring, a thianthrene ring, a chromene ring, a xanthene ring, a phenoxathiin ring, an indane ring, a phenothiazine ring, and a phenazine ring. Among others, a dithiolane ring, a benzodithiol ring, a benzothiazole ring, a benzimidazole ring and a benzoxazole ring are preferred.

$R_1$ to $R_6$ in formula (I) include, for example, the groups in the below-illustrated specific examples of the compound represented by formula (I). In specific examples, A represents a monovalent substituent.

[Chem. 84]

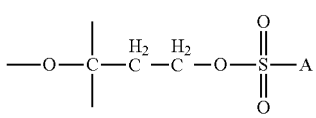

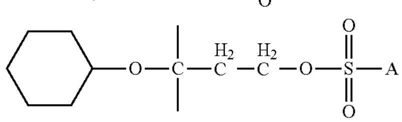

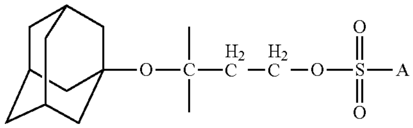

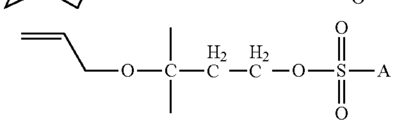

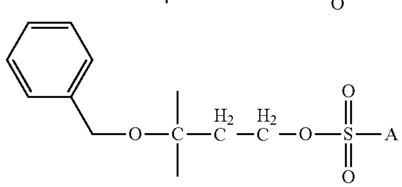

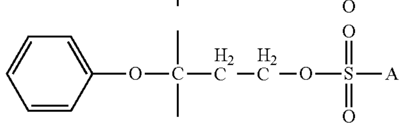

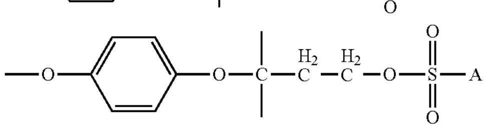

-continued

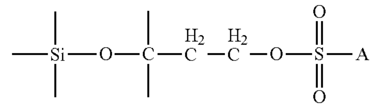

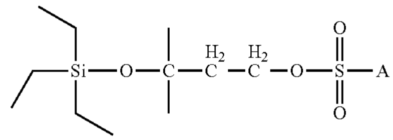

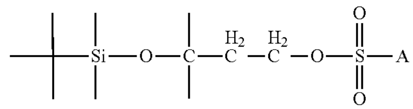

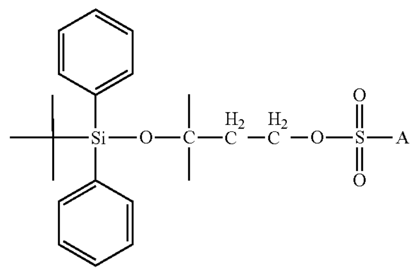

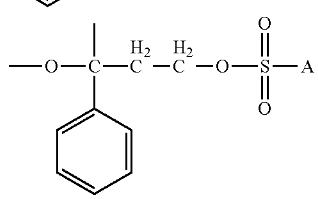

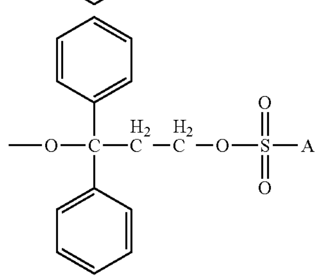

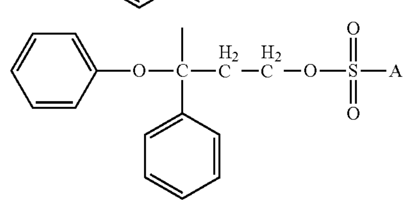

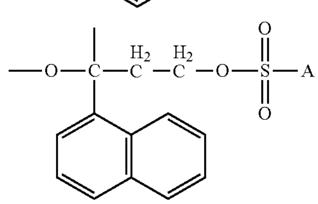

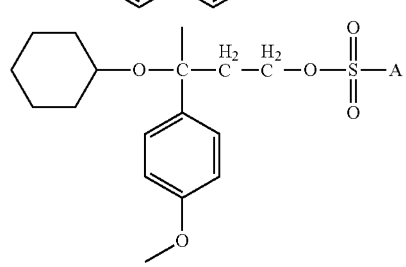

-continued
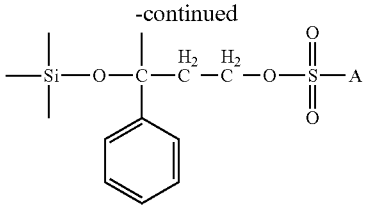
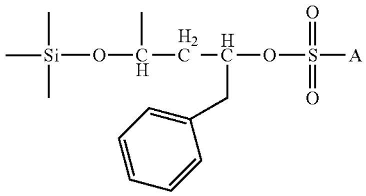
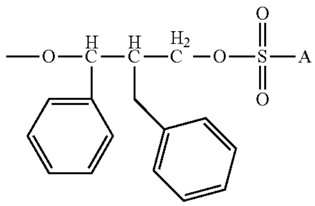
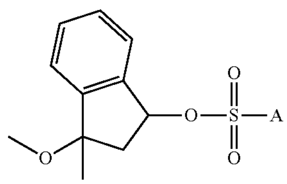
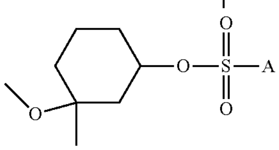
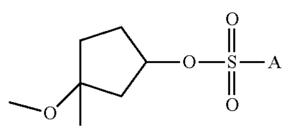
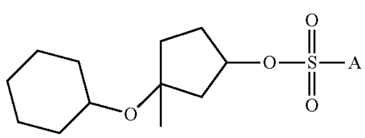
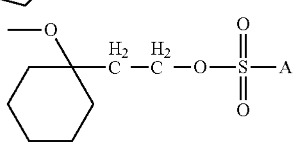
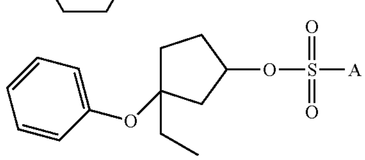
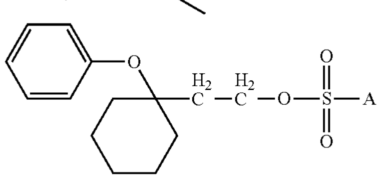
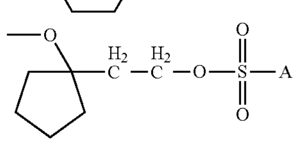
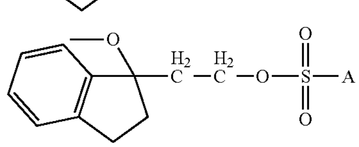
-continued
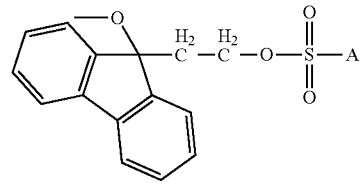
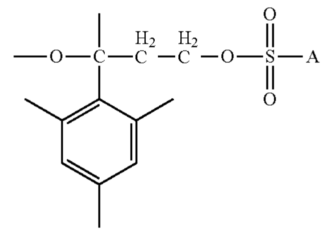
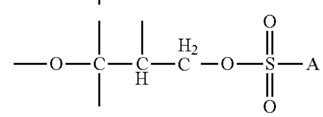
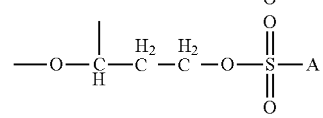
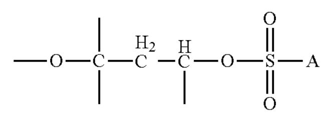
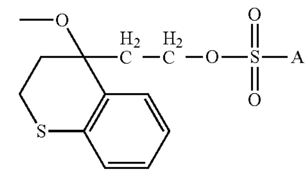
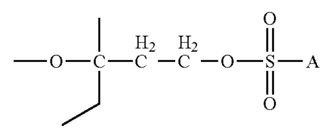
[Chem. 85]
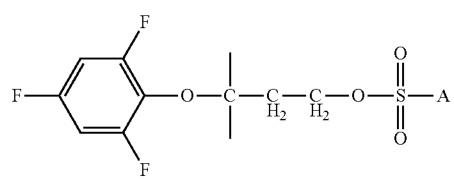
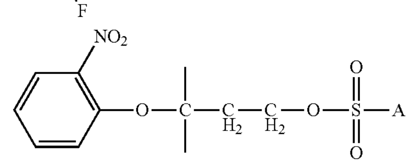
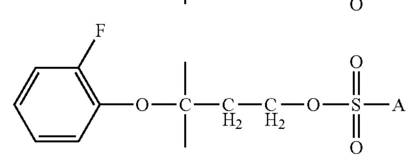
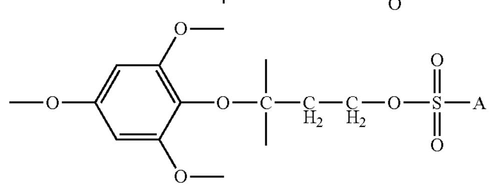

-continued
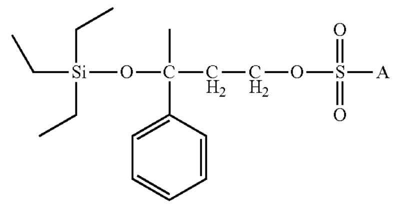
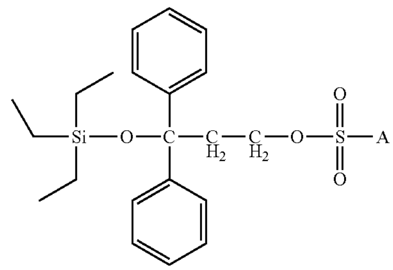
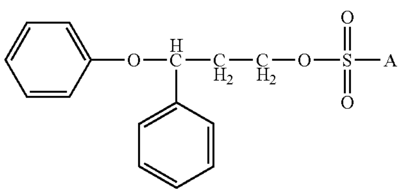
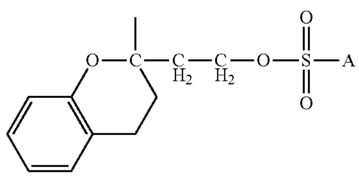
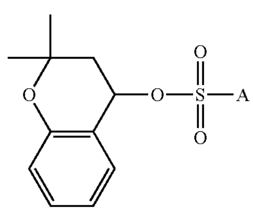
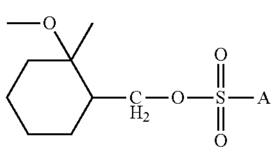
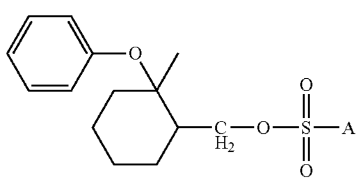
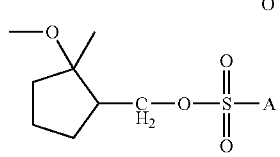
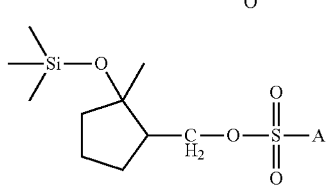
-continued
[Chem. 86]
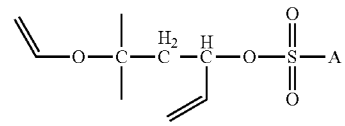
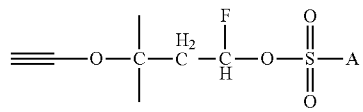
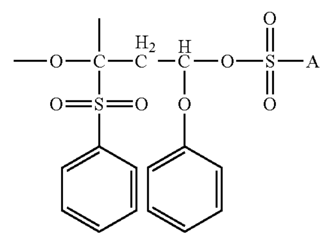
[Chem. 87]
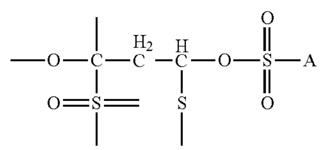
[Chem. 88]
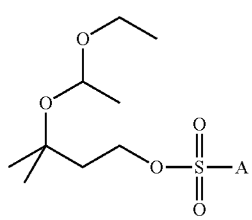
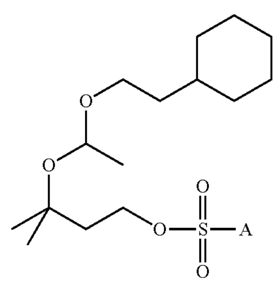
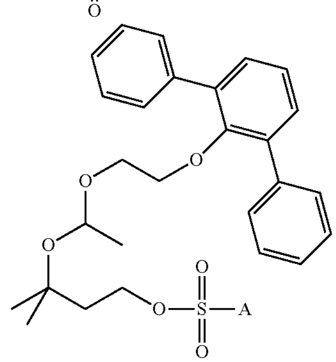
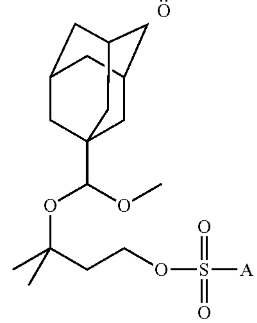

-continued

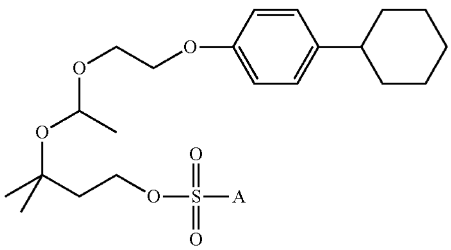

[Chem. 89]

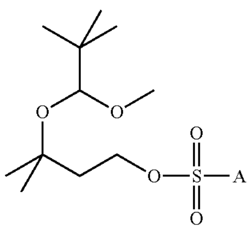

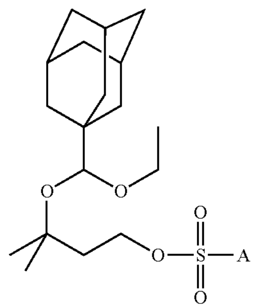

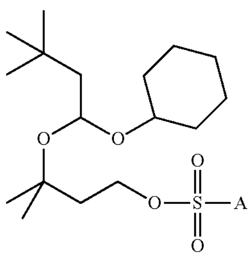

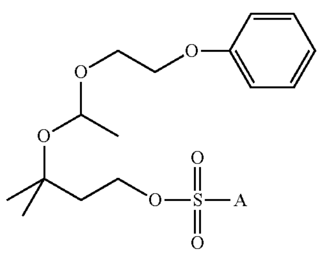

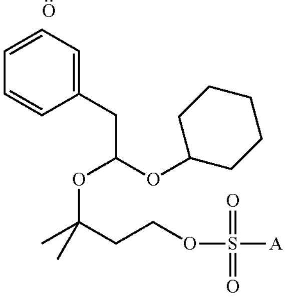

[Chem. 90]

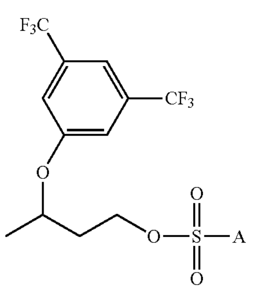

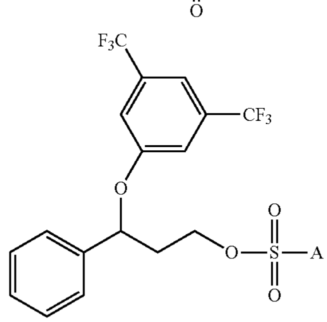

-continued

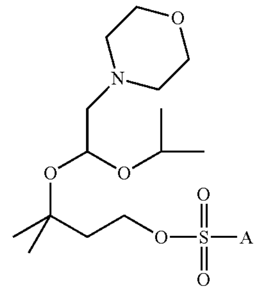

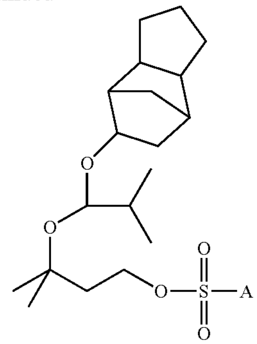

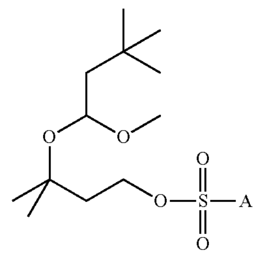

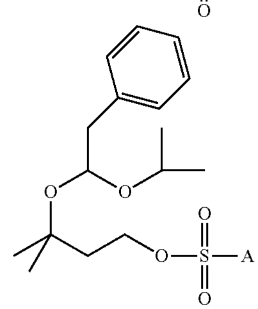

The substituent A is an alkyl group, a cycloalkyl group or an aromatic group. Each of these alkyl group, cycloalkyl group and aromatic group may have a substituent.

The alkyl group is preferably an alkyl group having a carbon umber of 1 to 30, and examples thereof include a methyl group, an ethyl group, a propyl group, a butyl group, a pentyl group, a hexyl group, a heptyl group, an octyl group, a nonyl group, a decyl group, a dodecyl group, a tetradecyl group, an octadecyl group, an isopropyl group, an isobutyl group, a sec-butyl group, a tert-butyl group, a 1-ethylpentyl group, and a 2-ethylhexyl group.

The cycloalkyl group is preferably a cycloalkyl group having a carbon number of 3 to 30 and may be a monocyclic cycloalkyl group or a polycyclic cycloalkyl group. The monocyclic cycloalkyl group includes, for example, a cyclopropyl group, a cyclobutyl group, a cyclopentyl group, a cyclohexyl group, a cycloheptyl group, and a cyclooctyl group. The polycyclic cycloalkyl group includes, for example, an adamantyl group, a norbornyl group, a bornyl group, a camphenyl group, a decahydronaphthyl group, a tricyclodecanyl group, a tetracyclodecanyl group, a camphoroyl group, a dicyclohexyl group, and a pinenyl group.

The aromatic group is preferably an aromatic group having a carbon number of 6 to 30, and examples thereof include a benzene ring, a naphthalene ring, a pentalene ring, an indene ring, an azulene ring, a heptalene ring, an indecene ring, a perylene ring, a pentacene ring, an acenaphthalene ring, a phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolidine ring, a quinoline ring, a phthalazine ring, a naphthylidine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiine ring, a phenothiazine ring and a phenazine ring. Among others, from the standpoint of satisfying both improvement of roughness and elevation of sensitivity, a benzene ring, a naphthalene ring and an anthracene ring are preferred, and a benzene ring is more preferred.

Examples of the substituent that may be substituted on the alkyl group, cycloalkyl group and aromatic group include a halogen atom such as fluorine atom, chlorine atom, bromine atom and iodine atom; an alkoxy group such as methoxy group, ethoxy group and tert-butoxy group; an aryloxy group such as phenoxy group and p-tolyloxy group; an alkoxycarbonyl group such as methoxycarbonyl group, butoxycarbonyl group and phenoxycarbonyl group; an acyloxy group such as acetoxy group, propionyloxy group and benzoyloxy group; an acyl group such as acetyl group, benzoyl group, isobutyryl group, acryloyl group, methacryloyl group and methoxalyl group; an alkylsulfanyl group such as methylsulfanyl group and tert-butylsulfanyl group; an arylsulfanyl group such as phenylsulfanyl group and p-tolylsulfanyl group; an alkyl group such as methyl group, ethyl group, tert-butyl group and dodecyl group; an aryl group such as phenyl group, p-tolyl group, xylyl group, cumenyl group, naphthyl group, anthryl group and phenanthryl group; a hydroxy group; a carboxy group; a formyl group; a sulfonyl group; a cyano group; an alkylaminocarbonyl group; an arylaminocarbonyl group; a sulfonamido group; a silyl group; an amino group; a thioxy group; and a combination thereof.

The substituent A preferably has a ring structure. A is more preferably a residue of sulfonic acid represented by the formula A-$SO_3H$, and the sulfonic acid represented by the formula A-$SO_3H$ is preferably a compound represented by the following formula (6) or (7). The sulfonic acid A-$SO_3H$ is more preferably a compound represented by the following formula (6).

First, the sulfonic acid represented by the following formula (6) is described in detail.

[Chem. 91]

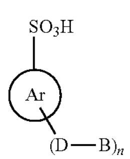

(6)

In formula (6), Ar represents an aromatic ring and may further have a substituent other than the sulfonic acid group and the group represented by -(D-B).

n represents an integer of 0 or more.

D represents a single bond or a divalent linking group. This divalent linking group is an ether group, a thioether group, a carbonyl group, a sulfoxide group, a sulfone group, a sulfonic acid ester group or an ester group.

B represents a hydrocarbon group.

The sulfonic acid represented by formula (6) is described in detail below.

In formula (6), Ar is preferably an aromatic ring having a carbon number of 6 to 30. Specifically, Ar is, for example, a benzene ring, a naphthalene ring, a pentalene ring, an indene ring, an azulene ring, a heptalene ring, an indecene ring, a perylene ring, a pentacene ring, an acenaphthalene ring, phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolidine ring, a quinoline ring, a phthalazine ring, a naphthylidine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiine ring, a phenothiazine ring or a phenazine ring. Among others, from the standpoint of satisfying both improvement of roughness and elevation of sensitivity, a benzene ring, a naphthalene ring or an anthracene ring is preferred, and a benzene ring is more preferred.

In the case where Ar further has a substituent other than the -(D-B) group, this substituent includes, for example, the following. That is, the substituent includes a halogen atom such as fluorine atom, chlorine atom, bromine atom and iodine atom; an alkoxy group such as methoxy group, ethoxy group and tert-butoxy group; an aryloxy group such as phenoxy group and p-tolyloxy group; an alkylthioxy group such as methylthioxy group, ethylthioxy group and tert-butylthioxy group; an arylthioxy group such as phenylthioxy group and p-tolylthioxy group; an alkoxycarbonyl group such as methoxycarbonyl group, butoxycarbonyl group and phenoxycarbonyl group; an acetoxy group; a linear or branched alkyl group such as methyl group, ethyl group, propyl group, butyl group, heptyl group, hexyl group, dodecyl group and 2-ethylhexyl group; an alkenyl group such as vinyl group, propenyl group and hexenyl group; an acetylene group; an alkynyl group such as propynyl group and hexynyl group; an aryl group such as phenyl group and tolyl group; a hydroxy group; a carboxy group; and a sulfonic acid group. Among others, from the standpoint of improving the roughness, a linear alkyl group and a branched alkyl group are preferred.

In formula (6), D is preferably a single bond, an ether group or an ester group. D is more preferably a single bond.

In formula (6), B is, for example, an alkyl group, an alkenyl group, an alkynyl group, an aryl group or a cycloalkyl group. B is preferably an alkyl group or a cycloalkyl group. The alkyl group, alkenyl group, alkynyl group, aryl group and cycloalkyl group as B may have a substituent.

The alkyl group as B is preferably a branched alkyl group. This branched alkyl group includes, for example, an isopropyl group, a tert-butyl group, a tert-pentyl group, a neopentyl group, a sec-butyl group, an isobutyl group, an isohexyl group, a 3,3-dimethylpentyl group, and a 2-ethylhexyl group.

Examples of the alkenyl group, alkynyl group and aryl group as B are the same as those described above for $R_1$, and preferred ranges are also the same.

The cycloalkyl group as B is preferably a cycloalkyl group having a carbon number of 3 to 30 and may be a monocyclic cycloalkyl group or a polycyclic cycloalkyl group. The monocyclic cycloalkyl group includes, for example, a cyclopropyl group, a cyclobutyl group, a cyclopentyl group, a cyclohexyl group, a cycloheptyl group, and a cyclooctyl group. The polycyclic cycloalkyl group includes, for example, an adamantyl group, a norbornyl group, a bornyl group, a camphenyl group, a decahydronaphthyl group, a tricyclodecanyl group, a tetracyclodecanyl group, a camphoroyl group, a dicyclohexyl group, and a pinenyl group.

In the case where the alkyl group, alkenyl group, alkynyl group, aryl group or cycloalkyl group as B has a substituent, this substituent includes, for example, the followings. That is, the substituent includes a halogen atom such as fluorine atom, chlorine atom, bromine atom and iodine atom; an alkoxy group such as methoxy group, ethoxy group and tert-butoxy group; an aryloxy group such as phenoxy group and p-tolyloxy group; an alkylthioxy group such as methylthioxy group, ethylthioxy group and tert-butylthioxy group; an arylthioxy group such as phenylthioxy group and p-tolylthioxy group; an alkoxycarbonyl group such as methoxycarbonyl group, butoxycarbonyl group and phenoxycarbonyl group; an acetoxy group; a linear or branched alkyl group such as methyl group, ethyl group, propyl group, butyl group, heptyl group, hexyl group, dodecyl group and 2-ethylhexyl group; a cycloalkyl group such as cyclohexyl group; an alkenyl group such as vinyl group, propenyl group and hexenyl group; an acetylene group; an alkynyl group such as propynyl group and hexynyl group; an aryl group such as phenyl group and tolyl group; a hydroxy group; a carboxy group; a sulfonic acid group; and a carbonyl group. Among others, from the standpoint of satisfying both improvement of roughness and elevation of sensitivity, a linear alkyl group and a branched alkyl group are preferred.

n is preferably from 1 to 4, more preferably 2 or 3, and most preferably 3.

Next, the compound represented by the following formula (7) is described in detail.

[Chem. 92]

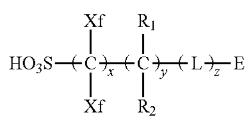

(7)

In formula (7), each Xf independently represents a fluorine atom or an alkyl group substituted with at least one fluorine atom.

Each of $R_1$ and $R_2$ independently represents a group selected from a hydrogen atom, a fluorine atom, an alkyl group and an alkyl group substituted with at least one fluorine atom, and when a plurality of $R_1$ or $R_2$ are present, each may be the same as or different from every other member.

L represents a divalent linking group, and when a plurality of L are present, each may be the same as or different from every other member.

E represents a group having a ring structure.

x represents an integer of 0 to 20 and is preferably from 1 to 4. y represents an integer of 0 to 10 and is preferably from 0 to 3. z represents an integer of 0 to 10 and is preferably from 0 to 3.

The sulfonic acid represented by formula (7) is described in detail below.

In formula (7), Xf is a fluorine atom or an alkyl group with at least one fluorine atom. This alkyl group is preferably an alkyl group having a carbon number of 1 to 10, more preferably an alkyl group having a carbon number of 1 to 4. The alkyl group substituted with a fluorine atom is preferably a perfluoroalkyl group.

Xf is preferably a fluorine atom or a perfluoroalkyl group having a carbon number of 1 to 4. Specifically, Xf is preferably a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ or $CH_2CH_2C_4F_9$, more preferably a fluorine atom or $CF_3$, and most preferably a fluorine atom.

In formula (7), each of $R_1$ and $R_2$ is a group selected from a hydrogen atom, a fluorine atom, an alkyl group and an alkyl group substituted with at least one fluorine atom. The alkyl group which may be substituted with a fluorine atom is preferably an alkyl group having a carbon number of 1 to 4. Also, the alkyl group substituted with a fluorine atom is preferably, among others, a perfluoroalkyl group having a carbon number of 1 to 4. This perfluoroalkyl group specifically includes $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, with $CF_3$ being preferred.

In formula (7), x is preferably from 1 to 8, more preferably from 1 to 4. y is preferably from 0 to 4, more preferably 0. z is preferably from 0 to 8, more preferably from 0 to 4.

In formula (7), L represents —COO—, —OCO—, —CO—, —O—, —S—, —SO—, —$SO_2$—, —NRCO— (R represents a hydrogen atom or a cycloalkyl group having a carbon number of 6 to 20), an alkylene group, a cycloalkylene group or an alkenylene group. Among others, L preferably represents —COO—, —OCO—, —CO—, —O—, —S—, —SO— or —$SO_2$—, more preferably represents —COO—, —OCO— or —$SO_2$—.

In formula (7), E represents a group having a ring structure. E includes, for example, a cyclic aliphatic group, an aryl group, and a group having a heterocyclic structure.

The cyclic aliphatic group as E may have a monocyclic structure or a polycyclic structure. The cyclic aliphatic group having a monocyclic structure is preferably a monocyclic cycloalkyl group such as cyclopentyl group, cyclohexyl group and cyclooctyl group. The cyclic aliphatic group having a polycyclic structure is preferably a polycyclic cycloalkyl group such as norbornyl group, tricyclodecanyl group, tetracyclodecanyl group, tetracyclododecanyl group and adamantyl group. Above all, when a cyclic aliphatic group having a bulky structure of 6-membered or higher membered ring is employed as E, in-film diffusion in the PEB (post-exposure baking) step can be suppressed, and resolution and EL (exposure latitude) can be more enhanced.

The aryl group as E is, for example, a benzene ring, a naphthalene ring, a phenanthrene ring or an anthracene ring.

The group having a heterocyclic structure as E may or may not have aromaticity. The heteroatom contained in this group is preferably a nitrogen atom or an oxygen atom. Specific examples of the heterocyclic structure include a furan ring, a thiophene ring, a benzofuran ring, a benzothiophene ring, a dibenzofuran ring, a dibenzothiophene ring, an indole ring, a pyridine ring, a piperidine ring, and a morpholine ring. Among these, a furan ring, a thiophene ring, a pyridine ring, a piperidine ring and a morpholine ring are preferred.

E may have a substituent, and this substituent includes, for example, an alkyl group (may be linear, branched or cyclic; preferably having a carbon number of 1 to 12), an aryl group (preferably having a carbon number of 6 to 14), a hydroxy group, an alkoxy group, an ester group, an amido group, a urethane group, a ureido group, a thioether group, a sulfonamido group, and a sulfonic acid ester group.

From the standpoint of improving the resolution and pattern profile by preventing the acid generated upon exposure from diffusing into the unexposed area, the compound represented by formula (I) is preferably a compound capable of generating an acid having a size of 200 Å$^3$ or more in volume, more preferably a compound capable of generating an acid having a size of 240 Å$^3$ or more in volume, still more preferably a compound capable of generating an acid having a size of 270 Å$^3$ or more in volume, yet still more preferably a compound capable of generating an acid having a size of 300 Å$^3$ or more in volume, and most preferably a compound capable of generating an acid having a size of 400 Å$^3$ or more in volume. However in view of sensitivity and solubility in the coating solvent, the compound represented by formula (I) is preferably a compound capable of generating an acid of 2,000 Å$^3$ or less in volume, more preferably a compound capable of generating an acid of 1,500 Å$^3$ or less in volume. Specific examples of the acid generated from the compound represented by formula (I) and the volumes (unit: $Å^3$) thereof are illustrated below, but the present invention is not limited thereto.

Incidentally, the volume of the acid generated from the compound represented by formula (I) was determined as follows by using "WinMOPAC" produced by Fujitsu Limited. That is, first, the chemical structure of the acid according to each example was input, and next, using this structure as the initial structure, the most stable conformation of each acid was obtained by molecular force field calculation using an MM3 method. Thereafter, with respect to the most stable conformation, molecular orbital calculation using a PM3 method was performed, whereby the "accessible volume" of each acid was computed.

[Chem. 93]

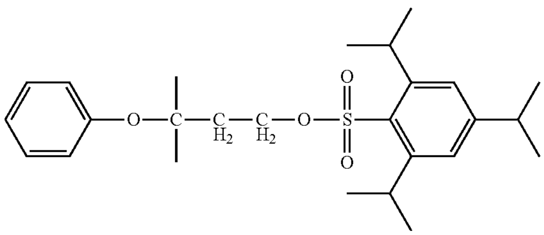

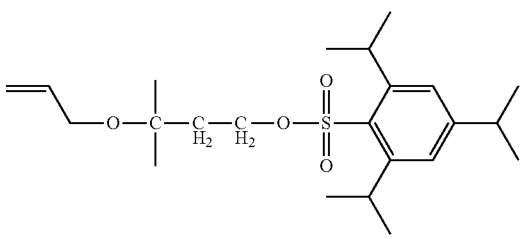

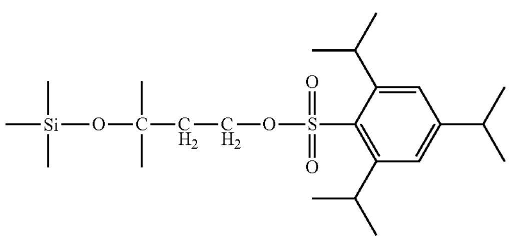

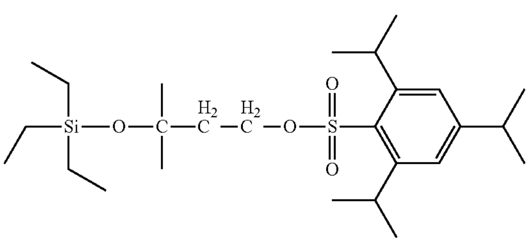

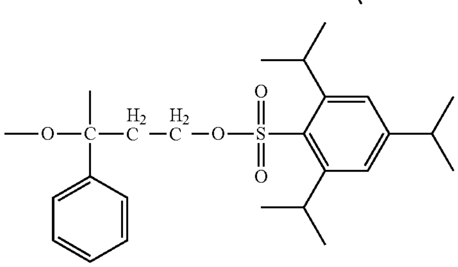

-continued

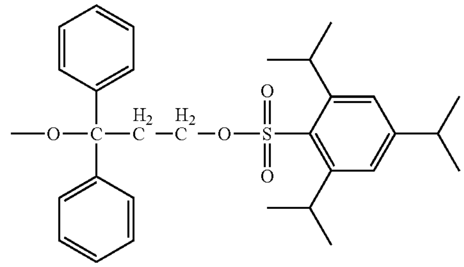

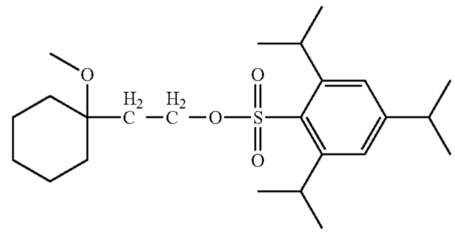

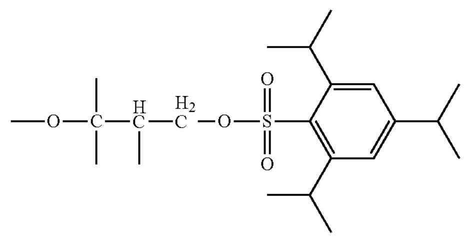

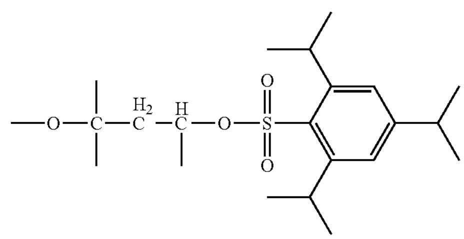

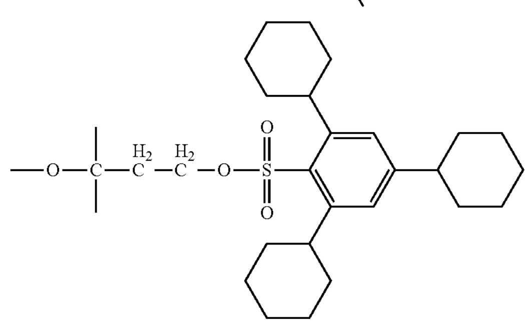

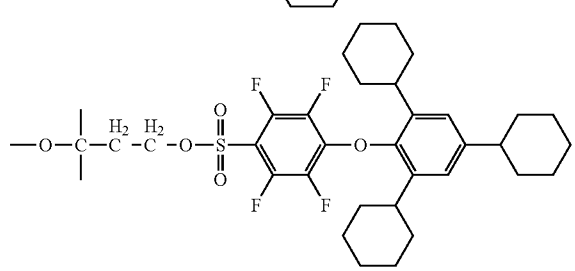

-continued
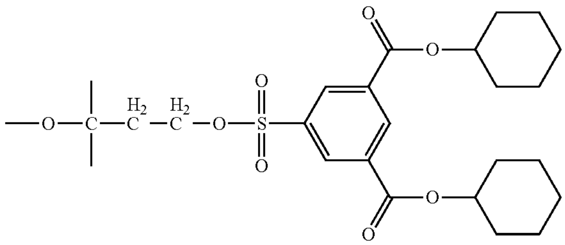
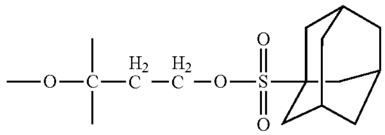
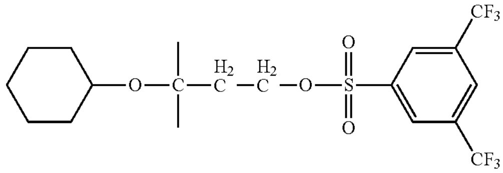
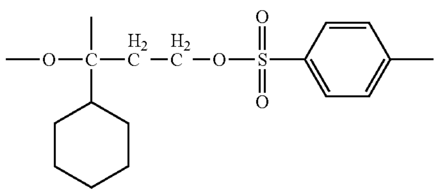
[Chem. 94]
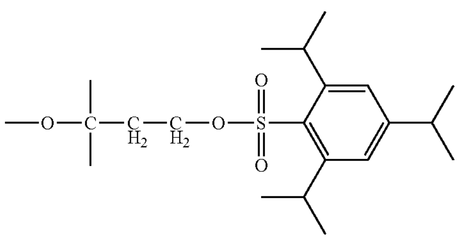
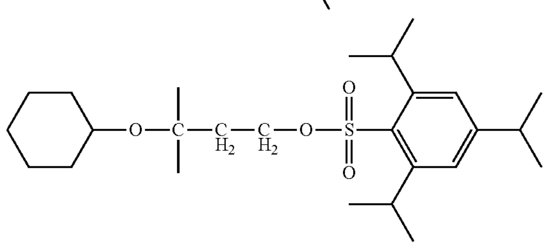
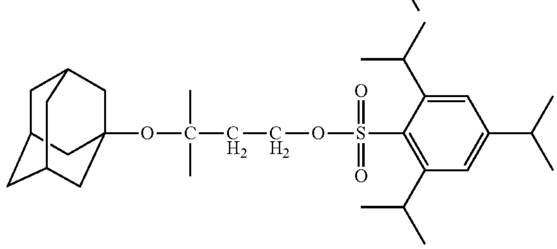
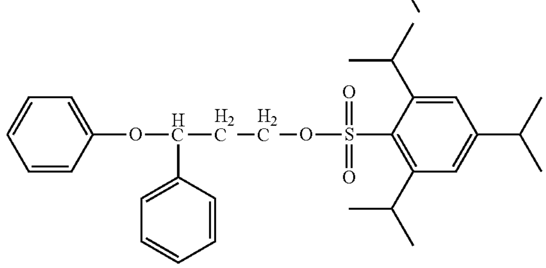
-continued
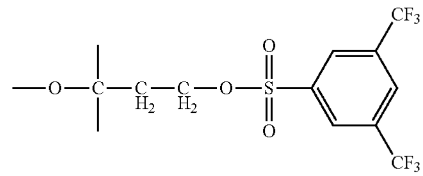
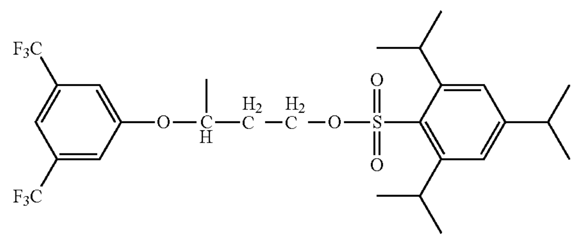
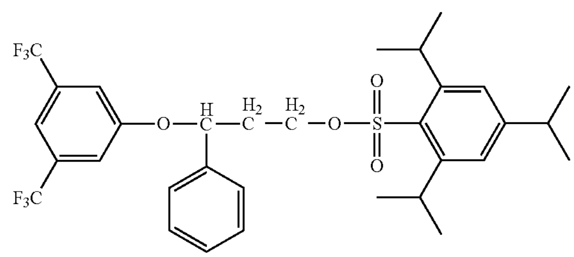
[Chem. 95]
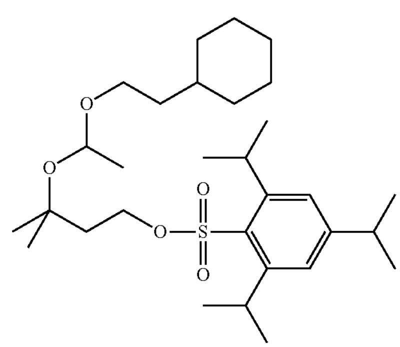
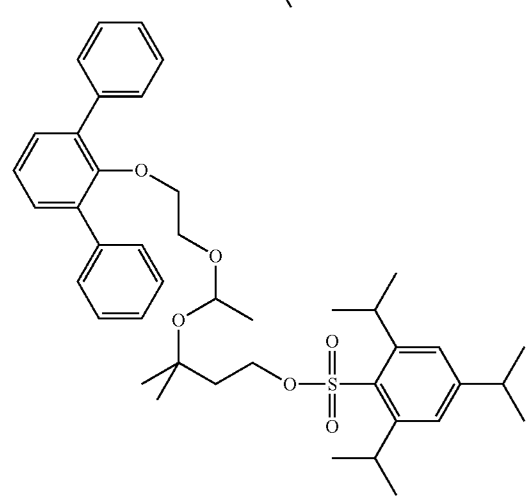

-continued
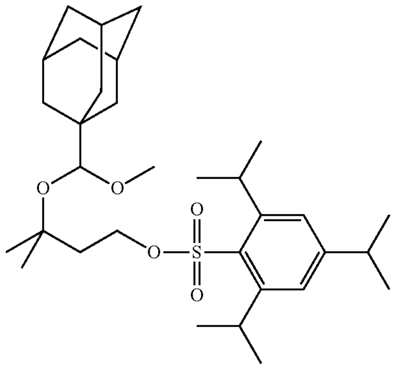
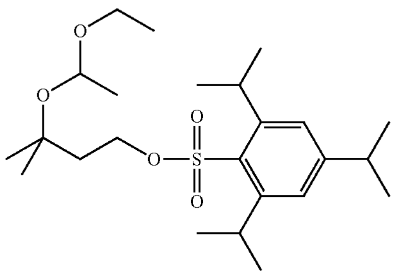
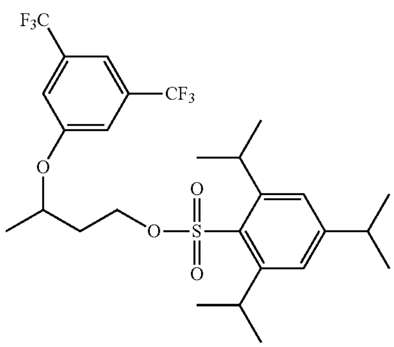
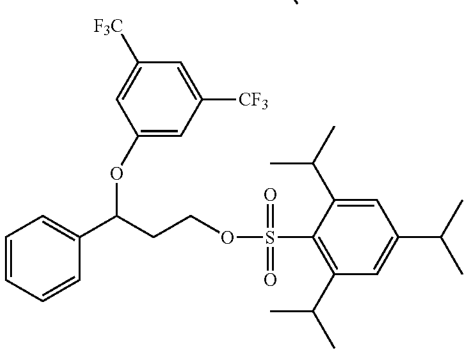
[Chem. 96]
303Å$^3$
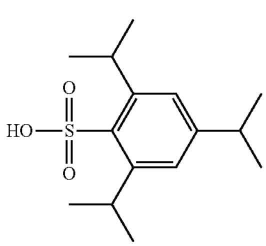
-continued
437Å$^3$
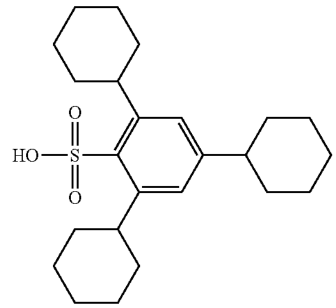
244Å$^3$
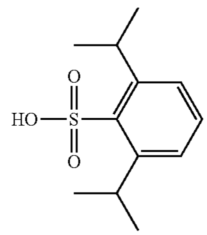
529Å$^3$
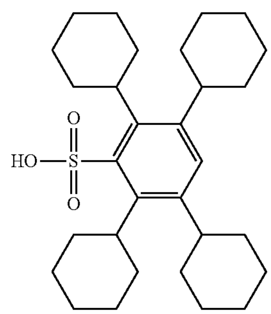
357Å$^3$
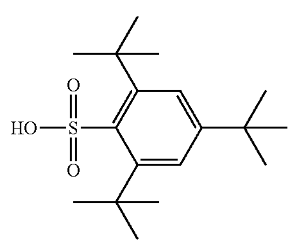
280Å$^3$
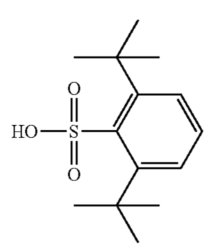

-continued
336Å$^3$
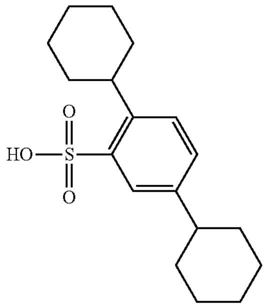
380Å$^3$
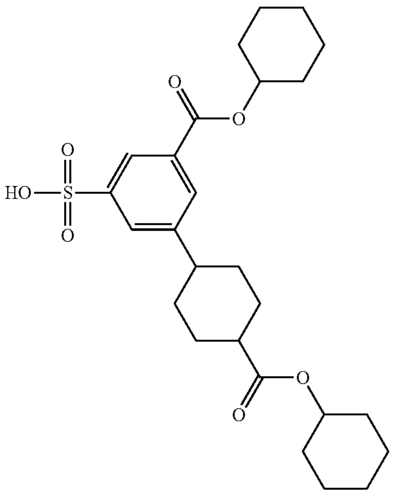
457Å$^3$
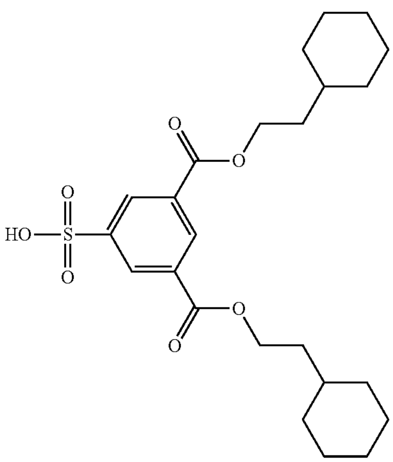
511Å$^3$
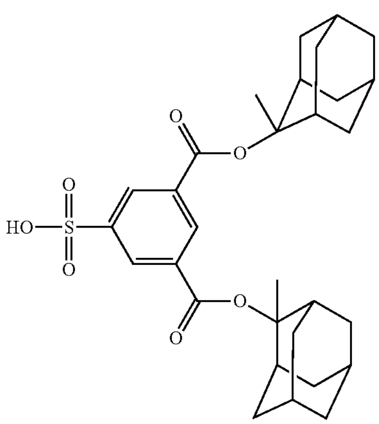
-continued
519Å$^3$
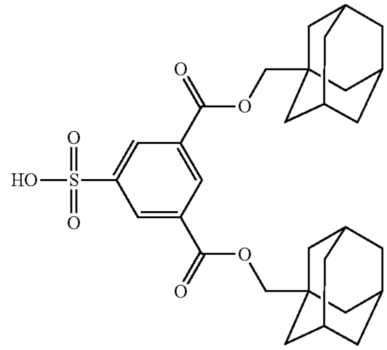
347Å$^3$
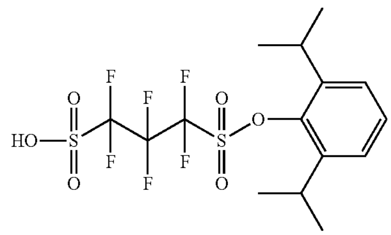
244Å$^3$
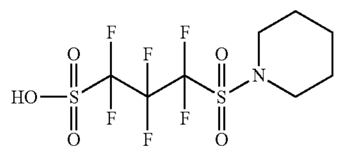
271Å$^3$
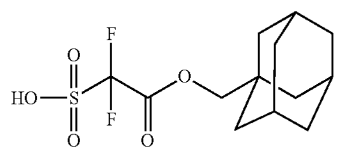
277Å$^3$
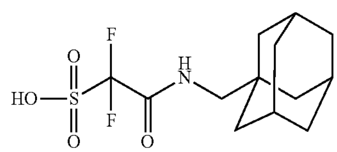
311Å$^3$
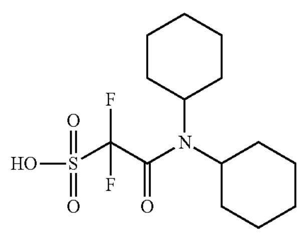
266Å$^3$
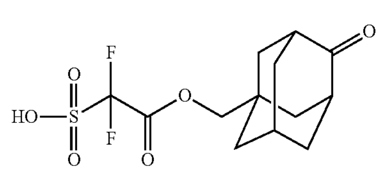
129Å$^3$
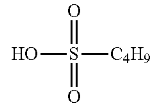

-continued
$380 Å^3$
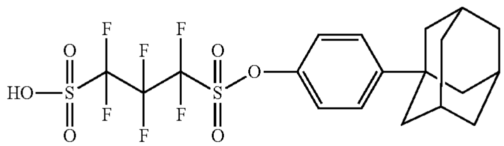
$291 Å^3$
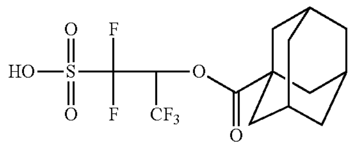
$250 Å^3$
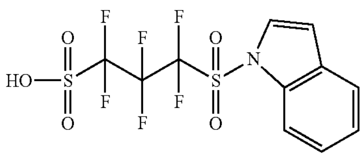
$339 Å^3$
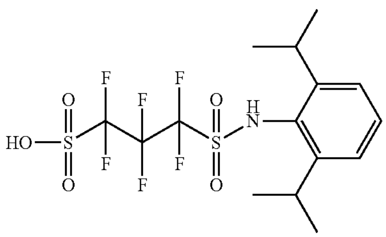
$211 Å^3$
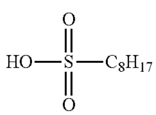
[Chem. 97]
$297 Å^3$
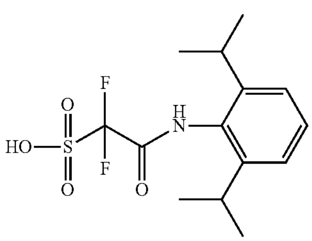
$277 Å^3$
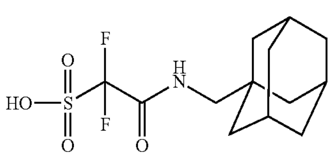
$315 Å^3$
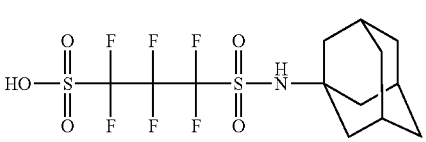
$281 Å^3$
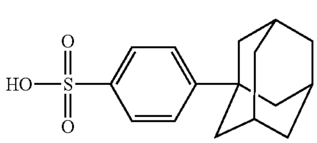
-continued
$310 Å^3$
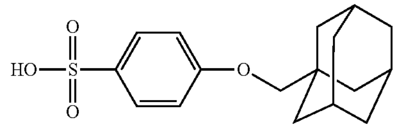
$127 Å^3$
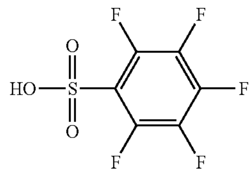
$393 Å^3$
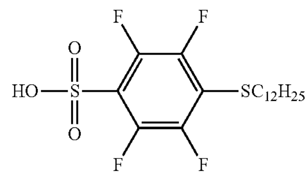
$113 Å^3$
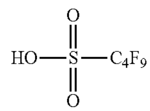
$220 Å^3$
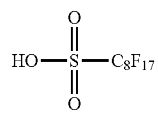
$186 Å^3$
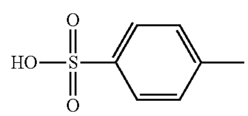
$168 Å^3$
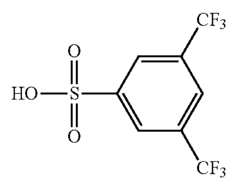
$146 Å^3$
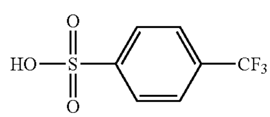
$350 Å^3$
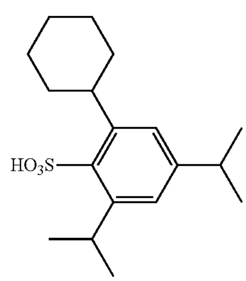
$311 Å^3$
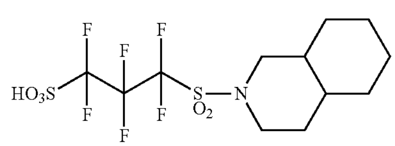

-continued

168Å$^3$

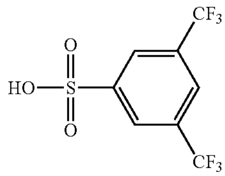

216Å$^3$

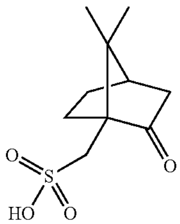

290Å$^3$

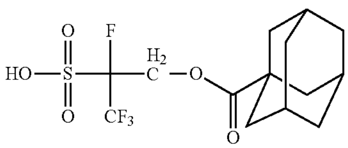

270Å$^3$

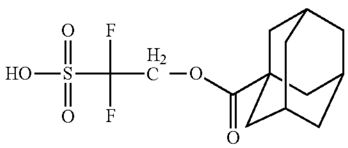

147Å$^3$

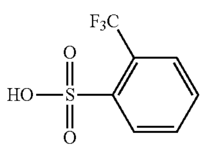

125Å$^3$

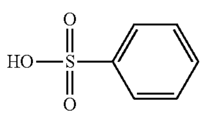

207Å$^3$

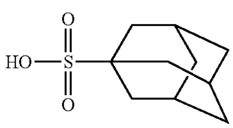

166Å$^3$

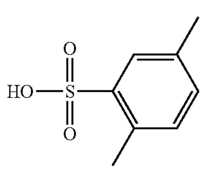

146Å$^3$

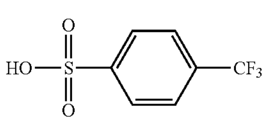

172Å$^3$

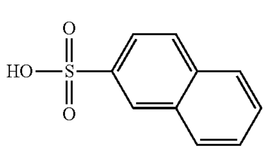

-continued

218Å$^3$

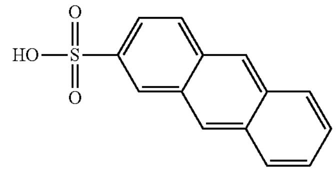

309Å$^3$

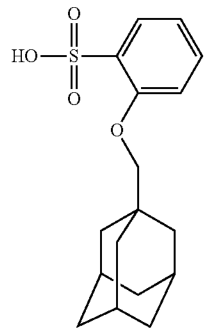

172Å$^3$

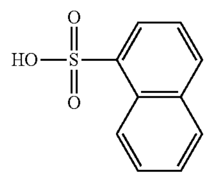

535Å$^3$

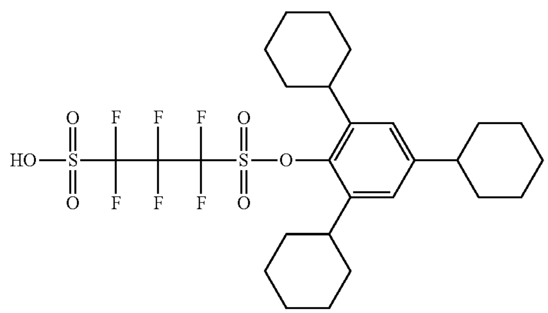

643Å$^3$

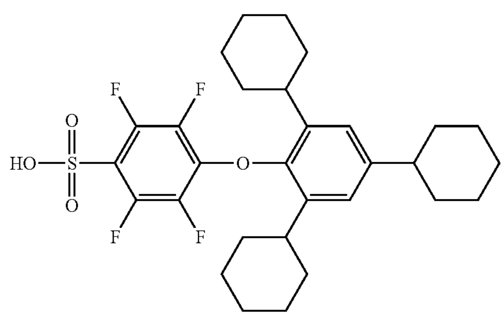

As for the compound (A) represented by formula (I), one compound may be used alone, or two or more compounds may be used in combination.

The content of the compound (A) represented by formula (I) is preferably from 0.1 to 40 mass %, more preferably from 0.5 to 30 mass %, still more preferably from 1.0 to 20 mass %, based on the total solid content of the composition.

As for the production method of the compound (A) represented by formula (I) of the present invention, a compound with one hydroxyl group of a diol being etherified or silyl-etherified and a sulfonyl halide or sulfonic anhydride are used and reacted in an inert solvent such as THF, DMF and acetonitrile or in a basic solvent such as pyridine in the presence of a base (for example, triethylamine or pyridine), whereby a compound with one hydroxyl group of a diol being sulfonylated can be synthesized. The reaction temperature is preferably from −10 to 60° C.

In addition, by using an alkylsulfonyl halide, an arylsulfonyl halide, etc. as the sulfonyl halide above, corresponding various sulfonic acid-generating compounds can be synthesized.

[2] (B) Compound Capable of Generating an Acid Upon Irradiation with an Actinic Ray or Radiation As the compound (B) capable of generating an acid upon irradiation with an actinic ray or radiation (hereinafter, sometimes referred to as "photoacid generator"), a photo-initiator for cationic photopolymerization, a photo-initiator for radical photopolymerization, a photo-decoloring agent for dyes, a photo-discoloring agent, a known compound capable of generating an acid upon irradiation with an actinic ray or radiation, which is used for microresist or the like, or a mixture thereof may be appropriately selected and used. Examples thereof include a sulfonium salt, an iodonium salt, and bis(alkylsulfonyldiazomethane.

Preferred examples of the photoacid generator include compounds represented by the following formulae (ZI), (ZII) and (ZIII):

[Chem. 98]

(ZI)

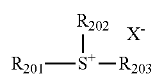

(ZII)

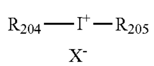

(ZIII)

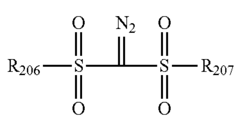

In formula (ZI), each of $R_{201}$, $R_{202}$ and $R_{203}$ independently represents an organic group. The carbon number of the organic group as $R_{201}$, $R_{202}$ and $R_{203}$ is, for example, from 1 to 30, preferably from 1 to 20.

Two members out of $R_{201}$ to $R_{203}$ may combine with each other through a single bond or a linking group to form a ring structure. In this case, the linking group includes an ether bond, a thioether bond, an ester bond, an amido bond, a carbonyl group, a methylene group, an ethylene group, etc. The group formed by combining two members out of $R_{201}$ to $R_{203}$ includes, for example, an alkylene group such as butylene group and pentylene group.

Specific examples of the organic group as $R_{201}$, $R_{202}$ and $R_{203}$ include corresponding groups in the later-described compounds (ZI-1), (ZI-2) and (ZI-3).

$X^-$ represents a non-nucleophilic anion. $X^-$ includes, for example, a sulfonate anion, a bis(alkylsulfonyl)amide anion, a tris(alkylsulfonyl)methide anion, $BF_4^-$, $PF_6^-$ and $SbF_6^-$. $X^-$ is preferably an organic anion containing a carbon atom. Preferred organic anions include, for example, organic anions represented by the following formulae AN1 to AN3:

[Chem. 99]

AN1

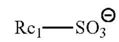

AN2

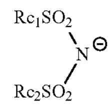

AN3

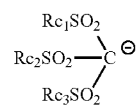

In formulae AN1 to AN3, each of $Rc_1$ to $Rc_3$ independently represents an organic group. The organic group includes, for example, an organic group having a carbon number of 1 to 30 and is preferably an alkyl group, an aryl group, or a group formed by connecting a plurality of these groups through a linking group. The linking group includes, for example, a single bond, —O—, —$CO_2$—, —S—, —$SO_3$— and —$SO_2N(Rd_1)$—, wherein $Rd_1$ represents a hydrogen atom or an alkyl group and may form a ring structure together with the alkyl group or aryl group bonded thereto.

The organic group of $Rc_1$ to $Rc_3$ may be an alkyl group substituted with a fluorine atom or a fluoroalkyl group at the 1-position, or a phenyl group substituted with a fluorine atom or a fluoroalkyl group. By virtue of containing a fluorine atom or a fluoroalkyl group, the acidity of the acid generated upon irradiation with light can be increased and in turn, the sensitivity of the actinic ray-sensitive or radiation-sensitive composition can be enhanced. Incidentally, each of $Rc_1$ to $Rc_3$ may combine with another alkyl group, aryl group or the like to form a ring structure.

$X^-$ is preferably an anion represented by the following formula (6') or (7'). This $X^-$ is a conjugate base of a sulfonic acid represented by formula (6) or (7).

[Chem. 100]

(6')

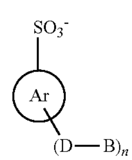

[Chem. 101]

(7')

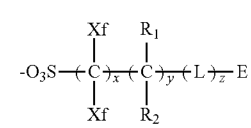

The definitions of Ar, D, B, n, Xf, $R_1$, $R_2$, L, E, x, y and z in this $X^-$ are the same as those in formulae (6) and (7).

As the photoacid generator, a compound having a plurality of structures represented by formula (ZI) may be used. For example, the photoacid generator may be a compound having a structure where at least one of $R_{201}$ to $R_{203}$ in a compound represented by formula (ZI) is bonded to at least one of $R_{201}$ to $R_{203}$ in another compound represented by formula (ZI).

As the component (ZI), compounds (ZI-1) to (ZI-4) described below are more preferred.

The compound (ZI-1) is a compound where at least one of $R_{201}$ to $R_{203}$ of formula (ZI) is an aryl group. That is, the compound (ZI-1) is an arylsulfonium compound, i.e., a compound having an arylsulfonium as the cation.

In the compound (ZI-1), all of $R_{201}$ to $R_{203}$ may be an aryl group or a part of $R_{201}$ to $R_{203}$ may be an aryl group with the remaining being an alkyl group. In the case where the compound (ZI-1) has a plurality of aryl groups, each aryl group may be the same as or different from every other aryl group.

The compound (ZI-1) includes, for example, a triarylsulfonium compound, a diarylalkylsulfonium compound, and an aryldialkylsulfonium compound.

The aryl group in the compound (ZI-1) is preferably a phenyl group, a naphthyl group or a heteroaryl group such as indole residue and pyrrole residue, more preferably a phenyl group, a naphthyl group or an indole residue.

The alkyl group which is contained, if desired, in the compound (ZI-1) is preferably a linear, branched or cyclic alkyl group having a carbon number of 1 to 15, and examples thereof include a methyl group, an ethyl group, a propyl group, an n-butyl group, a sec-butyl group, a tert-butyl group, a cyclopropyl group, a cyclobutyl group, and a cyclohexyl group.

These aryl group and alkyl group may have a substituent. This substituent includes, for example, an alkyl group (preferably having a carbon number of 1 to 15), an aryl group (preferably having a carbon number of 6 to 14), an alkoxy group (preferably having a carbon number of 1 to 15), a halogen atom, a hydroxyl group, and a phenylthio group.

Preferred substituents include a linear, branched or cyclic alkyl group having a carbon number of 1 to 12, and a linear, branched or cyclic alkoxy group having a carbon number of 1 to 12. More preferred substituents include an alkyl group having a carbon number of 1 to 6, and an alkoxy group having a carbon number of 1 to 6. The substituent may be substituted on any one of three members $R_{201}$ to $R_{203}$ or may be substituted on all of these three members. In the case where $R_{201}$ to $R_{203}$ are an aryl group, the substituent is preferably substituted on the p-position of the aryl group.

An embodiment where one or two of $R_{201}$, $R_{202}$ and $R_{203}$ are an aryl group which may have a substituent and the remaining groups are a linear, branched or cyclic alkyl group is also preferred. Specific examples of this structure include structures described in paragraphs 0141 to 0153 of JP-A-2004-210670.

At this time, the aryl group above is specifically the same as the aryl group of $R_{201}$, $R_{202}$ and $R_{203}$ and is preferably a phenyl group or a naphthyl group. The aryl group preferably has, as a substituent, any one of a hydroxyl group, an alkoxy group and an alkyl group. The substituent is more preferably an alkoxy group having a carbon number of 1 to 12, still more preferably an alkoxy group having a carbon number of 1 to 6.

The linear, branched or cyclic alkyl group as the remaining group is preferably an alkyl group having a carbon number of 1 to 6. Such a group may further have a substituent. Also, in the case where two groups are present as the remaining group, these two groups may combine with each other to form a ring structure.

The compound (ZI-2) is described below.

The compound (ZI-2) is a compound where each of $R_{201}$ to $R_{203}$ in formula (ZI) independently represents an aromatic ring-free organic group. The aromatic ring as used herein encompasses an aromatic ring containing a heteroatom.

The aromatic ring-free organic group as $R_{201}$ to $R_{203}$ has a carbon number of, for example, from 1 to 30, preferably from 1 to 20.

Each of $R_{201}$ to $R_{203}$ is independently represents preferably an alkyl group, a 2-oxoalkyl group, an alkoxycarbonylmethyl group, an allyl group or a vinyl group, more preferably a linear, branched or cyclic 2-oxoalkyl group or an alkoxycarbonylmethyl group, still more preferably a linear or branched 2-oxoalkyl group.

The alkyl group as $R_{201}$ to $R_{203}$ may be linear, branched or cyclic, and preferred examples thereof include a linear or branched alkyl group having a carbon number of 1 to 10 (e.g., methyl, ethyl, propyl, butyl, pentyl), and a cycloalkyl group having a carbon number of 3 to 10 (e.g., cyclopentyl, cyclohexyl, norbornyl).

The 2-oxoalkyl group as $R_{201}$ to $R_{203}$ may be linear, branched or cyclic and is preferably a group having >C=O on the 2-position of the above-described alkyl group.

Preferred examples of the alkoxy group in the alkoxycarbonylmethyl group as $R_{201}$ to $R_{203}$ include an alkoxy group having a carbon number of 1 to 5 (e.g., methoxy, ethoxy, propoxy, butoxy, pentoxy).

Each of $R_{201}$ to $R_{203}$ may be further substituted, for example, with a halogen atom, an alkoxy group (for example, having a carbon number of 1 to 5), a hydroxyl group, a cyano group and/or a nitro group.

Two members out of $R_{201}$ to $R_{203}$ may combine with each other to form a ring structure. This ring structure may contain an oxygen atom, a sulfur atom, an ester bond, an amido bond and/or a carbonyl group in the ring. The group formed by combining two members out of $R_{201}$ to $R_{203}$ includes, for example, an alkylene group (e.g., butylene, pentylene).

The compound (ZI-3) is described below.

The compound (ZI-3) is a compound represented by the following formula (ZI-3) and is a compound having a phenacylsulfonium salt structure.

[Chem. 102]

(ZI-3)

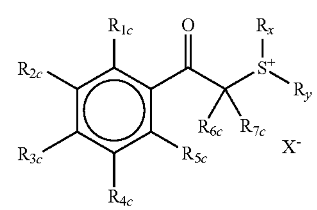

In the formula, each of $R_{1c}$ to $R_{5c}$ independently represents a hydrogen atom, an alkyl group, an alkoxy group, or a halogen atom. The carbon number of the alkyl group and alkoxy group is preferably from 1 to 6.

Each of $R_{6c}$ and $R_{7c}$ represents a hydrogen atom or an alkyl group. The carbon number of the alkyl group is preferably from 1 to 6.

Each of $R_x$ and $R_y$ independently represents an alkyl group, a 2-oxoalkyl group, an alkoxycarbonylmethyl group, an allyl group or a vinyl group. The carbon number of such an atomic group is preferably from 1 to 6.

Any two or more members of $R_{1c}$ to $R_{7c}$ may combine with each other to form a ring structure. Also, $R_x$ and $R_y$ may combine to form a ring structure. Such a ring structure may contain an oxygen atom, a sulfur atom, an ester bond and/or an amide bond.

$X^-$ in formula (ZI-3) has the same meaning as $X^-$ in formula (ZI).

Specific examples of the compound (ZI-3) include the compounds illustrated in paragraphs 0047 and 0048 of JP-A-2004-233661 and paragraphs 0040 to 0046 of JP-A-2003-35948.

The compound (ZI-4) is described below.

The compound (ZI-4) is a compound having a cation represented by the following formula (ZI-4). The compound (ZI-4) is effective to suppress outgassing.

[Chem. 103]

(ZI-4)

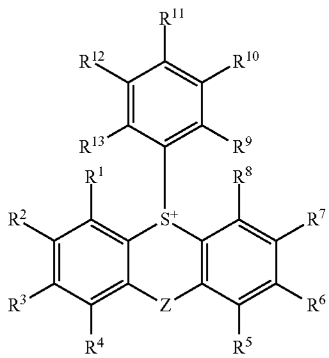

In formula (ZI-4), each of $R^1$ to $R^{13}$ independently represents a hydrogen atom or a substituent, and at least one of $R^1$ to $R^{13}$ is preferably a substituent containing an alcoholic hydroxyl group. The "alcoholic hydroxyl group" as used herein means a hydroxyl group bonded to a carbon atom of an alkyl group.

Z represents a single bond or a divalent linking group.

In the case where $R^1$ to $R^{13}$ are a substituent containing an alcoholic hydroxyl group, each of $R^1$ to $R^{13}$ is preferably a group represented by —(W—Y), wherein Y is an alkyl group substituted with a hydroxyl group and W is a single bond or a divalent linking group.

Preferred examples of the alkyl group represented by Y include an ethyl group, a propyl group and an isopropyl group. In particular, Y preferably contains a structure represented by $—CH_2CH_2OH$.

The divalent linking group represented by W is not particularly limited but is preferably a single bond or a divalent group formed by substituting a single bond for an arbitrary hydrogen atom in an alkoxyl group, an acyloxy group, an acylamino group, an alkyl- or aryl-sulfonylamino group, an alkylthio group, an alkylsulfonyl group, an acyl group, an alkoxycarbonyl group or a carbamoyl group, more preferably a single bond or a divalent group formed by substituting a single bond for an arbitrary hydrogen atom in an acyloxy group, an alkylsulfonyl group, an acyl group or an alkoxycarbonyl group.

In the case where $R^1$ to $R^{13}$ are a substituent containing an alcoholic hydroxyl group, the number of carbons contained therein is preferably from 2 to 10, more preferably from 2 to 6, still more preferably from 2 to 4.

The alcoholic hydroxyl group-containing substituent as $R^1$ to $R^{13}$ may have two or more alcoholic hydroxyl groups. The number of alcoholic hydroxyl groups in the alcoholic hydroxyl group-containing substituent as $R^1$ to $R^{13}$ is from 1 to 6, preferably from 1 to 3, more preferably 1.

The number of alcoholic hydroxyl groups in the compound represented by formula (ZI-4) is, in total of all of $R^1$ to $R^{13}$, from 1 to 10, preferably from 1 to 6, more preferably from 1 to 3.

In the case where $R^1$ to $R^{13}$ contain no alcoholic hydroxyl group, the substituent as $R^1$ to $R^{13}$ includes, for example, a halogen atom, an alkyl group, a cycloalkyl group, an alkenyl group, a cycloalkenyl group, an alkynyl group, an aryl group, a heterocyclic group, a cyano group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkyl- or aryl-sulfonylamino group, a mercapto group, an alkylthio group, an arylthio group, a heterocyclic thio group, a sulfamoyl group, a sulfo group, an alkyl- or aryl-sulfinyl group, an alkyl- or aryl-sulfonyl group, an acyl group, an aryloxycarbonyl group, an alkoxycarbonyl group, a carbamoyl group, an arylazo or heterocyclic azo group, an imido group, a phosphino group, a phosphinyl group, a phosphinyloxy group, a phosphinylamino group, a phosphono group, a silyl group, a hydrazino group, a ureido group, a boronic acid group [$—B(OH)_2$], a phosphato group [$—OPO(OH)_2$], a sulfato group ($—OSO_3H$), and other known substituents.

In the case where $R^1$ to $R^{13}$ contain no alcoholic hydroxyl group, each of $R^1$ to $R^{13}$ is preferably a hydrogen atom, a halogen atom, an alkyl group, a cycloalkyl group, an alkenyl group, a cycloalkenyl group, an alkynyl group, an aryl group, a cyano group, a carboxyl group, an alkoxy group, an aryloxy group, an acyloxy group, a carbamoyloxy group, an acylamino group, an aminocarbonylamino group, an alkoxycarbonylamino group, an aryloxycarbonylamino group, a sulfamoylamino group, an alkyl- or aryl-sulfonylamino group, an alkylthio group, an arylthio group, a sulfamoyl group, an alkyl- or aryl-sulfonyl group, an aryloxycarbonyl group, an alkoxycarbonyl group, a carbamoyl group, an imido group, a silyl group or a ureido group.

In the case where $R^1$ to $R^{13}$ contain no alcoholic hydroxyl group, each of $R^1$ to $R^{13}$ is more preferably a hydrogen atom, a halogen atom, an alkyl group, a cycloalkyl group, a cyano group, an alkoxy group, an acyloxy group, an acylamino group, an aminocarbonylamino group, an alkoxycarbonylamino group, an alkyl- or aryl-sulfonylamino group, an alkylthio group, a sulfamoyl group, an alkyl- or aryl-sulfonyl group, an alkoxycarbonyl group or a carbamoyl group.

In the case where $R^1$ to $R^{13}$ contain no alcoholic hydroxyl group, each of $R^1$ to $R^{13}$ is still more preferably a hydrogen atom, an alkyl group, a cycloalkyl group, a halogen atom or an alkoxy group.

Two adjacent members out of $R^1$ to $R^{13}$ may combine with each other to form a ring structure. This ring structure includes an aromatic or non-aromatic hydrocarbon ring and a heterocyclic ring. These ring structures may further combine to form a condensed ring.

The compound (ZI-4) preferably has a structure where at least one of $R^1$ to $R^{13}$ contains an alcoholic hydroxyl group, more preferably a structure where at least one of $R^9$ to $R^{13}$ contains an alcoholic hydroxyl group.

Z represents, as described above, a single bond or a divalent linking group. This divalent linking group includes, for example, an alkylene group, an arylene group, a carbonyl group, a sulfonyl group, a carbonyloxy group, a carbonylamino group, a sulfonylamido group, an ether group, a thioether group, an amino group, a disulfide group, an acyl group, an alkylsulfonyl group, —CH═CH—, an aminocarbonylamino group, and an aminosulfonylamino group.

The divalent linking group may have a substituent. Examples of the substituent thereon are the same as those enumerated above for $R^1$ to $R^{13}$.

Z is preferably a single bond or a non-electron-withdrawing bond or group such as alkylene group, arylene group, ether group, thioether group, amino group, —CH═CH—, aminocarbonylamino group and aminosulfonylamino group, more preferably a single bond, an ether group or a thioether group, still more preferably a single bond.

Formulae (ZII) and (ZIII) are described below.

In formulae (ZII) and (ZIII), each of $R_{204}$ to $R_{207}$ independently represents an aryl group, an alkyl group or a cycloalkyl group. These aryl group, alkyl group and cycloalkyl group may have a substituent.

Preferred examples of the aryl group as $R_{204}$ to $R_{207}$ include the same groups as those enumerated above for $R_{201}$ to $R_{203}$ in the compound (ZI-1).

Preferred examples of the alkyl group and cycloalkyl group as $R_{204}$ to $R_{207}$ include linear, branched or cyclic alkyl groups enumerated above for $R_{201}$ to $R_{203}$ in the compound (ZI-2).

$X^-$ in formulae (ZII) and (ZIII) has the same meaning as $X^-$ in formula (ZI).

Other preferred examples of the photoacid generator include the compounds represented by the following formulae (ZIV), (ZV) and (ZVI):

[Chem. 104]

ZIV $$Ar_3—SO_2—SO_2—Ar_4$$

ZV

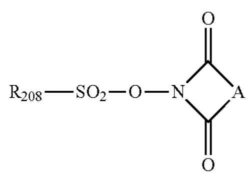

ZVI

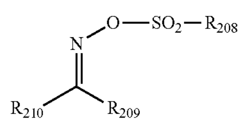

In formulae (ZIV) to (ZVI), each of $Ar_3$ and $Ar_4$ independently represents a substituted or unsubstituted aryl group.

$R_{208}$ represents an alkyl group, a cycloalkyl group or an aryl group independently of each other between formulae (ZV) and (ZVI). These alkyl group, cycloalkyl group and aryl group may or may not be substituted.

These groups are preferably substituted with a fluorine atom. In this case, the strength of the acid generated from the photoacid generator can be enhanced.

Each of $R_{209}$ and $R_{210}$ independently represents an alkyl group, a cycloalkyl group, an aryl group or an electron-withdrawing group. These alkyl group, cycloalkyl group, aryl group and electron-withdrawing group may or may not be substituted.

$R_{209}$ is preferably a substituted or unsubstituted aryl group.

$R_{210}$ is preferably an electron-withdrawing group. This electron-withdrawing group is preferably a cyano group or a fluoroalkyl group.

A represents an alkylene group, an alkenylene group or an arylene group. These alkylene group, alkenylene group and arylene group may have a substituent.

A compound having a plurality of structures represented by formula (ZVI) is also preferred as the photoacid generator. Such a compound includes, for example, a compound having a structure where $R_{209}$ or $R_{210}$ in a compound represented by formula (ZVI) is bonded to $R_{209}$ or $R_{210}$ in another compound represented by formula (ZVI).

As the photoacid generator, the compounds represented by formulae (ZI) to (ZIII) are preferred, the compound represented by formula (ZI) is more preferred, and compounds (ZI-1) to (ZI-3) are still more preferred.

From the standpoint of improving the resolution and pattern profile by preventing the acid generated upon exposure from diffusing into the unexposed area, the compound (B) as the photoacid generator is preferably a compound capable of generating an acid having a size of 200 $Å^3$ or more in volume, more preferably a compound capable of generating an acid having a size of 240 $Å^3$ or more in volume, still more preferably a compound capable of generating an acid having a size of 270 $Å^3$ or more in volume, yet still more preferably a compound capable of generating an acid having a size of 300 $Å^3$ or more in volume, and most preferably a compound capable of generating an acid having a size of 400 $Å^3$ or more in volume. However in view of sensitivity and solubility in the coating solvent, the compound (B) as the photoacid generator is preferably a compound capable of generating an acid of 2,000 $Å^3$ or less in volume, more preferably a compound capable of generating an acid of 1,500 $Å^3$ or less in volume. The structure of the compound (B) as the photoacid generator and the structure and volume (unit: $Å^3$) of the acid generated from the compound (B) as the photoacid generator are illustrated below.

This value was determined as follows by using "WinMOPAC" produced by Fujitsu Limited. That is, first, the chemical structure of the acid according to each example was input, and next, using this structure as the initial structure, the most stable conformation of each acid was obtained by molecular force field calculation using an MM3 method. Thereafter, with respect to the most stable conformation, molecular orbital calculation using a PM3 method was performed, whereby the "accessible volume" of each acid was computed.

Specific examples of the photoacid generator are illustrated below, but the present invention is not limited thereto. Incidentally, A represents a divalent linking group.

[Chem. 105]

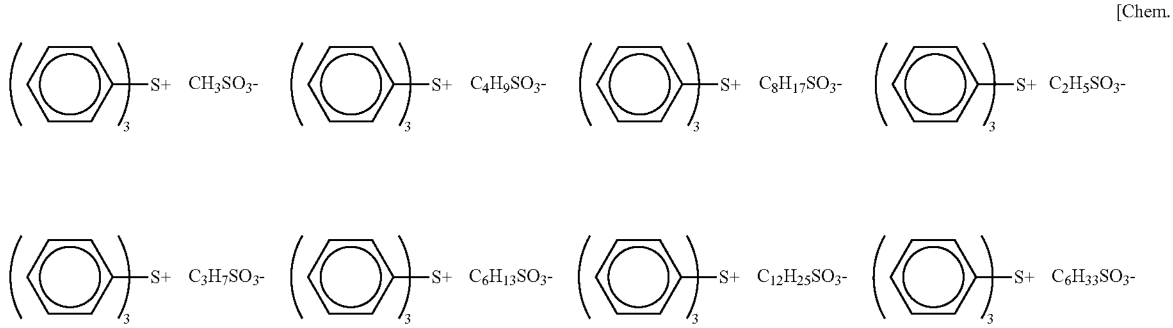

-continued
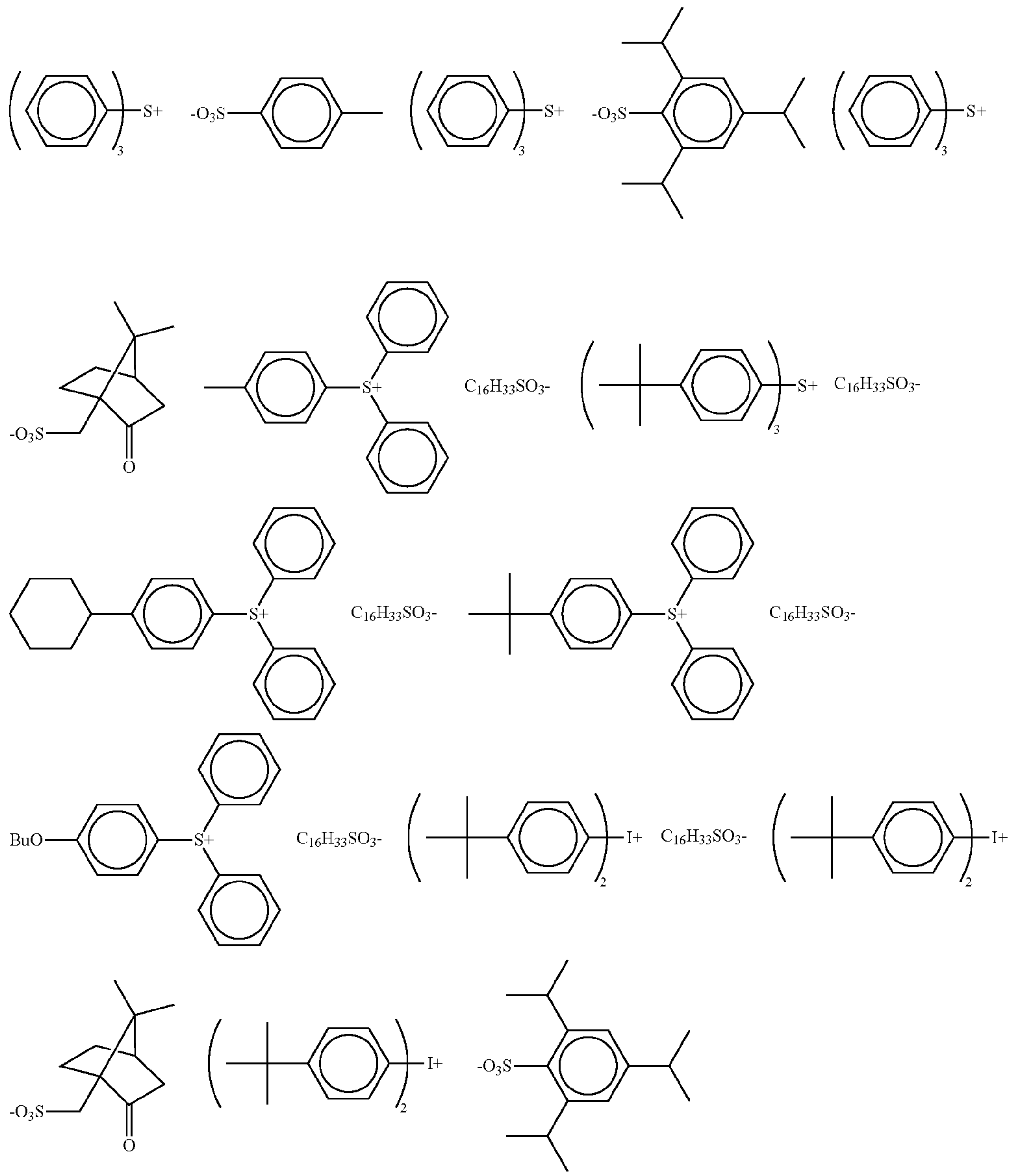
[Chem. 106]
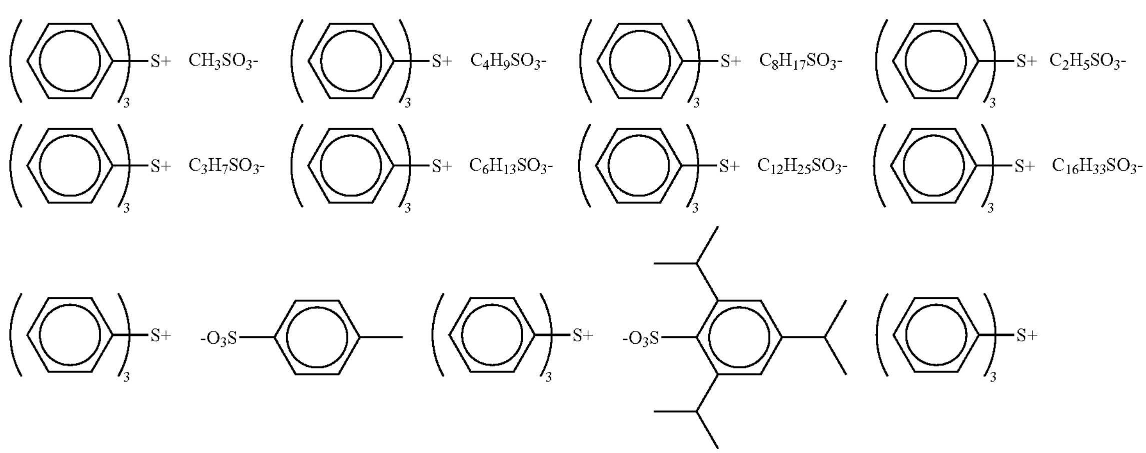

-continued
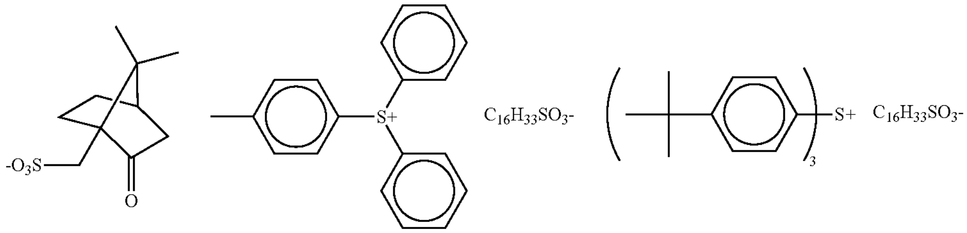
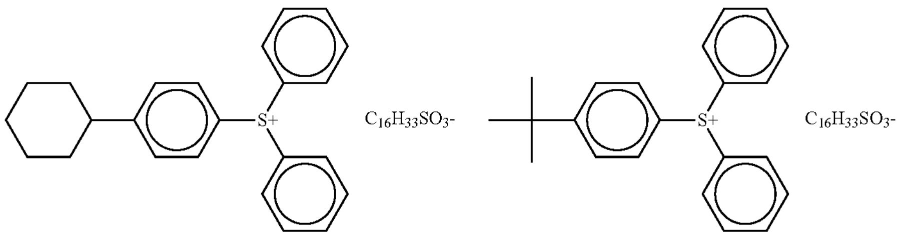
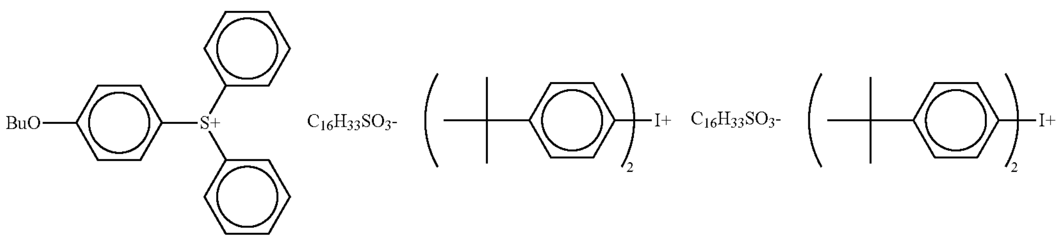
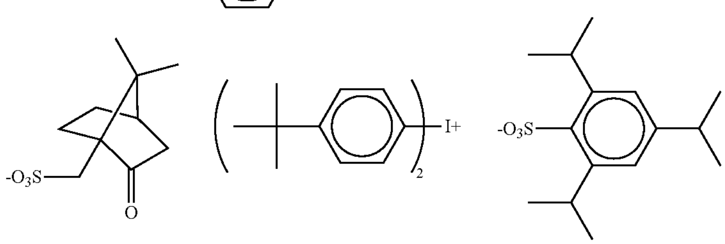
[Chem. 107]
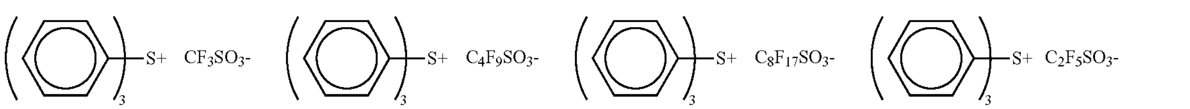
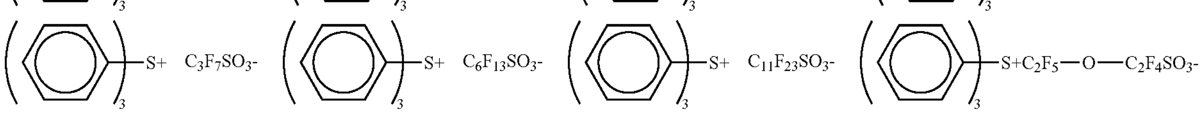
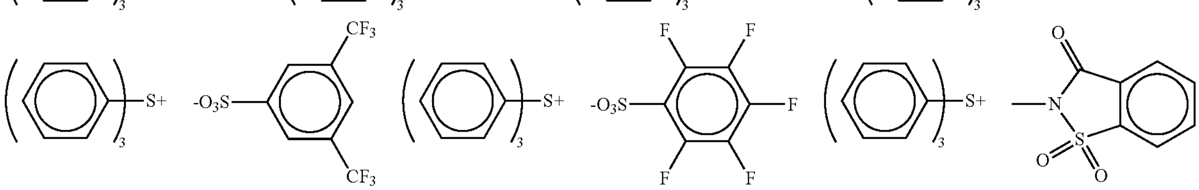
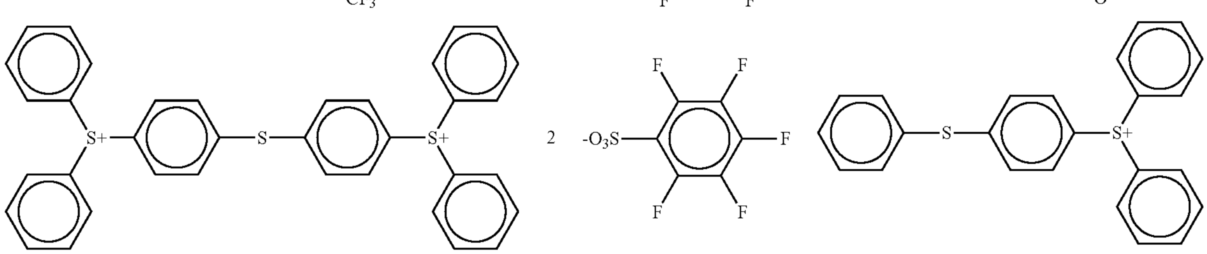

-continued
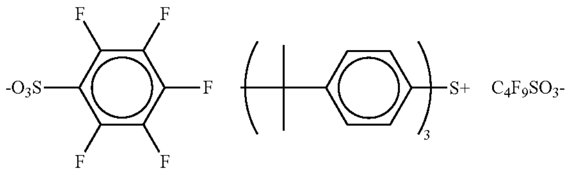
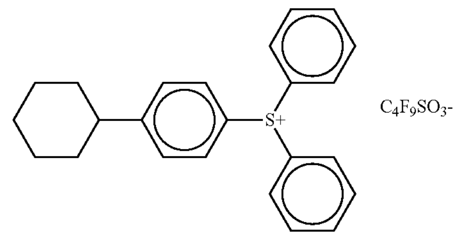
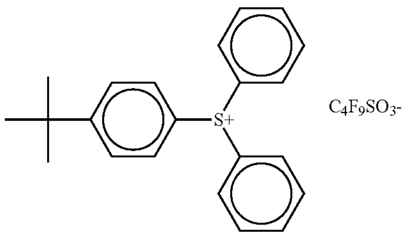
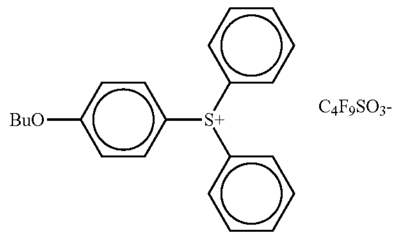
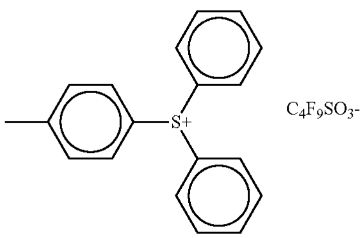
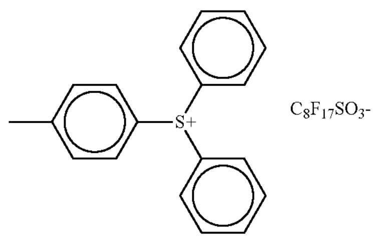
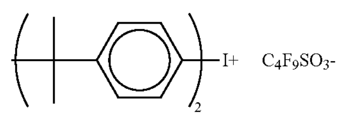
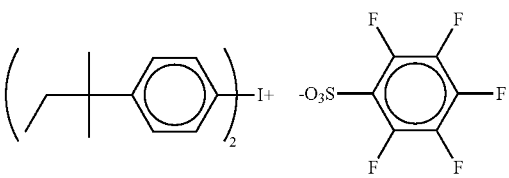
[Chem. 108]
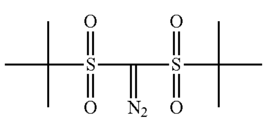
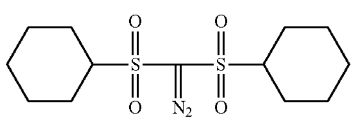
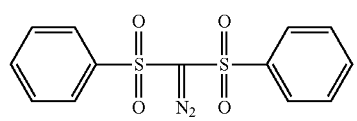
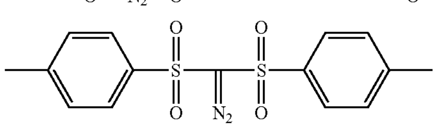
[Chem. 109]
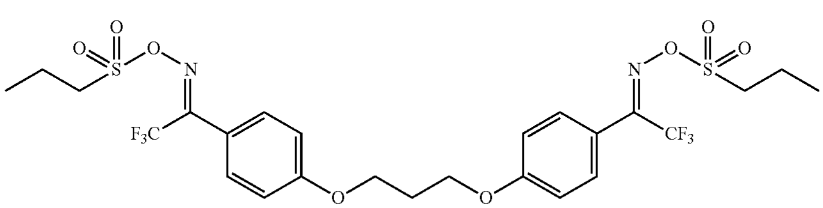
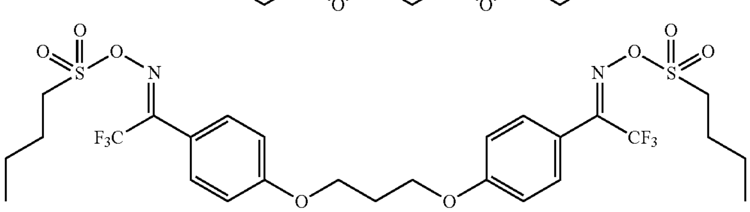

-continued
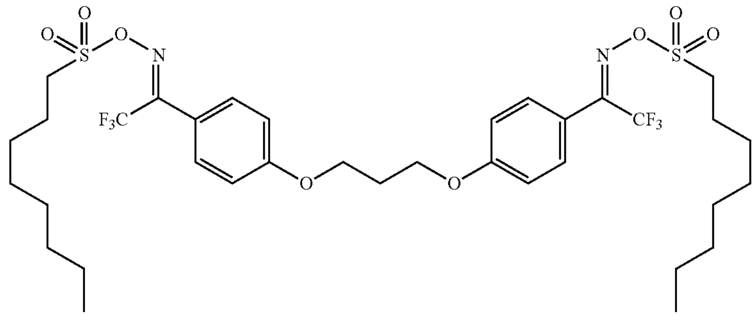
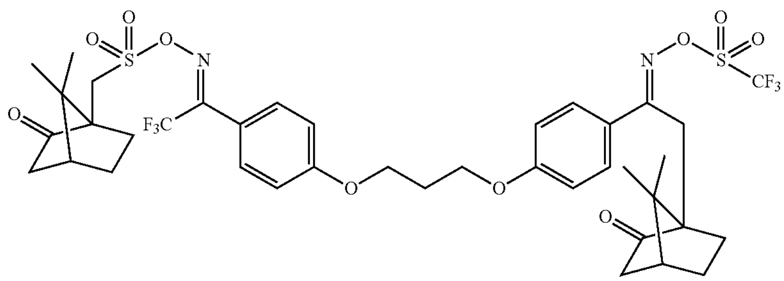
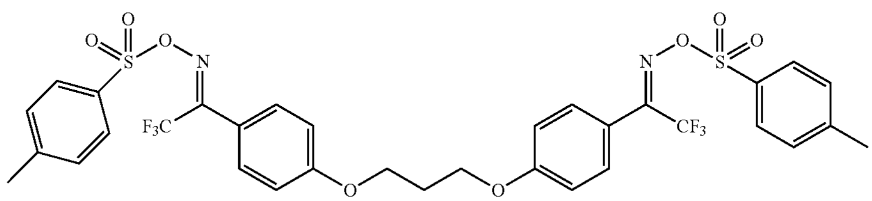
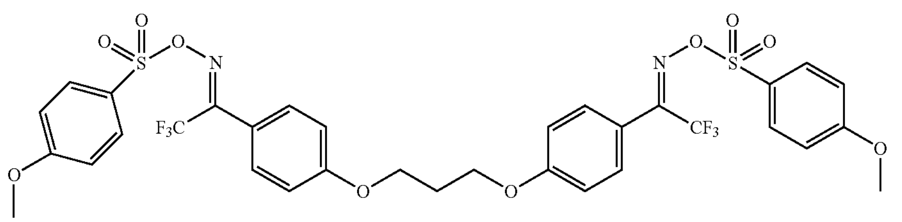
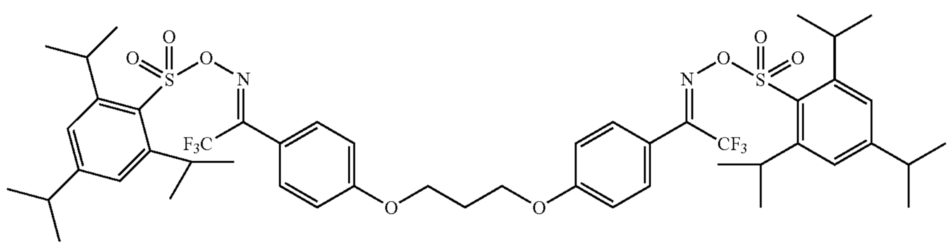
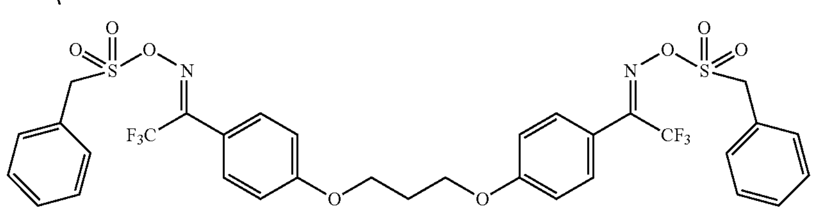
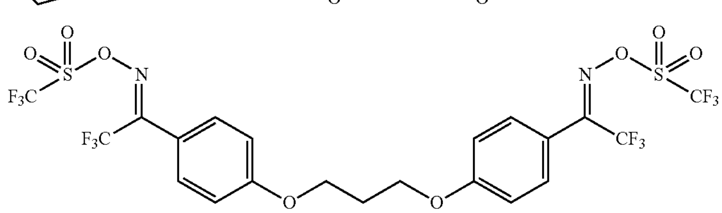

-continued
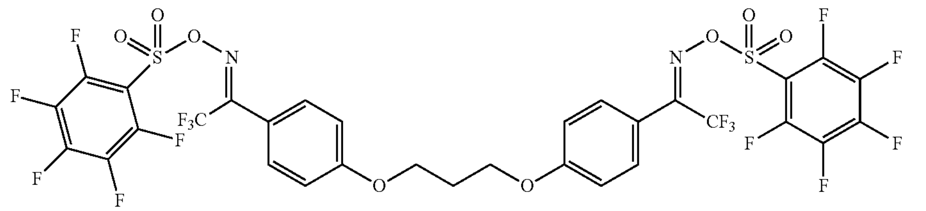
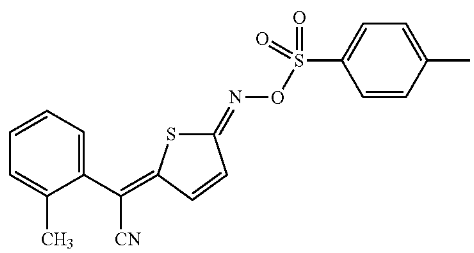
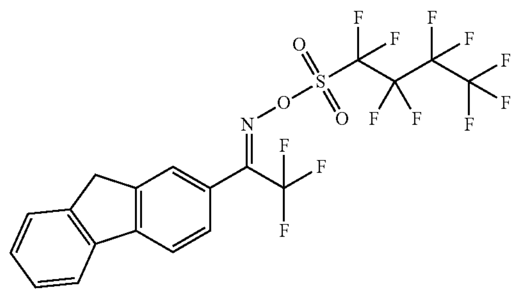
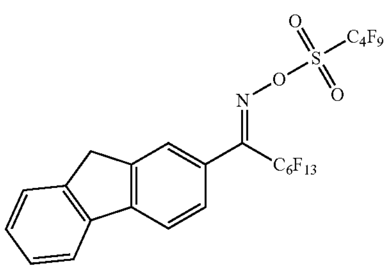
[Chem. 110]
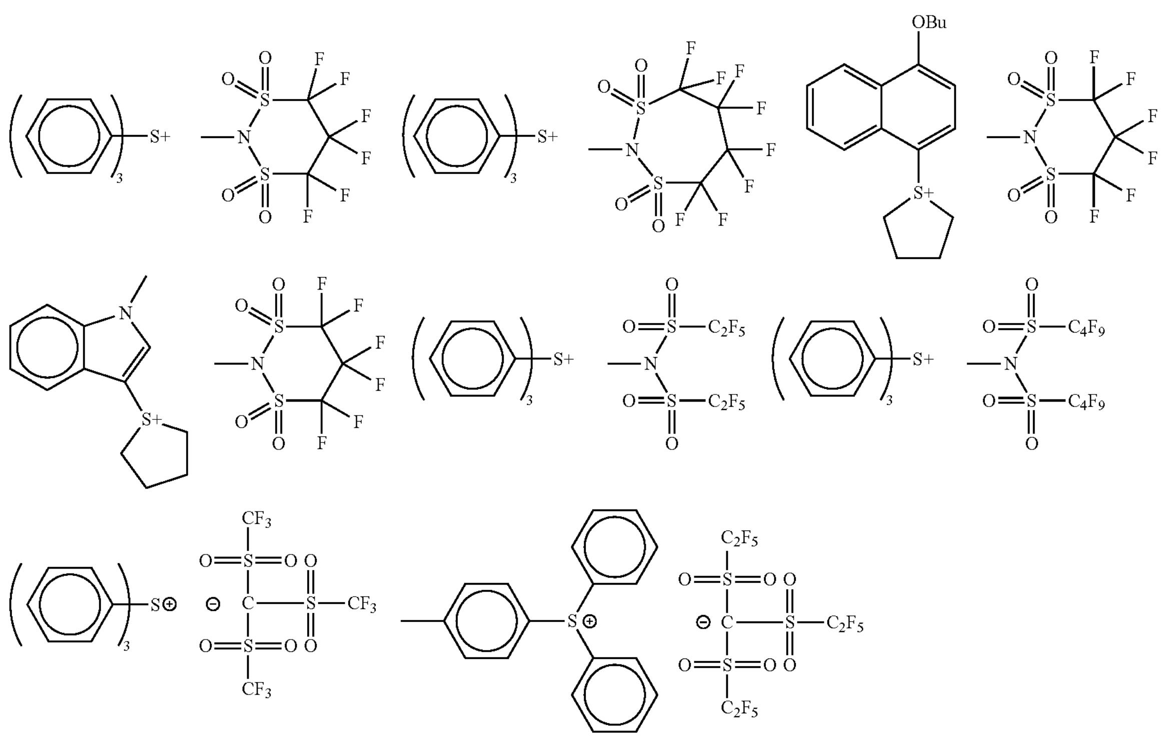

-continued
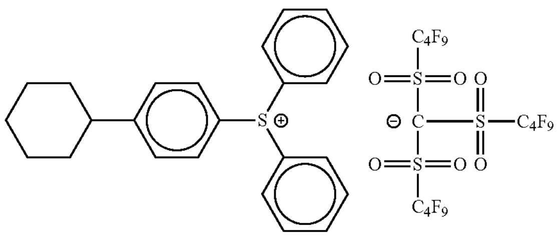
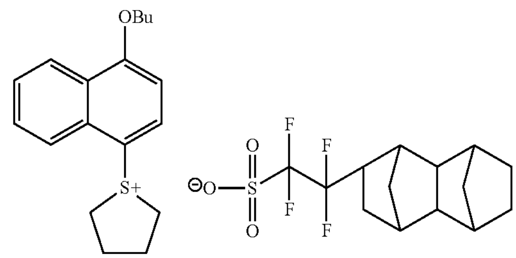
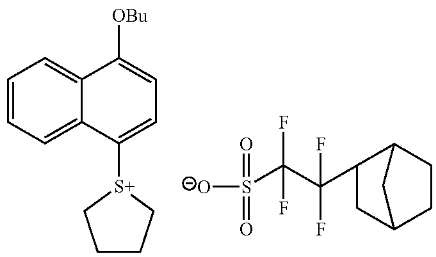
[Chem. 111]
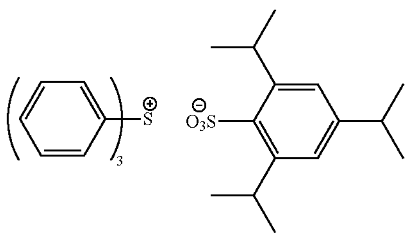
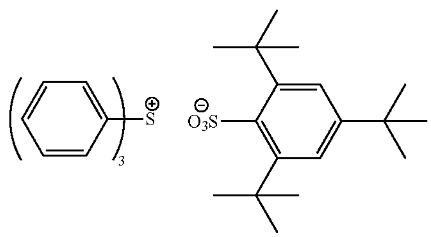
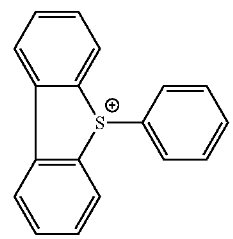
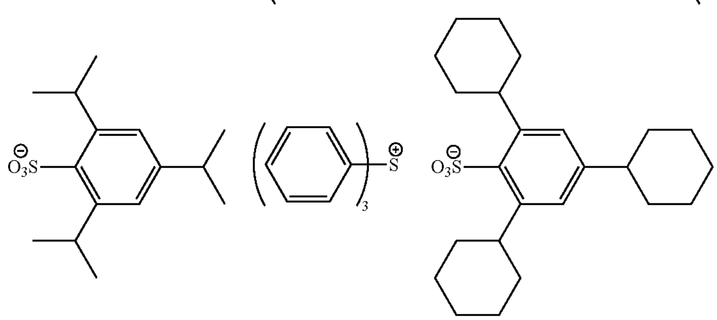
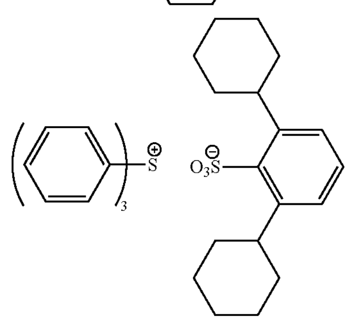
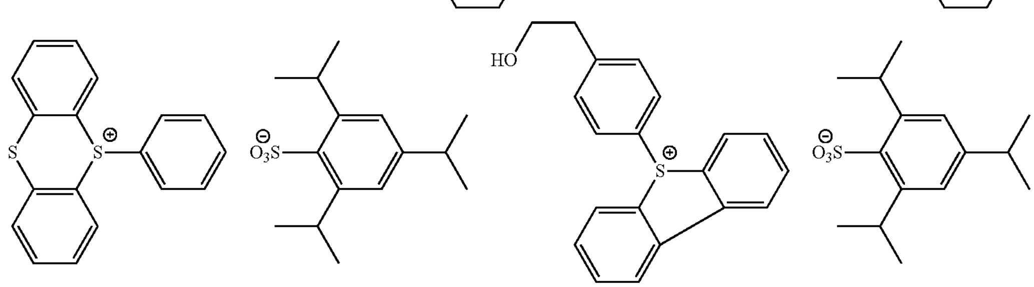
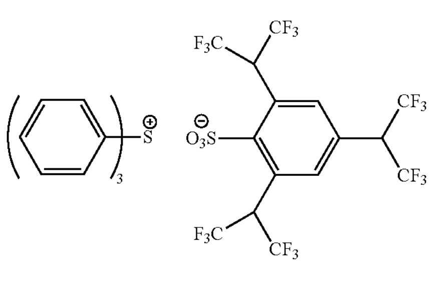
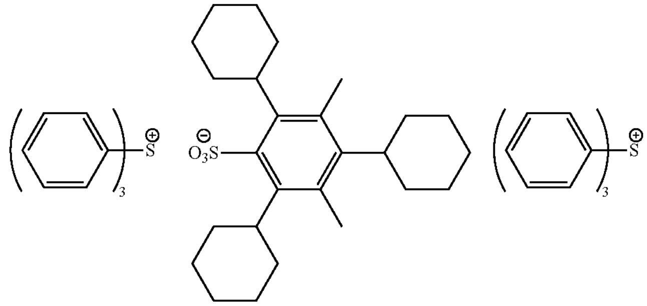

-continued
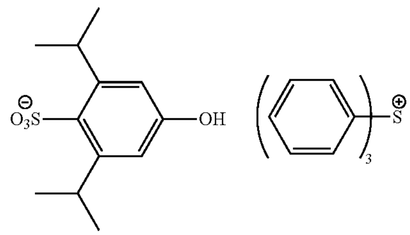
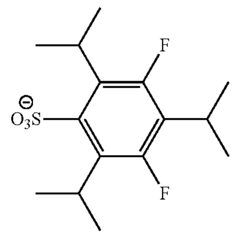
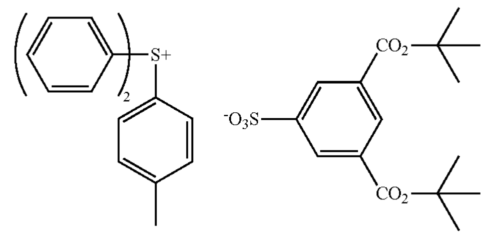
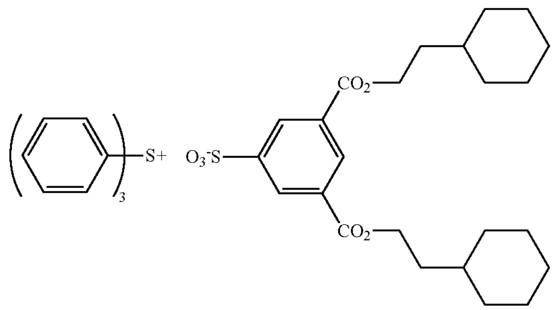
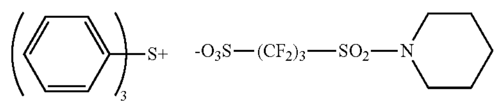
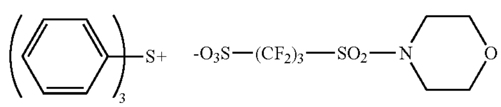
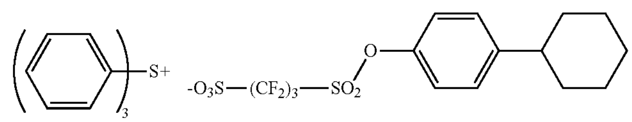
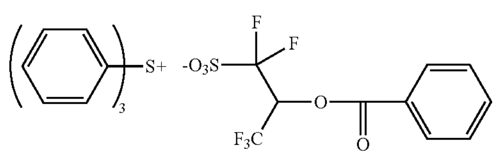
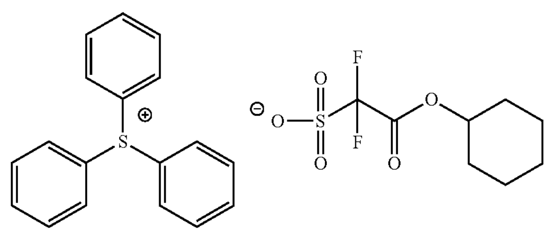
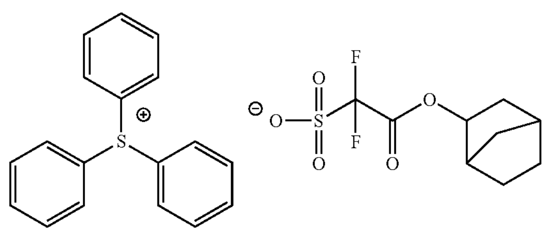
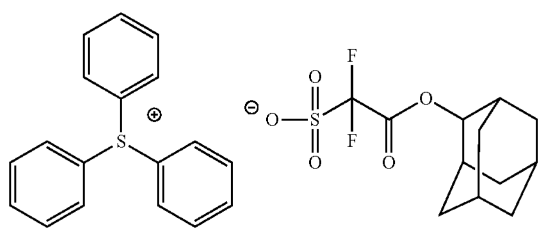
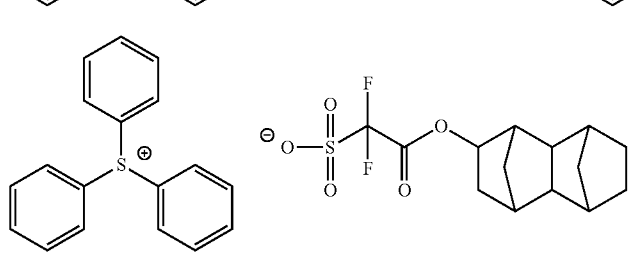
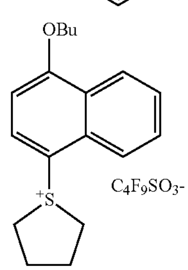
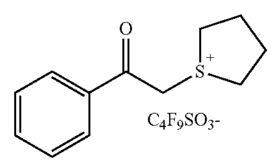
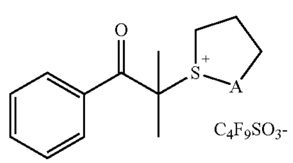

-continued
[Chem. 112]
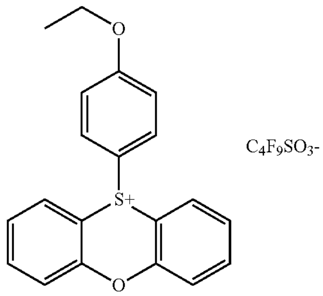
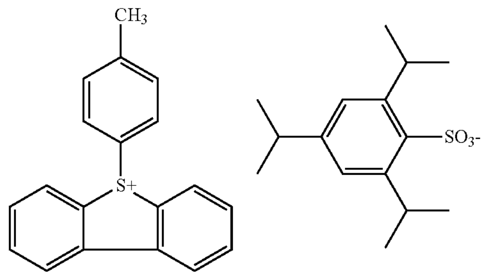
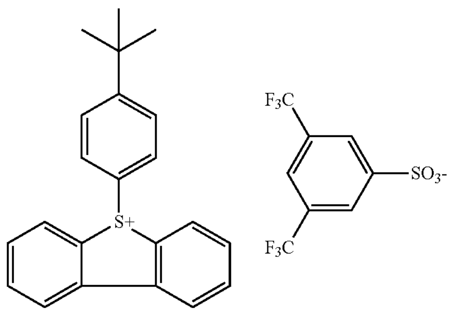
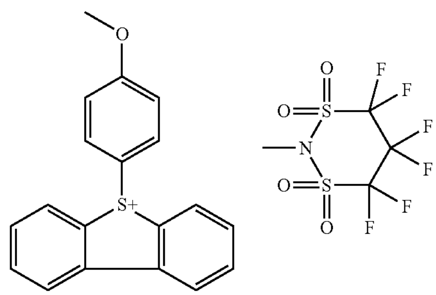
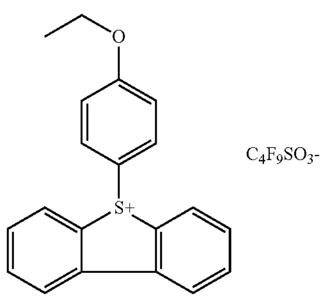
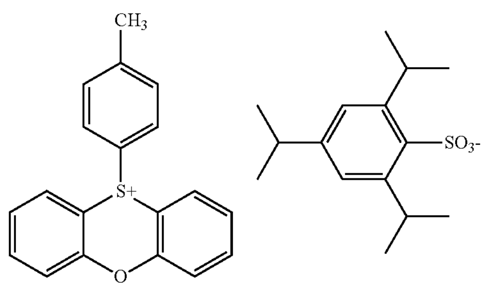
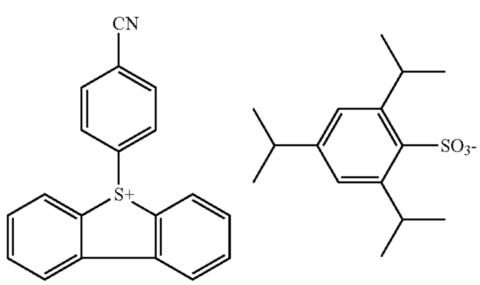
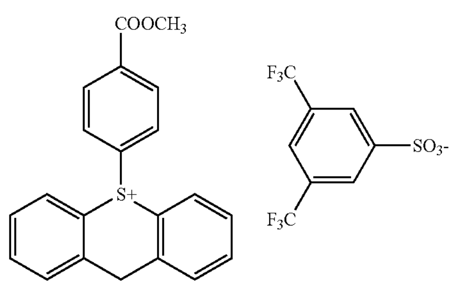
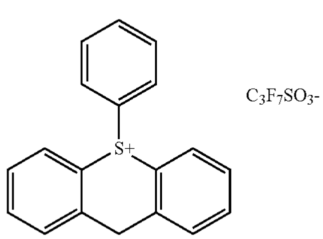
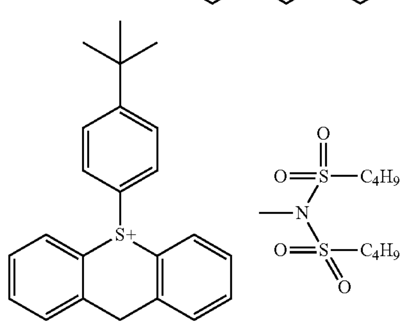
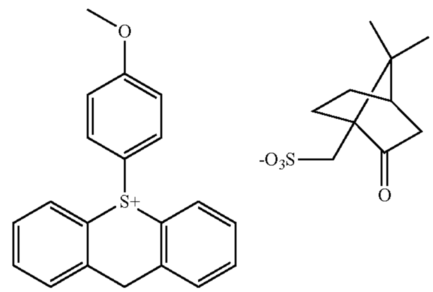

-continued

[Chem. 113]

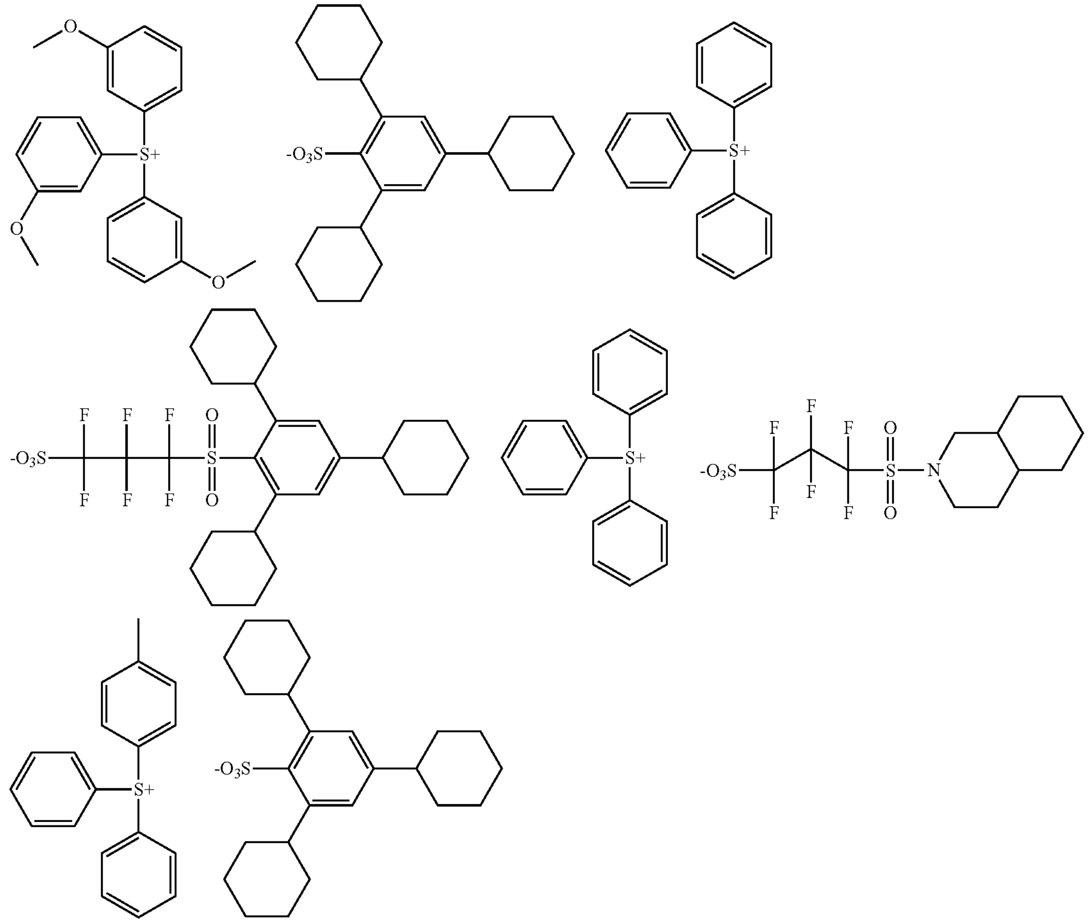

As for the photoacid generator, one compound may be used alone, or two or more compounds may be used in combination. In the case of using two or more compounds in combination, compounds capable of generating two kinds of organic acids differing in the number of all atoms excluding hydrogen atom by 2 or more are preferably combined.

The content of the photoacid generator is preferably from 0.1 to 40 mass %, more preferably from 0.5 to 30 mass %, still more preferably from 1 to 20 mass %, based on the total solid content of the composition. In the case of using the composition for electron beam or EUV exposure, the content is preferably from 1 to 20 mass % in particular.

[3] Compound Capable of Decomposing by an Action of Acid to Increase the Solubility for an Alkali Developer The compound capable of decomposing by an action of acid to increase the solubility for an alkali developer typically has a group capable of decomposing by an action of acid to produce an alkali-soluble group (hereinafter sometimes referred to as "acid-decomposable group").

The compound capable of decomposing by an action of acid to increase the solubility for an alkali developer is preferably a resin capable of decomposing by an action of acid to increase the solubility for an alkali developer (hereinafter, sometimes referred to as "acid-decomposable resin").

The acid-decomposable resin may have an acid-decomposable group on either one or both of the main chain and the side chain of the resin. This resin preferably has an acid-decomposable group on the side chain.

Also, the acid-decomposable resin is preferably a resin containing a repeating unit having an acid-decomposable group.

According to the actinic ray-sensitive or radiation-sensitive composition of the present invention, in the exposed area, the hydrogen atom in at least one phenolic hydroxyl group out of one or more phenolic hydroxyl groups is subject to actions of an acid generated from the compound (B) capable of generating an acid upon irradiation with an actinic ray or radiation and a sulfonic acid that is generated from the compound (A) represented by formula (I) by an action of acid, and the compound capable of decomposing by an action of acid to increase the solubility for an alkali developer is increased in the solubility for an alkali developer, whereby a positive pattern is formed.

The acid-decomposable group is preferably a group formed by replacing the hydrogen atom of an alkali-soluble group such as —COOH group and —OH group by a group capable of leaving by an action of acid. The group capable of leaving by an action of acid is preferably an acetal group or a tertiary ester group.

In the case where the acid-decomposable group is bonded as a side chain, the mother resin includes, for example, an alkali-soluble resin having an —OH or —COOH group in the side chain. Examples of such an alkali-soluble resin include those described later.

The alkali dissolution rate of the alkali-soluble resin is preferably 17 nm/sec or more as measured (at 23° C.) in 2.38 mass % tetramethylammonium hydroxide (TMAH). This rate is more preferably 33 nm/sec or more.

From such a standpoint, particularly preferred alkali-soluble resins include a resin containing a hydroxystyrene structural unit, such as o-, m- or p-poly(hydroxystyrene) or a copolymer thereof, hydrogenated poly(hydroxystyrene), halogen- or alkyl-substituted poly(hydroxystyrene), partially O-alkylated or O-acylated poly(hydroxystyrene), styrene-hydroxystyrene copolymer, α-methylstyrene-hydroxystyrene copolymer and hydrogenated novolak resin; and a resin containing a repeating unit having a carboxyl group, such as (meth)acrylic acid and norbornene carboxylic acid.

The repeating unit having a preferable acid-decomposable group includes, for example, a tert-butoxycarbonyloxystyrene, a 1-alkoxyethoxystyrene, and a tertiary alkyl (meth) acrylate. This repeating unit is more preferably a 2-alkyl-2-adamantyl (meth)acrylate or a dialkyl(1-adamantyl)methyl (meth)acrylate.

The resin capable of decomposing by an action of acid to increase the solubility for an alkali developer can be obtained, for example, by reacting a resin with a precursor of a group capable of leaving by an action of acid or by copolymerizing various monomers with an alkali-soluble resin monomer having bonded thereto a group capable of leaving by an action of acid, as disclosed in European Patent 254853, JP-A-2-25850, JP-A-3-223860, JP-A-4-251259, etc.

In the case of irradiating the composition of the present invention with KrF excimer laser light, electron beam, X-ray or high-energy light with a wavelength of 50 nm or less (e.g., EUV), the resin above preferably contains a hydroxystyrene repeating unit, and this resin is more preferably a copolymer of hydroxystyrene and hydroxystyrene protected by a group capable of leaving by an action of acid, or a copolymer of hydroxystyrene and a tertiary alkyl (meth)acrylate.

Such a resin specifically includes a resin containing a repeating unit represented by the following formula (A):

[Chem. 114]

(A)

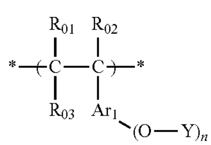

In the formula, each of $R_{01}$, $R_{02}$ and $R_{03}$ independently represents, for example, a hydrogen atom, an alkyl group, a cycloalkyl group, a halogen atom, a cyano group or an alkoxycarbonyl group. $Ar_1$ represents, for example, an aromatic ring group. Incidentally, it may be also possible that $R_{03}$ and $Ar_1$ are an alkylene group and these two members combine with each other to form a 5- or 6-membered ring together with the —C—C— chain.

Each of n Y's independently represents a hydrogen atom or a group capable of leaving by an action of acid. However, at least one Y represents a group capable of leaving by an action of acid.

n represents an integer of 1 to 4 and is preferably 1 or 2, more preferably 1.

The alkyl group as $R_{01}$ to $R_{03}$ is, for example, an alkyl group having a carbon number of 20 or less and is preferably a methyl group, an ethyl group, a propyl group, an isopropyl group, an n-butyl group, a sec-butyl group, a hexyl group, a 2-ethylhexyl group, an octyl group or a dodecyl group. The alkyl group is more preferably an alkyl group having a carbon number of 8 or less. These alkyl groups may have a substituent.

As the alkyl group contained in the alkoxycarbonyl group, the same alkyl group as in $R_{01}$ to $R_{03}$ above is preferred.

The cycloalkyl group may be a monocyclic cycloalkyl group or a polycyclic cycloalkyl group and is preferably a monocyclic cycloalkyl group having a carbon number of 3 to 8, such as cyclopropyl group, cyclopentyl group and cyclohexyl group. These cycloalkyl groups may have a substituent.

The halogen atom includes a fluorine atom, a chlorine atom, a bromine atom, and an iodine atom, with a fluorine atom being preferred.

In the case where $R_{03}$ represents an alkylene group, the alkylene group is preferably an alkylene group having a carbon number of 1 to 8, such as methylene group, ethylene group, propylene group, butylene group, hexylene group and octylene group.

The aromatic ring group as $Ar_1$ is preferably an aromatic ring group having a carbon number of 6 to 14, and examples thereof include a benzene ring, a toluene ring, and a naphthalene ring. These aromatic ring groups may have a substituent.

The group Y capable of leaving by an action of acid includes, for example, groups represented by $—C(R_{36})(R_{37})(R_{38})$, $—C(=O)—O—C(R_{36})(R_{37})(R_{38})$, $—C(R_{01})(R_{02})(OR_{39})$, $—C(R_{01})(R_{02})—C(=O)—O—C(R_{36})(R_{37})(R_{38})$, and $—CH(R_{36})(Ar)$.

In the formulae, each of $R_{36}$ to $R_{39}$ independently represents an alkyl group, a cycloalkyl group, an aryl group, an aralkyl group or an alkenyl group. $R_{36}$ and $R_{37}$ may combine with each other to form a ring structure.

Each of $R_{01}$ and $R_{02}$ independently represents a hydrogen atom, an alkyl group, a cycloalkyl group, an aryl group, an aralkyl group or an alkenyl group.

Ar represents an aryl group.

The alkyl group as $R_{36}$ to $R_{39}$, $R_{01}$ or $R_{02}$ is preferably an alkyl group having a carbon number of 1 to 8, and examples thereof include a methyl group, an ethyl group, a propyl group, an n-butyl group, a sec-butyl group, a hexyl group, and an octyl group.

The cycloalkyl group as $R_{36}$ to $R_{39}$, $R_{01}$ or $R_{02}$ may be a monocyclic cycloalkyl group or a polycyclic cycloalkyl group. The monocyclic cycloalkyl group is preferably a cycloalkyl group having a carbon number of 3 to 8, and examples thereof include a cyclopropyl group, a cyclobutyl group, a cyclopentyl group, a cyclohexyl group, and a cyclooctyl group. The polycyclic cycloalkyl group is preferably a cycloalkyl group having a carbon number of 6 to 20, and examples thereof include an adamantyl group, a norbornyl group, an isoboronyl group, a camphanyl group, a dicyclopentyl group, an α-pinel group, a tricyclodecanyl group, a tetracyclododecyl group, and an androstanyl group. Incidentally, a part of carbon atoms in the cycloalkyl group may be substituted with a heteroatom such as oxygen atom.

The aryl group as $R_{36}$ to $R_{39}$, $R_{01}$, $R_{02}$ or Ar is preferably an aryl group having a carbon number of 6 to 10, and examples thereof include a phenyl group, a naphthyl group, and an anthryl group.

The aralkyl group as $R_{36}$ to $R_{39}$, $R_{01}$ or $R_{02}$ is preferably an aralkyl group having a carbon number of 7 to 12, and preferred examples thereof include a benzyl group, a phenethyl group, and a naphthylmethyl group.

The alkenyl group as $R_{36}$ to $R_{39}$, $R_{01}$ or $R_{02}$ is preferably an alkenyl group having a carbon number of 2 to 8, and examples thereof include a vinyl group, an allyl group, a butenyl group, and a cyclohexenyl group.

The ring that may be formed by combining $R_{36}$ and $R_{37}$ with each other may be either a monocyclic type or a polycyclic type. The monocyclic type is preferably a cycloalkane structure having a carbon number of 3 to 8, and examples thereof include a cyclopropane structure, a cyclobutane structure, a cyclopentane structure, a cyclohexane structure, a cycloheptane structure, and a cyclooctane structure. The polycyclic type is preferably a cycloalkane structure having a carbon number of 6 to 20, and examples thereof include an adamantane structure, a norbornane structure, a dicyclopentane structure, a tricyclodecane structure, and a tetracyclododecane structure. Incidentally, a part of carbon atoms in the ring structure may be substituted with a heteroatom such as oxygen atom.

Each of the groups above may have a substituent. This substituent includes, for example, an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group. The carbon number of the substituent is preferably 8 or less.

The group Y capable of leaving by an action of acid is more preferably a structure represented by the following formula (III):

[Chem. 115]

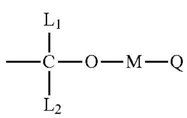

(III)

In formula (III), each of $L_1$ and $L_2$ independently represents a hydrogen atom, an alkyl group, a cycloalkyl group, an aryl group or an aralkyl group.

M represents a single bond or a divalent linking group.

Q represents an alkyl group, a cycloalkyl group that may contain a heteroatom, an aromatic ring group that may contain a heteroatom, an amino group, an ammonium group, a mercapto group, a cyano group or an acyl group. These cyclic aliphatic group and aromatic ring group may contain a heteroatom.

At least two members of Q, M and $L_1$ may combine with each other to form a 5- or 6-membered ring.

The alkyl group as $L_1$ and $L_2$ is, for example, an alkyl group having a carbon number of 1 to 8 and specifically includes a methyl group, an ethyl group, a propyl group, an n-butyl group, a sec-butyl group, a hexyl group, and an octyl group.

The cycloalkyl group as $L_1$ and $L_2$ is, for example, a cycloalkyl group having a carbon number of 3 to 15 and specifically includes a cyclopentyl group, a cyclohexyl group, a norbornyl group, and an adamantyl group.

The aryl group as $L_1$ and $L_2$ is, for example, an aryl group having a carbon number of 6 to 15 and specifically includes a phenyl group, a tolyl group, a naphthyl group, and an anthryl group.

The aralkyl group as $L_1$ and $L_2$ is, for example, an aralkyl group having a carbon number of 6 to 20 and specifically includes a benzyl group and a phenethyl group.

The divalent linking group as M is, for example, an alkylene group (e.g., methylene, ethylene, propylene, butylene, hexylene, octylene), a cycloalkylene group (e.g., cyclopentylene, cyclohexylene), an alkenylene group (e.g., ethylene, propenylene, butenylene), an arylene group (e.g., phenylene, tolylene, naphthylene), —S—, —O—, —CO—, —$SO_2$—, —$N(R_0)$—, or a combination of two or more thereof. Here, $R_0$ is a hydrogen atom or an alkyl group. The alkyl group as $R_0$ is, for example, an alkyl group having a carbon number of 1 to 8 and specifically includes a methyl group, an ethyl group, a propyl group, an n-butyl group, a sec-butyl group, a hexyl group, and an octyl group.

Examples of the alkyl group and cycloalkyl group as Q are the same as those of respective groups as $L_1$ and $L_2$.

The aromatic ring group as Q includes, for example, the above-described aryl group as $L_1$ and $L_2$. This aryl group is preferably a group having a carbon number of 3 to 15.

The heteroatom-containing cycloalkyl or aromatic ring group as Q includes, for example, a group having a heterocyclic structure such as thiirane, cyclothiolane, thiophene, furan, pyrrole, benzothiophene, benzofuran, benzopyrrole, triazine, imidazole, benzimidazole, triazole, thiadiazole, thiazole and pyrrolidone, but the ring is not limited thereto as long as it is a ring composed of carbon and a heteroatom or a ring composed of only a heteroatom.

The ring structure that may be formed by combining at least two members of Q, M and $L_1$ with each other includes, for example, a 5- or 6-membered ring structure where a propylene group or a butylene group is formed by the members above. Incidentally, this 5- or 6-membered ring structure contains an oxygen atom.

Each of the groups represented by $L_1$, $L_2$, M and Q in formula (2) may have a substituent. This substituent includes, for example, an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group. The carbon number of the substituent is preferably 8 or less.

The group represented by -(M-Q) is preferably a group having a carbon number of 1 to 30, more preferably a group having a carbon number of 5 to 20. Above all, from the standpoint of outgassing reduction, a group having a carbon number of 6 or more is preferred.

The acid-decomposable resin may contain, as the repeating unit having an acid-decomposable group, a repeating unit represented by the following formula (X):

[Chem. 116]

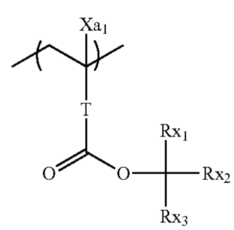

(X)

In formula (X), $Xa_1$ represents a hydrogen atom, a methyl group, a trifluoromethyl group or a hydroxymethyl group.

T represents a single bond or a divalent linking group.

Each of $Rx_1$ to $Rx_3$ independently represents a linear or branched alkyl group or a monocyclic or polycyclic cycloalkyl group. At least two members of $Rx_1$ to $Rx_3$ may combine with each other to form a monocyclic or polycyclic cycloalkyl group.

The divalent linking group as T includes, for example, an alkylene group, a —(COO-Rt)- group and a —(O-Rt)- group, wherein Rt represents an alkylene group or a cycloalkylene group.

T is preferably a single bond or a —(COO-Rt)- group. Rt is preferably an alkylene group having a carbon number of 1 to 5, more preferably a —$CH_2$— group, —$(CH_2)_2$— group or a —$(CH_2)_3$— group.

The alkyl group as $Rx_1$ to $Rx_3$ is preferably an alkyl group having a carbon number of 1 to 4, such as methyl group, ethyl group, n-propyl group, isopropyl group, n-butyl group, isobutyl group and tert-butyl group.

The cycloalkyl group as $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The cycloalkyl group that may be formed by combining two members of $Rx_1$ to $Rx_3$ with each other is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

Among others, an embodiment where $Rx_1$ is a methyl group or an ethyl group and $Rx_2$ and $Rx_3$ are combined with each other to form the above-described cycloalkyl group, is preferred.

Specific examples of the repeating unit having an acid-decomposable group are illustrated below, but the present invention is not limited thereto.

[Chem. 117]

1

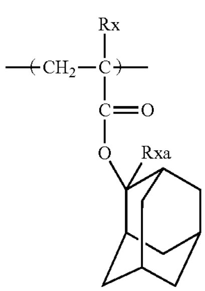

2

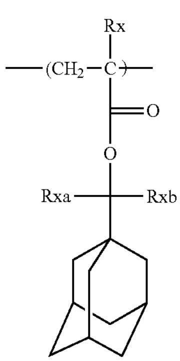

-continued

3

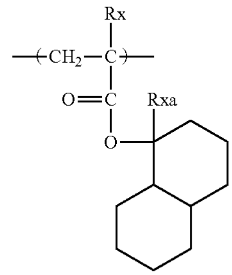

4

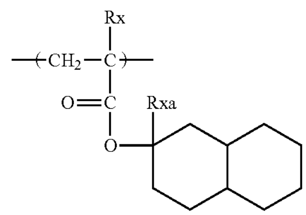

5

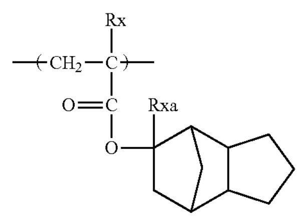

6

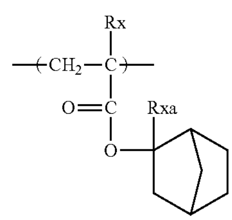

7

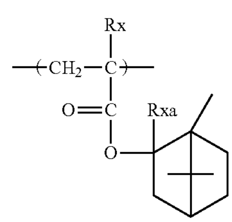

8

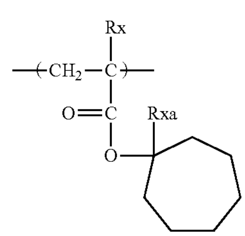

-continued
9
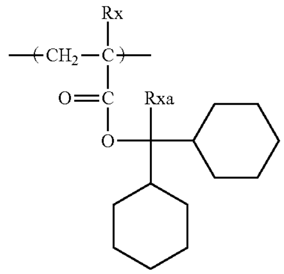
10
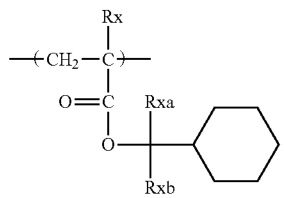
11
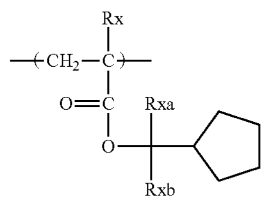
12
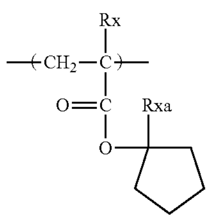
13
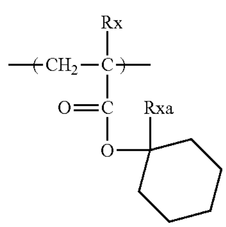
14
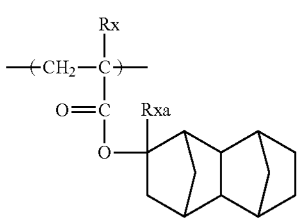
15
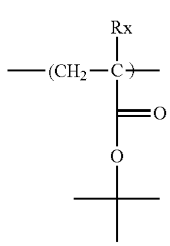
-continued
16
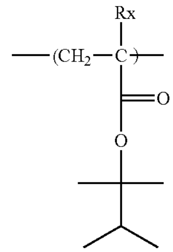
17
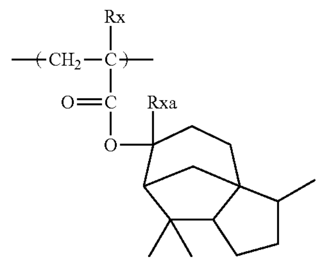
18
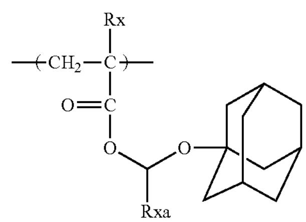
19
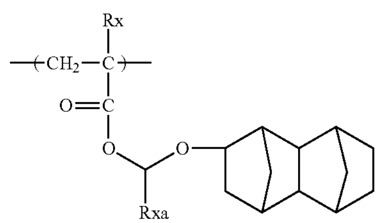
20
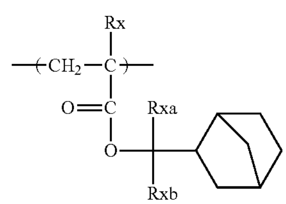
21
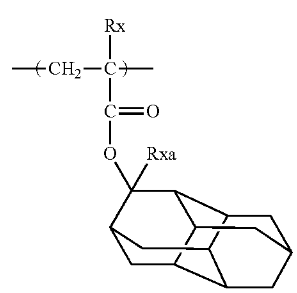

-continued

22

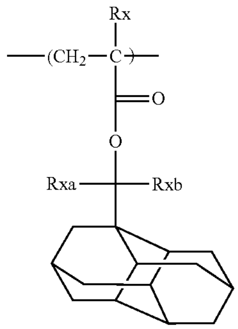

23

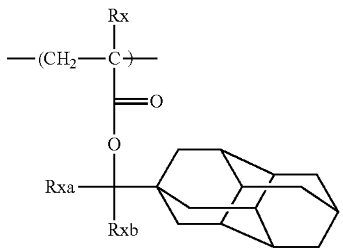

24

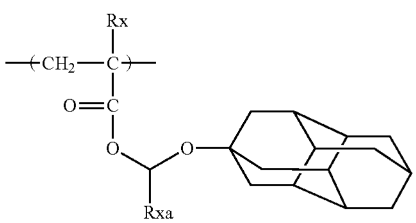

25

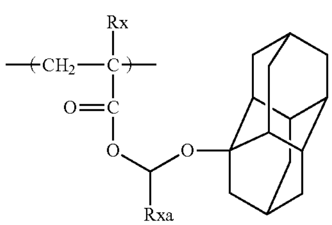

(In the formulae, Rx represents H, $CH_3$, $CF_3$ or $CH_2OH$, and each of Rxa and Rxb represents an alkyl group having a carbon number of 1 to 4.)

The content of the acid-decomposable group-containing repeating unit in the resin is preferably from 3 to 90 mol %, more preferably from 5 to 80 mol %, still more preferably from 7 to 70 mol %, based on all repeating units.

Specific examples of the resin described above are illustrated below, but the present invention is not limited thereto.

[Chem. 118]

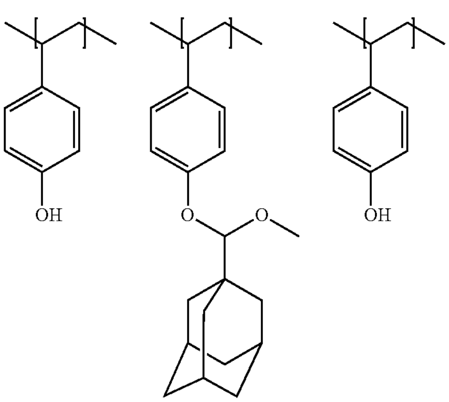

-continued

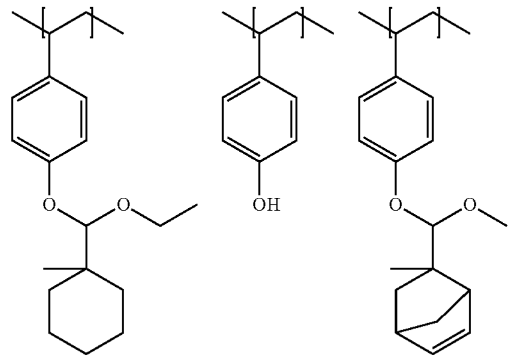

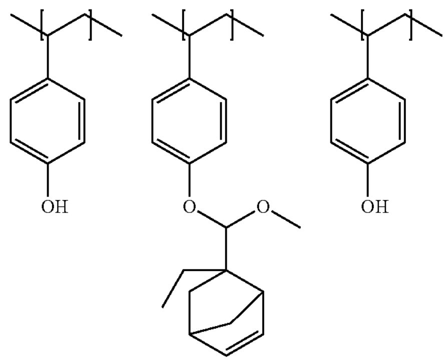

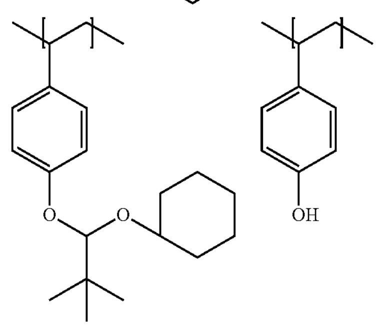

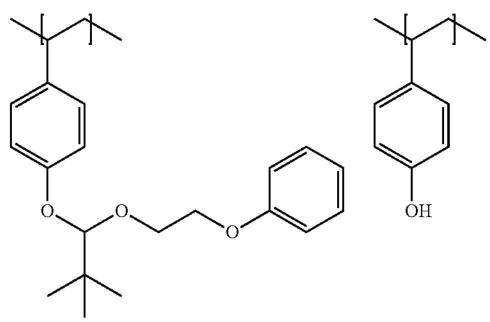

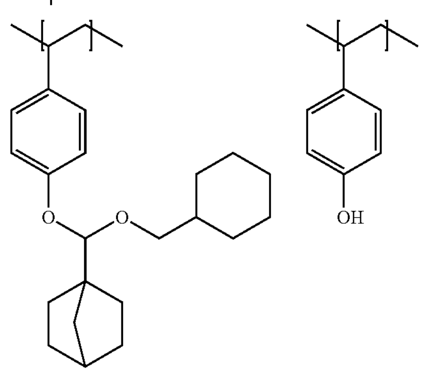

-continued
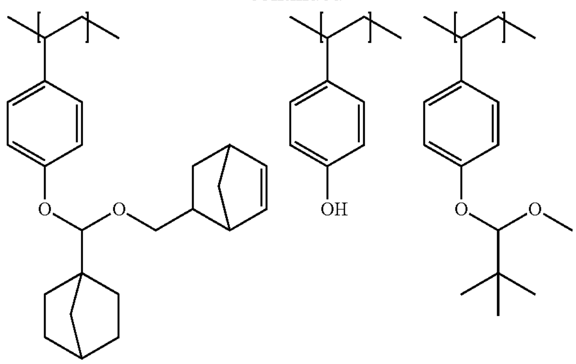
[Chem. 119]
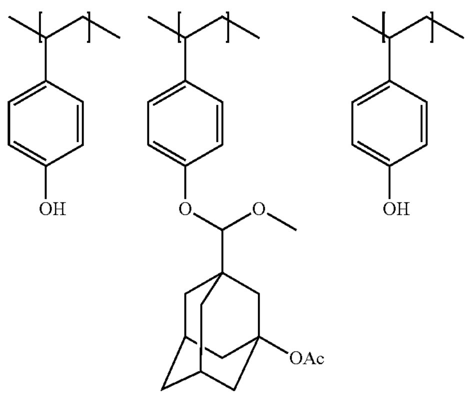
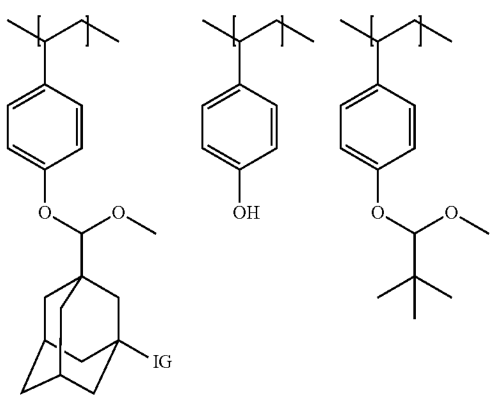
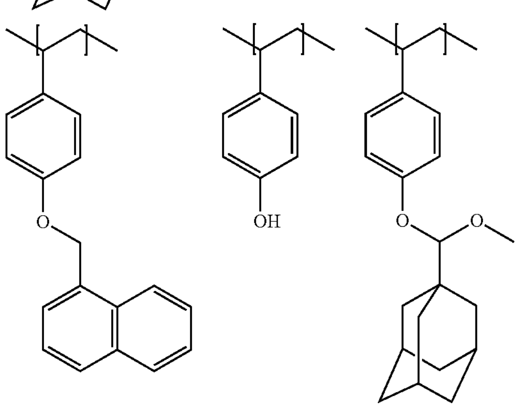
-continued
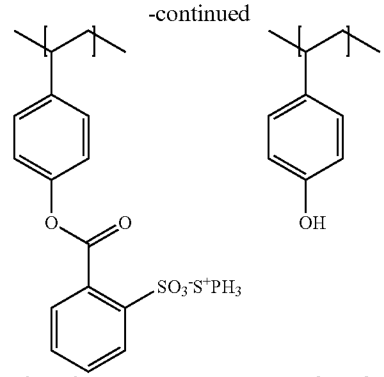
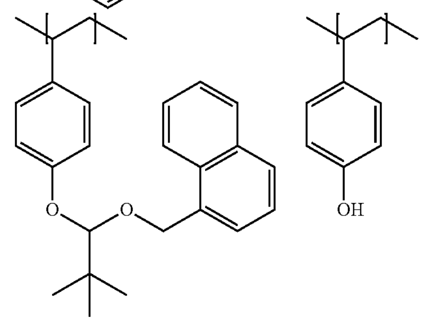
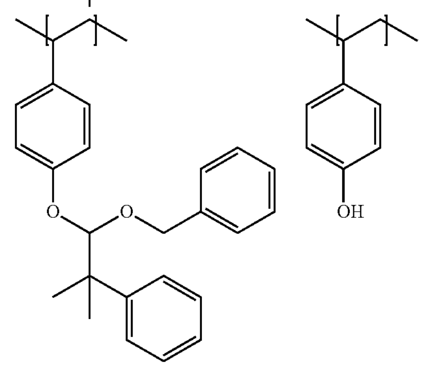
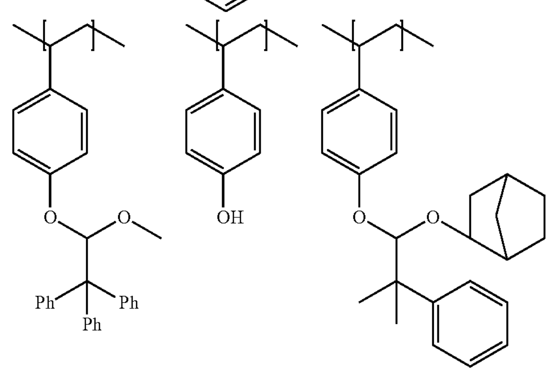
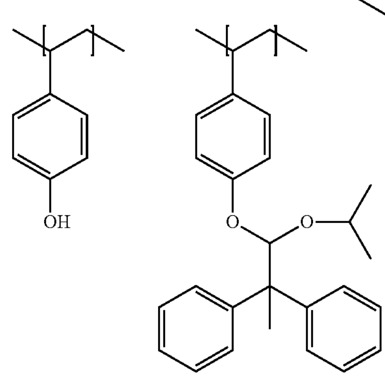

-continued
[Chem. 120]
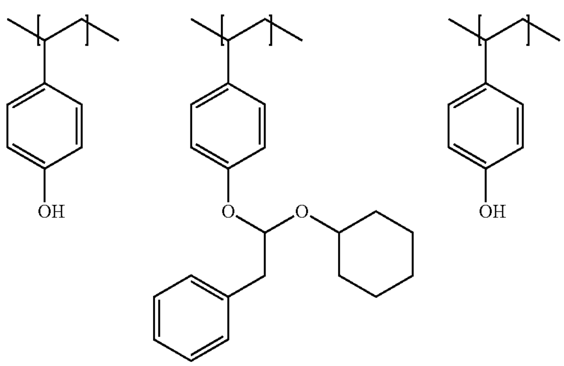
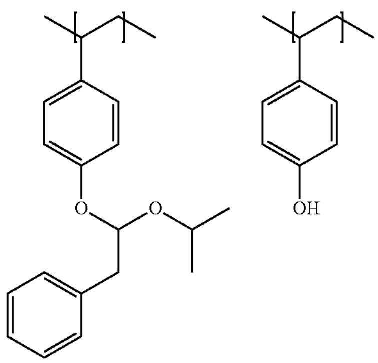
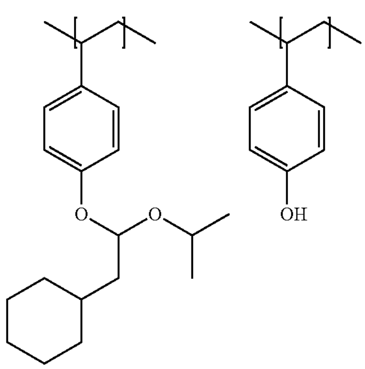
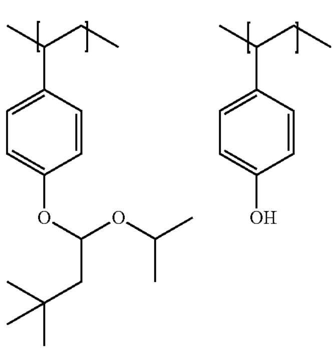
-continued
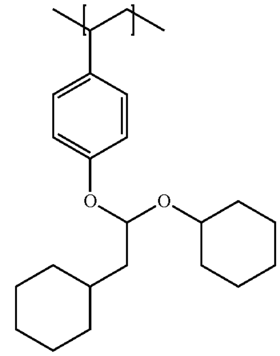
[Chem. 121]
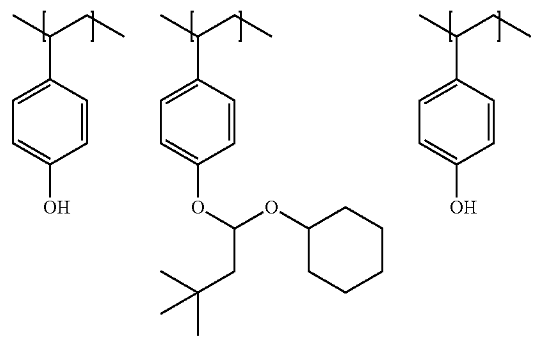
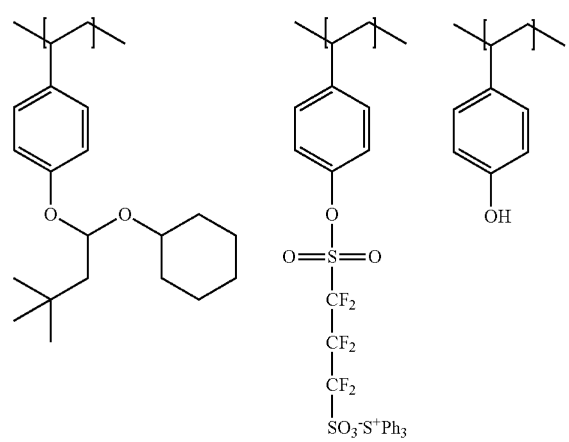
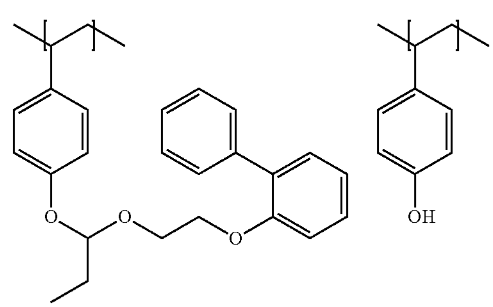

-continued
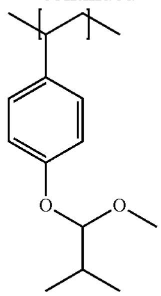
[Chem. 122]
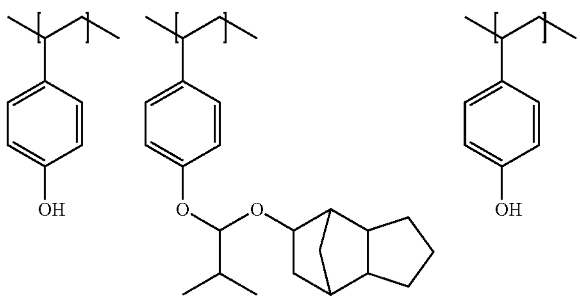
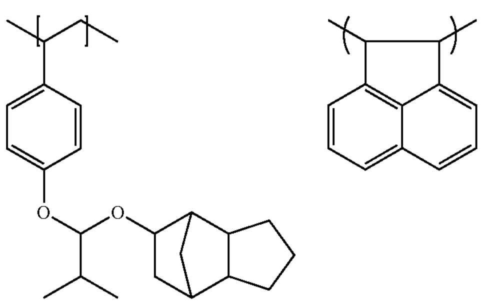
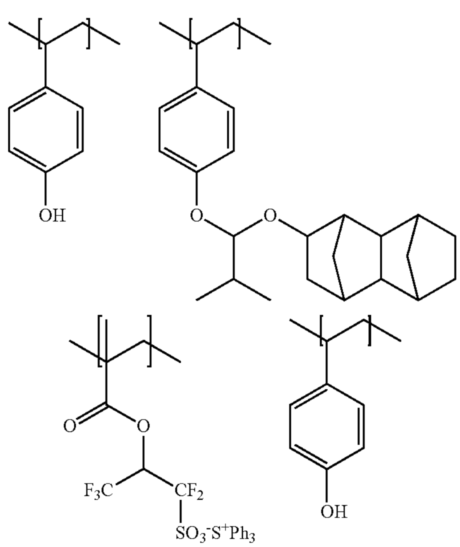
-continued
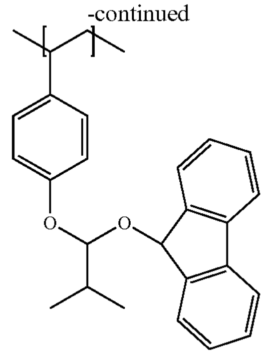
[Chem. 123]
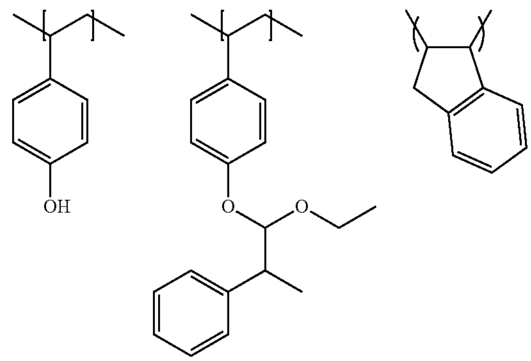
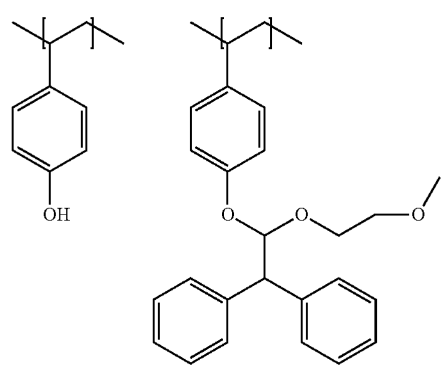
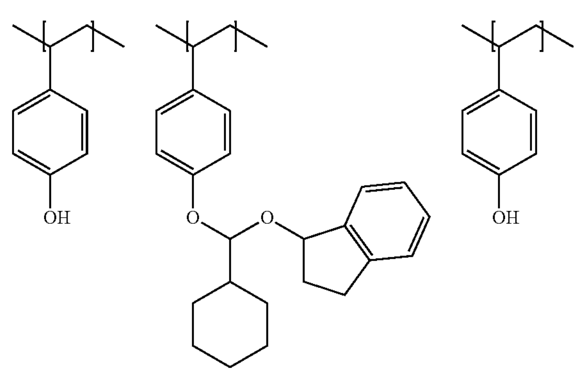

-continued
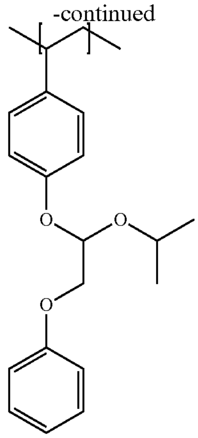
[Chem. 124]
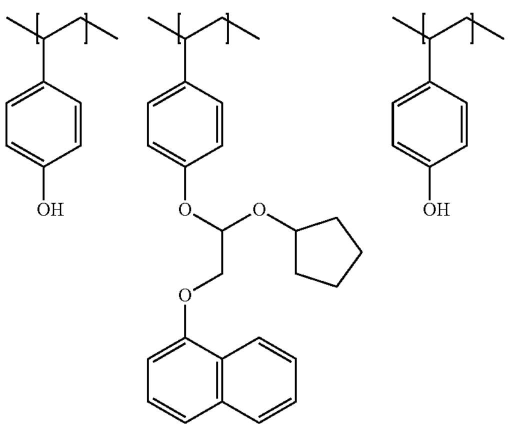
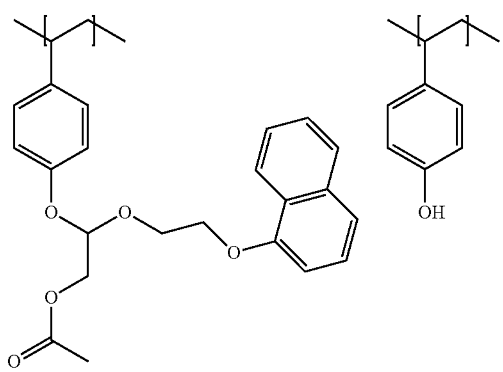
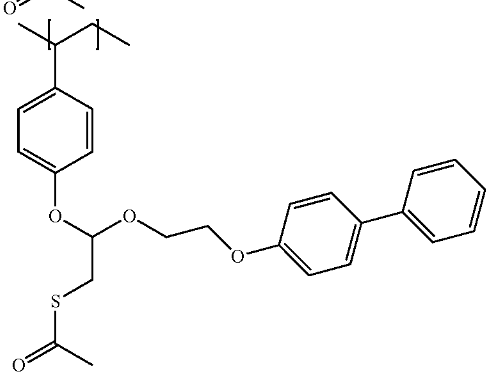
-continued
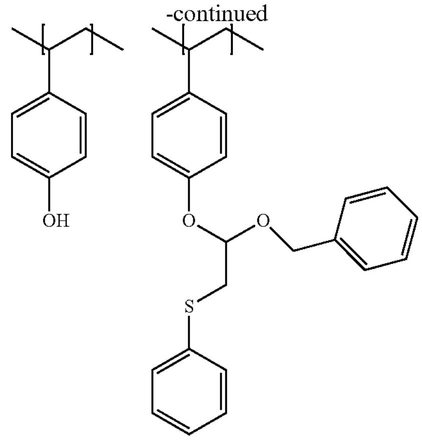
[Chem. 125]
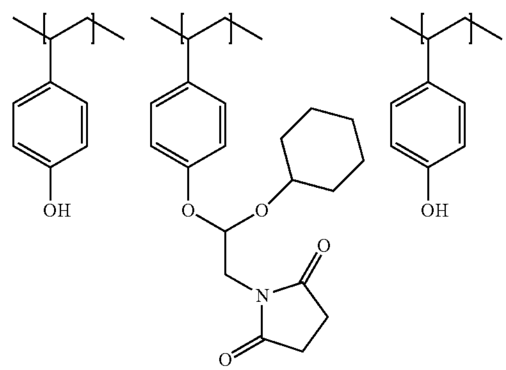
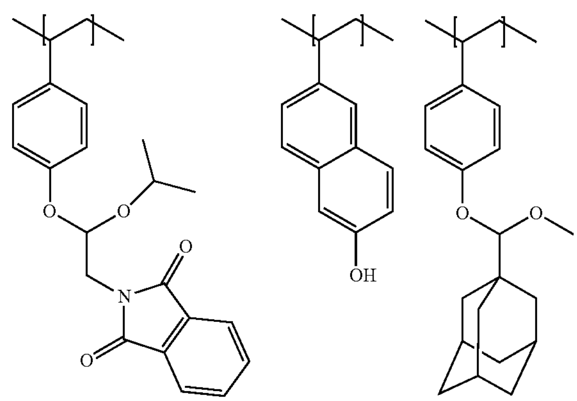
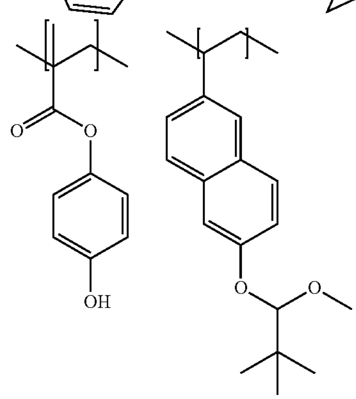

-continued
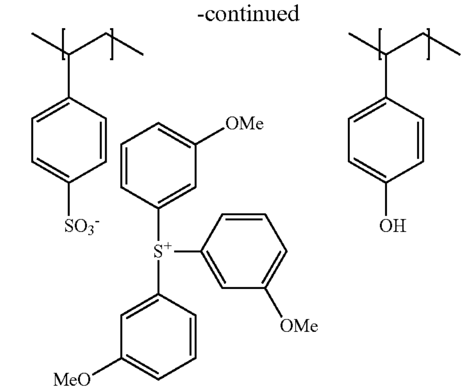
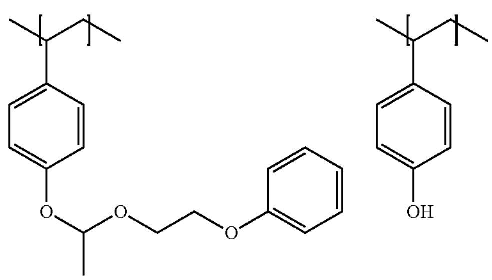
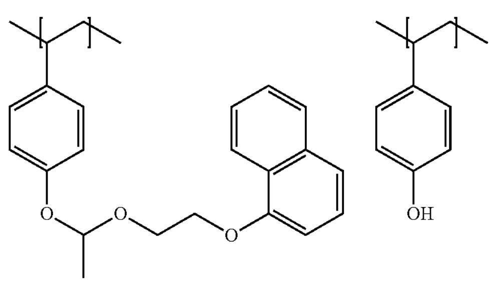
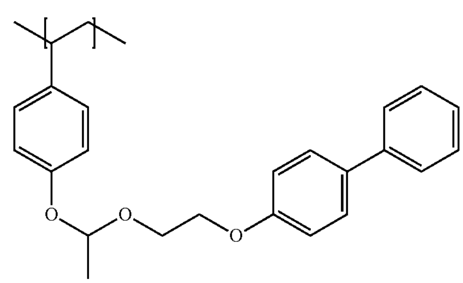
[Chem. 126]
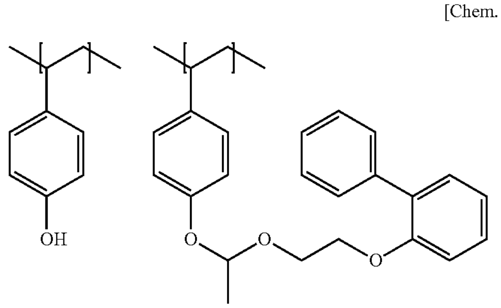
-continued
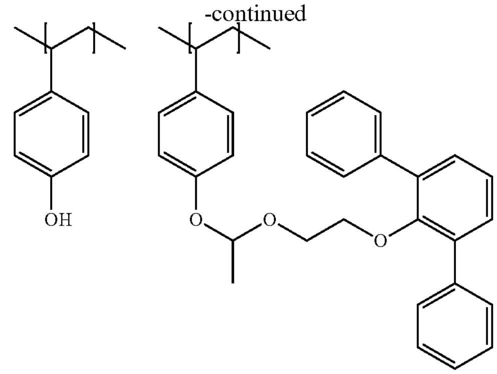
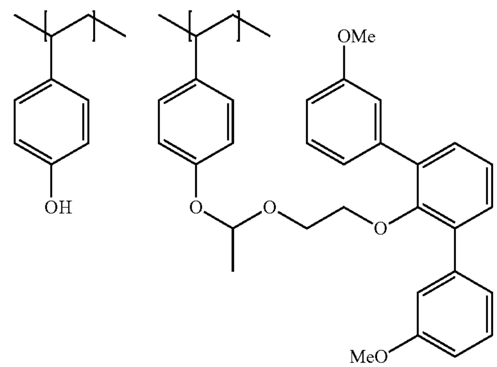
[Chem. 127]
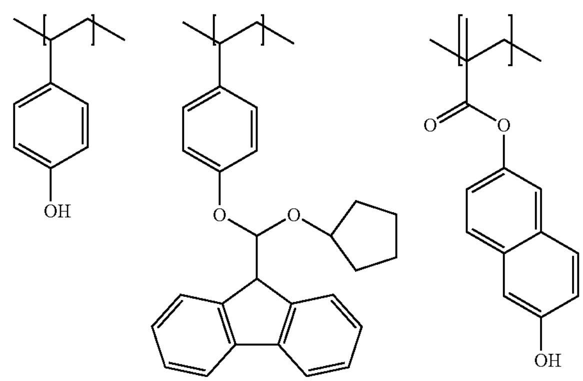
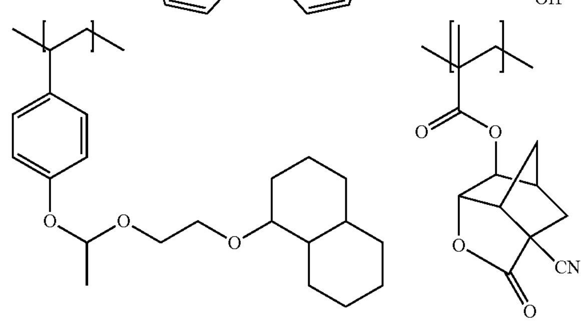
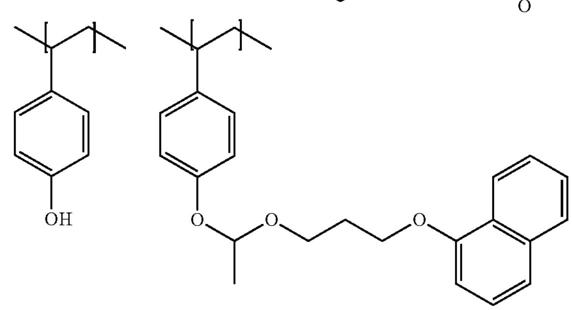

-continued
[Chem. 128]
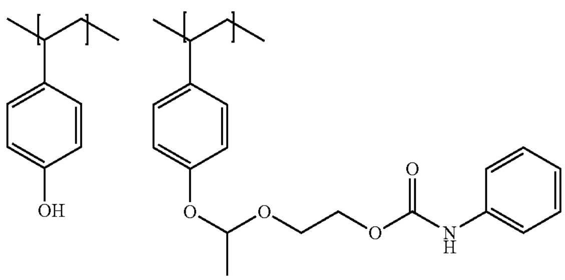
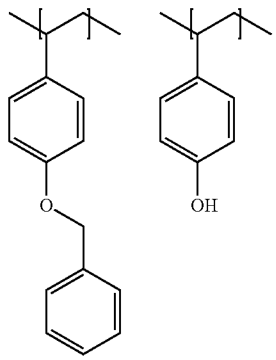
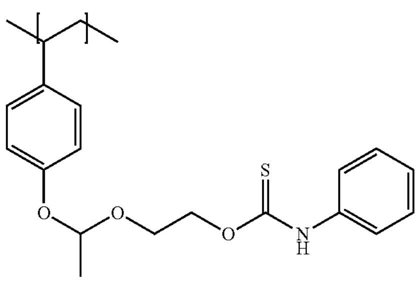
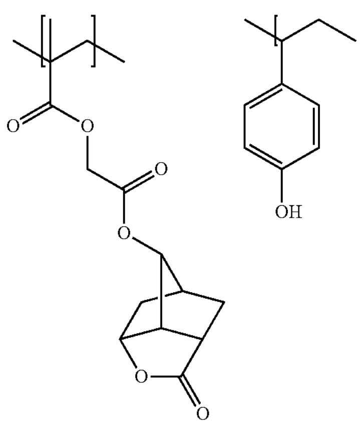
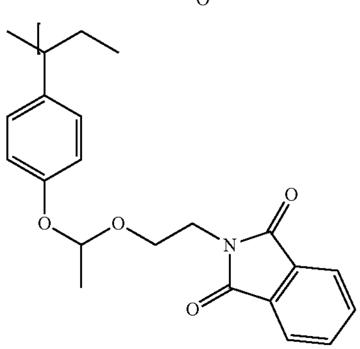
-continued
[Chem. 129]
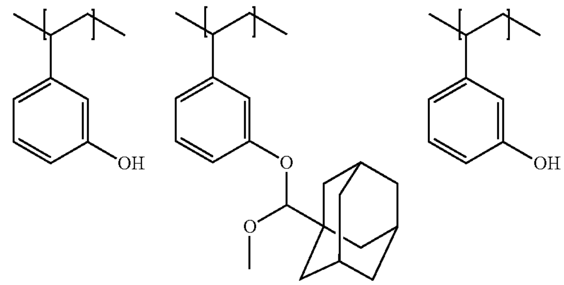
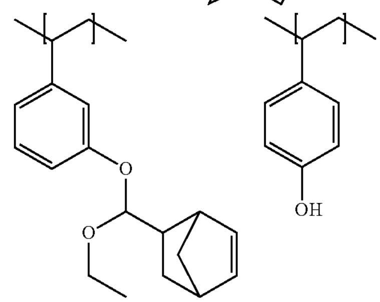
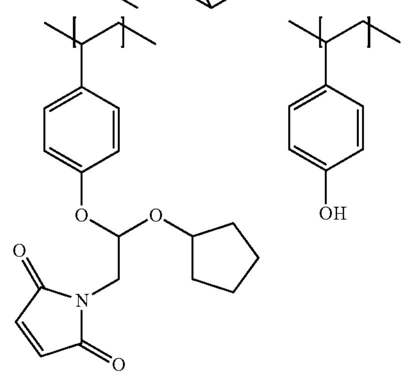
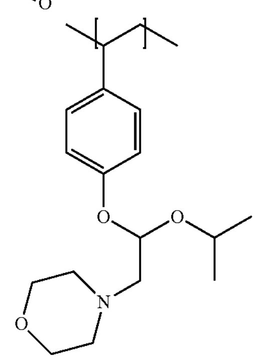
[Chem. 130]
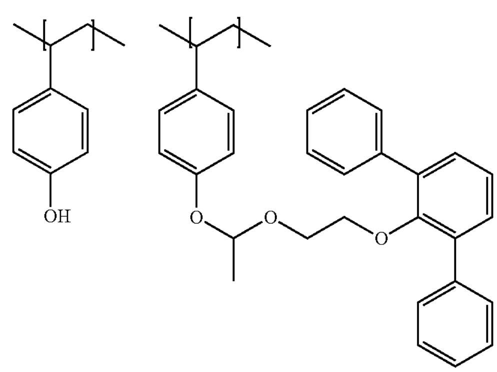

-continued
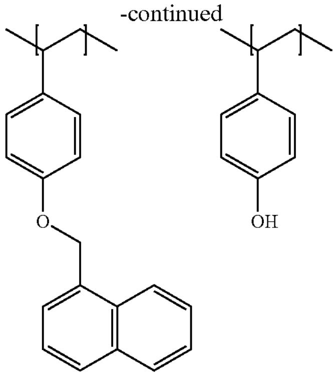
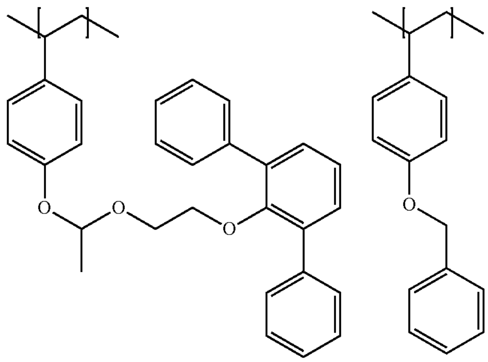
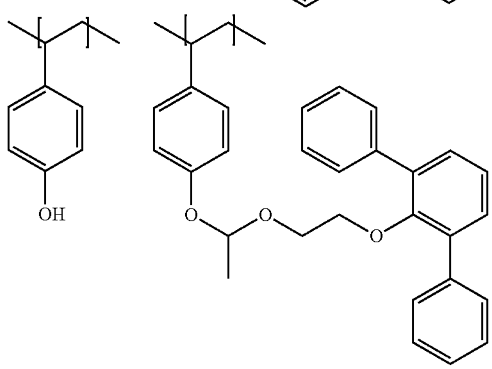
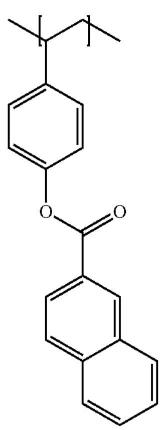
[Chem. 131]
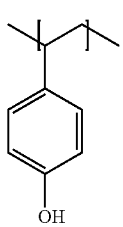
-continued
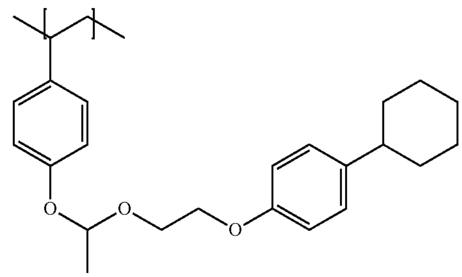
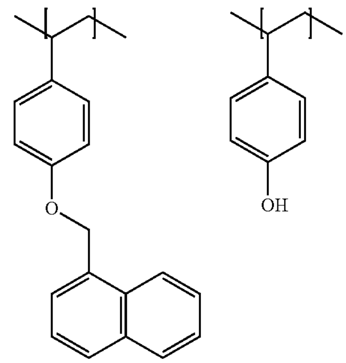
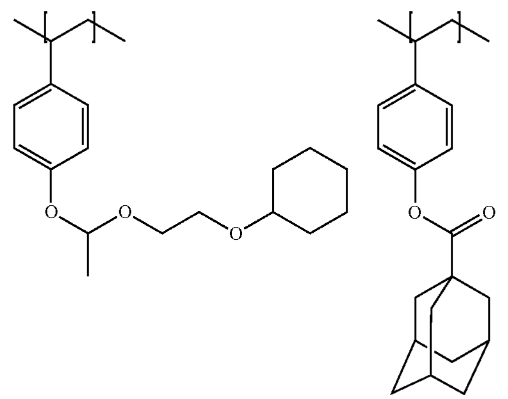
[Chem. 132]
(R-1)
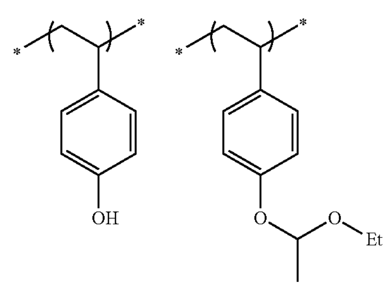
(R-2)
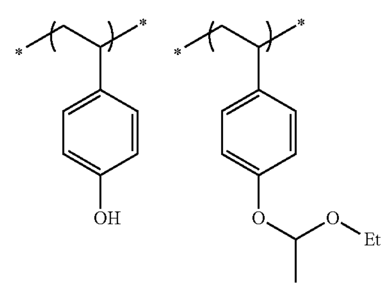

-continued
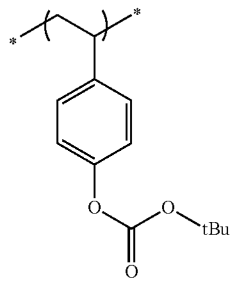
(R-3)
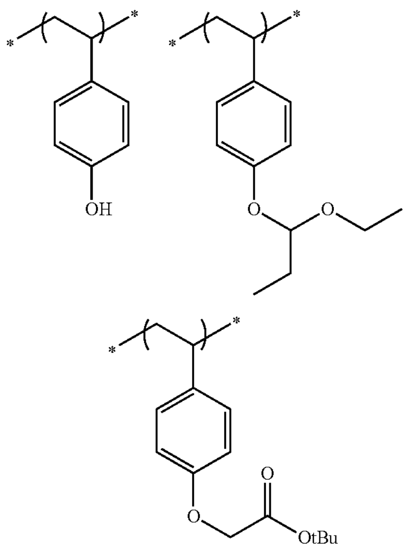
(R-4)
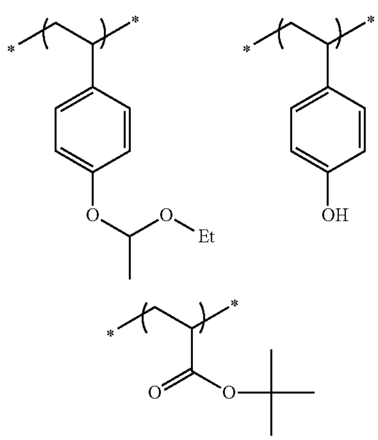
(R-5)
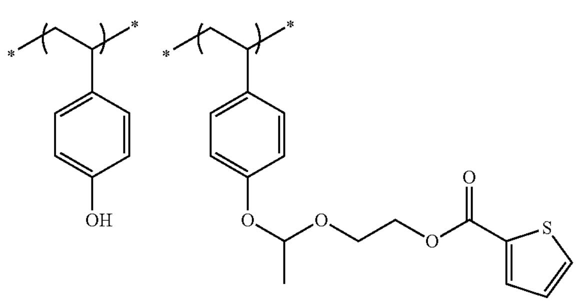
-continued
(R-6)
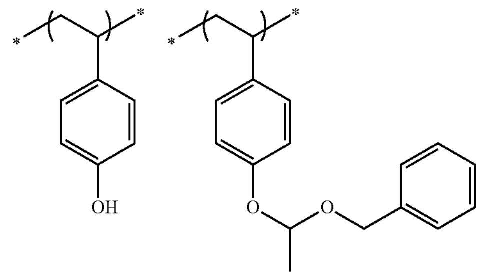
(R-7)
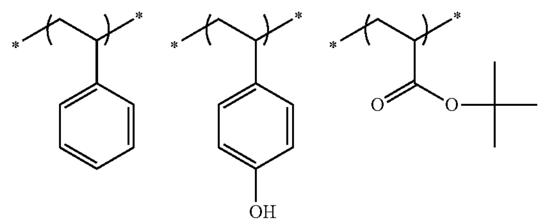
(R-8)
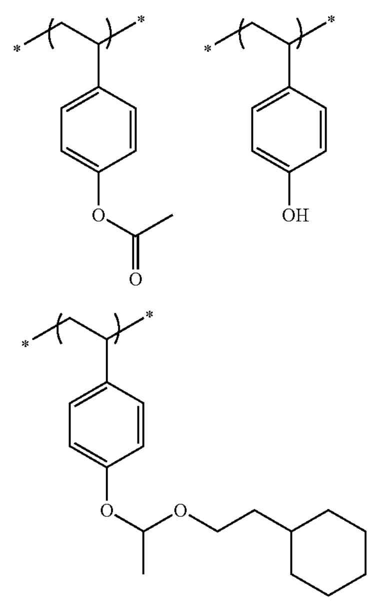
(R-9)
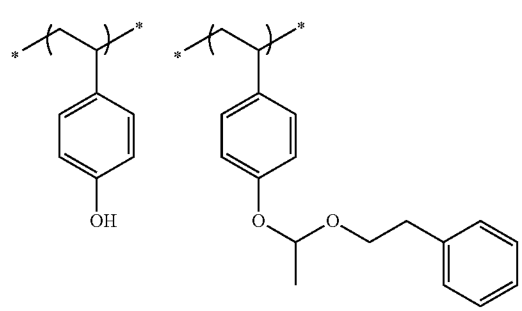

-continued
(R-10)
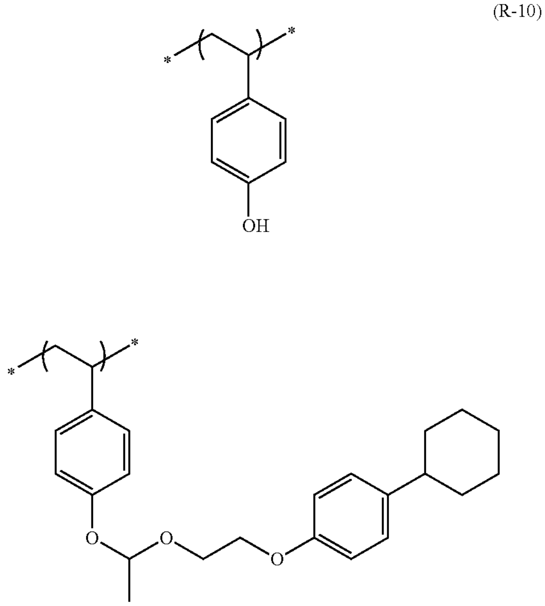
(R-11)
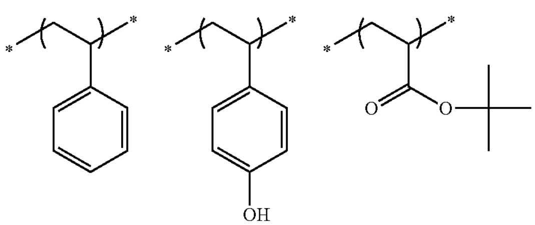
(R-12)
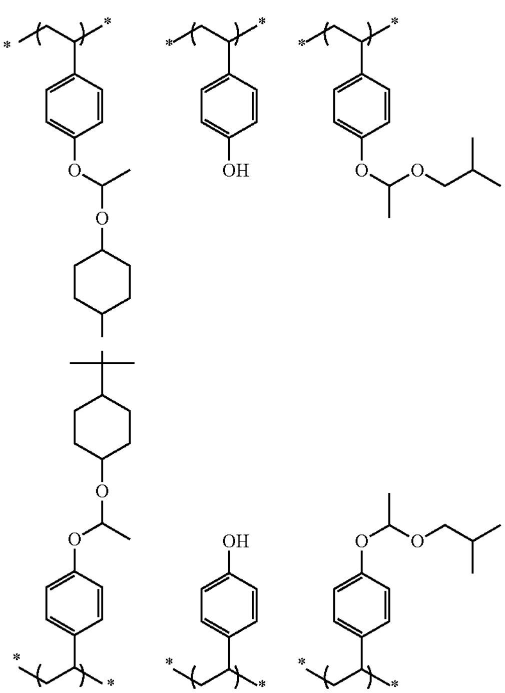
-continued
(R-13)
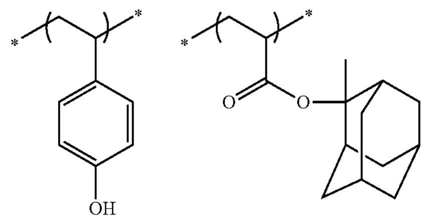
(R-14)
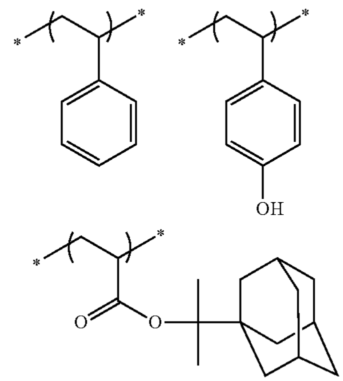
(R-15)
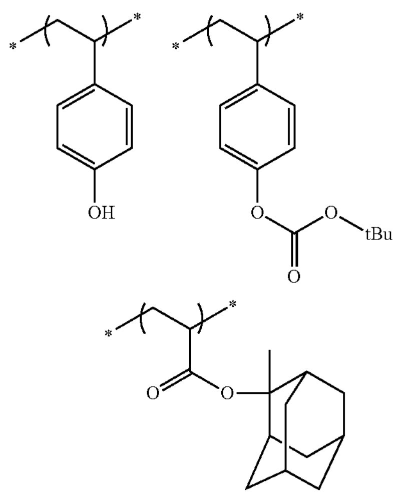
(R-16)
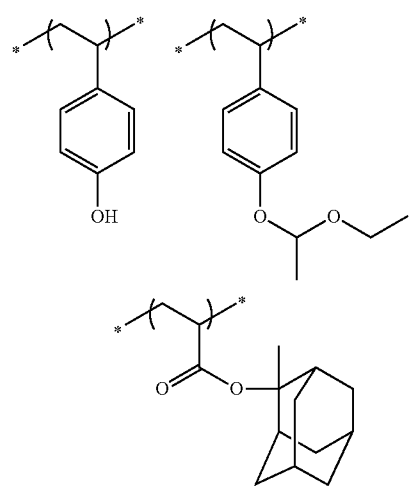

(R-17)
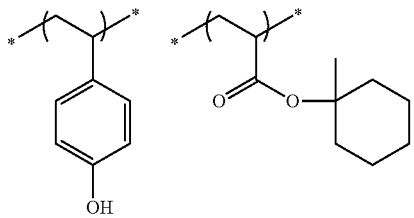
[Chem. 133]
(R-18)
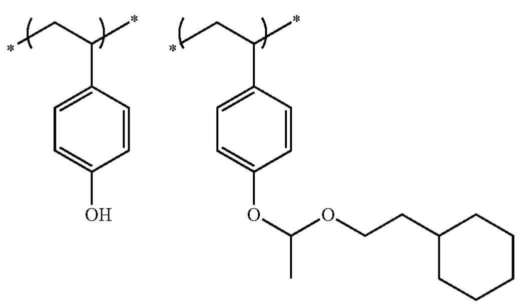
(R-19)
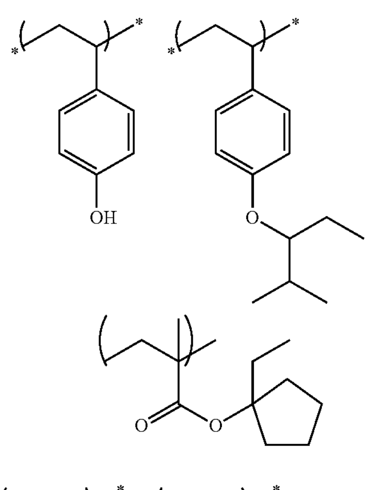
(R-20)
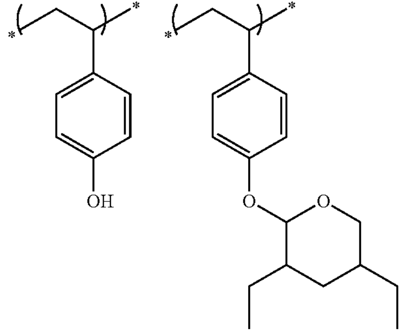
(R-21)
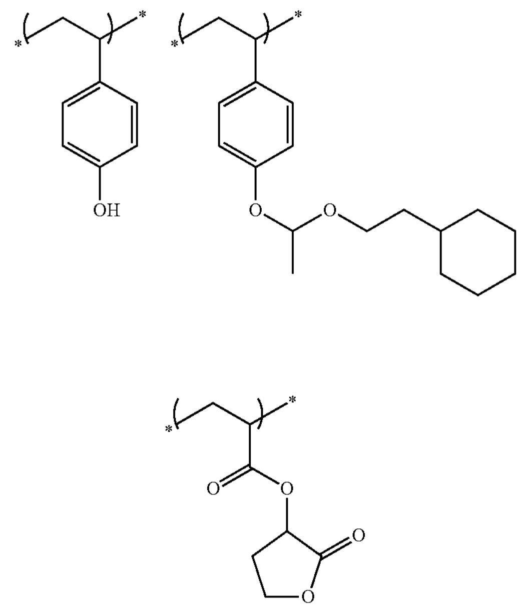
[Chem. 134]
R-22
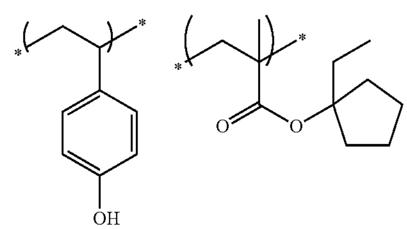
R-23
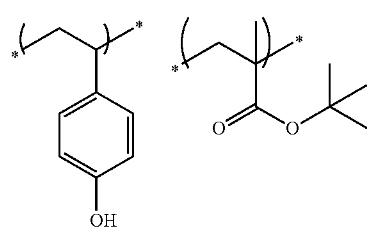
R-24
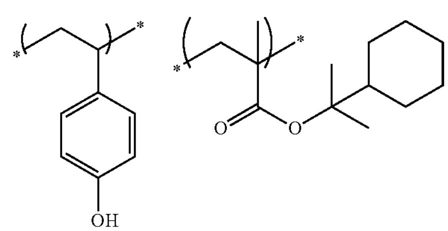
R-25
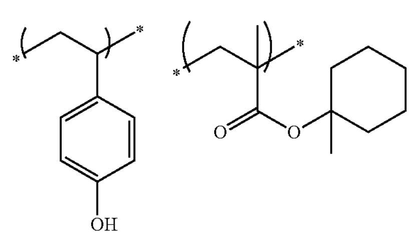

-continued

R-26

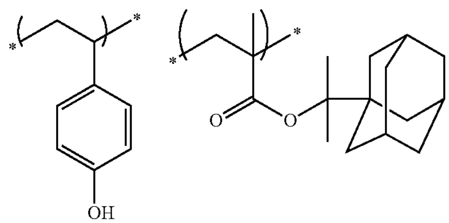

R-27

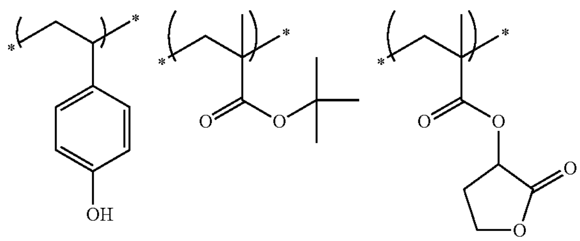

In specific examples above, tBu indicates a tert-butyl group.

The content ratio of the acid-decomposable group is calculated according to the formula B/(B+S) by using the number (B) of acid-decomposable groups in the resin and the number (S) of alkali-soluble groups not protected by a group capable of leaving by an action of acid. The content ratio is preferably from 0.01 to 0.7, more preferably from 0.05 to 0.50, still more preferably from 0.05 to 0.40.

In the case of irradiating the composition of the present invention with ArF excimer laser light, the resin preferably has a monocyclic or polycyclic alicyclic hydrocarbon structure. Hereinafter, such a resin is referred to as “alicyclic hydrocarbon-based acid-decomposable resin”.

The alicyclic hydrocarbon-based acid-decomposable resin is preferably a resin containing at least one repeating unit selected from the group consisting of a repeating unit having an alicyclic hydrocarbon-containing partial structure represented by any one of the following formulae (pI) to (pV) and a repeating unit represented by the following formula (II-AB):

[Chem. 135]

(pI)

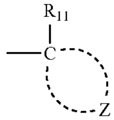

(pII)

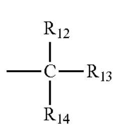

(pIII)

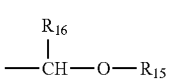

-continued (pIV)

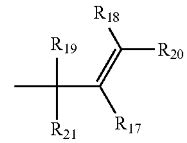

(pV)

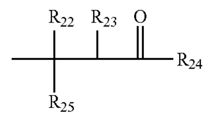

In formulae (pI) to (pV), $R_{11}$ represents a methyl group, an ethyl group, an n-propyl group, an isopropyl group, an n-butyl group, an isobutyl group or a sec-butyl group. Z represents an atomic group necessary for forming a cycloalkyl group together with the carbon atom.

Each of $R_{12}$ to $R_{16}$ independently represents a linear or branched alkyl group having a carbon number of 1 to 4 or a cycloalkyl group, provided that at least one of $R_{12}$ to $R_{14}$ represents a cycloalkyl group and that either $R_{15}$ or $R_{16}$ represents a cycloalkyl group.

Each of $R_{17}$ to $R_{21}$ independently represents a hydrogen atom, a linear or branched alkyl group having a carbon number of 1 to 4, or a cycloalkyl group, provided that at least one of $R_{17}$ to $R_{21}$ represents a cycloalkyl group and that either $R_{19}$ or $R_{21}$ represents a linear or branched alkyl group having a carbon number of 1 to 4 or a cycloalkyl group.

Each of $R_{22}$ to $R_{25}$ independently represents a hydrogen atom, a linear or branched alkyl group having a carbon number of 1 to 4, or a cycloalkyl group, provided that at least one of $R_{22}$ to $R_{25}$ represents a cycloalkyl group. $R_{23}$ and $R_{24}$ may combine with each other to form a ring structure.

In formulae (pI) to (pV), the alkyl group in $R_{12}$ to $R_{25}$ is preferably a linear or branched alkyl group having a carbon number of 1 to 4, and examples thereof include a methyl group, an ethyl group, a propyl group, an n-butyl group, a sec-butyl group, and a tert-butyl group.

The cycloalkyl group in $R_{12}$ to $R_{25}$ or the cycloalkyl group formed by Z together with the carbon atom may be a monocyclic cycloalkyl group or a polycyclic cycloalkyl group and specifically includes a group having a monocyclo, bicyclo, tricyclo or tetracyclo structure and having a carbon number of 5 or more. The carbon number thereof is preferably from 6 to 30, more preferably from 7 to 25.

Preferred cycloalkyl groups include, for example, an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group, and a cyclododecanyl group. An adamantyl group, a norbornyl group, a cyclohexyl group, a cyclopentyl group, a tetracyclododecanyl group, and a tricyclodecanyl group are more preferred.

These alkyl group and cycloalkyl group may have a substituent. This substituent includes, for example, an alkyl group (having a carbon number of 1 to 4), a halogen atom, a hydroxyl group, an alkoxy group (having a carbon number of 1 to 4), a carboxyl group, and an alkoxycarbonyl group (having a carbon number of 2 to 6). These substituents may have a further substituent. The further substituent includes, for example, a hydroxyl group, a halogen atom, and an alkoxy group.

The structure represented by any one of formulae (pI) to (pV) may be used for the protection of an alkali-soluble group. The alkali-soluble group includes various groups known in this technical field.

Specific examples thereof include a structure where the hydrogen atom of a carboxylic acid group, sulfonic acid group, phenol group or thiol group is replaced by a structure represented by any one of formulae (pI) to (pV). A structure where the hydrogen atom of a carboxylic acid group or sulfonic acid group is replaced by a structure represented by any one of formulae (pI) to (pV) is preferred.

The repeating unit having an alkali-soluble group protected by a structure represented by any one of formulae (pI) to (pV) is preferably a repeating unit represented by the following formula (pA):

[Chem. 136]

(pA)

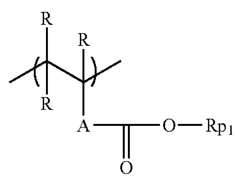

In formula (pA), R represents a hydrogen atom, a halogen atom or a linear or branched alkyl group having a carbon number of 1 to 4, and each R may be the same as or different from every other R.

A is selected from the group consisting of a single bond, an alkylene group, an ether group, a thioether group, a carbonyl group, an ester group, an amido group, a sulfonamido group, a urethane group, a urea group, and a combination of two or more thereof, and is preferably a single bond.

$Rp_1$ is a group represented by any one of formulae (pI) to (pV).

The repeating unit represented by formula (pA) is most preferably a repeating unit composed of a 2-alkyl-2-adamantyl (meth)acrylate or a dialkyl(1-adamantyl)methyl (meth) acrylate.

Specific examples of the repeating unit represented by formula (pA) are illustrated below.

[Chem. 137]

1

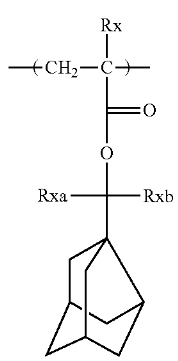

-continued

2

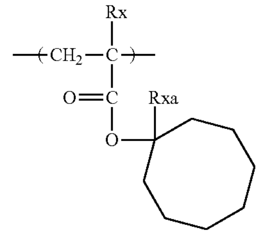

3

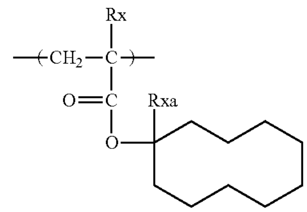

In the structural formulae above, Rx represents H, $CH_3$, $CF_3$ or $CH_2OH$, and each of Rxa and Rxb independently represents an alkyl group having a carbon number of 1 to 4.

[Chem. 138]

(II-AB)

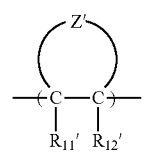

In formula (II-AB), each of $R_{11}$' and $R_{12}$' independently represents a hydrogen atom, a cyano group, a halogen atom or an alkyl group.

Z' represents an atomic group necessary for forming an alicyclic structure together with two carbon atoms (C—C) bonded thereto.

Formula (II-AB) is preferably the following formula (II-AB1) or (II-AB2):

[Chem. 139]

(II-AB1)

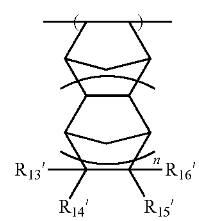

(II-AB2)

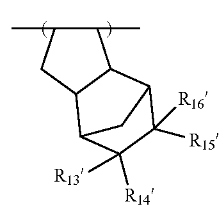

In formulae (II-AB1) and (II-AB2), each of $R_{13}$' to $R_{16}$' independently represents a hydrogen atom, a halogen atom, a cyano group, a hydroxyl group, —COOH, —$COOR_5$, a group capable of decomposing by an action of acid, —C(═O)—X-A'—$R_{17}'$, an alkyl group or a cycloalkyl group. Here, $R_5$ represents an alkyl group, a cycloalkyl group or a group having a lactone structure. X represents an oxygen atom, a sulfur atom, —NH—, —$NHSO_2$— or —$NHSO_2NH$—. A' represents a single bond or a divalent linking group. $R_{17}'$ represents —COOH, —$COOR_5$, —CN, a hydroxyl group, an alkoxy group, —CO—NH—$R_6$, —CO—NH—$SO_2$—$R_6$ or a group having a lactone structure, wherein $R_6$ represents an alkyl group or a cycloalkyl group. At least two members of $R_{13}'$ to $R_{16}'$ may combine with each other to form a ring structure.

n represents 0 or 1.

The halogen atom as $R_{11}'$ or $R_{12}'$ in formula (II-AB) is, for example, a chlorine atom, a bromine atom, a fluorine atom or an iodine atom.

The alkyl group as $R_{11}'$ or $R_{12}'$ is preferably a linear or branched alkyl group having a carbon number of 1 to 10, and examples thereof include a methyl group, an ethyl group, an n-propyl group, an isopropyl group, and a linear or branched butyl, pentyl, hexyl or heptyl group.

The atomic group represented by Z' is an atomic group for forming, in the resin, a repeating unit of an alicyclic hydrocarbon that may have a substituent. This atomic group is preferably an atomic group for forming a crosslinked alicyclic hydrocarbon repeating unit.

Examples of the framework of the alicyclic hydrocarbon formed are the same as those of the cycloalkyl group of $R_{12}$ to $R_{25}$ in formulae (pI) to (pVI).

The framework of the alicyclic hydrocarbon may have a substituent, and the substituent includes, for example, $R_{13}'$ to $R_{16}'$ in formulae (II-AB1) and (II-AB2).

In the alicyclic hydrocarbon-based acid-decomposable resin, the group capable of decomposing by an action of acid may be contained in at least one repeating unit out of a repeating unit having an alicyclic hydrocarbon-containing partial structure represented by formulae (pI) to (pV), a repeating unit represented by formula (II-AB), and a repeating unit of the later-described copolymerization component.

Each of the substituents $R_{13}'$ to $R_{16}'$ in formulae (II-AB1) and (II-AB2) may work out to a substituent of the atomic group Z' for forming an alicyclic structure or a crosslinked alicyclic structure in formula (II-AB).

Specific examples of the repeating units represented by formulae (II-AB1) and (II-AB2) are illustrated below, but the present invention is not limited to these examples.

[Chem. 140]

[II-1]

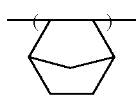

[II-2]

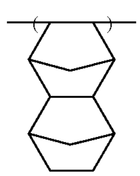

-continued

[II-3]

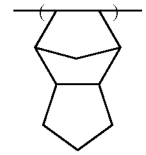

[II-4]

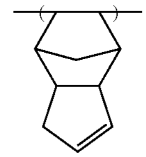

[II-5]

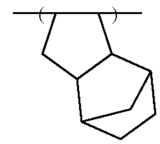

[II-6]

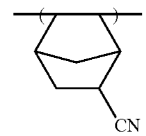

[II-7]

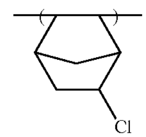

[II-8]

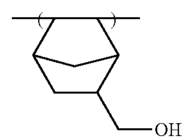

[II-9]

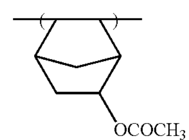

[II-10]

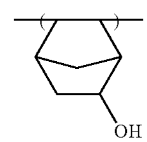

[II-11]

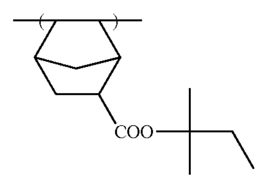

[II-12]

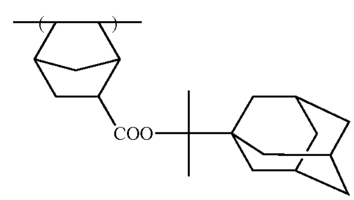

-continued
[II-13]
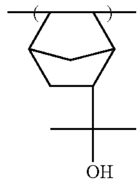
[II-14]
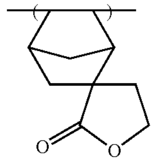
[II-15]
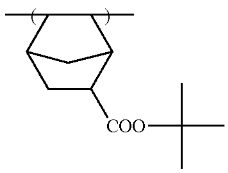
[II-16]
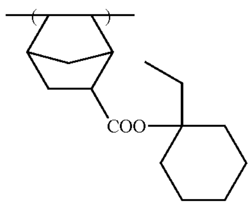
[II-17]
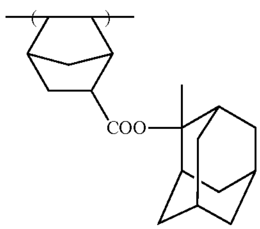
[II-18]
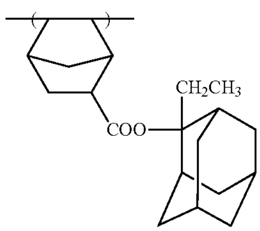
[II-19]
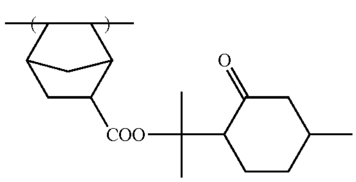
[II-20]
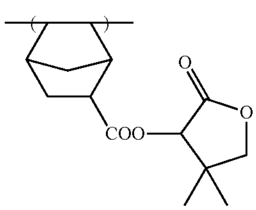
-continued
[II-21]
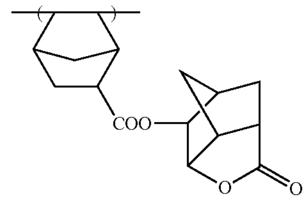
[II-22]
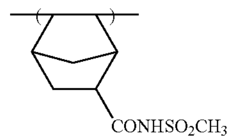
[II-23]
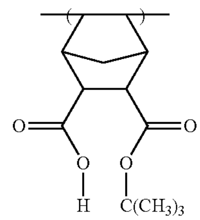
[II-24]
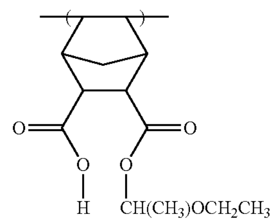
[II-25]
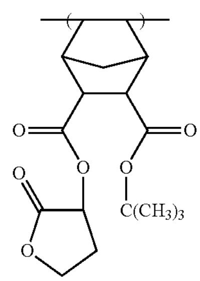
[II-26]
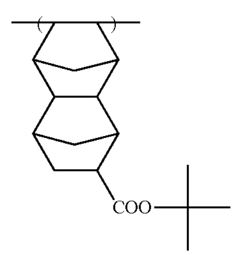
[II-27]
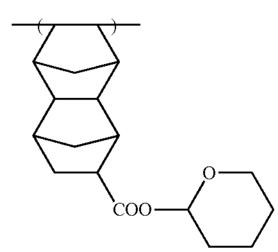

-continued

[II-28]

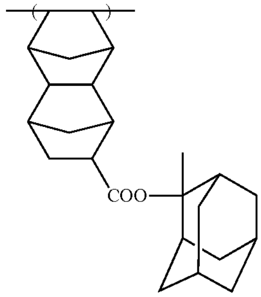

[II-29]

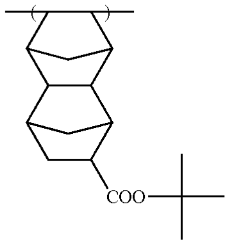

[II-30]

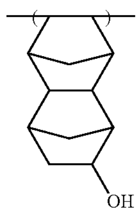

[II-31]

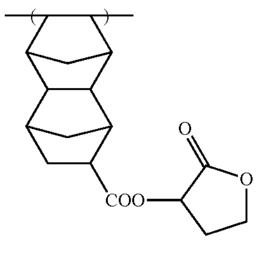

[II-32]

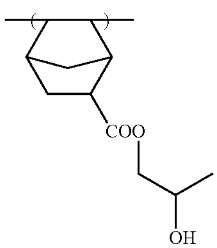

The acid-decomposable resin preferably contains a repeating unit having a lactone group. The lactone group is preferably a group having a 5- to 7-membered ring lactone structure, more preferably a 5- to 7-membered ring lactone structure to which another ring structure is fused in the form of forming a bicyclo or Spiro structure.

This acid-decomposable resin more preferably contains a repeating unit having a group containing a lactone structure represented by any one of the following formulae (LC1-1) to (LC1-17). The group having a lactone structure may be bonded directly to the main chain. Preferred lactone structures include (LC1-1), (LC1-4), (LC1-5), (LC1-6), (LC1-13), (LC1-14) and (LC1-17). By virtue of using a specific lactone structure, the line edge roughness and development defect can be more reduced.

[Chem. 141]

LC1-1

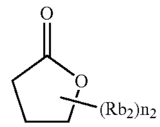

LC1-2

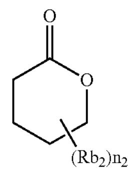

LC1-3

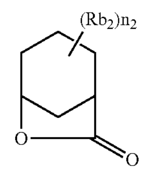

LC1-4

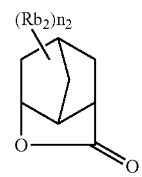

LC1-5

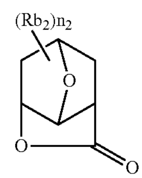

LC1-6

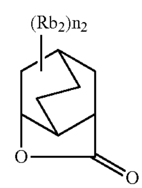

LC1-7

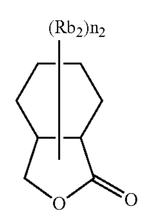

LC1-8

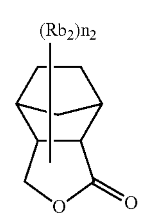

-continued

LC1-9

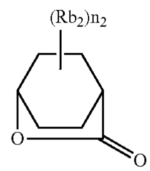

LC1-10

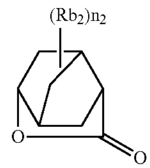

LC1-11

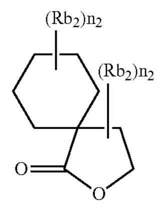

LC1-12

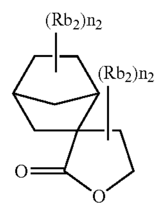

LC1-13

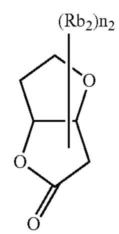

LC1-14

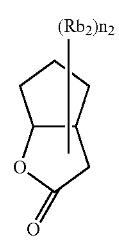

LC1-15

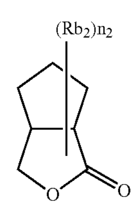

LC1-16

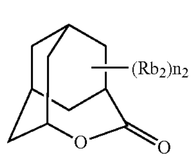

-continued

LC1-17

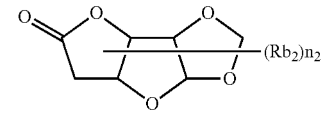

The lactone structure moiety may or may not have a substituent ($Rb_2$). Preferable substituents ($Rb_2$) include, for example, an alkyl group having a carbon number of 1 to 8, a cycloalkyl group having a carbon number of 3 to 7, an alkoxy group having a carbon number of 1 to 8, an alkoxycarbonyl group having a carbon number of 1 to 8, a carboxyl group, a halogen atom, a hydroxyl group, a cyano group, and an acid-decomposable group.

$n_2$ represents an integer of 0 to 4. When $n_2$ is an integer of 2 or more, each $Rb_2$ may be the same as or different from every other $Rb_2$. Also, in this case, the plurality of $Rb_2$ may combine with each other to form a ring structure.

The repeating unit having a group containing a lactone structure represented by any one of formulae (LC1-1) to (LC1-17) includes, for example, a repeating unit where at least one of $R_{13}'$ to $R_{16}'$ in formula (II-AB1) or (II-AB2) has a group represented by formulae (LC1-1) to (LC1-17), and a repeating unit represented by the following formula (AI). Examples of the former include a structure where $R_5$ of —$COOR_5$ is a group represented by formulae (LC1-1) to (LC1-17).

[Chem. 142]

(AI)

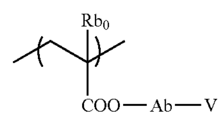

In formula (AI), $Rb_0$ represents a hydrogen atom, a halogen atom or an alkyl group having a carbon number of 1 to 4.

The alkyl group as $Rb_0$ includes, for example, a methyl group, an ethyl group, a propyl group, an n-butyl group, a sec-butyl group, and a tert-butyl group. This alkyl group may have a substituent. The substituent includes, for example, a hydroxyl group and a halogen atom.

The halogen atom of $Rb_0$ includes a fluorine atom, a chlorine atom, a bromine atom, and an iodine atom.

$Rb_0$ is preferably a hydrogen atom or a methyl group.

Ab represents an alkylene group, a divalent linking group having a monocyclic or polycyclic alicyclic hydrocarbon structure, a single bond, an ether group, an ester group, a carbonyl group, a carboxyl group, or a combination thereof. Ab is preferably a single bond or a linking group represented by -$Ab_1$-$CO_2$—.

$Ab_1$ is a linear or branched alkylene group or a monocyclic or polycyclic cycloalkylene group, preferably a methylene group, an ethylene group, a cyclohexylene group, an adamantylene group or a norbornylene group.

V represents a group represented by any one of formulae (LC1-1) to (LC1-17).

The repeating unit having a lactone structure usually has an optical isomer, and any optical isomer may be used. One optical isomer may be used alone, or a plurality of optical isomers may be mixed and used. In the case of mainly using one optical isomer, the optical purity thereof is preferably 90% ee or more, more preferably 95% ee or more.

Particularly preferred repeating units having a lactone group include the following repeating units. By selecting an optimal lactone group, the pattern profile and the iso/dense bias are improved. In the formulae, each of Rx and R represents H, $CH_3$, $CH_2OH$ or $CF_3$.
[Chem. 143]
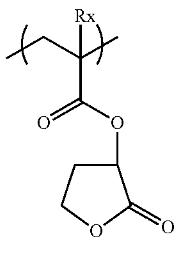
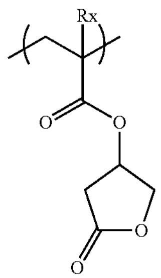
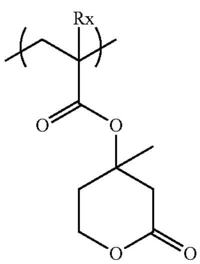
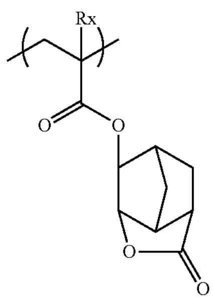
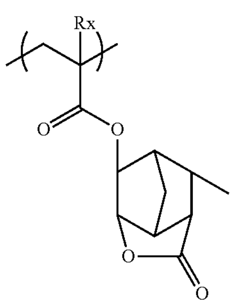
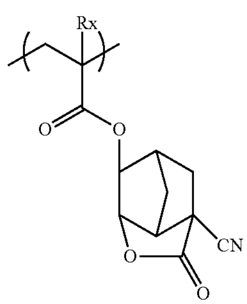
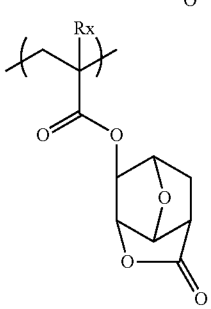
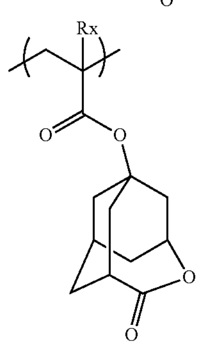
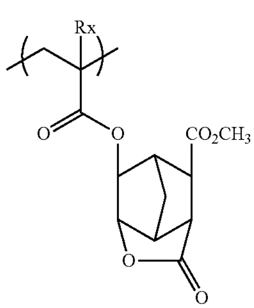
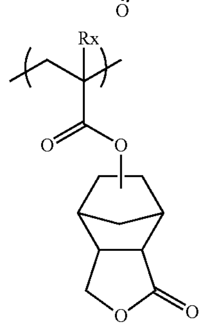
-continued
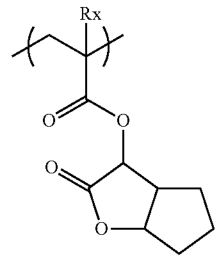
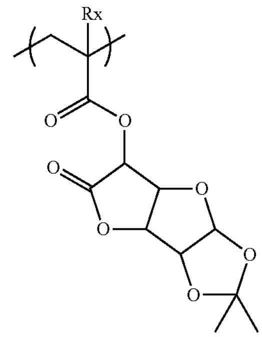
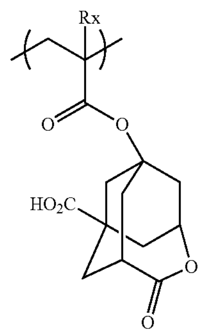
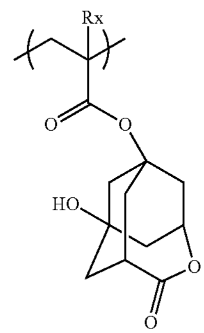
[Chem. 144]
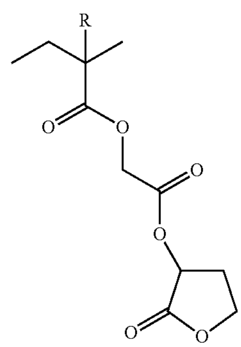
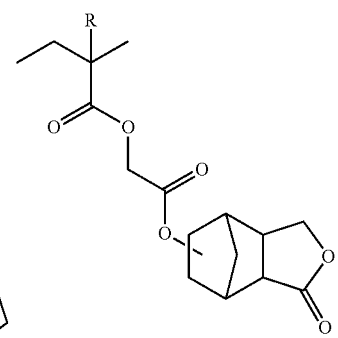
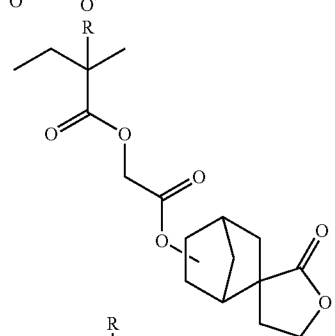
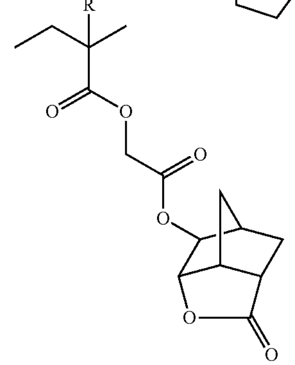

-continued
[Chem. 145]
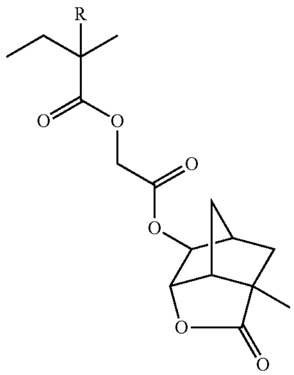
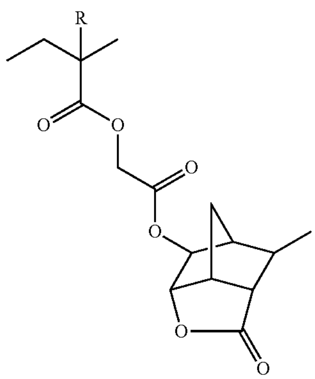
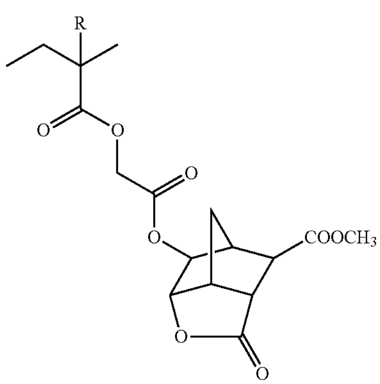
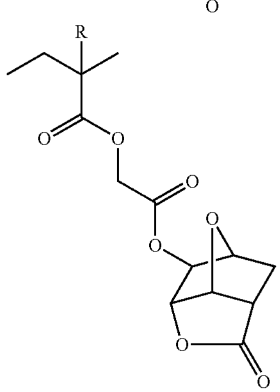
-continued
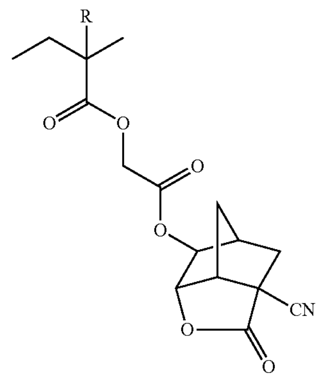
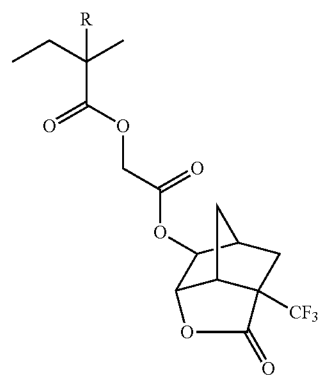
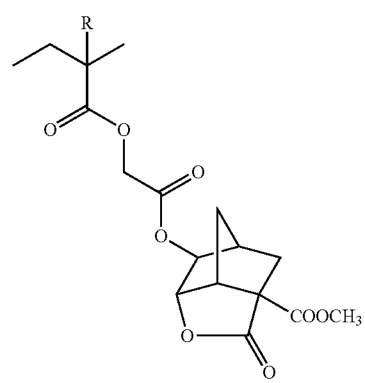
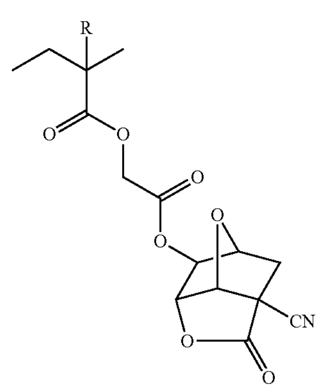

-continued
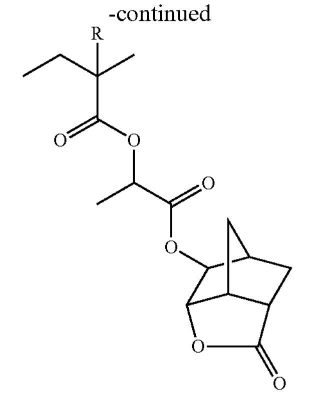
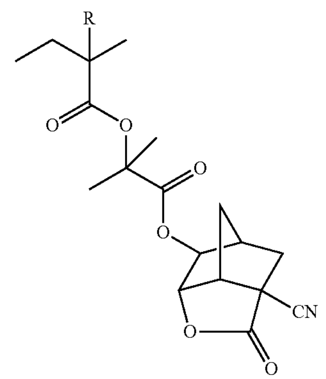
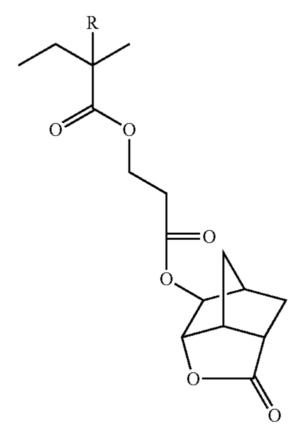
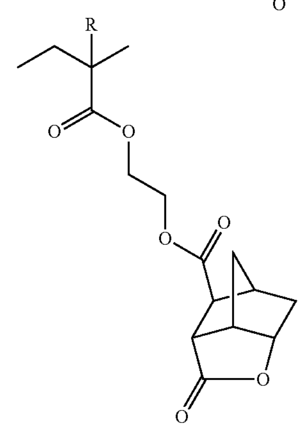
-continued
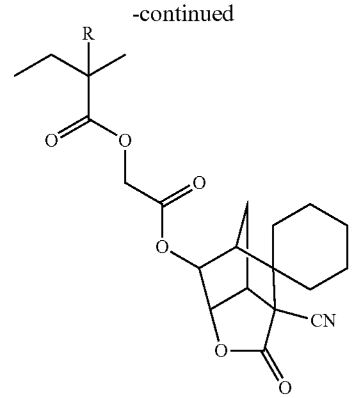
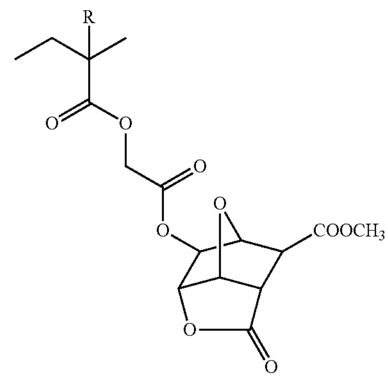
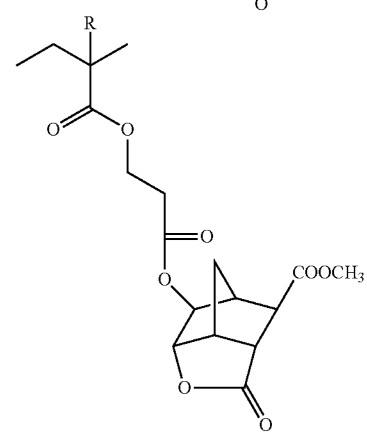
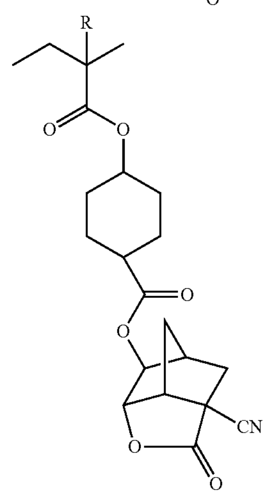

-continued

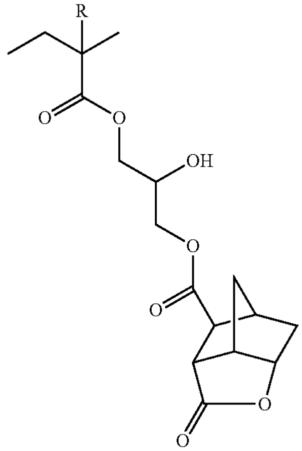

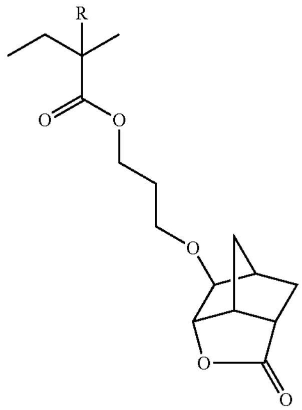

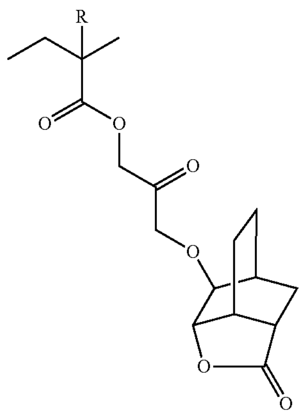

The content ratio of the lactone group-containing repeating unit in the resin is preferably from 3 to 90 mol %, more preferably from 5 to 80 mol %, still more preferably from 7 to 70 mol %, based on all repeating units.

The alicyclic hydrocarbon-based acid-decomposable resin preferably contains a repeating unit having an alicyclic hydrocarbon structure substituted with a polar group. Thanks to this configuration, the adherence to substrate and the affinity for developer can be enhanced. The polar group is preferably a hydroxyl group or a cyano group. The hydroxyl group as the polar group forms an alcoholic hydroxyl group.

The alicyclic hydrocarbon structure substituted with a polar group includes, for example, a structure represented by the following formula (VIIa) or (VIIb):

[Chem. 146]

(VIIa)

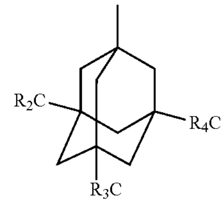

(VIIb)

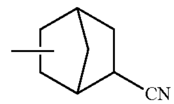

In formula (VIIa), each of $R_2c$ to $R_4c$ independently represents a hydrogen atom, a hydroxyl group or a cyano group, provided that at least one of $R_2c$ to $R_4c$ represents a hydroxyl group or a cyano group. A structure where one or two members out of $R_2c$ to $R_4c$ are a hydroxyl group with the remaining being a hydrogen atom is preferred, and it is more preferred that two members out of $R_2c$ to $R_4c$ are a hydroxyl group and the remaining one member is a hydrogen atom.

The group represented by formula (VIIa) is preferably a dihydroxy form or a monohydroxy form, more preferably a dihydroxy form.

The repeating unit having a group represented by formula (VIIa) or (VIIb) includes a repeating unit where at least one of $R_{13}'$ to $R_{16}'$ in formula (II-AB1) or (II-AB2) has a group represented by formula (VIIa) or (VIIb), and a repeating unit represented by the following formula (AIIa) or (AIIb). Examples of the former include a structure where $R_5$ of —$COOR_5$ is a group represented by formula (VIIa) or (VIIb).

[Chem. 147]

(AIIa)

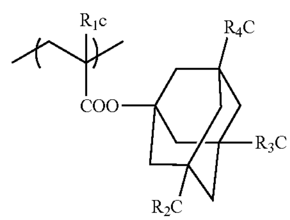

(AIIb)

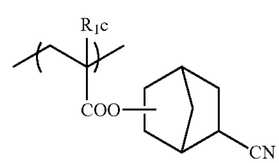

In formulae (AIIa) and (AIIb), $R_1c$ represents a hydrogen atom, a methyl group, a trifluoromethyl group or a hydroxymethyl group.

$R_2c$ to $R_4c$ have the same meanings as $R_2c$ to $R_4c$ in formula (VIIa).

Specific examples of the repeating unit represented by formula (AIIa) or (AIIb) are illustrated below, but the present invention is not limited thereto.

[Chem. 148]

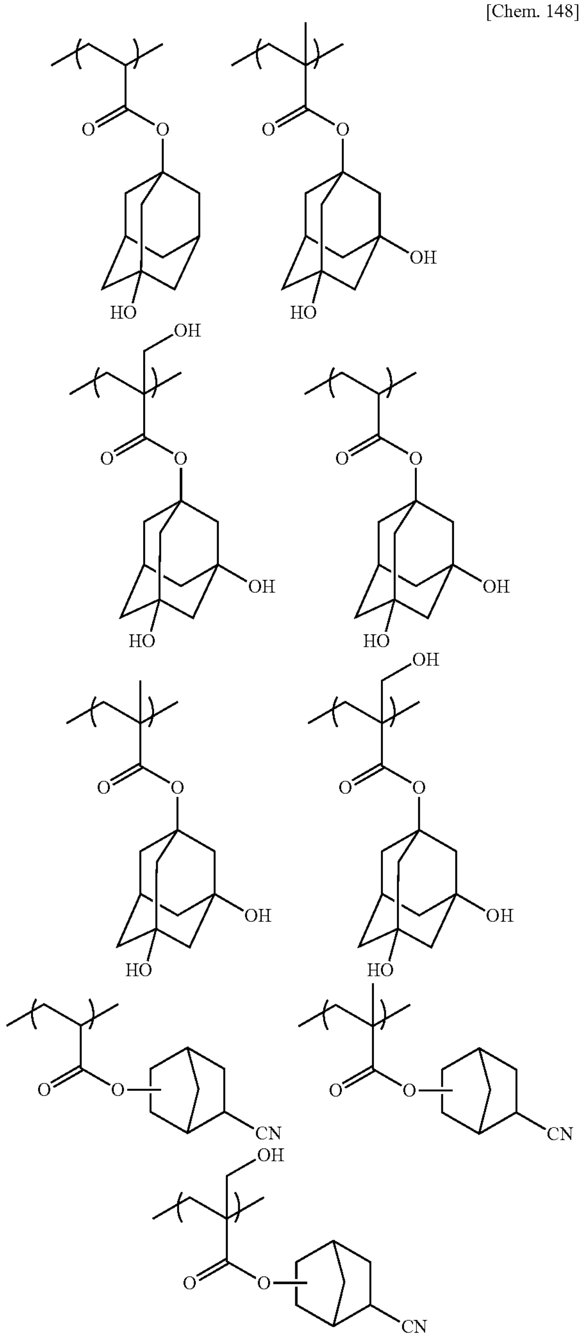

The acid-decomposable resin may contain a repeating unit represented by the following formula (VIII):

[Chem. 149]

(VIII)

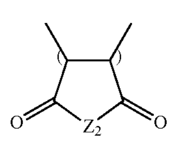

In formula (VIII), $Z_2$ represents —O— or —$N(R_{41})$—. $R_{41}$ represents a hydrogen atom, a hydroxyl group, an alkyl group or —$OSO_2$—$R_{42}$, wherein $R_{42}$ represents an alkyl group, a cycloalkyl group or a camphor residue. The alkyl group as $R_{41}$ or $R_{42}$ may be substituted with a halogen atom or the like. In this case, the halogen atom is preferably a fluorine atom.

Specific examples of the repeating unit represented by formula (VIII) are illustrated below, but the present invention is not limited thereto.

[Chem. 150]

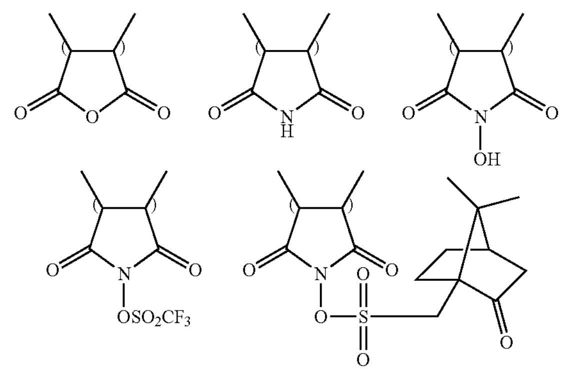

The acid-decomposable resin preferably contains a repeating unit having an alkali-soluble group, more preferably a repeating unit having a carboxyl group. Thanks to this configuration, the resolution can be increased in usage of forming contact holes.

As the repeating unit having a carboxyl group, both a repeating unit where a carboxyl group is directly bonded to the main chain of the resin, and a repeating unit where a carboxyl group is bonded to the main chain of the resin through a linking group, are preferred.

Examples of the former include a repeating unit by an acrylic acid or a methacrylic acid. Also, the linking group in the latter may have a monocyclic or polycyclic cycloalkyl structure.

The repeating unit having a carboxyl group is most preferably a repeating unit by an acrylic acid or a methacrylic acid.

The weight average molecular weight of the acid-decomposable resin is preferably from 2,000 to 200,000 in terms of polystyrene as determined by the GPC method. By setting the weight average molecular weight to 2,000 or more, among others, heat resistance and dry etching resistance can be improved. Also, by setting the weight average molecular weight to 200,000 or less, developability in particular can be increased and at the same time, thanks to reduction in the viscosity of the composition, the film-forming property of the composition can be enhanced.

The weight average molecular weight is more preferably from 2,500 to 50,000, still more preferably from 3,000 to 20,000. In the fine pattern formation using an electron beam, an X-ray or a high-energy ray with a wavelength of 50 nm or less (e.g., EUV), the weight average molecular weight is most preferably from 3,000 to 15,000. By adjusting the weight average molecular weight, for example, enhancement of the heat resistance and resolution of the composition and decrease of the development defect can be achieved at the same time.

The polydispersity (Mw/Mn) of the acid-decomposable resin is preferably from 1.0 to 3.0, more preferably from 1.2 to 2.5, still more preferably from 1.0 to 1.6. By adjusting the polydispersity to this range, for example, the line edge roughness performance can be improved.

The above-described resin capable of decomposing by an action of acid to increase the solubility for an alkali developer is preferably (C1) a compound where in a compound having one or more phenolic hydroxyl groups, the hydrogen atom in at least one phenolic hydroxyl group out of one or more phenolic hydroxyl groups is replaced by a group capable of leaving by an action of acid, and the compound (C1) is preferably a resin. The compound (C1) as a resin is suitably a resin containing a repeating unit represented by formula (A).

The compound (C1) where in a compound having one or more phenolic hydroxyl groups, the hydrogen atom in at least one phenolic hydroxyl group out of one or more phenolic hydroxyl groups is replaced by a group capable of leaving by an action of acid is preferably the above-described resin capable of decomposing by an action of acid to increase the solubility for an alkali developer.

In the compound (C1), the content ratio of the group where the hydrogen atom in at least one phenolic hydroxyl group out of one or more phenolic hydroxyl groups is replaced by a group capable of leaving by an action of acid is calculated according to the formula B'/(B'+S') by using the number (W) of groups where the hydrogen atom in at least one phenolic hydroxyl group out of one or more phenolic hydroxyl groups is replaced by a group capable of leaving by an action of acid, and the number (S') of phenolic hydroxyl groups not replaced by a group capable of leaving by an action of acid. The content ratio is preferably from 0.01 to 0.7, more preferably from 0.05 to 0.50, still more preferably from 0.05 to 0.40.

The actinic ray-sensitive or radiation-sensitive composition according to the present invention may or may not contain the compound capable of decomposing by an action of acid to increase the solubility for an alkali developer, but in the case of containing the compound, the blending ratio thereof is preferably from 0 to 99.9 mass %, more preferably from 50 to 95 mass %, still more preferably from 60 to 93 mass %, based on the total solid content of the composition.

Also in the case where the actinic ray-sensitive or radiation-sensitive composition according to the present invention is a negative resist composition, film formation and exposure are performed using the composition containing a compound capable of decomposing by an action of acid to increase the solubility for an alkali developer, and the film is subjected to development using an organic solvent, whereby a negative pattern can be obtained.

[4] (C2) Compound Having a Phenolic Hydroxyl Group

The actinic ray-sensitive or radiation-sensitive composition according to the present invention may contain, as the compound (C), (C2) a compound having one or more phenolic hydroxyl groups (hereinafter, sometimes referred to as "compound (C2)").

When such an actinic ray-sensitive or radiation-sensitive composition further contains, for example, the later-described crosslinking agent (D), a crosslinking reaction of the phenolic hydroxyl group-containing compound (C2) with the crosslinking agent (D) proceeds in the exposed area by actions of an acid generated from the compound (B) and a sulfonic acid that is generated from the compound (A) by an action of acid, whereby a negative pattern can be formed.

The phenolic hydroxyl group-containing compound (C2) is not particularly limited as long as it has a phenolic hydroxyl group, and the compound may be a relatively low molecular compound such as molecular resist or may be a polymer compound. As the molecular resist, a low molecular weight cyclic polyphenol compound, etc. described, for example, in JP-A-2009-173623 and JP-A-2009-173625 can be used.

In view or reactivity and sensitivity, the phenolic hydroxyl group-containing compound (C2) is preferably a polymer compound.

In the case where the phenolic hydroxyl group-containing compound (C2) of the present invention is a polymer compound, the polymer compound preferably contains at least one phenolic hydroxyl group-containing repeating unit. The phenolic hydroxyl group-containing repeating unit is not particularly limited but is preferably a repeating unit represented by the following formula (1):

[Chem. 151]

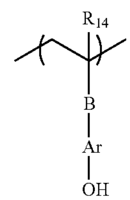

(1)

In formula (1), $R_{14}$ represents a hydrogen atom, a methyl group that may have a substituent, or a halogen atom.

B represents a single bond or a divalent linking group.

Ar represents an aromatic ring.

The methyl group that may have a substituent in $R_{14}$ includes a trifluoromethyl group, a hydroxymethyl group, etc.

$R_{14}$ is preferably a hydrogen atom or a methyl group and is preferably a hydrogen atom on account of develop ability.

The divalent linking group of B is preferably a carbonyl group, an alkylene group (preferably having a carbon number of 1 to 10, more preferably a carbon number of 1 to 5), a sulfonyl group (—S(═O)$_2$—), —O—, —NH—, or a divalent linking group formed by combining these.

B preferably represents a single bond, a carbonyloxy group (—C(═O)—O—) or —C(═O)—NH—, more preferably a single bond or a carbonyloxy group (—C(═O)—O—), and from the standpoint of enhancing the dry etching resistance, still more preferably a single bond.

The aromatic ring of Ar is a monocyclic or polycyclic aromatic ring and includes an aromatic hydrocarbon ring having a carbon number of 6 to 18 which may have a substituent, such as benzene ring, naphthalene ring, anthracene ring, fluorene ring and phenanthrene ring, and an aromatic heterocyclic ring containing a heterocyclic ring such as thiophene ring, furan ring, pyrrole ring, benzothiophene ring, benzofuran ring, benzopyrrole ring, triazine ring, imidazole ring, benzimidazole ring, triazole ring, thiadiazole ring and thiazole ring. Among these, a benzene ring and a naphthalene ring are preferred in view of resolution, and a benzene ring is most preferred in view of sensitivity.

The aromatic ring of Ar may have a substituent other than the group represented by —OH, and the substituent includes, for example, an alkyl group, a cycloalkyl group, a halogen atom, a hydroxyl group, an alkoxy group, a carboxyl group, an alkoxycarbonyl group, an alkylcarbonyl group, an alkylcarbonyloxy group, an alkylsulfonyloxy group, and an arylcarbonyl group.

On account of crosslinking reactivity, developability and dry etching resistance, the phenolic hydroxyl group-containing repeating unit is more preferably a repeating unit represented by the following formula (2):

[Chem. 152]

(2)

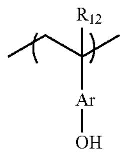

In formula (2), $R_{12}$ represents a hydrogen atom or a methyl group.

Ar represents an aromatic ring.

$R_{12}$ represents a hydrogen atom or a methyl group and is preferably a hydrogen atom on account of develop ability.

Ar in formula (2) has the same meaning as Ar in formula (1), and its preferred range is also the same. In view of sensitivity, the repeating unit represented by formula (2) is preferably a repeating unit derived from hydroxystyrene (that is, a repeating unit where in formula (2), $R_{12}$ is a hydrogen atom and Ar is a benzene ring).

The compound (C2) as a polymer compound may be composed of only the above-described phenolic hydroxyl group-containing repeating unit. The compound (C2) as a polymer compound may contain a repeating unit described later, other than the phenolic hydroxyl group-containing repeating unit. In this case, the content of the phenolic hydroxyl group-containing repeating unit is preferably from 10 to 98 mol %, more preferably from 30 to 97 mol %, still more preferably from 40 to 95 mol %, based on all repeating units in the compound (C2) as a polymer compound. Within this range, among others, when the resist film is a thin film (for example, when the thickness of the resist film is from 10 to 150 nm), the dissolution rate for an alkali developer of the exposed area in the resist film of the present invention formed using the compound (C2) can be more unfailingly reduced (that is, the dissolution rate of the resist film using the compound (C2) can be more unfailingly controlled to an optimal level). As a result, the sensitivity can be more reliably enhanced.

Examples of the phenolic hydroxyl group-containing repeating unit are illustrated below, but the present invention is not limited thereto.

[Chem. 153]

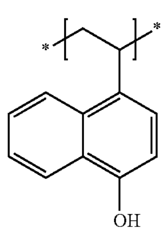

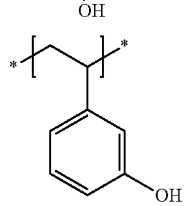

-continued

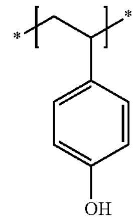

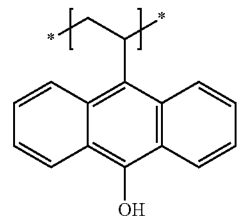

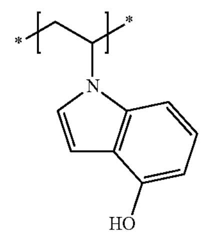

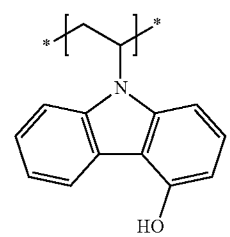

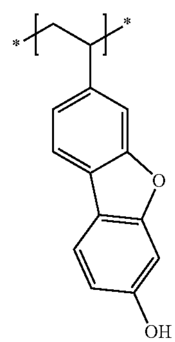

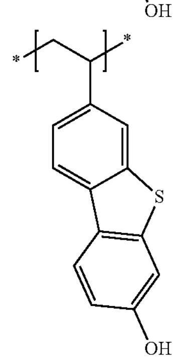

-continued
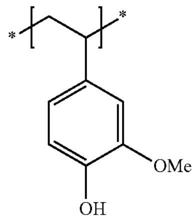
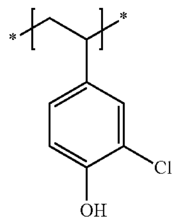
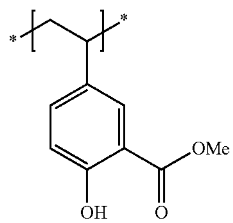
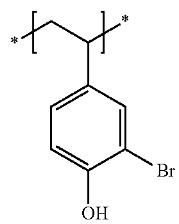
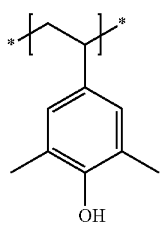
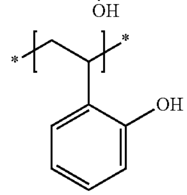
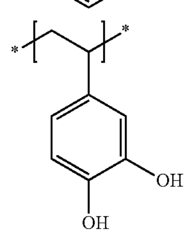
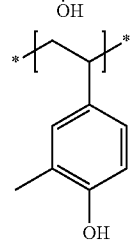
-continued
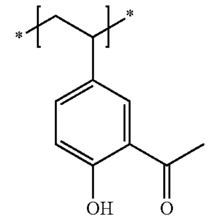
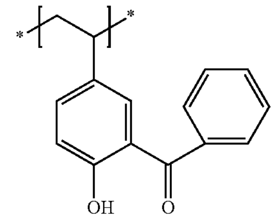
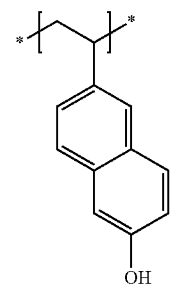
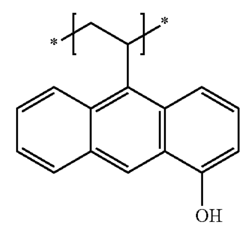
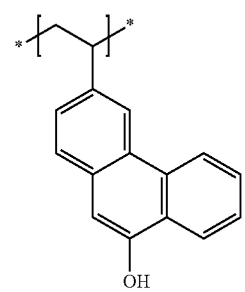
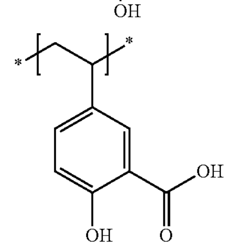
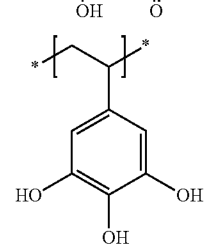

-continued
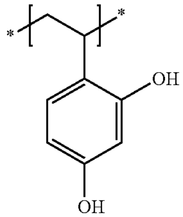
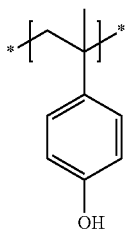
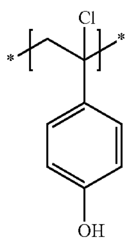
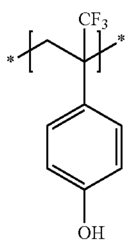
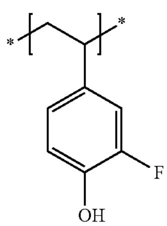
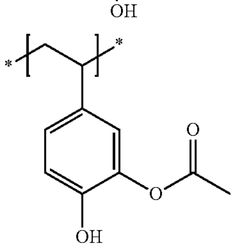
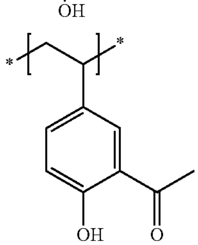
-continued
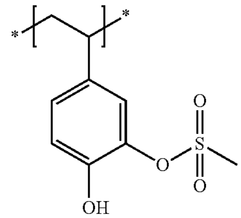
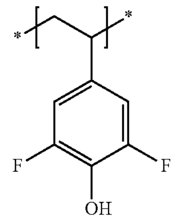
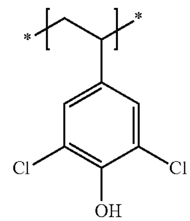
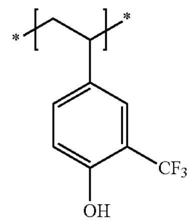
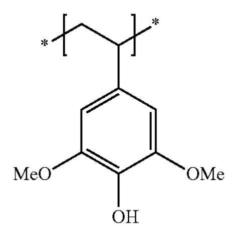
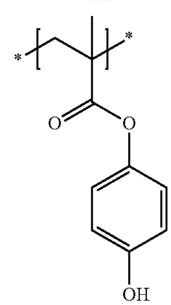
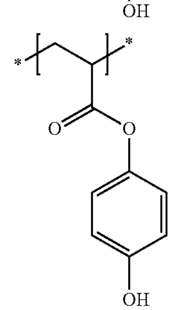

-continued

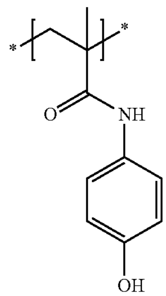

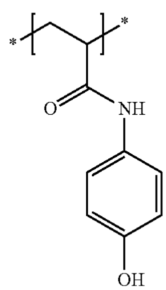

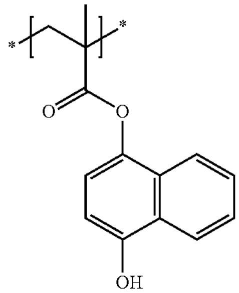

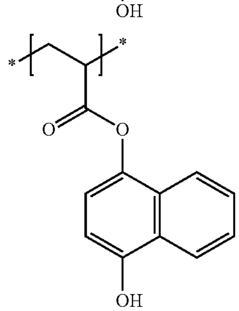

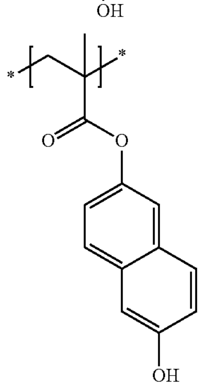

-continued

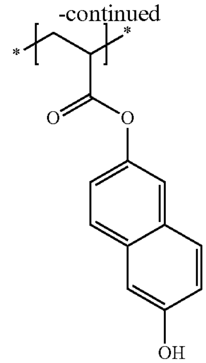

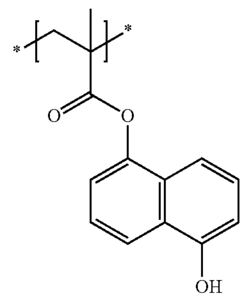

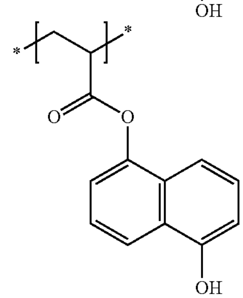

The compound (C2) preferably further has a structure where the hydrogen atom of a phenolic hydroxyl group is replaced by a group having a non-acid-decomposable polycyclic alicyclic hydrocarbon structure, because a high glass transition temperature (Tg) is obtained and the dry etching resistance is improved.

By virtue of the compound (C2) having the above-described specific structure, the glass transition temperature (Tg) of the compound (C2) becomes high, so that a very hard resist film can be formed and the acid diffusion and dry etching resistance can be controlled. As a result, acid diffusion in the area exposed to an actinic ray or radiation such as electron beam and extreme-ultraviolet ray is highly suppressed and therefore, the resolution, pattern profile and LER in a fine pattern are more improved. Also, the configuration that the compound (C2) has a non-acid-decomposable polycyclic alicyclic hydrocarbon structure is considered to contribute to more enhancement of the dry etching resistance. Furthermore, although details are unknown, it is presumed that the polycyclic alicyclic hydrocarbon structure has a high hydrogen radical-donating property and the compound works out to a hydrogen source at the time of decomposition of the photoacid generator, that is, the compound (B) capable of generating an acid upon irradiation with an actinic ray or radiation, leading to a more improved decomposition efficiency of the photoacid generator and a higher acid generation efficiency, which is thought to contribute to more excellent sensitivity.

In the specific structure that the compound (C2) of the present invention may have, an aromatic ring such as benzene ring and a group having a non-acid-decomposable polycyclic alicyclic hydrocarbon structure are connected through an oxygen atom derived from a phenolic hydroxyl group. As described above, this structure is capable of not only contributing to high dry etching resistance but also raising the glass transition temperature (Tg) of the compound (C2), and the combination of these effects is presumed to provide for higher resolution.

In the present invention, the "non-acid-decomposable" means the property that a decomposition reaction is not caused by an acid generated from the compound (B) capable of generating an acid upon irradiation with an actinic ray or radiation.

More specifically, the group having a non-acid-decomposable polycyclic alicyclic hydrocarbon structure is preferably a group stable to an acid and an alkali. The "group stable to an acid and an alkali" means a group not exhibiting acid decomposability and alkali decomposability. The "acid decomposability" as used herein means the property of causing a decomposition reaction due to an action of the acid generated from the compound (B) capable of generating an acid upon irradiation with an actinic ray or radiation, and the group exhibiting acid decomposability includes the acid-decomposable group described above in "Repeating Unit Having Acid-Decomposable Group".

Also, the "alkali decomposability" means the property of causing a decomposition reaction due to an action of an alkali developer, and the group exhibiting alkali decomposability includes the conventionally known group capable of decomposing by an action of alkali developer to increase the dissolution rate in an alkali developer (for example, a group having a lactone structure), which is contained in the resin suitably used for the positive actinic ray-sensitive or radiation-sensitive composition.

The group having a polycyclic alicyclic hydrocarbon structure is not particularly limited as long as it is a monovalent group having a polycyclic alicyclic hydrocarbon structure, but the total carbon number thereof is preferably from 5 to 40, more preferably from 7 to 30. The polycyclic alicyclic hydrocarbon structure may have an unsaturated bond in the ring.

The polycyclic alicyclic hydrocarbon structure in the group having a polycyclic alicyclic hydrocarbon structure means a structure having a plurality of alicyclic hydrocarbon groups of a monocyclic type, or an alicyclic hydrocarbon structure of a polycyclic type, and may be a bridged system. The alicyclic hydrocarbon group of a monocyclic type is preferably a cycloalkyl group having a carbon number of 3 to 8, and examples thereof include a cyclopropyl group, a cyclopentyl group, a cyclohexyl group, a cyclobutyl group, and a cyclooctyl group. The structure having a plurality of alicyclic hydrocarbon groups of a monocyclic type has a plurality of such groups. The structure having a plurality of alicyclic hydrocarbon groups of a monocyclic type preferably has from 2 to 4, more preferably 2, alicyclic hydrocarbon groups of a monocyclic type.

The alicyclic hydrocarbon group of a polycyclic type includes, for example, a bicyclo-, tricyclo- or tetracyclo-structure having a carbon number of 5 or more and is preferably a polycyclic cyclo-structure having a carbon number of 6 to 30, and examples thereof include an adamantane structure, a decalin structure, a norbornane structure, a norbornene structure, a cedrol structure, an isoboronane structure, a bornane structure, a dicyclopentane structure, an α-pinene structure, a tricyclodecane structure, a tetracyclododecane structure, and an androstane structure. Incidentally, a part of carbon atoms in the monocyclic or polycyclic cycloalkyl group may be substituted with a heteroatom such as oxygen atom.

Among these polycyclic alicyclic hydrocarbon structures, an adamantane structure, a decalin structure, a norbornane structure, a norbornene structure, a cedrol structure, a structure having a plurality of cyclohexyl groups, a structure having a plurality of cycloheptyl groups, a structure having a plurality of cyclooctyl groups, a structure having a plurality of cyclodecanyl groups, a structure having a plurality of cyclododecanyl groups, and a tricyclodecane structure are preferred, and an adamantane structure is most preferred in view of dry etching resistance (that is, it is most preferred that the group having a non-acid-decomposable polycyclic alicyclic hydrocarbon structure is a group having a non-acid-decomposable adamantane structure).

Chemical formulae of these polycyclic alicyclic hydrocarbon structures (with respect to the structure having a plurality of alicyclic hydrocarbon groups of a monocyclic type, the alicyclic hydrocarbon structure of a monocyclic type corresponding to the contained alicyclic hydrocarbon group of a monocyclic type (specifically, structures of the following formulae (47) to (50))) are illustrated below.

[Chem. 154]

(1)

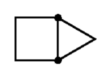

(2)

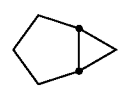

(3)

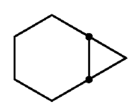

(4)

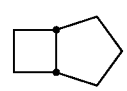

(5)

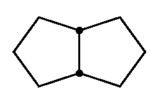

(6)

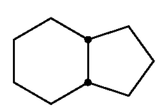

(7)

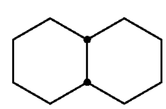

(8)

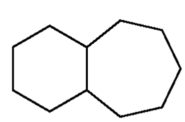

(9)

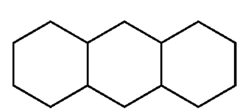

-continued
(10)
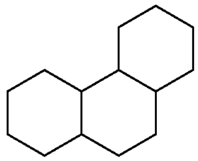
(11)
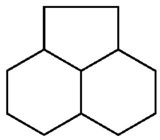
(12)
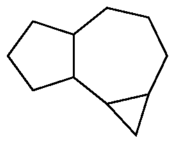
(13)
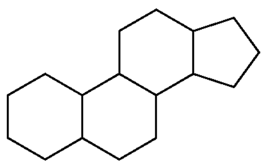
(14)
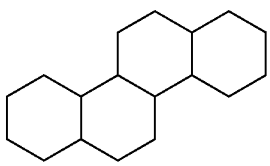
(15)
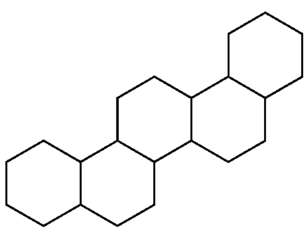
(16)
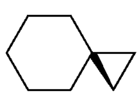
(17)
(18)
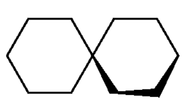
(19)
(20)
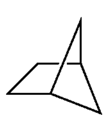
-continued
(21)
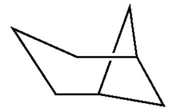
(22)
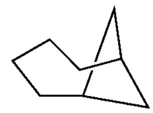
(23)
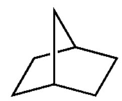
(24)
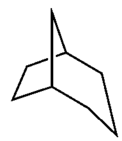
(25)
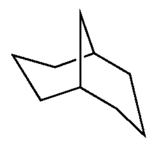
(26)
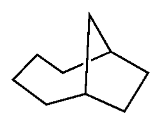
(27)
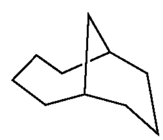
(28)
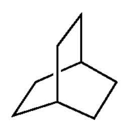
(29)
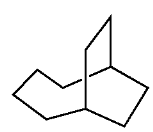
(30)
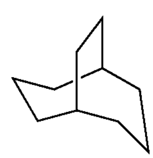
(31)
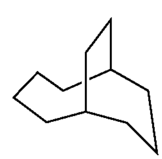

-continued

(32)
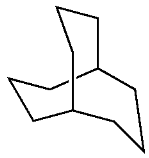

(33)
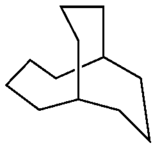

(34)
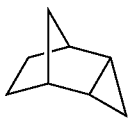

(35)
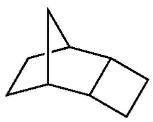

(36)
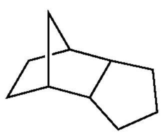

(37)
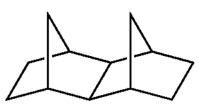

(38)
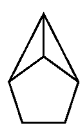

(39)
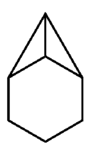

(40)
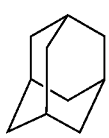

(41)
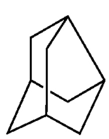

(42)
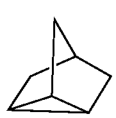

-continued

(43)
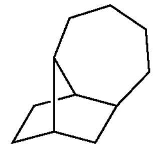

(44)
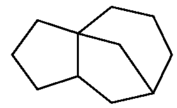

(45)
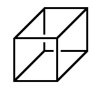

(46)
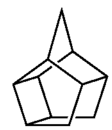

(47)
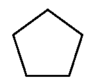

(48)
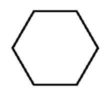

(49)
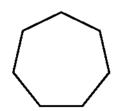

(50)
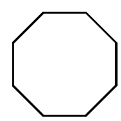

[Chem. 155]

(51)
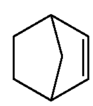

The polycyclic alicyclic hydrocarbon structure may further have a substituent, and the substituent includes, for example, an alkyl group (preferably having a carbon number of 1 to 6), a cycloalkyl group (preferably having a carbon number of 3 to 10), an aryl group (preferably having a carbon number of 6 to 15), a halogen atom, a hydroxyl group, an alkoxy group (preferably having a carbon number of 1 to 6), a carboxyl group, a carbonyl group, a thiocarbonyl group, an alkoxycarbonyl group (preferably having a carbon number of 2 to 7), and a group formed by combining these groups (preferably having a total carbon number of 1 to 30, more preferably a total carbon number of 1 to 15).

The polycyclic alicyclic hydrocarbon structure is preferably a structure represented by any one of formulae (7), (23), (40), (41) and (51), or a structure having two monovalent groups each formed by substituting a bond for one arbitrary hydrogen atom in the structure of formula (48), more preferably a structure represented by any one of formulae (23), (40) and (51), or a structure having two monovalent groups each formed by substituting a bond for one arbitrary hydrogen atom in the structure of formula (48), and most preferably a structure represented by formula (40).

The group having a polycyclic alicyclic hydrocarbon structure is preferably a monovalent group formed by substituting a bond for one arbitrary hydrogen atom in the above-described polycyclic alicyclic hydrocarbon structure.

The structure where the hydrogen atom of a phenolic hydroxyl group is replaced by the group having a non-acid-decomposable polycyclic alicyclic hydrocarbon structure is preferably contained, in the compound (C2) that is a polymer compound, as a repeating unit having a structure where the hydrogen atom of a phenolic hydroxyl group is replaced by the group having a non-acid-decomposable polycyclic alicyclic hydrocarbon structure, and more preferably contained, in the compound (C2), as a repeating unit represented by the following formula (3):

[Chem. 156]

(3)

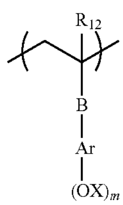

In formula (3), $R_{12}$ represents a hydrogen atom or a methyl group.

X represents a hydrogen atom or a group having a non-acid-decomposable polycyclic alicyclic hydrocarbon structure, and at least one represents a group having a non-acid-decomposable polycyclic alicyclic hydrocarbon structure.

Ar represents an aromatic ring group.

B represents a single bond or a divalent linking group.

m is an integer of 1 or more.

In formula (3), $R_{12}$ represents a hydrogen atom or a methyl group and is preferably a hydrogen atom.

The aromatic ring of Ar in formula (3) includes those recited above in formula (1), and the preferred range thereof is also the same. The aromatic ring of Ar may have a substituent other than the group represented by —OX, and the substituent includes, for example, an alkyl group (preferably having a carbon number of 1 to 6), a cycloalkyl group (preferably having a carbon number of 3 to 10), an aryl group (preferably having a carbon number of 6 to 15), a halogen atom, a hydroxyl group, an alkoxy group (preferably having a carbon number of 1 to 6), a carboxyl group, and an alkoxycarbonyl group (preferably having a carbon number of 2 to 7), and is preferably an alkyl group, an alkoxy group or an alkoxycarbonyl group, more preferably an alkoxy group.

B is preferably a single bond.

X represents a group having a non-acid-decomposable polycyclic alicyclic hydrocarbon structure. Specific examples and preferred range of the group having a non-acid-decomposable polycyclic alicyclic hydrocarbon structure, represented by X, are the same as those described above. X is more preferably a group represented by —Y—$X_2$ in formula (4) later.

m is preferably an integer of 1 to 5 and most preferably 1. When m is 1 and $Ar_1$ is a benzene ring, the substitution position of —OX may be the para-, meta- or ortho-position relative to the bonding position of the benzene ring to the polymer main chain but is preferably the para- or meta-position, more preferably the para-position.

In the present invention, the repeating unit represented by formula (3) is preferably a repeating unit represented by the following formula (4).

When a polymer compound (C2) containing a repeating unit represented by formula (4) is used, Tg of the polymer compound (C2) becomes high, and a very hard resist film is formed, so that acid diffusion and dry etching resistance can be more reliably controlled.

[Chem. 157]

(4)

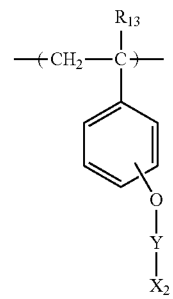

In formula (4), $R_{13}$ represents a hydrogen atom or a methyl group.

Y represents a single bond or a divalent linking group.

$X_2$ represents a non-acid-decomposable polycyclic alicyclic hydrocarbon group.

As to the repeating unit represented by formula (4), preferred embodiments used in the present invention are described below.

In formula (4), $R_{13}$ represents a hydrogen atom or a methyl group and in particular, is preferably a hydrogen atom.

In formula (4), Y is preferably a divalent linking group. The group preferred as the divalent linking group of Y is a carbonyl group, a thiocarbonyl group, an alkylene group (preferably having a carbon number of 1 to 10, more preferably a carbon number of 1 to 5), a sulfonyl group, —$COCH_2$—, —NH— or a divalent linking group formed by combining these (preferably having a total carbon number of 1 to 20, more preferably a total carbon umber of 1 to 10), more preferably a carbonyl group, —$COCH_2$—, a sulfonyl group, —CONH— or —CSNH—, still more preferably a carbonyl group or —$COCH_2$—, yet still more preferably a carbonyl group.

$X_2$ represents a polycyclic alicyclic hydrocarbon group and is non-acid-decomposable. The total carbon number of the polycyclic alicyclic hydrocarbon group is preferably from 5 to 40, more preferably from 7 to 30. The polycyclic alicyclic hydrocarbon group may have an unsaturated bond in the ring.

The polycyclic alicyclic hydrocarbon group is a group having a plurality of alicyclic hydrocarbon groups of a monocyclic type, or an alicyclic hydrocarbon group of a polycyclic type, and may be a bridged system. The alicyclic hydrocarbon group of a monocyclic type is preferably a cycloalkyl group having a carbon number of 3 to 8, and examples thereof include a cyclopropyl group, a cyclopentyl group, a cyclohexyl group, a cyclobutyl group, and a cyclooctyl group. The group has a plurality of such groups. The group having a plurality of alicyclic hydrocarbon groups of a monocyclic type preferably has from 2 to 4, more preferably 2, alicyclic hydrocarbon groups of a monocyclic type.

The alicyclic hydrocarbon group of a polycyclic type includes, for example, a bicyclo-, tricyclo- or tetracyclo-structure having a carbon number of 5 or more and is preferably a group having a polycyclic cyclo-structure with a carbon number of 6 to 30, and examples thereof include an adamantyl group, a norbornyl group, a norbornenyl group, an isoboronyl group, a camphanyl group, a dicyclopentyl group, an α-pinel group, a tricyclodecanyl group, a tetracyclododecyl group, and an androstanyl group. Incidentally, a part of carbon atoms in the monocyclic or polycyclic cycloalkyl group may be substituted with a heteroatom such as oxygen atom.

Among these polycyclic alicyclic hydrocarbon groups of $X_2$, an adamantyl group, a decalin group, a norbornyl group, a norbornenyl group, a cedrol group, a group having a plurality of cyclohexyl groups, a group having a plurality of cycloheptyl groups, a group having a plurality of cyclooctyl groups, a group having a plurality of cyclodecanyl groups, a group having a plurality of cyclododecanyl groups and a tricyclodecanyl group are preferred, and an adamantyl group is most preferred in view of dry etching resistance. Examples of the chemical formula of the polycyclic alicyclic hydrocarbon structure in the polycyclic alicyclic hydrocarbon group of $X_2$ are the same as those of the chemical formula of the polycyclic alicyclic hydrocarbon structure in the group having a polycyclic alicyclic hydrocarbon structure, and the preferred range is also the same. The polycyclic alicyclic hydrocarbon group of $X_2$ includes a monovalent group formed by substituting a bond for one arbitrary hydrogen atom in the above-described polycyclic alicyclic hydrocarbon structure.

Furthermore, the alicyclic hydrocarbon group above may have a substituent, and examples of the substituent are the same as those described above for the substituent that may be substituted on the polycyclic alicyclic hydrocarbon structure.

In formula (4), the substitution position of —O—Y—$X_2$ may be the para-, meta- or ortho-position relative to the bonding position of the benzene ring to the polymer main chain but is preferably the para-position.

In the present invention, the repeating unit represented by formula (3) is most preferably a repeating unit represented by the following formula (47:

[Chem. 158]

(4')

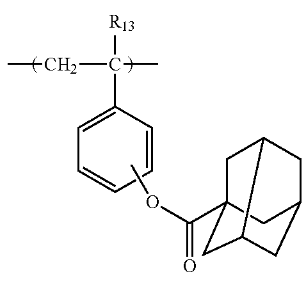

In formula (4'), $R_{13}$ represents a hydrogen atom or a methyl group.

In formula (4'), $R_{13}$ represents a hydrogen atom or a methyl group and in particular, is preferably a hydrogen atom.

In formula (4'), the substitution position of the adamantyl ester group may be the para-, meta- or ortho-position relative to the bonding position of the benzene ring to the polymer main chain but is preferably the para-position.

Specific examples of the repeating unit represented by formula (3) include the followings.

[Chem. 159]

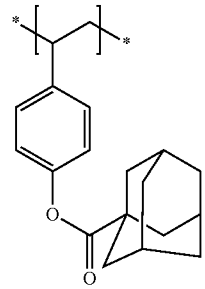

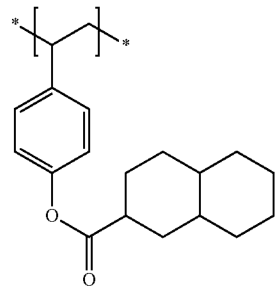

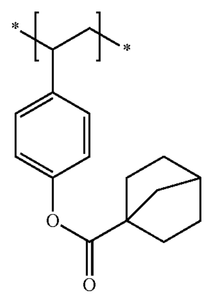

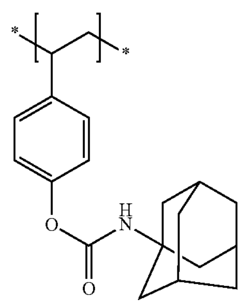

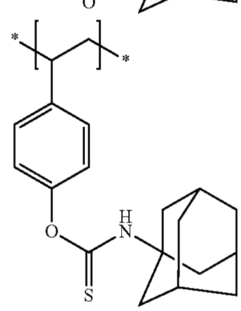

-continued
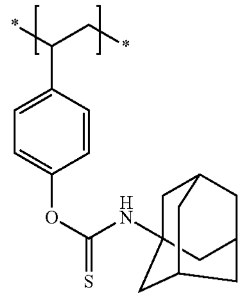
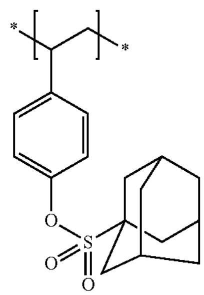
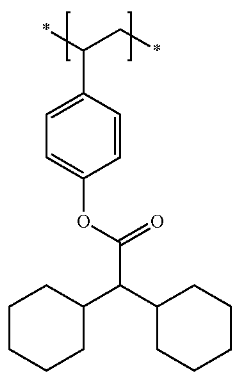
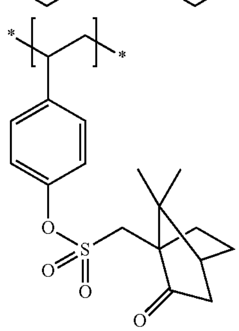
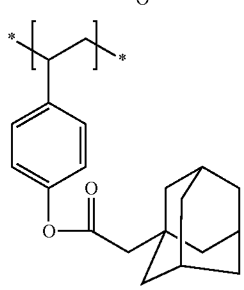
-continued
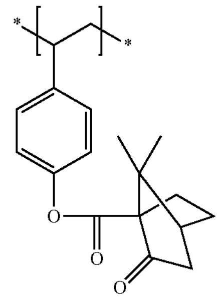
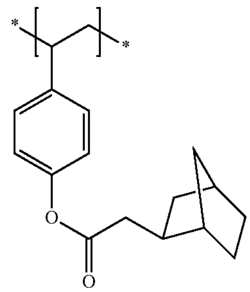
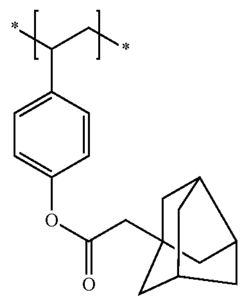
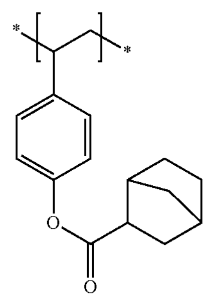
[Chem. 160]
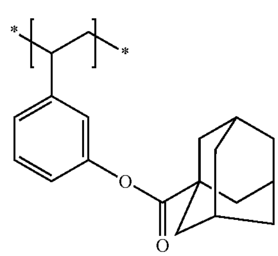
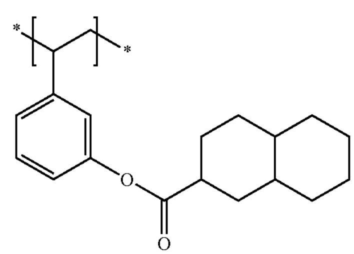

-continued
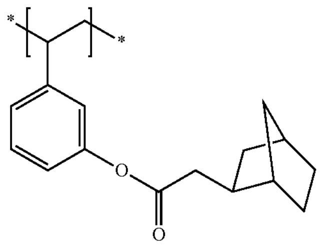
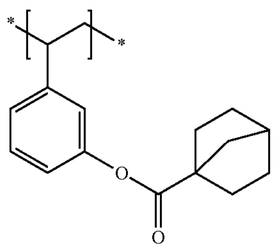
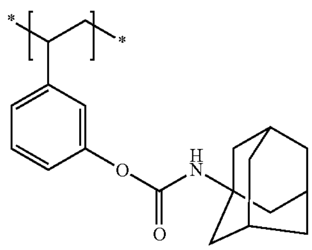
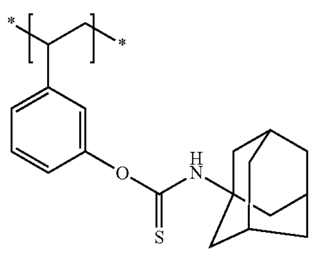
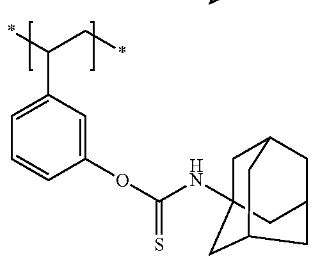
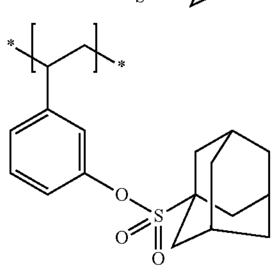
-continued
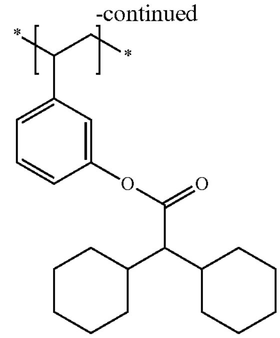
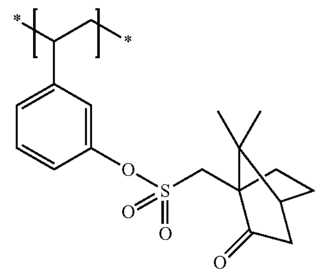
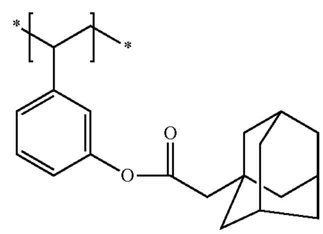
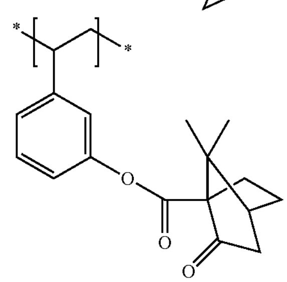
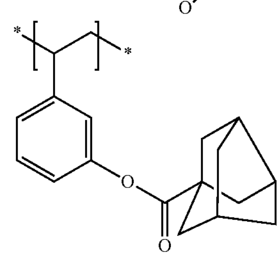
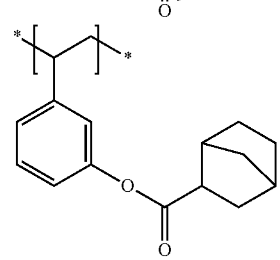

-continued

[Chem. 161]

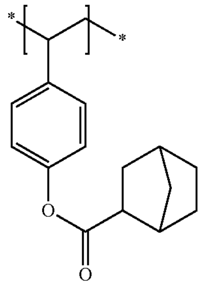

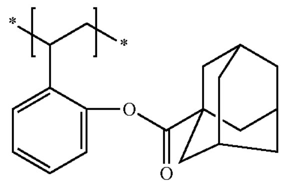

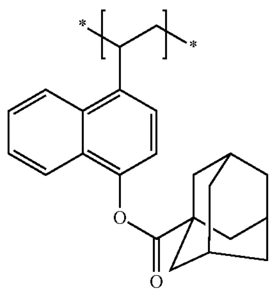

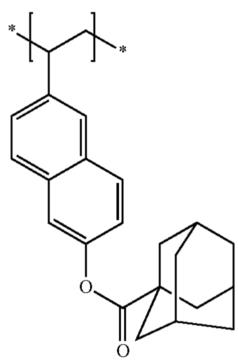

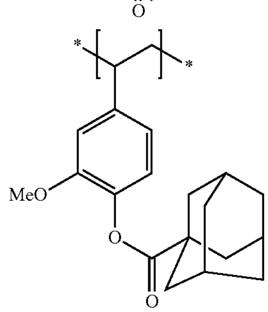

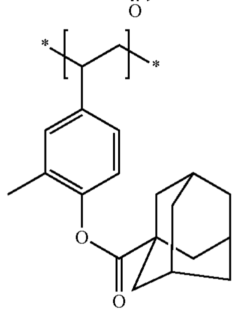

-continued

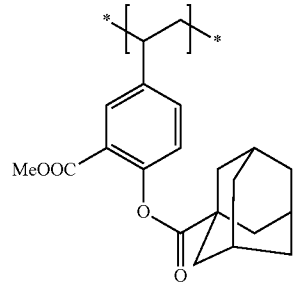

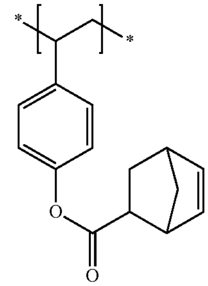

In the case where the compound (C2) is a polymer compound and contains a repeating unit having a structure in which the hydrogen atom of a phenolic hydroxyl group is replaced by the group having a non-acid-decomposable polycyclic alicyclic hydrocarbon structure, the content of the repeating unit is preferably from 1 to 40 mol %, more preferably from 2 to 30 mol %, based on all repeating units in the compound (C2) as a polymer compound.

It is also preferred that the compound (C2) as a polymer compound for use in the present invention further contains the following repeating unit (hereinafter, sometimes referred to as "another repeating unit") as a repeating unit other than the repeating units described above.

Examples of the polymerizable monomer for forming such another repeating unit include styrene, an alkyl-substituted styrene, an alkoxy-substituted styrene, a halogen-substituted styrene, an O-alkylated styrene, an O-acylated styrene, a hydrogenated hydroxystyrene, a maleic anhydride, an acrylic acid derivative (e.g., acrylic acid, acrylic acid ester), a methacrylic acid derivative (e.g., methacrylic acid, methacrylic acid ester), an N-substituted maleimide, acrylonitrile, methacrylonitrile, vinylnaphthalene, vinylanthracene, and an indene that may have a substituent.

The compound (C2) as a polymer compound may or may not contain such another repeating unit, but in the case of containing such another repeating unit, the content thereof in the compound (C2) as a polymer compound is generally from 1 to 30 mol %, preferably from 1 to 20 mol %, more preferably from 2 to 10 mol %, based on all repeating units constituting the compound (C2) as a polymer compound.

The compound (C2) as a polymer compound can be synthesized by a known radical polymerization method, anionic polymerization method or living radical polymerization method (e.g., iniferter method). For example, in the anionic polymerization method, vinyl monomers are dissolved in an appropriate organic solvent and reacted usually under cooling condition by using a metal compound (e.g., butyllithium) as the initiator, whereby the polymer can be obtained.

As the compound (C2) that is a polymer compound, a polyphenol compound produced by a condensation reaction of an aromatic ketone or aromatic aldehyde and a compound containing from 1 to 3 phenolic hydroxyl groups (see, for example, JPA-2008-145539), a calixarene derivative (see, for example, JP-A-2004-18421), a Noria derivative (see, for example, JP-A-2009-222920), and a polyphenol derivative (see, for example, JPA-2008-94782) can be also applied, and these compounds may be modified by a polymer reaction to synthesize a polymer compound.

The compound (C2) as a polymer compound is preferably synthesized by subjecting a polymer obtained by radical polymerization or anionic polymerization to modification by a polymer reaction.

The weight average molecular weight of the compound (C2) as a polymer compound is preferably from 1,000 to 200,000, more preferably from 2,000 to 50,000, still more preferably from 2,000 to 15,000.

The polydispersity (molecular weight distribution) (Mw/Mn) of the compound (C2) as a polymer compound is preferably 2.5 or less and from the standpoint of enhancing the sensitivity and resolution, more preferably from 1.0 to 2.0, still more preferably from 1.0 to 1.6, most preferably from 1.0 to 1.25. By employing living polymerization such as living anionic polymerization, the polydispersity (molecular weight distribution) of the polymer compound obtained becomes uniform, and this is preferred. The weight average molecular weight and polydispersity of the compound (C2) as a polymer compound are defined as a value in terms of polystyrene by GPC measurement.

The molecular weight of the compound (C2) as a low molecular compound is preferably 3,000 or less and is preferably from 300 to 2,000, more preferably from 500 to 1,500.

The added of the compound (C2) amount to the actinic ray-sensitive or radiation-sensitive composition of the present invention is preferably from 30 to 95 mass %, more preferably from 40 to 90 mass %, still more preferably from 50 to 85 mass %, based on the total solid content of the composition.

Specific examples of the compound (C2) are illustrated below, but the present invention is not limited thereto.

[Chem. 162]

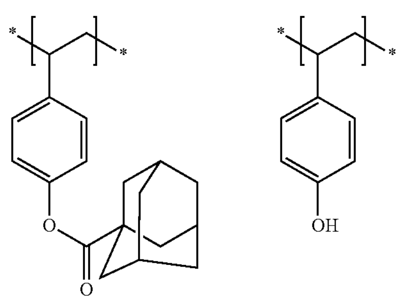

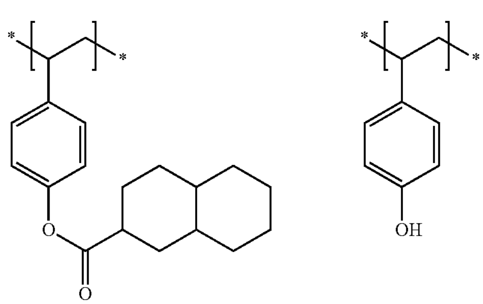

-continued

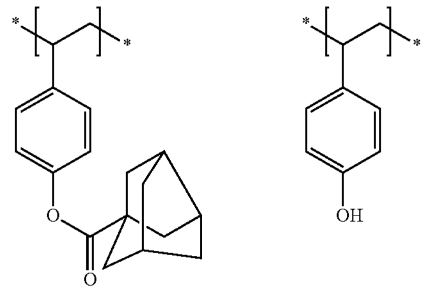

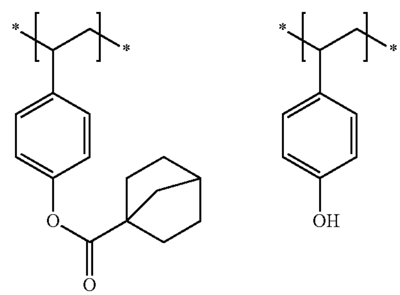

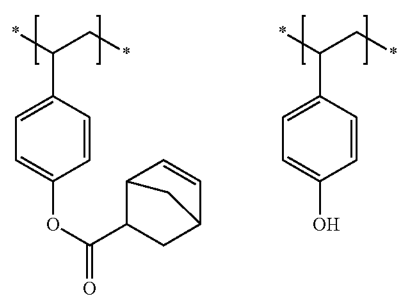

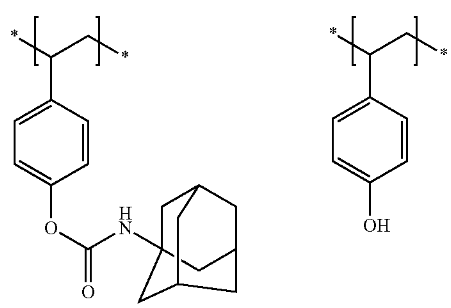

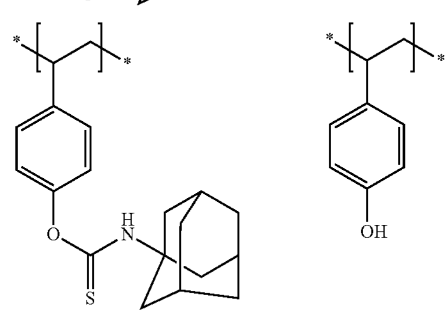

-continued
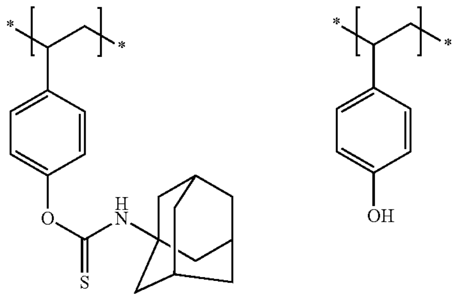
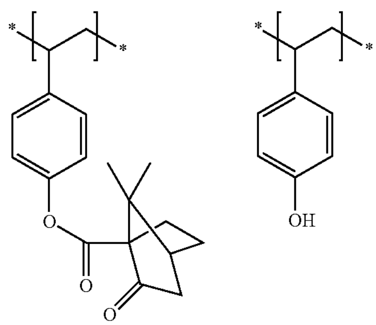
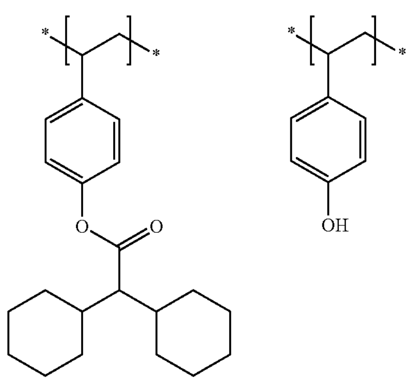
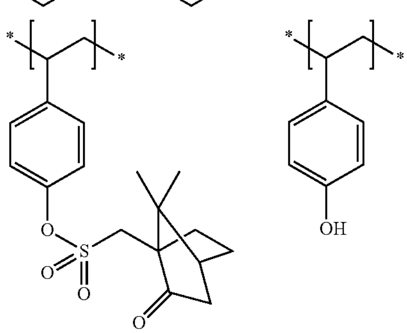
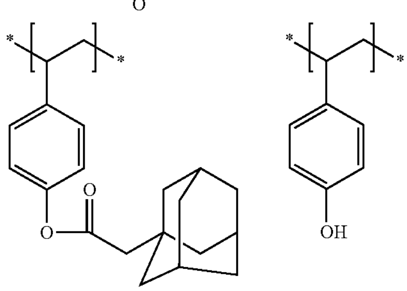
-continued
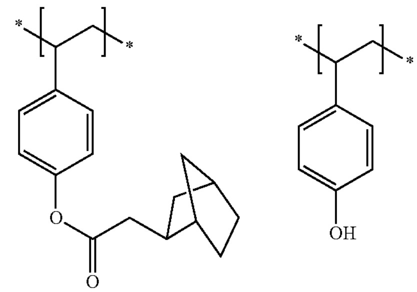
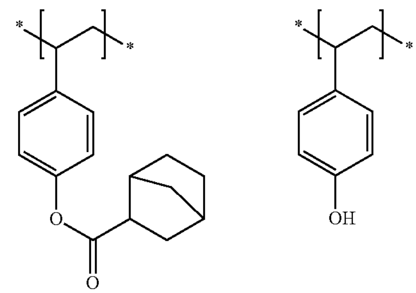
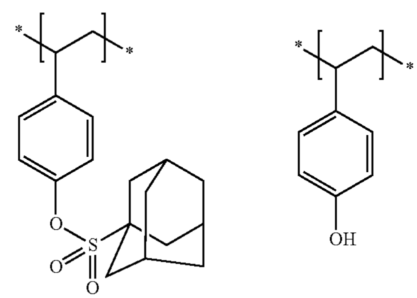
[Chem. 163]
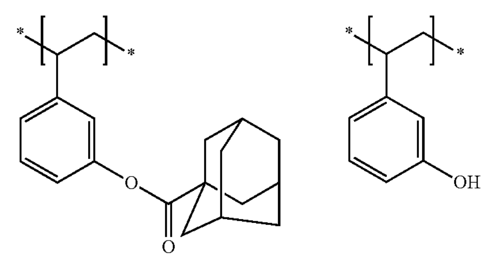
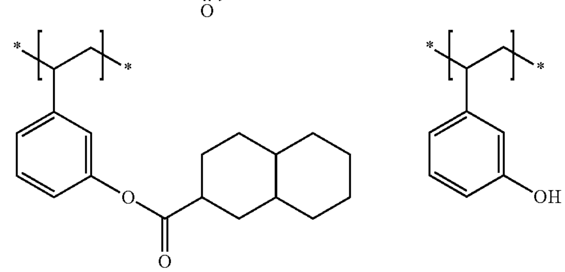
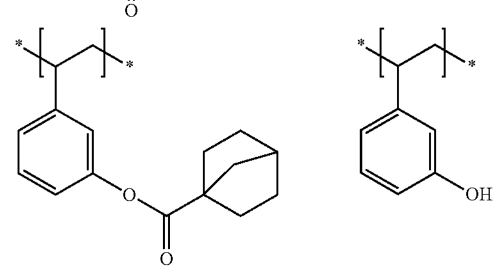

-continued
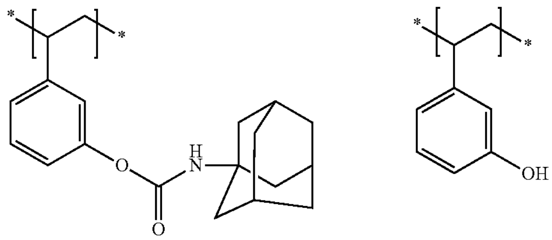
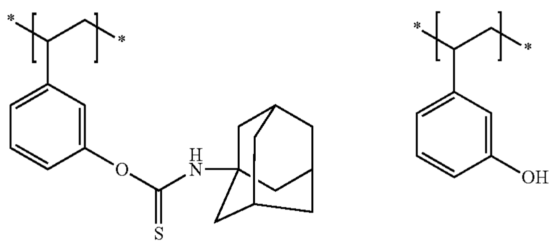
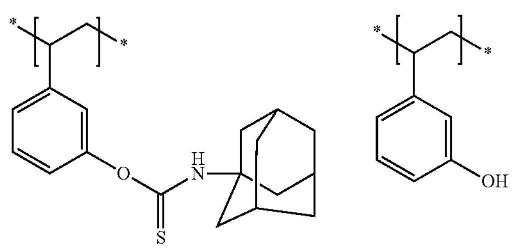
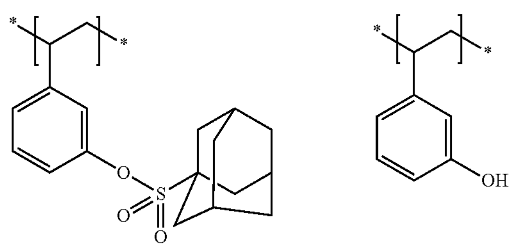
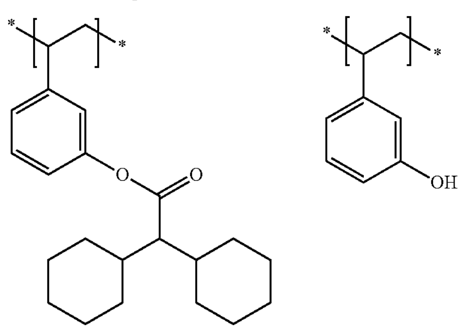
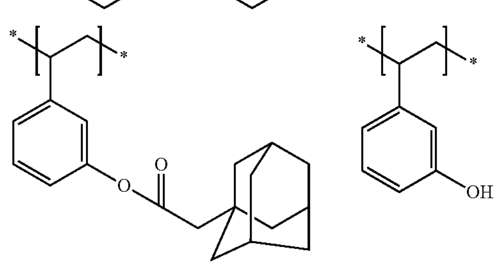
-continued
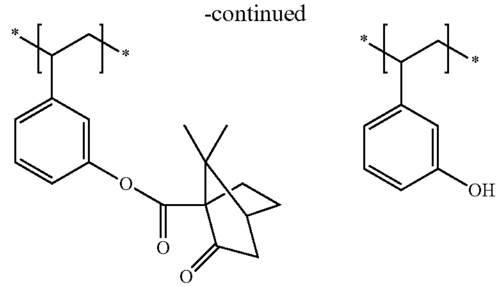
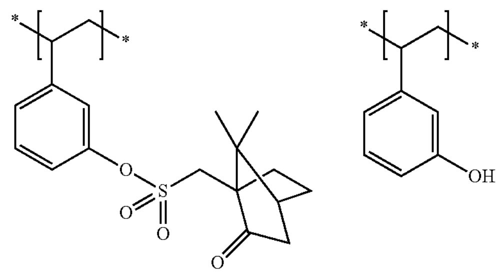
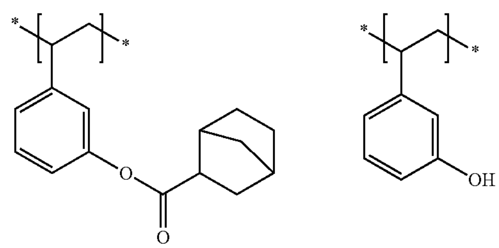
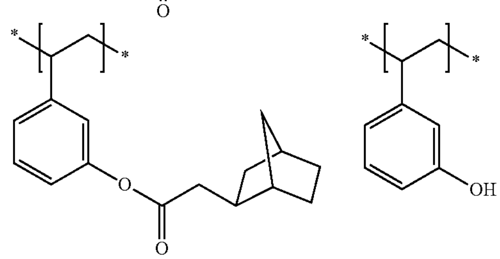
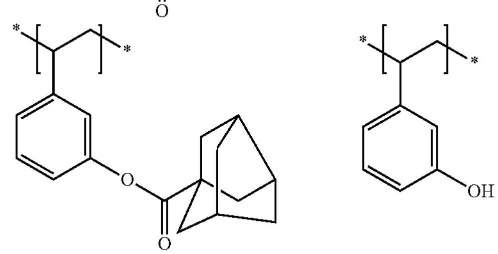
[Chem. 164]
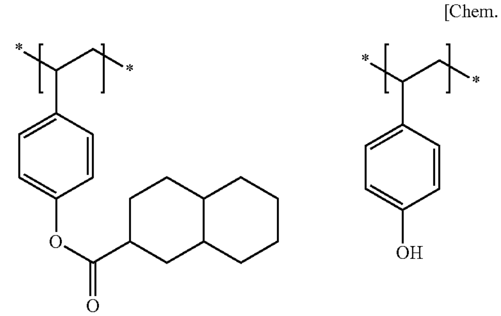

-continued
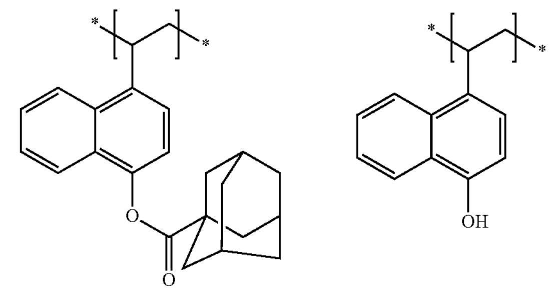
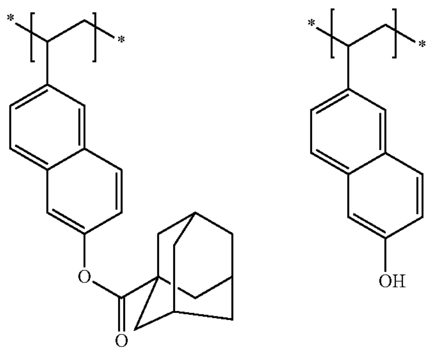
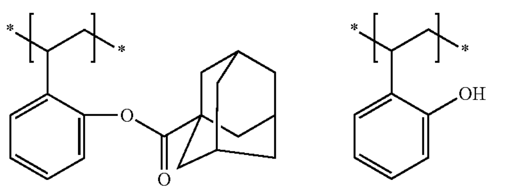
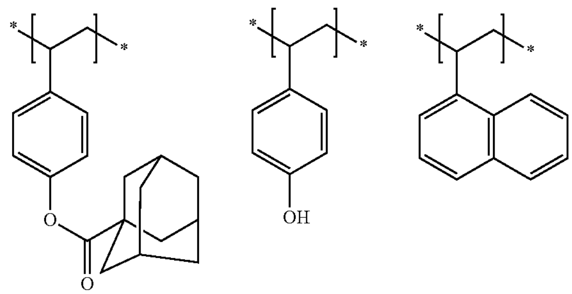
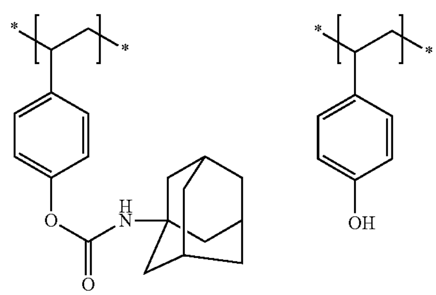
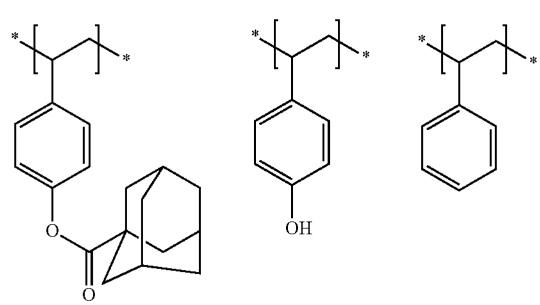
-continued
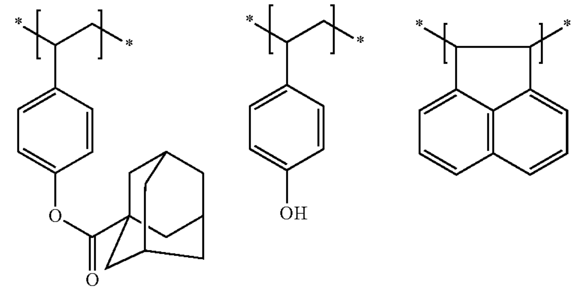
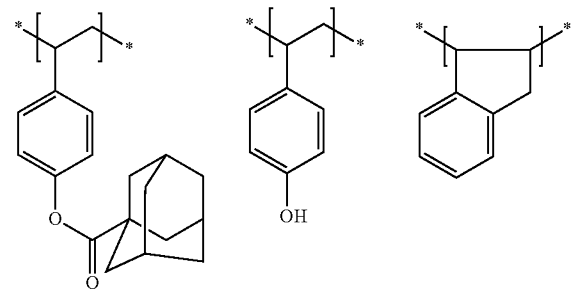
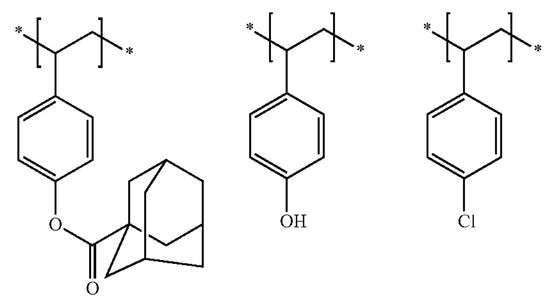
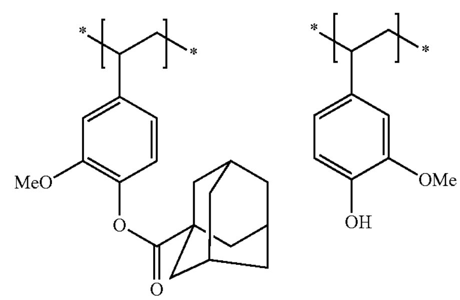
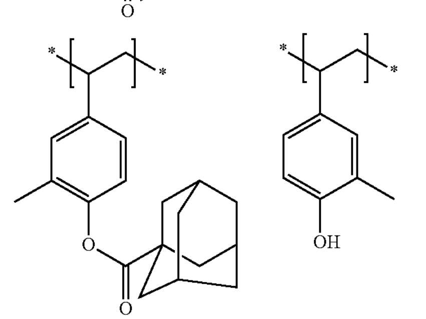

-continued

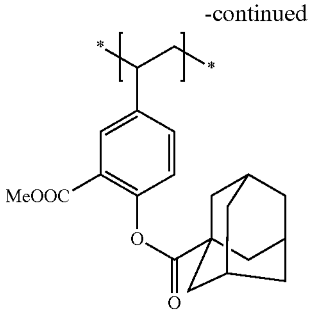

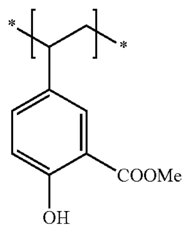

[Chem. 165]

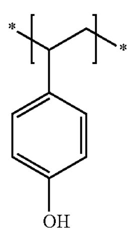

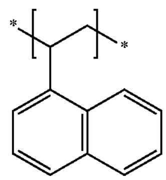

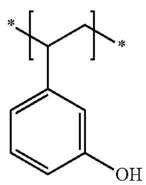

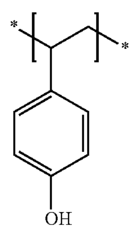

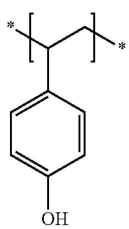

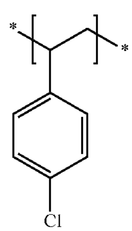

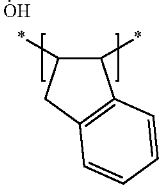

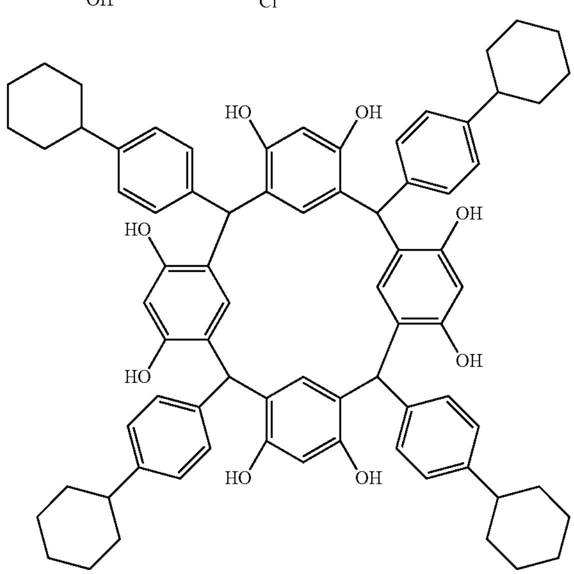

[5] Compound Having a Molecular Weight of 3,000 or Less and being Capable of Decomposing by an Action of Acid to Increase the Solubility in an Alkali Developer (Hereinafter, Sometimes Referred to as "Dissolution Inhibiting Compound")

As described above, in the case where the actinic ray-sensitive or radiation-sensitive composition of the present invention is particularly a positive resist composition, the actinic ray-sensitive or radiation-sensitive composition may contain a dissolution inhibiting compound.

In order to prevent reduction in the transparency to light of 220 nm or less, the dissolution inhibiting compound is preferably an alicyclic or aliphatic compound containing an acid-decomposable group. Such a compound includes, for example, an acid-decomposable group-containing cholic acid derivative described in *Proceeding of SPIE,* 2724, 355 (1996). Incidentally, examples of the alicyclic structure and acid-decomposable group are the same as those described above for the alicyclic hydrocarbon-based acid-decomposable resin.

In the case where the composition according to the present invention is exposed to a KrF excimer laser or irradiated with an electron beam, the dissolution inhibiting compound preferably contains a structure where a phenolic hydroxyl group in a phenol compound is substituted with an acid-decomposable group. This phenol compound is preferably a compound containing from 1 to 9 phenol frameworks, more preferably from 2 to 6 phenol frameworks.

The molecular weight of the dissolution inhibiting compound is 3,000 or less, preferably from 300 to 3,000, more preferably from 500 to 2,500.

The amount of the dissolution inhibiting compound added is preferably from 3 to 50 mass %, more preferably from 5 to 40 mass %, based on the total solid content of the composition.

Specific examples of the dissolution inhibiting compound are illustrated below, but the present invention is not limited thereto.

[Chem. 166]

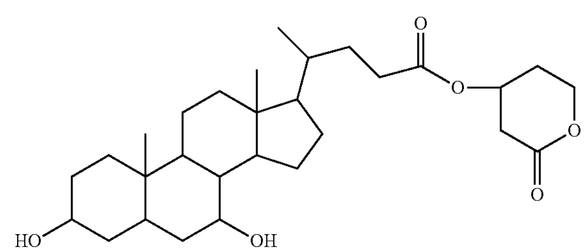

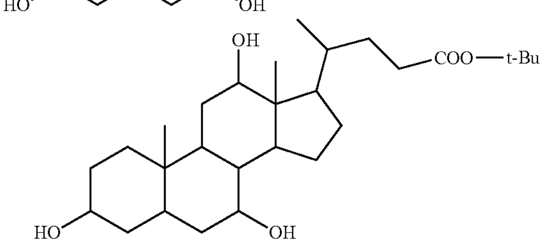

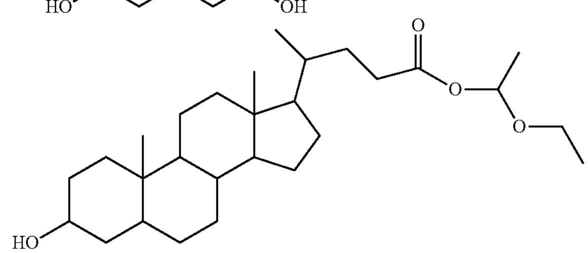

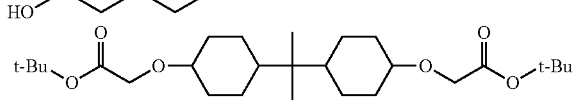

-continued

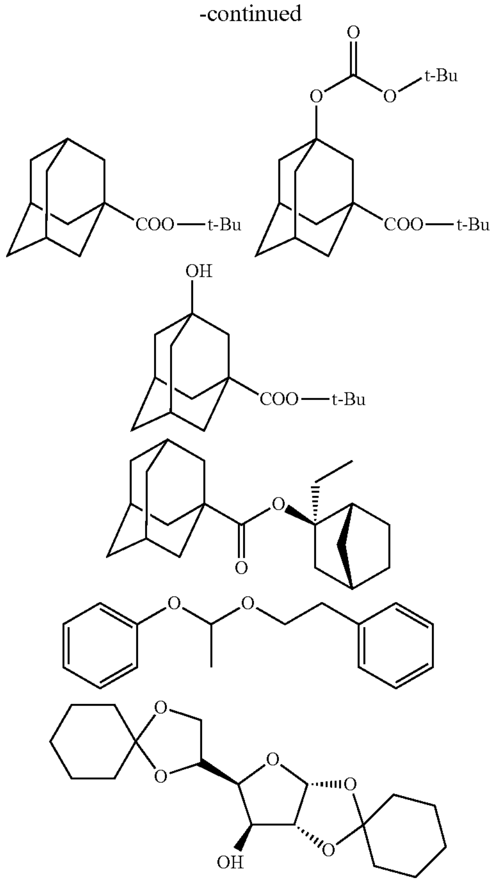

[6] (D) Acid Crosslinking Agent Capable of Crosslinking with the Alkali-Soluble Resin by an Action of Acid In the case of a negative resist composition, the actinic ray-sensitive or radiation-sensitive composition of the present invention preferably contains (D) a crosslinking agent (hereinafter, sometimes referred to as "acid crosslinking agent" or simply as "crosslinking agent").

The actinic ray-sensitive or radiation-sensitive composition of the present invention more preferably contains, as the crosslinking agent (D), a compound having two or more hydroxymethyl or alkoxymethyl groups in the molecule.

Preferred crosslinking agents include hydroxymethylated or alkoxymethylated phenol compounds, alkoxymethylated melamine-based compounds, alkoxymethyl glycoluril-based compounds, and alkoxymethylated urea-based compounds, and among these, hydroxymethylated or alkoxymethylated phenol compounds are more preferred, because a good pattern profile is obtained. The compound (D) particularly preferred as the crosslinking agent includes a phenol derivative having a molecular weight of 1,200 or less and containing, in the molecule, from 3 to 5 benzene rings and a total of two or more hydroxymethyl groups or alkoxymethyl groups, a melamine-formaldehyde derivative having at least two free N-alkoxymethyl groups, and an alkoxymethyl glycoluril derivative.

In view of the pattern profile, the actinic ray-sensitive or radiation-sensitive composition of the present invention preferably contains, as the crosslinking agent (C2), at least two compounds each having two or more alkoxymethyl groups in the molecule, more preferably contains at least two phenol compounds each having two or more alkoxymethyl groups in the molecule, and above all, of the at least two phenol compounds above, at least one phenol compound is preferably a phenol derivative having a molecular weight of 1,200 or less and containing, in the molecule, from 3 to 5 benzene rings and a total of two or more alkoxymethyl groups.

The alkoxymethyl group is preferably a methoxymethyl group or an ethoxymethyl group.

Out of the crosslinking agents above, the phenol derivative having a hydroxymethyl group can be obtained by reacting a corresponding phenol compound having no hydroxymethyl group with formaldehyde in the presence of a base catalyst. Also, the phenol derivative having an alkoxymethyl group can be obtained by reacting a corresponding phenol derivative having a hydroxymethyl group with an alcohol in the presence of an acid catalyst.

Among the thus-synthesized phenol derivatives, a phenol derivative having an alkoxymethyl group is preferred in view of sensitivity and storage stability.

Other preferred examples of the crosslinking agent include a compound having an N-hydroxymethyl group or an N-alkoxymethyl group, such as alkoxymethylated melamine-based compound, alkoxymethyl glycoluril-based compound and alkoxymethylated urea-based compound.

Such a compound includes hexamethoxymethylmelamine, hexaethoxymethylmelamine, tetramethoxymethyl glycoluril, 1,3-bismethoxymethyl-4,5-bismethoxyethyleneurea, bismethoxymethylurea, etc., and these are disclosed in EP 0,133,216A, German Patents 3,634,671 and 3,711,264, and EP 0,212,482A.

Among these crosslinking agents, particularly preferred are those illustrated below.

[Chem. 168]

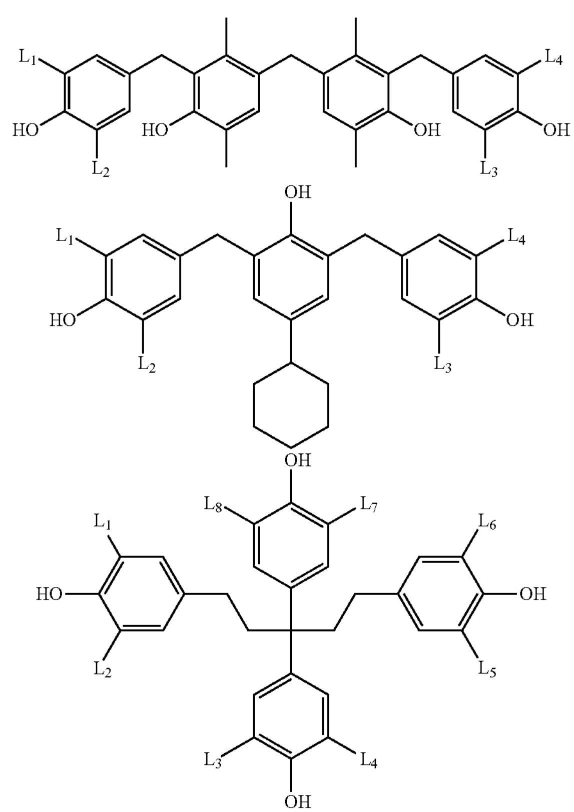

-continued

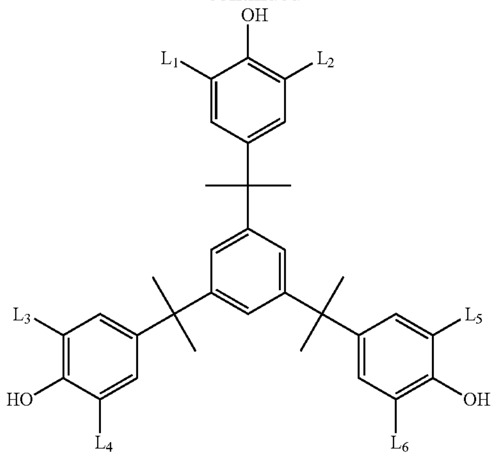

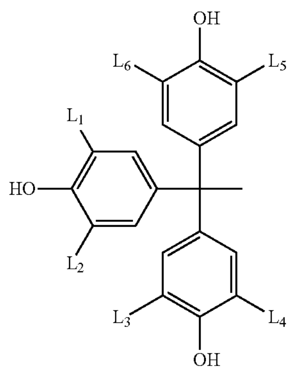

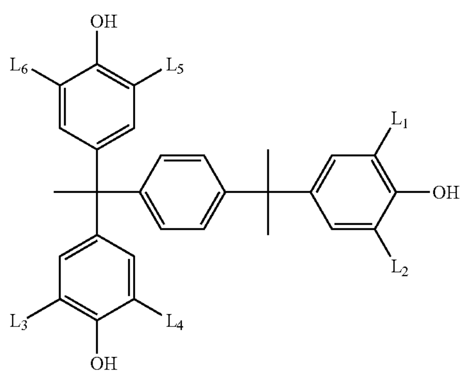

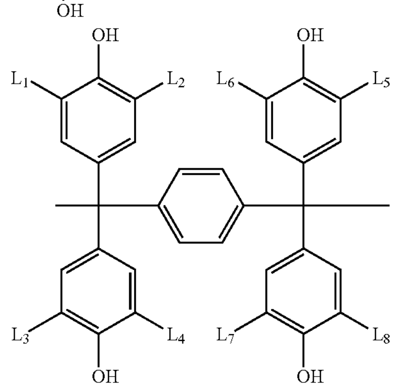

-continued

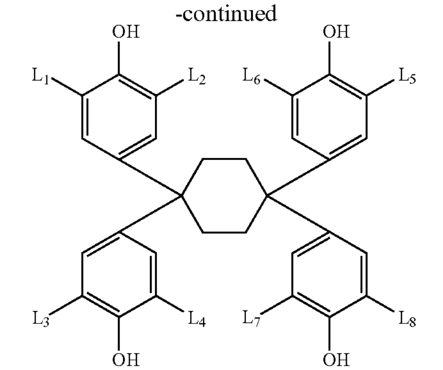

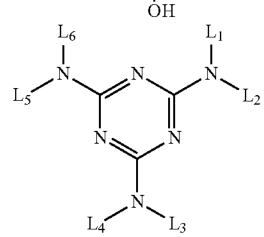

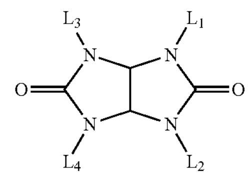

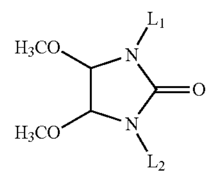

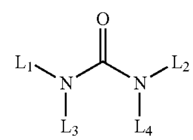

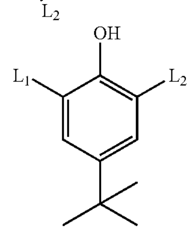

In these formulae, each of $L_1$ to $L_8$ independently represents a hydrogen atom, a hydroxymethyl group, a methoxymethyl group, an ethoxymethyl group, or an alkyl group having a carbon number of 1 to 6.

In the present invention, the crosslinking agent is used in an addition amount of preferably from 3 to 65 mass %, more preferably from 5 to 50 mass %, still more preferably from 5 to 30 mass %, based on the solid content of the actinic ray-sensitive or radiation-sensitive composition. When the amount of the crosslinking agent added is from 3 to 65 mass %, the residual film ratio and the resolution can be prevented from decreasing and at the same time, the stability during storage of the resist solution can be kept good.

In the present invention, one crosslinking agent may be used alone, or two or more crosslinking agents may be used in combination and in view of the pattern profile, two or more crosslinking agents are preferably used in combination.

For example, in the case of using the phenol derivative and additionally using another crosslinking agent, for example, using the above-described compound having an N-alkoxymethyl group in combination, the ratio between the phenol derivative and another crosslinking agent is, in terms of molar ratio, from 100/0 to 20/80, preferably from 90/10 to 40/60, more preferably from 80/20 to 50/50.

[7] Basic Compound

The composition according to the present invention preferably contains a basic compound so as to reduce the change of performance over time from exposure to heating. The basic compound fulfills a role in quenching a deprotection reaction by an acid generated upon exposure, and the diffusibility, basicity or the like of the compound can affect the practical acid diffusion.

Preferred basic compounds include an ammonium salt represented by the following formula (A) and basic compounds having a structure represented by the following formulae (B) to (E):

[Chem. 169]

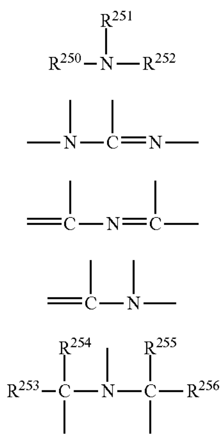

(A)

(B)

(C)

(D)

(E)

In formula (A), each of $R^{250}$, $R^{251}$ and $R^{252}$ independently represents a hydrogen atom, an alkyl group (preferably having a carbon number of 1 to 20), a cycloalkyl group (preferably having a carbon number of 3 to 20) or an aryl group (having a carbon number of 6 to 20). $R^{250}$ and $R^{251}$ may combine with each other to form a ring structure. Also, these groups may have a substituent.

The alkyl or cycloalkyl group having a substituent is preferably an aminoalkyl group having a carbon number of 1 to 20, an aminocycloalkyl group having a carbon number of 3 to 20, a hydroxyalkyl group having a carbon number of 1 to 20, or a hydroxycycloalkyl group having a carbon number of 3 to 20.

These groups may contain an oxygen atom, a sulfur atom or a nitrogen atom in the alkyl chain.

In formula (E), each of $R^{253}$ to $R^{256}$ independently represents an alkyl group (preferably having a carbon number of 1 to 6) or a cycloalkyl group (preferably having a carbon number of 3 to 6).

Preferred compounds include guanidine, aminopyrrolidine, pyrazole, pyrazoline, piperazine, aminomorpholine, aminoalkylmorpholine, and piperidine. These compounds may have a substituent.

More preferred compounds include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

The compound having an imidazole structure includes, for example, imidazole; 2,4,5-triphenylimidazole; and benzimidazole.

The compound having a diazabicyclo structure includes, for example, 1,4-diazabicyclo[2,2,2]octane; 1,5-diazabicyclo[4,3,0]non-5-ene; and 1,8-diazabicyclo[5,4,0]undec-7-ene.

The compound having an onium hydroxide structure includes, for example, a triarylsulfonium hydroxide, a phenacylsulfonium hydroxide, and a 2-oxoalkyl group-containing sulfonium hydroxide. The compound specifically includes, for example, triphenylsulfonium hydroxide, tris(tert-butylphenyl)sulfonium hydroxide, bis(tert-butylphenyl)iodonium hydroxide, phenacylthiophenium hydroxide, and 2-oxopropylthiophenium hydroxide.

The compound having an onium carboxylate structure is a compound where the anion moiety of the compound having an onium hydroxide structure is replaced by a carboxylate, and the compound includes, for example, an acetate, an adamantane-1-carboxylate, and a perfluoroalkyl carboxylate.

The compound having a trialkylamine structure includes, for example, tri(n-butyl)amine and tri(n-octyl)amine.

The aniline compound includes, for example, 2,6-diisopropylaniline and N,N-dimethylaniline.

The alkylamine derivative having a hydroxy group and/or an ether bond includes, for example, ethanolamine, diethanolamine, triethanolamine, and tris(methoxyethoxyethyl) amine.

The aniline derivative having a hydroxy group and/or an ether bond includes, for example, N,N-bis(hydroxyethyl) aniline.

Other basic compounds include at least one kind of a nitrogen-containing compound selected from a phenoxy group-containing amine compound and a phenoxy group-containing ammonium salt compound.

As for the amine compound, a primary, secondary or tertiary amine compound can be used, and an amine compound where at least one alkyl group is bonded to the nitrogen atom is preferred. The amine compound is more preferably a tertiary amine compound. In the amine compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom, in addition to the alkyl group.

The amine compound preferably contains an oxygen atom in the alkyl chain to have one or more oxyalkylene groups. The number of oxyalkylene groups is preferably from 3 to 9, more preferably from 4 to 6. The oxyalkylene group is preferably an oxyethylene group (—$CH_2CH_2O$—) or an oxypropylene group (—$CH(CH_3)CH_2O$— or —$CH_2CH_2CH_2O$—), more preferably an oxyethylene group.

In the ammonium salt compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom, in addition to the alkyl group.

The ammonium salt compound may contain an oxygen atom in the alkyl chain to have one or more oxyalkylene groups. The number of oxyalkylene groups is preferably from 3 to 9, more preferably from 4 to 6. The oxyalkylene group is preferably an oxyethylene group (—$CH_2CH_2O$—) or an oxypropylene group (—$CH(CH_3)CH_2O$— or —$CH_2CH_2CH_2O$—), more preferably an oxyethylene group.

The anion of the ammonium salt compound includes a halide, a sulfonate, a borate, a phosphate, a hydroxide, etc., and among others, a hydroxide is preferred.

The halide is preferably chloride, bromide or iodide.

The phenoxy group-containing amine compound is obtained, for example, by reacting a primary or secondary amine having a phenoxy group with a haloalkyl ether under heating and after adding an aqueous solution of a strong base such as sodium hydroxide, potassium hydroxide and tetraalkylammonium, extracting the reaction product with an organic solvent such as ethyl acetate and chloroform. The phenoxy group-containing amine compound may be also obtained by reacting a primary or secondary amine with a haloalkyl ether having a phenoxy group at the terminal under heating and after adding an aqueous solution of a strong base such as sodium hydroxide, potassium hydroxide and tetraalkylammonium, extracting the reaction product with an organic solvent such as ethyl acetate and chloroform.

In view of, sensitivity, roughness, stability and the like, an ammonium salt compound is preferably used as the basic compound, and it is most preferable to use a hydroxide of a quaternary ammonium salt compound.

One of these basic compounds may be used alone, or two or more thereof may be used in combination.

The molecular weight of the basic compound is preferably from 250 to 1,000, more preferably from 250 to 800, still more preferably from 400 to 800.

The content of the basic compound is preferably from 0.1 to 8.0 mass %, more preferably from 0.1 to 5.0 mass %, still more preferably from 0.1 to 4.0 mass %, based on the total solid content of the composition.

[8] Fluorine- and/or Silicon-Containing Surfactant

The composition according to the present invention preferably further contains a fluorine- and/or silicon-containing surfactant. The fluorine- and/or silicon-containing surfactant includes, for example, a fluorine-containing surfactant, a silicon-containing surfactant, a surfactant containing both a fluorine atom and a silicon atom, and a mixture thereof.

By virtue of containing a fluorine-containing and/or silicon-containing surfactant, the composition of the present invention can give a pattern with good sensitivity, resolution and adherence as well as little development defect when using an exposure light source of 250 nm or less, particularly 220 nm or less.

The commercially available surfactant that can be used includes, for example, a fluorine-containing or silicon-containing surfactant such as EFtop EF301 and EF303 (produced by Shin-Akita Kasei K.K.); Florad FC430 and 431 (produced by Sumitomo 3M Inc.); Megaface F171, F173, F176, F189 and $R^{08}$ (produced by DIC Corporation); Surflon S-382, SC101, 102, 103, 104, 105 and 106 (produced by Asahi Glass Co., Ltd.); and Troysol S-366 (produced by Troy Chemical). In addition, Polysiloxane Polymer KP-341 (produced by Shin-Etsu Chemical Co., Ltd.) may be also used as the silicon-containing surfactant.

Other than these known surfactants, a surfactant containing a polymer having a fluoroaliphatic group that is derived from a fluoroaliphatic compound produced by a telomerization process (also called telomer process) or an oligomerization process (also called oligomer process) may be also used. The fluoroaliphatic compound can be synthesized, for example, by the method described in JP-A-2002-90991.

The polymer having a fluoroaliphatic group is preferably a copolymer of a fluoroaliphatic group-containing monomer with a (poly(oxyalkylene)) acrylate or methacrylate and/or a (poly(oxyalkylene)) methacrylate, and the polymer may have an irregular distribution or may be a block copolymer.

The poly(oxyalkylene) group includes, for example, a poly (oxyethylene) group, a poly(oxypropylene) group, and a poly (oxybutylene) group. This group may also be a unit having alkylenes differing in the chain length within the same chain, such as block-linked poly(oxyethylene, oxypropylene and oxyethylene) and block-linked poly(oxyethylene and oxypropylene).

Furthermore, the copolymer of a fluoroaliphatic group-containing monomer with a (poly(oxyalkylene)) acrylate or methacrylate may also be a ternary or higher copolymer obtained by simultaneously copolymerizing two or more different fluoroaliphatic group-containing monomers or two or more different (poly(oxyalkylene)) acrylates or methacrylates.

Examples thereof include commercially available surfactants such as Megaface F-178, F-470, F-473, F-475, F-476 and F-472 (produced by DIC Corporation); a copolymer of a $C_6F_{13}$ group-containing acrylate or methacrylate with a (poly (oxyalkylene)) acrylate or methacrylate; a copolymer of a $C_6F_{13}$ group-containing acrylate or methacrylate with a (poly (oxyethylene)) acrylate or methacrylate and a (poly(oxypropylene)) acrylate or methacrylate; a copolymer of a $C_8F_{17}$ group-containing acrylate or methacrylate with a (poly(oxyalkylene)) acrylate or methacrylate; and a copolymer of a $C_8F_{17}$ group-containing acrylate or methacrylate with a (poly (oxyethylene)) acrylate or methacrylate and a (poly(oxypropylene)) acrylate or methacrylate.

The amount of the surfactant used is preferably from 0.0001 to 2 mass %, more preferably from 0.001 to 1 mass %, based on the total solid content of the composition.

[9] Organic Solvent

The composition according to the present invention is used by dissolving the components described above in a predetermined organic solvent.

The organic solvent that can be used includes, for example, ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone, and tetrahydrofuran.

The solvent having a ketone structure includes, for example, a chain ketone solvent and a cyclic ketone solvent. In view of coatability, a compound having a total carbon number of 5 to 8 is preferred.

The chain ketone solvent includes, for example, 2-heptanone, methyl ethyl ketone, and methyl isobutyl ketone. Among these, 2-heptanone is preferred.

The cyclic ketone solvent includes, for example, cyclopentanone, 3-methyl-2-cyclopentanone, cyclohexanone, 2-methylcyclohexanone, 2,6-dimethylcyclohexanone, cycloheptanone, cyclooctanone, and isophorone. Among these, cyclohexanone and cycloheptanone are preferred.

As the organic solvent, it is preferable to use a ketone structure-containing solvent alone or use a mixed solvent of a ketone structure-containing solvent and another solvent.

The another solvent (jointly-used solvent) mixed with a ketone structure-containing solvent includes, for example, a propylene glycol monoalkyl ether carboxylate, an alkyl lactate, a propylene glycol monoalkyl ether, an alkyl alkoxypropionate, and a lactone compound.

The propylene glycol monoalkyl ether carboxylate includes, for example, propylene glycol monomethyl ether acetate, propylene glycol monomethyl ether propionate, and propylene glycol monoethyl ether acetate.

The alkyl lactate includes, for example, methyl lactate and ethyl lactate.

The propylene glycol monoalkyl ether includes, for example, propylene glycol monomethyl ether and propylene glycol monoethyl ether.

The alkyl alkoxypropionate includes, for example, methyl methoxypropionate, ethyl methoxypropionate, methyl ethoxypropionate, and ethyl ethoxypropionate.

The lactone compound includes, for example, γ-butyrolactone.

Preferred jointly-used solvents include a propylene glycol monoalkyl ether carboxylate, an alkyl lactate, and a propylene glycol monoalkyl ether. More preferred jointly-used solvents include propylene glycol monomethyl ether acetate.

In view of film thickness uniformity and performance in terms of development defect, a high boiling-point solvent having a boiling point of 200° C. or more, such as ethylene carbonate and propylene carbonate, may also be mixed.

The amount of this high boiling-point solvent added is usually from 0.1 to 15 mass %, preferably from 0.5 to 10 mass %, more preferably from 1 to 5 mass %, based on all solvents.

In the present invention, the actinic ray-sensitive or radiation-sensitive resin composition is prepared by using an organic solvent, preferably a mixed solvent of two or more kinds of solvents.

The solid content concentration of the composition is usually from 1 to 25 mass %, preferably from 3 to 22 mass %, more preferably from 5 to 15 mass %.

[10] Other Additives

The composition according to the present invention may further contain, if desired, additives such as a dye, a plasticizer, a surfactant other than the above-described fluorine- and/or silicon-containing surfactants, a photosensitizer and a compound capable of promoting the solubility for a developer.

The compound capable of promoting the solubility for a developer (dissolution promoting compound) is, for example, a low molecular compound containing two or more phenolic OH groups or one or more carboxy groups and having a molecular weight of 1,000 or less. In the case of containing a carboxy group, an alicyclic or aliphatic compound is preferred.

The amount of the dissolution promoting compound added is preferably from 2 to 50 mass %, more preferably from 5 to 30 mass %, based on the above-described resin. From the standpoint of suppressing the development scum or preventing the pattern deformation at the time of development, this addition amount is preferably 50 mass % or less.

The phenol compound having a molecular weight of 1,000 or less can be easily synthesized by referring to the method described, for example, in JP-A-4-122938, JP-A-2-28531, U.S. Pat. No. 4,916,210 and European Patent 219294.

Specific examples of the alicyclic or aliphatic compound having a carboxy group include, but are not limited to, a carboxylic acid derivative having a steroid structure, such as cholic acid, deoxycholic acid and lithocholic acid, an adamantane carboxylic acid derivative, an adamantane dicarboxylic acid, a cyclohexanecarboxylic acid, and a cyclohexanedicarboxylic acid.

The surfactant other than the fluorine- and/or silicon-containing surfactants specifically includes a nonionic surfactant such as polyoxyethylene alkyl ethers, polyoxyethylene alkylallyl ethers, polyoxyethylene.polyoxypropylene block copolymers, sorbitan aliphatic esters and polyoxyethylene sorbitan aliphatic esters. One of these surfactants may be added alone, or two or more thereof may be added in combination.

[11] Pattern Forming Method

The pattern forming method using the composition according to the present invention is described below.

The composition according to the present invention is typically used by dissolving the components in a predetermined organic solvent, preferably the above-described mixed solvent, and coating the solution on a predetermined support. For example, the composition is applied to a substrate (e.g., silicon, silicon/silicon dioxide coat, silicon nitride, Cr layer-containing quartz) for use in the production of a precision integrated circuit device, an imprint mold structure or the like by an appropriate coating method such as spinner or coater. Thereafter, the coating is dried to obtain an actinic ray-sensitive or radiation-sensitive film (hereinafter, sometimes referred to as "resist film"). The drying temperature is preferably from 60 to 150° C., more preferably from 80 to 130° C. Incidentally, a known antireflection film may also be provided by coating.

Subsequently, the photosensitive film is irradiated with an actinic ray or radiation, then preferably baked (heated) and developed. In view of sensitivity and stability, the baking temperature is preferably from 80 to 150° C., more preferably from 90 to 130° C. By this baking, a good pattern can be obtained.

The actinic ray or radiation includes, for example, infrared light, visible light, ultraviolet light, far ultraviolet light, X-ray, and electron beam. An actinic ray or radiation having, for example, a wavelength of 250 nm or less, particularly 220 nm or less, is preferred. Such an actinic ray or radiation includes, for example, KrF excimer laser (248 nm), ArF excimer laser (193 nm), $F_2$ excimer laser (157 nm), X-ray, and electron beam. Particularly preferred actinic ray or radiation includes ArF excimer laser, $F_2$ excimer laser, EUV (13 nm), and electron beam.

Exposure where at the time of irradiation with an actinic ray or radiation, the gap between the photosensitive film and the lens is filled with a liquid (e.g., pure water) having a refractive index higher than that of air, namely, immersion exposure, may also be performed. By this exposure, the resolution can be enhanced. In this case, for preventing the resist film from coming into contact with the immersion liquid, a film (sometimes referred to as a "topcoat") sparingly soluble in the immersion liquid may be provided on the resist film to intervene between the resist film and the immersion liquid. As another means to avoid contact of the resist film with the immersion liquid, a hydrophobic resin (HR) may be previously added to the above-described composition. This hydrophobic resin (HR) specifically includes the resins and the like described in paragraphs 0172 to 0253 of US2008/0305432A1.

In the development step, an alkali developer is usually used.

The alkali developer includes, for example, an alkaline aqueous solution containing inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, or cyclic amines such as pyrrole and piperidine.

In the alkali developer, alcohols and/or a surfactant may be added each in an appropriate amount.

The alkali concentration of the alkali developer is usually from 0.1 to 20 mass %. The pH of the alkali developer is usually from 10.0 to 15.0.

As for the rinsing solution, pure water is used, and the pure water may be used after adding thereto an appropriate amount of a surfactant.

As the developing method, for example, a method of dipping the substrate in a bath filled with the developer for a fixed time (dipping method), a method of raising the developer on the substrate surface by the effect of a surface tension and keeping it still for a fixed time, thereby performing the development (puddling method), a method of spraying the developer on the substrate surface (spraying method), and a method of continuously ejecting the developer on the substrate spinning at a constant speed while scanning a developer ejecting nozzle at a constant rate (dynamic dispense method) may be applied.

In the rinsing step, the wafer after development is rinsed using a rinsing solution. The method for rinsing treatment is not particularly limited but, for example, a method of continuously ejecting the rinsing solution on the substrate spinning at a constant speed (spin coating method), a method of dipping the substrate in a bath filled with the rinsing solution for a fixed time (dipping method), and a method of spraying the rinsing solution on the substrate surface (spraying method) may be applied. Above all, it is preferable to perform the rinsing treatment by the spin coating method and after the rinsing, remove the rinsing solution from the substrate surface by spinning the substrate at a rotational speed of 2,000 to 4,000 rpm. It is also preferable to include a heating step (Post Bake) after the rinsing step. The developer and rinsing solution remaining between patterns as well as in the inside of the pattern are removed by the baking. The heating step after the rinsing step is performed at usually from 40 to 160° C., preferably from 70 to 95° C., for usually from 10 seconds to 3 minutes, preferably from 30 to 90 seconds.

After the development step or rinsing step, a treatment of removing the developer or rinsing solution adhering on the pattern by a supercritical fluid may be performed.

The pattern forming method of the present invention may also be used for a process where a resist film formed by coating the composition according to the present invention is exposed and then developed using a developer containing an organic solvent as the main component to obtain a negative pattern. As such a process, the process described, for example, in JP-A-2010-217884 may be used.

As the organic developer, a polar solvent such as ester-based solvent (e.g., butyl acetate, ethyl acetate), ketone-based solvent (e.g., 2-heptanone, cyclohexanone), alcohol-based solvent, amide-based solvent and ether-based solvent, and a hydrocarbon-based solvent may be used. The water content ratio in the organic developer as a whole is preferably less than 10 mass %, and it is more preferable to contain substantially no water.

For details of the process when fabricating an imprint mold by using the composition of the present invention, please refer to, for example, Japanese Patent No. 4,109,085, JP-A-2008-162101, and Yoshihiko Hirai (compiler), *Nanoimprint no Kiso to Gijutsu Kaihatsu•Oyo Tenkai-Nanoimprint no Kiban Gijutsu to Saishin no Gijutsu Tenkai* (*Basic and Technology Development•Application Expansion of Nanoimprint-Substrate Technology of Nanoimprint and Latest Technology Expansion*), Frontier Shuppan.

The present invention also relates to a photomask obtained by exposing and developing the resist-coated mask blanks. As for the exposure and development, the above-described steps are applied. The photomask is suitably used for the production of a semiconductor.

The photomask of the present invention may be a light transmitting mask used with an ArF excimer laser, etc. or may be a reflective mask used for reflective lithography using EUV light as the light source.

The present invention also relates to the above-described photosensitive film or resist-coated mask blanks and a resist pattern forming method involving exposing the film or resist-coated mask blanks and developing the exposed photosensitive film or resist-coated mask blanks. In the present invention, the exposure is preferably performed using an electron beam or an extreme-ultraviolet ray.

The present invention also relates to a manufacturing method of a semiconductor device, involving the above-described resist pattern forming method of the present invention, and a semiconductor device manufactured by this manufacturing method.

The semiconductor device of the present invention is suitably mounted on electric and electronic equipment (e.g., home electric appliances, OA•media-related devices, optical equipment, communication equipment).

EXAMPLES

The present invention is described in greater detail below by referring to Examples, but the contents of the present invention are not limited thereto.

Synthesis of Compound (α)

Synthesis Example 1

Synthesis of Compound (α1)

10 g of 3-methyl-1,3-butanediol was dissolved in 200 mL and after adding 14.6 g of triethylamine and 235 mg of 4-dimethylaminopyridine, 29.1 g of 2,4,6-triisopropylbenzenesulfonic acid chloride was added, followed by stirring at room temperature for 4 hours. The reaction solution was added with 100 mL of ethyl acetate and 100 mL of distilled water and transferred to a separating funnel to remove the aqueous layer. Thereafter, the organic layer was washed with 200 mL of distilled water three times, and the resulting organic layer was concentrated. The concentrate was purified by silica gel column chromatography (developing solvent: ethyl acetate/hexane (mass ratio)=10/1) and after removing the solvent by distillation under reduced pressure, vacuum-dried to obtain 30.7 g of Compound (α0).

$^{1}$H-NMR ($CDCl_3$: ppm) δ: 1.33-1.22 (18H, m), 1.92 (2H, t, J=7.1 Hz), 2.97-2.85 (1H, m), 4.20-4.10 (2H, m), 4.23 (2H, t, J=7.2 Hz), 7.18 (2H, s).

[Chem. 170]

Compound (α0)

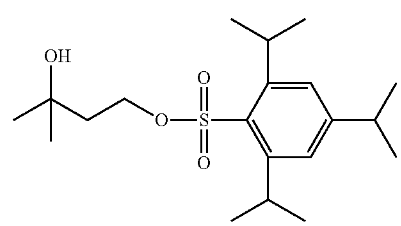

1.0 g of Compound (α0) was dissolved in 5 mL of acetonitrile, and 413 mg of acetic anhydride and 7.4 mg of cerium trifluoromethanesulfonate, followed by stirring at room temperature for 24 hours. The reaction solution was added with 50 mL of ethyl acetate and 50 mL of distilled water and transferred to a separating funnel to remove the aqueous layer. Thereafter, the organic layer was washed with 50 mL of distilled water three times, and the resulting organic layer was concentrated. The concentrate was purified by silica gel column chromatography (developing solvent: ethyl acetate/hexane=5/1) and after removing the solvent by distillation under reduced pressure, vacuum-dried to obtain 670 mg of Compound (a 1).

$^{1}$H-NMR ($CDCl_3$: ppm) δ: 1.54-1.25 (18H, m), 1.46 (6H, s), 1.90 (3H, m), 2.17 (2H, t, J=7.0 Hz), 2.93-2.90 (1H, m), 4.17-4.09 (4H, m), 7.19 (2H, s).

Compounds (α2) to (α14) were synthesized in the same manner by reacting an alcohol compound with an acid anhydride or an acid chloride in the presence of an acid catalyst.

Also, Compounds (αC1) to (αC4) for comparison were prepared as the compound not coming under formula (αI).

Furthermore, as to the volume of the sulfonic acid generated from these compounds, the value computed by the method described above using "WinMOPAC" produced by Fujitsu Limited is shown together with the structure of the compound in Tables 1 to 3 below. Incidentally, Compound (αC4) for comparison is a 1,4-diol derivative and does not function as an acid-increasing agent as described above, but on the assumption that the compound generates a sulfonic acid, the volume of the sulfonic acid is shown for descriptive purposes.

TABLE 1

(Compound (α) used in Examples)

| Compound | Chemical Formula | Volume of Acid Generated (Å$^3$) |
|---|---|---|
| Compound (α1) | 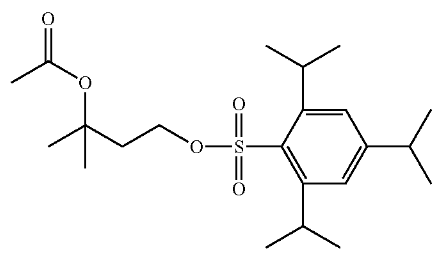 [SMILES: CC(=O)OC(C)(C)CCOS(=O)(=O)c1c(C(C)C)cc(C(C)C)cc1C(C)C] | 303 |
| Compound (α2) | 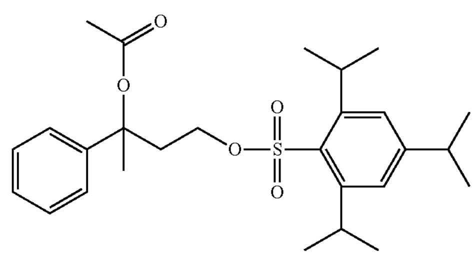 [SMILES: CC(=O)OC(C)(CCOS(=O)(=O)c1c(C(C)C)cc(C(C)C)cc1C(C)C)c1ccccc1] | 303 |
| Compound (α3) | 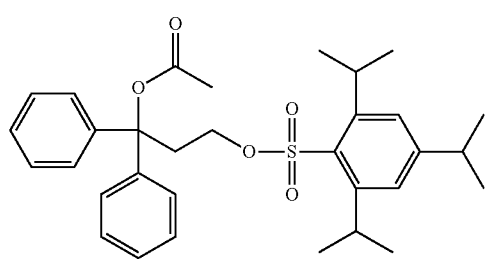 [SMILES: CC(=O)OC(CCOS(=O)(=O)c1c(C(C)C)cc(C(C)C)cc1C(C)C)(c1ccccc1)c1ccccc1] | 303 |
| Compound (α4) | 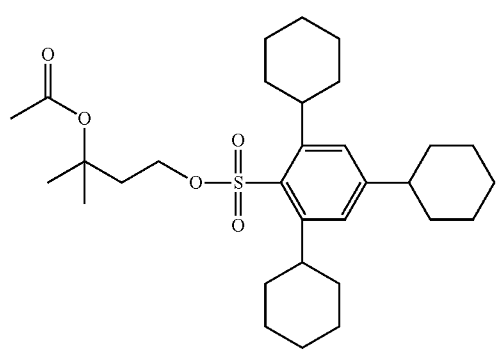 [SMILES: CC(=O)OC(C)(C)CCOS(=O)(=O)c1c(C2CCCCC2)cc(C2CCCCC2)cc1C1CCCCC1] | 437 |

TABLE 1-continued
| (Compound (α) used in Examples) | | |
|---|---|---|
| Compound | Chemical Formula | Volume of Acid Generated (Å$^3$) |
| Compound (α5) | 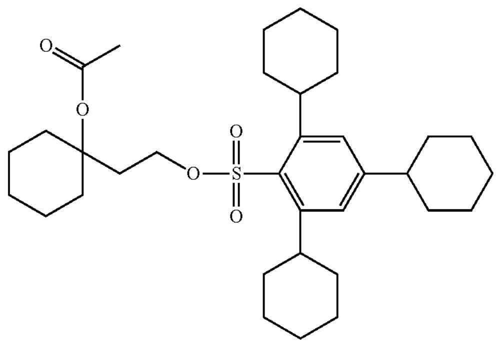 [SMILES: CC(=O)OC1(CCOS(=O)(=O)c2c(C3CCCCC3)cc(C3CCCCC3)cc2C2CCCCC2)CCCCC1] | 437 |
| Compound (α6) | 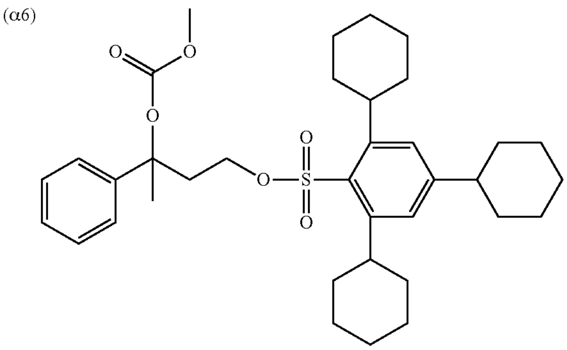 | 437 |
| Compound (α7) | 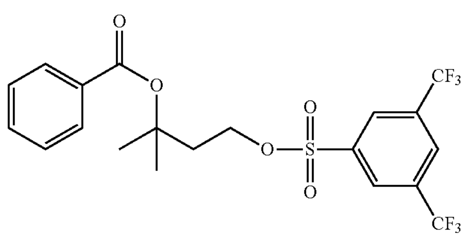 [SMILES: CC(C)(CCOS(=O)(=O)c1cc(C(F)(F)F)cc(C(F)(F)F)c1)OC(=O)c1ccccc1] | 168 |
TABLE 2
| (Cont. of Table 1, Compound (α) used in Examples) | | |
|---|---|---|
| Compound | Chemical Formula | Volume of Acid Generated (Å$^3$) |
| Compound (α8) | 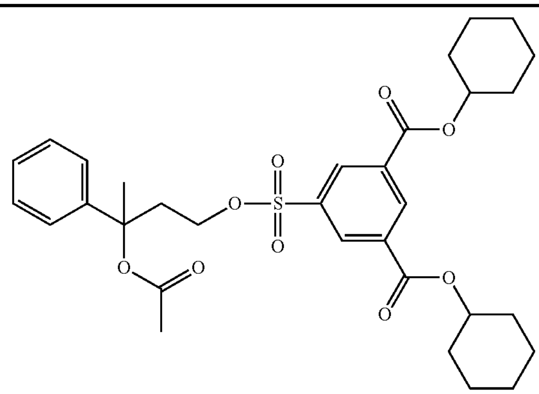 | 380 |

TABLE 2-continued
| (Cont. of Table 1, Compound (α) used in Examples) | | |
|---|---|---|
| Compound | Chemical Formula | Volume of Acid Generated (Å$^3$) |
| Compound (α9) | 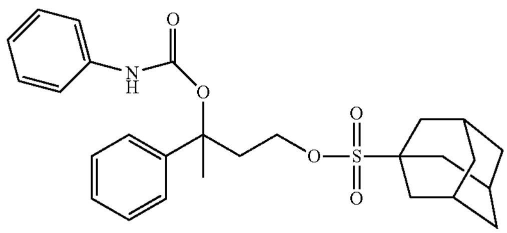 [SMILES: CC(CCOS(=O)(=O)C12CC3CC(CC(C3)C1)C2)(OC(=O)Nc1ccccc1)c1ccccc1] | 207 |
| Compound (α10) | 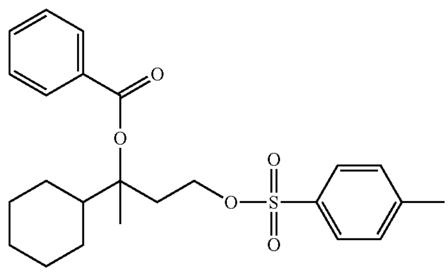 [SMILES: Cc1ccc(S(=O)(=O)OCCC(C)(OC(=O)c2ccccc2)C2CCCCC2)cc1] | 186 |
| Compound (α11) | 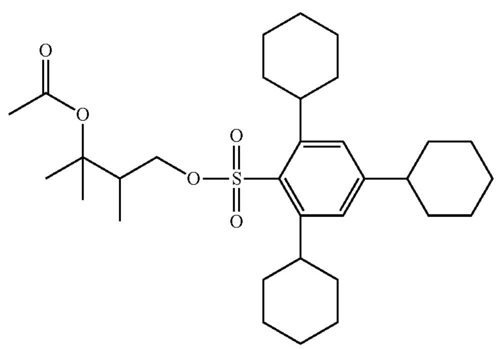 [SMILES: CC(=O)OC(C)(C)C(C)COS(=O)(=O)c1c(C2CCCCC2)cc(C2CCCCC2)cc1C1CCCCC1] | 437 |
| Compound (α12) | 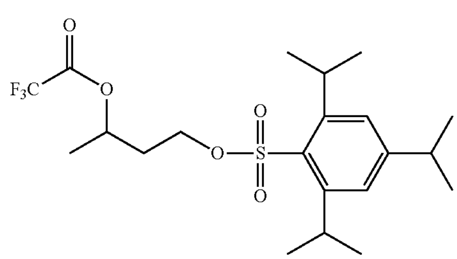 [SMILES: CC(CCOS(=O)(=O)c1c(C(C)C)cc(C(C)C)cc1C(C)C)OC(=O)C(F)(F)F] | 303 |
| Compound (α13) | 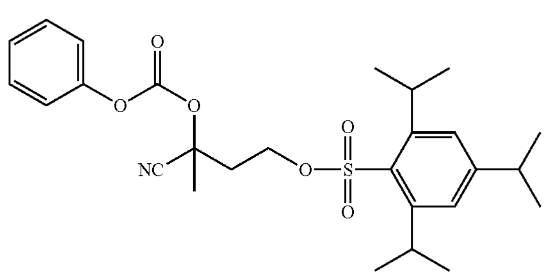 [SMILES: CC(C)c1cc(C(C)C)c(S(=O)(=O)OCCC(C)(C#N)OC(=O)Oc2ccccc2)c(C(C)C)c1] | 303 |

TABLE 2-continued
| (Cont. of Table 1, Compound (α) used in Examples) | | |
|---|---|---|
| Compound | Chemical Formula | Volume of Acid Generated (Å$^3$) |
| Compound (α14) | 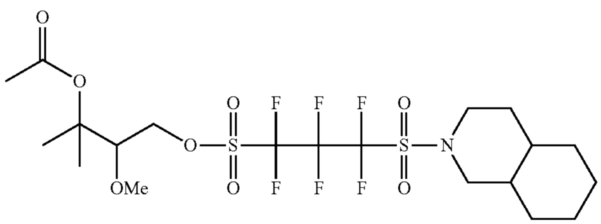 [SMILES: COC(COS(=O)(=O)C(F)(F)C(F)(F)C(F)(F)S(=O)(=O)N1CCC2CCCCC2C1)C(C)(C)OC(C)=O] | 311 |
TABLE 3
| (compounds used in Comparative Examples) | | |
|---|---|---|
| Compound | Chemical Formula | Volume of Acid Generated (Å$^3$) |
| Comparative Compound (αC1) | 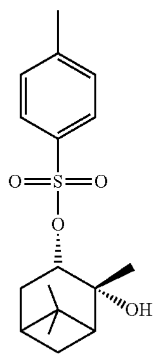 | 186 |
| Comparative Compound (αC2) | 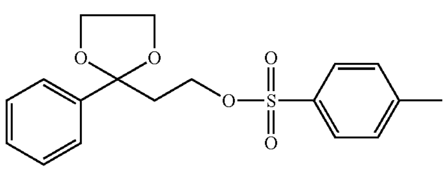 [SMILES: Cc1ccc(S(=O)(=O)OCCC2(c3ccccc3)OCCO2)cc1] | 186 |
| Comparative Compound (αC3) | 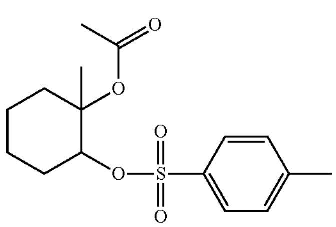 [SMILES: CC(=O)OC1(C)CCCCC1OS(=O)(=O)c1ccc(C)cc1] | 186 |
| Comparative Compound (αC4) | 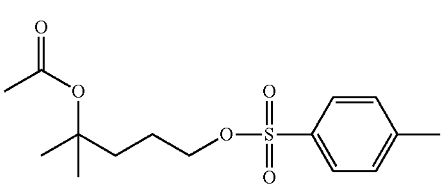 [SMILES: CC(=O)OC(C)(C)CCCOS(=O)(=O)c1ccc(C)cc1] | 186 |

Example 1P

Electron Beam Exposure

Positive (1) Preparation of Support

A Cr oxide-deposited 6-inch wafer (a wafer subjected to a shielding film treatment, which is used for normal photomask blanks) was prepared.

(2) Preparation of Resist Coating Solution (Formulation of Coating Solution of Positive Chemical Amplification Resist Composition P1)

| | |
|---|---|
| Compound (A1) | 0.3 g |
| Polymer Compound (Pol-4) | 9.7 g |
| Photoacid Generator z5 (the structural formula is shown below) | 0.3 g |
| Tetrabutylammonium hydroxide (basic compound) | 0.02 g |
| Surfactant PF6320 (produced by OMNOVA) | 0.01 g |
| Propylene glycol monomethyl ether acetate (solvent) | 18.0 g |

The solution of the composition above was microfiltered through a polytetrafluoroethylene filter having a pore size of 0.04 μm to obtain a resist coating solution having a solid content concentration of 3.84 mass %.

(3) Formation of Resist Film

The resist coating solution was coated on the 6-inch wafer by using a spin coater, Mark 8, manufactured by Tokyo Electron Ltd. and dried at 110° C. for 90 seconds on a hot plate to obtain a resist film having a thickness of 100 nm. That is, a resist-coated mask blanks was obtained.

(4) Production of Positive Resist Pattern

This resist film was patternwise irradiated using an electron beam lithography apparatus (ELS-7500, manufactured by Elionix Inc., accelerating voltage: 50 keV). After the irradiation, the resist film was heated at 120° C. for 90 seconds on a hot plate, dipped in an aqueous 2.38 mass % tetramethylammonium hydroxide (TMAH) solution for 60 seconds, rinsed with water for 30 seconds and dried.

(5) Evaluation of Resist Pattern

The obtained pattern was evaluated for the sensitivity, resolution, pattern profile, line edge roughness (LER) and dry etching resistance by the following methods.

[Sensitivity]

The cross-sectional profile of the pattern obtained was observed using a scanning electron microscope (S-4300, manufactured by Hitachi, Ltd.), and the exposure dose (dose of electron beam irradiation) when resolving a resist pattern with a line width of 100 nm (line:space=1:1) was taken as the sensitivity. A smaller value indicates higher sensitivity.

[Evaluation of Resolution (LS)]

The limiting resolution (the minimum line width below which the line and the space were not separated and resolved) at the exposure dose (dose of electron beam irradiation) giving the sensitivity above was taken as the LS resolution.

[Evaluation of Resolution (IL)]

The limiting resolution (the minimum line width below which the line and the space were not separated and resolved) at the minimum irradiation dose when resolving an isolated line pattern with a line width of 100 nm (line:space=1:>100) was taken as the IL resolution (nm).

[Pattern Profile]

The cross-sectional profile of a line pattern (L/S=1/1) with a line width of 100 nm at the exposure dose (dose of electron beam irradiation) giving the sensitivity above was observed using a scanning electron microscope (S-4300, manufactured by Hitachi, Ltd.). The cross-sectional profile of the line pattern was rated "forward tapered" when the ratio represented by [line width in the bottom part (at the bottom) of line pattern/line width in the middle of line pattern (at the position of half the height of line pattern)] is 1.5 or more, rated "slightly forward tapered" when the ratio above is from 1.2 to less than 1.5, and rated "rectangular" when the ratio is less than 1.2.

[Line Edge Roughness (LER)]

A line pattern (L/S=1/1) having a line width of 100 nm was formed with the irradiation dose (dose of electron beam irradiation) giving the sensitivity above. At arbitrary 30 points included in its longitudinal 50 μm region, the distance from the reference line where the edge should be present was measured using a scanning electron microscope (S-9220, manufactured by Hitachi, Ltd.). The standard deviation of measured distances was determined, and 3σ was computed. A smaller value indicates better performance.

[Evaluation of Scum]

A line pattern was formed by the same method as in [Pattern Profile] above. Thereafter, its cross-sectional SEM was obtained using S4800 (manufactured by Hitachi High-Technologies Corporation), and the scum in the space portion was observed and rated as follows.

C: Scum was observed and patterns were partially connected.

B: Scum was observed but patterns were not connected.

A: Scum was not observed.

[Evaluation of Dry Etching Resistance]

An unexposed resist film was subjected to dry etching for 30 seconds by using an $Ar/C_4F_6/O_2$ gas (a mixed gas in a volume ratio of 100/4/2) in HITACHI U-621. Thereafter, the residual resist film ratio was measured and used as an indicator of dry etching resistance.

Very good: Residual film ratio of 95% or more.

Good: Less than 95% and 90% or more.

Bad: Less than 90%.

[Aging Stability]

Each composition was stored at room temperature over 1 month, and the degree of variation in the sensitivity (the sensitivity measured in [Sensitivity] above) between before and after the storage was evaluated. This evaluation was performed based on the following criteria.

(Criteria)

A (Good): The variation in sensitivity was less than 1 $\mu C/cm^2$.

B (Fair): The variation in sensitivity was 1 $\mu C/cm^2$ or more and 3 $\mu C/cm^2$ or less.

C (Insufficient): The variation in sensitivity was more than 3 $\mu C/cm^2$.

[Example 2P] to [Example 28P] and [Comparative Example 1P] and [Comparative Example 5P]

Preparation of a resist solution having a solid content concentration of 3.84 mass % (Positive Resist Compositions P2 to P28, Comparative Positive Resist Compositions P1 and P5), positive pattern formation and evaluation thereof were performed in the same manner as in Example 1P except for using the components shown in Tables 4 to 6 below in the resist solution formulation.

TABLE 4

[Electron Beam Exposure; positive]

| Composition | Acid Generator | Acid-Increasing Agent | Resin (γ) | Basic Compound (0.02 g) | Surfactant (0.1 mass %)* | Solvent (mass ratio) |
|---|---|---|---|---|---|---|
| P1 | z5 (0.3 g) | α1 (0.3 g) | Pol-4 (9.7 g) | B1 | W-1 | S1 |
| P2 | z5 (0.3 g) | α2 (0.3 g) | Pol-4 (9.7 g) | B1 | W-1 | S1/S2 (6/4) |
| P3 | z5 (0.3 g) | α3 (0.3 g) | Pol-4 (9.7 g) | Bl | W-1 | S1/S2 (6/4) |
| P4 | z5 (0.3 g) | α4 (0.3 g) | Pol-4 (9.7 g) | B1 | W-1 | S1/S2 (6/4) |
| P5 | z5 (0.3 g) | α5 (0.3 g) | Pol-4 (9.7 g) | B1 | W-1 | S1/S2 (6/4) |
| P6 | z5 (0.3 g) | α6 (0.3 g) | Pol-4 (9.7 g) | B1 | W-1 | S1/S2 (6/4) |
| P7 | z5 (0.3 g) | α7 (0.3 g) | Pol-4 (9.7 g) | B1 | W-1 | S1/S2 (6/4) |
| P8 | z5 (0.3 g) | α8 (0.3 g) | Pol-4 (9.7 g) | B1 | W-1 | S1/S2 (6/4) |
| P9 | z5 (0.3 g) | α9 (0.3 g) | Pol-4 (9.7 g) | B1 | W-1 | S1/S2 (6/4) |
| P10 | z5 (0.3 g) | α10 (0.3 g) | Pol-4 (9.7 g) | B1 | W-1 | S1/S2 (6/4) |
| P11 | z5 (0.3 g) | α11 (0.3 g) | Pol-4 (9.7 g) | B1 | W-1 | S1/S2 (6/4) |
| P12 | z5 (0.3 g) | α12 (0.3 g) | Pol-4 (9.7 g) | B1 | W-1 | S1/S2 (6/4) |
| P13 | z67 (0.3 g) | α1 (0.3 g) | Pol-5 (9.7 g) | B1 | W-1 | S1/S4 (6/4) |
| P14 | z68 (0.3 g) | α1 (0.3 g) | Pol-6 (9.7 g) | B5 | W-1 | S1/S3 (6/4) |
| P15 | z61 (0.3 g) | α1 (0.3 g) | Pol-9 (9.7 g) | B2 | W-1 | S1/S5 (6/4) |

*The content (0.1 mass %) of surfactant is the content based on the total amount of solid matters in the resist composition. In the following Tables, the same applies.

TABLE 5

(Cont. of Table 4)

| Composition | Acid Generator | Acid-Increasing Agent | Resin (γ) | Basic Compound (0.02 g) | Surfactant (0.1 mass %) | Solvent (mass ratio) |
|---|---|---|---|---|---|---|
| P16 | z63 (0.3 g) | α1 (0.3 g) | Pol-11 (9.7 g) | B2 | W-1 | S1/S2/S6 (6/3/1) |
| P17 | z42 (0.3 g) | α1 (0.3 g) | Pol-10 (9.7 g) | B2 | W-2 | S1/S7 (6/4) |
| P18 | z67 (0.3 g) | α1 (0.3 g) | Pol-2 (9.7 g) | B3 | W-2 | S1/S2 (6/4) |
| P19 | z67 (0.3 g) | α1 (0.3 g) | Pol-3 (9.7 g) | B4 | W-3 | S1/S2 (6/4) |
| P20 | z67 (0.3 g) | α1 (0.3 g) | Pol-7 (9.7 g) | B5 | W-1 | S1/S2 (6/4) |
| P21 | z67 (0.3 g) | α1 (0.3 g) | Pol-8 (9.7 g) | B3 | W-3 | S1/S2 (6/4) |
| P22 | z37 (0.5 g) | α4 (0.3 g) | Pol-11 (9.7 g) | B4 | none | S1/S2 (6/4) |
| P23 | z45 (0.5 g) | α4 (0.3 g) | Pol-10 (9.7 g) | B5 | none | S1/S2 (6/4) |
| P24 | z66 (0.5 g) | α4 (0.3 g) | Pol-9 (9.7 g) | B6 | none | S1/S2 (6/4) |
| P25 | z65 (0.5 g) | α4 (0.3 g) | Pol-2 (9.7 g) | B6 | none | S1/S2 (6/4) |
| P26 | z5 (0.3 g) | α13 (0.3 g) | Pol-4 (9.7 g) | B1 | W-1 | S1/S2 (6/4) |
| P27 | z5 (0.3 g) | α14 (0.3 g) | Pol-4 (9.7 g) | B1 | W-1 | S1/S2 (6/4) |
| P28 | z5/z63 (0.2 g/0.1 g) | α1/α3 (0.2 g/0.1 g) | Pol-4/ Pol-5 (4.7 g/5.0 g) | B1 | W-1 | S1/S2 (6/4) |

TABLE 6

| (Cont. of Table 4) | | | | | | |
|---|---|---|---|---|---|---|
| Composition | Acid Generator | Acid-Increasing Agent | Resin (γ) | Basic Compound (0.02 g) | Surfactant (0.1 mass %) | Solvent (mass ratio) |
| Comparative Composition P1 | z48 (0.3 g) | none | Pol-1 (9.7 g) | B2 | W-1 | S1/S2 (6/4) |
| Comparative Composition P2 | z48 (0.3 g) | Comparative αC1 (0.3 g) | Pol-1 (9.7 g) | B2 | W-1 | S1/S2 (6/4) |
| Comparative Composition P3 | z48 (0.3 g) | Comparative αC2 (0.3 g) | Pol-1 (9.7 g) | B2 | W-1 | S1/S2 (6/4) |
| Comparative Composition P4 | z48 (0.3 g) | Comparative αC3 (0.3 g) | Pol-1 (9.7 g) | B2 | W-1 | S1/S2 (6/4) |
| Comparative Composition P5 | z48 (0.3 g) | Comparative αC4 (0.3 g) | Pol-1 (9.7 g) | B2 | W-1 | S1/S2 (6/4) |

Abbreviations of materials except for those shown before, which are used in Examples/Comparative Examples, are shown below.

[Acid Generator (Compound (B))]

[Chem. 171]

(z2)

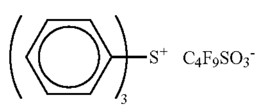

113Å3

(z5)

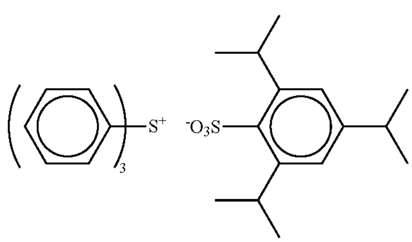

303Å3

(z8)

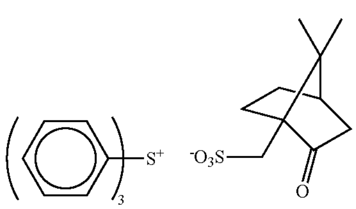

216Å3

(z37)

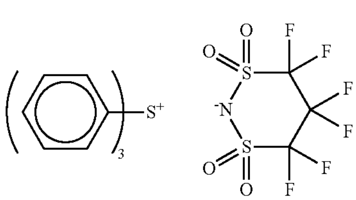

136Å3

-continued (z42)

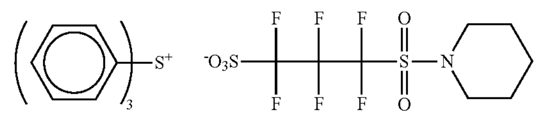

244Å3

(z45)

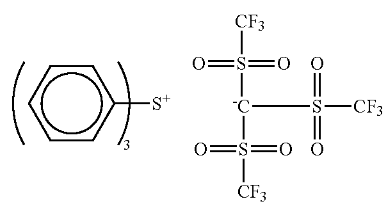

189Å3

(z48)

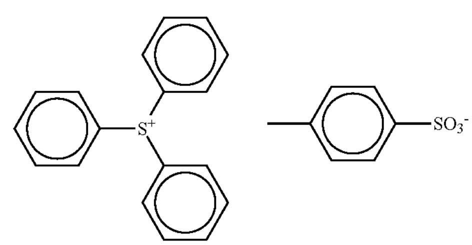

186Å3

(z49)

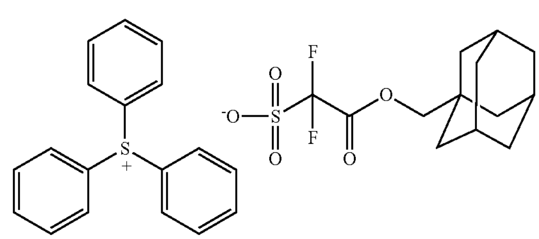

271Å3

(z61)
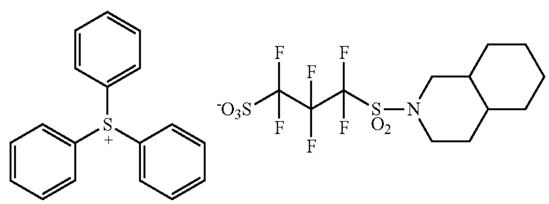
311Å$^3$
(z63)
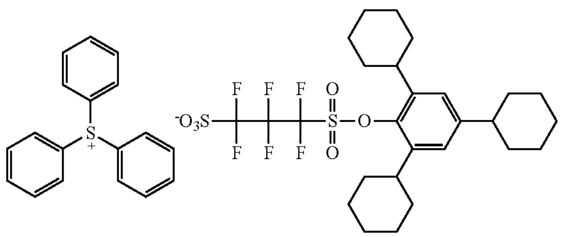
535Å$^3$
(z65)
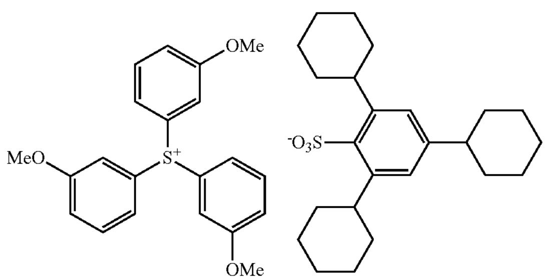
437Å$^3$
(z66)
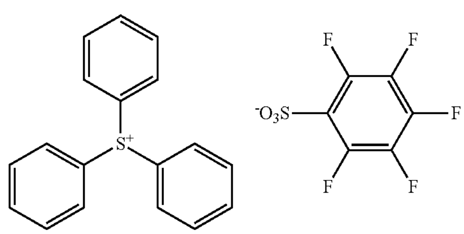
127Å$^3$
(z67)
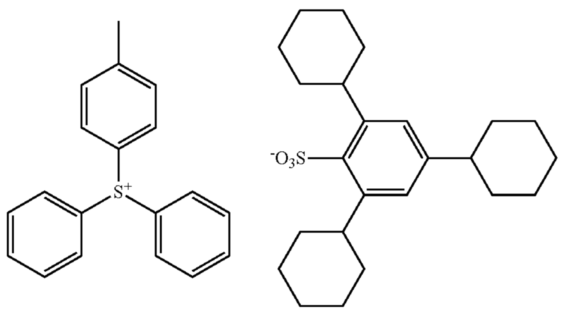
437Å$^3$
(z68)
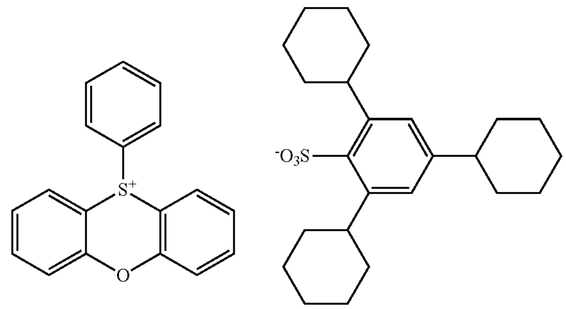
427Å$^3$
[Resin (γ)]
[Chem. 172]
Pol-1
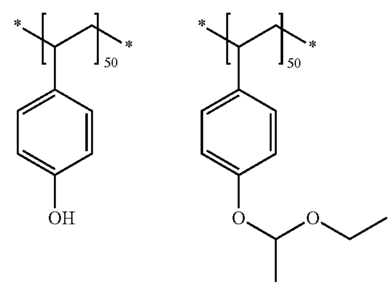
Mw = 12000, Mw/Mn = 1.2
Pol-2
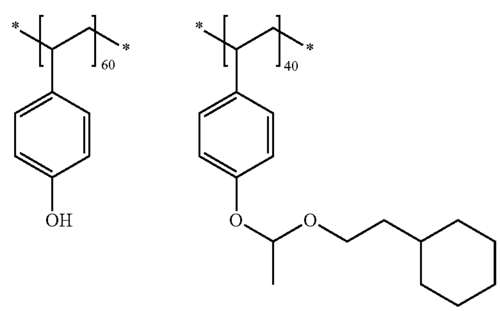
Mw = 4800, Mw/Mn = 1.2
Pol-3
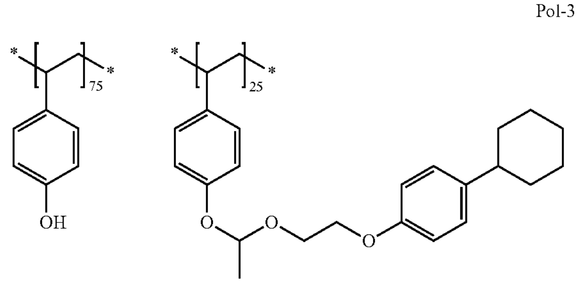
Mw = 11000, Mw/Mn = 1.1

-continued
Pol-4
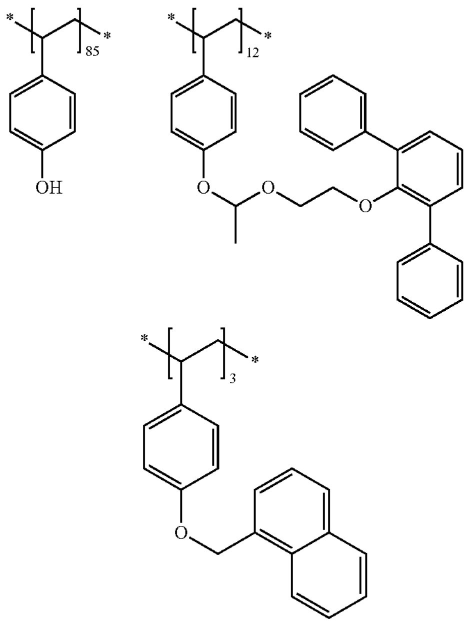
Mw = 11000, Mw/Mn = 1.1
Pol-5
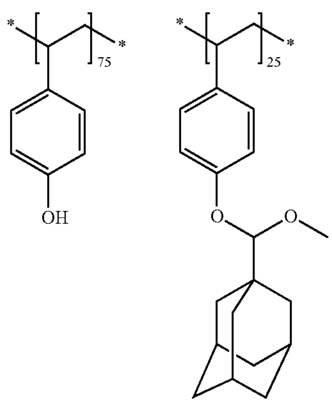
Mw = 4800, Mw/Mn = 1.2
Pol-6
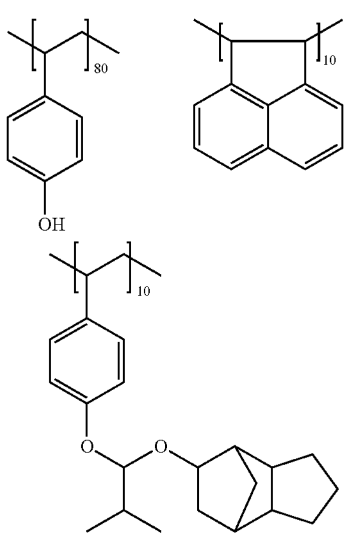
Mw = 5500, Mw/Mn = 1.5
-continued
[Chem. 173]
Pol-7
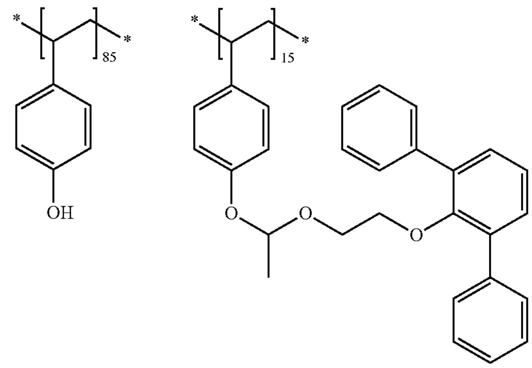
Mw = 10000, Mw/Mn = 1.1
Pol-8
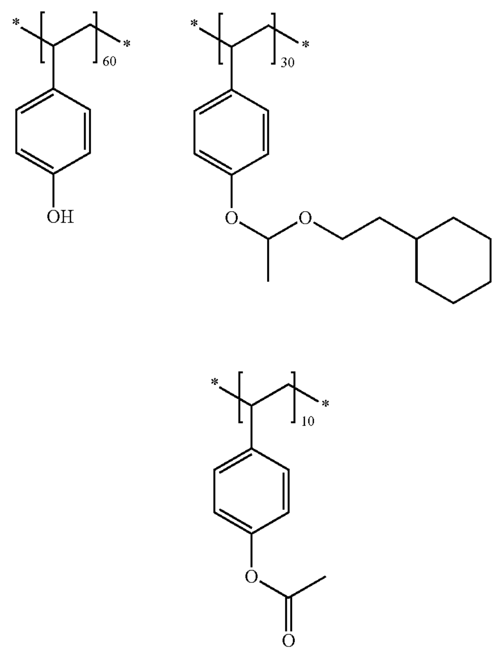
Mw = 4800, Mw/Mn = 1.1
Pol-9
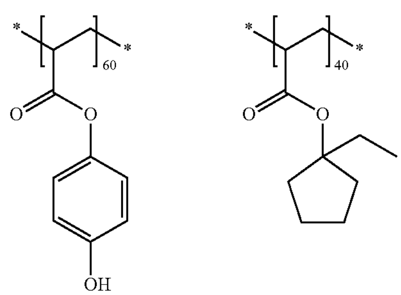
Mw = 4800, Mw/Mn = 1.3

-continued

Pol-10

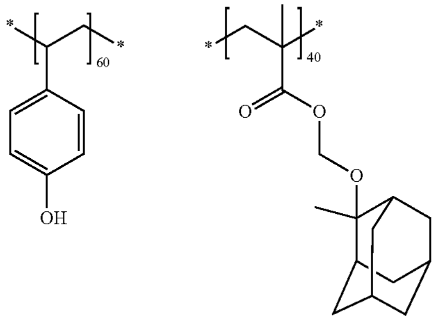

Mw = 5700, Mw/Mn = 1.3

Pol-11

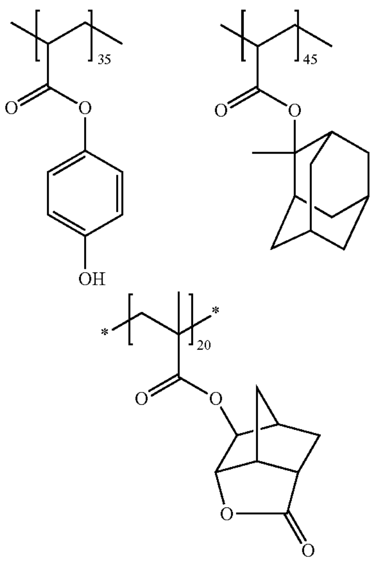

Mw =6500, Mw/Mn = 1.3

[Basic Compound]

B1: Tetrabutylammonium hydroxide

B2: Tri(n-octyl)amine

B3: 2,4,5-Triphenylimidazole

[Chem. 174]

B4

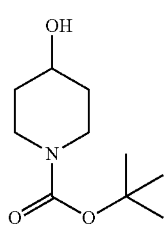

-continued

B5

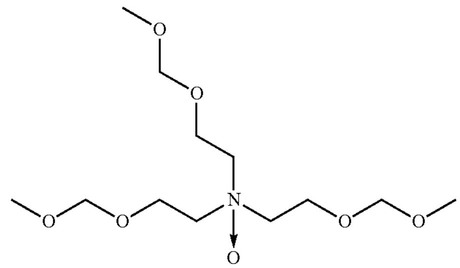

B6

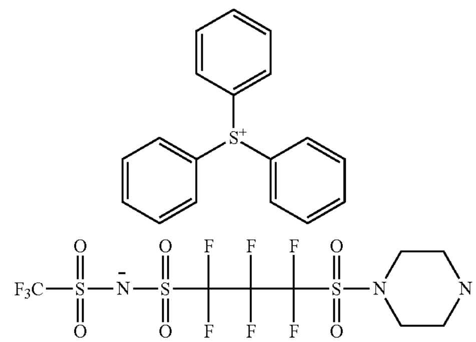

[Surfactant]

W-1: PF6320 (produced by OMNOVA)

W-2: Megaface F176 (produced by Dainippon Ink & Chemicals, Inc.; fluorine-containing)

W-3: Polysiloxane Polymer KP-341 (produced by Shin-Etsu Chemical Co., Ltd.; silicon-containing)

[Solvent]

S1: Propylene glycol monomethyl ether acetate (1-methoxy-2-acetoxypropane)

S2: Propylene glycol monomethyl ether (1-methoxy-2-propanol)

S3: 2-Heptanone

S4: Ethyl lactate

S5: Cyclohexanone

S6: γ-Butyrolactone

S7: Propylene carbonate

The evaluation results are shown in Table 7.]

TABLE 7

(Electron Beam Exposure; positive)

| Example | Composition | Sensitivity ($\mu C/cm^2$) | LS Resolution (nm) | IL Resolution (nm) | Pattern Profile | LER (nm) | Scum | Dry Etching Resistance | Aging Stability |
|---|---|---|---|---|---|---|---|---|---|
| 1P | P1 | 10.8 | 50 | 45 | rectangular | 4.5 | A | very good | A |
| 2P | P2 | 10.9 | 50 | 45 | rectangular | 4.5 | A | very good | A |

TABLE 7-continued (Electron Beam Exposure; positive)

| Example | Composition | Sensitivity (μC/cm$^2$) | LS Resolution (nm) | IL Resolution (nm) | Pattern Profile | LER (nm) | Scum | Dry Etching Resistance | Aging Stability |
|---|---|---|---|---|---|---|---|---|---|
| 3P | P3 | 10.7 | 50 | 45 | rectangular | 4.5 | A | very good | A |
| 4P | P4 | 10.7 | 50 | 45 | rectangular | 4.5 | A | very good | A |
| 5P | P5 | 10.8 | 50 | 45 | rectangular | 4.5 | A | very good | A |
| 6P | P6 | 10.8 | 50 | 45 | rectangular | 4.5 | A | very good | A |
| 7P | P7 | 10.7 | 50 | 50 | rectangular | 4.5 | A | very good | B |
| 8P | P8 | 10.8 | 50 | 45 | rectangular | 4.5 | A | very good | A |
| 9P | P9 | 10.9 | 50 | 50 | rectangular | 4.5 | A | very good | A |
| 10P | P10 | 10.8 | 50 | 50 | rectangular | 4.5 | A | very good | B |
| 11P | P11 | 10.8 | 50 | 45 | rectangular | 4.5 | A | very good | A |
| 12P | P12 | 10.8 | 50 | 45 | rectangular | 4.5 | A | very good | A |
| 13P | P13 | 10.7 | 50 | 45 | rectangular | 4.5 | A | very good | A |
| 14P | P14 | 10.8 | 50 | 45 | rectangular | 5.0 | A | very good | A |
| 15P | P15 | 10.8 | 50 | 45 | slightly forward tapered | 5.0 | A | good | A |
| 16P | P16 | 10.6 | 50 | 45 | slightly forward tapered | 5.0 | A | good | A |
| 17P | P17 | 10.8 | 50 | 45 | slightly forward tapered | 5.0 | A | good | A |
| 18P | P18 | 10.6 | 50 | 45 | rectangular | 5.0 | A | good | A |
| 19P | P19 | 10.6 | 50 | 45 | rectangular | 5.0 | A | very good | A |
| 20P | P20 | 10.8 | 50 | 45 | rectangular | 5.0 | A | very good | A |
| 21P | P21 | 10.8 | 50 | 45 | rectangular | 5.0 | A | good | A |
| 22P | P22 | 10.8 | 55 | 45 | slightly forward tapered | 5.0 | A | very good | A |
| 23P | P23 | 10.8 | 55 | 45 | slightly forward tapered | 5.0 | A | very good | A |
| 24P | P24 | 10.8 | 55 | 45 | slightly forward tapered | 4.5 | A | very good | A |
| 25P | P25 | 10.8 | 50 | 45 | rectangular | 4.5 | A | Good | A |
| 26P | P26 | 10.8 | 50 | 45 | rectangular | 4.5 | A | very good | A |
| 27P | P27 | 10.8 | 50 | 50 | rectangular | 4.5 | A | very good | B |
| 28P | P28 | 10.8 | 50 | 45 | rectangular | 4.5 | A | very good | A |
| Comparative Example 1P | Comparative Composition P1 | 12.9 | 70 | 80 | forward tapered | 6.5 | C | bad | A |
| Comparative Example 2P | Comparative Composition P2 | 12.9 | 70 | 80 | slightly forward tapered | 6.0 | B | bad | C |
| Comparative Example 3P | Comparative Composition P3 | 12.9 | 70 | 80 | slightly forward tapered | 6.0 | B | bad | C |
| Comparative Example 4P | Comparative Composition P4 | 13.9 | 70 | 80 | slightly forward tapered | 6.0 | C | bad | C |
| Comparative Example 5P | Comparative Composition P5 | 14.9 | 70 | 80 | slightly forward tapered | 6.0 | C | bad | C |

As apparent from the results shown in Table 7, in Comparative Example 1P not using an acid-increasing agent and in Comparative Examples 2P to 5P using an acid-increasing agent not satisfying formula (I), the sensitivity, resolution, pattern profile, LER and dry etching resistance are poor. In addition, in Comparative Examples 1P, 4P and 5P, the reduction in scum is also poor, and in Comparative Examples 2P to 5P, the aging stability is also poor.

On the other hand, in Examples 1P to 28P using an acid-increasing agent satisfying formula (I), it is seen that the reduction in scum is particularly excellent and the sensitivity, resolution, pattern profile, LER performance, dry etching resistance and aging stability are excellent.

Example as Positive Chemical Amplification Resist

EUV

Examples 1Q to 9Q and Comparative Examples 1Q to 5Q

Preparation of Resist Solution

The positive resist composition shown in Table 8 below was filtered through a polytetrafluoroethylene filter having a pore size of 0.04 μm to prepare a positive resist solution having a solid content concentration of 3.84 mass %.

(Evaluation of Resist)

The prepared positive resist solution was uniformly coated on a hexamethyldisilazane-treated silicon substrate by using a spin coater and heated/dried at 100° C. for 60 seconds on a hot plate to form a resist film having a thickness of 0.05 μm.

With respect to the resist film obtained, the sensitivity, resolution, pattern profile, line edge roughness (LER) and dry etching resistance were evaluated by the following methods.

[Sensitivity]

The obtained resist film was exposed using EUV light (wavelength: 13 nm) through a reflective mask having a 1:1 line-and-space pattern with a line width of 100 nm by changing the exposure dose in steps of 0.1 mJ/cm$^2$ in the range of 0 to 20.0 mJ/cm$^2$, then baked at 110° C. for 90 seconds and thereafter, developed with an aqueous 2.38 mass % tetramethylammonium hydroxide (TMAH) solution.

The exposure dose for reproducing the line-and-space (L/S=1/1) mask pattern with a line width of 100 nm was taken as the sensitivity. A smaller value indicates higher sensitivity.

[Resolution]

The limiting resolution (the minimum line width below which the line and the space were not separated and resolved) at the exposure dose giving the sensitivity above was taken as the resolution (nm).

[Pattern Profile]

The cross-sectional profile of a line pattern (L/S=1/1) with a line width of 100 nm at the exposure dose giving the sensitivity above was observed using a scanning electron microscope (S-4300, manufactured by Hitachi, Ltd.). The cross-sectional profile of the line pattern was rated "forward tapered" when the ratio represented by [line width in the bottom part (at the bottom) of line pattern/line width in the middle of line pattern (at the position of half the height of line pattern)] is 1.5 or more, rated "slightly forward tapered" when the ratio above is from 1.2 to less than 1.5, and rated "rectangular" when the ratio is less than 1.2.

(Criteria)

A (Good): The variation in sensitivity was less than 1 $mJ/cm^2$.

B (Fair): The variation in sensitivity was 1 $mJ/cm^2$ or more and 3 $mJ/cm^2$ or less.

C (Insufficient): The variation in sensitivity was more than 3 $mJ/cm^2$.

[Evaluation of Scum]

A line pattern was formed by the same method as in [Pattern Profile] above. Thereafter, its cross-sectional SEM was obtained using S4800 (manufactured by Hitachi High-Technologies Corporation), and the scum in the space portion was observed and rated as follows.

C: Scum was observed and patterns were partially connected.

B: Scum was observed but patterns were not connected.

A: Scum was not observed.

These evaluation results are shown in Table 8.

TABLE 8

(EUV Exposure; positive)

| Example | Composition | Sensitivity ($mJ/cm^2$) | Resolution (nm) | Pattern Profile | LER (nm) | Scum | Dry Etching Resistance | Aging Stability |
|---|---|---|---|---|---|---|---|---|
| 1Q | P1 | 10.8 | 45 | rectangular | 4.5 | A | very good | A |
| 2Q | P2 | 10.8 | 45 | rectangular | 4.5 | A | very good | A |
| 3Q | P10 | 10.8 | 50 | rectangular | 4.5 | A | very good | B |
| 4Q | P11 | 10.7 | 45 | rectangular | 4.5 | A | very good | A |
| 5Q | P14 | 10.8 | 45 | rectangular | 5.0 | A | very good | A |
| 6Q | P15 | 10.8 | 45 | slightly forward tapered | 5.0 | A | good | A |
| 7Q | P16 | 10.7 | 45 | slightly forward tapered | 5.0 | A | good | A |
| 8Q | P17 | 10.8 | 45 | slightly forward tapered | 5.0 | A | good | A |
| 9Q | P12 | 10.9 | 45 | rectangular | 4.5 | A | very good | A |
| Comparative Example 1Q | Comparative Composition P1 | 12.9 | 70 | forward tapered | 6.5 | C | bad | A |
| Comparative Example 2Q | Comparative Composition P2 | 12.9 | 70 | slightly forward tapered | 6.0 | B | bad | C |
| Comparative Example 3Q | Comparative Composition P3 | 12.9 | 70 | slightly forward tapered | 6.0 | B | bad | C |
| Comparative Example 4Q | Comparative Composition P4 | 13.9 | 70 | slightly forward tapered | 6.0 | C | bad | C |
| Comparative Example 5Q | Comparative Composition P5 | 14.9 | 70 | slightly forward tapered | 6.0 | C | bad | C |

[Line Edge Roughness (LER)]

A line pattern (L/S=1/1) having a line width of 100 nm was formed with the exposure dose giving the sensitivity above. At arbitrary 30 points included in its longitudinal 50 μm region, the distance from the reference line where the edge should be present was measured using a scanning electron microscope (S-9220, manufactured by Hitachi, Ltd.). The standard deviation of measured distances was determined, and 3σ was computed. A smaller value indicates better performance.

[Dry Etching Resistance]

An unexposed resist film was subjected to dry etching for 15 seconds by using an $Ar/C_4F_6/O_2$, gas (a mixed gas in a volume ratio of 100/4/2) in HITACHI U-621. Thereafter, the residual resist film ratio was measured and used as an indicator of dry etching resistance.

Very good: Residual film ratio of 95% or more.

Good: Less than 95% and 90% or more.

Bad: Less than 90%.

[Aging Stability]

Each composition was stored at room temperature over 1 month, and the degree of variation in the sensitivity (the sensitivity measured in [Sensitivity] above) between before and after the storage was evaluated. This evaluation was performed based on the following criteria.

As apparent from the results shown in Table 8, in Comparative Example 1Q not using an acid-increasing agent and in Comparative Examples 2Q to 5Q using an acid-increasing agent not satisfying formula (I), the sensitivity, resolution, pattern profile, LER and dry etching resistance are poor. In addition, in Comparative Examples 1Q, 4Q and 5Q, the reduction in scum is also poor, and in Comparative Examples 2Q to 5Q, the aging stability is also poor.

On the other hand, in Examples 1Q to 9Q using an acid-increasing agent satisfying formula (I), it is seen that the reduction in scum is particularly excellent and the sensitivity, resolution, pattern profile, LER performance, dry etching resistance and aging stability are excellent.

Examples 1EE to 30EE and Comparative Examples 1EE to 5EE

Electron Beam Exposure: Negative (1) Preparation of Support

A Cr oxide-deposited 6-inch wafer (a wafer subjected to a shielding film treatment, which is used for normal photomask blanks) was prepared.

(2) Preparation of Resist Coating Solution (Formulation of Coating Solution of Negative Chemical Amplification Resist Composition N1)

| | |
|---|---|
| Compound (α1) (the structural formula is shown above) | 0.47 g |
| Photoacid Generator (z61) (the structural formula is shown above) | 0.47 g |
| Compound (P4) (the structural formula is shown below) | 4.21 g |
| Crosslinking Agent CL-1 (the structural formula is shown below) | 0.59 g |
| Crosslinking Agent CL-4 (the structural formula is shown below) | 0.30 g |
| Tetrabutylammonium hydroxide (basic compound) | 0.04 g |
| 2-Hydroxy-3-naphthoic acid (organic carboxylic acid) | 0.11 g |
| Surfactant PF6320 (produced by OMNOVA) | 0.005 g |
| Propylene glycol monomethyl ether acetate (solvent) | 18.8 g |
| Propylene glycol monomethyl ether (solvent) | 75.0 g |

[Chem. 175]

(z61)

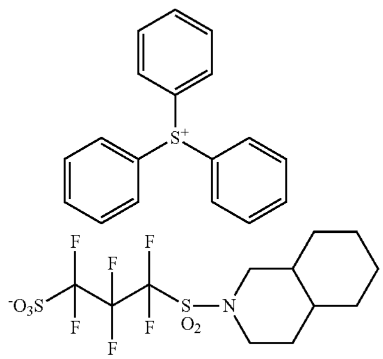

311Å$^3$

-continued

CL-1

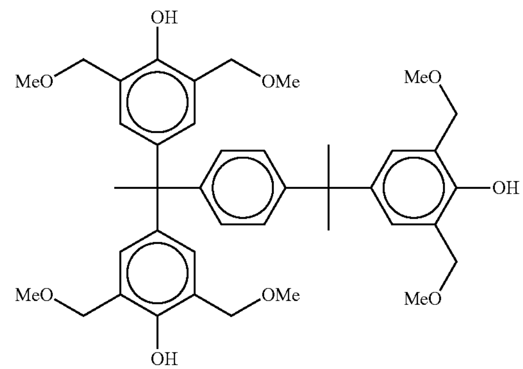

CL-4

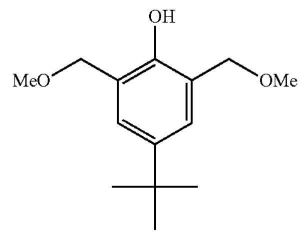

The solution of the composition above was microfiltered through a polytetrafluoroethylene filter having a pore size of 0.04 μm to obtain a resist coating solution.

Negative Chemical Amplification Resist Compositions N2 to N30 and Comparative Negative Chemical Amplification Resist Compositions N1 to N5 were prepared in the same manner as Negative Chemical Amplification Resist Composition N1 except for using the components shown in Tables 9 to 11 blow in the resist solution formulation.

TABLE 9

| Composition | Acid-Increasing Agent | Phenolic Hydroxyl Group-Containing Compound | Photoacid Generator | Organic Carboxylic Acid | Basic Compound | Surfactant | Crosslinking Agent | Solvent |
|---|---|---|---|---|---|---|---|---|
| N1 | α1 (0.47 g) | P1-4 (4.21 g) | z61 (0.47 g) | D1 (0.11 g) | B1 (0.04 g) | W-1 (0.005 g) | CL-1/CL-4 (0.59 g/0.30 g) | S2/S1 (75.0 g/18.8 g) |
| N2 | α2 (0.47 g) | P1-4 (4.21 g) | z61 (0.47 g) | D1 (0.11 g) | B1 (0.04 g) | W-1 (0.005 g) | CL-1/CL-4 (0.59 g/0.30 g) | S1/S3 (75.0 g/18.8 g) |
| N3 | α3 (0.47 g) | P1-4 (4.21 g) | z61 (0.47 g) | D1 (0.11 g) | B1 (0.04 g) | W-1 (0.005 g) | CL-1/CL-4 (0.59 g/0.30 g) | S2/S3 (75.0 g/18.8 g) |
| N4 | α4 (0.47 g) | P1-4 (4.21 g) | z61 (0.47 g) | D1 (0.11 g) | B1 (0.04 g) | W-1 (0.005 g) | CL-1/CL-4 (0.59 g/0.30 g) | S2/S7 (75.0 g/18.8 g) |
| N5 | α5 (0.47 g) | P1-4 (4.21 g) | z61 (0.47 g) | D1 (0.11 g) | B1 (0.04 g) | W-1 (0.005 g) | CL-1/CL-4 (0.59 g/0.30 g) | S2/S1 (75.0 g/18.8 g) |
| N6 | α6 (0.47 g) | P1-4 (4.21 g) | z61 (0.47 g) | D1 (0.11 g) | B1 (0.04 g) | W-1 (0.005 g) | CL-1/CL-4 (0.59 g/0.30 g) | S2/S1 (75.0 g/18.8 g) |
| N7 | α7 (0.47 g) | P1-4 (4.21 g) | z61 (0.47 g) | D1 (0.11 g) | B1 (0.04 g) | W-1 (0.005 g) | CL-1/CL-4 (0.59 g/0.30 g) | S2/S1 (75.0 g/18.8 g) |
| N8 | α8 (0.47 g) | P1-4 (4.21 g) | z61 (0.47 g) | D1 (0.11 g) | B1 (0.04 g) | W-1 (0.005 g) | CL-1/CL-4 (0.59 g/0.30 g) | S2/S1 (75.0 g/18.8 g) |
| N9 | α9 (0.47 g) | P1-4 (4.21 g) | z61 (0.47 g) | D1 (0.11 g) | B1 (0.04 g) | W-1 (0.005 g) | CL-1/CL-4 (0.59 g/0.30 g) | S2/S1 (75.0 g/18.8 g) |
| N10 | α10 (0.47 g) | P1-4 (4.21 g) | z61 (0.47 g) | D1 (0.11 g) | B1 (0.04 g) | W-1 (0.005 g) | CL-1/CL-4 (0.59 g/0.30 g) | S2/S1 (75.0 g/18.8 g) |
| N11 | α1 (0.47 g) | P1-1 (4.21 g) | z61 (0.47 g) | D1 (0.11g) | B1 (0.04 g) | W-1 (0.005 g) | CL-1/CL-4 (0.59 g/0.30 g) | S2/S1 (75.0 g/18.8 g) |
| N12 | α1 (0.47 g) | P1-2 (4.21 g) | z61 (0.47 g) | D1 (0.11 g) | B1 (0.04 g) | W-1 (0.005 g) | CL-1/CL-4 (0.59 g/0.30 g) | S1/S2/S6 (50.0 g/25.0 g/18.8 g) |
| N13 | α1 (0.47 g) | P1-3 (4.21 g) | z61 (0.47 g) | D1 (0.11 g) | B1 (0.04 g) | W-1 (0.005 g) | CL-1/CL-4 (0.59 g/0.30 g) | Sl/S2/S5 (50.0 g/25.0 g/18.8 g) |
| N14 | α1 (0.47 g) | P1-6 (4.21 g) | z61 (0.47 g) | D1 (0.11 g) | B1 (0.04 g) | W-1 (0.005 g) | CL-1/CL-4 (0.59 g/0.30 g) | Sl/S2/S4 (50.0 g/25.0 g/18.8 g) |

TABLE 9-continued

| Composition | Acid-Increasing Agent | Phenolic Hydroxyl Group-Containing Compound | Photoacid Generator | Organic Carboxylic Acid | Basic Compound | Surfactant | Crosslinking Agent | Solvent |
|---|---|---|---|---|---|---|---|---|
| N15 | α1<br>(0.47 g) | P1-4<br>(4.21 g) | z65<br>(0.47 g) | D1<br>(0.11 g) | B2<br>(0.04 g) | W-1<br>(0.005 g) | CL-1/CL-4<br>(0.59 g/0.30 g) | S2/S1<br>(75.0 g/18.8 g) |

TABLE 10

(Cont. of Table 9)

| Composition | Acid-Increasing Agent | Phenolic Hydroxyl Group-Containing Compound | Photoacid Generator | Organic Carboxylic Acid | Basic Compound | Surfactant | Crosslinking Agent | Solvent |
|---|---|---|---|---|---|---|---|---|
| N16 | α1<br>(0.47 g) | P1-4<br>(4.21 g) | z49/z63<br>(0.27 g/0.20 g) | D1<br>(0.11 g) | B3<br>(0.04 g) | none | CL-1<br>(0.89 g) | S2/Sl<br>(75.0 g/18.8 g) |
| N17 | α1<br>(0.47 g) | P1-5<br>(4.21 g) | z2<br>(0.47 g) | D1<br>(0.11 g) | B1<br>(0.04 g) | none | CL-3<br>(0.89 g) | S2/S1<br>(75.0 g/18.8 g) |
| N18 | α1<br>(0.47 g) | P1-4<br>(4.21 g) | z5<br>(0.47 g) | D1<br>(0.11 g) | B1/B6<br>(0.02 g/0.02 g) | none | CL-1/CL-5<br>(0.59 g/0.30 g) | S2/S1<br>(75.0 g/18.8 g) |
| N19 | α1<br>(0.47 g) | P1-4<br>(4.21 g) | z8<br>(0.47 g) | D1<br>(0.11 g) | B5<br>(0.04 g) | none | CL-2/CL-3<br>(0.59 g/0.30 g) | S2/S1<br>(75.0 g/18.8 g) |
| N20 | α1<br>(0.47 g) | P1-5<br>(4.21 g) | z37/z45<br>(0.27 g/0.20 g)) | D1<br>(0.11 g) | B4<br>(0.04 g) | none | CL-3<br>(0.89 g) | S2/S1<br>(75.0 g/18.8 g) |
| N21 | α1<br>(0.47 g) | P1-4<br>(4.21 g) | z42<br>(0.47 g) | D2<br>(0.11 g) | B1<br>(0.04 g) | W-2<br>(0.005 g) | CL-1/CL-5<br>(0.59 g/0.30 g) | S2/S1<br>(75.0 g/18.8 g) |
| N22 | α1<br>(0.47 g) | P1-3<br>(4.21 g) | z48<br>(0.47 g) | D2<br>(0.11 g) | B3<br>(0.04 g) | W-3<br>(0.005 g) | CL-3<br>(0.89 g) | S2/S1<br>(75.0 g/18.8 g) |
| N23 | α1<br>(0.47 g) | P1-1/P1-3<br>(2.0 g/2.21 g) | z66<br>(0.47 g) | D3<br>(0.11 g) | B2<br>(0.04 g) | none | CL-2<br>(0.89 g) | S2/S1<br>(75.0 g/18.8 g) |
| N24 | α1<br>(0.47 g) | P1-4<br>(4.21 g) | z67<br>(0.47 g) | DI<br>(0.11 g) | B6<br>(0.04 g) | none | CL-1/CL-5<br>(0.59 g/0.30 g) | S2/S1<br>(75.0 g/18.8 g) |
| N25 | α1<br>(0.47 g) | P1-4<br>(4.21 g) | z68<br>(0.47 g) | D3<br>(0.11 g) | B6<br>(0.04 g) | none | CL-1/CL-5<br>(0.59 g/0.30 g) | S2/S1<br>(75.0 g/18.8 g) |
| N26 | α11<br>(0.47 g) | P1-1<br>(4.21 g) | z61<br>(0.47 g) | D1<br>(0.11 g) | B1<br>(0.04 g) | W-1<br>(0.005 g) | CL-1/CL-4<br>(0.59 g/0.30 g) | S2/S1<br>(75.0 g/18.8 g) |
| N27 | α12<br>(0.47 g) | P1-2<br>(4.21 g) | z61<br>(0.47 g) | D1<br>(0.11 g) | B1<br>(0.04 g) | W-1<br>(0.005 g) | CL-1/CL-4<br>(0.59 g/0.30 g) | S2/S1<br>(75.0 g/18.8 g) |
| N28 | α13<br>(0.47 g) | P1-3<br>(4.21 g) | z61<br>(0.47 g) | D1<br>(0.11 g) | B1<br>(0.04 g) | W-1<br>(0.005 g) | CL-1/CL-4<br>(0.59 g/0.30 g) | S2/S1<br>(75.0 g/18.8 g) |
| N29 | α14<br>(0.47 g) | P1-6<br>(4.21 g) | z61<br>(0.47 g) | D1<br>(0.11 g) | B1<br>(0.04 g) | W-1<br>(0.005 g) | CL-1/CL-4<br>(0.59 g/0.30 g) | S2/S1<br>(75.0 g/18.8 g) |
| N30 | α1/α3<br>(0.27 g/0.2g) | P1-4<br>(4.21 g) | z61<br>(0.47 g) | D1<br>(0.11 g) | B2<br>(0.04 g) | W-1<br>(0.005 g) | CL-1/CL-4<br>(0.59 g/0.30 g) | S2/S1<br>(75.0 g/18.8 g) |

TABLE 11

(Cont. of Table 9)

| Composition | Acid-Increasing Agent | Phenolic Hydroxyl Group-Containing Compound | Photoacid Generator | Organic Carboxylic Acid | Basic Compound | Surfactant | Crosslinking Agent | Solvent |
|---|---|---|---|---|---|---|---|---|
| Comparative Composition N1 | none | P1-2<br>(4.80 g) | z2<br>(0.47 g) | D1<br>(0.11 g) | B2<br>(0.04 g) | W-1<br>(0.005 g) | CL-3<br>(0.89 g) | S1<br>(93.8 g) |
| Comparative Composition N2 | Comparative αC1<br>(0.47 g) | P1-2<br>(4.21 g) | z2<br>(0.47 g) | D1<br>(0.11 g) | B2<br>(0.04 g) | W-1<br>(0.005 g) | CL-3<br>(0.89 g) | S1<br>(93.8 g) |
| Comparative Composition N3 | Comparative αC2<br>(0.47 g) | P1-2<br>(4.21 g) | z2<br>(0.47 g) | D1<br>(0.11 g) | B2<br>(0.04 g) | W-1<br>(0.005 g) | CL-3<br>(0.89 g) | S1<br>(93.8 g) |
| Comparative Composition N4 | Comparative αC3<br>(0.47 g) | P1-2<br>(4.21 g) | z2<br>(0.47 g) | D1<br>(0.11 g) | B2<br>(0.04 g) | W-1<br>(0.005 g) | CL-3<br>(0.89 g) | S1<br>(93.8 g) |
| Comparative Composition N5 | Comparative αC4<br>(0.47 g) | P1-2<br>(4.21 g) | z2<br>(0.47 g) | D1<br>(0.11 g) | B2<br>(0.04 g) | W-1<br>(0.005 g) | CL-3<br>(0.89 g) | S1<br>(93.8 g) |

Abbreviations of materials except for those shown before, which are used in Examples/Comparative Examples, are shown below.

[Phenolic Hydroxyl Group-Containing Compound (Compound (ε))]

[Chem. 176]

P1-1

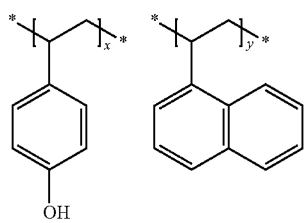

x/y (molar ratio) = 90/10
Mw = 12000, Mw/Mn = 2.3

P1-2

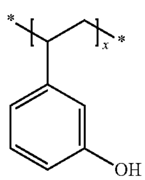

x (molar ratio) = 100
Mw = 4500, Mw/Mn = 1.1

P1-3

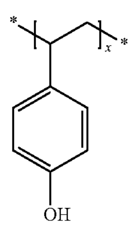

x (molar ratio) = 100
Mw = 3700, Mw/Mn = 1.1

P1-4

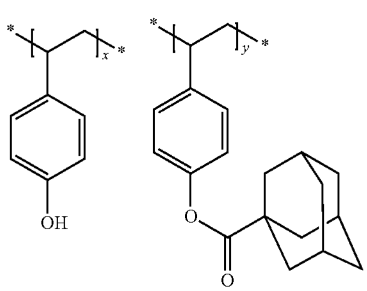

x/y (molar ratio) = 85/15
Mw = 4200, Mw/Mn = 1.1

P1-5

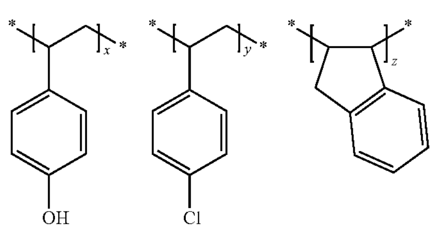

x/y/z (molar ratio) = 75/5/20
Mw = 4500, Mw/Mn = 1.5

-continued

P-16

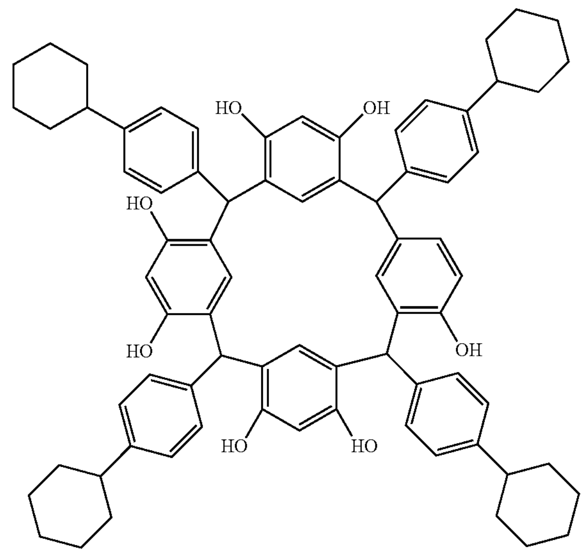

[Acid Generator (Compound (β))]

Acid generators (compound (β)) are as shown before.

[Crosslinking Agent (Compound (δ))]

[Chem. 175]

CL-1

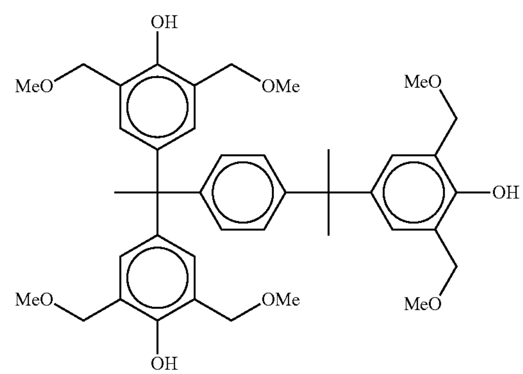

CL-2

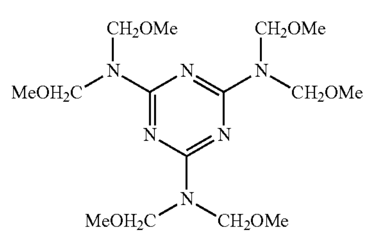

CL-3

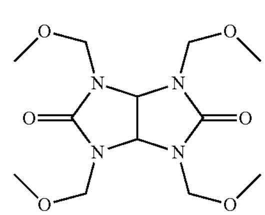

-continued

CL-4

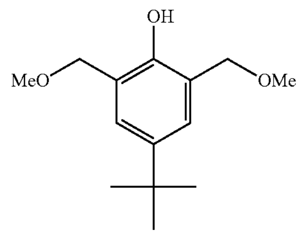

[Chem. 178]

CL-5

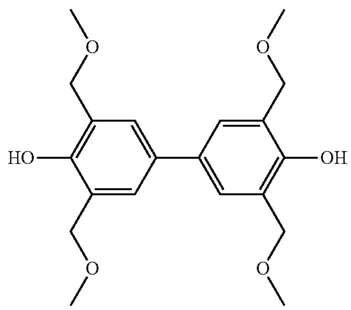

[Basic Compound]

Basic compounds (B1 to B6) are as shown before.

[Organic Carboxylic Acid]

D1: 2-Hydroxy-3-naphthoic acid

D2: 2-Naphthoic acid

D3: Benzoic acid

[Surfactant]

Surfactants (W-1 to W-3) are as shown before.

[Solvent]

Solvents (S1 to S7) are as shown before.

(3) Formation of Resist Film

The resist coating solution was coated on the 6-inch wafer by using a spin coater, Mark 8, manufactured by Tokyo Electron Ltd. and dried at 110° C. for 90 seconds on a hot plate to obtain a resist film having a thickness of 100 nm. That is, a resist-coated mask blanks was obtained.

(4) Production of Negative Resist Pattern

This resist film was patternwise irradiated using an electron beam lithography apparatus (ELS-7500, manufactured by Elionix Inc., accelerating voltage: 50 keV). After the irradiation, the resist film was heated at 120° C. for 90 seconds on a hot plate, dipped in an aqueous 2.38 mass % tetramethylammonium hydroxide (TMAH) solution for 60 seconds, rinsed with water for 30 seconds and dried.

(5) Evaluation of Resist Pattern

The obtained pattern was evaluated for the sensitivity, resolution, pattern profile, line edge roughness (LER), dry etching resistance, scum and aging stability by the following methods.

[Sensitivity]

The cross-sectional profile of the pattern obtained was observed using a scanning electron microscope (S-4300, manufactured by Hitachi, Ltd.), and the exposure dose (dose of electron beam irradiation) when resolving a resist pattern with a line width of 100 nm (line:space=1:1) was taken as the sensitivity. A smaller value indicates higher sensitivity.

[Resolution]

The limiting resolution (the minimum line width below which the line and the space (line:space=1:1) were not separated and resolved) at the exposure dose (dose of electron beam irradiation) giving the sensitivity above was taken as the resolution (nm).

[Pattern Profile]

The cross-sectional profile of a line pattern (L/S=1/1) with a line width of 100 nm at the exposure dose (dose of electron beam irradiation) giving the sensitivity above was observed using a scanning electron microscope (S-4300, manufactured by Hitachi, Ltd.). The cross-sectional profile of the line pattern was rated "reverse tapered" when the ratio represented by [line width in the top part (surface part) of line pattern/line width in the middle of line pattern (at the position of half the height of line pattern)] is 1.5 or more, rated "slightly reverse tapered" when the ratio above is from 1.2 to less than 1.5, and rated "rectangular" when the ratio is less than 1.2.

[Line Edge Roughness (LER)]

A line pattern (L/S=1/1) having a line width of 100 nm was formed with the irradiation dose (dose of electron beam irradiation) giving the sensitivity above. At arbitrary 30 points included in its longitudinal 50 μm region, the distance from the reference line where the edge should be present was measured using a scanning electron microscope (S-9220, manufactured by Hitachi, Ltd.). The standard deviation of measured distances was determined, and 3σ was computed. A smaller value indicates better performance.

[Dry Etching Resistance]

A resist film formed by performing entire surface irradiation with the irradiation dose (dose of electron beam irradiation) giving the sensitivity above was subjected to dry etching for 30 seconds by using an $Ar/C_4F_6/O_2$ gas (a mixed gas in a volume ratio of 100/4/2) in HITACHI U-621. Thereafter, the residual resist film ratio was measured and used as an indicator of dry etching resistance.

Very good: Residual film ratio of 95% or more.

Good: Less than 95% and 90% or more.

Bad: Less than 90%.

[Evaluation of Scum]

A line pattern was formed by the same method as in [Pattern Profile] above. Thereafter, its cross-sectional SEM was obtained using S4800 (manufactured by Hitachi High-Technologies Corporation), and the scum in the space portion was observed and rated as follows.

C: Scum was observed and patterns were partially connected.

B: Scum was observed but patterns were not connected.

A: Scum was not observed.

[Aging Stability]

Each composition was stored at room temperature over 1 month, and the degree of variation in the sensitivity (the sensitivity measured in [Sensitivity] above) between before and after the storage was evaluated. This evaluation was performed based on the following criteria.

(Criteria)

A (Good): The variation in sensitivity was less than 1 $\mu C/cm^2$.

B (Fair): The variation in sensitivity was 1 $\mu C/cm^2$ or more and 3 $\mu C/cm^2$ or less.

C (Insufficient): The variation in sensitivity was more than 3 μC/$cm^2$.

The evaluation results are shown in Tables 12 and 13.

TABLE 12

(Electron Beam Exposure; negative)

| Example | Composition | Sensitivity (μC/$cm^2$) | Resolution (nm) | Pattern Profile | LER (nm) | Scum | Dry Etching Resistance | Aging Stability |
|---|---|---|---|---|---|---|---|---|
| 1EE | N1 | 10.2 | 50 | rectangular | 4.0 | A | very good | A |
| 2EE | N2 | 10.0 | 50 | rectangular | 4.0 | A | very good | A |
| 3EE | N3 | 10.2 | 50 | rectangular | 4.0 | A | very good | A |
| 4EE | N4 | 10.2 | 50 | rectangular | 4.0 | A | very good | A |
| 5EE | N5 | 10.3 | 50 | rectangular | 4.0 | A | very good | A |
| 6EE | N6 | 10.3 | 50 | rectangular | 4.0 | A | very good | A |
| 7EE | N7 | 10.0 | 55 | rectangular | 4.0 | A | very good | B |
| 8EE | N8 | 10.2 | 50 | rectangular | 4.0 | A | very good | A |
| 9EE | N9 | 10.2 | 50 | rectangular | 4.0 | A | very good | A |
| 10EE | N10 | 10.2 | 55 | rectangular | 4.0 | A | very good | B |
| 11EE | N11 | 10.3 | 50 | rectangular | 4.0 | A | good | A |
| 12EE | N12 | 10.2 | 50 | rectangular | 4.0 | A | good | A |
| 13EE | N13 | 10.3 | 50 | rectangular | 4.0 | A | good | A |
| 14EE | N14 | 13.3 | 50 | rectangular | 4.0 | A | good | A |
| 15EE | N15 | 10.3 | 50 | rectangular | 4.5 | A | very good | A |
| 16EE | N16 | 10.2 | 50 | rectangular | 4.5 | A | very good | A |
| 17EE | N17 | 10.3 | 55 | slightly reverse tapered | 4.0 | A | good | A |
| 18EE | N18 | 10.5 | 50 | rectangular | 4.0 | A | very good | A |
| 19EE | N19 | 10.2 | 55 | slightly reverse tapered | 4.5 | A | very good | A |
| 20EE | N20 | 10.2 | 55 | slightly reverse tapered | 4.5 | A | good | A |
| 21EE | N21 | 10.2 | 50 | rectangular | 4.0 | A | very good | A |
| 22EE | N22 | 10.2 | 55 | slightly reverse tapered | 4.5 | A | good | A |
| 23EE | N23 | 10.2 | 55 | slightly reverse tapered | 4.5 | A | good | A |
| 24EE | N24 | 10.2 | 50 | rectangular | 4.0 | A | very good | A |
| 25EE | N25 | 10.2 | 50 | rectangular | 4.0 | A | very good | A |
| 26EE | N26 | 10.2 | 50 | rectangular | 4.0 | A | very good | A |
| 27EE | N27 | 10.2 | 50 | rectangular | 4.0 | A | very good | A |
| 28EE | N28 | 10.2 | 50 | rectangular | 4.0 | A | very good | A |
| 29EE | N29 | 10.2 | 55 | rectangular | 4.0 | A | very good | B |
| 30EE | N30 | 10.2 | 50 | rectangular | 4.0 | A | very good | A |

TABLE 13

(Cont. of Table 12, Electron Beam Exposure; negative)

| Example | Composition | Sensitivity (μC/$cm^2$) | Resolution (nm) | Pattern Profile | LER (nm) | Scum | Dry Etching Resistance | Aging Stability |
|---|---|---|---|---|---|---|---|---|
| Comparative Example 1EE | Comparative Composition N1 | 14.8 | 70 | reverse tapered | 6.5 | C | bad | A |
| Comparative Example 2E | Comparative Composition N2 | 11.8 | 65 | slightly reverse tapered | 6.0 | B | bad | C |
| Comparative Example 3EE | Comparative Composition N3 | 11.8 | 65 | slightly reverse tapered | 6.0 | B | bad | C |
| Comparative Example 4EE | Comparative Composition N4 | 13.8 | 65 | slightly reverse tapered | 6.0 | C | bad | C |
| Comparative Example 5EE | Comparative Composition N5 | 14.8 | 65 | slightly reverse tapered | 6.0 | C | bad | C |

As apparent from the results shown in Tables 12 and 13, in Comparative Example 1EE not using an acid-increasing agent and in Comparative Examples 2EE to 5EE using an acid-increasing agent not satisfying formula (αI), the sensitivity, resolution, pattern profile, LER and dry etching resistance are poor. In addition, in Comparative Examples 1EE, 4EE and 5EE, the reduction in scum is also poor, and in Comparative Examples 2EE to 5EE, the aging stability is also poor.

On the other hand, in Examples 1EE to 30EE using an acid-increasing agent satisfying formula (αI), it is seen that the sensitivity and reduction in scum are particularly excellent and the resolution, pattern profile, LER performance, dry etching resistance and aging stability are excellent.

Examples 1FF to 6FF and Comparative Examples 1FF to 5FF

EUV (Evaluation of Resist)

The negative resist composition shown in Table 14 below, which was prepared as above, was uniformly coated on a hexamethyldisilazane-treated silicon substrate by using a spin coater and heated/dried at 100° C. for 60 seconds on a hot plate to form a resist film having a thickness of 0.05 μm.

With respect to the resist film obtained, the sensitivity, resolution, pattern profile, line edge roughness (LER), dry etching resistance, scum and aging stability were evaluated by the following methods.

[Sensitivity]

The resist film obtained was exposed using EUV light (wavelength: 13 nm) from an EUV exposure apparatus (Micro Exposure Tool, manufactured by Exitech, NA: 0.3, Quadrupole, outer sigma: 0.68, inner sigma: 0.36) through a reflective mask having a 1:1 line-and-space pattern with a line width of 100 nm by changing the exposure dose in steps of 0.1 mJ/cm$^2$ in the range of 0 to 20.0 mJ/cm$^2$, then baked at 110° C. for 90 seconds and thereafter, developed with an aqueous 2.38 mass % tetramethylammonium hydroxide (TMAH) solution.

The exposure dose for reproducing the line-and-space (L/S=1/1) mask pattern with a line width of 100 nm was taken as the sensitivity. A smaller value indicates higher sensitivity.

[Resolution]

The limiting resolution (the minimum line width below which the line and the space (line:space=1:1) were not separated and resolved) at the exposure dose giving the sensitivity above was taken as the resolution (nm).

[Pattern Profile]

The cross-sectional profile of a line pattern (L/S=1/1) with a line width of 100 nm at the exposure dose giving the sensitivity above was observed using a scanning electron microscope (S-4300, manufactured by Hitachi, Ltd.). The cross-sectional profile of the line pattern was rated "reverse tapered" when the ratio represented by [line width in the top part (surface part) of line pattern/line width in the middle of line pattern (at the position of half the height of line pattern)] is 1.5 or more, rated "slightly reverse tapered" when the ratio above is from 1.2 to less than 1.5, and rated "rectangular" when the ratio is less than 1.2.

[Line Edge Roughness (LER)]

A line pattern (L/S=1/1) having a line width of 100 nm was formed with the exposure dose giving the sensitivity above. At arbitrary 30 points included in its longitudinal 50 μm region, the distance from the reference line where the edge should be present was measured using a scanning electron microscope (S-9220, manufactured by Hitachi, Ltd.). The standard deviation of measured distances was determined, and 3σ was computed. A smaller value indicates better performance.

[Dry Etching Resistance]

A resist film formed by performing entire surface irradiation with the exposure dose giving the sensitivity above was subjected to dry etching for 15 seconds by using an Ar/$C_4F_6$/$O_2$ gas (a mixed gas in a volume ratio of 100/4/2) in HITACHI U-621. Thereafter, the residual resist film ratio was measured and used as an indicator of dry etching resistance.

Very good: Residual film ratio of 95% or more.

Good: Less than 95% and 90% or more.

Bad: Less than 90%.

[Evaluation of Scum]

A line pattern was formed by the same method as in [Pattern Profile] above. Thereafter, its cross-sectional SEM was obtained using S4800 (manufactured by Hitachi High-Technologies Corporation), and the scum in the space portion was observed and rated as follows.

C: Scum was observed and patterns were partially connected.

B: Scum was observed but patterns were not connected.

A: Scum was not observed.

[Aging Stability]

Each composition was stored at room temperature over 1 month, and the degree of variation in the sensitivity (the sensitivity measured in [Sensitivity] above) between before and after the storage was evaluated. This evaluation was performed based on the following criteria.

(Criteria)

A (Good): The variation in sensitivity was less than 1 mJ/cm$^2$.

B (Fair): The variation in sensitivity was 1 mJ/cm$^2$ or more and 3 mJ/cm$^2$ or less.

C (Insufficient): The variation in sensitivity was more than 3 mJ/cm$^2$.

These evaluations results are shown in Table 14.

TABLE 14

(EUV Exposure; positive)

| Example | Composition | Sensitivity (mJ/cm$^2$) | Resolution (nm) | Pattern Profile | LER (nm) | Scum | Dry Etching Resistance | Aging Stability |
|---|---|---|---|---|---|---|---|---|
| 1FF | N1 | 12.8 | 50 | rectangular | 4.0 | A | very good | A |
| 2FF | N2 | 12.7 | 50 | rectangular | 4.0 | A | very good | A |
| 3FF | N3 | 12.8 | 50 | rectangular | 4.0 | A | very good | A |
| 4FF | N12 | 16.0 | 50 | rectangular | 4.0 | A | good | A |
| 5FF | N14 | 14.0 | 50 | rectangular | 4.0 | A | good | A |
| 6FF | N20 | 13.0 | 55 | slightly reverse tapered | 4.5 | A | good | A |
| Comparative Example 1FF | Comparative Composition N1 | 15.8 | 70 | reverse tapered | 6.5 | C | bad | A |
| Comparative Example 2FF | Comparative Composition N2 | 14.8 | 65 | slightly reverse tapered | 6.0 | B | bad | C |
| Comparative Example 3FF | Comparative Composition N3 | 14.8 | 70 | reverse tapered | 6.5 | B | bad | C |
| Comparative Example 4FF | Comparative Composition N4 | 15.2 | 70 | reverse tapered | 6.5 | C | bad | C |
| Comparative Example 5FF | Comparative Composition N5 | 15.8 | 70 | reverse tapered | 6.5 | C | bad | C |

As apparent from the results shown in Table 14, in Comparative Example 1FF not using an acid-increasing agent and in Comparative Examples 2FF to 5FF using an acid-increasing agent not satisfying formula (αI), the sensitivity, resolution, pattern profile, LER and dry etching resistance are poor. In addition, in Comparative Examples 1FF, 4FF and 5FF, the reduction in scum is also poor, and in Comparative Examples 2FF to 5FF, the aging stability is also poor.

On the other hand, in Examples 1FF to 6FF using an acid-increasing agent satisfying formula (αI), it is seen that the sensitivity and reduction in scum are particularly excellent and the resolution, pattern profile, LER performance, dry etching resistance and aging stability are excellent.

[Synthesis of Compound A]

<Synthesis of Compounds (A-1) to (A-23)>

As the acid-increasing agent, Compounds (A-1) to (A-23) shown in Table 15 below were synthesized as follows.

<Synthesis of Compound (A-1)>

10 g of 3-methoxy-1,3-methylbutanol was dissolved in 140 mL and after adding 33 g of triethylamine and 414 mg of 4-dimethylaminopyridine, 25.6 g of 2,4,6-triisopropylbenzenesulfonic acid chloride was added, followed by stirring at room temperature for 4 hours. The reaction solution was added with 100 mL of ethyl acetate and 100 mL of distilled water and transferred to a separating funnel to remove the aqueous layer. Thereafter, the organic layer was washed with 200 mL of distilled water three times, and the resulting organic layer was concentrated. The concentrate was purified by silica gel column chromatography (developing solvent: ethyl acetate/hexane=10/1) and after removing the solvent by distillation under reduced pressure, vacuum-dried to obtain 28.9 g of Compound (A-1).

$^1$H-NMR ($CDCl_3$: ppm) δ: 1.16 (6H, s), 1.25-1.27 (18H, m), 1.92 (2H, t, J=7.6 Hz), 2.91 (1H, sept, J=6.9 Hz), 3.12 (3H, s), 4.12-4.20 (4H, m), 7.17 (2H, s).

<Synthesis of Compounds (A-2) to (A-23)>

Compounds (A-2) to (A-23) were synthesized in the same manner by reacting an alcohol with a sulfonic acid halide under basic conditions. Also, Compounds (R-1) to (R-3) for comparison were prepared as the compound not coming under formula (1).

TABLE 15

(Chemical Formula and Volume of Acid-Increasing Agent)

| Compound | Chemical Formula | Volume of Acid Generated (Å$^3$) |
|---|---|---|
| A-1 | 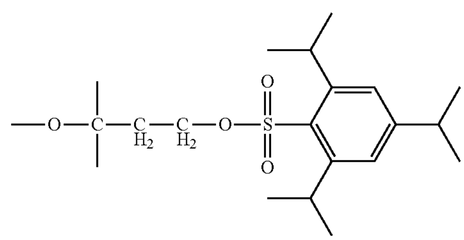 [SMILES: COC(C)(C)CCOS(=O)(=O)c1c(C(C)C)cc(C(C)C)cc1C(C)C] | 303 |
| A-2 | 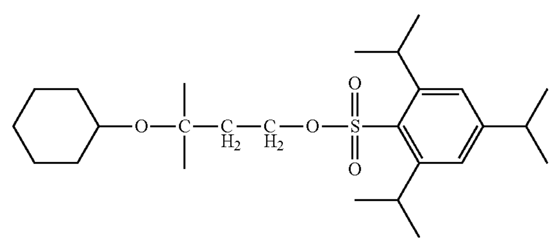 [SMILES: CC(C)c1cc(C(C)C)c(S(=O)(=O)OCCC(C)(C)OC2CCCCC2)c(C(C)C)c1] | 303 |
| A-3 | 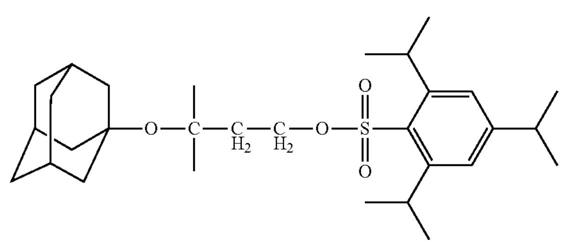 [SMILES: CC(C)c1cc(C(C)C)c(S(=O)(=O)OCCC(C)(C)OC23CC4CC(CC(C4)C2)C3)c(C(C)C)c1] | 303 |
| A-4 | 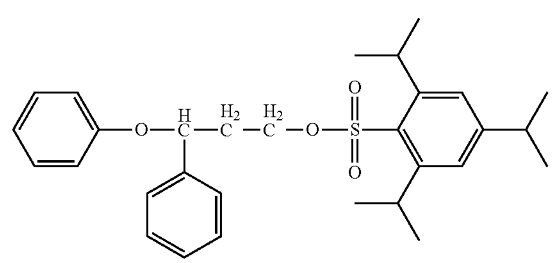 [SMILES: CC(C)c1cc(C(C)C)c(S(=O)(=O)OCCC(Oc2ccccc2)c2ccccc2)c(C(C)C)c1] | 303 |

TABLE 15-continued
| (Chemical Formula and Volume of Acid-Increasing Agent) | | |
|---|---|---|
| Compound | Chemical Formula | Volume of Acid Generated (Å$^3$) |
| A-5 | 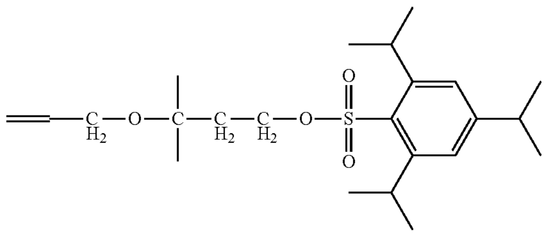 [SMILES: C=CCOC(C)(C)CCOS(=O)(=O)c1c(C(C)C)cc(C(C)C)cc1C(C)C] | 303 |
| A-6 | 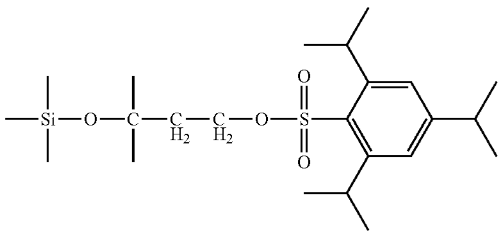 [SMILES: CC(C)c1cc(C(C)C)c(S(=O)(=O)OCCC(C)(C)O[Si](C)(C)C)c(C(C)C)c1] | 303 |
| A-7 | 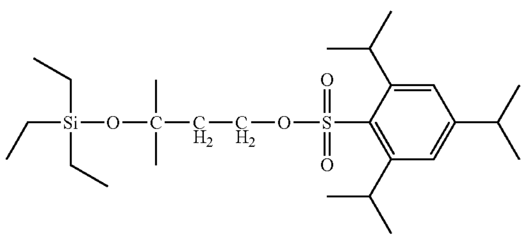 [SMILES: CC[Si](CC)(CC)OC(C)(C)CCOS(=O)(=O)c1c(C(C)C)cc(C(C)C)cc1C(C)C] | 303 |
TABLE 16
| Cont. of Table 15 (Chemical Formula and Volume of Acid-Increasing Agent) | | |
|---|---|---|
| Compound | Chemical Formula | Volume of Acid Generated (Å$^3$) |
| A-8 | 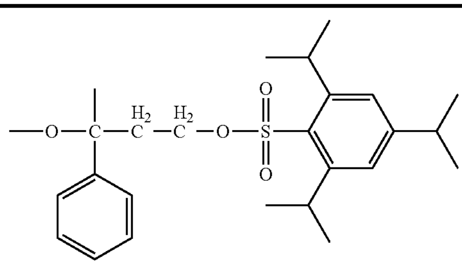 | 303 |
| A-9 | 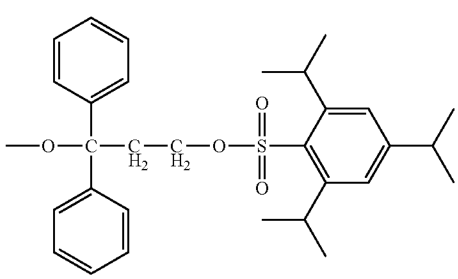 [SMILES: COC(CCOS(=O)(=O)c1c(C(C)C)cc(C(C)C)cc1C(C)C)(c1ccccc1)c1ccccc1] | 303 |

TABLE 16-continued
Cont. of Table 15 (Chemical Formula and Volume of Acid-Increasing Agent)
| Compound | Chemical Formula | Volume of Acid Generated (Å$^3$) |
| --- | --- | --- |
| A-10 | 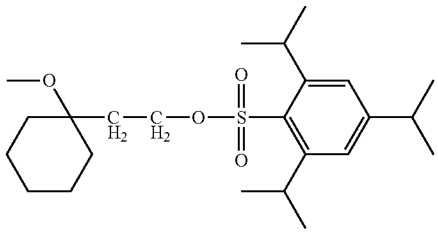 [SMILES: COC1(CCOS(=O)(=O)c2c(C(C)C)cc(C(C)C)cc2C(C)C)CCCCC1] | 303 |
| A-11 | 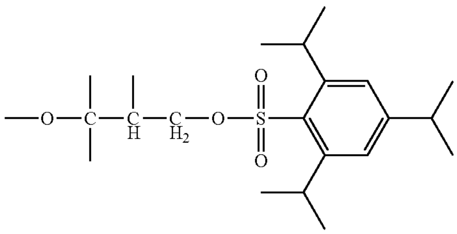 | 303 |
| A-12 | 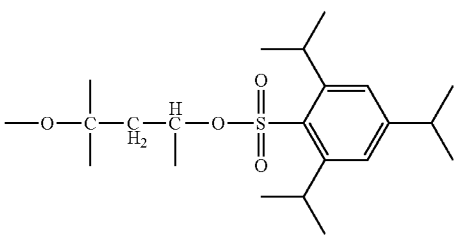 [SMILES: COC(C)(C)CC(C)OS(=O)(=O)c1c(C(C)C)cc(C(C)C)cc1C(C)C] | 303 |
| A-13 | 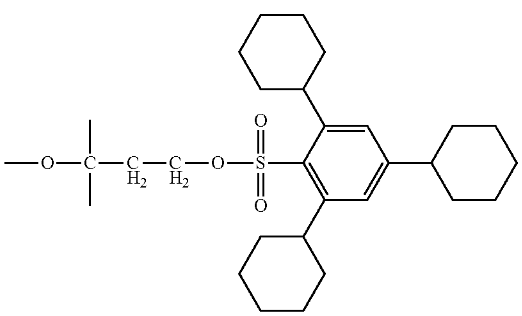 [SMILES: COC(C)(C)CCOS(=O)(=O)c1c(C2CCCCC2)cc(C2CCCCC2)cc1C1CCCCC1] | 437 |
| A-14 | 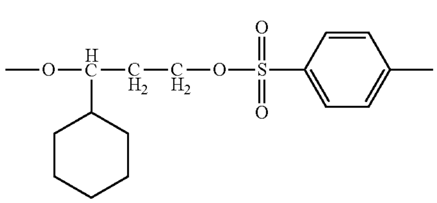 | 186 |

TABLE 17
| Cont. of Table 15 (Chemical Formula and Volume of Acid-Increasing Agent) | | |
|---|---|---|
| Compound | Chemical Formula | Volume of Acid Generated (Å$^3$) |
| A-15 | 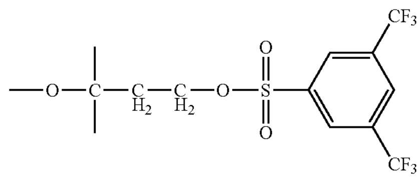 [SMILES: COC(C)(C)CCOS(=O)(=O)c1cc(C(F)(F)F)cc(C(F)(F)F)c1] | 168 |
| A-16 | 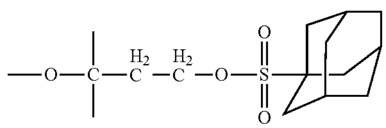 [SMILES: COC(C)(C)CCOS(=O)(=O)C12CC3CC(CC(C3)C1)C2] | 207 |
| A-17 | 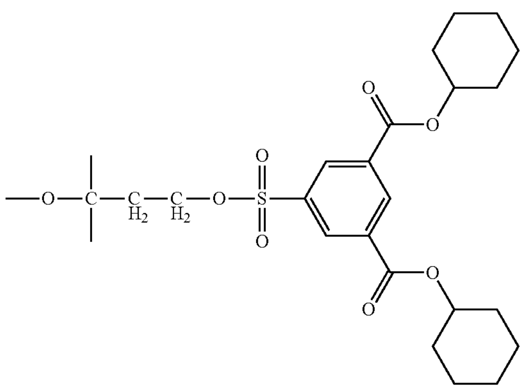 [SMILES: COC(C)(C)CCOS(=O)(=O)c1cc(C(=O)OC2CCCCC2)cc(C(=O)OC2CCCCC2)c1] | 380 |
| A-18 | 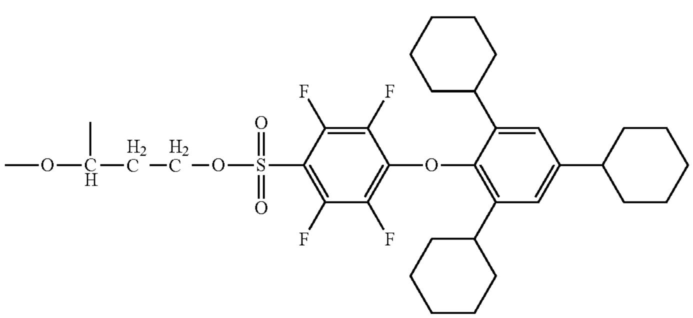 [SMILES: COC(C)CCOS(=O)(=O)c1c(F)c(F)c(Oc2c(C3CCCCC3)cc(C3CCCCC3)cc2C2CCCCC2)c(F)c1F] | 643 |
| A-19 | 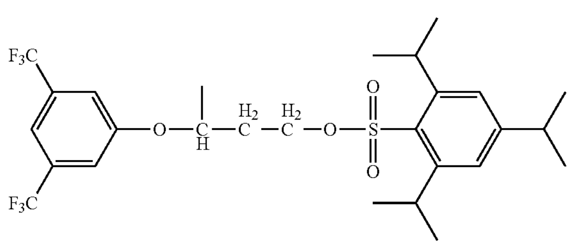 [SMILES: CC(CCOS(=O)(=O)c1c(C(C)C)cc(C(C)C)cc1C(C)C)Oc1cc(C(F)(F)F)cc(C(F)(F)F)c1] | 303 |
| A-20 | 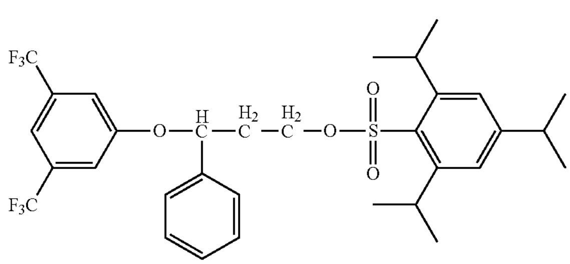 [SMILES: CC(C)c1cc(C(C)C)c(S(=O)(=O)OCCC(Oc2cc(C(F)(F)F)cc(C(F)(F)F)c2)c2ccccc2)c(C(C)C)c1] | 303 |

TABLE 18
| Cont. of Table 15 (Chemical Formula and Volume of Acid-Increasing Agent) | | |
|---|---|---|
| Compound | Chemical Formula | Volume of Acid Generated (Å$^3$) |
| A-21 | 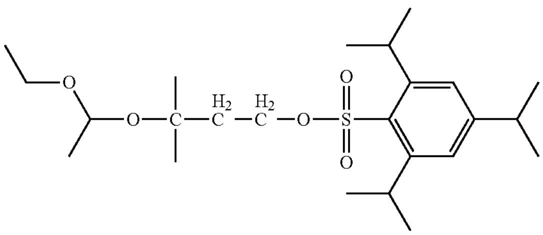 [SMILES: CCOC(C)OC(C)(C)CCOS(=O)(=O)c1c(C(C)C)cc(C(C)C)cc1C(C)C] | 303 |
| A-22 | 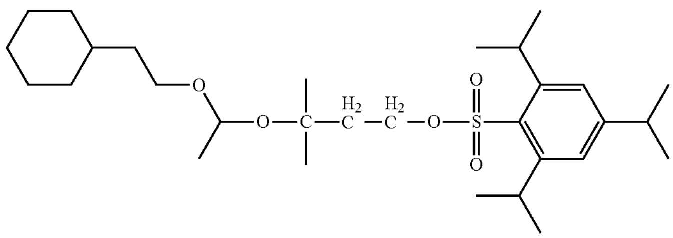 [SMILES: CC(OCCC1CCCCC1)OC(C)(C)CCOS(=O)(=O)c1c(C(C)C)cc(C(C)C)cc1C(C)C] | 303 |
| A-23 | 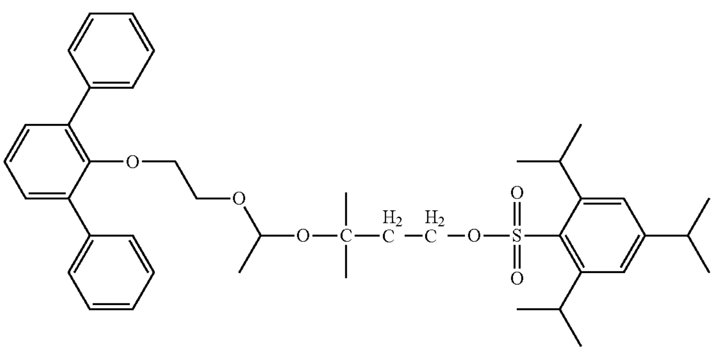 [SMILES: CC(OCCOc1c(-c2ccccc2)cccc1-c1ccccc1)OC(C)(C)CCOS(=O)(=O)c1c(C(C)C)cc(C(C)C)cc1C(C)C] | 303 |
| R-1 | 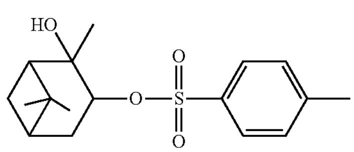 [SMILES: Cc1ccc(S(=O)(=O)OC2CC3CC(C3(C)C)C2(C)O)cc1] | 186 |
| R-2 | 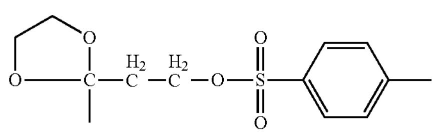 [SMILES: Cc1ccc(S(=O)(=O)OCCC2(C)OCCO2)cc1] | 186 |
| R-3 | 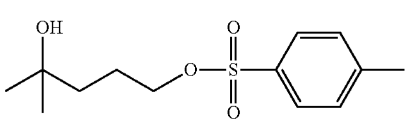 [SMILES: Cc1ccc(S(=O)(=O)OCCCC(C)(C)O)cc1] | 186 |

[Calculation of Volume of Acid]

The volume of the sulfonic acid that can be generated from Compounds (A-1) to (A-23) and Comparative Compounds (R-1) to (R-3) were calculated as follows. That is, the volume was determined as follows by using "WinMOPAC" produced by Fujitsu Limited. First, the chemical structure of the acid that can be generated from each compound was input. Next, using this structure as the initial structure, the most stable conformation of each acid was obtained by molecular force field calculation using an MM3 method. Thereafter, with respect to the most stable conformation, molecular orbital calculation using a PM3 method was performed, whereby the "accessible volume" of each acid was computed.

The results obtained are shown in Tables 15 to 18.

Examples 1A to 43A and Comparative Examples 1A to 4A

(1) Preparation of Support

A Cr oxide-deposited 6-inch wafer (a wafer subjected to a shielding film treatment, which is used for normal photomask blanks) was prepared.

Synthesis Example 1

Synthesis of Compound (P1)

(Synthesis of Chloroether Compound)

In a 500-mL Kjeldahl flask, 20.0 g of 1-adamantanecarboaldehyde, 16.8 g of trimethyl orthoformate, 283 mg of camphorsulfonic acid and 100 mL of hexane were added and stirred at 25° C. for 1 hour. After adding 617 mg of triethylamine, the mixture was stirred, and the organic layer was washed with 150 mL of distilled water three times. Hexane was removed under a reduced pressure condition to form an acetal compound, whereby 24.0 g of Compound 1 shown below was obtained.

Subsequently, 8.96 g of acetyl chloride was added to 20.0 g of Compound 1 obtained, and the mixture was stirred in a water bath at 45° C. for 4 hours. After returning to room temperature, unreacted acetyl chloride was removed under a reduced pressure condition to form a chloroether compound, whereby 20.42 g of Compound 2 shown below was obtained.

$^{1}$H-NMR ($CDCl_3$: ppm) δ: 1.58-1.83 (12H, m), 2.02 (3H, s), 3.52 (3H, s), 5.08 (1H, s).

[Chem. 179]

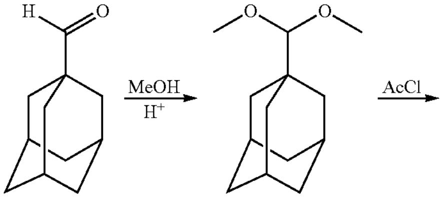

1 aldehyde compound acetal compound

-continued

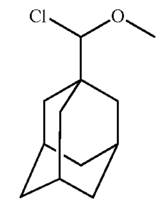

2 chloroether compound (Synthesis of Compound (P1))

10.0 g of poly(p-hydroxystyrene) (VP-2500, produced by Nippon Soda Co., Ltd.) as a polyhydroxystyrene compound was dissolved in 60 g of tetrahydrofuran (THF) and after adding 8.85 g of triethylamine, the mixture was stirred in an ice water bath. To the reaction solution, Compound 2 (4.47 g) obtained above was added dropwise, and the mixture was stirred for 4 hours. A small amount of the reaction solution was sampled and measured for $^{1}$H-NMR, as a result, the protection ratio was 22.3%. Thereafter, an operation of additionally adding a small amount of Compound 2, stirring the mixture for 1 hour, and measuring $^{1}$H-NMR was repeated, and when the protection ratio exceeded the target value of 25.0%, the reaction was stopped by adding distilled water. THF was removed by distillation under reduced pressure, and the reaction product was dissolved in ethyl acetate. The obtained organic layer was washed with distilled water five times, and the resulting organic layer was added dropwise to 1.5 L of hexane. The obtained precipitate was separated by filtration, then washed with a small amount of hexane and dissolved in 35 g of propylene glycol monomethyl ether acetate (PGMEA), and a low-boiling-point solvent was removed from the obtained solution in an evaporator to obtain 43.3 g of a PGMEA solution of Compound (P1) (23.7 mass %).

With respect to the obtained Compound (P1), the compositional ratio (molar ratio) of Compound (P1) was calculated by $^{1}$H-NMR measurement. Also, the weight average molecular weight (Mw: in terms of polystyrene), number average molecular weight (Mn: in terms of polystyrene) and polydispersity (Mw/Mn, hereinafter sometimes referred to as "PDI") of Compound (P1) were calculated by GPC (solvent: THF) measurement.

Resins (P2) to (P9) shown below were also synthesized in the same manner as in Synthesis Example 1 by reacting a corresponding polyhydroxystyrene compound with the chloroether compound. The chemical structure, compositional ratio (molar ratio), weight average molecular weight and polydispersity of each resin are as shown below.

[Chem. 180]

(P1)

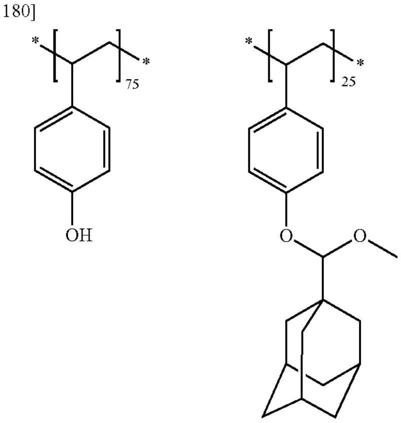

Mw = 4600
Mw/Mn = 1.13

-continued
(P2)
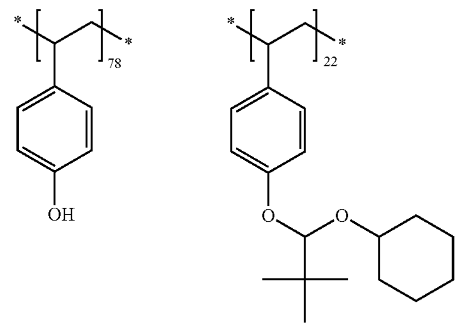
Mw = 4500
Mw/Mn = 1.13
(P3)
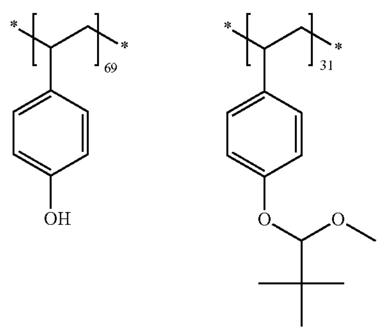
Mw = 4400
Mw/Mn = 1.11
(P4)
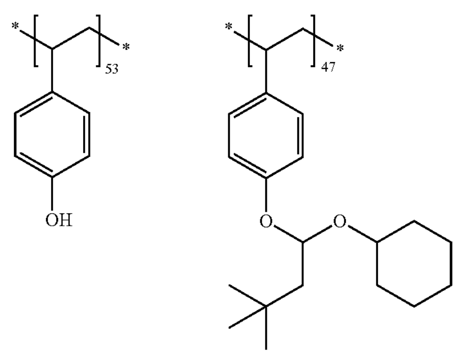
Mw = 5500
Mw/Mn = 1.14
(P-5)
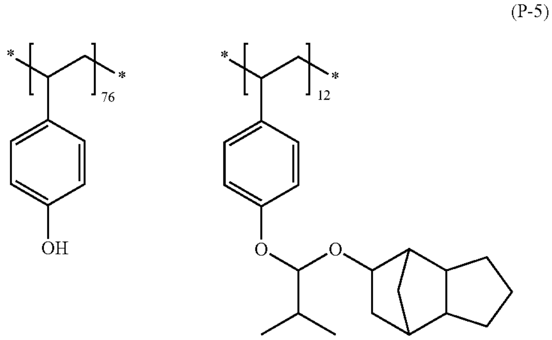
-continued
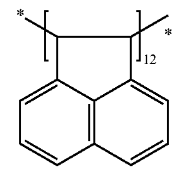
Mw = 5600
Mw/Mn = 1.45
[Chem. 181]
(P6)
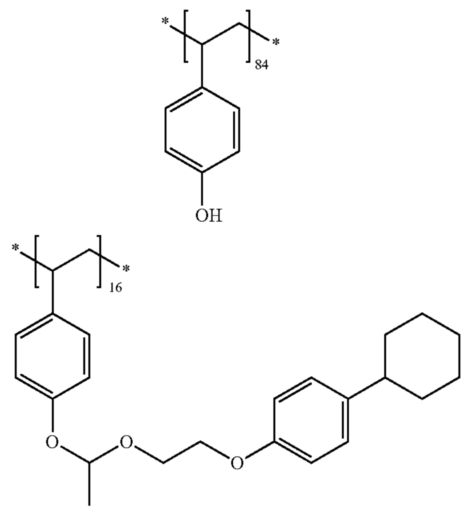
Mw = 12400
Mw/Mn = 1.08
(P7)
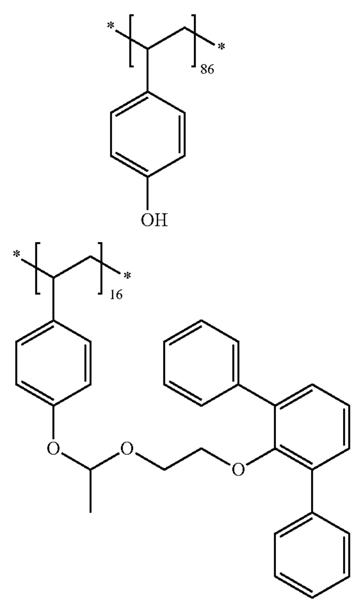
Mw = 12300
Mw/Mn = 1.08

-continued (P8)

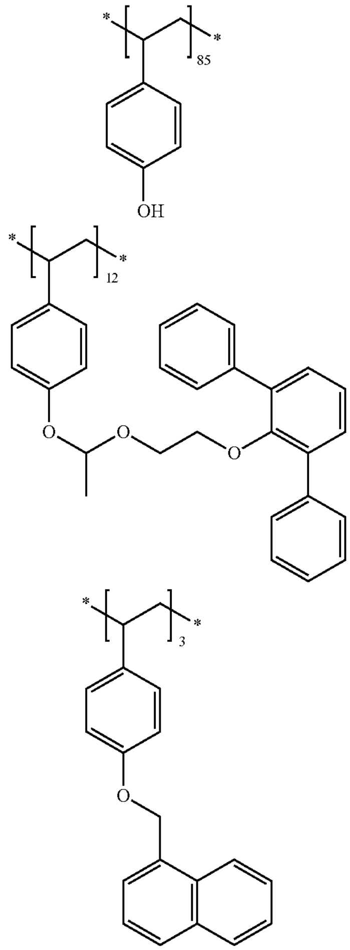

Mw = 12300
Mw/Mn = 1.09

(P9)

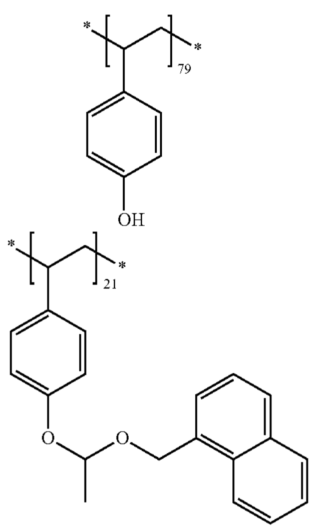

Mw = 4400
Mw/Mn = 1.12

The structures of the photoacid generators used in Examples are shown below together with the volume value of the acid generated from the photoacid generator. Here, the volume value of the acid was obtained by the same calculation method as that for the volume value generated from Compounds (A-1) to (A-23).

[Photoacid Generator]

[Chem. 182]

(PAG-1)

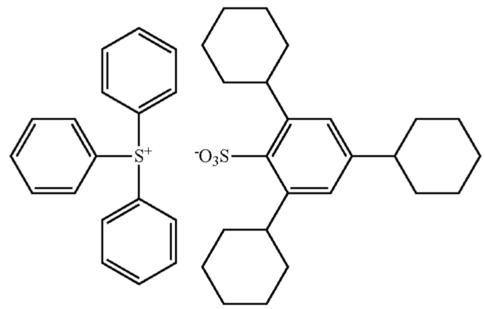

437Å$^3$ (PAG-2)

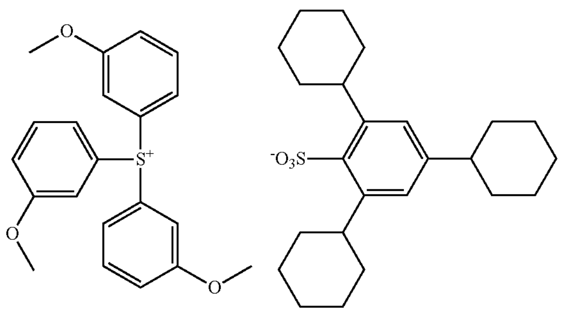

437Å$^3$ (PAG-3)

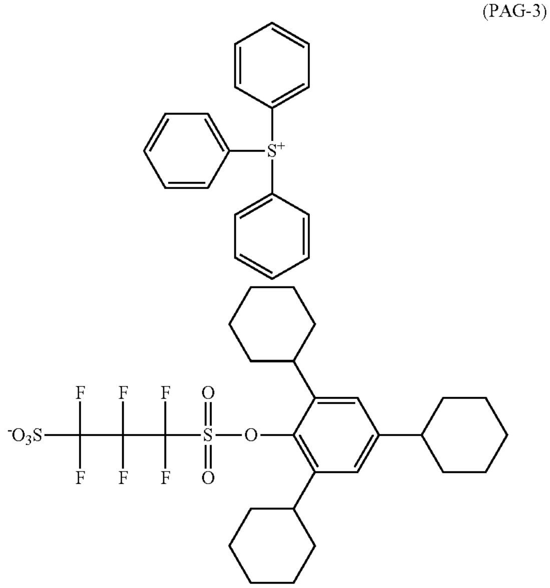

535Å$^3$

-continued (PAG-4)

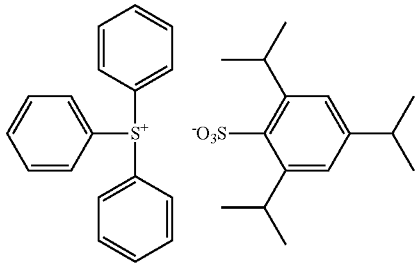

303Å$^3$

Synthesis Example

PAG-1

(Synthesis of Tricyclohexylbenzene)

6.83 g of aluminum chloride was added to 20.0 g of benzene, followed by cooling/stirring at 3° C., and 40.4 g of cyclohexyl chloride was slowly added dropwise. After the dropwise addition, the mixture was stirred at room temperature for 5 hours and poured into ice water. The organic layer was extracted with ethyl acetate, and the obtained organic layer was distilled off under reduced pressure at 40° C. After further distillation off under reduced pressure at 170° C., the product was cooled to room temperature, charged into 50 ml of acetone and thereby recrystallized. The crystal precipitated was collected by filtration to obtain 14 g of tricyclohexylbenzene.

(Synthesis of Sodium Tricyclohexylbenzenesulfonate)

30 g of tricyclohexylbenzene was dissolved in 50 ml of methylene chloride, followed by cooling/stirring at 3° C., and 15.2 g of chlorosulfonic acid was slowly added dropwise. After the dropwise addition, the mixture was stirred at room temperature for 5 hours, charged with 10 g of ice, and further charged with 40 g of an aqueous 50% sodium hydroxide solution. Furthermore, 20 g of ethanol was added, followed by stirring at 50° C. for 1 hour, and after removing insoluble matters by filtration, the filtrate was distilled off under reduced pressure at 40° C. The precipitated crystal was collected by filtration and subjected to hexane washing to obtain 30 g of sodium 1,3,5-tricyclohexylbenzenesulfonate.

(Synthesis of PAG-1)

4.0 g of triphenylsulfonium bromide was dissolved in 20 ml of methanol, and 5.0 g of sodium 1,3,5-tricyclohexylbenzenesulfonate dissolved in 20 ml of methanol was added thereto. After stirring at room temperature for 2 hours, 50 ml of ion-exchanged water was added, and the product was extracted with chloroform. The obtained organic layer was washed with water and then distilled off under reduced pressure at 40° C., and the obtained crystal was recrystallized from a methanol/ethyl acetate solvent, whereby 5.0 g of PAG-1 was obtained.

$^1$H-NMR (400 MHz, $CDCl_3$) δ=7.85 (d, 6H), 7.68 (t, 3H), 7.59 (t, 6H), 6.97 (s, 2H), 4.36-4.27 (m, 2H), 2.48-2.38 (m, 1H), 1.97-1.16 (m, 30H).

PAG-2 to PAG-4 were also synthesized in the same manner.

As the basic compound, the compounds represented by the following formulae were used.

[Basic Compound]

[Chem. 183]

(BASE-1)

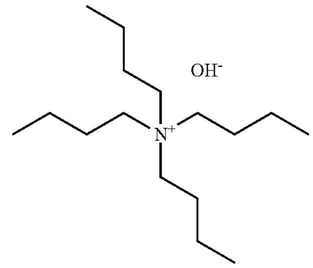

(BASE-2)

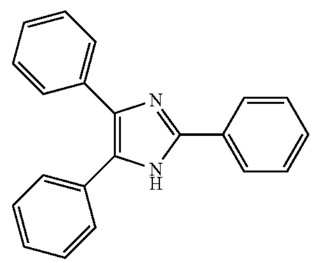

(BASE-3)

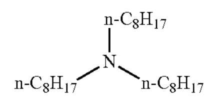

[Surfactant]

As the surfactant, the followings were used.

W-1: Megaface F176 (produced by DIC Corp.; fluorine-containing)

W-2: Megaface R08 (produced by DIC Corp.; containing fluorine and silicon)

W-3: PF6320 (produced by OMNOVA Solutions Inc.; fluorine-containing)

As the solvent, the followings were used.

S1: Propylene glycol monomethyl ether acetate (PGMEA)

S2: Propylene glycol monomethyl ether (PGME)

S3: Cyclohexanone

S4: Ethyl lactate (EL)

(2) Preparation of Resist Coating Solution

The components shown in Tables 19 to 24 below were dissolved in the solvent shown in the same Tables, and the resulting solution was microfiltered through a polytetrafluoroethylene filter having a pore size of 0.04 μm to obtain a resist coating solution having a solid content concentration of 2 mass %.

(3) Formation of Resist Film

The resist coating solution was coated on the 6-inch wafer by using a spin coater, Mark 8, manufactured by Tokyo Electron Ltd. and dried at 110° C. for 90 seconds on a hot plate to obtain a resist film having a thickness of 40 nm. That is, a resist-coated mask blanks was obtained.

(4) Production of Positive Resist Pattern

This resist film was patternwise irradiated using an electron beam lithography apparatus (HL750, manufactured by Hitachi Ltd., accelerating voltage: 50 keV). After the irradiation, the resist film was heated at 120° C. for 90 seconds on a hot plate, dipped in an aqueous 2.38 mass % tetramethylammonium hydroxide (TMAH) solution for 60 seconds, rinsed with water for 30 seconds and dried.

(5) Evaluation of Resist Pattern

The obtained pattern was evaluated for the sensitivity, resolution, pattern profile, line edge roughness (LER) and aging stability by the following methods.

[Sensitivity]

The cross-sectional profile of the pattern obtained was observed using a scanning electron microscope (S-4300, manufactured by Hitachi, Ltd.), and the exposure dose (dose of electron beam irradiation) when resolving a 1:1 line-and-space resist pattern with a line width of 100 nm was taken as the sensitivity. A smaller value indicates higher sensitivity.

[Evaluation of Resolution]

The limiting resolution (the minimum line width below which the line and the space were not separated and resolved) at the exposure dose (dose of electron beam irradiation) giving the sensitivity above was taken as the resolution.

[Pattern Profile]

The cross-sectional profile of a 1:1 line-and-space pattern with a line width of 100 nm at the exposure dose (dose of electron beam irradiation) giving the sensitivity above was observed using a scanning electron microscope (S-4300, manufactured by Hitachi, Ltd.). The cross-sectional profile of the line pattern was rated "reverse tapered" when the ratio represented by [line width in the bottom part (at the bottom) of line pattern/line width in the middle of line pattern (at the position of half the height of line pattern)] is 1.5 or more, rated "slightly reverse tapered" when the ratio above is from 1.2 to less than 1.5, and rated "rectangular" when the ratio is less than 1.2.

[Line Edge Roughness (LER)]

A 1:1 line-and-space resist pattern having a line width of 100 nm was formed with the exposure dose (dose of electron beam irradiation) giving the sensitivity above. At arbitrary 30 points included in its longitudinal 50 μm region, the distance from the reference line where the edge should be present was measured using a scanning electron microscope (S-9220, manufactured by Hitachi, Ltd.). The standard deviation of measured distances was determined, and 3σ was computed. A smaller value indicates better performance.

[Aging Stability]

Each composition was stored at 20° C. over 1 month, and the degree of variation in the sensitivity (the sensitivity measured in [Sensitivity] above) between before and after the storage was evaluated. This evaluation was performed based on the following criteria.

(Criteria)

A (Good): The variation in sensitivity was less than 0.5 μC/cm$^2$.

B (Fair): The variation in sensitivity was 0.5 μC/cm$^2$ or more and 1.0 μC/cm$^2$ or less.

C (Insufficient): The variation in sensitivity was more than 1.0 μC/cm$^2$.

[Example 2A] to [Example 43A] and [Comparative Example 1A] to [Comparative Example 4A]

Preparation of the resist solution (Positive Resist Compositions 2D to 43D and Comparative Positive Resist Compositions 1D to 4D) and the formation and evaluation of the positive pattern were performed in the same manner as in Example 1D except for using the components shown in Tables 19 to 24 blow in the resist solution formulation.

TABLE 19

(Positive Resist Composition)

| Composition | Compound of Formula (I) (mass %) | Polymer Compound (mass %) | Photoacid Generator (mass %) | Basic Compound (mass %) | Surfactant (mass %) | Solvent (mass ratio) |
|---|---|---|---|---|---|---|
| 1D | A-1 (3.18) | P1 (90.87) | PAG-1 (5.5) | BASE-1 (0.40) | W-1 (0.05) | S1/S2 (8/2) |
| 2D | A-2 (3.74) | P1 (90.31) | PAG-1 (5.5) | BASE-1 (0.40) | W-1 (0.05) | S1/S2 (8/2) |
| 3D | A-3 (4.17) | P1 (89.88) | PAG-1 (5.5) | BASE-1 (0.40) | W-1 (0.05) | S1/S2 (8/2) |
| 4D | A-4 (3.69) | P1 (90.36) | PAG-1 (5.5) | BASE-1 (0.40) | W-1 (0.05) | S1/S2 (8/2) |
| 5D | A-5 (3.39) | P1 (90.66) | PAG-1 (5.5) | BASE-1 (0.40) | W-1 (0.05) | S1/S2 (8/2) |
| 6D | A-6 (3.66) | P1 (90.39) | PAG-1 (5.5) | BASE-1 (0.40) | W-1 (0.05) | S1/S2 (8/2) |
| 7D | A-7 (4.00) | P1 (90.05) | PAG-1 (5.5) | BASE-1 (0.40) | W-1 (0.05) | S1/S2 (8/2) |
| 8D | A-8 (3.69) | P1 (90.36) | PAG-1 (5.5) | BASE-1 (0.40) | W-1 (0.05) | S1/S2 (8/2) |
| 9D | A-9 (4.20) | P1 (89.85) | PAG-1 (5.5) | BASE-1 (0.40) | W-1 (0.05) | S1/S2 (8/2) |
| 10D | A-10 (3.51) | P1 (90.54) | PAG-1 (5.5) | BASE-1 (0.40) | W-1 (0.05) | S1/S2 (8/2) |
| 11D | A-11 (3.29) | P1 (90.76) | PAG-1 (5.5) | BASE-1 (0.40) | W-1 (0.05) | S1/S2 (8/2) |
| 12D | A-12 (3.29) | P1 (90.76) | PAG-1 (5.5) | BASE-1 (0.40) | W-1 (0.05) | S1/S2 (8/2) |
| 13D | A-13 (4.17) | P1 (89.88) | PAG-1 (5.5) | BASE-1 (0.40) | W-1 (0.05) | S1/S2 (8/2) |
| 14D | A-14 (2.70) | P1 (91.35) | PAG-1 (5.5) | BASE-1 (0.40) | W-1 (0.05) | S1/S2 (8/2) |

TABLE 20

Cont. of Table 19 (Positive Resist Composition)

| Composition | Compound of Formula (I) (mass %) | Polymer Compound (mass %) | Photoacid Generator (mass %) | Basic Compound (mass %) | Surfactant (mass %) | Solvent (mass ratio) |
|---|---|---|---|---|---|---|
| 15D | A-15 (3.26) | P1 (90.79) | PAG-1 (5.5) | BASE-1 (0.40) | W-1 (0.05) | S1/S2 (8/2) |
| 16D | A-16 (2.61) | P1 (91.44) | PAG-1 (5.5) | BASE-1 (0.40) | W-1 (0.05) | S1/S2 (8/2) |
| 17D | A-17 (4.22) | P1 (89.83) | PAG-1 (5.5) | BASE-1 (0.40) | W-1 (0.05) | S1/S2 (8/2) |

TABLE 20-continued

Cont. of Table 19 (Positive Resist Composition)

| Composition | Compound of Formula (I) (mass %) | Polymer Compound (mass %) | Photoacid Generator (mass %) | Basic Compound (mass %) | Surfactant (mass %) | Solvent (mass ratio) |
|---|---|---|---|---|---|---|
| 18D | A-18 (5.41) | P1 (88.64) | PAG-1 (5.5) | BASE-1 (0.40) | W-1 (0.05) | S1/S2 (8/2) |
| 19D | A-1 (3.18) | P2 (90.87) | PAG-1 (5.5) | BASE-1 (0.40) | W-1 (0.05) | S1/S2 (8/2) |
| 20D | A-1 (3.18) | P3 (90.87) | PAG-1 (5.5) | BASE-1 (0.40) | W-1 (0.05) | S1/S2 (8/2) |
| 21D | A-1 (3.18) | P4 (90.87) | PAG-1 (5.5) | BASE-1 (0.40) | W-1 (0.05) | S1/S2 (8/2) |
| 22D | A-1 (3.18) | P5 (90.87) | PAG-1 (5.5) | BASE-1 (0.40) | W-1 (0.05) | S1/S2 (8/2) |
| 23D | A-1 (3.18) | P6 (90.87) | PAG-1 (5.5) | BASE-1 (0.40) | W-1 (0.05) | S1/S2 (8/2) |
| 24D | A-1 (3.18) | P7 (90.87) | PAG-1 (5.5) | BASE-1 (0.40) | W-1 (0.05) | S1/S2 (8/2) |
| 25D | A-1 (3.18) | P8 (91.17) | PAG-1/ PAG-4 (4.0/1.2) | BASE-1 (0.40) | W-1 (0.05) | S1/S2 (8/2) |
| 26D | A-1 (3.18) | P9 (90.87) | PAG-1 (5.5) | BASE-1 (0.40) | W-1 (0.05) | S1/S2 (8/2) |

TABLE 21

Cont. of Table 19 (Positive Resist Composition)

| Composition | Compound of Formula (I) (mass %) | Polymer Compound (mass %) | Photoacid Generator (mass %) | Basic Compound (mass %) | Surfactant (mass %) | Solvent (mass ratio) |
|---|---|---|---|---|---|---|
| 27D | A-1 (3.18) | P1 (91.87) | PAG-4 (4.5) | BASE-1 (0.40) | W-1 (0.05) | S1/S2 (8/2) |
| 28D | A-1 (3.18) | P1 (90.17) | PAG-2 (6.2) | BASE-1 (0.40) | W-1 (0.05) | S1/S2 (8/2) |
| 29D | A-1 (3.18) | P1 (88.97) | PAG-3 (7.4) | BASE-1 (0.40) | W-1 (0.05) | S1/S2 (8/2) |
| 30D | A-1 (3.18) | P5 (90.73) | PAG-1 (5.5) | BASE-3 (0.54) | W-1 (0.05) | S1/S2 (8/2) |
| 31D | A-1 (3.18) | P7 (91.87) | PAG-4 (4.5) | BASE-1 (0.40) | W-1 (0.05) | S1/S2 (8/2) |
| 32D | A-9 (4.20) | P8 (87.89) | PAG-3 (7.4) | BASE-2 (0.46) | W-1 (0.05) | S1/S2 (8/2) |
| 33D | A-4 (3.69) | P2 (89.52) | PAG-2 (6.2) | BASE-3 (0.54) | W-1 (0.05) | S1/S2 (8/2) |
| 34D | A-1 (3.18) | P6 (91.17) | PAG-1 · PAG-4 (4.0/1.2) | BASE-1 (0.40) | W-2 (0.05) | S1/S2/S4 (6/3/1) |
| 35D | A-1 (3.18) | P7 (91.22) | PAG-1 · PAG-4 (4.0/1.2) | BASE-1 (0.40) | none | S1/S2 (8/2) |
| 36D | A-1 (3.18) | P8 (91.03) | PAG-1 · PAG-4 (4.0/1.2) | BASE-3 (0.54) | W-3 (0.05) | S1/S2 (8/2) |
| 37D | A-1 (3.18) | P1 (90.92) | PAG-1 (5.5) | BASE-1 (0.40) | none | S1/S2 (8/2) |
| 38D | A-1 (3.18) | P8 (91.22) | PAG-1 · PAG-4 (4.0/1.2) | BASE-1 (0.40) | none | S1/S2 (8/2) |
| 39D | A-19 (4.70) | P1 (89.35) | PAG-1 (5.5) | BASE-1 (0.40) | W-1 (0.05) | S1/S2 (8/2) |
| 40D | A-20 (5.21) | P1 (88.84) | PAG-1 (5.5) | BASE-1 (0.40) | W-1 (0.05) | S1/S2 (8/2) |
| 41D | A-21 (3.66) | P1 (90.39) | PAG-1 (5.5) | BASE-1 (0.40) | W-1 (0.05) | S1/S2 (8/2) |
| 42D | A-22 (4.34) | P1 (89.71) | PAG-1 (5.5) | BASE-1 (0.40) | W-1 (0.05) | S1/S2 (8/2) |
| 43D | A-23 (5.68) | P1 (88.37) | PAG-1 (5.5) | BASE-1 (0.40) | W-1 (0.05) | S1/S2 (8/2) |

TABLE 22

Cont. of Table 19 (Positive Resist Composition)

| | | | | | | |
|---|---|---|---|---|---|---|
| Comparative Example 1D | none | P1 (94.05) | PAG-1 (5.5) | BASE-1 (0.40) | W-1 (0.05) | S1/S2 (8/2) |

TABLE 22-continued

Cont. of Table 19 (Positive Resist Composition)

| | | | | | | |
|---|---|---|---|---|---|---|
| Comparative Example 2D | R-1 (2.68) | P1 (91.37) | PAG-1 (5.5) | BASE-1 (0.40) | W-1 (0.05) | S1/S2 (8/2) |

TABLE 22-continued

| Cont. of Table 19 (Positive Resist Composition) | | | | | | |
|---|---|---|---|---|---|---|
| Comparative Example 3D | R-2 (2.34) | P1 (91.71) | PAG-1 (5.5) | BASE-1 (0.40) | W-1 (0.05) | S1/S2 (8/2) |
| Comparative Example 4D | R-3 (2.23) | P1 (91.82) | PAG-1 (5.5) | BASE-1 (0.40) | W-1 (0.05) | S1/S2 (8/2) |

The evaluation results are shown in Tables 23 and 24 below.

TABLE 23

(Electron Beam Exposure (positive))

| Example | Composition | Sensitivity (μC/cm²) | Resolution (nm) | Pattern Profile | LER (nm) | Aging Stability |
|---|---|---|---|---|---|---|
| 1A | 1D | 18.2 | 25.0 | rectangular | 4.8 | A |
| 2A | 2D | 18.5 | 25.0 | rectangular | 4.8 | A |
| 3A | 3D | 17.5 | 25.0 | rectangular | 4.8 | A |
| 4A | 4D | 17.2 | 25.0 | rectangular | 4.7 | A |
| 5A | 5D | 18.4 | 25.0 | rectangular | 4.9 | A |
| 6A | 6D | 18.2 | 25.0 | rectangular | 4.8 | A |
| 7A | 7D | 18.2 | 25.0 | rectangular | 4.8 | A |
| 8A | 8D | 17.5 | 25.0 | rectangular | 4.7 | A |
| 9A | 9D | 17.0 | 25.0 | rectangular | 4.7 | A |
| 10A | 10D | 18.0 | 25.0 | rectangular | 4.7 | A |
| 11A | 11D | 18.5 | 25.0 | rectangular | 5.0 | A |
| 12A | 12D | 18.3 | 25.0 | rectangular | 4.8 | A |
| 13A | 13D | 18.0 | 25.0 | rectangular | 5.1 | A |
| 14A | 14D | 18.0 | 25.0 | rectangular | 5.2 | A |
| 15A | 15D | 18.0 | 25.0 | rectangular | 5.2 | A |
| 16A | 16D | 18.1 | 25.0 | rectangular | 5.2 | A |
| 17A | 17D | 18.3 | 25.0 | rectangular | 4.9 | A |
| 18A | 18D | 17.5 | 25.0 | rectangular | 5.0 | A |
| 19A | 19D | 17.5 | 25.0 | rectangular | 4.5 | A |
| 20A | 20D | 17.7 | 25.0 | rectangular | 4.7 | A |
| 21A | 21D | 18.1 | 25.0 | rectangular | 4.8 | A |
| 22A | 22D | 18.4 | 25.0 | rectangular | 4.5 | A |
| 23A | 23D | 18.4 | 25.0 | rectangular | 4.5 | A |
| 24A | 24D | 17.5 | 25.0 | rectangular | 4.5 | A |
| 25A | 25D | 17.5 | 25.0 | rectangular | 4.4 | A |
| 26A | 26D | 19.3 | 25.0 | rectangular | 5.0 | B |
| 27A | 27D | 18.0 | 25.0 | rectangular | 4.4 | A |

TABLE 24

Cont. of Table 23 (Electron Beam Exposure (positive))

| Example | Composition | Sensitivity (μC/cm²) | Resolution (nm) | Pattern Profile | LER (nm) | Aging Stability |
|---|---|---|---|---|---|---|
| 28A | 28D | 17.8 | 25.0 | rectangular | 4.8 | A |
| 29A | 29D | 17.5 | 25.0 | rectangular | 4.8 | A |
| 30A | 30D | 18.4 | 25.0 | rectangular | 4.5 | A |
| 31A | 31D | 17.5 | 25.0 | rectangular | 4.4 | A |
| 32A | 32D | 17.8 | 25.0 | rectangular | 4.7 | A |
| 33A | 33D | 17.8 | 25.0 | rectangular | 4.8 | A |
| 34A | 34D | 18.1 | 25.0 | rectangular | 5.1 | A |
| 35A | 35D | 17.9 | 25.0 | rectangular | 5.1 | A |
| 36A | 36D | 17.5 | 25.0 | rectangular | 4.6 | A |
| 37A | 37D | 18.2 | 25.0 | rectangular | 4.9 | A |
| 38A | 38D | 17.9 | 37.5 | rectangular | 5.0 | A |
| 39A | 39D | 17.9 | 25.0 | rectangular | 4.7 | A |
| 40A | 40D | 17.5 | 25.0 | rectangular | 4.5 | A |
| 41A | 41D | 17.5 | 25.0 | rectangular | 4.6 | A |
| 42A | 42D | 17.8 | 25.0 | rectangular | 4.7 | A |
| 43A | 43D | 18.0 | 25.0 | rectangular | 4.7 | A |
| Comparative Example 1A | Comparative Composition 1D | 22.3 | 50.0 | reverse tapered | 6.2 | A |
| Comparative Example 2A | Comparative Composition 2D | 22.1 | 37.5 | slightly reverse tapered | 6.0 | C |

TABLE 24-continued

Cont. of Table 23 (Electron Beam Exposure (positive))

| Example | Composition | Sensitivity (μC/cm²) | Resolution (nm) | Pattern Profile | LER (nm) | Aging Stability |
|---|---|---|---|---|---|---|
| Comparative Example 3A | Comparative Composition 3D | 21.6 | 37.5 | slightly reverse tapered | 6.0 | C |
| Comparative Example 4A | Comparative Composition 4D | 22.2 | 50.0 | reverse tapered | 6.2 | C |

It is seen from the results shown in Tables 23 and 24 that the composition according to the present invention is excellent in the sensitivity, resolution, pattern profile, LER performance and aging stability.

Examples 1B to 6B and Comparative Examples 1B to 4B

Preparation of Resist Solution

Each of the positive resist compositions shown in Tables 19 to 22 was filtered through a polytetrafluoroethylene filter having a pore size of 0.04 μm to prepare a positive resist solution having a solid content concentration of 2 mass %.

(Evaluation of Resist)

The positive resist solution prepared was uniformly coated on a hexamethyldisilazane-treated silicon substrate by using a spin coater and heated/dried at 100° C. for 60 seconds on a hot plate to form a resist film having a thickness of 0.05 μm.

With respect to the resist film obtained, the sensitivity, resolution, pattern profile, line edge roughness (LER) and aging stability were evaluated by the following methods.

[Sensitivity]

The obtained resist film was exposed using EUV light (wavelength: 13 nm) through a reflective mask having a 1:1 line-and-space pattern by changing the exposure dose in steps of 0.1 mJ/cm² in the range of 0 to 30.0 mJ/cm², then baked at 110° C. for 90 seconds and thereafter, developed with an aqueous 2.38 mass % tetramethylammonium hydroxide (TMAH) solution.

The exposure dose for resolving the pattern with a line width of 100 nm was taken as the sensitivity. A smaller value indicates higher sensitivity.

[Resolution]

The limiting resolution (the minimum line width below which the line and the space were not separated and resolved) at the exposure dose giving the sensitivity above was taken as the LS resolution (nm).

[Pattern Profile]

The cross-sectional profile of a 1:1 line-and-space pattern with a line width of 100 nm at the exposure dose giving the sensitivity above was observed using a scanning electron microscope (S-4300, manufactured by Hitachi, Ltd.). The cross-sectional profile of the line pattern was rated "reverse tapered" when the ratio represented by [line width in the bottom part (at the bottom) of line pattern/line width in the middle of line pattern (at the position of half the height of line pattern)] is 1.5 or more, rated "slightly reverse tapered" when the ratio above is from 1.2 to less than 1.5, and rated "rectangular" when the ratio is less than 1.2.

[Line Edge Roughness (LER)]

A 1:1 line-and-space pattern having a line width of 100 nm was formed with the exposure dose giving the sensitivity above. At arbitrary 30 points included in its longitudinal 50

μm region, the distance from the reference line where the edge should be present was measured using a scanning electron microscope (S-9220, manufactured by Hitachi, Ltd.). The standard deviation of measured distances was determined, and 3σ was computed. A smaller value indicates better performance.

[Aging Stability]

Each composition was stored at room temperature over 1 month, and the degree of variation in the sensitivity (the sensitivity measured in [Sensitivity] above) between before and after the storage was evaluated. This evaluation was performed based on the following criteria.

(Criteria)

A (Good): The variation in sensitivity was less than 1 mJ/cm$^2$.

B (Fair): The variation in sensitivity was 1 mJ/cm$^2$ or more and 3 mJ/cm$^2$ or less.

C (Insufficient): The variation in sensitivity was more than 3 mJ/cm$^2$.

These evaluation results are shown in Table 25 below.

TABLE 25

(EUV Exposure (positive))

| Example | Composition | Sensitivity (mJ/cm$^2$) | Resolution (nm) | Pattern Profile | LER (nm) | Aging Stability |
|---|---|---|---|---|---|---|
| 1B | 1D | 19.2 | 25.0 | rectangular | 4.9 | A |
| 2B | 13D | 18.8 | 25.0 | rectangular | 4.7 | A |
| 3B | 18D | 19.0 | 20.0 | rectangular | 5.1 | A |
| 4B | 21D | 18.5 | 25.0 | rectangular | 5.1 | A |
| 5B | 24D | 18.9 | 25.0 | rectangular | 4.9 | A |
| 6B | 33D | 19.0 | 30.0 | rectangular | 4.8 | A |
| Comparative Example 1B | Comparative Composition 1D | 23.2 | 35.0 | reverse tapered | 6.4 | A |
| Comparative Example 2B | Comparative Composition 2D | 22.8 | 35.0 | slightly reverse tapered | 6.0 | C |
| Comparative Example 3B | Comparative Composition 3D | 22.7 | 35.0 | slightly reverse tapered | 6.0 | C |
| Comparative Example 4B | Comparative Composition 4D | 23.1 | 35.0 | reverse tapered | 6.4 | C |

It is seen from the results shown in Table 25 that the composition according to the present invention is excellent in the sensitivity, resolution, pattern profile, LER performance and aging stability.

Examples 1E to 38E and Comparative Examples 1E to 4E

(1) Preparation of Support

A Cr oxide-deposited 6-inch wafer (a wafer subjected to a shielding film treatment, which is used for normal photomask blanks) was prepared.

[Resin]

With respect to Polymer Compounds P10 to P14 used in Examples, the chemical structure, compositional ratio (molar ratio) of repeating units, and weight average molecular weight of each polymer compound are shown below. Also, the chemical structure of Low Molecular Compound P15 used in Examples is shown below.

[Chem. 184]

P10

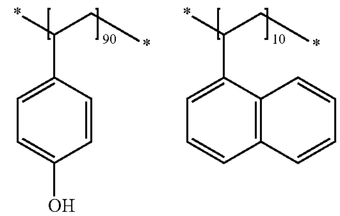

Mw = 12000
Mw/Mn = 2.30

P11

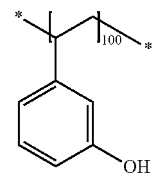

Mw = 4500
Mw/Mn = 1.10

P12

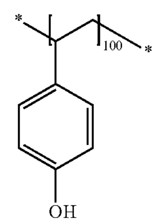

Mw = 3700
Mw/Mn = 1.10

P13

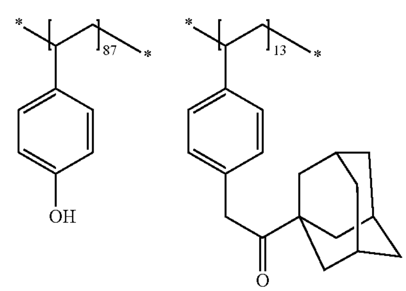

Mw = 4200
Mw/Mn = 1.10

P14

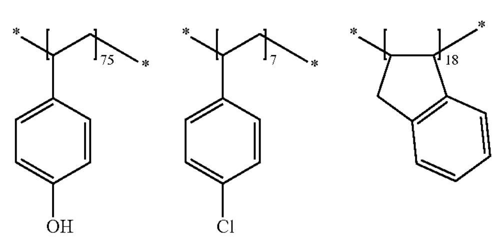

Mw = 4500
Mw/Mn = 1.50

-continued

P15

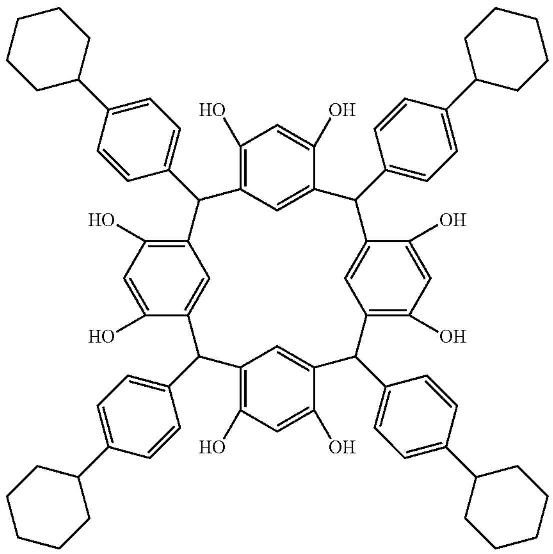

[Photoacid Generator]

The structures of the photoacid generators used in Examples are shown below together with the volume value of the acid generated from the photoacid generator. Here, the volume value of the acid was obtained by the same calculation method as that for the volume value generated from Compounds (A-1) to (A-23).

[Chem. 185]

(PAG-3)

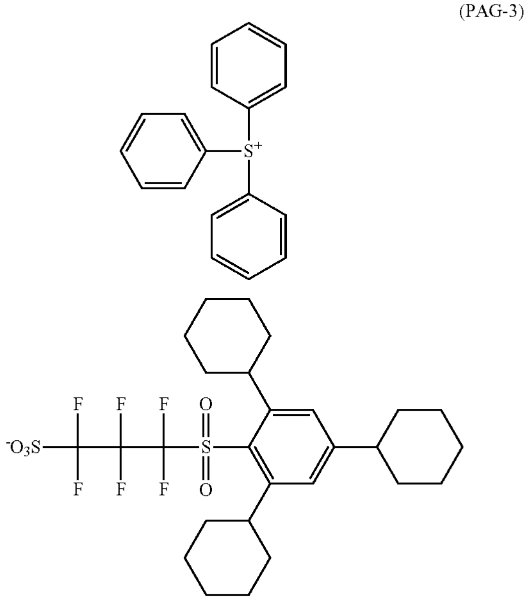

535 Å$^3$

-continued (PAG-4)

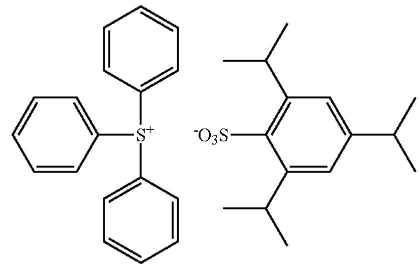

303 Å$^3$ (PAG-5)

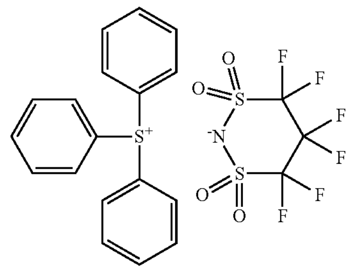

136 Å$^3$ (PAG-6)

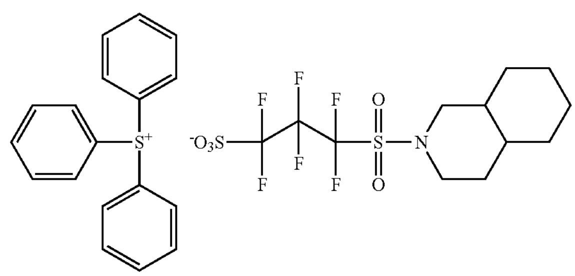

311 Å$^3$ (PAG-7)

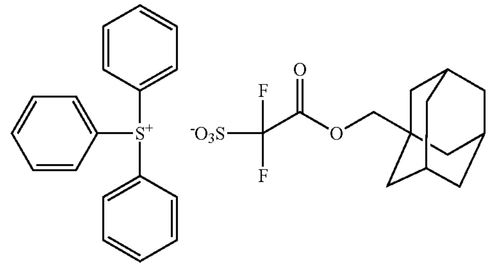

271 Å$^3$

-continued
(PAG-8)
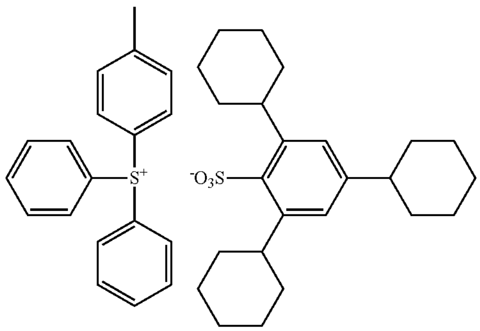
437 Å$^3$
[Crosslinking Agent]
As the crosslinking agent, the compounds represented by the following formulae were used.
[Chem. 186]
CL-1
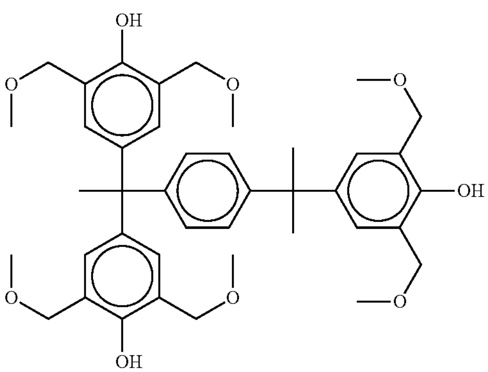
CL-2
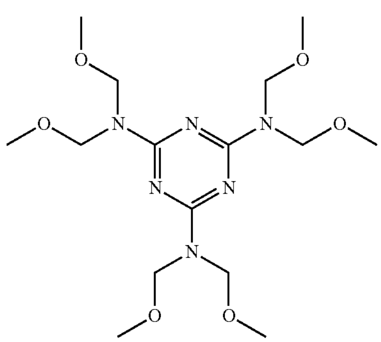
CL-3
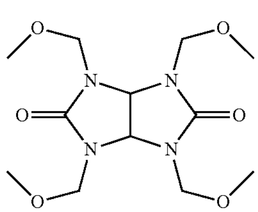
-continued
CL-4
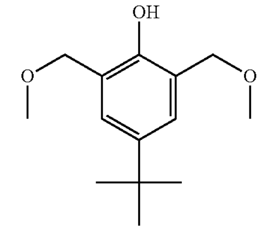
CL-5
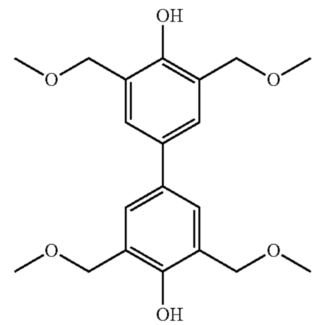
[Basic Compound]
As the basic compound, the compounds represented by the following formulae were used.
[Chem. 187]
(BASE-1)
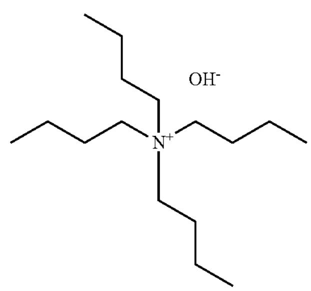
(BASE-2)
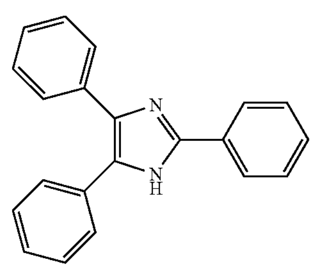
(BASE-3)
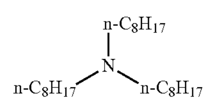
(BASE-4)
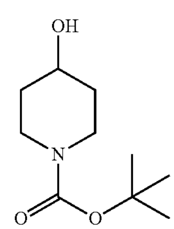

-continued (BASE-5)

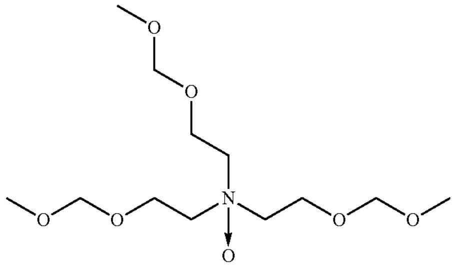

(BASE-6)

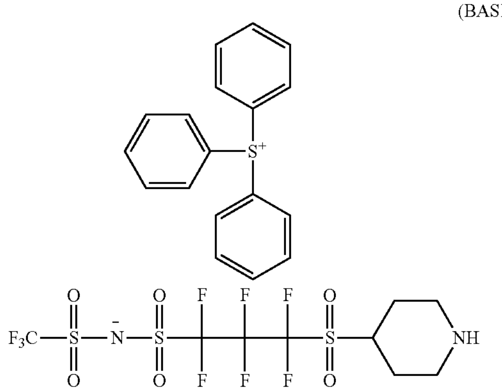

[Organic Carboxylic Acid]

As the organic carboxylic acid, the followings were used.

D1: 2-Hydroxy-3-naphthoic acid

D2: 2-Naphthoic acid

D3: Benzoic acid

[Surfactant]

As the surfactant, the followings were used.

W-1: Megaface F176 (produced by DIC Corp.; fluorine-containing)

W-2: Megaface R08 (produced by DIC Corp.; containing fluorine and silicon)

W-3: PF6320 (produced by OMNOVA Solutions Inc.; fluorine-containing)

W-4: Polysiloxane Polymer (produced by Shin-Etsu Chemical Co., Ltd.; silicon-containing)

[Solvent]

As the solvent, the followings were used.

S1: Propylene glycol monomethyl ether acetate (PGMEA)

S2: Propylene glycol monomethyl ether (PGME)

S3: Cyclohexanone

S4: Ethyl lactate (EL)

S5: 2-Heptanone

S6: γ-Butyrolactone

S7: Propylene carbonate (2) Preparation of Resist Coating Solution (Formulation of Coating Solution of Negative Resist Composition)

The components shown in Table 26 below were dissolved in the solvent shown in the same Table, and the resulting solution was microfiltered through a polytetrafluoroethylene filter having a pore size of 0.04 μm to obtain a resist coating solution having a solid content concentration of 4 mass %.

(3) Formation of Resist Film

The resist coating solution was coated on the 6-inch wafer by using a spin coater, Mark 8, manufactured by Tokyo Electron Ltd. and dried at 110° C. for 90 seconds on a hot plate to obtain a resist film having a thickness of 100 nm. That is, a resist-coated mask blanks was obtained.

(4) Production of Negative Resist Pattern

This resist film was patternwise irradiated using an electron beam lithography apparatus (HL750, manufactured by Hitachi Ltd., accelerating voltage: 50 keV). After the irradiation, the resist film was heated at 120° C. for 90 seconds on a hot plate, dipped in an aqueous 2.38 mass % tetramethylammonium hydroxide (TMAH) solution for 60 seconds, rinsed with water for 30 seconds and dried.

(5) Evaluation of Resist Pattern

The obtained pattern was evaluated for the sensitivity, resolution, pattern profile, LER performance, scum, dry etching resistance and aging stability by the following methods.

[Sensitivity]

The cross-sectional profile of the pattern obtained was observed using a scanning electron microscope (S-4300, manufactured by Hitachi, Ltd.), and the exposure dose (dose of electron beam irradiation) when resolving a 1:1 line-and-space resist pattern with a line width of 100 nm was taken as the sensitivity. A smaller value indicates higher sensitivity.

[Resolution]

The limiting resolution (the minimum line width below which the line and the space were not separated and resolved) at the exposure dose (dose of electron beam irradiation) giving the sensitivity above was taken as the resolution (nm).

[Pattern Profile]

The cross-sectional profile of a 1:1 line-and-space resist pattern with a line width of 100 nm at the exposure dose (dose of electron beam irradiation) giving the sensitivity above was observed using a scanning electron microscope (S-4300, manufactured by Hitachi, Ltd.). The cross-sectional profile of the line pattern was rated "reverse tapered" when the ratio represented by [line width in the top part (surface part) of line pattern/line width in the middle of line pattern (at the position of half the height of line pattern)] is 1.5 or more, rated "slightly reverse tapered" when the ratio above is from 1.2 to less than 1.5, and rated "rectangular" when the ratio is less than 1.2.

[LER Performance]

A 1:1 line-and-space resist pattern having a line width of 100 nm was formed with the irradiation dose (dose of electron beam irradiation) giving the sensitivity above. At arbitrary 30 points included in its longitudinal 50 μm region, the distance from the reference line where the edge should be present was measured using a scanning electron microscope (S-9220, manufactured by Hitachi, Ltd.). The standard deviation of measured distances was determined, and 3σ was computed. A smaller value indicates better performance.

[Dry Etching Resistance]

A resist film formed by performing entire surface irradiation with the irradiation dose (dose of electron beam irradiation) giving the sensitivity above was subjected to dry etching for 30 seconds by using an $Ar/C_4F_6/O_2$ gas (a mixed gas in a volume ratio of 100/4/2) in HITACHI U-621. Thereafter, the residual resist film ratio was measured and used as an indicator of dry etching resistance.

Very good: Residual film ratio of 95% or more.

Good: Less than 95% and 90% or more.

Bad: Less than 90%.

[Evaluation of Scum]

A line-and-space resist pattern was formed by the same method as in [Pattern Profile] above. Thereafter, its cross-sectional SEM was obtained using S4800 (manufactured by Hitachi High-Technologies Corporation), and the scum in the space portion was observed and rated as follows.

C: Scum was observed and patterns were partially connected.

B: Scum was observed but patterns were not connected.

A: Scum was not observed.

[Aging Stability]

Each composition was stored at room temperature over 1 month, and the degree of variation in the sensitivity (the sensitivity measured in the exposure above) between before and after the storage was evaluated. This evaluation was performed based on the following criteria.

(Criteria)

A (Good): The variation in sensitivity was less than 0.5 $\mu C/cm^2$.

B (Fair): The variation in sensitivity was 0.5 $\mu C/cm^2$ or more and 1 $\mu C/cm^2$ or less.

C (Insufficient): The variation in sensitivity was more than 1 $\mu C/cm^2$.

TABLE 26

(Composition for Negative Resist)

| Composition | Compound of Formula(I) (mass %) | Polymer Compound (mass %) | Photoacid Generator (mass %) | Organic Carboxylic Acid (mass %) | Basic Compound (mass %) | Surfactant (mass %) | Crosslinking Agent (mass %) | Solvent (mass ratio) |
|---|---|---|---|---|---|---|---|---|
| 1N | A-1 (3.18) | P13 (78.35) | PAG-6 (5.73) | D1 (1.34) | BASE-1 (0.49) | W-3 (0.06) | CL-1/CL-4 (7.19/3.66) | S1/S2 (80/20) |
| 2N | A-2 (3.74) | P13 (77.79) | PAG-6 (5.73) | D1 (1.34) | BASE-1 (0.49) | W-3 (0.06) | CL-1/CL-4 (7.19/3.66) | S1/S2 (80/20) |
| 3N | A-3 (4.17) | P13 (77.36) | PAG-6 (5.73) | D1 (1.34) | BASE-1 (0.49) | W-3 (0.06) | CL-1/CL-4 (7.19/3.66) | S1/S2 (80/20) |
| 4N | A-4 (3.69) | P13 (77.84) | PAG-6 (5.73) | D1 (1.34) | BASE-1 (0.49) | W-3 (0.06) | CL-1/CL-4 (7.19/3.66) | S1/S2 (80/20) |
| 5N | A-5 (3.39) | P13 (78.14) | PAG-6 (5.73) | D1 (1.34) | BASE-1 (0.49) | W-3 (0.06) | CL-1/CL-4 (7.19/3.66) | S1/S2 (80/20) |
| 6N | A-6 (3.66) | P13 (77.87) | PAG-6 (5.73) | D1 (1.34) | BASE-1 (0.49) | W-3 (0.06) | CL-1/CL-4 (7.19/3.66) | S1/S2 (80/20) |
| 7N | A-7 (4.00) | P13 (77.53) | PAG-6 (5.73) | D1 (1.34) | BASE-1 (0.49) | W-3 (0.06) | CL-1/CL-4 (7.19/3.66) | S1/S2 (80/20) |
| 8N | A-8 (3.69) | P13 (77.84) | PAG-6 (5.73) | D1 (1.34) | BASE-1 (0.49) | W-3 (0.06) | CL-1/CL-4 (7.19/3.66) | S1/S5 (80/20) |
| 9N | A-9 (4.20) | P13 (77.33) | PAG-6 (5.73) | D1 (1.34) | BASE-1 (0.49) | W-3 (0.06) | CL-1/CL-4 (7.19/3.66) | S1/S5 (80/20) |
| 10N | A-10 (3.51) | P13 (78.02) | PAG-6 (5.73) | D1 (1.34) | BASE-1 (0.49) | W-3 (0.06) | CL-1/CL-4 (7.19/3.66) | S1/S2 (80/20) |
| 11N | A-11 (3.29) | P13 (78.24) | PAG-6 (5.73) | D1 (1.34) | BASE-1 (0.49) | W-3 (0.06) | CL-1/CL-4 (7.19/3.66) | S1/S2 (80/20) |
| 12N | A-12 (3.29) | P13 (78.24) | PAG-6 (5.73) | D1 (1.34) | BASE-1 (0.49) | W-3 (0.06) | CL-1/CL-4 (7.19/3.66) | S1/S2 (80/20) |
| 13N | A-13 (4.17) | P13 (77.36) | PAG-6 (5.73) | D1 (1.34) | BASE-1 (0.49) | W-3 (0.06) | CL-1/CL-4 (7.19/3.66) | S1/S7 (80/20) |
| 14N | A-14 (2.70) | P13 (78.83) | PAG-6 (5.73) | D1 (1.34) | BASE-1 (0.49) | W-3 (0.06) | CL-1/CL-4 (7.19/3.66) | S1/S2 (80/20) |
| 15N | A-15 (3.26) | P13 (78.27) | PAG-6 (5.73) | D1 (1.34) | BASE-1 (0.49) | W-3 (0.06) | CL-1/CL-4 (7.19/3.66) | S1/S2 (80/20) |

TABLE 27

Cont. of Table 26 (Composition for Negative Resist)

| Composition | Compound of Formula(I) (mass %) | Polymer Compound (mass %) | Photoacid Generator (mass %) | Organic Carboxylic Acid (mass %) | Basic Compound (mass %) | Surfactant (mass %) | Crosslinking Agent (mass %) | Solvent (mass ratio) |
|---|---|---|---|---|---|---|---|---|
| 16N | A-16 (2.61) | P13 (78.92) | PAG-6 (5.73) | D1 (1.34) | BASE-1 (0.49) | W-3 (0.06) | CL-1/CL-4 (7.19/3.66) | S1/S2 (80/20) |
| 17N | A-17 (4.22) | P13 (77.31) | PAG-6 (5.73) | D1 (1.34) | BASE-1 (0.49) | W-3 (0.06) | CL-1/CL-4 (7.19/3.66) | S1/S2 (80/20) |
| 18N | A-18 (5.41) | P13 (76.12) | PAG-6 (5.73) | D1 (1.34) | BASE-1 (0.49) | W-3 (0.06) | CL-1/CL-4 (7.19/3.66) | S1/S2 (80/20) |
| 19N | A-1 (3.18) | P10 (78.35) | PAG-6 (5.73) | D1 (1.34) | BASE-1 (0.49) | W-3 (0.06) | CL-1/CL-4 (7.19/3.66) | S1/S2 (80/20) |
| 20N | A-1 (3.18) | P11 (78.35) | PAG-6 (5.73) | D1 (1.34) | BASE-1 (0.49) | W-3 (0.06) | CL-1/CL-4 (7.19/3.66) | S1/S2/S6 (55/25/20) |
| 21N | A-1 (3.18) | P12 (78.35) | PAG-6 (5.73) | D1 (1.34) | BASE-1 (0.49) | W-4 (0.06) | CL-1/CL-4 (7.19/3.66) | S1/S2/S3 (55/25/20) |
| 22N | A-1 (3.18) | P15 (78.35) | PAG-6 (5.73) | D1 (1.34) | BASE-1 (0.49) | W-1 (0.06) | CL-1/CL-4 (7.19/3.66) | S1/S2/S4 (55/25/20) |

TABLE 27-continued

Cont. of Table 26 (Composition for Negative Resist)

| Composition | Compound of Formula(I) (mass %) | Polymer Compound (mass %) | Photoacid Generator (mass %) | Organic Carboxylic Acid (mass %) | Basic Compound (mass %) | Surfactant (mass %) | Crosslinking Agent (mass %) | Solvent (mass ratio) |
|---|---|---|---|---|---|---|---|---|
| 23N | A-1 (3.18) | P13 (79.58) | PAG-4 (4.50) | D1 (1.34) | BASE-1 (0.49) | W-2 (0.06) | CL-1/CL-4 (7.19/3.66) | S1/S2 (80/20) |
| 24N | A-1 (3.18) | P13 (80.39) | PAG-5/PAG-3 (2.63/1.12) | D1 (1.34) | BASE-1 (0.49) | none | CL-1/CL-4 (7.19/3.66) | S1/S2 (80/20) |
| 25N | A-1 (3.18) | P13 (76.88) | PAG-3 (7.26) | D1 (1.34) | BASE-5 (0.49) | none | CL-1/CL-4 (7.19/3.66) | S1/S2 (80/20) |
| 26N | A-1 (3.18) | P13 (78.53) | PAG-8 (5.61) | D1 (1.34) | BASE-1 (0.49) | none | CL-1/CL-4 (7.19/3.66) | S1/S2 (80/20) |

TABLE 28

Cont. of Table 26 (Composition for Negative Resist)

| Composition | Compound of Formula(I) (mass %) | Polymer Compound (mass %) | Photoacid Generator (mass %) | Organic Carboxylic Acid (mass %) | Basic Compound (mass %) | Surfactant (mass %) | Crosslinking Agent (mass %) | Solvent (mass ratio) |
|---|---|---|---|---|---|---|---|---|
| 27N | A-1 (3.18) | P-14 (79.64) | PAG-7 (4.50) | D1 (1.34) | BASE-1 (0.49) | none | CL-3 (10.85) | S1/S2 (80/20) |
| 28N | A-1 (3.18) | P13 (77.64) | PAG-4 (4.50) | D1 (1.34) | BASE-1/BASE-6 (0.29/0.29) | none | CL-1/CL-5 (7.19/5.57) | S1/S2 (80/20) |
| 29N | A-1 (3.18) | P13 (78.52) | PAG-6 (5.73) | D1 (1.34) | BASE-4 (0.38) | none | CL-3 (10.85) | S1/S2 (80/20) |
| 30N | A-1 (3.18) | P13 (75.03) | PAG-3 (7.26) | D2 (1.22) | BASE-1 (0.49) | W-1 (0.06) | CL-1/CL-5 (7.19/5.57) | S1/S2 (80/20) |
| 31N | A-1 (3.18) | P12 (80.03) | PAG-5 (4.58) | D2 (1.22) | BASE-3 (0.56) | none | CL-2 (10.43) | S1/S2 (80/20) |
| 32N | A-1 (3.18) | P10/P12 (36.54/40.37) | PAG-8 (5.61) | D3 (0.87) | BASE-2 (0.67) | none | CL-1/CL-5 (7.19/5.57) | S1/S2 (80/20) |
| 33N | A-1 (3.18) | P13 (77.23) | PAG-4 (4.50) | D3 (0.87) | BASE-6 (1.46) | none | CL-1/CL-5 (7.19/5.57) | S1/S2 (80/20) |
| 34N | A-19 (4.70) | P13 (76.83) | PAG-6 (5.73) | D1 (1.34) | BASE-1 (0.49) | W-3 (0.06) | CL-1/CL-4 (7.19/3.66) | S1/S2 (80/20) |
| 35N | A-20 (5.21) | P13 (76.32) | PAG-6 (5.73) | D1 (1.34) | BASE-1 (0.49) | W-3 (0.06) | CL-1/CL-4 (7.19/3.66) | S1/S2 (80/20) |
| 36N | A-21 (3.66) | P13 (77.87) | PAG-6 (5.73) | D1 (1.34) | BASE-1 (0.49) | W-3 (0.06) | CL-1/CL-4 (7.19/3.66) | S1/S2 (80/20) |
| 37N | A-22 (4.34) | P13 (77.19) | PAG-6 (5.73) | D1 (1.34) | BASE-1 (0.49) | W-3 (0.06) | CL-1/CL-4 (7.19/3.66) | S1/S2 (80/20) |
| 38N | A-23 (5.68) | P13 (75.85) | PAG-6 (5.73) | D1 (1.34) | BASE-1 (0.49) | W-3 (0.06) | CL-1/CL-4 (7.19/3.66) | S1/S2 (80/20) |
| Comparative Example 1N | none | P11 (81.53) | PAG-6 (5.73) | D1 (1.34) | BASE-1 (0.49) | W-3 (0.06) | CL-3 (10.85) | S1 (100) |
| Comparative Example 2N | R-1 (2.68) | P11 (78.85) | PAG-6 (5.73) | D1 (1.34) | BASE-1 (0.49) | W-3 (0.06) | CL-3 (10.85) | S1 (100) |
| Comparative Example 3N | R-2 (2.34) | P11 (79.19) | PAG-6 (5.73) | D1 (1.34) | BASE-1 (0.49) | W-3 (0.06) | CL-3 (10.85) | S1 (100) |
| Comparative Example 4N | R-3 (2.23) | P11 (79.30) | PAG-6 (5.73) | D1 (1.34) | BASE-1 (0.49) | W-3 (0.06) | CL-3 (10.85) | S1 (100) |

The evaluation results are shown in Table 29 below.

TABLE 29

(Electron Beam Exposure (negative))

| Example | Composition | Sensitivity (μC/cm$^2$) | Resolution (nm) | Pattern Profile | LER (nm) | Scum | Dry Etching Resistance | Aging Stability |
|---|---|---|---|---|---|---|---|---|
| 1E | 1N | 10.3 | 50 | rectangular | 4.0 | A | very good | A |
| 2E | 2N | 10.6 | 50 | rectangular | 4.1 | A | very good | A |
| 3E | 3N | 10.6 | 50 | rectangular | 4.2 | A | very good | A |
| 4E | 4N | 10.1 | 50 | rectangular | 4.0 | A | very good | A |
| 5E | 5N | 10.1 | 50 | rectangular | 3.9 | A | very good | A |
| 6E | 6N | 10.2 | 50 | rectangular | 4.0 | A | very good | A |
| 7E | 7N | 10.0 | 50 | rectangular | 4.0 | A | very good | A |
| 8E | 8N | 9.9 | 37.5 | rectangular | 3.9 | A | very good | A |
| 9E | 9N | 9.9 | 37.5 | rectangular | 3.9 | A | very good | B |
| 10E | 10N | 10.0 | 50 | rectangular | 4.1 | A | very good | A |

TABLE 29-continued

| (Electron Beam Exposure (negative)) | | | | | | | | |
|---|---|---|---|---|---|---|---|---|
| Example | Composition | Sensitivity (μC/cm²) | Resolution (nm) | Pattern Profile | LER (nm) | Scum | Dry Etching Resistance | Aging Stability |
| 11E | 11N | 10.0 | 50 | rectangular | 4.0 | A | very good | A |
| 12E | 12N | 10.2 | 50 | rectangular | 4.0 | A | very good | A |
| 13E | 13N | 10.2 | 50 | rectangular | 4.0 | A | very good | A |
| 14E | 14N | 10.3 | 50 | rectangular | 4.3 | A | very good | B |
| 15E | 15N | 10.4 | 50 | rectangular | 4.3 | A | very good | B |
| 16E | 16N | 10.4 | 50 | rectangular | 4.2 | A | very good | B |
| 17E | 17N | 10.1 | 50 | rectangular | 4.1 | A | very good | A |
| 18E | 18N | 10.1 | 50 | rectangular | 4.0 | A | very good | A |
| 19E | 19N | 10.3 | 50 | rectangular | 4.0 | A | good | A |
| 20E | 20N | 10.2 | 50 | rectangular | 4.0 | A | good | A |
| 21E | 21N | 10.3 | 50 | rectangular | 4.1 | A | good | A |
| 22E | 22N | 11.1 | 50 | rectangular | 4.0 | A | good | A |

TABLE 30

| Cont. of Table 29 (Electron Beam Exposure (negative)) | | | | | | | | |
|---|---|---|---|---|---|---|---|---|
| Example | Composition | Sensitivity (μC/cm²) | Resolution (nm) | Pattern Profile | LER (nm) | Scum | Dry Etching Resistance | Aging Stability |
| 23E | 23N | 10.5 | 50 | rectangular | 4.0 | A | very good | A |
| 24E | 24N | 10.2 | 50 | rectangular | 4.1 | A | very good | A |
| 25E | 25N | 10.3 | 50 | rectangular | 4.2 | A | very good | A |
| 26E | 26N | 10.2 | 50 | rectangular | 4.0 | A | very good | A |
| 27E | 27N | 10.5 | 50 | rectangular | 4.0 | A | good | A |
| 28E | 28N | 10.5 | 50 | rectangular | 4.0 | A | very good | A |
| 29E | 29N | 10.2 | 50 | rectangular | 4.5 | A | very good | A |
| 30E | 30N | 10.3 | 50 | rectangular | 4.0 | A | very good | A |
| 31E | 31N | 10.1 | 50 | rectangular | 4.5 | A | good | A |
| 32E | 32N | 10.1 | 50 | rectangular | 4.5 | A | good | A |
| 33E | 33N | 10.2 | 50 | rectangular | 4.5 | A | very good | A |
| 34E | 34N | 10.3 | 50 | rectangular | 4.1 | A | very good | A |
| 35E | 35N | 10.0 | 50 | rectangular | 3.9 | A | very good | A |
| 36E | 36N | 10.0 | 50 | rectangular | 4.0 | A | very good | A |
| 37E | 37N | 10.2 | 50 | rectangular | 4.1 | A | very good | A |
| 38E | 38N | 10.5 | 50 | rectangular | 4.1 | A | very good | A |
| Comparative Example 1E | Comparative Composition 1N | 14.8 | 75 | reverse tapered | 6.5 | C | bad | A |
| Comparative Example 2E | Comparative Composition 2N | 11.8 | 62.5 | slightly reverse tapered | 6.5 | B | good | C |
| Comparative Example 3E | Comparative Composition 3N | 11.8 | 62.5 | slightly reverse tapered | 6.0 | B | good | C |
| Comparative Example 4E | Comparative Composition 4N | 14.5 | 75 | reverse tapered | 6.5 | C | bad | C |

It is seen from the results shown in Tables 29 and 30 that the composition according to the present invention is excellent in the sensitivity, resolution, pattern profile, LER performance, scum, dry etching resistance and aging stability.

Examples 1F to 6F and Comparative Examples 1F to 4F

Preparation of Resist Solution

Each of the negative resist compositions shown in Tables 26 to 28 was filtered through a polytetrafluoroethylene filter having a pore size of 0.04 μm to prepare a negative resist solution having a solid content concentration of 2 mass %.

(Evaluation of Resist)

The negative resist solution prepared was uniformly coated on a hexamethyldisilazane-treated silicon substrate by using a spin coater and heated/dried at 100° C. for 60 seconds on a hot plate to form a resist film having a thickness of 0.05 μm.

With respect to the resist film obtained, the sensitivity, resolution, pattern profile, LER performance, scum, dry etching resistance and aging stability were evaluated by the following methods.

[Sensitivity]

The obtained resist film was exposed using EUV light (wavelength: 13 nm) through a reflective mask having a 1:1 line-and-space pattern by changing the exposure dose in steps of 0.1 mJ/cm$^2$ in the range of 0 to 20.0 mJ/cm$^2$, then baked at 110° C. for 90 seconds and thereafter, developed with an aqueous 2.38 mass % tetramethylammonium hydroxide (TMAH) solution.

The exposure dose for resolving the pattern with a line width of 100 nm was taken as the sensitivity. A smaller value indicates higher sensitivity.

[Resolution]

The limiting resolution (the minimum line width below which the line and the space were not separated and resolved) at the exposure dose giving the sensitivity above was taken as the resolution (nm).

[Pattern Profile]

The cross-sectional profile of a 1:1 line-and-space resist pattern with a line width of 100 nm at the exposure dose giving the sensitivity above was observed using a scanning electron microscope (S-4300, manufactured by Hitachi, Ltd.). The cross-sectional profile of the line pattern was rated "reverse tapered" when the ratio represented by [line width in the bottom part (at the bottom) of line pattern/line width in the middle of line pattern (at the position of half the height of line pattern)] is 1.5 or more, rated "slightly reverse tapered" when the ratio above is from 1.2 to less than 1.5, and rated "rectangular" when the ratio is less than 1.2.

[LER Performance]

A 1:1 line-and-space resist pattern having a line width of 100 nm was formed with the exposure dose giving the sensitivity above. At arbitrary 30 points included in its longitudinal 50 μm region, the distance from the reference line where the edge should be present was measured using a scanning electron microscope (S-9220, manufactured by Hitachi, Ltd.). The standard deviation of measured distances was determined, and 3σ was computed. A smaller value indicates better performance.

[Evaluation of Scum]

A line-and-space resist pattern was formed by the same method as in [Pattern Profile] above. Thereafter, its cross-sectional SEM was obtained using 54800 (manufactured by Hitachi High-Technologies Corporation), and the scum in the space portion was observed and rated as follows.

C: Scum was observed and patterns were partially connected.

B: Scum was observed but patterns were not connected.

A: Scum was not observed.

[Dry Etching Resistance]

A resist film formed by performing entire surface irradiation with the irradiation dose (dose of electron beam irradiation) giving the sensitivity above was subjected to dry etching for 30 seconds by using an $Ar/C_4F_6/O_2$ gas (a mixed gas in a volume ratio of 100/4/2) in HITACHI U-621. Thereafter, the residual resist film ratio was measured and used as an indicator of dry etching resistance.

Very good: Residual film ratio of 95% or more.

Good: Less than 95% and 90% or more.

Bad: Less than 90%.

[Aging Stability]

Each composition was stored at room temperature over 1 month, and the degree of variation in the sensitivity (the sensitivity measured in [Sensitivity] above) between before and after the storage was evaluated. This evaluation was performed based on the following criteria.

(Criteria)

A (Good): The variation in sensitivity was less than 1 mJ/cm$^2$.

B (Fair): The variation in sensitivity was 1 mJ/cm$^2$ or more and 3 mJ/cm$^2$ or less.

C (Insufficient): The variation in sensitivity was more than 3 mJ/cm$^2$.

These evaluation results are shown in Table 31 below.

TABLE 31

| EUV Exposure (negative) | | | | | | | | |
|---|---|---|---|---|---|---|---|---|
| Example | Composition | Sensitivity (mJ/cm$^2$) | Resolution (nm) | Pattern Profile | LER (nm) | Scum | Dry Etching Resistance | Aging Stability |
| 1F | 1N | 12.8 | 50 | rectangular | 4.0 | A | very good | A |
| 2F | 9N | 12.8 | 37.5 | rectangular | 3.9 | A | very good | B |
| 3F | 13N | 12.8 | 37.5 | rectangular | 3.9 | A | very good | A |
| 4F | 18N | 12.8 | 37.5 | rectangular | 3.8 | A | very good | A |
| 5F | 20N | 13.0 | 50 | rectangular | 4.1 | A | very good | A |
| 6F | 22N | 13.5 | 50 | rectangular | 4.0 | A | very good | A |
| Comparative Example 1F | Comparative Composition 1N | 15.8 | 75 | reverse tapered | 6.5 | C | bad | A |
| Comparative Example 2F | Comparative Composition 2N | 14.8 | 62.5 | slightly reverse tapered | 6.5 | B | good | C |
| Comparative Example 3F | Comparative Composition 3N | 14.8 | 62.5 | slightly reverse tapered | 6.0 | B | good | C |
| Comparative Example 4F | Comparative Composition 4N | 15.4 | 75 | reverse tapered | 6.5 | C | bad | C |

It is seen from the results shown in Table 31 that the composition according to the present invention is excellent in the sensitivity, resolution, pattern profile, LER performance, scum, dry etching resistance and aging stability.

INDUSTRIAL APPLICABILITY

According to the present invention, an actinic ray-sensitive or radiation-sensitive composition capable of forming a pattern satisfying all of high sensitivity, high resolution (for example, high resolving power, excellent pattern profile and small line edge roughness (LER)), high aging stability, little scumming and good dry etching resistance at the same time can be provided.

Also, according to the present invention, a resist film, a resist-coated mask blanks, a resist pattern forming method, and a photomask, each using the actinic ray-sensitive or radiation-sensitive composition above, can be provided.

Furthermore, according to the present invention, an actinic ray-sensitive or radiation-sensitive composition capable of forming a pattern satisfying all of high sensitivity, high resolution (for example, high resolving power, excellent pattern profile and small line edge roughness (LER)), high aging stability and good dry etching resistance at the same time and being reduced in scumming can be provided.

In addition, according to the present invention, a resist film, a resist-coated mask blanks, a pattern forming method, and a photomask, each using the actinic ray-sensitive or radiation-sensitive composition above, can be provided.

While the invention has been described in detail and with reference to specific embodiments thereof, it will be apparent to one skilled in the art that various changes and modifications can be made therein without departing from the spirit and scope of the invention.

This application is based on Japanese Patent Application (Patent Application No. 2012-072540) filed on Mar. 27, 2012, and Japanese Patent Application (Patent Application No.

2012-078094) filed on Mar. 29, 2012, the contents of which are incorporated herein by way of reference.

The invention claimed is:

1. An actinic ray-sensitive or radiation-sensitive composition containing (α) a compound represented by the following formula (αI) capable of generating an acid having a size of 200 Å$^3$ or more in volume and (β) a compound capable of generating an acid upon irradiation with an actinic ray or radiation:

(αI)

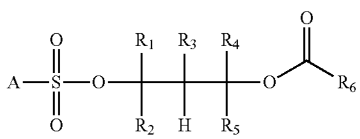

wherein in formula (αI), each of $R_1$ to $R_3$ represents a hydrogen atom or a substituent, each of $R_4$ and $R_5$ is a hydrogen atom, an alkyl group, a cycloalkyl group, an aryl group or a cyano group, and two or more members of $R_1$ to $R_5$ may combine with each other to form a ring, $R_6$ represents a substituent, and A represents a monovalent organic group.

2. The actinic ray-sensitive or radiation-sensitive composition as claimed in claim 1, wherein A has a ring structure.

3. The actinic ray-sensitive or radiation-sensitive composition as claimed in claim 1, wherein the size of the acid generated from the compound (α) is 300 Å$^3$ or more in volume.

4. The actinic ray-sensitive or radiation-sensitive composition as claimed in claim 3, wherein the size of the acid generated from said compound (α) is 400 Å$^3$ or more in volume.

5. The actinic ray-sensitive or radiation-sensitive composition as claimed in claim 1, which further contains (γ) a resin having a group capable of decomposing by an action of acid to produce an alkali-soluble group and is used for positive pattern formation.

6. The actinic ray-sensitive or radiation-sensitive composition as claimed in claim 5, wherein the resin (γ) having a group capable of decomposing by an action of acid to produce an alkali-soluble group is a resin containing a repeating unit represented by the following formula (2):

(2)

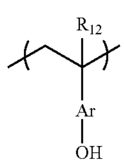

wherein in formula (2), $R_{12}$ represents a hydrogen atom or a methyl group, and Ar represents an aromatic ring.

7. The actinic ray-sensitive or radiation-sensitive composition as claimed in claim 1, which further contains (δ) a crosslinking agent and is used for negative pattern formation.

8. The actinic ray-sensitive or radiation-sensitive composition as claimed in claim 7, wherein the crosslinking agent (δ) is a compound having two or more hydroxymethyl groups or alkoxymethyl groups in the molecule.

9. The actinic ray-sensitive or radiation-sensitive composition as claimed in claim 1, which further contains (ϵ) a compound having a phenolic hydroxyl group and is used for negative pattern formation.

10. The actinic ray-sensitive or radiation-sensitive composition as claimed in claim 9, wherein the phenolic hydroxyl group-containing compound (ϵ) is a polymer compound containing a repeating unit represented by the following formula (2):

(2)

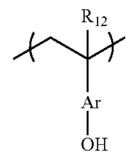

wherein in formula (2), $R_{12}$ represents a hydrogen atom or a methyl group, and Ar represents an aromatic ring.

11. The actinic ray-sensitive or radiation-sensitive composition as claimed in claim 1, which is used for electron beam or extreme-ultraviolet exposure.

12. The actinic ray-sensitive or radiation-sensitive composition as claimed in claim 1, wherein the compound (β) is a compound capable of generating an acid having a size of 200 Å$^3$ or more in volume upon irradiation with an actinic ray or radiation.

13. A resist film formed using the actinic ray-sensitive or radiation-sensitive composition claimed in claim 1.

14. A resist-coated mask blanks coated with the resist film claimed in claim 13.

15. A resist pattern forming method comprising exposing the resist film claimed in claim 13 and developing the exposed film.

16. A resist pattern forming method comprising exposing the resist-coated mask blanks claimed in claim 14 and developing the exposed mask blanks.

17. A method for manufacturing an electronic device, comprising the resist pattern forming method claimed in claim 15.

18. An actinic ray-sensitive or radiation-sensitive composition containing (A) a compound represented by the following formula (I) capable of generating an acid having a size of 200 Å$^3$ or more in volume by an action of acid and (B) a compound capable of generating an acid upon irradiation with an actinic ray or radiation:

(I)

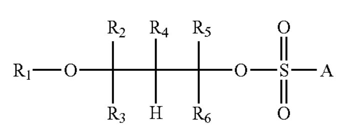

wherein in formula (I), $R_1$ represents an alkyl group, a cycloalkyl group, an alkenyl group, an alkynyl group, an aryl group or a silicon atom-containing group, each of $R_2$ and $R_3$ independently represents a hydrogen atom, an alkyl group, a cycloalkyl group, an alkenyl group, an alkynyl group, an aryl group, an alkylsulfonyl group, an arylsulfonyl group or a heterocyclic group, each of $R_4$ to $R_6$ independently represents a hydrogen atom or a monovalent substituent, at least two members of $R_1$ to $R_6$ may combine with each other to form a ring, and A represents a monovalent organic group.

19. The actinic ray-sensitive or radiation-sensitive composition as claimed in claim 18, wherein A has a ring structure.

20. The actinic ray-sensitive or radiation-sensitive composition as claimed in claim 18, wherein the size of the acid generated from the compound (A) is 300 $Å^3$ or more in volume.

21. The actinic ray-sensitive or radiation-sensitive composition as claimed in claim 20, wherein the size of the acid generated from the compound (A) is 400 $Å^3$ or more in volume.

22. The actinic ray-sensitive or radiation-sensitive composition as claimed in claim 18, which further contains (D) a crosslinking agent.

23. The actinic ray-sensitive or radiation-sensitive composition as claimed in claim 18, which further contains (C) a compound having one or more phenolic hydroxyl groups or a compound where the hydrogen atom in at least one phenolic hydroxyl group out of the one or more phenolic hydroxyl groups is replaced by a group capable of leaving by an action of acid.

24. The actinic ray-sensitive or radiation-sensitive composition as claimed in claim 23, wherein the compound (C) is a polymer compound containing a repeating unit represented by the following formula (1):

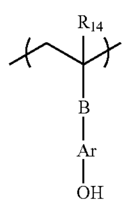

(1)

wherein in formula (1), $R_{14}$ represents a hydrogen atom or a methyl group,

B represents a single bond or a divalent linking group, and

Ar represents an aromatic ring.

25. The actinic ray-sensitive or radiation-sensitive composition as claimed in claim 23, wherein the compound (C) is a compound in which the hydrogen atom in at least one phenolic hydroxyl group out of the phenolic hydroxyl groups of the compound having one or more phenolic hydroxyl groups is replaced by an acid-labile group represented by the following formula (III):

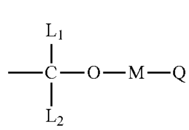

(III)

wherein in formula (III), each of $L_1$ and $L_2$ independently represents a hydrogen atom, an alkyl group, a cycloalkyl group, an aryl group or an aralkyl group, M represents a single bond or a divalent linking group, and Q represents an alkyl group, a cycloalkyl group that may contain a heteroatom, an aromatic ring group that may contain a heteroatom, an amino group, an ammonium group, a mercapto group, a cyano group or an acyl group, provided that at least two members of Q, M and $L_1$ may combine with each other to form a 5- or 6-membered ring.

26. The actinic ray-sensitive or radiation-sensitive composition as claimed in claim 23, wherein the compound (C) is a polymer compound further containing a repeating unit represented by the following formula (3):

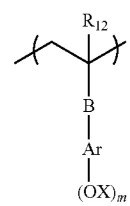

(3)

wherein in formula (3), $R_{12}$ represents a hydrogen atom or a methyl group,

X represents a hydrogen atom or a group having a non-acid-decomposable polycyclic alicyclic hydrocarbon structure, and when a plurality of X are present, at least one of the plurality of X represents a group having a non-acid-decomposable polycyclic alicyclic hydrocarbon structure, Ar represents an aromatic ring group, B represents a single bond or a divalent linking group, and m is an integer of 1 or more.

27. The actinic ray-sensitive or radiation-sensitive composition as claimed in claim 18, wherein the compound (B) is a compound capable of generating an acid having a size of 200 $Å^3$ or more in volume upon irradiation with an actinic ray or radiation.

28. A resist film formed using the actinic ray-sensitive or radiation-sensitive composition claimed in claim 18.

29. A resist-coated mask blanks coated with the resist film claimed in claim 28.

30. A pattern forming method comprising exposing the resist film claimed in claim 28 and developing the exposed film.

31. A pattern forming method comprising exposing the resist-coated mask blanks claimed in claim 29 and developing the exposed mask blanks.

32. The pattern forming method as claimed in claim 30, wherein the exposure is performed using an electron beam, an X-ray or EUV light.

33. The actinic ray-sensitive or radiation-sensitive composition as claimed in claim 18, wherein $R_1$ represents a cycloalkyl group, an alkenyl group, an alkynyl group, an aryl group, or a group having a silicon atom, which may have a substituent.

34. The actinic ray-sensitive or radiation-sensitive composition as claimed in claim 18, wherein $R_1$ represents a cycloalkyl group, an aryl group, or a group having a silicon atom, which may have a substituent.

35. The actinic ray-sensitive or radiation-sensitive composition as claimed in claim 15, wherein $R_1$ represents an alkyl group having a carbon number of 2 or more.

36. The actinic ray-sensitive or radiation-sensitive composition as claimed in claim 18, wherein $R_1$ represents a cycloalkyl group, an alkenyl group, an alkynyl group, an aryl group or a silicon atom-containing group.

* * * * *